US009082995B2

(12) United States Patent
Nishimura et al.

(10) Patent No.: US 9,082,995 B2

(45) Date of Patent: Jul. 14, 2015

(54) ORGANIC EL ELEMENT AND ORGANIC EL MATERIAL-CONTAINING SOLUTION

(75) Inventors: Kazuki Nishimura, Sodegaura (JP); Chishio Hosokawa, Sodegaura (JP); Toshihiro Iwakuma, Sodegaura (JP); Kenichi Fukuoka, Sodegaura (JP); Tetsuya Inoue, Sodegaura (JP)

(73) Assignee: IDEMITSU KOSAN CO., LTD., Tokyo (JP)

(*) Notice: Subject to any disclaimer, the term of this patent is extended or adjusted under 35 U.S.C. 154(b) by 754 days.

(21) Appl. No.: 12/667,893

(22) PCT Filed: Jul. 4, 2008

(86) PCT No.: PCT/JP2008/062137

§ 371 (c)(1),
(2), (4) Date: Jan. 6, 2010

(87) PCT Pub. No.: WO2009/008349

PCT Pub. Date: Jan. 15, 2009

(65) Prior Publication Data

US 2010/0270539 A1 Oct. 28, 2010

(30) Foreign Application Priority Data

Jul. 7, 2007 (JP) ................................ 2007-179116

(51) Int. Cl.

*H01L 29/08* (2006.01)
*H01L 35/24* (2006.01)

(Continued)

(52) U.S. Cl.

CPC ............. *H01L 51/5036* (2013.01); *C09B 1/00* (2013.01); *C09B 3/14* (2013.01); *C09B 3/78* (2013.01); *C09B 6/00* (2013.01); *C09B 23/148* (2013.01);

(Continued)

(58) Field of Classification Search

CPC ........... H01L 51/5012; H01L 51/5036; H01L 51/5016

USPC ............... 257/40, E51.08, E51.001, E51.028, 257/E51.022; 313/504

See application file for complete search history.

(56) References Cited

U.S. PATENT DOCUMENTS

2002/0168544 A1 11/2002 Fukuoka et al.
2002/0182441 A1 12/2002 Lamansky et al.

(Continued)

FOREIGN PATENT DOCUMENTS

CN 1918946 A 2/2007
JP 9 241629 9/1997

(Continued)

OTHER PUBLICATIONS

Sun, Y., et al., "Management of Singlet and Triplet Excitons for Efficient White Organic Light-emitting Devices", Nature, vol. 440, pp. 908-912 (2006).

(Continued)

*Primary Examiner* — Latanya N Crawford

(74) *Attorney, Agent, or Firm* — Oblon, McClelland, Maier & Neustadt, L.L.P.

(57) ABSTRACT

An organic EL device (1) includes an anode (3), a cathode (4) and an organic thin-film layer (5) provided between the anode (3) and the cathode (4). The organic thin-film layer (5) includes a single-layered mixed-color emitting layer (51) for providing mixed-color emission. The mixed-color emitting layer (51) contains a host, a fluorescent dopant for blue fluorescent emission and a phosphorescent dopant for red or green phosphorescent emission.

11 Claims, 3 Drawing Sheets

(51) Int. Cl.

| | |
|---|---|
| ***H01L 51/00*** | (2006.01) |
| ***H01L 51/50*** | (2006.01) |
| ***C09K 11/06*** | (2006.01) |
| ***C09B 6/00*** | (2006.01) |
| ***C09B 23/14*** | (2006.01) |
| ***C09B 57/00*** | (2006.01) |
| ***C09B 1/00*** | (2006.01) |
| ***C09B 3/14*** | (2006.01) |
| ***C09B 3/78*** | (2006.01) |

(52) U.S. Cl.
CPC ............... *C09B 57/00* (2013.01); *C09B 57/008* (2013.01); *C09K 11/06* (2013.01); *H01L 51/0058* (2013.01); *H01L 51/0072* (2013.01); *H01L 51/5016* (2013.01); *C09K 2211/1007* (2013.01); *C09K 2211/1029* (2013.01); *C09K 2211/1044* (2013.01); *H01L 51/006* (2013.01); *H01L 51/0061* (2013.01); *H01L 51/0081* (2013.01); *H01L 51/0085* (2013.01)

(56) References Cited

U.S. PATENT DOCUMENTS

| | | | | |
|---|---|---|---|---|
| 2004/0124766 | A1 | 7/2004 | Nakagawa et al. | |
| 2004/0169461 | A1 | 9/2004 | Moriyama et al. | |
| 2005/0073245 | A1 | 4/2005 | Gong et al. | |
| 2005/0158584 | A1 * | 7/2005 | Thompson et al. | 428/690 |
| 2005/0221124 | A1 * | 10/2005 | Hwang et al. | 428/690 |
| 2006/0066225 | A1 * | 3/2006 | Kishino et al. | 313/504 |
| 2007/0035238 | A1 | 2/2007 | Nakagawa et al. | |
| 2007/0120453 | A1 * | 5/2007 | Hwang et al. | 313/112 |
| 2007/0138947 | A1 * | 6/2007 | Popovic et al. | 313/504 |
| 2007/0159083 | A1 | 7/2007 | Matsuura et al. | |
| 2008/0074034 | A1 * | 3/2008 | Jou | 313/504 |
| 2008/0193773 | A1 * | 8/2008 | Hsu et al. | 428/421 |
| 2008/0213624 | A1 * | 9/2008 | Lecloux et al. | 428/691 |

FOREIGN PATENT DOCUMENTS

| | | |
|---|---|---|
| JP | 2001 250690 | 9/2001 |
| JP | 2003 257670 | 9/2003 |
| JP | 2003 317946 | 11/2003 |
| JP | 2004 506305 | 2/2004 |
| JP | 2004 221045 | 8/2004 |
| JP | 2005 19413 | 1/2005 |
| JP | 2005 123205 | 5/2005 |
| JP | 2005 235787 | 9/2005 |
| JP | 2006 120689 | 5/2006 |
| JP | 2006 120821 | 5/2006 |
| JP | 2006 172762 | 6/2006 |
| JP | 2006 190759 | 7/2006 |
| JP | 2007 19070 | 1/2007 |
| JP | 2007 27620 | 2/2007 |
| JP | 2007 59310 | 3/2007 |
| JP | 2007 73814 | 3/2007 |
| JP | 2007 509502 | 4/2007 |
| JP | 2007 173827 | 7/2007 |
| WO | 2004 016575 | 2/2004 |
| WO | 2004 018588 | 3/2004 |
| WO | 2004 060026 | 7/2004 |
| WO | 2005 079118 | 8/2005 |
| WO | 2005 117500 | 12/2005 |
| WO | 2006 038020 | 4/2006 |
| WO | 2006 062078 | 6/2006 |
| WO | 2007 029426 | 3/2007 |
| WO | 2007 029806 | 3/2007 |
| WO | 2007 032162 | 3/2007 |

OTHER PUBLICATIONS

U.S. Appl. No. 12/667,939, filed Jan. 6, 2010, Nishimura, et al.
U.S. Appl. No. 12/668,035, filed Jan. 7, 2010, Nishimura, et al.
U.S. Appl. No. 12/668,110, filed Jan. 7, 2010, Nishimura, et al.
U.S. Appl. No. 12/668,111, filed Jan. 7, 2010, Nishimura, et al.
Office Action issued Dec. 15, 2010 in China Application No. 200880023728.9 (With English Translation).
Extended European Search Report issued Mar. 6, 2012, in European Patent Application No. 08790868.7.
Shizuo Tokito, et al., "Confinement of triplet energy on phosphorescent molecules for highly-efficient organic blue-light-emitting devices", Applied Physics Letters, vol. 83, No. 3, XP-012035549, Jul. 21, 2003, pp. 569-571.
Gang Cheng, et al., "Improved efficiency for white organic light-emitting devices based on phosphor sensitized fluorescence", Applied Physics Letters, vol. 88, No. 8, XP-012083026, Feb. 24, 2006, pp. 83512-1 to 83512-3.
Hiroshi Kanno, et al., "White Organic light-emitting device based on a compound fluorescent-phosphor-sensitized-fluorescent emission layer", Applied Physics Letters, vol. 89, No. 14, Oct. 5, 2006, pp. 143516-1 to 143516-3.

* cited by examiner

ORGANIC EL ELEMENT AND ORGANIC EL MATERIAL-CONTAINING SOLUTION

TECHNICAL FIELD

The present invention relates to an organic EL device. In particular, the invention relates to an organic EL device that provides white emission by a smaller number of emitting layer(s). The invention also relates to an organic-EL-material-containing solution for forming the emitting layer(s) of the organic EL device.

BACKGROUND ART

Organic EL devices are known. Such an organic EL device is a self-emitting device applicable to illuminators, displays and the like, and thus attracting more and more attentions.

One of known organic EL devices includes a plurality of emitting layers that each emit light of a different wavelength. Mixture of the light emitted by the emitting layers provides mixed-color light.

An example of such organic EL devices includes a layered red-emitting layer, green-emitting layer and blue-emitting layer, and provides white light in which emission from the emitting layers are mixed together (see, e.g., Patent Documents 1, 2 and 3, Non-Patent Document 1).

However, such a known organic EL device as disclosed in Patent Document 1 requires at least three emitting layers to be layered, which has led to complication of the manufacturing process and increase in cost.

One possible solution is to structure a single emitting layer to contain dopants for emitting three colors of red, green and blue, so that emission of the dopants as a whole will provide white emission.

Such a structure can unify the conventional three-separate emitting layers into a single emitting layer, and realize simplification of the manufacturing process and reduction in cost.

However, it has been difficult to adopt such a structure because of the following problems.

In terms of singlet energy gaps of dopants for fluorescent emission, a dopant for emission of longer wavelength (redder emission) has a smaller singlet energy gap, and a dopant for emission of shorter wavelength (bluer emission) has a greater singlet energy gap.

Accordingly, the singlet energy of blue to green dopants tends to transfer to a red dopant, so that the blue to green emission is difficult to be obtained.

Hence, only the red dopant provides intense emission while blue to green emission is difficult to be obtained, so that the device as a whole will provide reddish emission.

Examples of methods for preventing the above-described problems are: a method of balancing three color emission by suppressing the energy transfer between the color dopants (in particular, the energy transfer to the red dopant) by wholly reducing the doping concentrations of the dopants; and a method of relatively weakening the red emission by reducing the doping concentration of the easily-emitting red dopant to be smaller than those of the other dopants.

However, these methods require minute adjustment of the doping concentrations, which would bring considerable difficulty to the manufacture of devices.

Although the problems are described above by exemplifying the fluorescent dopants that utilize the singlet energy, the same problems will be encountered when phosphorescent dopants utilizing triplet energy are used.

Further, such a conventional organic EL device as disclosed in Patent Document 1 provides phosphorescent emission by transferring the triplet energy from a fluorescent host of a fluorescent-emitting layer to a phosphorescent dopant of a phosphorescent-emitting layer. However, in order to secure the transfer of the triplet energy, the fluorescent-emitting layer is required to be thinned, which has led to shortening of the device lifetime.

Patent Document 1: US2002/182441
Patent Document 2: WO2006/038020
Patent Document 3: WO2004/060026
Non-Patent Document 1: nature vol 440 p. 908

DISCLOSURE OF THE INVENTION

Problems to be Solved by the Invention

An object of the invention is to provide an organic EL device capable of providing a mixed color by a smaller number of emitting layer(s) and having long lifetime. Also, an object of the invention is to provide an organic-EL-material-containing solution for forming the emitting layer(s) of the organic EL device.

Means for Solving the Problems

An organic EL device according to an aspect of the invention includes: an anode; a cathode; an organic thin-film layer provided between the anode and the cathode, the organic thin-film layer including a single-layered mixed-color emitting layer for providing mixed-color emission, the mixed-color emitting layer containing a host, a fluorescent dopant for fluorescent emission and a phosphorescent dopant for phosphorescent emission, a wavelength of emission of the fluorescent dopant being shorter than a wavelength of emission of the phosphorescent dopant.

According to the above arrangement, when charges are injected into the mixed-color emitting layer, singlet exciton and triplet exciton are generated in the host of the mixed-color emitting layer.

The singlet energy is transferred to the fluorescent dopant, so that fluorescent emission is obtained.

The triplet energy is transferred to the phosphorescent dopant, so that phosphorescent emission is obtained.

Accordingly, the mixed-color emitting layer as a whole provides mixed-color emission.

The singlet energy gap of the phosphorescent dopant is generally larger than the singlet energy gap of the fluorescent dopant for fluorescent emission.

Thus, the singlet energy is hardly transferred from the fluorescent dopant to the phosphorescent dopant.

Further, when the singlet energy gap of the fluorescent dopant is compared with the triplet energy gap of the phosphorescent dopant, the triplet energy gap of the phosphorescent dopant is smaller than the other. However, since the singlet differs from the triplet in the spin quantum number, an energy transfer does not easily take place. Thus, the rate at which the singlet energy of the fluorescent dopant escapes to the triplet exciton of the phosphorescent dopant is small.

Accordingly, the energy transferred from the host to the singlet of the fluorescent dopant is not deactivated for other uses but is utilized for the fluorescent emission. Resultantly, the fluorescent emission can be provided at a sufficient intense.

On the other hand, when the triplet energy gap Eg(T) of the phosphorescent dopant is compared with the triplet energy gap Eg(T) of the fluorescent dopant, the triplet energy gap of the phosphorescent dopant is larger than the other, so that the triplet energy may be transferred from the phosphorescent dopant to the fluorescent dopant. However, since the energy efficiency in the phosphorescent emission is higher than that in the fluorescent emission, the sufficiently-intense phosphorescent emission in terms of a balance with the fluorescent emission can still be obtained even when the triplet energy of the phosphorescent dopant should be more or less transferred to the fluorescent dopant.

In the aspect of the invention, the phosphorescent emission is obtained by generating the energy transfer within a single mixed-color emitting layer. Thus, unlike the organic EL device disclosed in Patent Document 1, there is no need to thin an exciton-generating layer (fluorescent-emitting layer in Patent Document 1) for securing the transfer of the triplet energy. Accordingly, no reduction is brought to the device lifetime.

As described above, the organic EL device according to the aspect of the invention can provide both of the fluorescent emission and the fluorescent emission at sufficient intense with use of the single-layered mixed-color emitting layer. Thus, the organic EL device not only provides a favorable mixed color but also has long emission lifetime.

Further, according to the aspect of the invention, since the wavelength of the emission of the fluorescent dopant is shorter than the wavelength of the emission of the phosphorescent dopant, for instance, the fluorescent dopant can provide blue emission while the phosphorescent dopant can provide green and red emission. Hence, the organic EL device as a whole can provide white emission.

The mixed-color emitting layer is only required to contain a fluorescent dopant and a phosphorescent dopant. Thus, the invention includes a variety of patterns: for instance, patterns of two-wavelength mixed color by a blue fluorescent dopant and red phosphorescent dopant, three-wavelength mixed color by a blue fluorescent dopant, green fluorescent dopant and red phosphorescent dopant, and three-wavelength mixed color by a blue fluorescent dopant, green phosphorescent dopant and red phosphorescent dopant.

The organic EL device according to the aspect of the invention may include a second emitting layer separately from the mixed-color emitting layer.

For instance, the mixed-color emitting layer and the second emitting layer each may emit light by separately generating the recombination of the charges therein.

In this structure, the charges are trapped by the mixed-color emitting layer or the second emitting layer, and the amount of the charges injected into the other one of the emitting layers is reduced. In order to prevent such reduction in charge injection, the dopants are contained in each layer preferably at a content of 10% or less of the host by mass ratio, more preferably 5% or less.

In order to sufficiently generate recombination in the mixed-color emitting layer, the mixed-color emitting layer is preferably thicker than the second emitting layer.

Further, the energy may be transferred from the second emitting layer so that the mixed-color emitting layer emits light. The organic EL device may include a second emitting layer, and the energy may be transferred from the mixed-color emitting layer so that the second emitting layer emits light.

When the mixed-color emitting layer is located closer to the anode than the second emitting layer, the host preferably has large hole mobility. With this arrangement, the injection of holes into the second emitting layer (i.e., exciton generating layer) through the mixed-color emitting layer can be facilitated, and a probability of the charge recombination can be increased. At this time, the hole mobility of the host is preferably $1\times10^{-5}$ $cm^2/Vs$ or more in an electric field intensity of $1.0\times10^4$ to $1.0\times10^6$V/cm. The hole mobility is more preferably $10^{-4}$ $cm^2/Vs$ or more, much more preferably $10^{-3}$ $cm^2/Vs$.

When the mixed-color emitting layer is located closer to the cathode than the second emitting layer, the host preferably has large electron mobility. With this arrangement, the injection of electrons into the second emitting layer (i.e., exciton generating layer) through the mixed-color emitting layer can be facilitated, and a probability of the charge recombination can be increased. At this time, the electron mobility of the host is preferably $1\times10^{-5}$ $cm^2/Vs$ or more in an electric field intensity of $1.0\times10^4$ to $1.0\times10^6$V/cm. The electron mobility is more preferably $10^{-4}$ $cm^2/Vs$ or more, much more preferably $10^{-3}$ $cm^2/Vs$.

In this structure, the charges are trapped by the mixed-color emitting layer, and the amount of the charges injected into the second emitting layer is reduced. In order to prevent such reduction in charge injection, the phosphorescent dopant is contained preferably at 10% or less of the host by mass ratio, more preferably 5% or less.

The organic EL device may further include an intermediate layer between the mixed-color emitting layer and the second emitting layer, for trapping the charges and excited energy. For instance, when a green phosphorescent-emitting layer is provided as the second emitting layer, the host material contained in the emitting layer has a large energy gap, and the transfer (leakage) of the excited energy may affect the emission by the mixed-color layer. The intermediate layer contributes to prevention of the transfer (leakage) of the excited energy from the green phosphorescent-emitting layer.

The second emitting layer is preferably thinner than the mixed-color emitting layer.

In order for the excited energy generated by the host in the second layer to be transferred to the mixed-color emitting layer, the second emitting layer is preferably thin. On the other hand, the mixed-color emitting layer, which is required to receive the excited energy diffused from the second emitting layer, is preferably thick to some degree.

Contrarily, the energy may be transferred from the mixed-color emitting layer so that the second emitting layer emits light.

When the mixed-color emitting layer is located closer to the anode than the second emitting layer, the second host in the second emitting layer preferably has large hole mobility. With this arrangement, the injection of holes into the mixed-color emitting layer (i.e., exciton generating layer) through the second emitting layer can be facilitated, and a probability of the charge recombination can be increased. At this time, the hole mobility of the second host is preferably $1\times10^{-5}$ $cm^2/Vs$ or more in an electric field intensity of $1.0\times10^4$ to $1.0\times10^6$V/cm. The hole mobility is more preferably $10^{-4}$ $cm^2/Vs$ or more, much more preferably $10^{-3}$ $cm^2/Vs$.

When the second emitting layer is located closer to the cathode than the mixed-color emitting layer, the second host preferably has large electron mobility. With this arrangement, the injection of electrons into the mixed-color emitting layer (i.e., exciton generating layer) through the second emitting layer can be facilitated, and a probability of the charge recombination can be increased. At this time, the electron mobility of the second host is preferably $1\times10^{-5}$ $cm^2/Vs$ or more in an electric field intensity of $1.0\times10^4$ to $1.0\times10^6$V/cm. The electron mobility is more preferably $10^{-4}$ $cm^2/Vs$ or more, much more preferably $10^{-3}$ $cm^2/Vs$.

In this structure, the charges are trapped by the second emitting layer, and the amount of the charges injected into the mixed-color emitting layer is reduced. In order to prevent such reduction in charge injection, the dopant of the second emitting layer is contained preferably at 10% or less of the host by mass ratio, more preferably 5% or less.

The organic EL device may further include an intermediate layer between the mixed-color emitting layer and the second emitting layer, for trapping the charges and excited energy.

The mixed-color emitting layer is preferably thinner than the second emitting layer.

In order for the excited energy generated by the host in the mixed-color emitting layer to be transferred to the second emitting layer, the mixed-color emitting layer is preferably thin. On the other hand, the second emitting layer, which is required to receive the excited energy diffused from the mixed-color emitting layer, is preferably thick to some degree.

Examples of the host materials are compounds represented by the following formulae (101) to (105), i.e., carbazole derivatives.

[Chemical Formula 1]

(101)

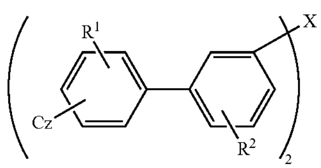

(102)

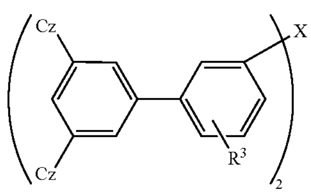

(103)

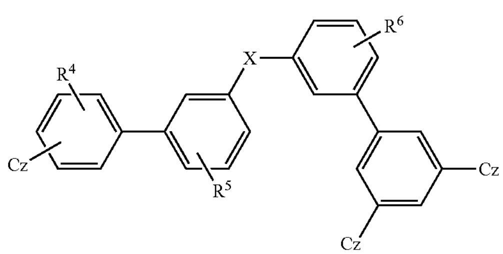

(104)

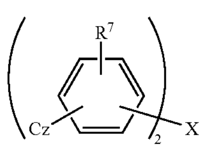

(105)

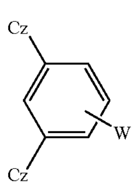

In particular, the compounds represented by the formula (101) or (103) are favorably usable as the phosphorescent host.

The structure of the formula (101) is any one of the following structures.

[Chemical Formula 2]

(101′)

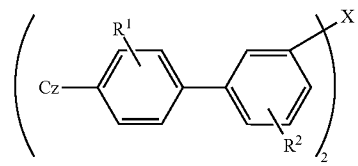

(101″)

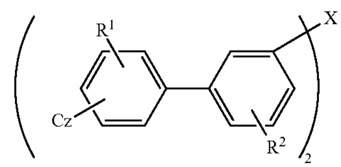

(101‴)

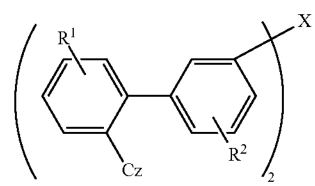

The structure of the formula (103) is any one of the following structures.

[Chemical Formula 3]

(103′)

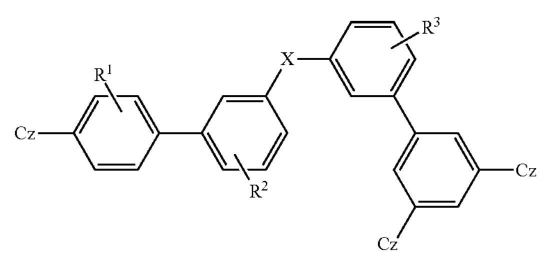

(103″)

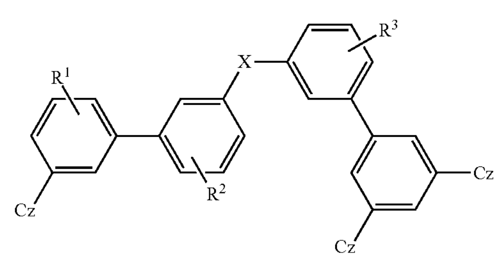

(103‴)

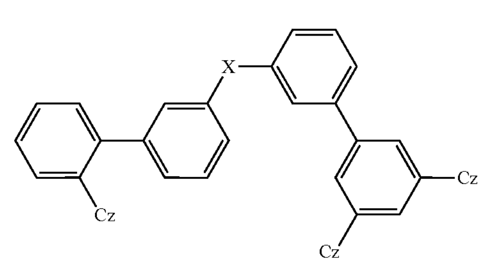

Among the above, materials containing the compounds represented by the general formula (101') or (103') are preferable.

In the formulae (101) to (104), $R^1$ to $R^7$ each independently represent a hydrogen atom, halogen atom, substituted or unsubstituted alkyl group having 1 to 40 carbon atoms (preferably 1 to 30 carbon atoms), substituted or unsubstituted heterocyclic group having 3 to 30 carbon atoms (preferably 3 to 20 carbon atoms), substituted or unsubstituted alkoxy group having 1 to 40 carbon atoms (preferably 1 to 30 carbon atoms), substituted or unsubstituted aryl group having 6 to 40 carbon atoms (preferably 6 to 30 carbon atoms), substituted or unsubstituted aryloxy group having 6 to 40 carbon atoms (preferably 6 to 30 carbon atoms), substituted or unsubstituted aralkyl group having 7 to 40 carbon atoms (preferably 7 to 30 carbon atoms), substituted or unsubstituted alkenyl group having 2 to 40 carbon atoms (preferably 2 to 30 carbon atoms), substituted or unsubstituted alkylamino group having 1 to 80 carbon atoms (preferably 1 to 60 carbon atoms), substituted or unsubstituted arylamino group having 6 to 80 carbon atoms (preferably 6 to 60 carbon atoms), substituted or unsubstituted aralkylamino group having 7 to 80 carbon atoms (preferably 7 to 60 carbon atoms), substituted or unsubstituted alkylsilyl group having 3 to 10 carbon atoms (preferably 3 to 9 carbon atoms), substituted or unsubstituted arylsilyl group having 6 to 30 carbon atoms (preferably 8 to 20 carbon atoms) or cyano group. $R^1$ to $R^7$ each may be plural. An adjacent set thereof may form a saturated or unsaturated cyclic structure.

Examples of the halogen atom represented by $R^1$ to $R^7$ are fluorine, chlorine, bromine, iodine and the like.

Examples of the substituted or unsubstituted alkyl group represented by $R^1$ to $R^7$ are a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, 1-methylpentyl group, 2-methylpentyl group, 1-pentylhexyl group, 1-butylpentyl group, 1-heptyloctyl group, 3-methylpentyl group, hydroxymethyl group, 1-hydroxyethyl group, 2-hydroxyethyl group, 2-hydroxyisobutyl group, 1,2-dihydroroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 1,2-dinitroethyl group, 2,3-dinitro-t-butyl group, 1,2,3-trinitropropyl group, cyclopentyl group, cyclohexyl group, cyclooctyl group and 3,5-tetramethylhexyl group.

Among the above, the alkyl group is preferably a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, 1-methylpentyl group, 1-pentylhexyl group, 1-butylpentyl group, 1-heptyloctyl group, cyclohexyl group, cyclooctyl group and 3,5-tetramethylcyclohexyl group.

Examples of the substituted or unsubstituted heterocyclic group having 3 to 30 carbon atoms represented by $R^1$ to $R^7$ are 1-pyrrolyl group, 2-pyrrolyl group, 3-pyrrolyl group, pyrazinyl group, 2-pyridinyl group, 1-imidazolyl group, 2-imidazolyl group, 1-pyrazolyl group, 1-indolizinyl group, 2-indolizinyl group, 3-indolizinyl group, 5-indolizinyl group, 6-indolizinyl group, 7-indolizinyl group, 8-indolizinyl group, 2-imidazopyridinyl group, 3-imidazopyridinyl group, 5-imidazopyridinyl group, 6-imidazopyridinyl group, 7-imidazopyridinyl group, 8-imidazopyridinyl group, 3-pyridinyl, 4-pyridinyl, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl, 5-quinoxalinyl, 6-quinoxalinyl, 1-carbazolyl group, 2-carbazolyl group, 3-carbazolyl group, 4-carbazolyl group, 9-carbazolyl group, β-carboline-1-yl, β-carboline-3-yl, β-carboline-4-yl, β-carboline-5-yl, β-carboline-6-yl, β-carboline-7-yl, β-carboline-6-yl, β-carboline-9-yl, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl, 5-oxadiazolyl, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

Among the above, the preferable examples are 2-pyridinyl group, 1-indolizinyl group, 2-indolizinyl group, 3-indolizinyl group, 5-indolizinyl group, 6-indolizinyl group, 7-indolizinyl group, 8-indolizinyl group, 2-imidazopyridinyl group, 3-imidazopyridinyl group, 5-imidazopyridinyl group, 6-imidazopyridinyl group, 7-imidazopyridinyl group, 8-imidazopyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 1-carbazolyl group, 2-carbazolyl group, 3-carbazolyl group, 4-carbazolyl group and 9-carbazolyl group.

The substituted or unsubstituted alkoxy group having 1 to 40 carbon atoms represented by $R^1$ to $R^7$ is a group represented by —OY. Examples of Y are the same as those described with respect to the alkyl group. Preferable examples are also the same.

Examples of the substituted or unsubstituted aryl group having 6 to 40 ring carbon atoms represented by $R^1$ to $R^7$ are a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, o-cumenyl group, m-cumenyl group, p-cumenyl group, 2,3-xylyl group, 3,4-xylyl group, 2,5-xylyl group and mesityl group.

Among the above, the preferably examples are a phenyl group, 1-naphthyl group, 2-naphthyl group, 9-phenanthryl group, 2-biphenylyl group, 3-biphenylyl group, 4-biphenylyl group, p-tolyl group and 3,4-xylyl group.

The substituted or unsubstituted aryloxy group having 6 to 40 carbon atoms represented by $R^1$ to $R^7$ is a group represented by —OAr. Examples of Ar are the same as those described with respect to the aryl group. Preferable examples are also the same.

Examples of the substituted or unsubstituted aralkyl group having 7 to 40 carbon atoms represented by $R^1$ to $R^7$ are a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro-2-phenylisopropyl group.

Among the above, the preferable examples are a benzyl group, p-cyanobenzyl group, m-cyanobenzyl group, o-cyanobenzyl group, 1-phenylethyl group, 2-phenylethyl group, 1-phenylisopropyl group and 2-phenylisopropyl group.

Examples of the substituted or unsubstituted alkenyl group having 2 to 40 carbon atoms represented by $R^1$ to $R^7$ are a vinyl group, allyl group, 1-butenyl group, 2-butenyl group, 3-butenyl group, 1,3-butanedienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group and 3-phenyl-1-butenyl group, among which a styryl group, 2,2-phenylvinyl group and 1,2-diphenylvinyl group are preferable.

The substituted or unsubstituted alkylamino group having 1 to 80 carbon atoms, the substituted or unsubstituted arylamino group having 6 to 80 carbon atoms and the substituted or unsubstituted aralkylamino group having 7 to 80 carbon atoms, which are represented by $R^1$ to $R^7$, are represented by $—NQ^1Q^2$. Examples of $Q^1$ and $Q^2$ each are independently the same as those described with respect to the alkyl group, aryl group and aralkyl group. The preferable examples are also the same.

The substituted or unsubstituted alkylsilyl group having 3 to 10 carbon atoms represented by $R^1$ to $R^7$ are a trimethylsilyl group, triethylsilyl group, t-butyldimethylsilyl group, vinyldimethylsilyl group and propyldimethylsilyl group.

The substituted or unsubstituted arylsilyl group having 6 to 30 carbon atoms represented by $R^1$ to $R^7$ are a triphenylsilyl group, phenyldimethylsilyl group and t-butyldiphenylsilyl group.

Examples of the cyclic structure formed when $R^1$ to $R^7$ are plural are a unsaturated six-membered ring such as benzene ring, saturated or unsaturated five-membered ring and seven-membered ring.

In the formulae (101) to (104), X is a group represented by one of the following formulae (111) to (116).

[Chemical Formula 4]

(111)

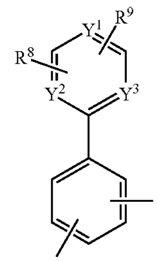

-continued (112)

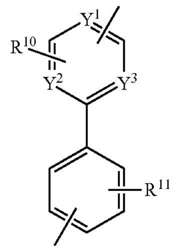

(113)

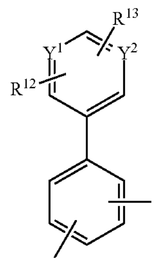

(114)

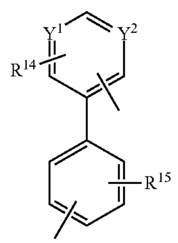

(115)

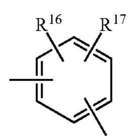

(116)

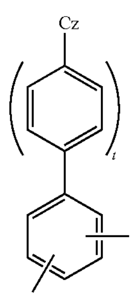

In the formulae (111) to (116), $R^8$ to $R^{17}$ each independently represent a hydrogen atom, halogen atom, substituted or unsubstituted alkyl group having 1 to 40 carbon atoms (preferably 1 to 30 carbon atoms), substituted or unsubstituted heterocyclic group having 3 to 30 carbon atoms (preferably 3 to 20 carbon atoms), substituted or unsubstituted alkoxy group having 1 to 40 carbon atoms (preferably 1 to 30 carbon atoms), substituted or unsubstituted aryl group having 6 to 40 carbon atoms (preferably 6 to 30 carbon atoms), substituted or unsubstituted aryloxy group having 6 to 40 carbon atoms (preferably 6 to 30 carbon atoms), substituted or unsubstituted aralkyl group having 7 to 40 carbon atoms (preferably 7 to 30 carbon atoms), substituted or unsubstituted alkenyl group having 2 to 40 carbon atoms (preferably 2 to 30 carbon atoms), substituted or unsubstituted alkylamino group having 1 to 80 carbon atoms (preferably 1 to 60 carbon atoms), substituted or unsubstituted arylamino group having 6 to 80 carbon atoms (preferably 6 to 60 carbon atoms), substituted or unsubstituted aralkylamino group having 7 to 80 carbon atoms (preferably 7 to 60 carbon atoms), substituted or unsubstituted alkylsilyl group having 3 to 10 carbon atoms (preferably 3 to 9 carbon atoms), substituted or unsubstituted arylsilyl group having 6 to 30 carbon atoms (preferably 8 to 20 carbon atoms) or cyano group. $R^8$ to $R^{17}$ each may be plural. An adjacent set thereof may form a saturated or unsaturated cyclic structure.

Examples of the groups represented by R8 to R17 are the same as the examples described in relation to $R^1$ to $R^7$. The preferable examples are also the same.

In the formulae (111) to (114), $Y^1$ to $Y^3$ each independently represent —CR(R represents a hydrogen atom, group bonded to X in the general formulae (101) to (104) or any one of $R^8$, $R^9$, $R^{10}$, $R^{12}$, $R^{13}$ and $R^{14}$)) or a nitrogen atom. When $Y^1$ to $Y^3$ represent a nitrogen atom, the number thereof is at least 2 within the same ring. Cz is the same as the following.

In the general formula (116), t is an integer of 0 to 1.

The group represented by the general formula (111) preferably has any one of the following structures.

[Chemical Formula 5]

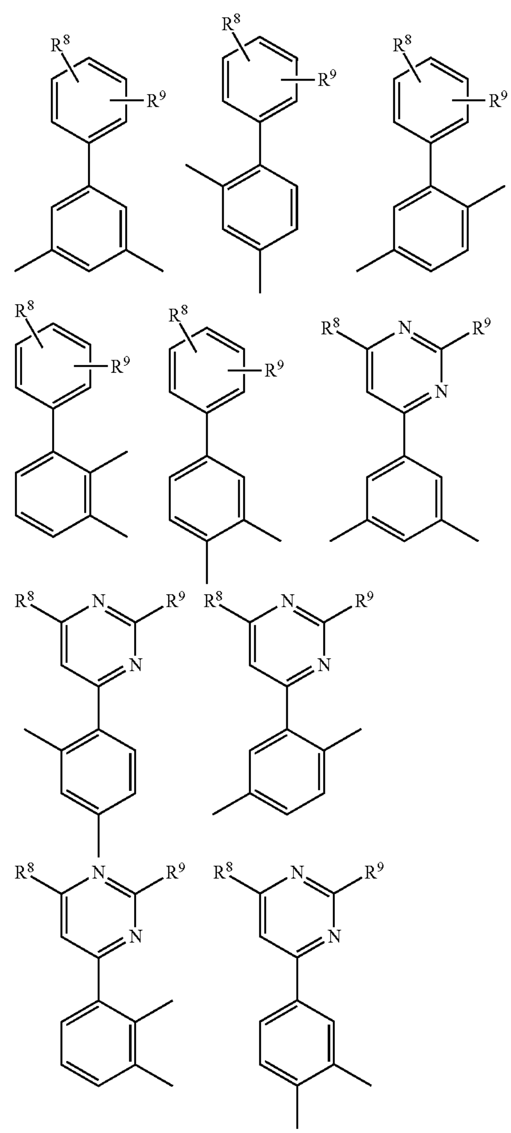

-continued
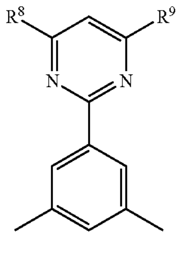
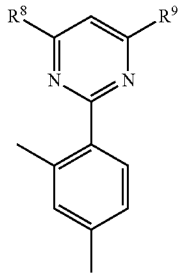
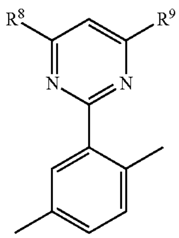
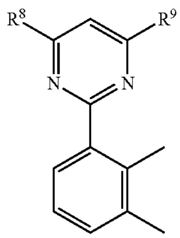
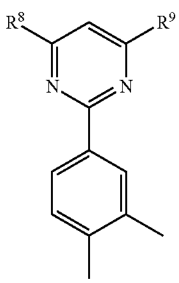
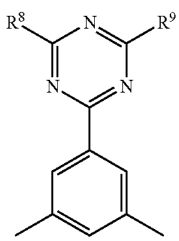
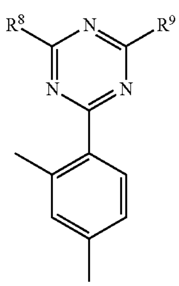
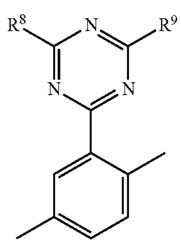
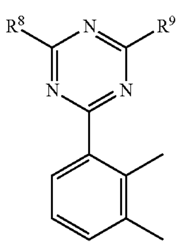
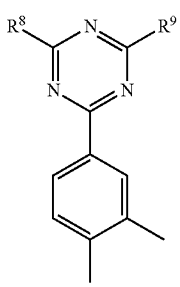
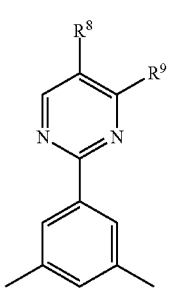
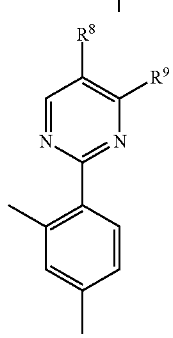
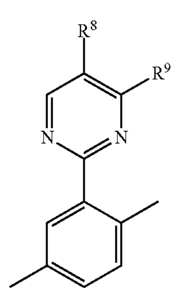
-continued
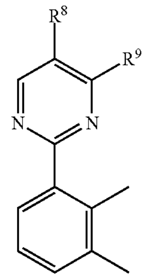
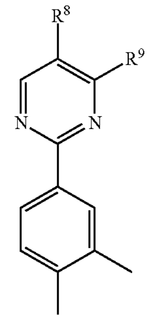
The group represented by the general formula (112) preferably has any one of the following structures.
[Chemical Formula 6]
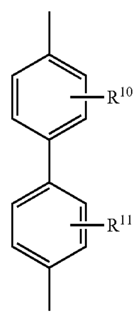
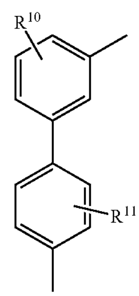
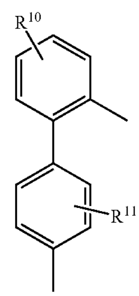
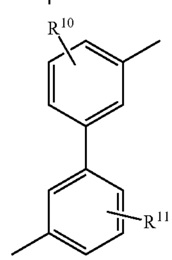
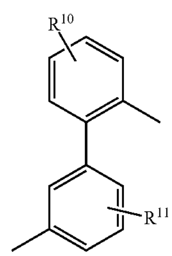
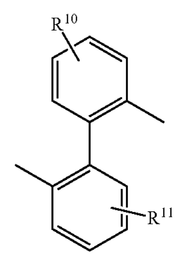
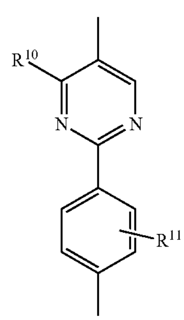
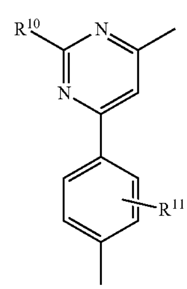
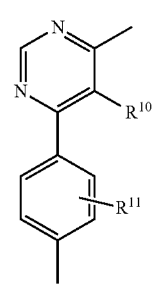
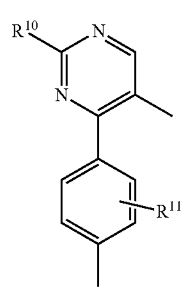
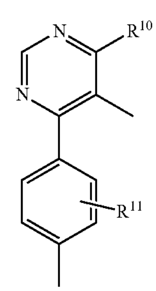
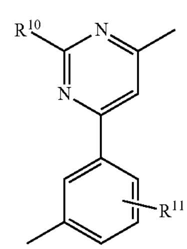

-continued
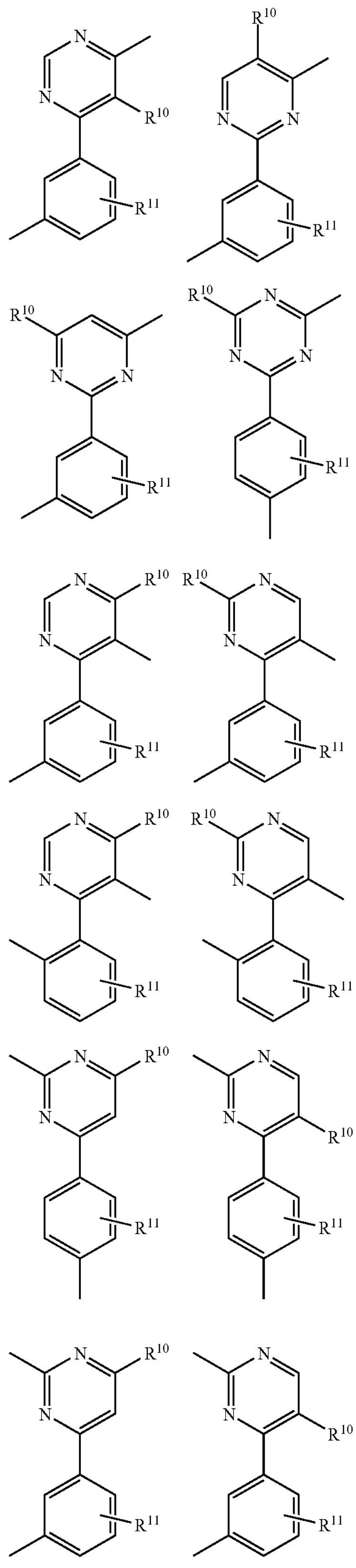
The group represented by the general formula (113) preferably has any one of the following structures.
[Chemical Formula 7]
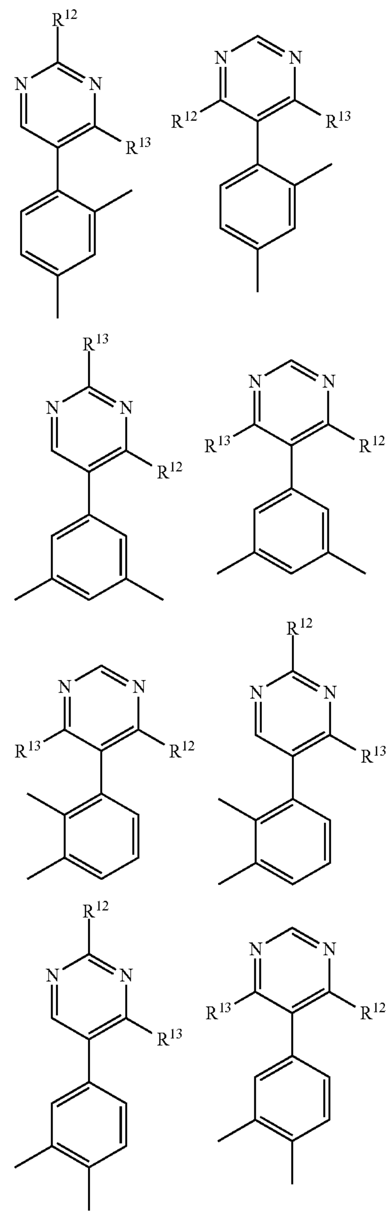
The group represented by the general formula (114) preferably has any one of the following structures.
[Chemical Formula 8]
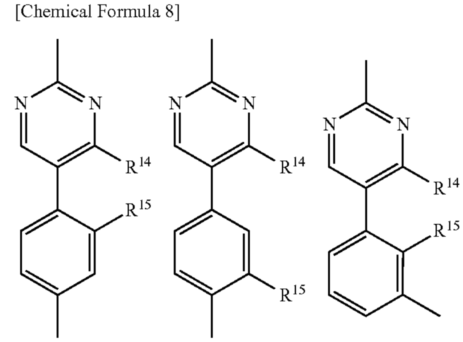

-continued
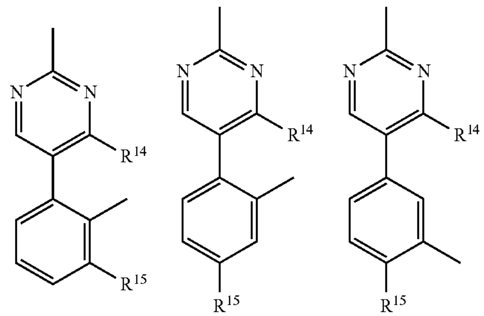
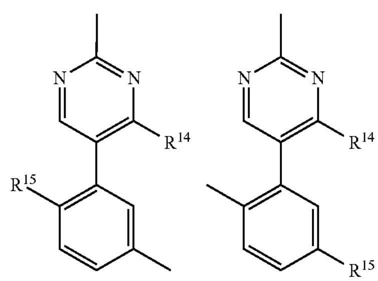
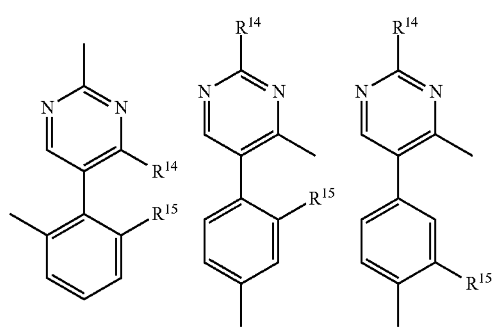
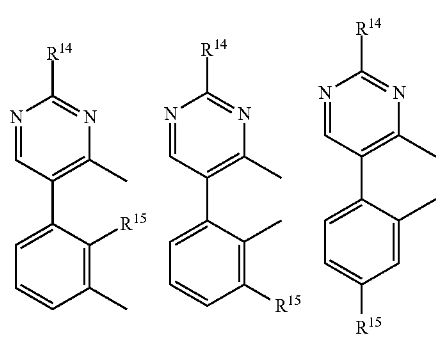
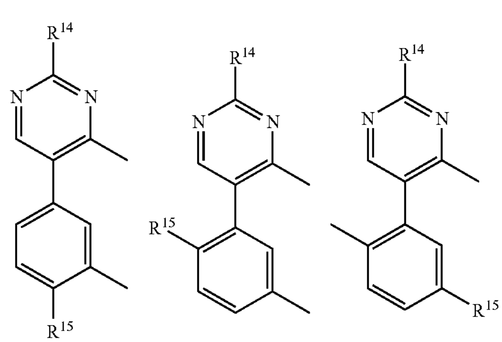
-continued
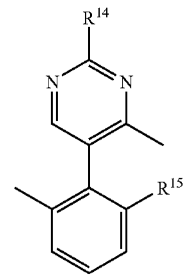
The group represented by the general formula (115) preferably has any one of the following structures.
[Chemical Formula 9]
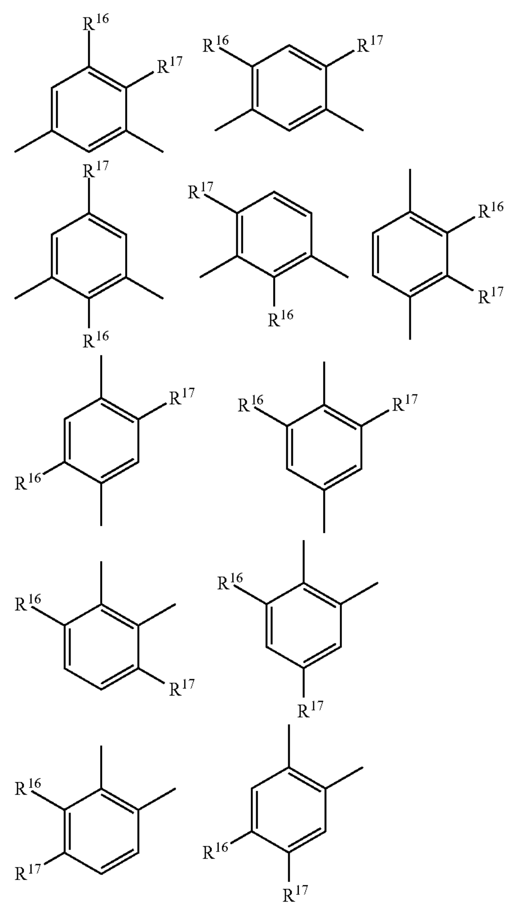
The group represented by the general formula (116) preferably has any one of the following structures.
[Chemical Formula 10]
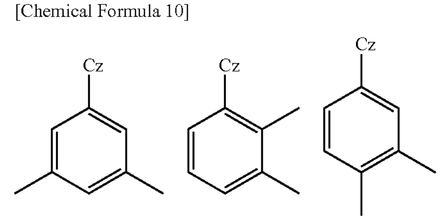

-continued

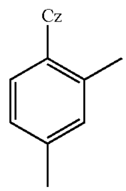

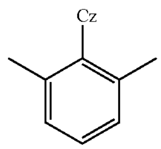

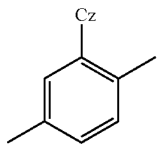

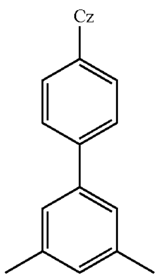

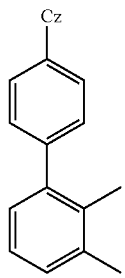

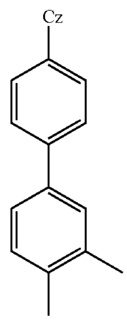

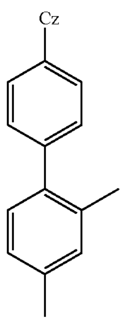

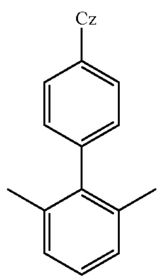

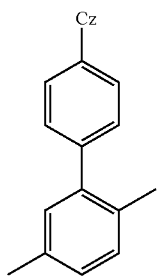

In the formula (105), W is a group represented by one of the following formulae (121) to (125).

[Chemical Formula 11]

(121)

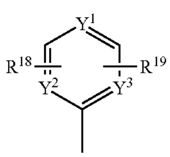

(122)

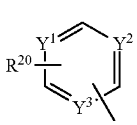

(123)

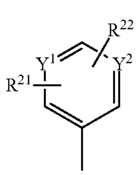

(124)

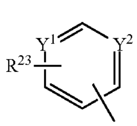

-continued (125)

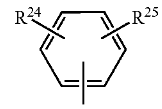

In the formulae (121) to (125), $R^{18}$ to $R^{25}$ represent the same as those represented by $R^8$ to $R^{17}$. $Y^1$ to $Y^3$ are the same as $Y^1$ to $Y^3$ in the formulae (111) to (114).

Examples of the groups represented by $R^{18}$ to $R^{25}$ are the same as the examples described in relation to $R^1$ to $R^7$. The preferable examples are also the same.

In the formulae (101) to (105), Cz is a group represented by either one of the following formulae (131) and (132).

[Chemical Formula 12]

(131)

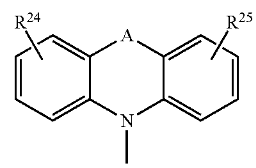

(132)

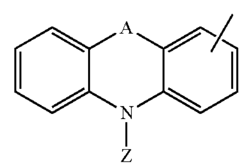

In the formulae (131) and (132), A represents a single bond, —$(CR^{26}R^{27})_n$— (n is an integer of 1 to 3), —$SiR^{28}R^{29}$—, —$NR^{30}$—, —O— or —S—. $R^{26}$ and $R^{27}$, and $R^{28}$ and $R^{29}$ are may be bonded together to form a saturated or unsaturated cyclic structure. $R^{24}$ to $R^{30}$ each independently represent a hydrogen atom, halogen atom, substituted or unsubstituted alkyl group having 1 to 40 carbon atoms, substituted or unsubstituted heterocyclic group having 3 to 30 carbon atoms, substituted or unsubstituted alkoxy group having 1 to 40 carbon atoms, substituted or unsubstituted aryl group having 6 to 40 carbon atoms, substituted or unsubstituted aryloxy group having 6 to 40 carbon atoms, substituted or unsubstituted aralkyl group having 7 to 40 carbon atoms, substituted or unsubstituted alkenyl group having 2 to 40 carbon atoms, substituted or unsubstituted alkylamino group having 1 to 80 carbon atoms, substituted or unsubstituted arylamino group having 6 to 80 carbon atoms, substituted or unsubstituted aralkylamino group having 7 to 80 carbon atoms, substituted or unsubstituted alkylsilyl group having 3 to 10 carbon atoms, substituted or unsubstituted arylsilyl group having 6 to 30 carbon atoms or cyano group. $R^{24}$ to $R^{25}$ each may be plural. An adjacent set thereof may form a saturated or unsaturated cyclic structure.

In the formula (132), Z represents a substituted or unsubstituted alkyl group having 1 to 20 carbon atoms, a substituted or unsubstituted aryl group having 6 to 18 carbon atoms, or a substituted or unsubstituted aralkyl group having 7 to 40 carbon atoms.

Examples of the alkyl group having 1 to 20 carbon atoms represented by Z are a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neo-pentyl group, a 1-methylpentyl group, 2-methylpentyl group, a 1-pentylhexyl group, a 1-butylpentyl group, a 1-heptyloctyl group and 3-methylpentyl group. The preferable examples are a methyl group, ethyl group, propyl group, n-hexyl group and n-heptyl group.

Examples of the aryl group represented by Z are a phenyl group, naphthyl group, tolyl group, biphenyl group and terphenyl group. The preferable examples are a phenyl group, biphenyl group and tolyl group.

Examples of the aralkyl group represented by Z are an α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, benzyl group, p-cyanobenzyl group, m-cyanobenzyl group, o-cyanobenzyl group, 1-phenylethyl group, 2-phenylethyl group, 1-phenylisopropyl group and 2-phenylisopropyl group. Preferable examples are a benzyl group and p-cyanobenzyl group.

Cz preferably has any one of the following structures.

[Chemical Formula 13]

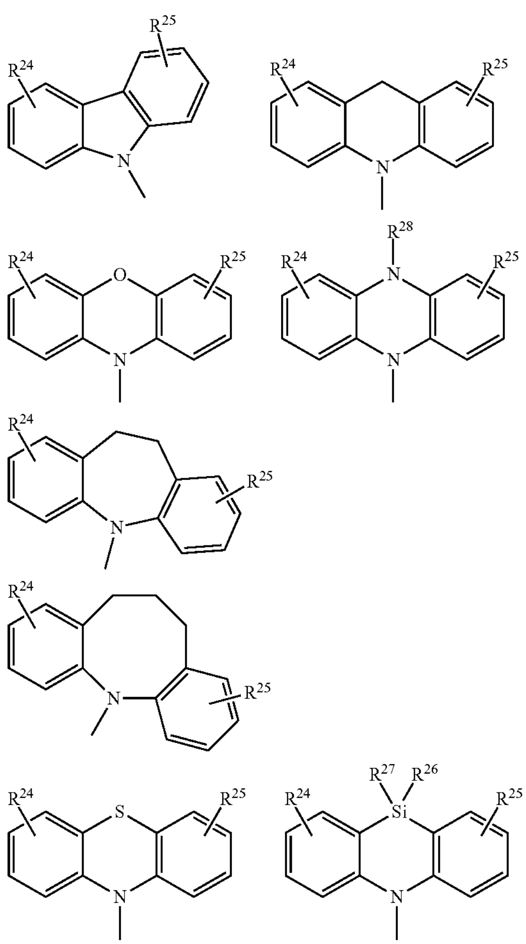

-continued

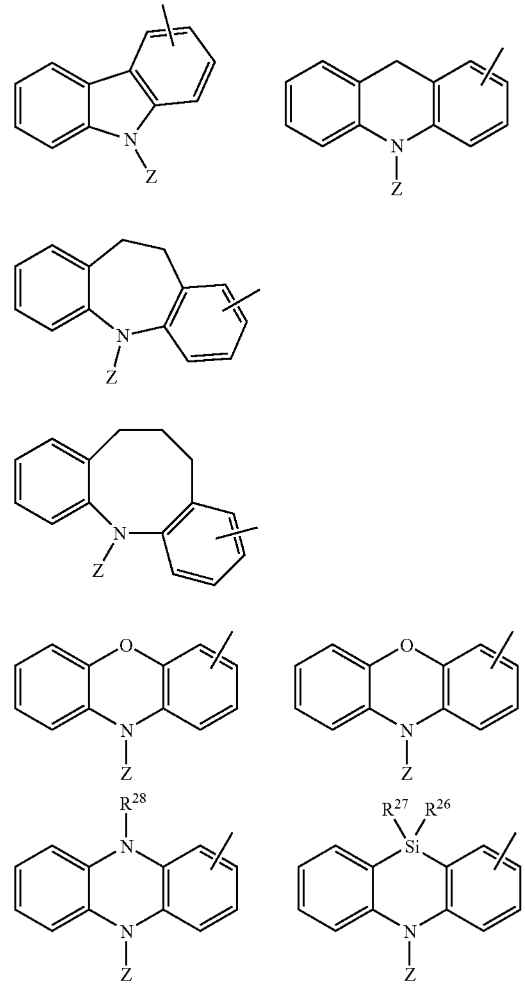

Cz more preferably has any one of the following structures.

[Chemical Formula 14]

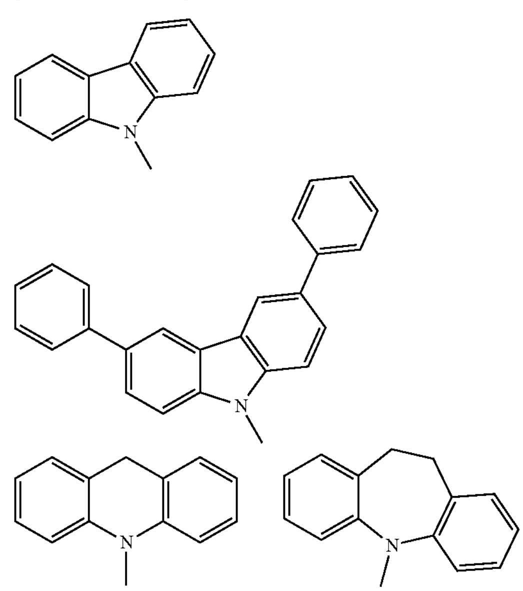

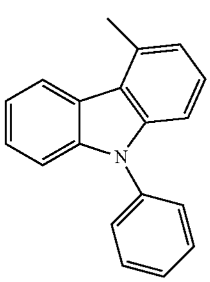
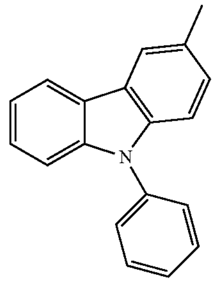
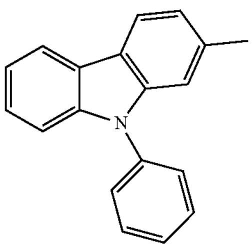
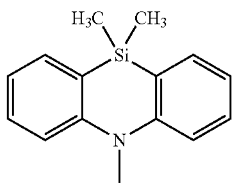
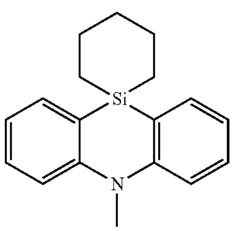

In addition, Cz particularly preferably represents a substituted or unsubstituted carbazolyl group, or substituted or unsubstituted arylcarbazolyl group.

Examples of the substituents for the groups exemplified in the general formulae (101) to (105) are a halogen atom, hydroxyl group, amino group, nitro group, cyano group, alkyl group, alkenyl group, cycloalkyl group, alkoxy group, aromatic hydrocarbon group, aromatic heterocyclic group, aralkyl group, aryloxy group and alkoxycarbonyl group.

Examples of the organic-EL-device material containing the compound represented by any one of the formulae (101) to (105) according to the aspect of the invention will be shown below. However, the invention is not limited to the exemplary compounds shown below.

[Chemical Formula 15]

(C1)

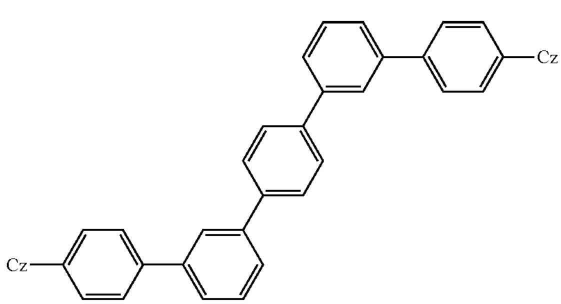

(C2)

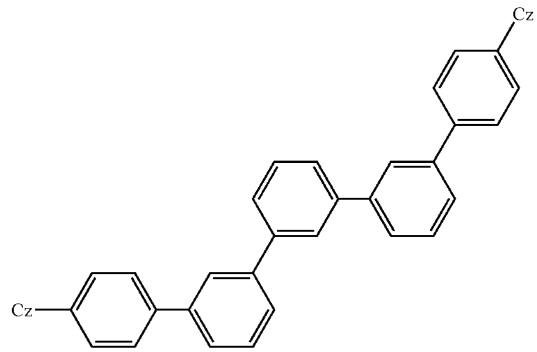

(C3)

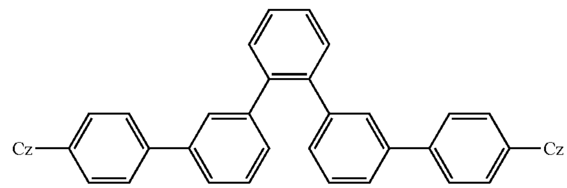

(C4)

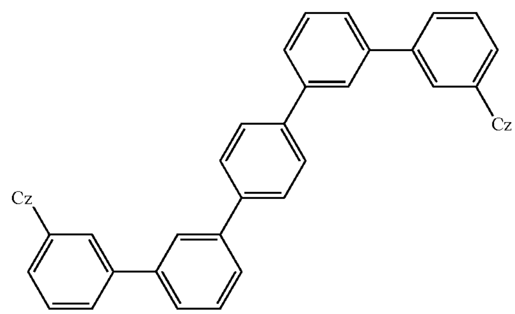

(C5)

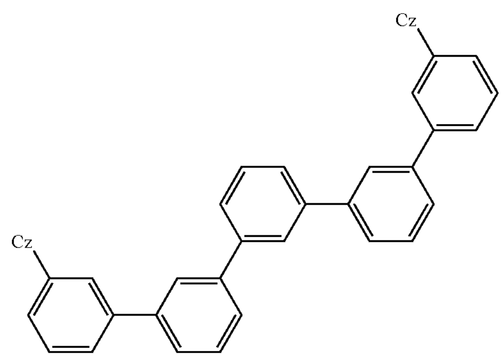

(C6)

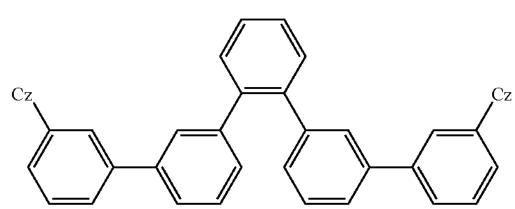

-continued
(C7)
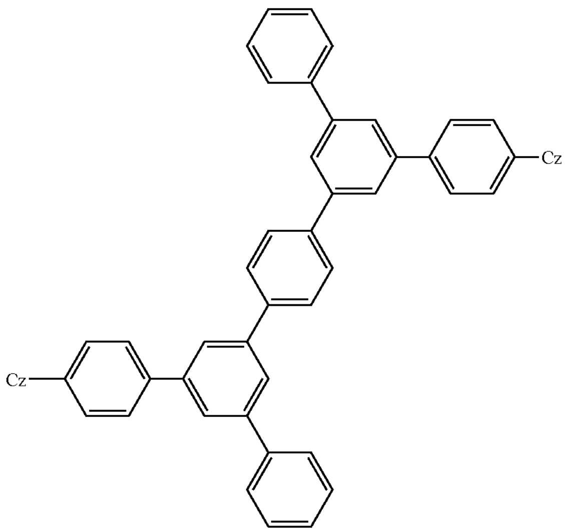
(C8)
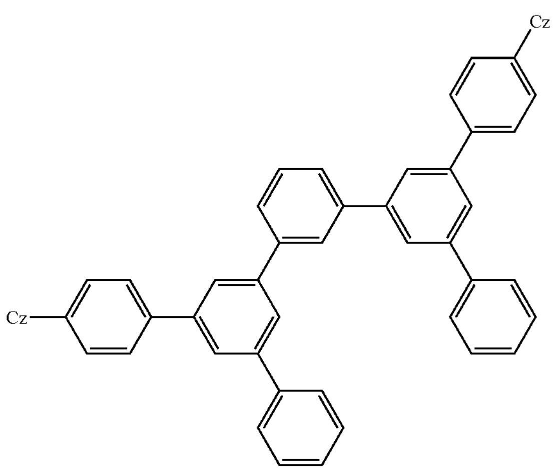
(C9)
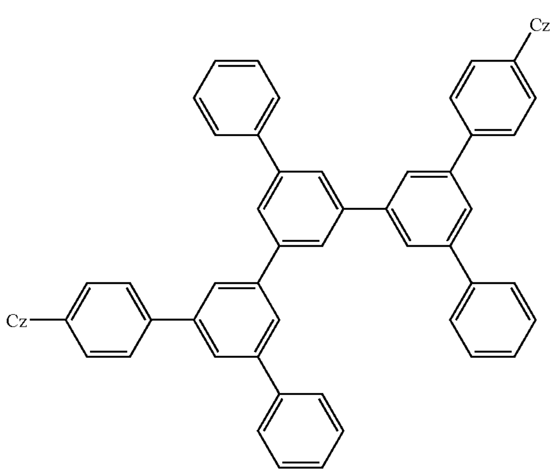
-continued
(C10)
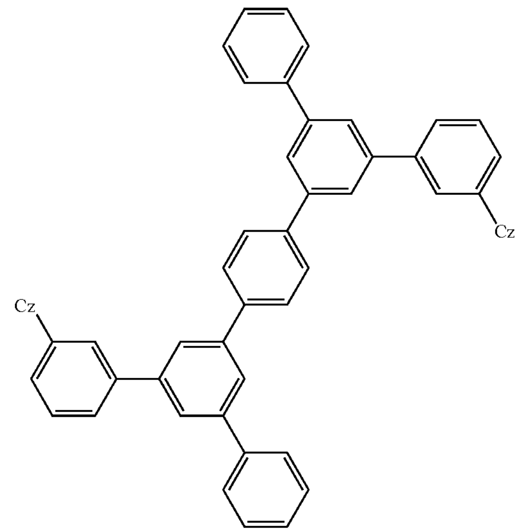
(C11)
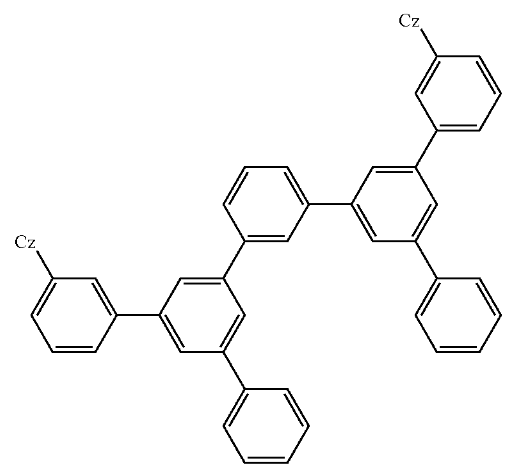
(C12)
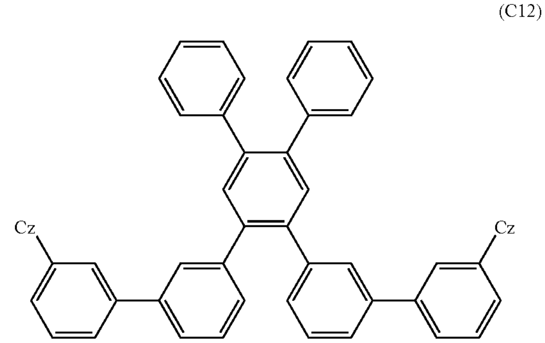

-continued
(C13)
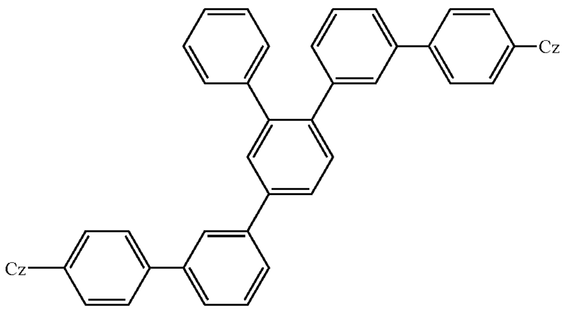
(C14)
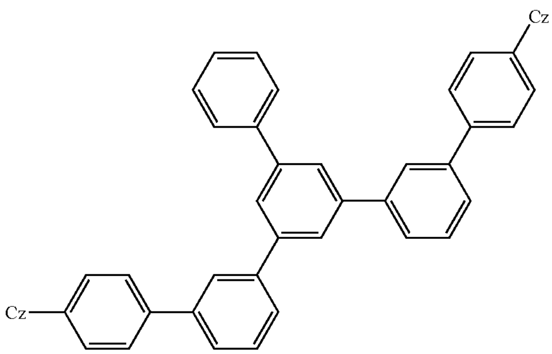
(C15)
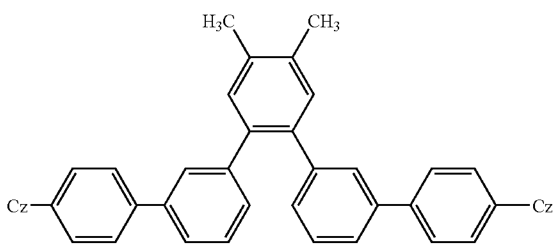
(C16)
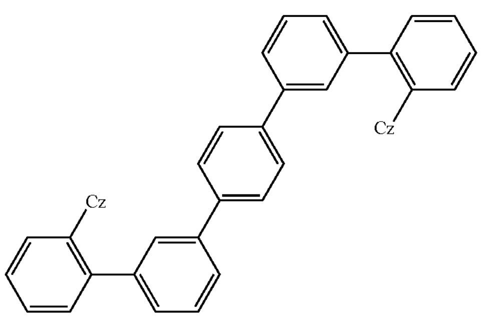
(C17)
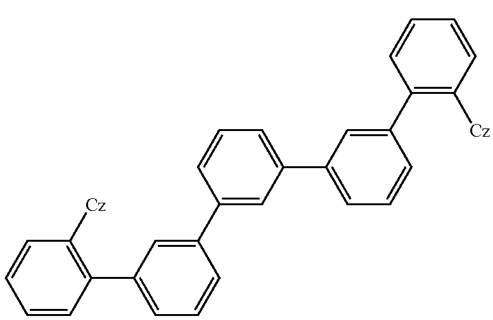
-continued
(C18)
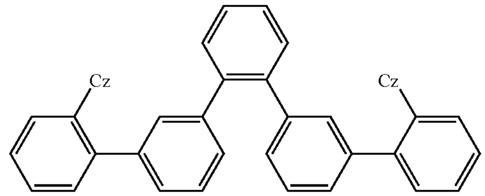
(C19)
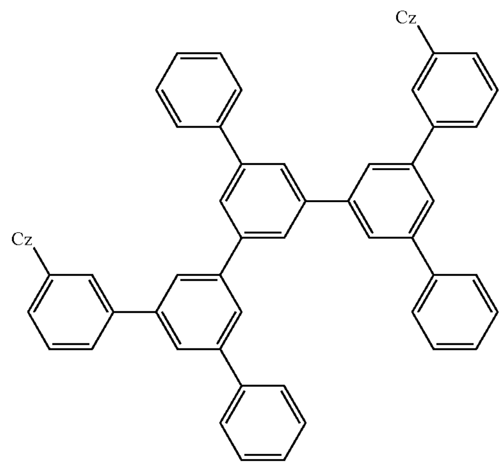
(C20)
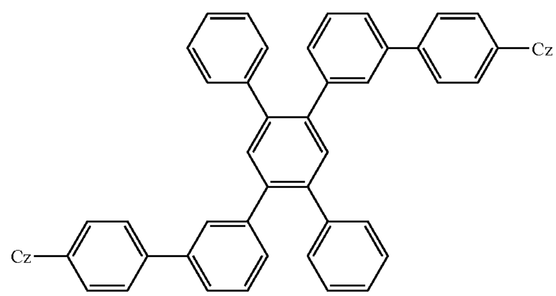
(C21)
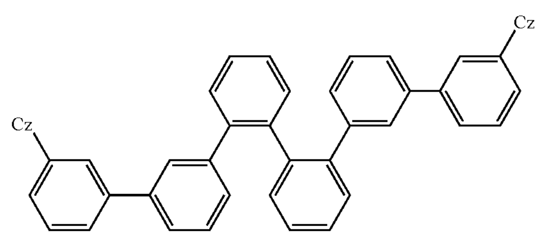
(C22)
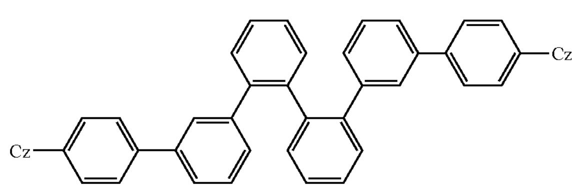
(C23)
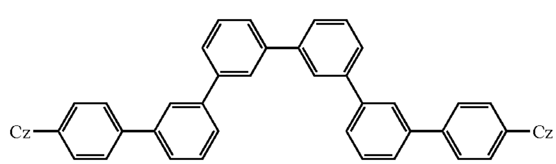

-continued
(C24)
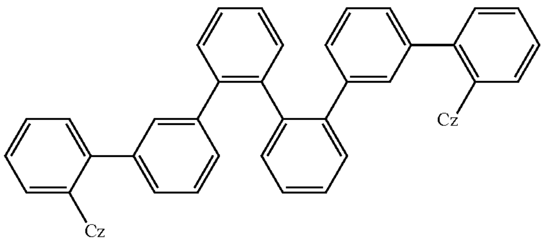
(C25)
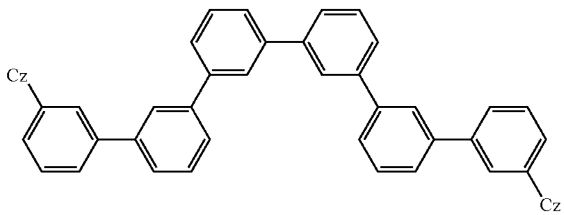
[Chemical Formula 16]
(C26)
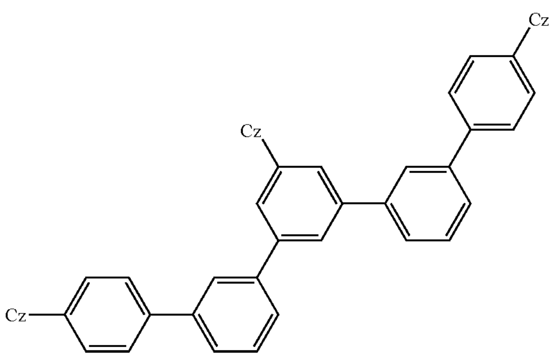
(C27)
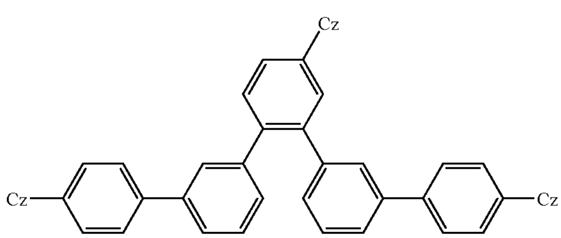
(C28)
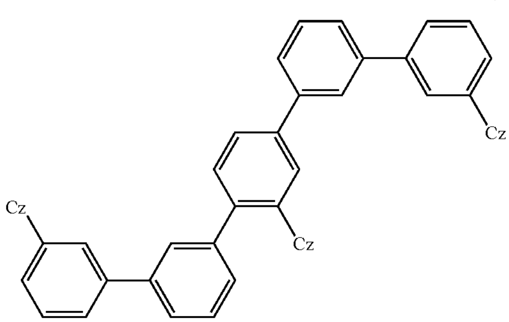
-continued
(C29)
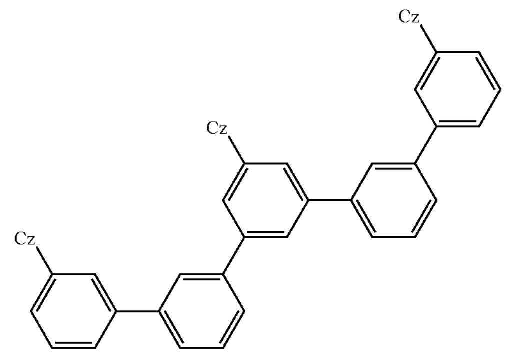
(C30)
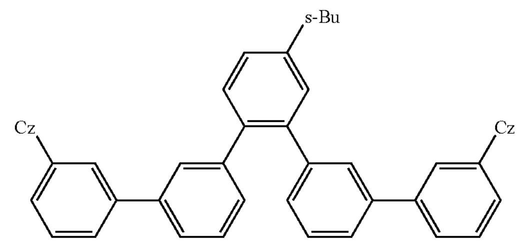
(C31)
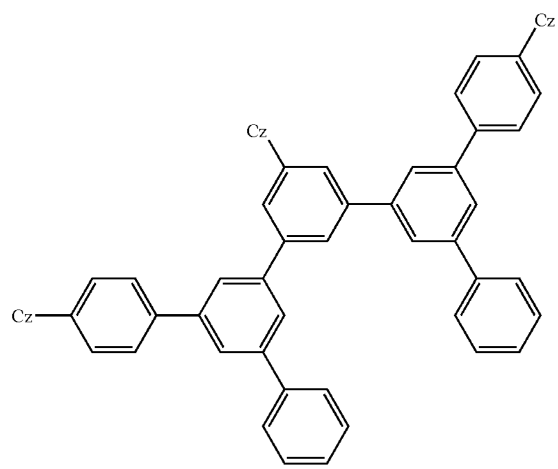
(C32)
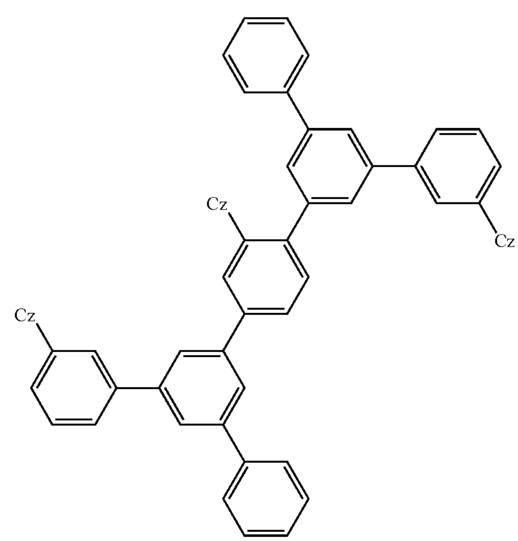

-continued
(C33)
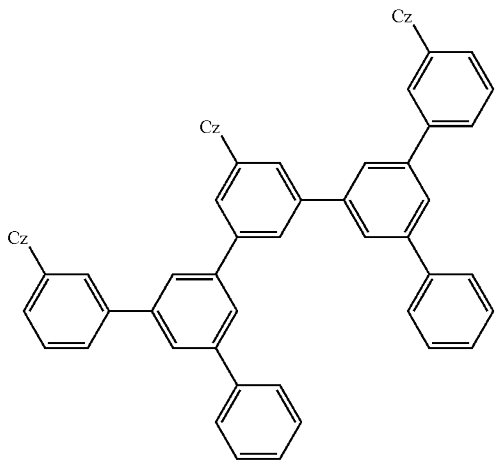
(C34)
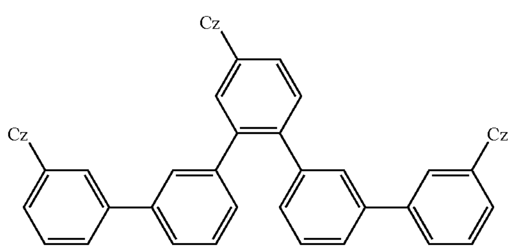
(C35)
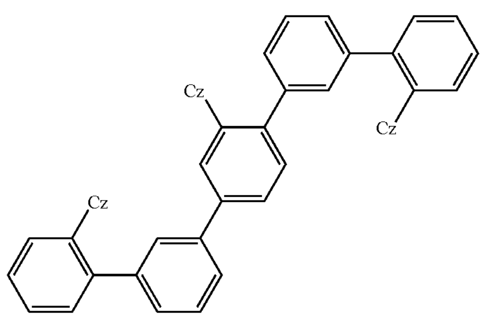
(C36)
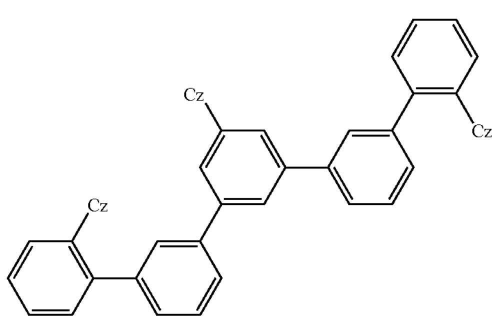
-continued
(C37)
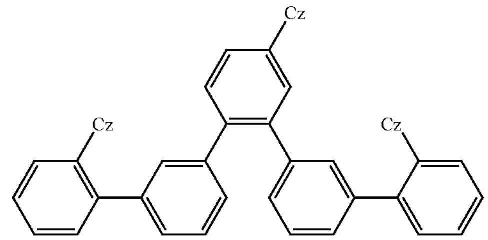
(C38)
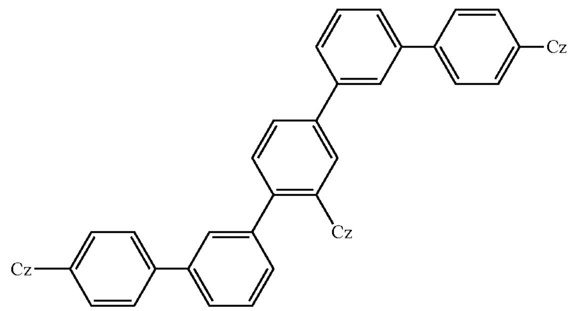
(C39)
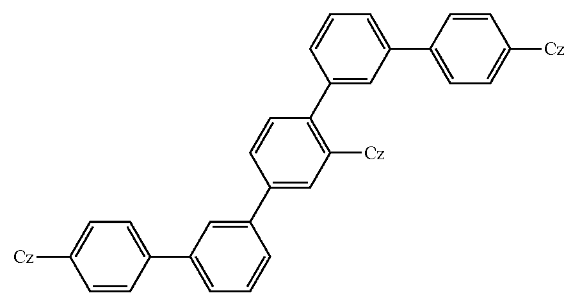
[Chemical Formula 17]
(C40)
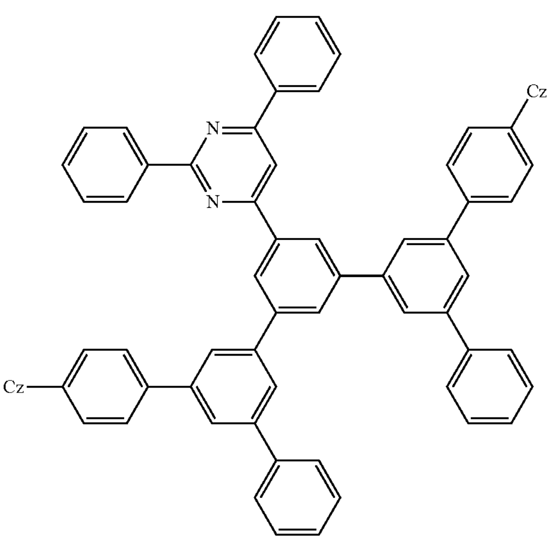

(C41)
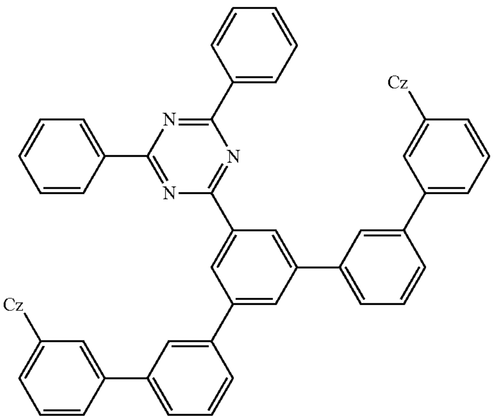
(C42)
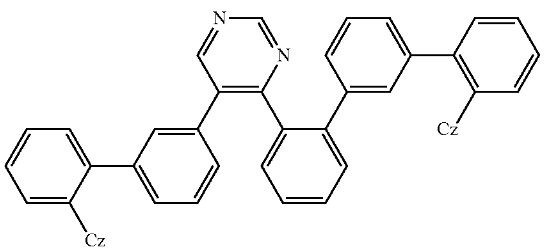
(C43)
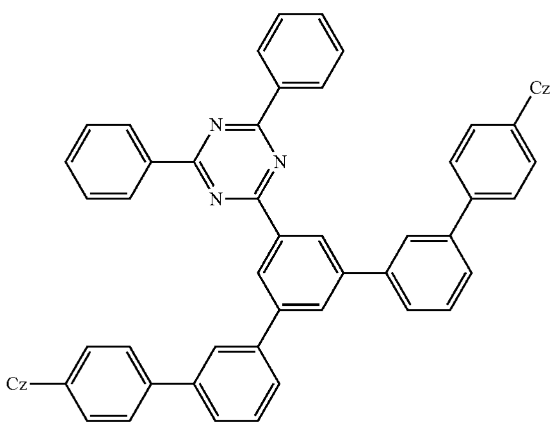
(C44)
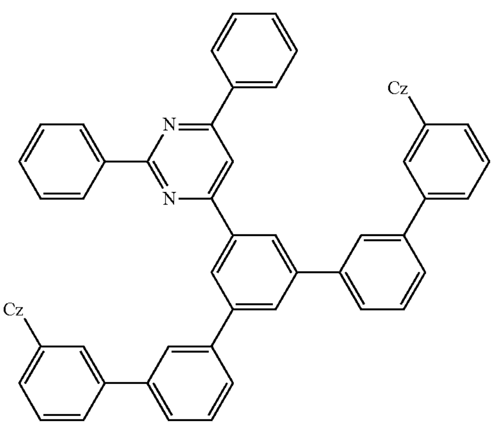
(C45)
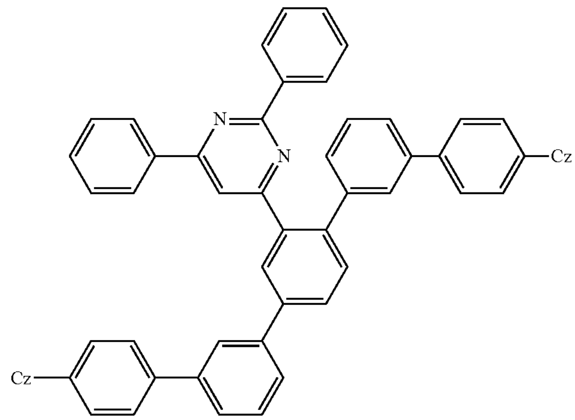
(C46)
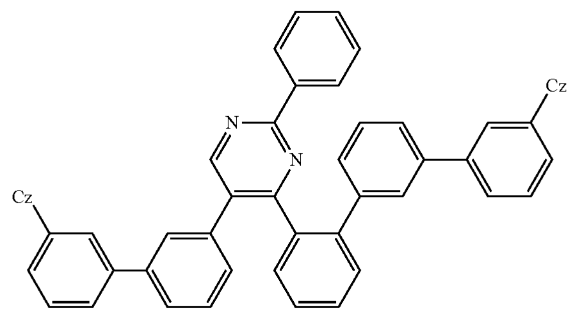
(C47)
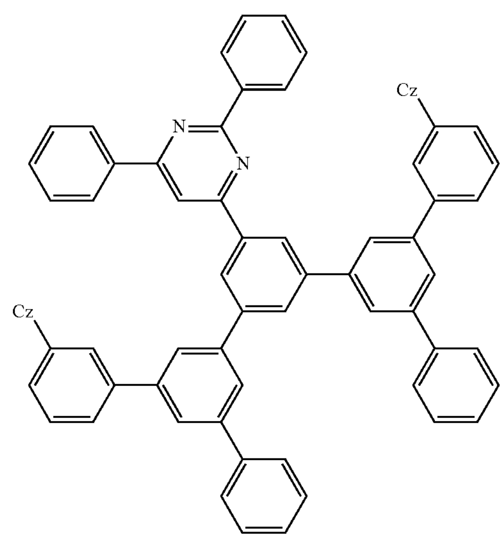

-continued
(C48)
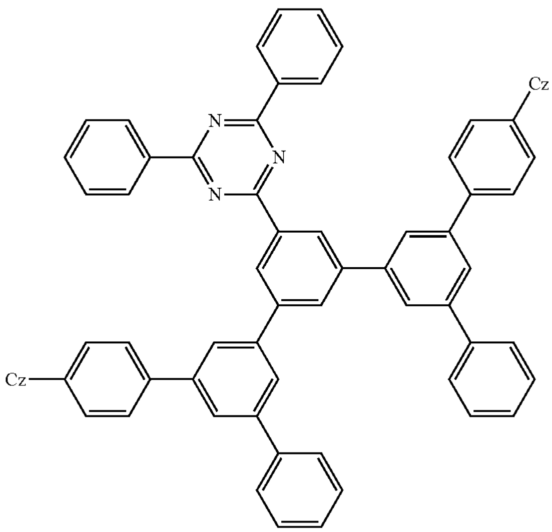
(C49)
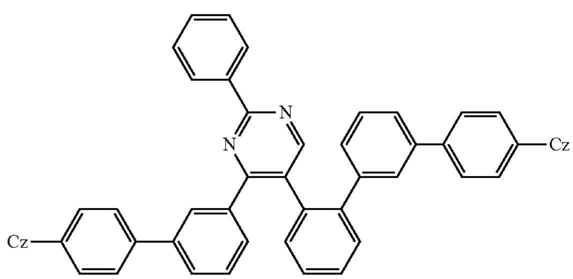
(C50)
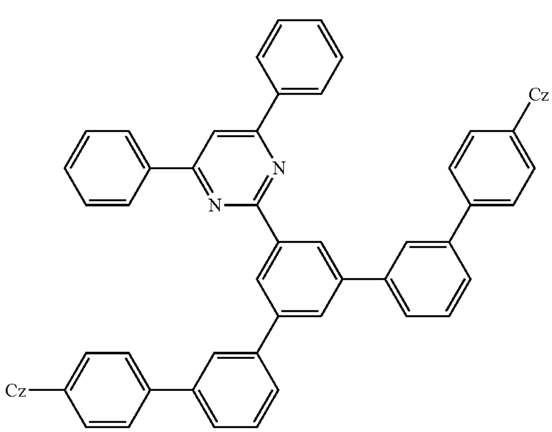
-continued
(C51)
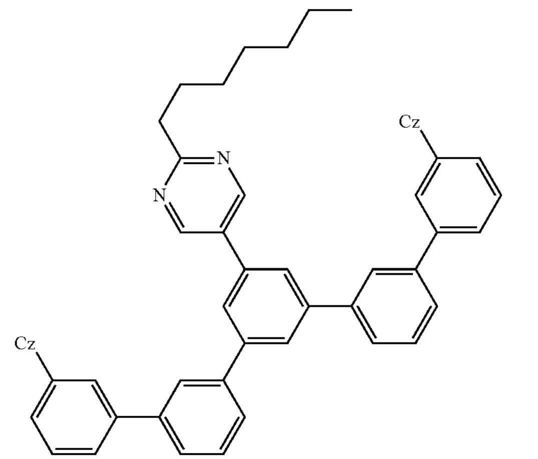
(C52)
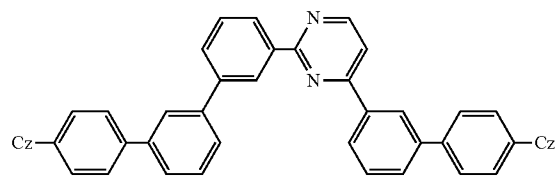
(C53)
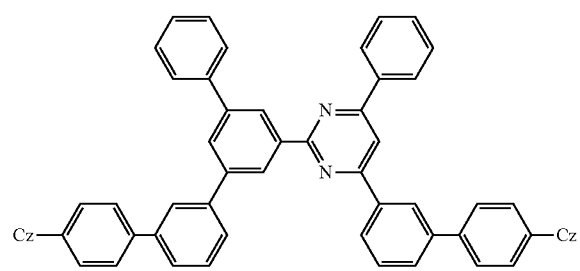
(C54)
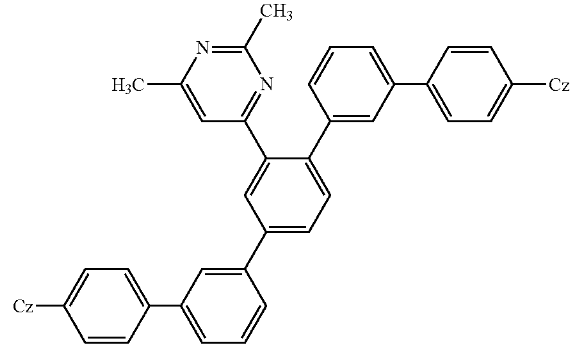

-continued
(C55)
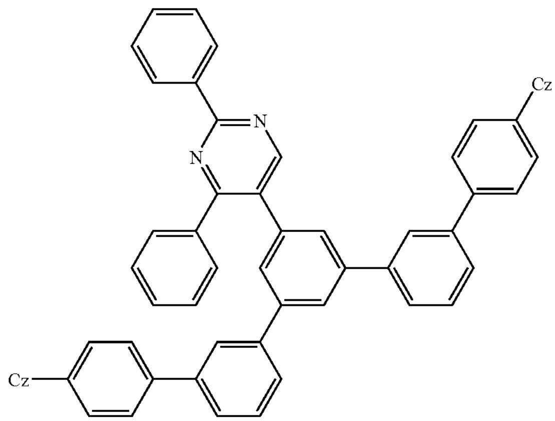
(C56)
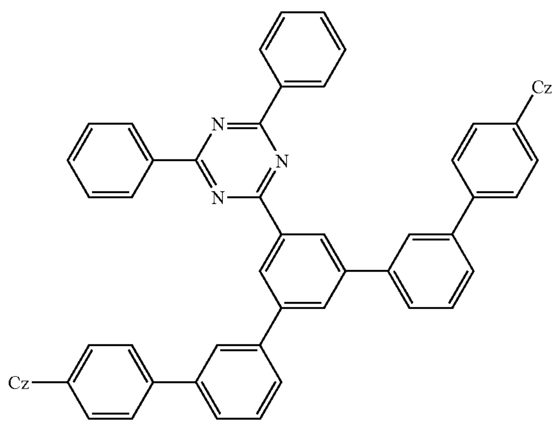
(C57)
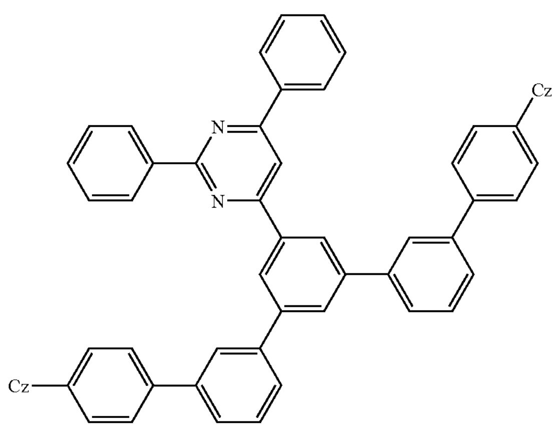
(C58)
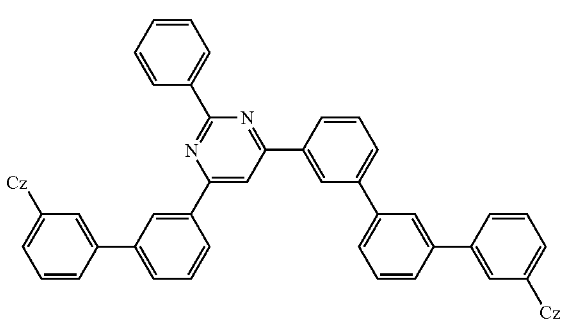
-continued
(C59)
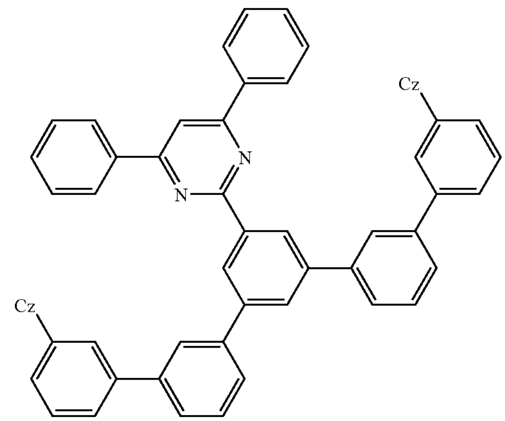
(C60)
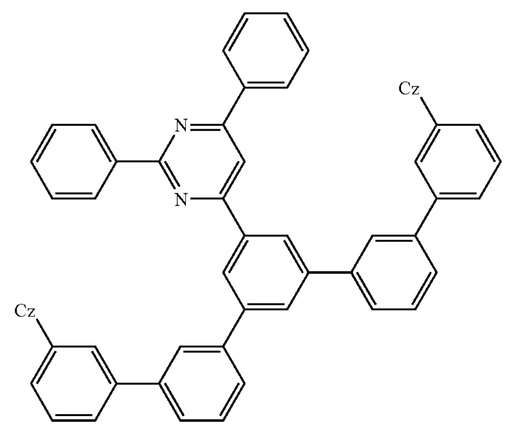
(C61)
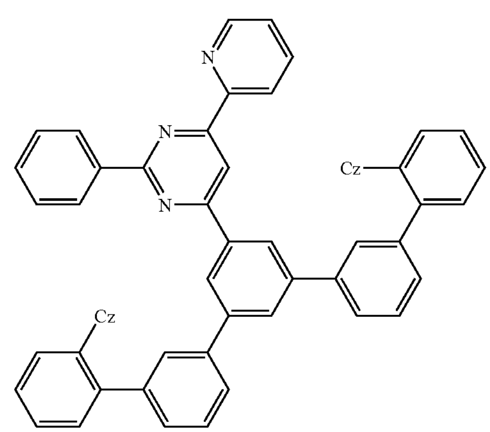

-continued
(C62)
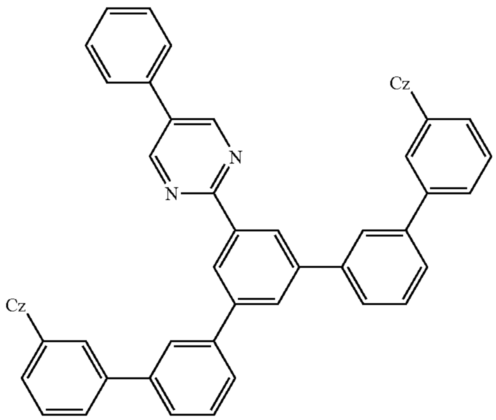
(C63)
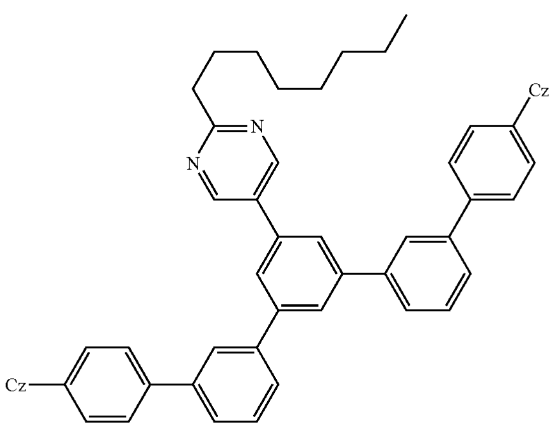
(C64)
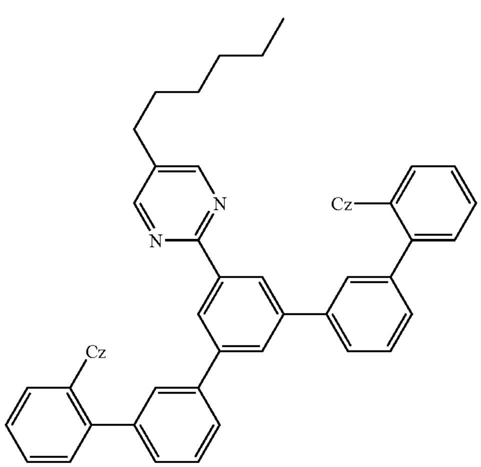
-continued
[Chemical Formula 18]
(C65)
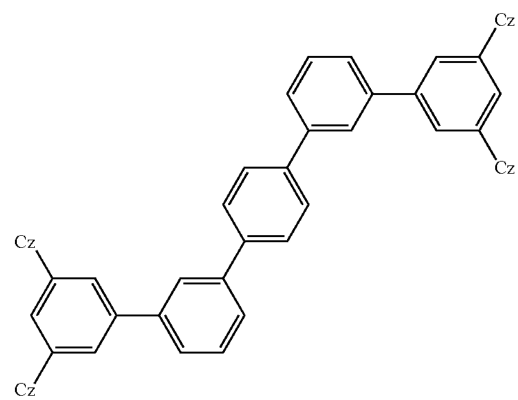
(C66)
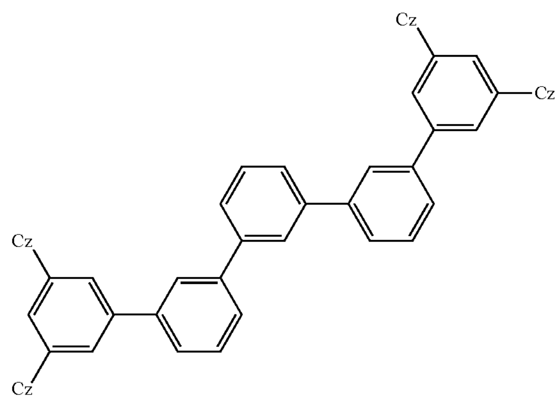
(C67)
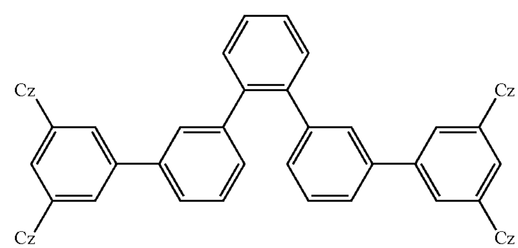
(C68)
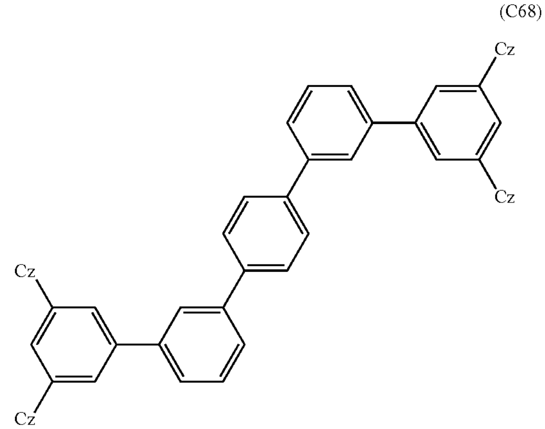

-continued
(C69)
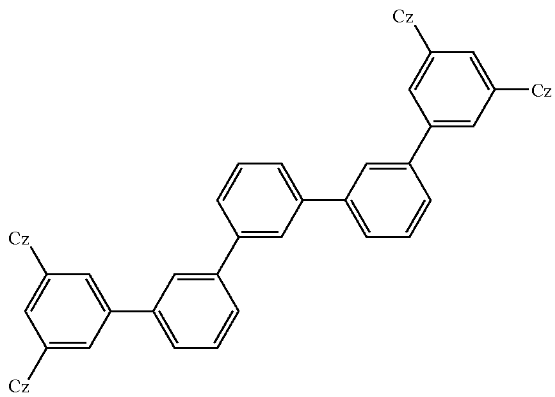
(C70)
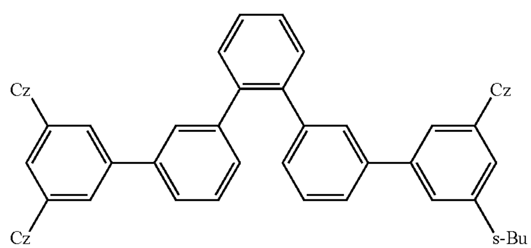
(C71)
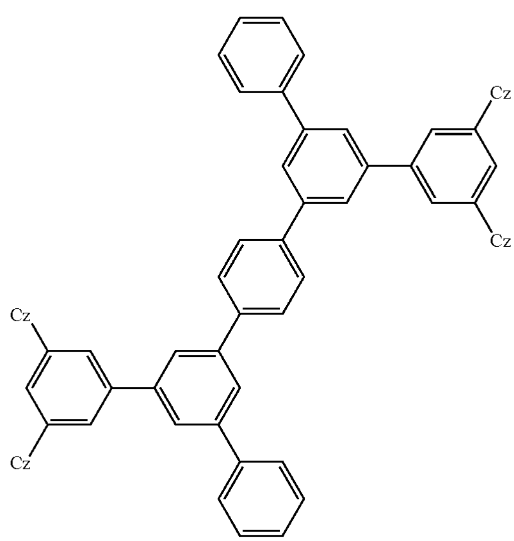
-continued
(C72)
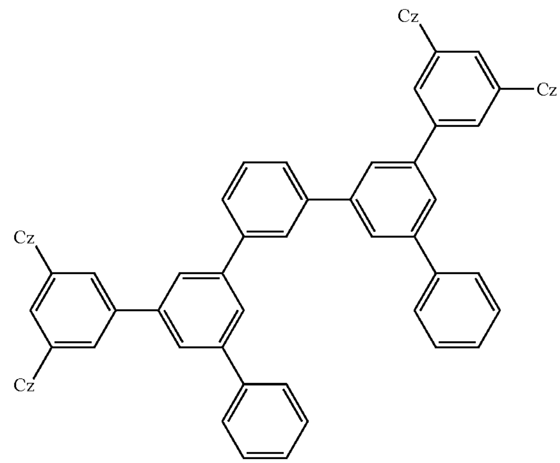
(C73)
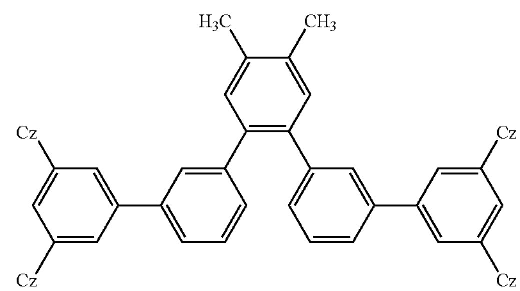
(C74)
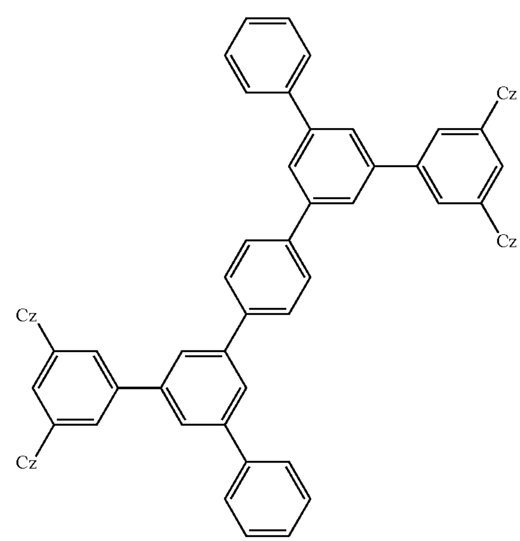

-continued
(C75)
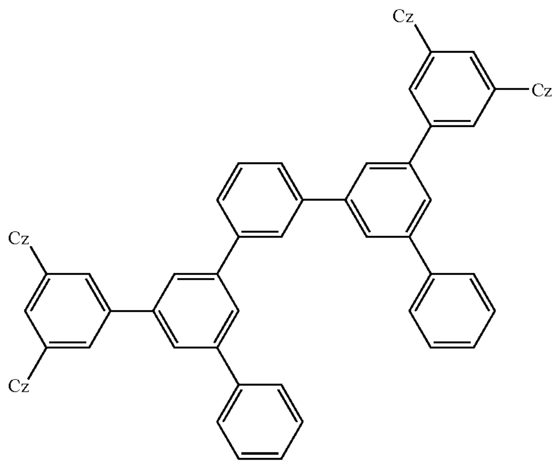
(C76)
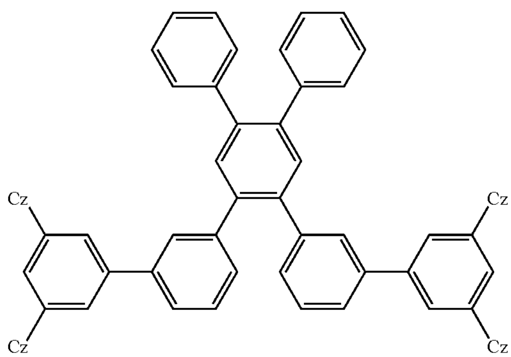
(C77)
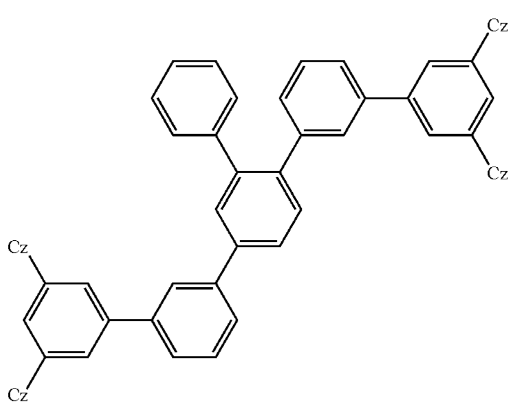
-continued
(C78)
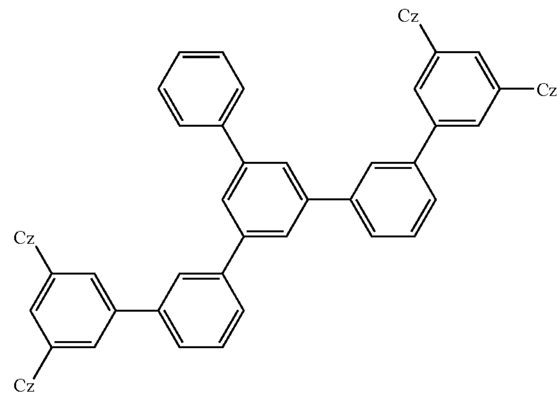
(C79)
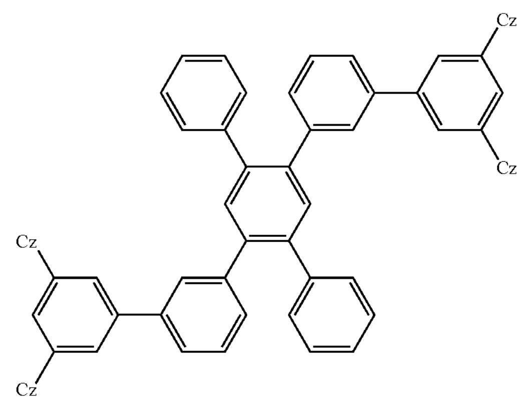
(C80)
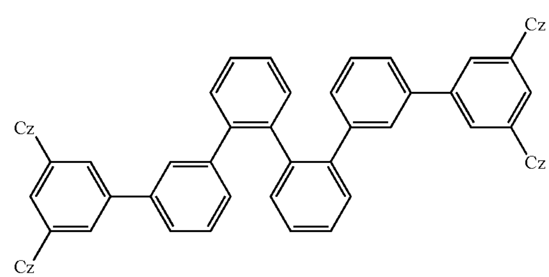
(C81)
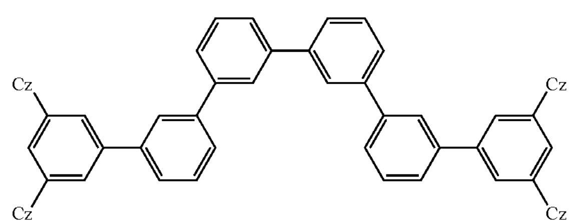

-continued
(C82)
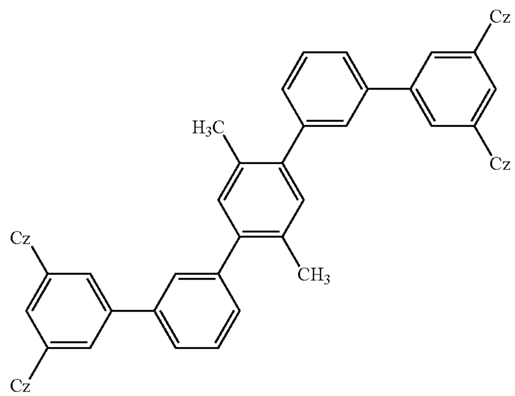
(C83)
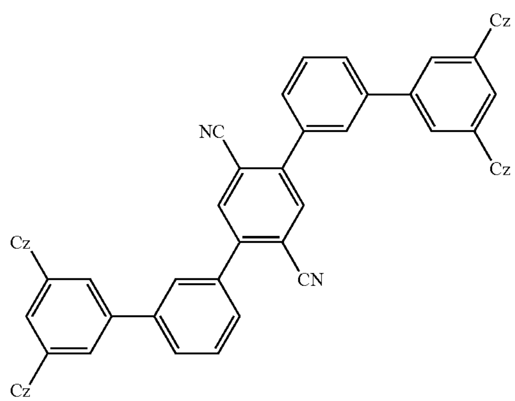
(C84)
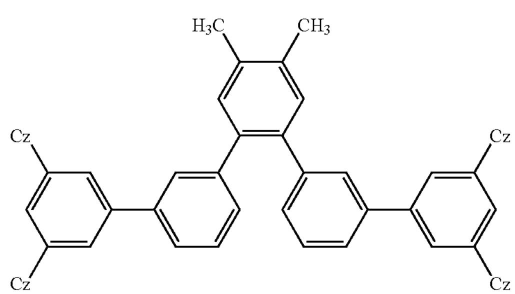
[Chemical Formula 19]
(C85)
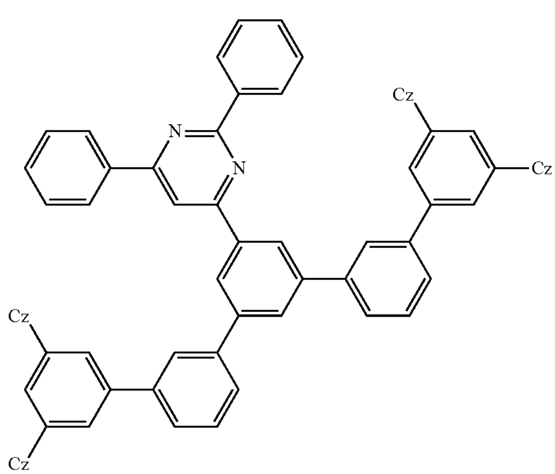
-continued
(C86)
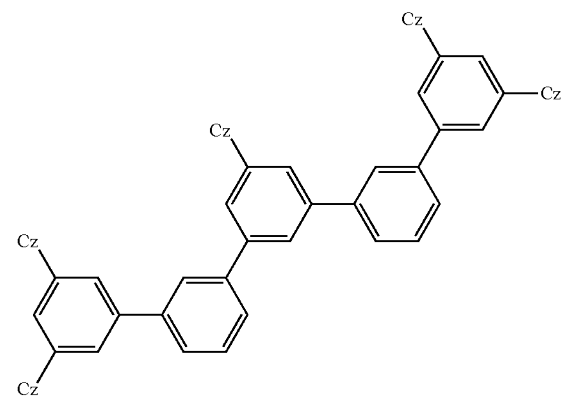
(C87)
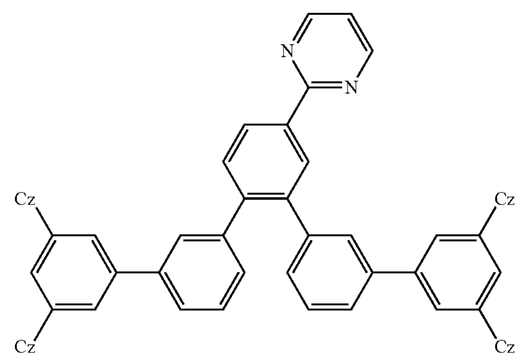
(C88)
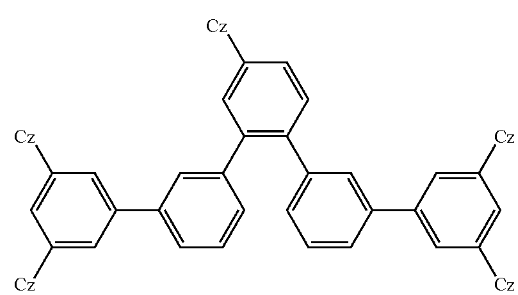
(C89)
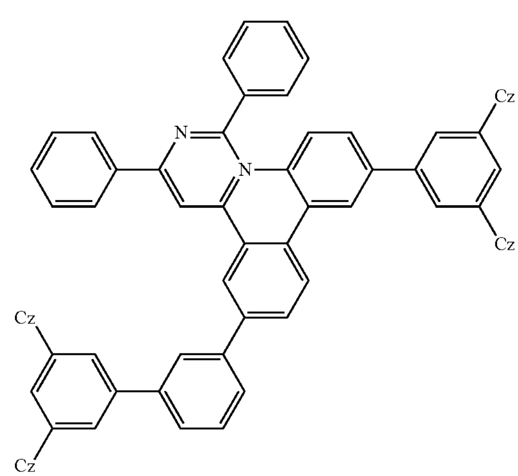

-continued
(C90)
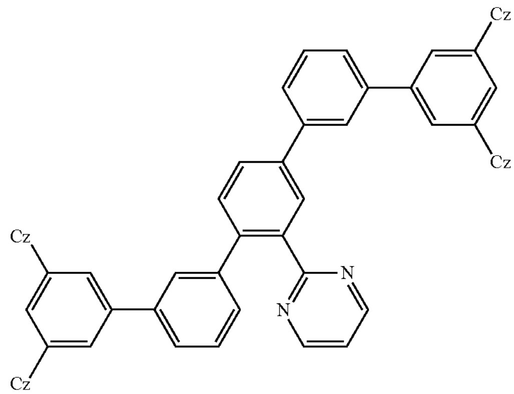
(C91)
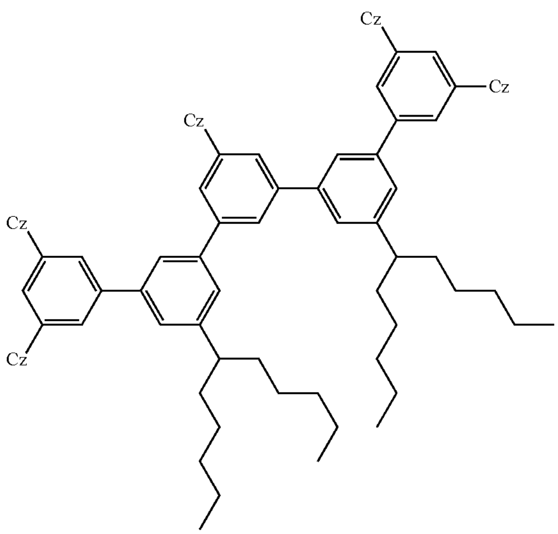
(C92)
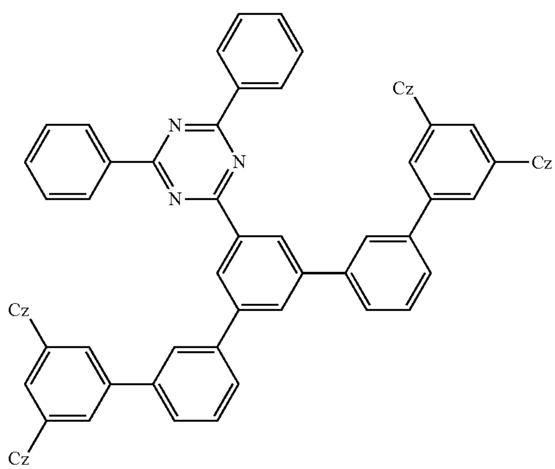
-continued
(C93)
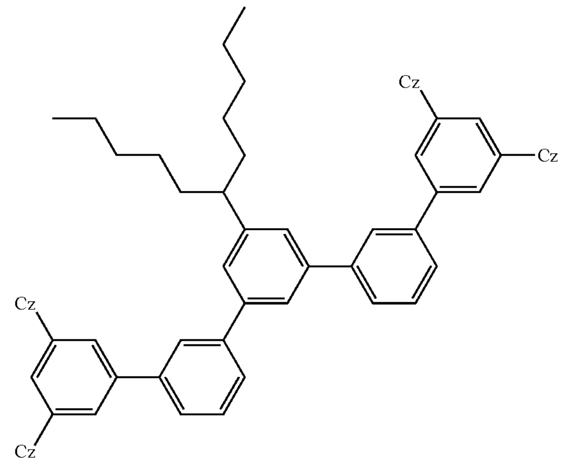
(C94)
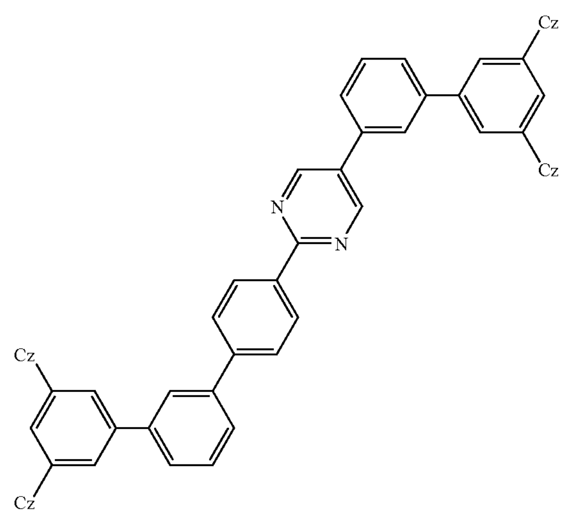
(C95)
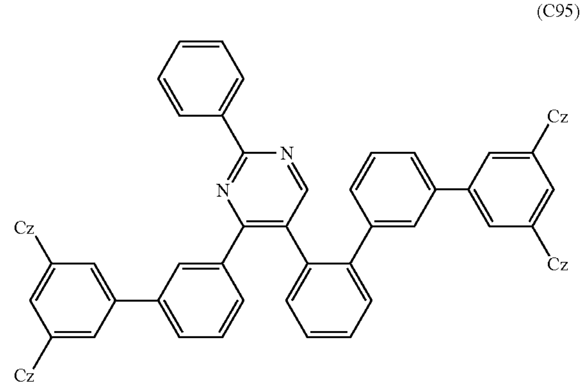

-continued
(C96)
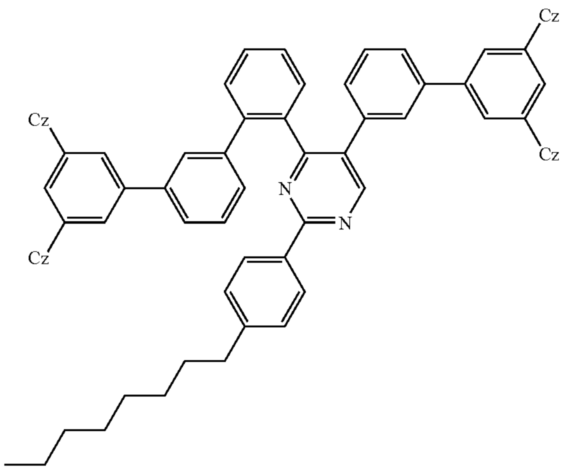
(C97)
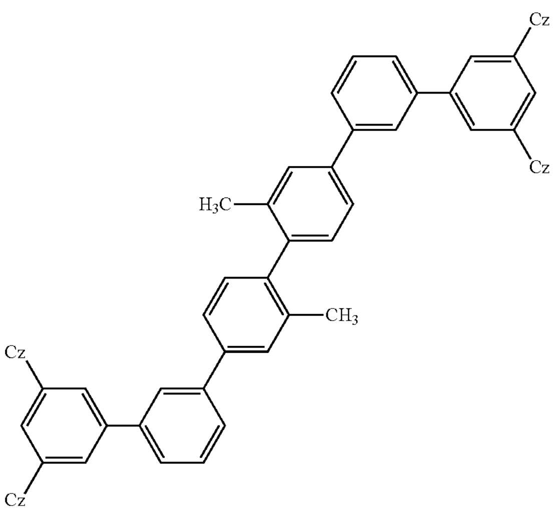
(C98)
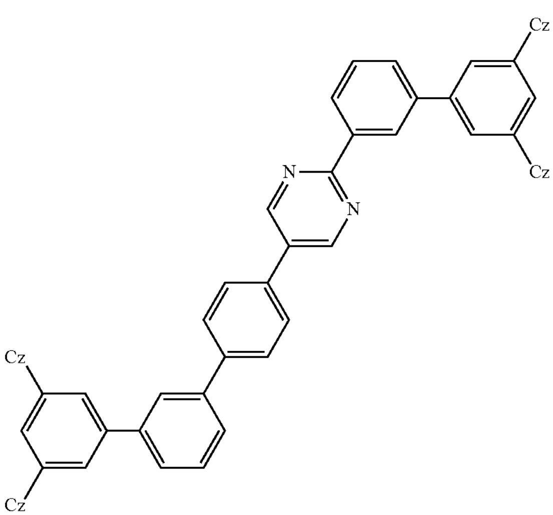
-continued
(C99)
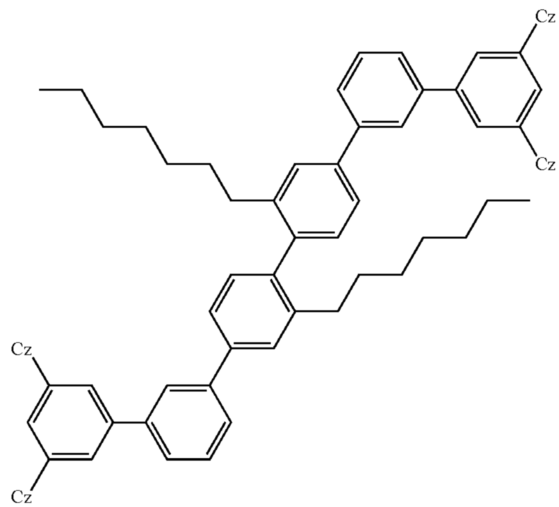
(C100)
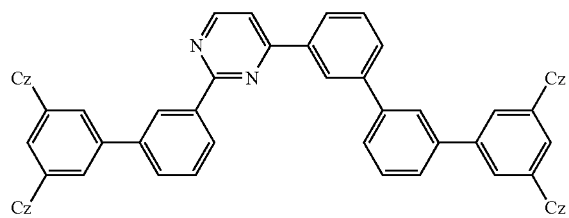
(C101)
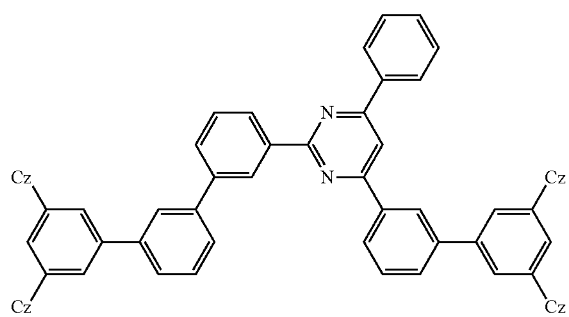
(C102)
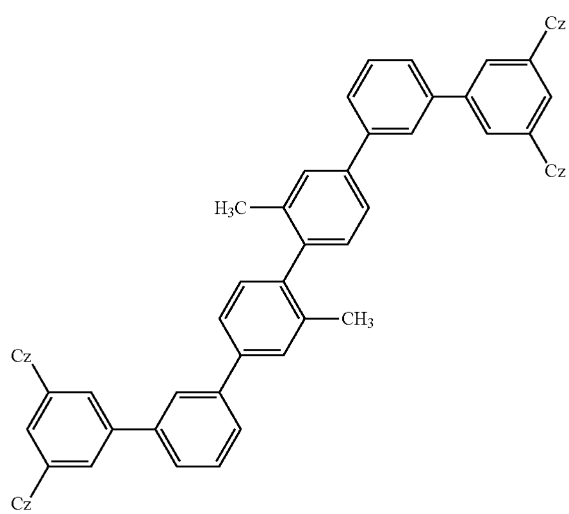

(C103)
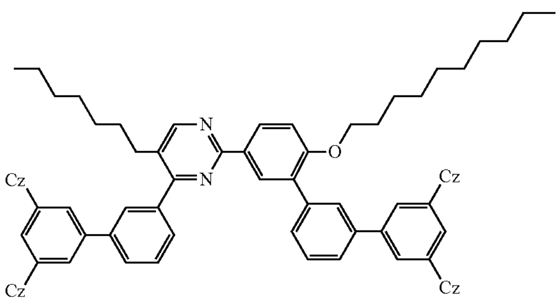
(C104)
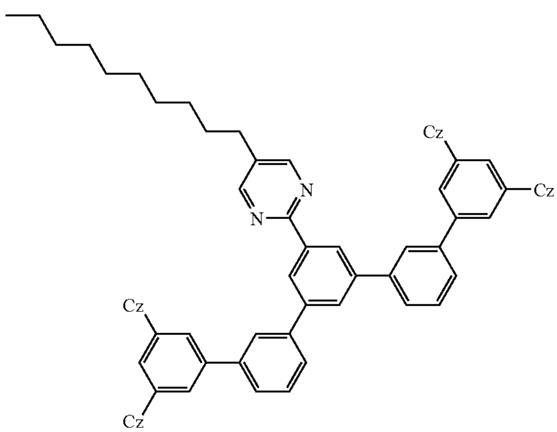
[Chemical Formula 20]
(C105)
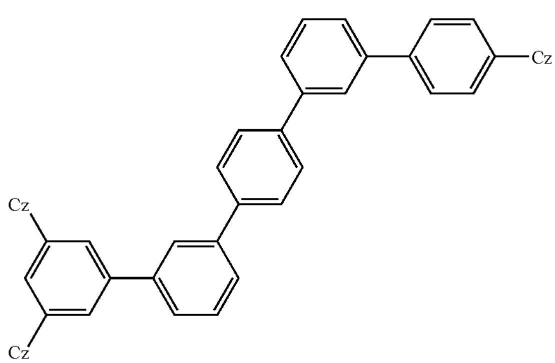
(C106)
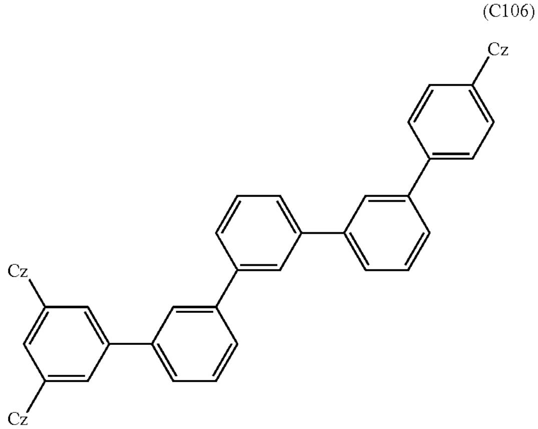
(C107)
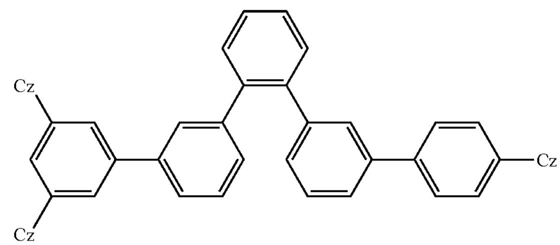
(C108)
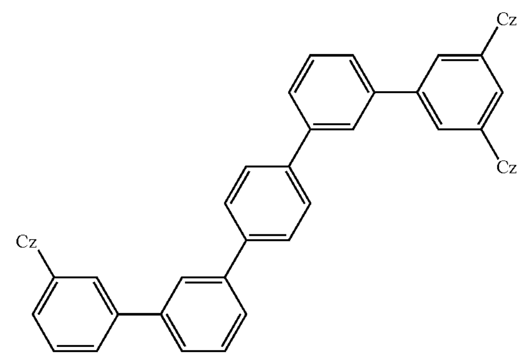
(C109)
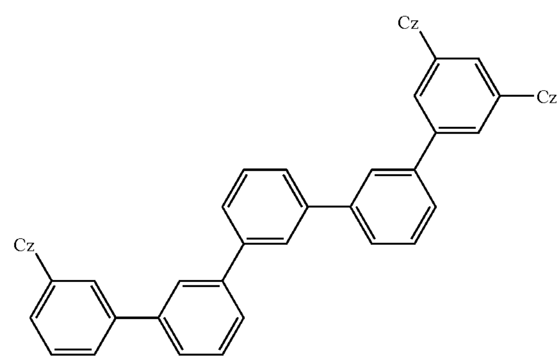
(C110)
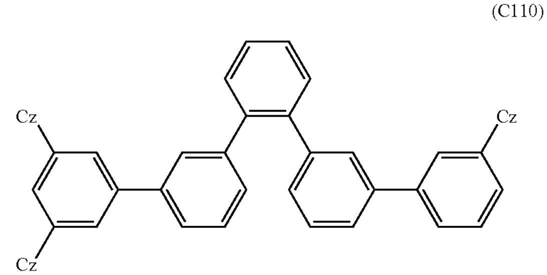

-continued
(C111)
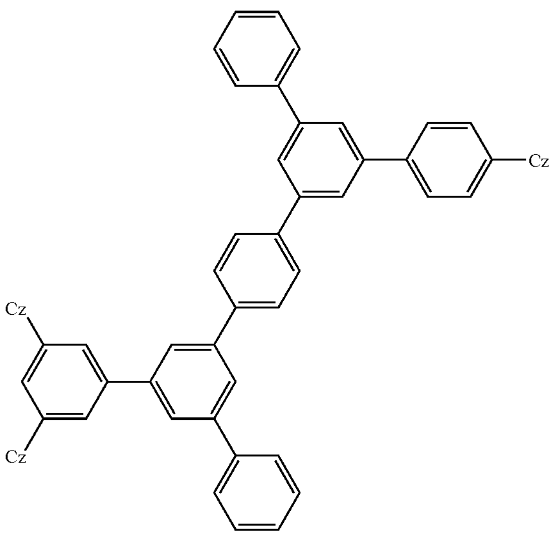
(C112)
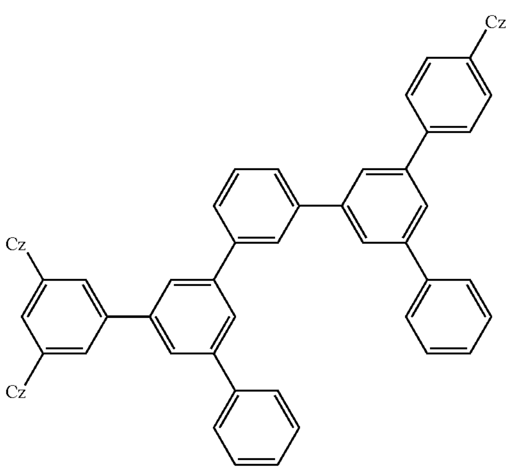
(C113)
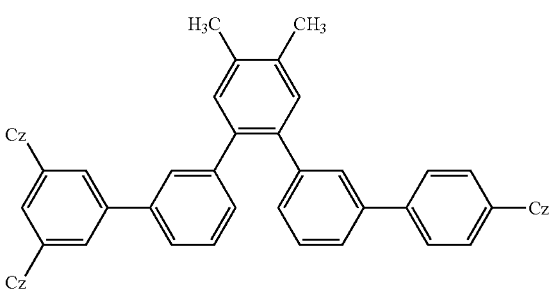
-continued
(C114)
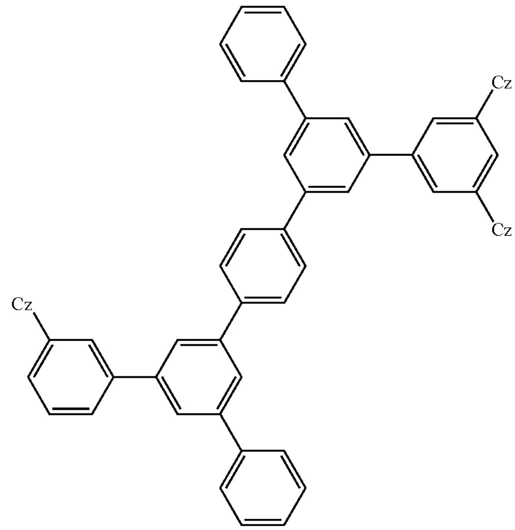
(C115)
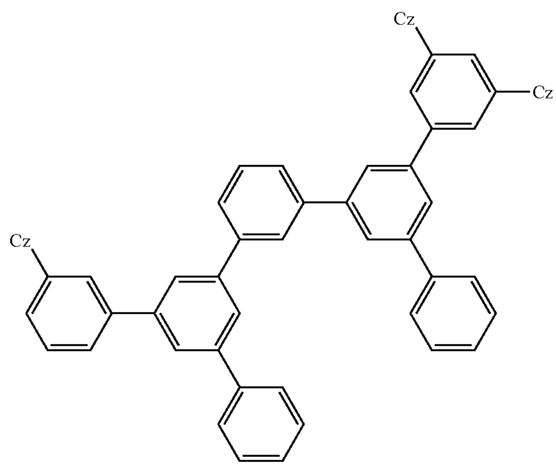
(C116)
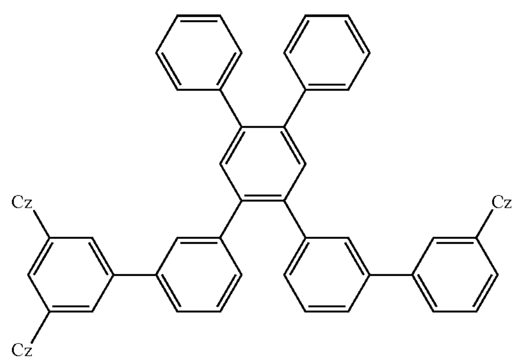

-continued
(C117)
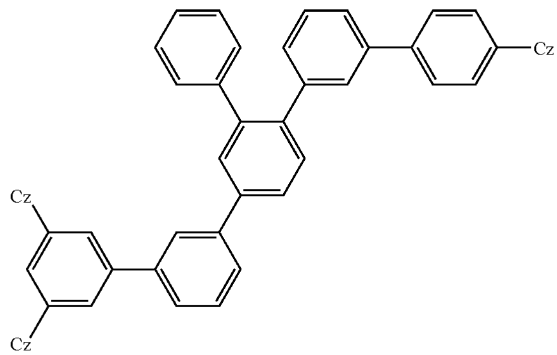
(C118)
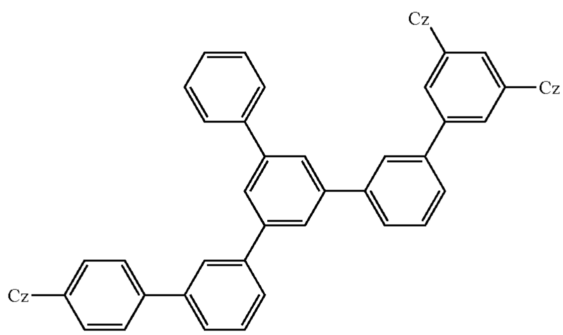
(C119)
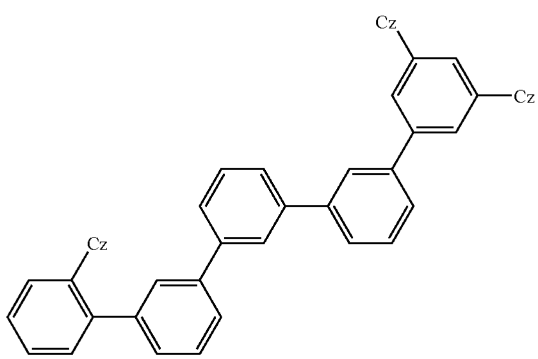
(C120)
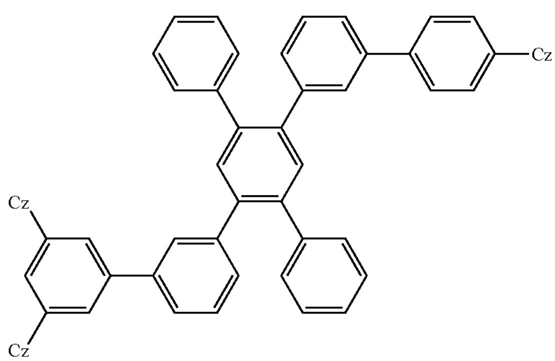
-continued
(C121)
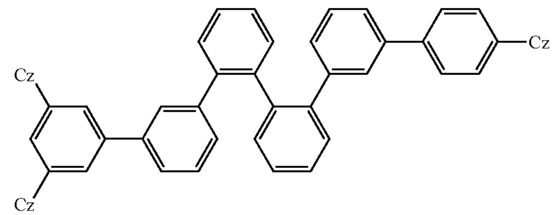
(C122)
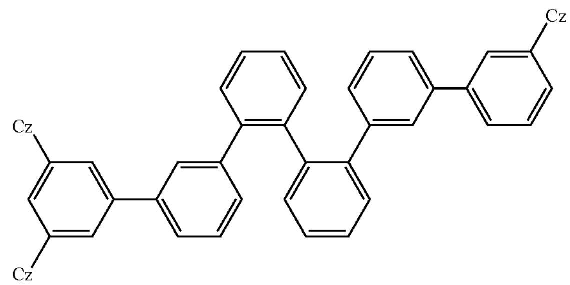
(C123)
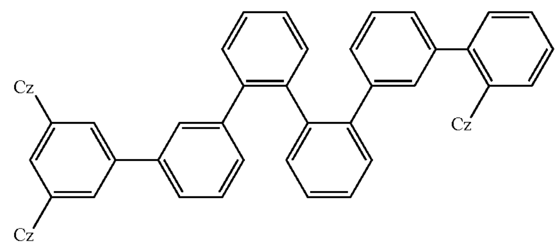
(C124)
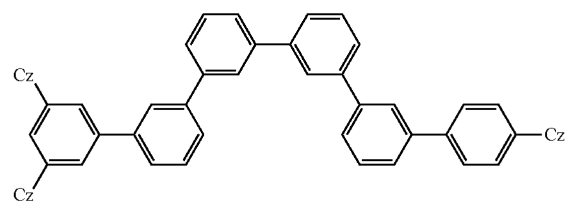
(C125)
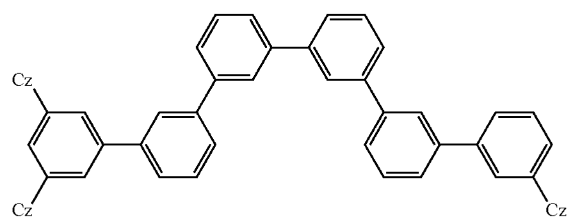
(C126)
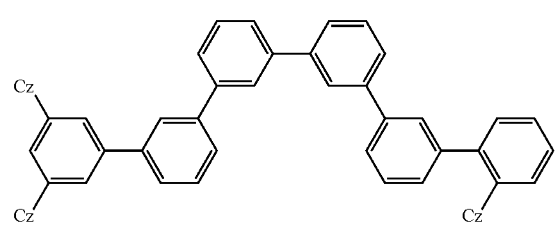

-continued
[Chemical Formula 21]
(C127)
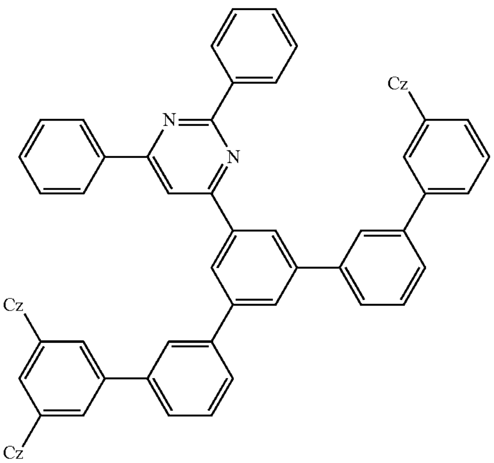
(C128)
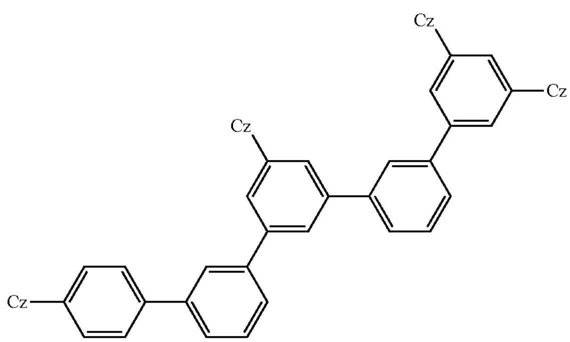
(C129)
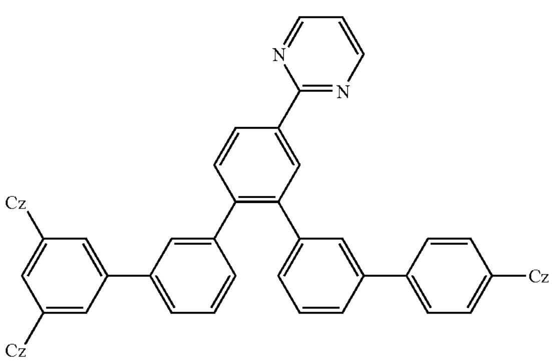
(C130)
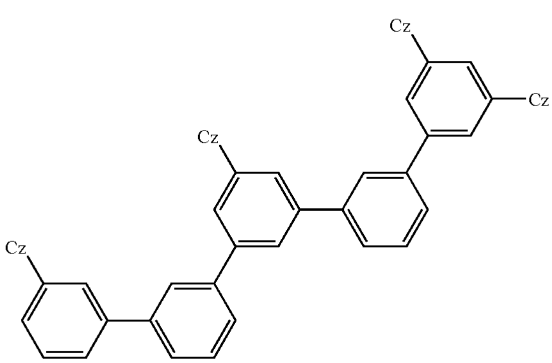
-continued
(C131)
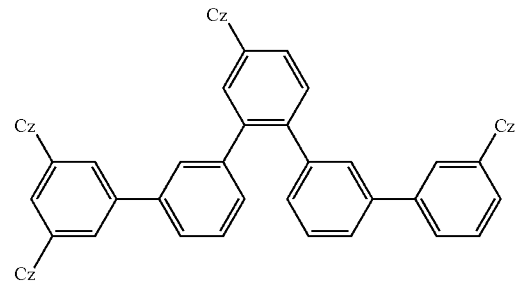
(C132)
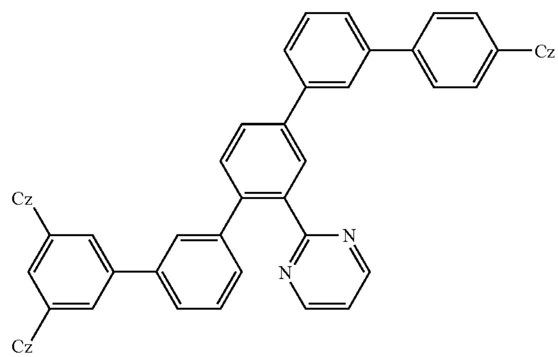
(C133)
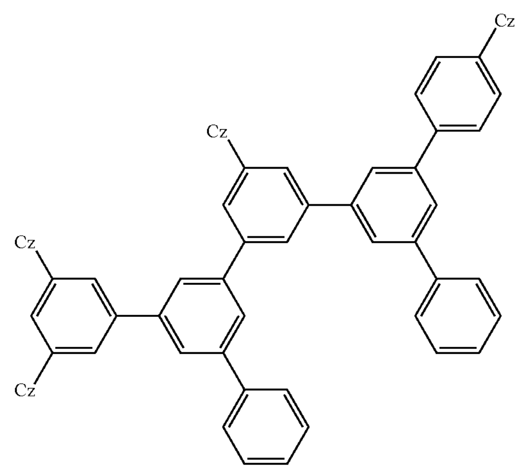
(C134)
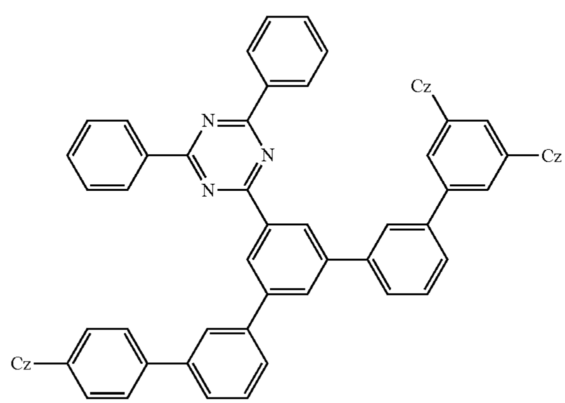

(C135)
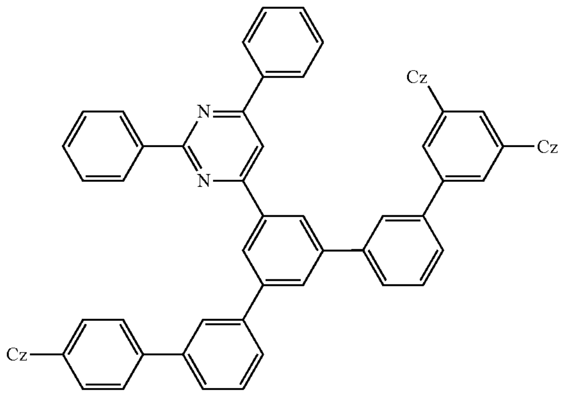
(C136)
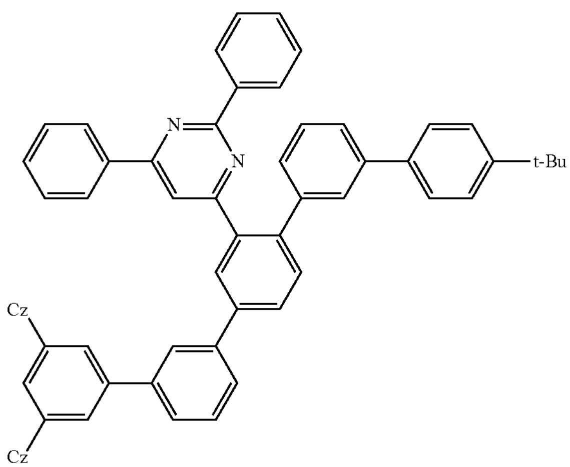
(C137)
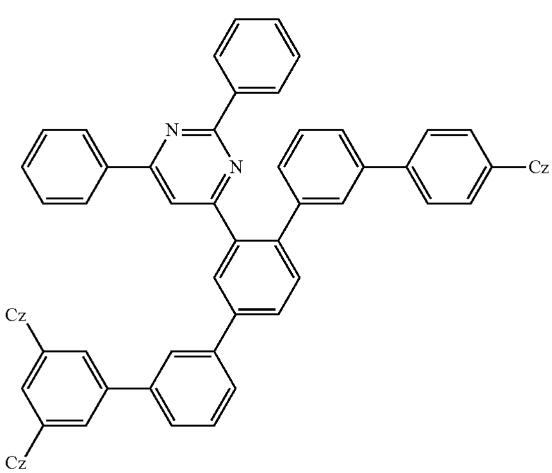
(C138)
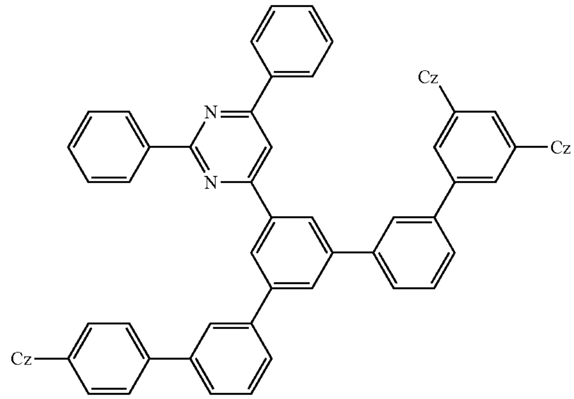
(C139)
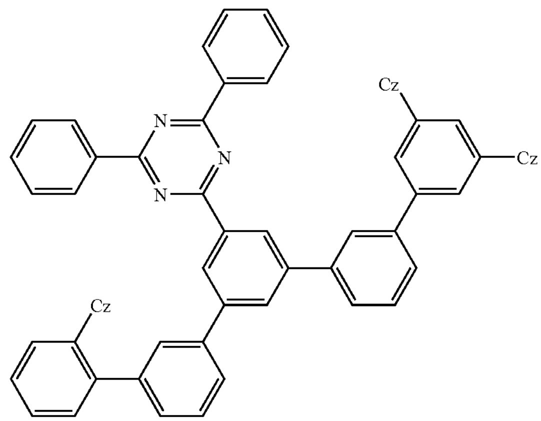
(C140)
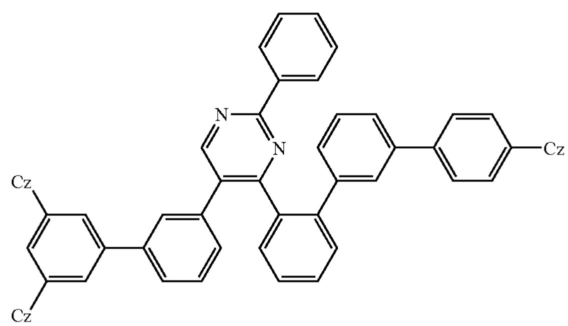
(C141)
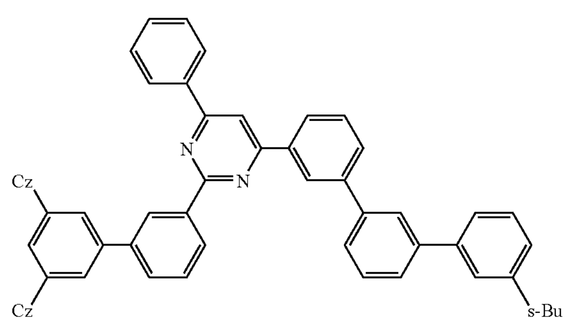

-continued
(C142)
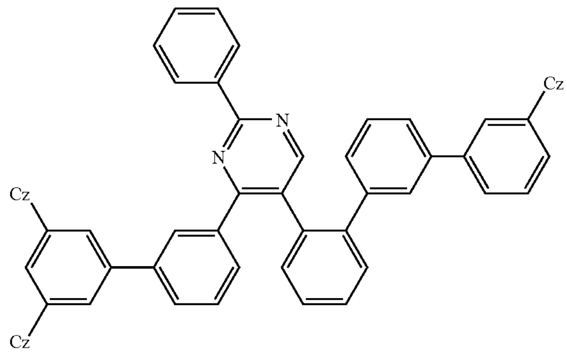
(C143)
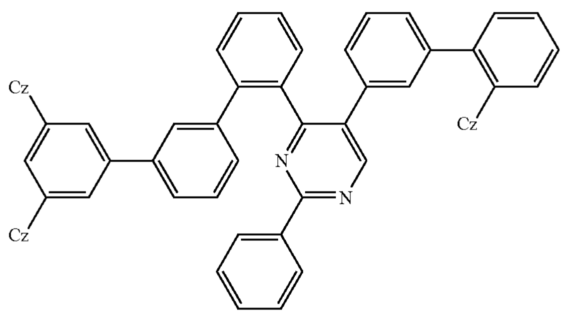
(C144)
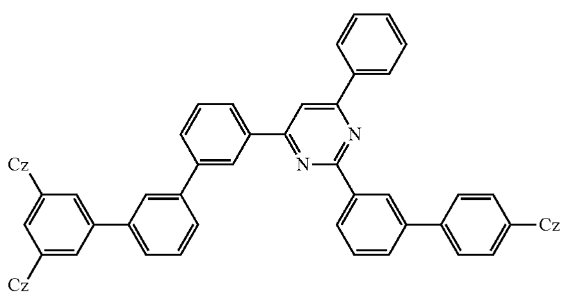
(C145)
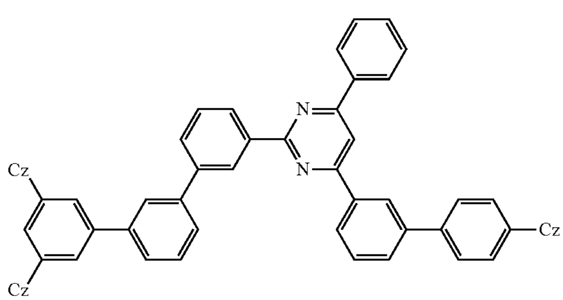
-continued
(C146)
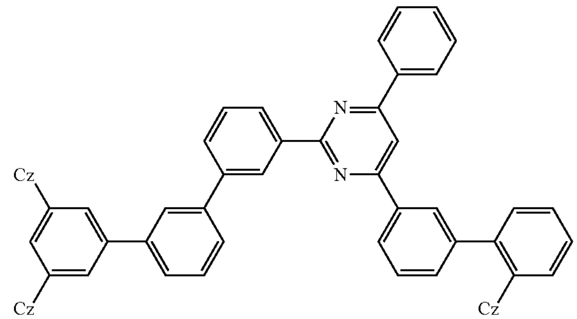
(C147)
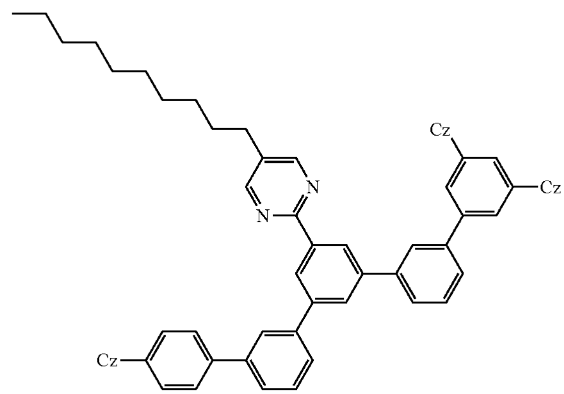
[Chemical Formula 22]
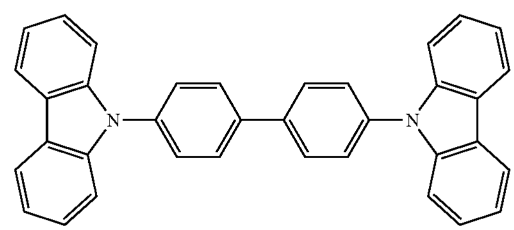
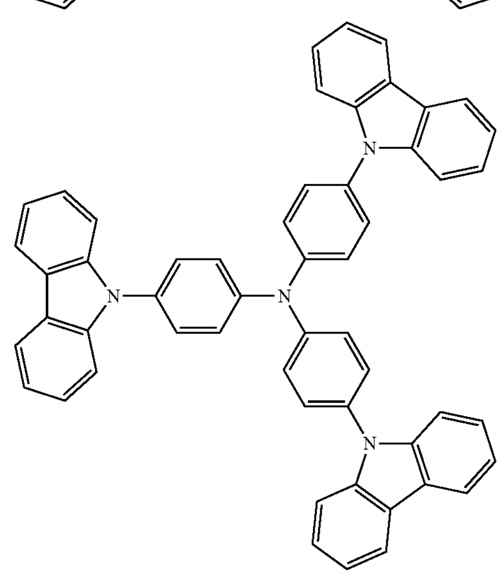

-continued
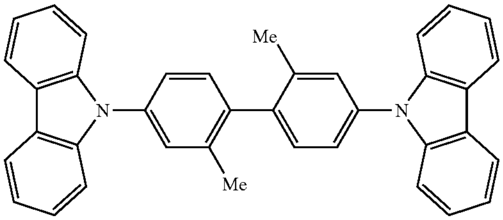
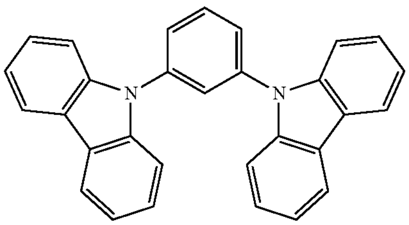
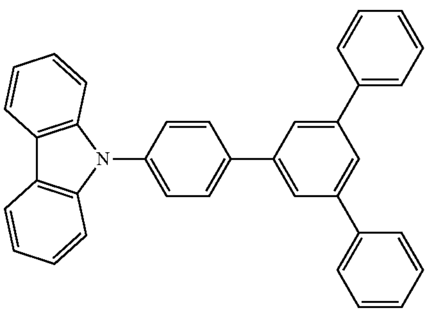
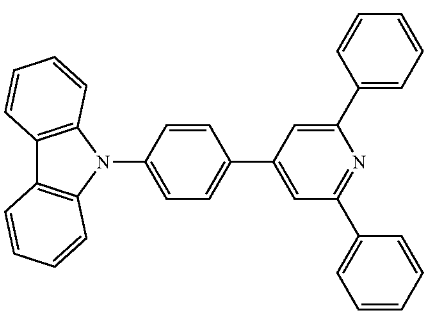
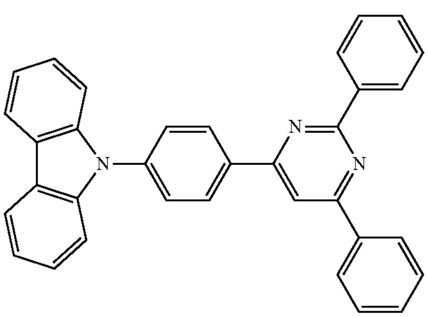
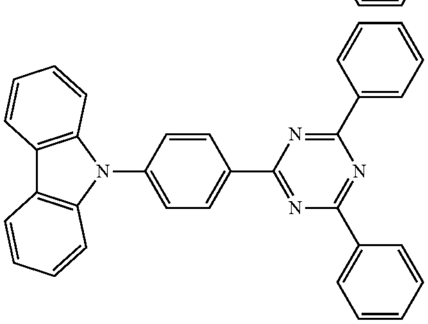
-continued
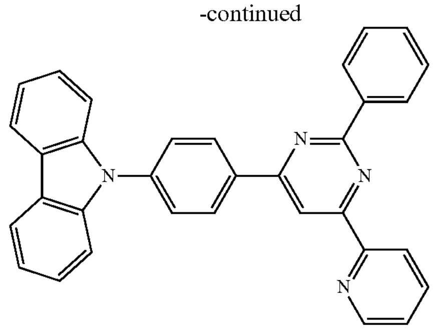
[Chemical Formula 23]
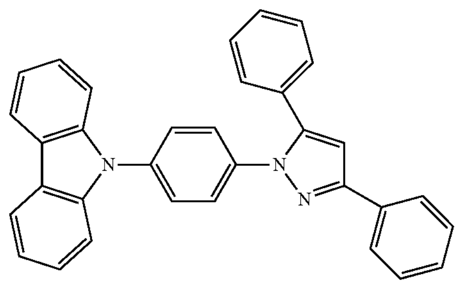
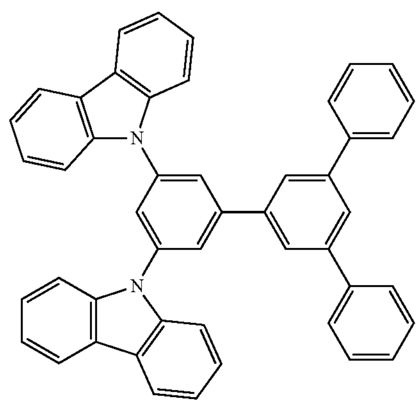
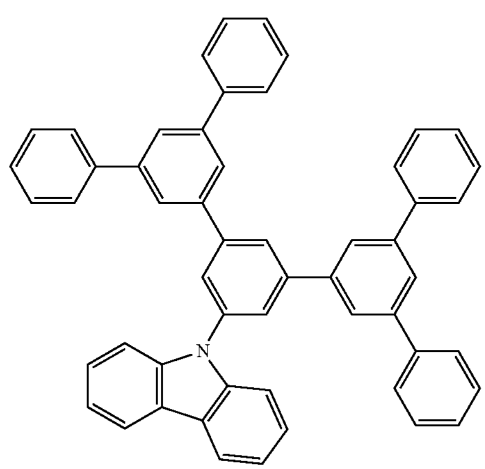

-continued
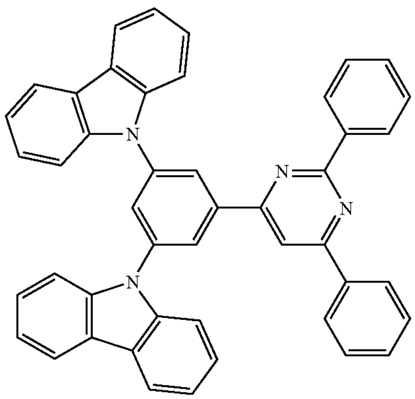
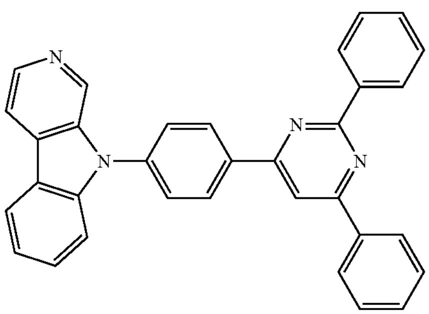
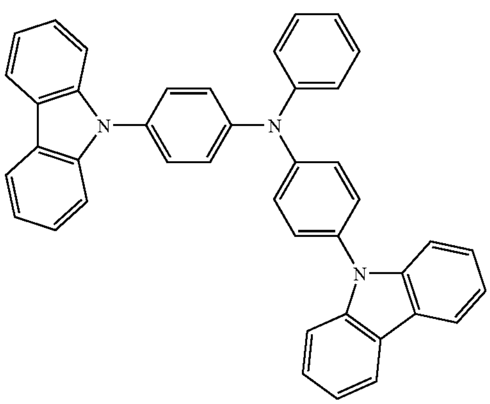
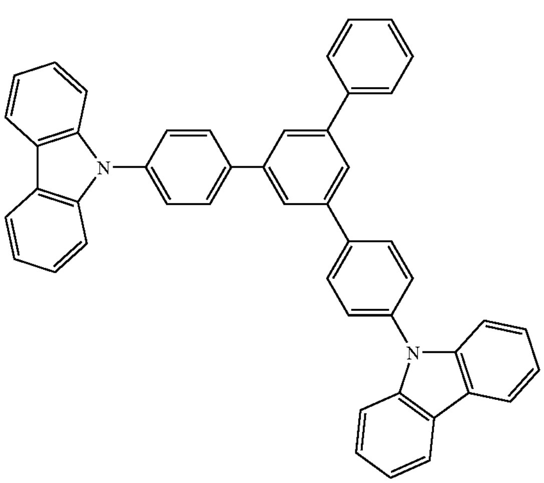
-continued
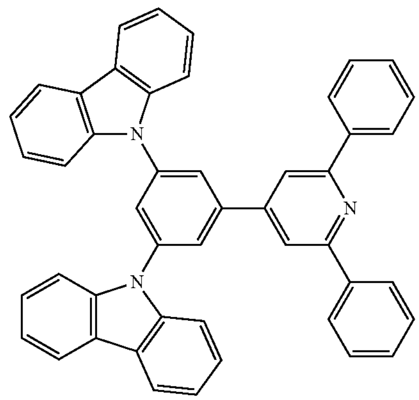
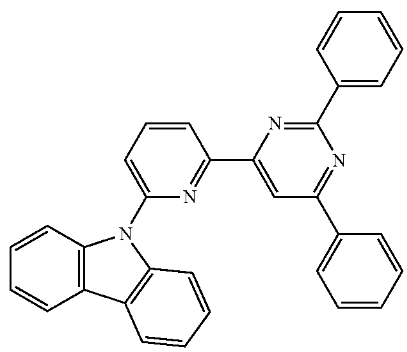
[Chemical Formula 24]
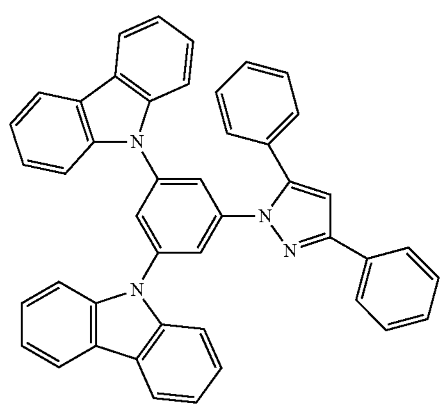
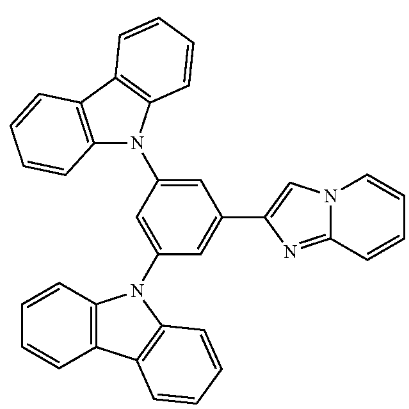

-continued
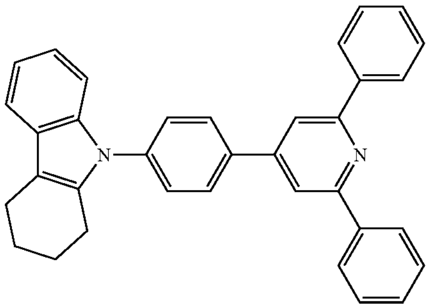
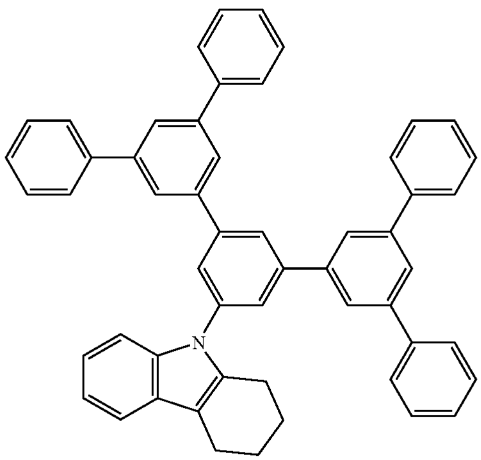
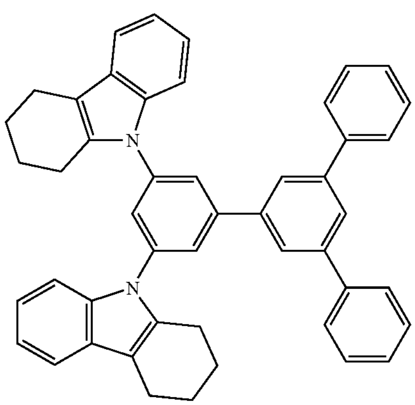
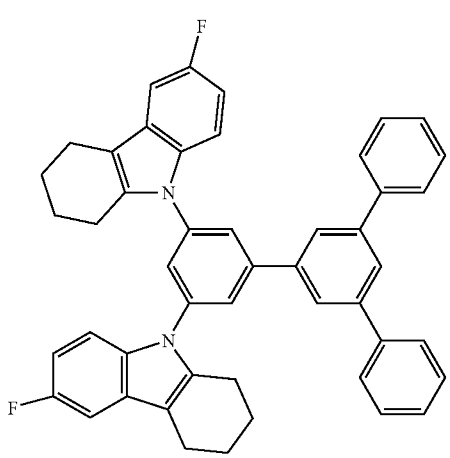
-continued
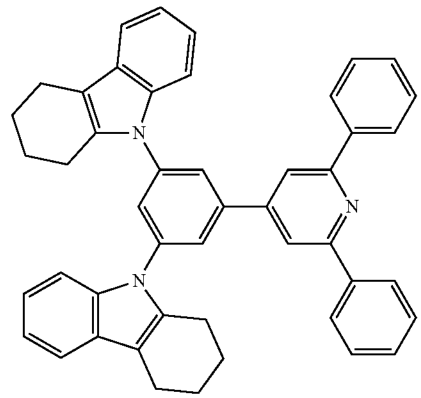
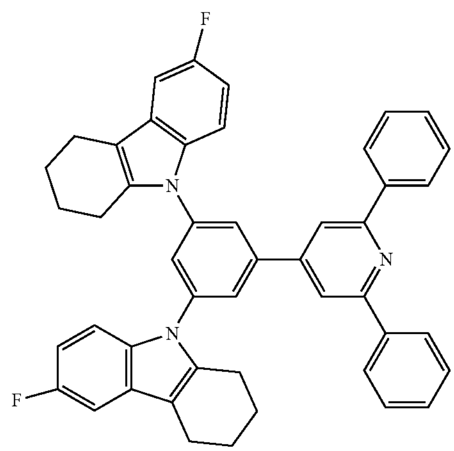
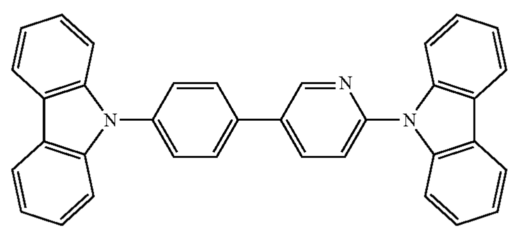
[Chemical Formula 25]
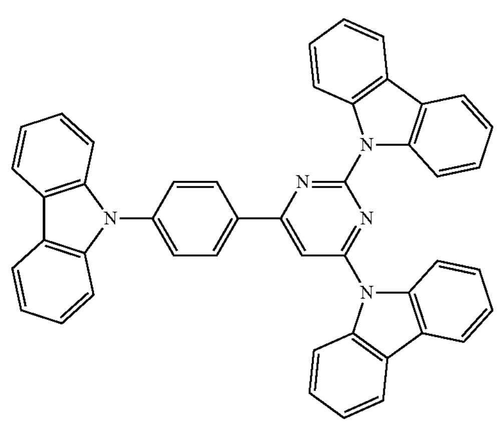

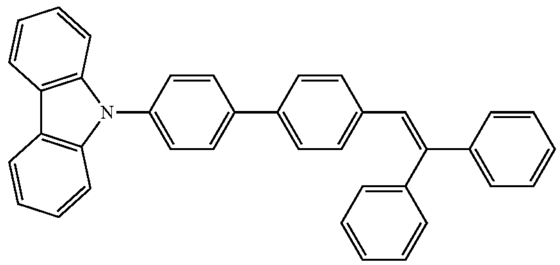
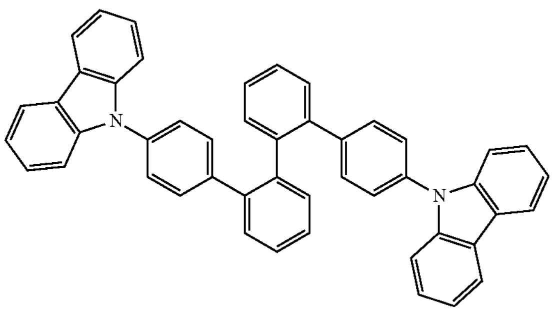
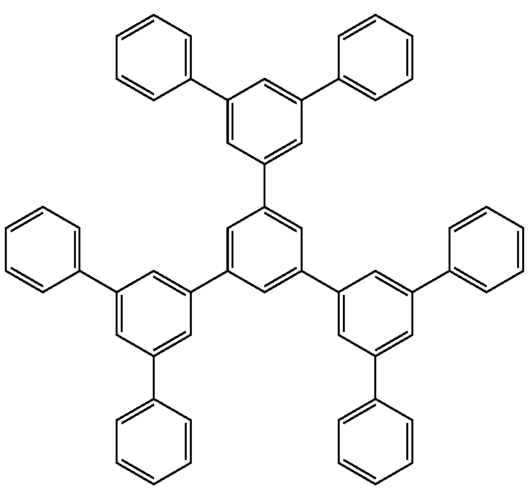
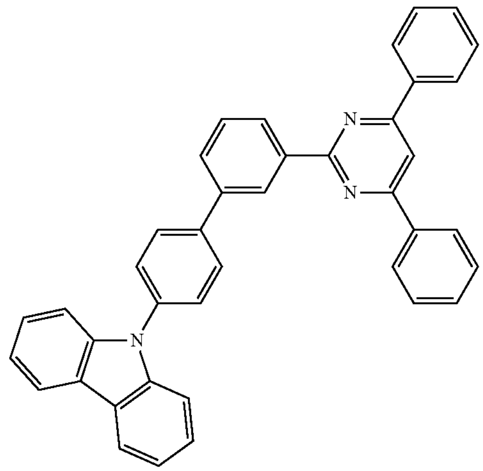
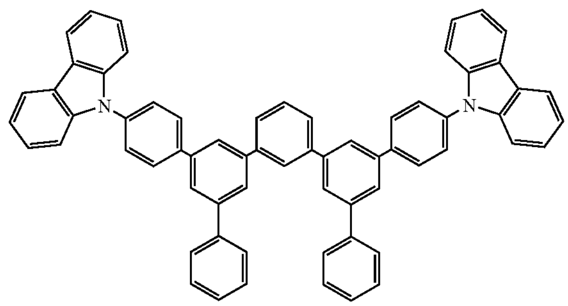
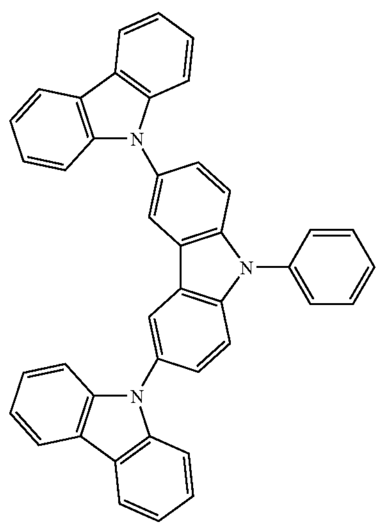
Examples of the usable host materials are as follows.

[Chemical Formula 26]
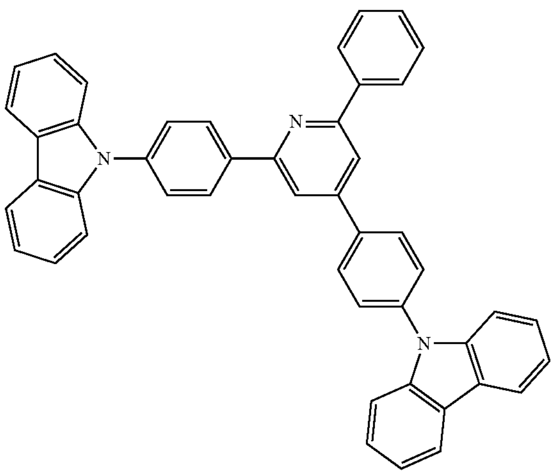
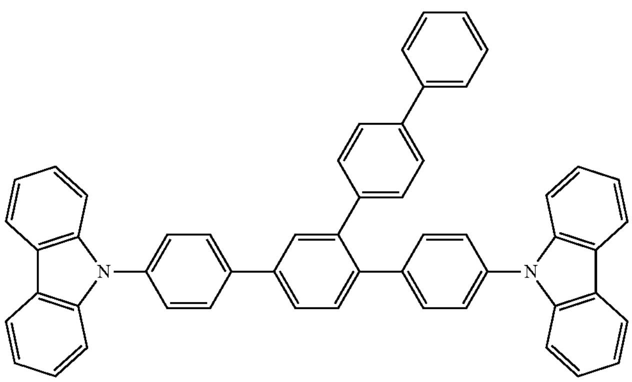
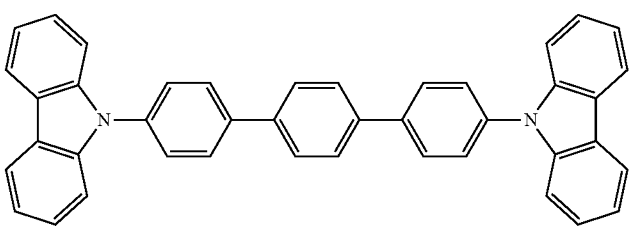
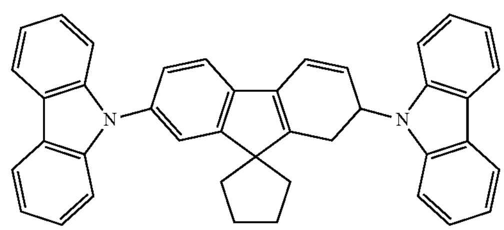
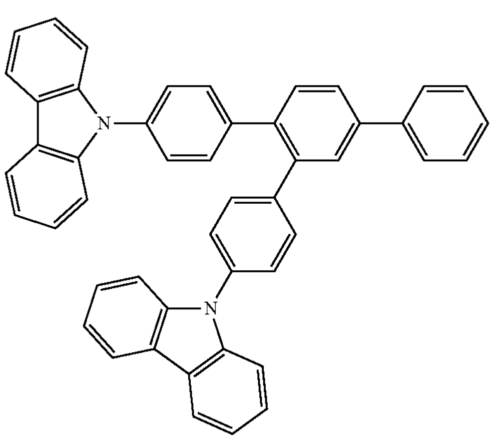
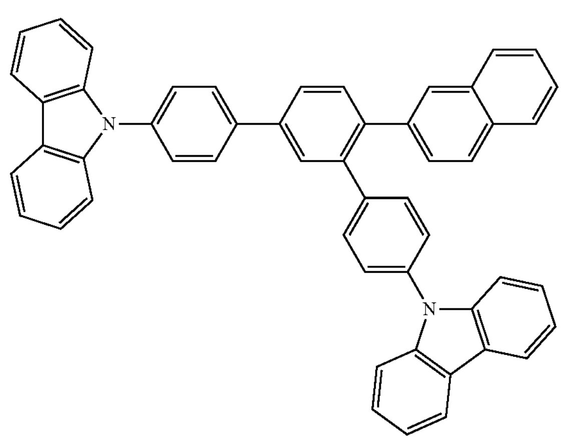

-continued
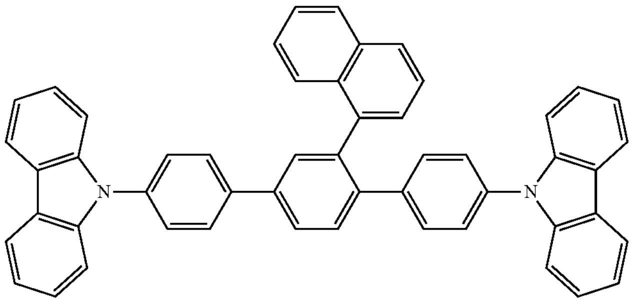
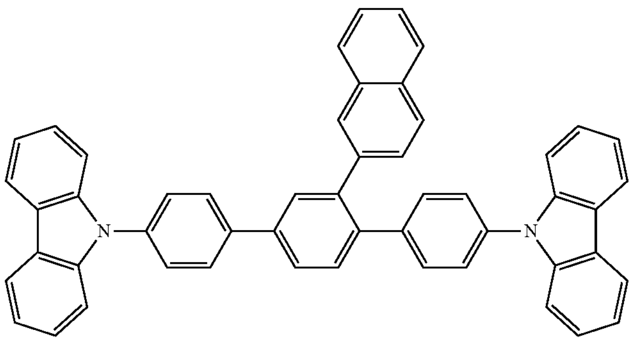
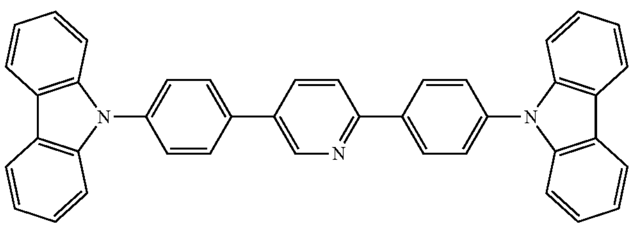
[Chemical Formula 27]
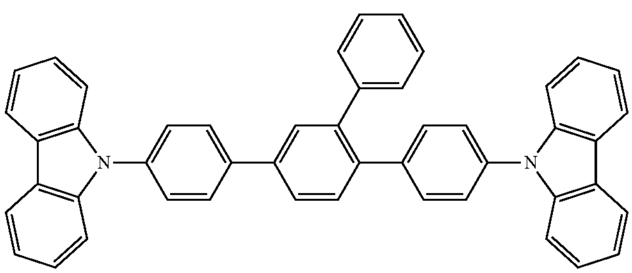
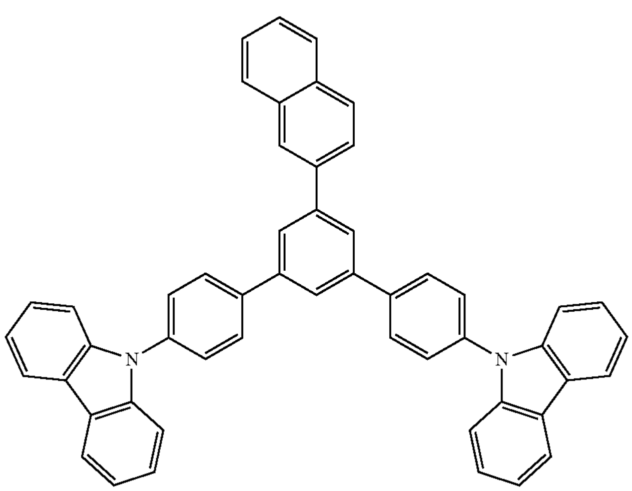

-continued
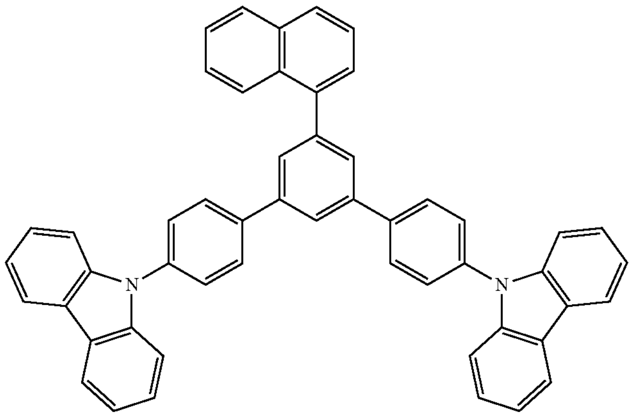
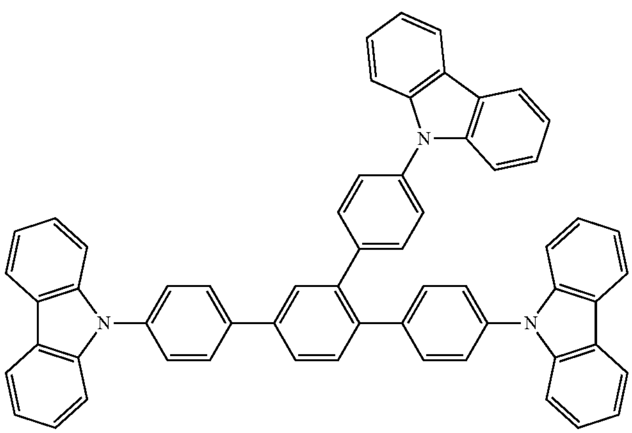
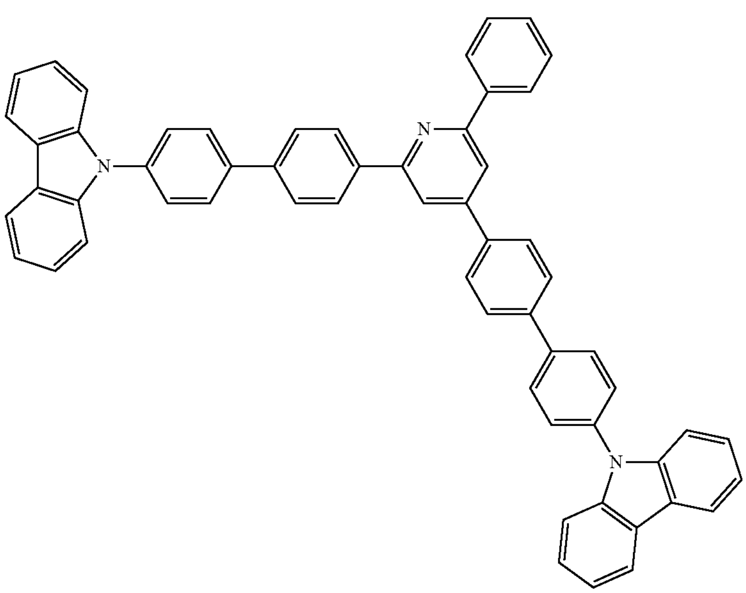

-continued
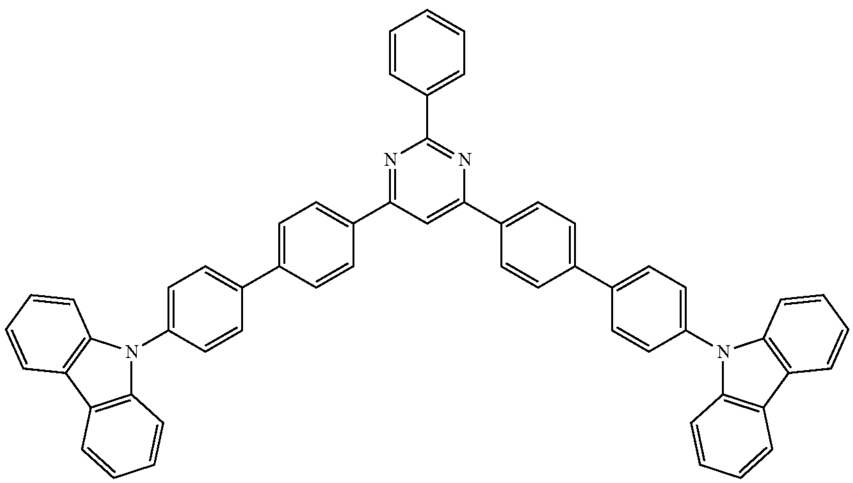
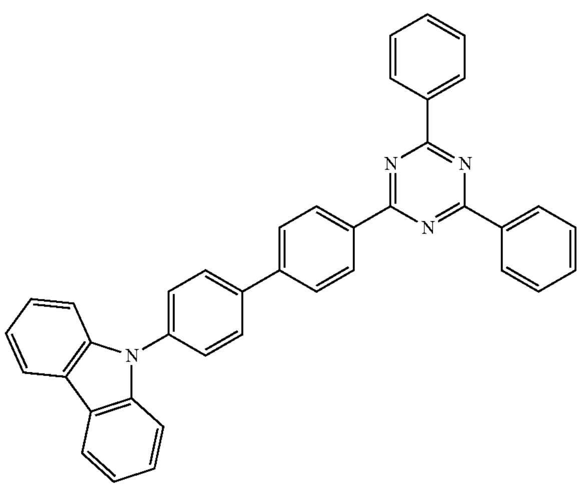
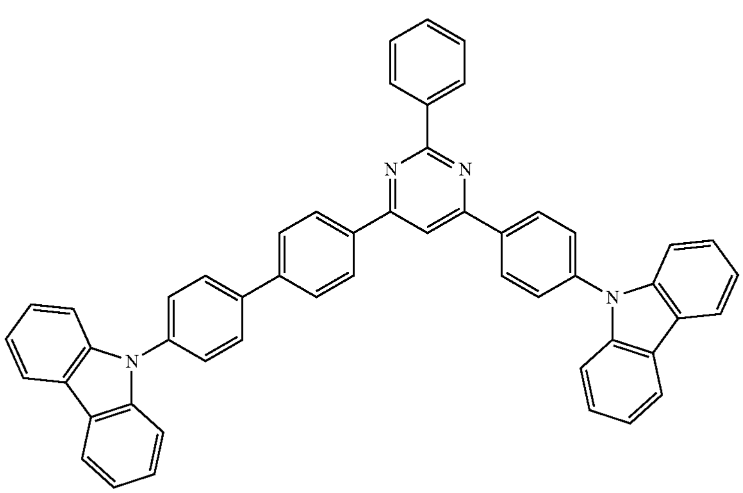

-continued
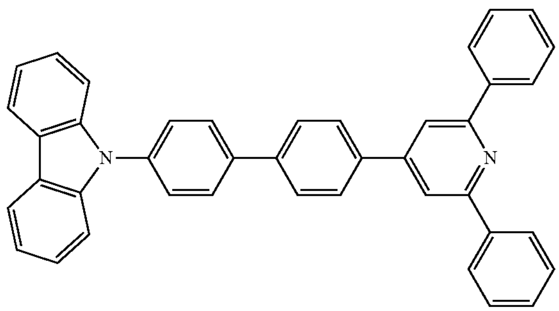
[Chemical Formula 28]
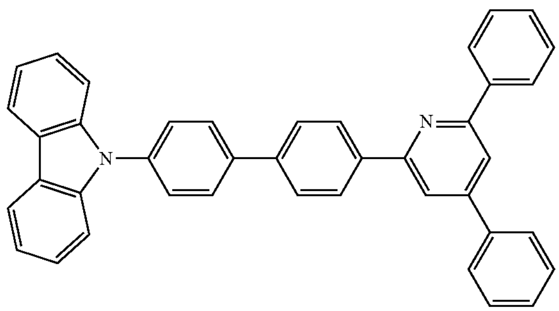
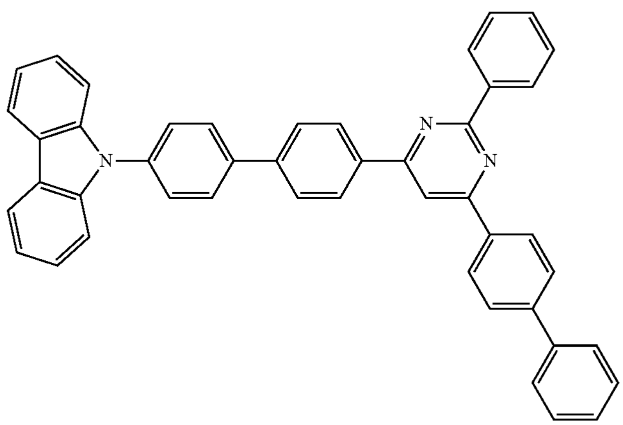
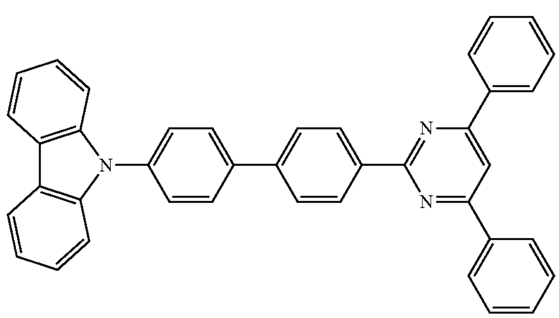
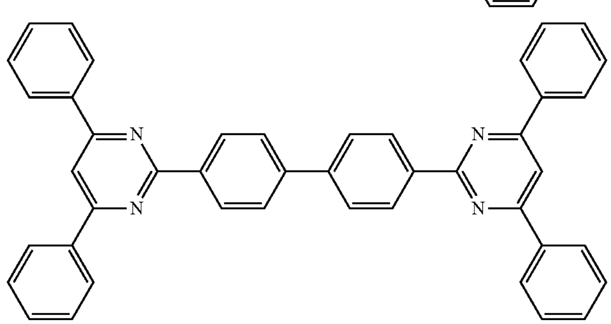

-continued
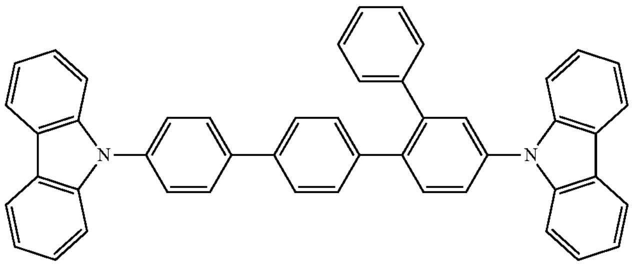
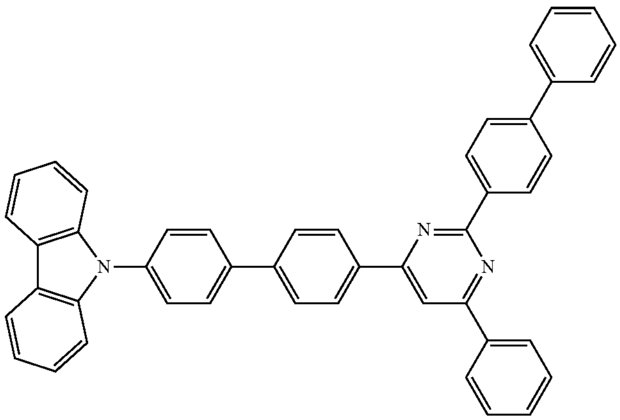
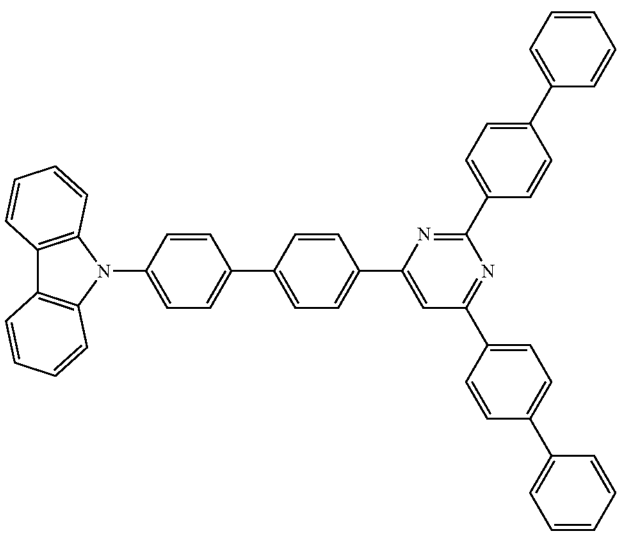
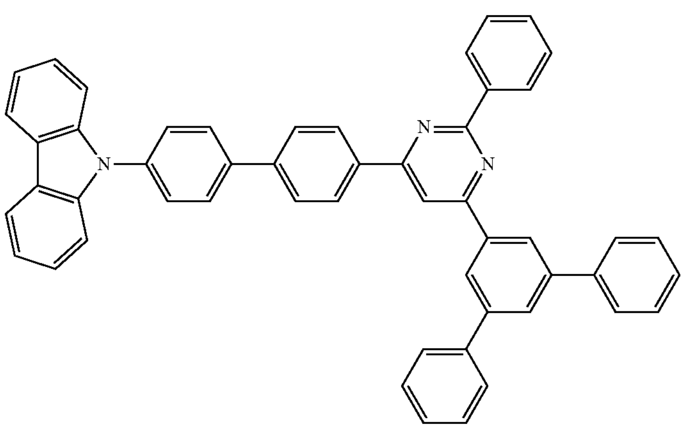

-continued
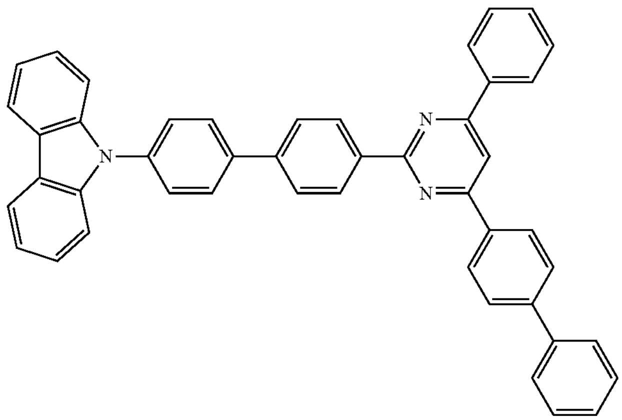
[Chemical Formula 29]
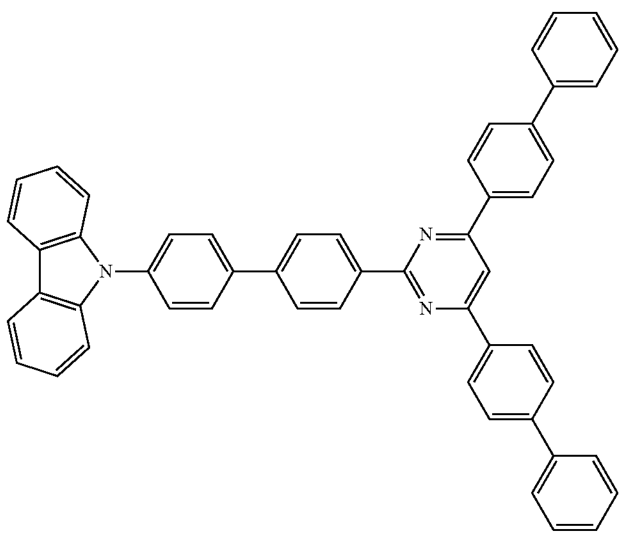
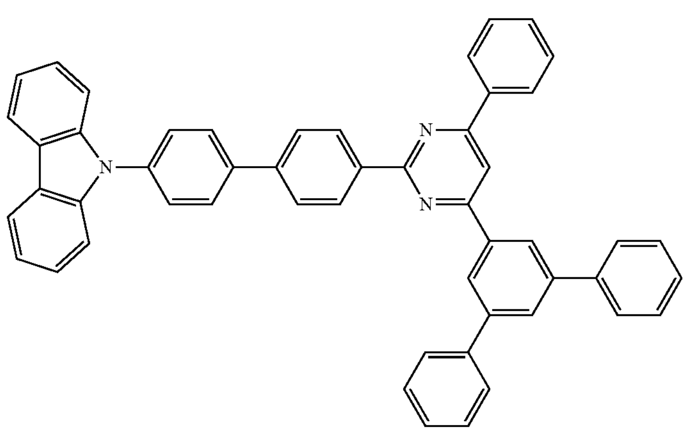

-continued
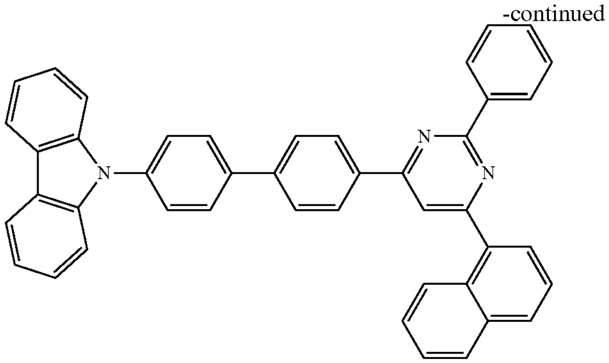
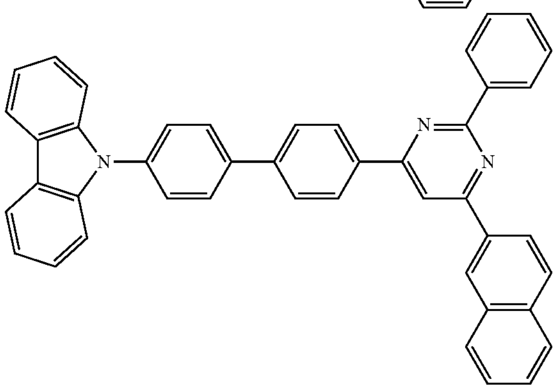
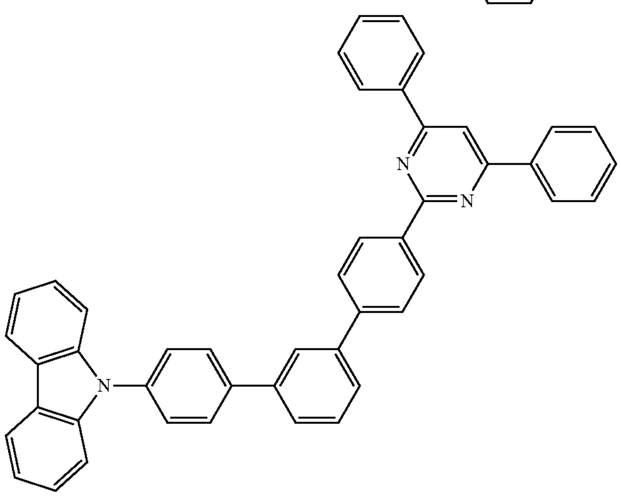
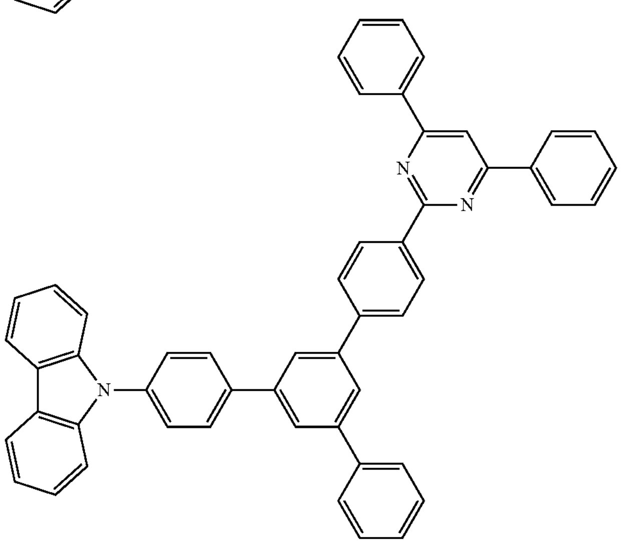

-continued
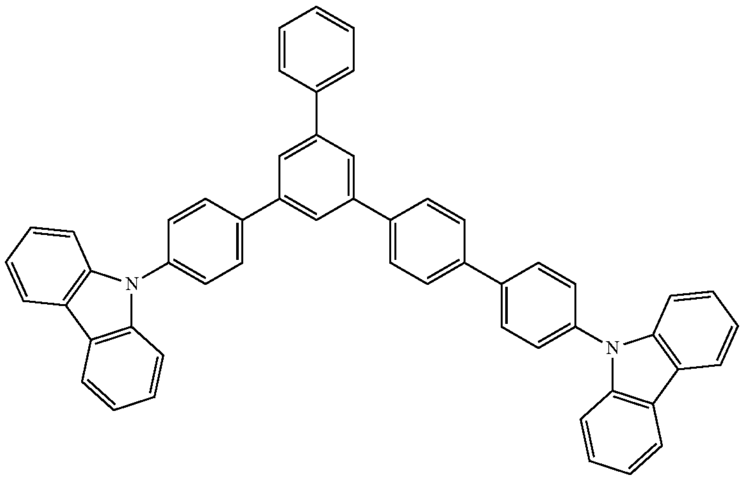
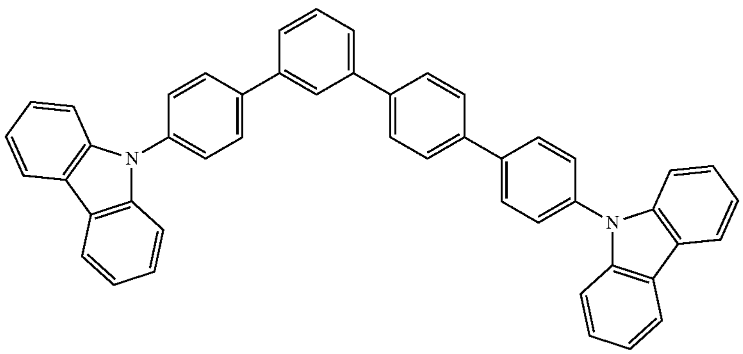
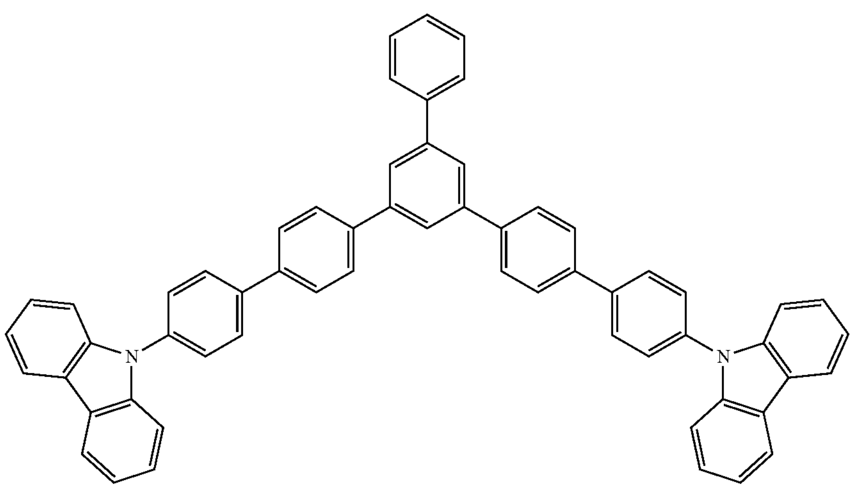
[Chemical Formula 30]
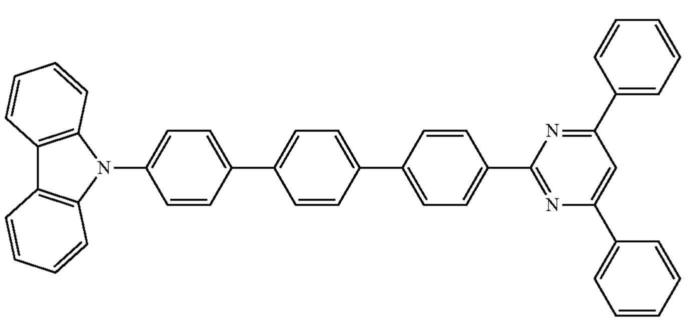

-continued
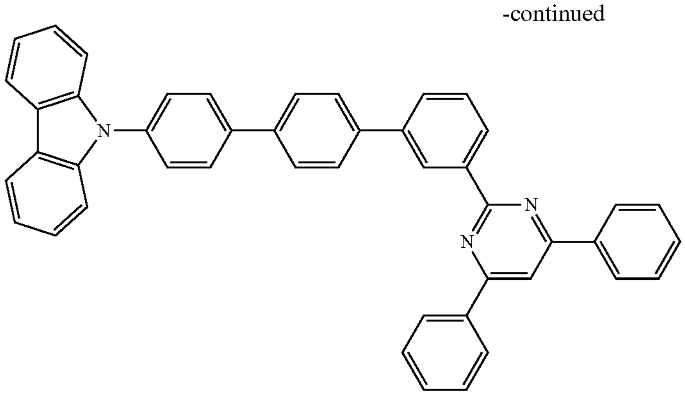
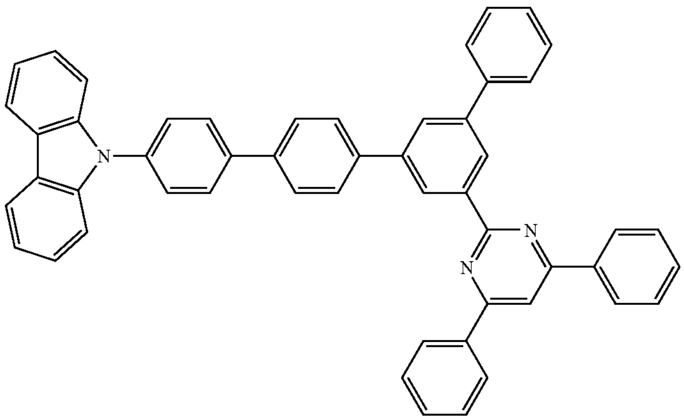
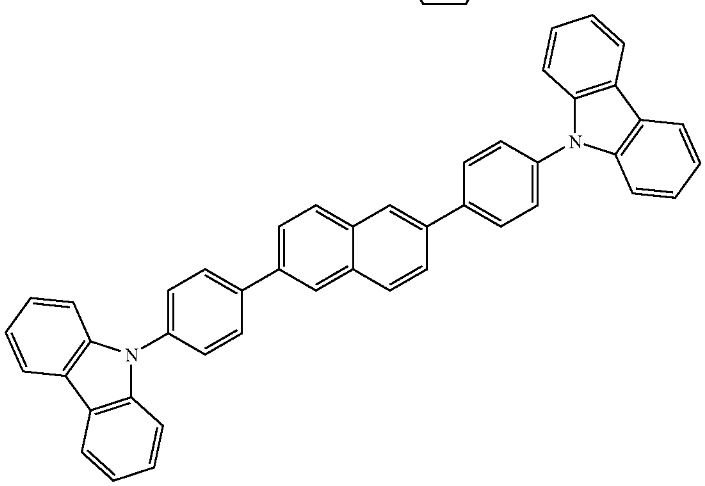
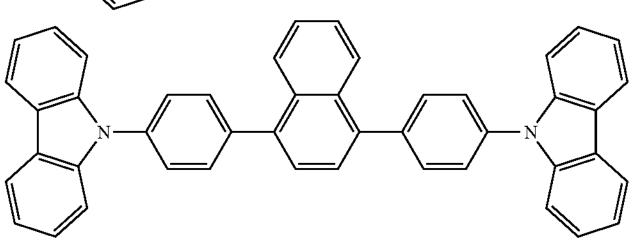
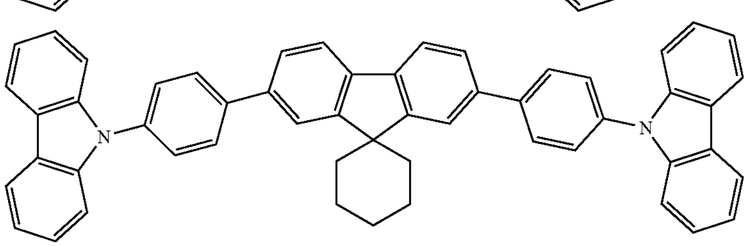

-continued
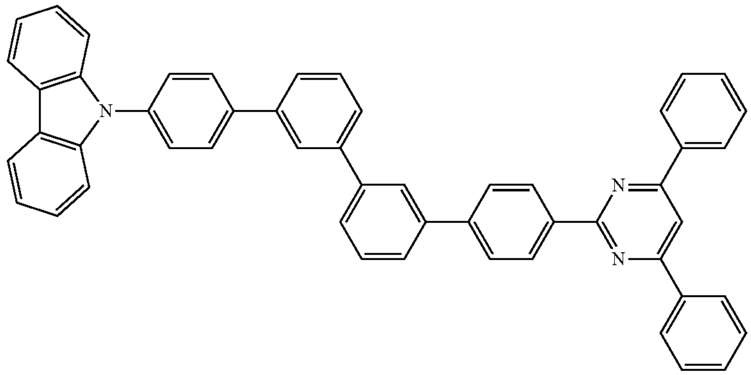
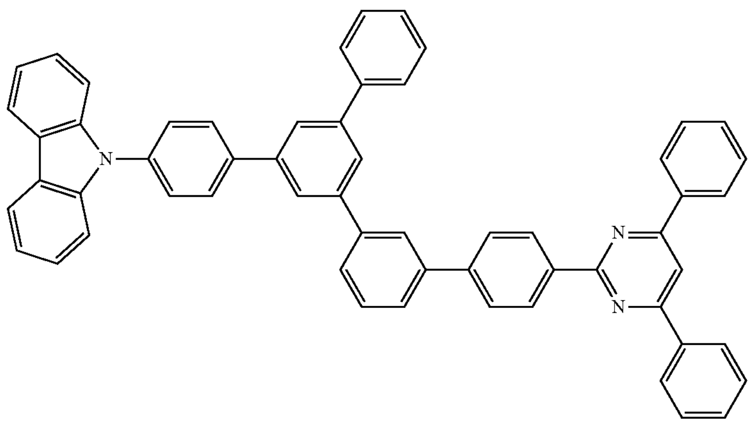
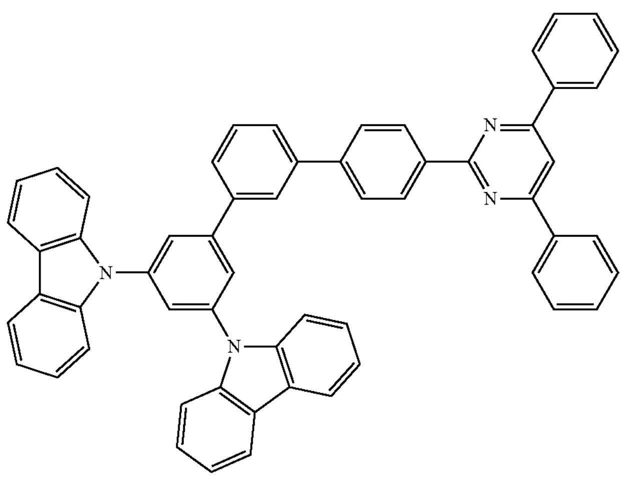
[Chemical Formula 31]
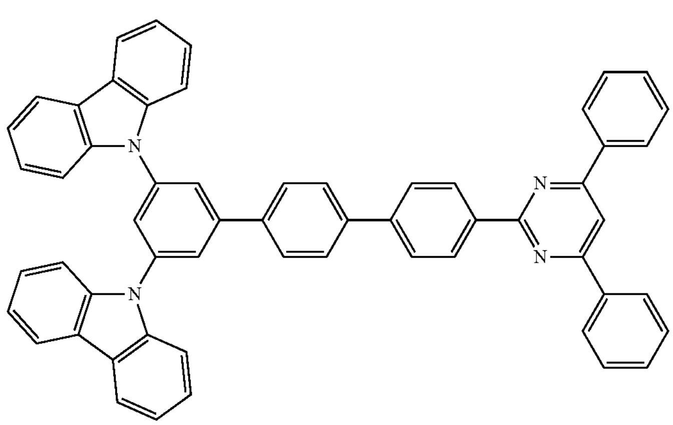

-continued
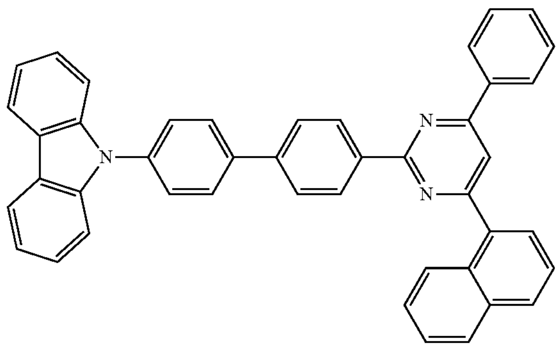
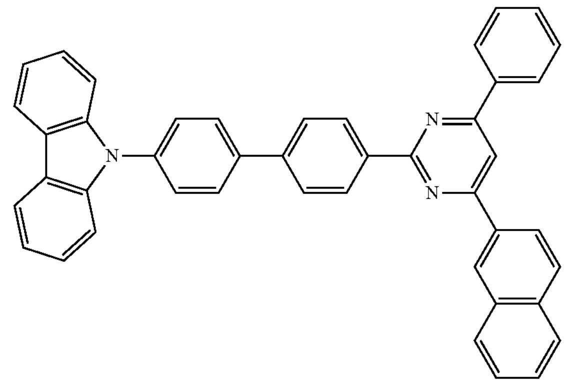
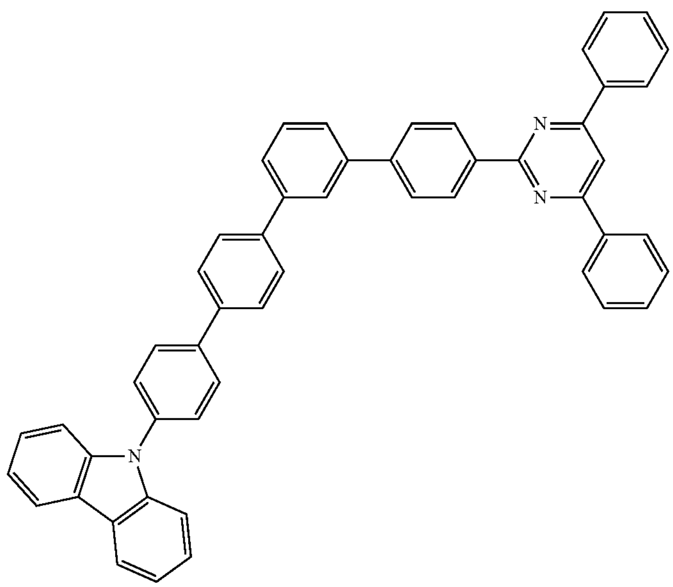
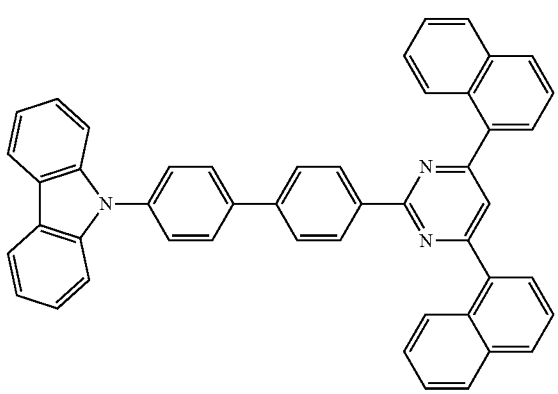
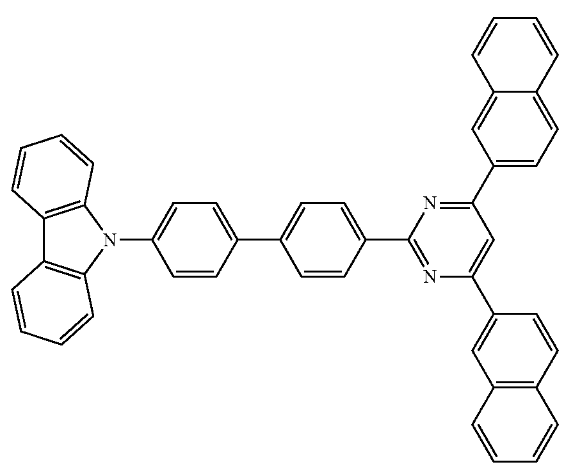

-continued
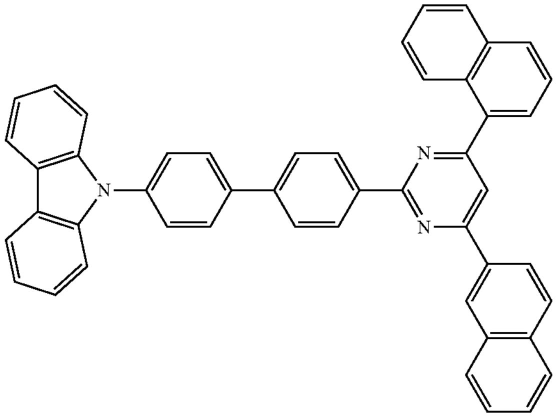
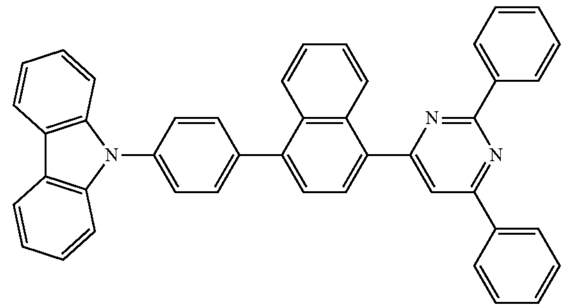
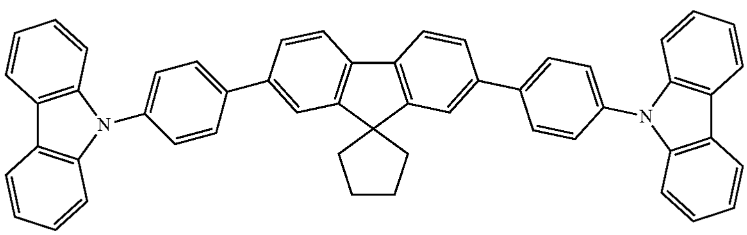
[Chemical Formula 32]
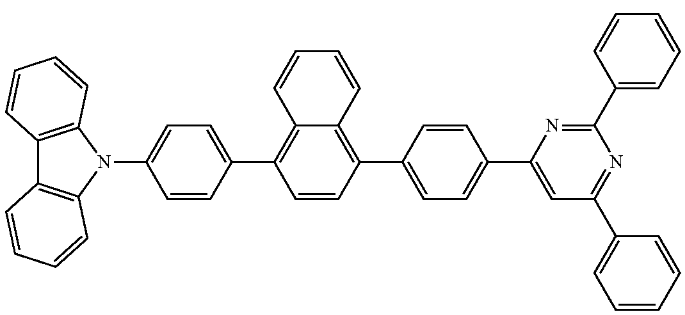
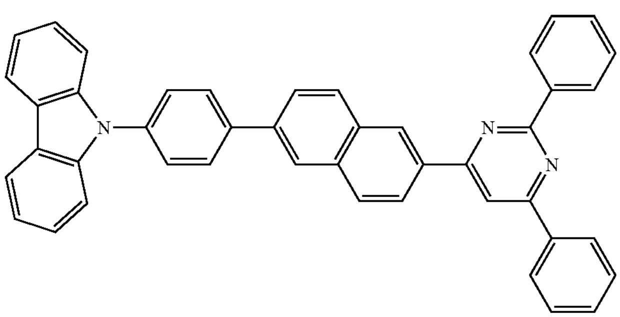
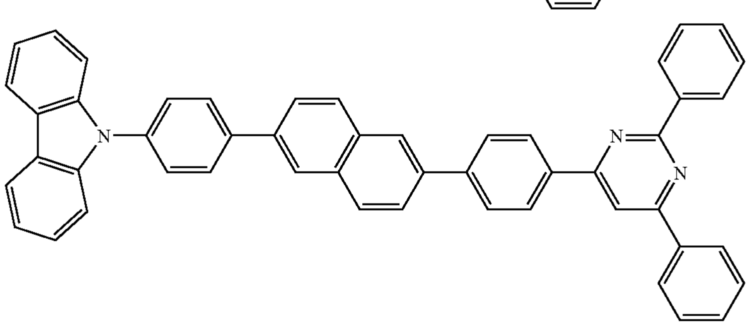

-continued
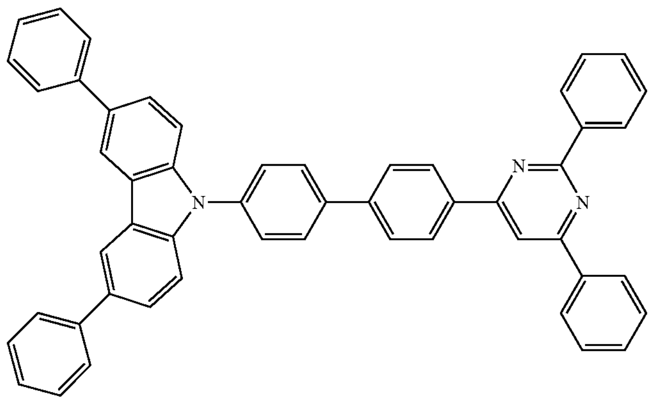
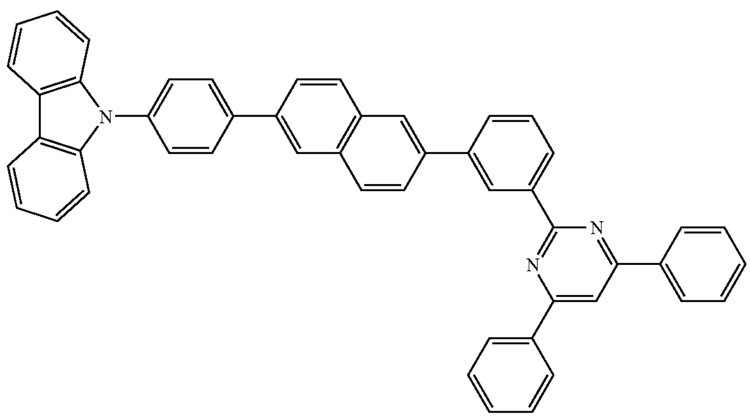
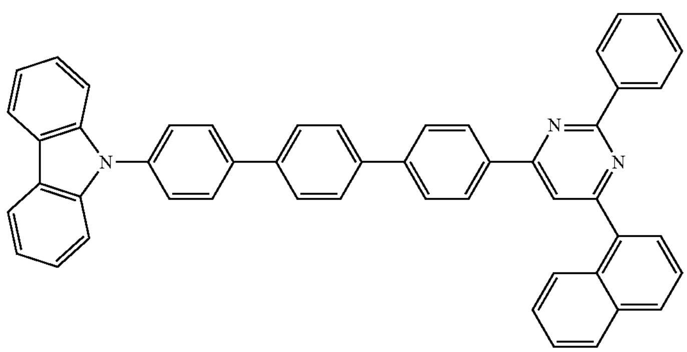
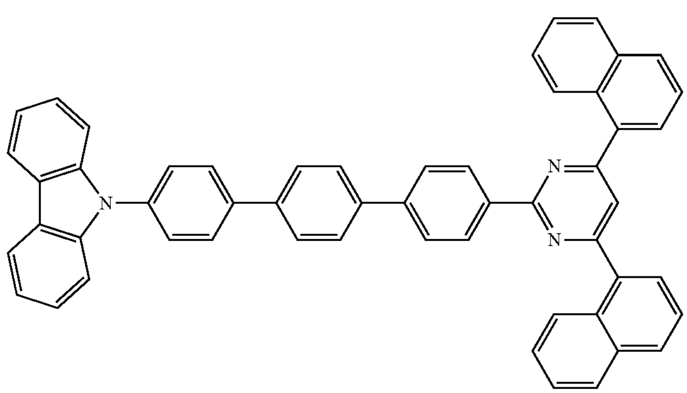

-continued
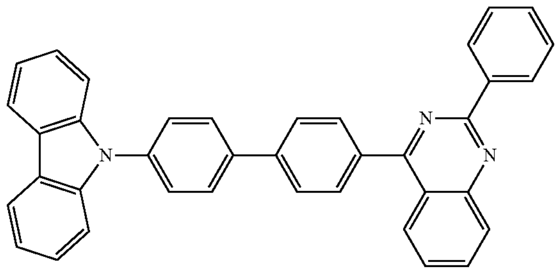
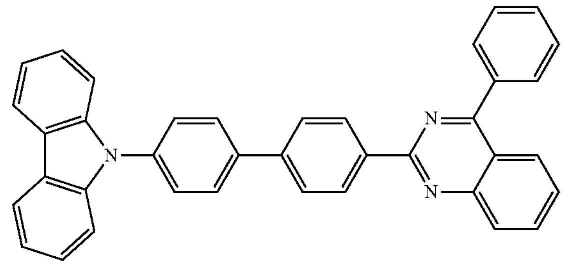
[Chemical Formula 33]
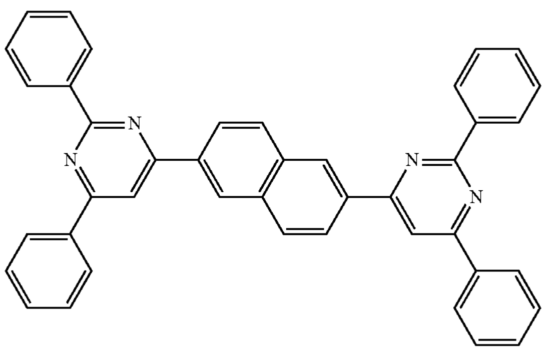
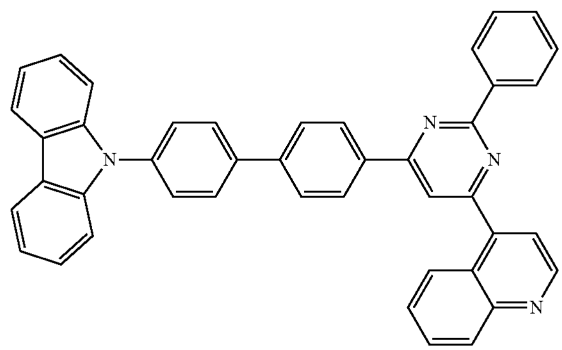
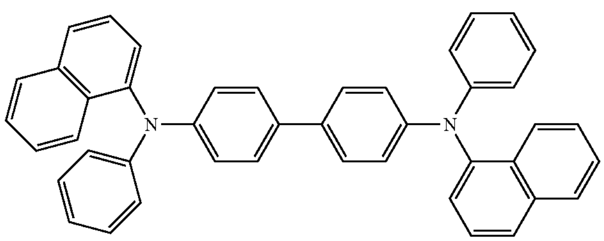
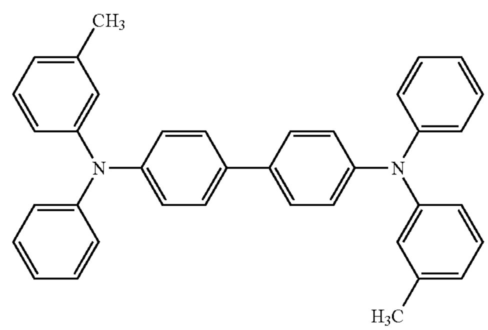
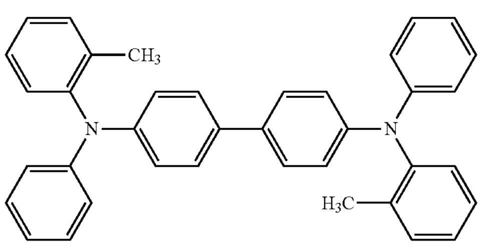
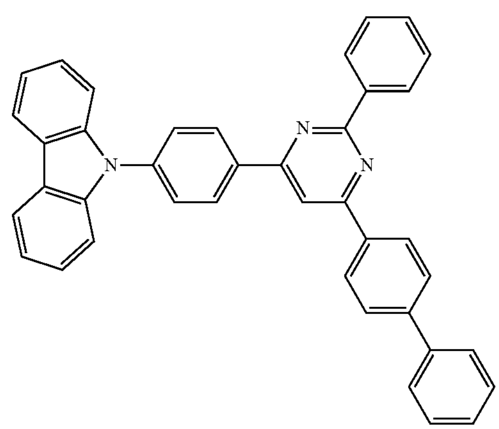

-continued

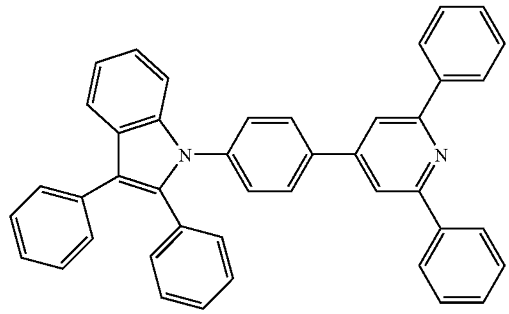

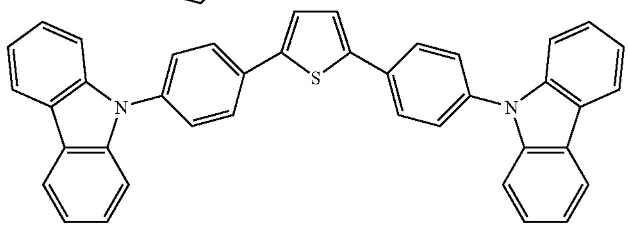

In the aspect of the invention, the host preferably has the minimum triplet energy gap of 2.1 eV to 3.5 eV, more preferably 2.1 eV to 2.7 eV.

Since the minimum triplet energy gap of the host material is 2.1 eV or more, the transfer of the triplet energy from the host material to the phosphorescent dopant can be secured, and the red and green phosphorescent emission is obtainable.

However, when the minimum triplet energy gap is 2.7 eV or less, the triplet energy gap of the host material is smaller than that of CBP (i.e., a representative phosphorescent host). Thus, the host material is not applicable to a host for a phosphorescent dopant for short-wavelength emission.

However, according to the aspect of the invention, the short-wavelength emission is to be obtained from the fluorescence, and thus the above point can be sufficiently covered. Further, when the host material has an energy gap of 2.1 eV to 2.7 eV, the singlet energy gap of the host is frequently between the singlet energy gap of the phosphorescent dopant and the singlet gap of the fluorescent dopant.

At this time, the singlet energy generated by the host does not transit to the singlet of the phosphorescent dopant, but transits only to the singlet of the fluorescent dopant.

As a consequence, the emission luminance of the fluorescent dopant can be enhanced.

Accordingly, a further favorable mixed color of the fluorescent emission and the phosphorescent emission is obtainable.

Preferably in the aspect of the invention, the singlet energy gap $Eg_H$ of the host and the singlet energy gap $Eg_{PD}$ of the phosphorescent dopant satisfy a relationship of $Eg_H < Eg_{PD}$.

With this arrangement, the singlet energy generated by the host does not transit to the singlet of the phosphorescent dopant, but transits only to the singlet of the fluorescent dopant. As a consequence, the emission luminance of the fluorescent dopant can be enhanced.

Preferably in the aspect of the invention, the host contains a host material having a substituted or unsubstituted polycyclic fused aromatic skeleton, the host material having the minimum triplet energy gap of 2.1 eV to 3.0 eV.

While it is sufficient for the host material to have the minimum triplet energy gap of 2.1 eV to 3.0 eV, the minimum triplet energy is preferably 2.1 eV to 2.7 eV, more preferably 2.3 eV to 2.7 eV.

By using a polycyclic fused aromatic series for the host material in the above structure, the stability of the molecules (e.g., oxidation-reduction stability) can be enhanced, and the device lifetime can be increased.

Conventionally, when the fluorescent emission is solely used, only 25% of the generated excited energy has been usable for the light.

Further, although it has been possible to utilize 100% of the excited energy by using a phosphorescent material, no practical phosphorescent material has been available for obtaining short-wavelength emission.

According to the aspect of the invention, since both the singlet exciton and the triplet exciton utilize the excited energy generated by the host of the mixed-color emitting layer, the efficiency can be enhanced as compared to a structure in which a fluorescent dopant is solely used.

In addition, by using a polycyclic fused aromatic series, which exhibits higher molecular stability, for the host material of the mixed-color emitting layer, the device lifetime can be increased.

Accordingly, the aspect of the invention can realize an organic EL device having long lifetime and capable of providing mixed-color emission at high efficiency.

The triplet energy gap Eg(T) of the material may be exemplarily defined based on the phosphorescence spectrum. For instance, in the aspect of the invention, the triplet energy gap Eg(T) may be defined as follows.

Specifically, each material is dissolved in an EPA solvent (diethylether:isopentane:ethanol=5:5:2 in volume ratio) at a concentration of 10 μmol/L, thereby forming a sample for phosphorescence measurement.

Then, the sample for phosphorescence measurement is put into a quartz cell, cooled to 77K and irradiated with exciting light, so that a wavelength of phosphorescence radiated therefrom is measured.

A tangent line is drawn to be tangent to a rising section adjacent to short-wavelength of the obtained phosphorescence spectrum, a wavelength value at an intersection of the tangent line and a base line is converted into energy value, and the converted energy value is defined as the triplet energy gap Eg(T).

For the measurement, for instance, a commercially-available measuring equipment F-4500 (manufactured by Hitachi, Ltd.) may be used.

However, the triplet energy gap does not need to be defined by the above method, but may be defined by any other suitable method as long as such a method is compatible with the invention.

Preferably in the aspect of the invention, the polycyclic fused aromatic skeleton is present in a chemical structure formula as a divalent or multivalent group.

Examples of the substituent for the polycyclic fused aromatic skeleton are a halogen atom, hydroxyl group, substituted or unsubstituted amino group, nitro group, cyano group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic heterocyclic group, substituted or unsubstituted aralkyl group, substituted or unsubstituted aryloxy group, substituted or unsubstituted alkoxycarbonyl group, and carboxyl group. When the polycyclic fused aromatic skeleton includes a plurality of substituents, two of the substituents may form a ring.

Examples of the halogen atom are fluorine, chlorine, bromine and iodine.

The substituted or unsubstituted amino group is represented by —$NX^1X^2$. $X^1$ and $X^2$ each independently and exemplarily represent a hydrogen atom, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 4-styrylphenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenailthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, and 4-t-butyl-3-indolyl group.

Examples of the substituted or unsubstituted alkyl group are methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

Examples of the substituted or unsubstituted alkenyl group are vinyl group, allyl group, 1-butenyl group, 2-butenyl group, 3-butenyl group, 1,3-butanedienyl group, 1-methylvinyl group, styryl group, 4-diphenylaminostyryl group, 4-di-p-tolylaminostyryl group, 4-di-m-tolylaminostyryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group, and 3-phenyl-1-butenyl group.

Examples of the substituted or unsubstituted cycloalkyl group are cyclopropyl group, cyclobutyl group, cyclopentyl group, cyclohexyl group, and 4-methylcyclohexyl group.

The substituted or unsubstituted alkoxycarbonyl group is represented by —OY. Examples of Y are methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

Examples of the substituted or unsubstituted aromatic hydrocarbon group are phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, and 4"-t-butyl-p-terphenyl-4-yl group.

Examples of the substituted or unsubstituted heterocyclic group are a 1-pyroryl group, 2-pyroryl group, 3-pyroryl group, pyrazinyl group, 2-pyridiny group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-3-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, 4-t-butyl-3-indolyl group and the like.

Examples of the substituted or unsubstituted aralkyl group are benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro-2-phenylisopropyl group.

The substituted or unsubstituted aryloxy group is represented by —OZ. Examples of Z include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group, a 4'-t-butyl-p-terphenyl-4-yl group, a 2-pyrrolyl group, a 3-pyrrolyl group, a pyrazinyl group, a 2-pyrizinyl group, a 3-pyrizinyl group, a 4-pyrizinyl group, a 2-indolyl group, a 3-indolyl group, a 4-indolyl group, a 5-indolyl group, a 6-indolyl group, a 7-indolyl group, a 1-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a 2-quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthroline-2-yl group, a 1,7-phenanthroline-3-yl group, a 1,7-phenanthroline-4-yl group, a 1,7-phenanthroline-5-yl group, a 1,7-phenanthroline-6-yl group, a 1,7-phenanthroline-8-yl group, a 1,7-phenanthroline-9-yl group, a 1,7-phenanthroline-10-yl group, a 1,8-phenanthroline-2-yl group, a 1,8-phenanthroline-3-yl group, a 1,8-phenanthroline-4-yl group, a 1,8-phenanthroline-5-yl group, a 1,8-phenanthroline-6-yl group, a 1,8-phenanthroline-7-yl group, a 1,8-phenanthroline-9-yl group, a 1,8-phenanthroline-10-yl group, a 1,9-phenanthroline-2-yl group, a 1,9-phenanthroline-3-yl group, a 1,9-phenanthroline-4-yl group, a 1,9-phenanthroline-5-yl group, a 1,9-phenanthroline-6-yl group, a 1,9-phenanthroline-7-yl group, a 1,9-phenanthroline-8-yl group, a 1,9-phenanthroline-10-yl group, a 1,10-phenanthroline-2-yl group, a 1,10-phenanthroline-3-yl group, a 1,10-phenanthroline-4-yl group, a 1,10-phenanthroline-5-yl group, a 2,9-phenanthroline-1-yl group, a 2,9-phenanthroline-3-yl group, a 2,9-phenanthroline-4-yl group, a 2,9-phenanthroline-5-yl group, a 2,9-phenanthroline-6-yl group, a 2,9-phenanthroline-7-yl group, a 2,9-phenanthroline-8-yl group, a 2,9-phenanthroline-10-yl group, a 2,8-phenanthroline-1-yl group, a 2,8-phenanthroline-3-yl group, a 2,8-phenanthroline-4-yl group, a 2,8-phenanthroline-5-yl group, a 2,8-phenanthroline-6-yl group, a 2,8-phenanthroline-7-yl group, a 2,8-phenanthroline-9-yl group, a 2,8-phenanthroline-10-yl group, a 2,7-phenanthroline-1-yl group, a 2,7-phenanthroline-3-yl group, a 2,7-phenanthroline-4-yl group, a 2,7-phenanthroline-5-yl group, a 2,7-phenanthroline-6-yl group, a 2,7-phenanthroline-8-yl group, a 2,7-phenanthroline-9-yl group, a 2,7-phenanthroline-10-yl group, a 1-phenazinyl group, a 2-phenazinyl group, a 1-phenothiazinyl group, a 2-phenothiazinyl group, a 3-phenothiazinyl group, a 4-phenothiazinyl group, a 1-phenoxazinyl group, a 2-phenoxazinyl group, a 3-phenoxazinyl group, a 4-phenoxazinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrol-1-yl group, a 2-methylpyrrol-3-yl group, a 2-methylpyrrol-4-yl group, a 2-methylpyrrol-5-yl group, a 3-methylpyrrol-1-yl group, a 3-methylpyrrol-2-yl group, a 3-methylpyrrol-4-yl group, a 3-methylpyrrol-5-yl group, a 2-t-butylpyrrol-4-yl group, a 3-(2-phenylpropyl)pyrrol-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, and a 4-t-butyl-3-indolyl group.

The substituted or unsubstituted alkoxycarbonyl group is represented by —COOY. Examples of Y are methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

Preferably in the aspect of the invention, the polycyclic fused aromatic skeleton has a substituent, and the substituent is a substituted or unsubstituted aryl group or heteroaryl group.

By introducing an aryl group or heteroaryl group as the substituent, the energy gap can be adjusted and molecular associate can be prevented. Thus, the lifetime can be prolonged.

Preferably in the aspect of the invention, the polycyclic fused aromatic skeleton is selected from the group consisting of substituted or unsubstituted naphthalene-diyl, phenanthrene-diyl, chrysene-diyl, fluoranthene-diyl and triphenylene-diyl.

Also preferably in the aspect of the invention, the polycyclic fused aromatic skeleton is substituted by a group containing naphthalene, phenanthrene, chrysene, fluoranthene or triphenylene.

Preferably in the aspect of the invention, the polycyclic fused aromatic skeleton is represented by any one of formulae (1) to (4) as follows.

[Chemical Formula 34]

(1)

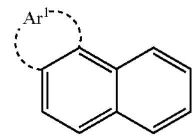

(2)

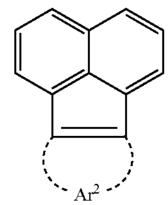

(3)

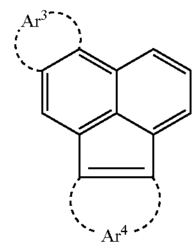

(4)

$$Ar^5—Np—Ar^6$$

In the formulae (1) to (3), $Ar^1$ to $Ar^4$ each represent a substituted or unsubstituted fused cyclic structure having 4 to 10 ring carbon atoms.

In the formula (4), Np represents substituted or unsubstituted naphthalene, and $Ar^5$ and $Ar^6$ each independently represent a substituent formed solely of a substituted or unsubstituted aryl group having 5 to 14 carbon atoms or a substituent formed of a combination of a plurality thereof. However, $Ar^5$ or $Ar^6$ is not anthracene.

Preferably in the aspect of the invention, the polycyclic fused aromatic skeleton is the elementary substance of phenanthrene represented by the following formula (10) or its derivative.

[Chemical Formula 35]

(10)

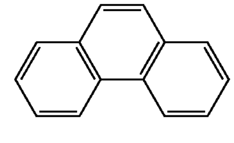

Examples of the substituent for the phenanthrene derivative are an alkyl group, cycloalkyl group, aralkyl group, alkenyl group, cycloalkenyl group, alkynyl group, hydroxyl group, mercapto group, alkoxy group, alkylthio group, arylether group, arylthioether group, aryl group, heterocyclic group, halogen, haloalkane, haloalkene, haloalkyne, cyano group, aldehyde group, carbonyl group, carboxyl group, ester group, amino group, nitro group, silyl group and siloxanyl group.

Examples of the phenanthrene derivative are those represented by the following formulae.

[Chemical Formula 36]
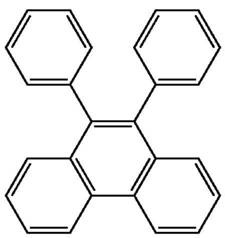
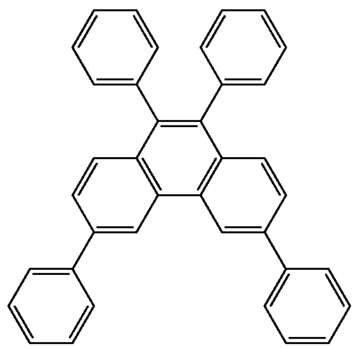
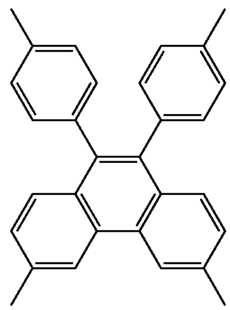
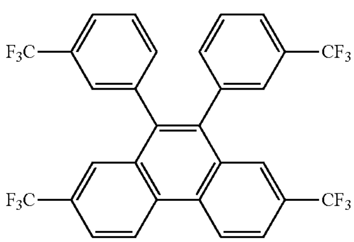
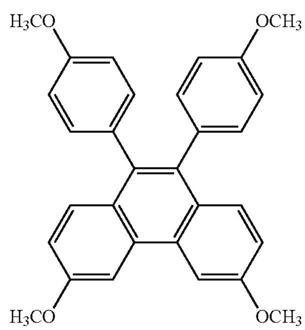
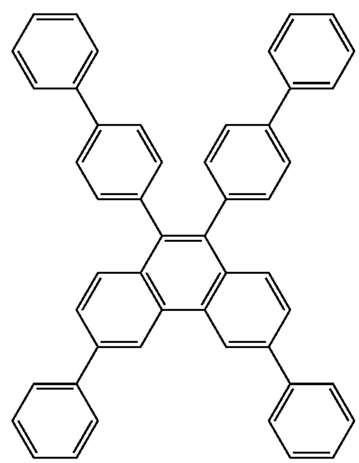
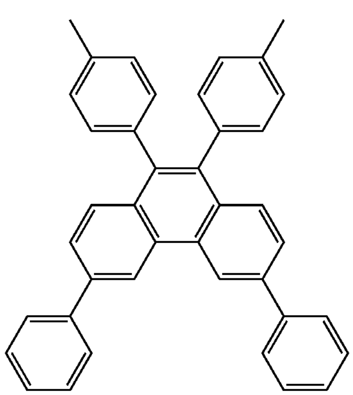

-continued
[Chemical Formula 37]
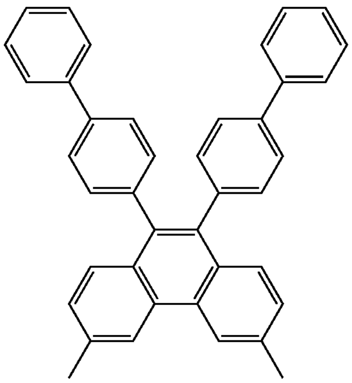
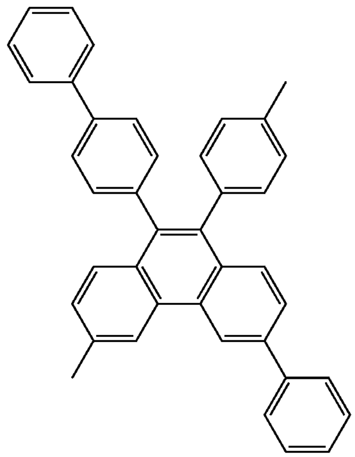
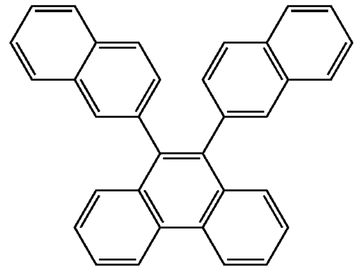
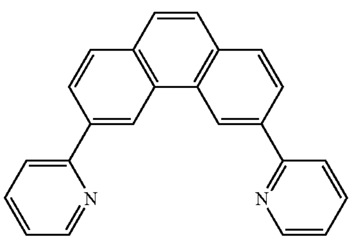
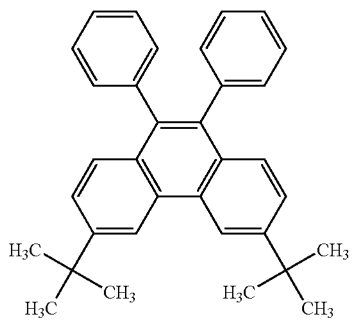
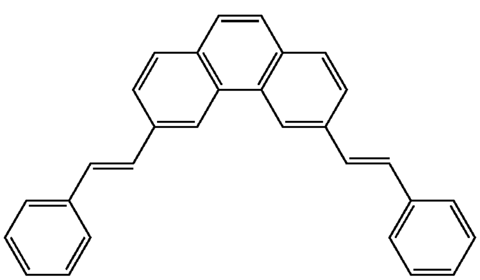
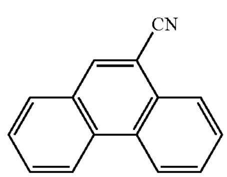
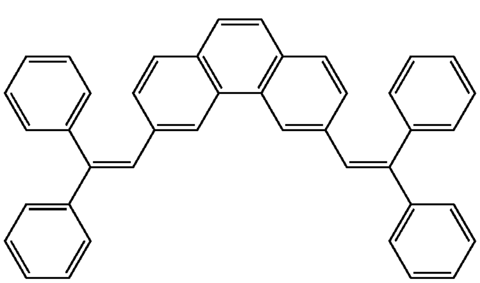

-continued
[Chemical Formula 38]
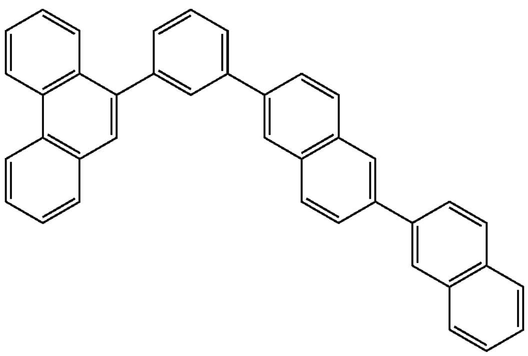
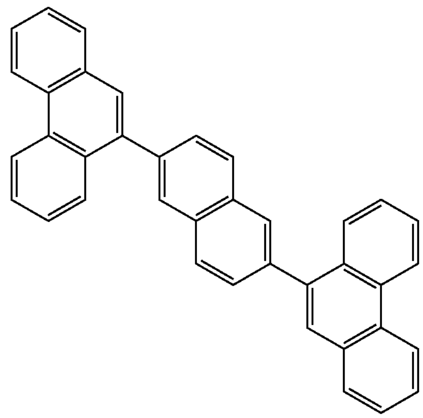
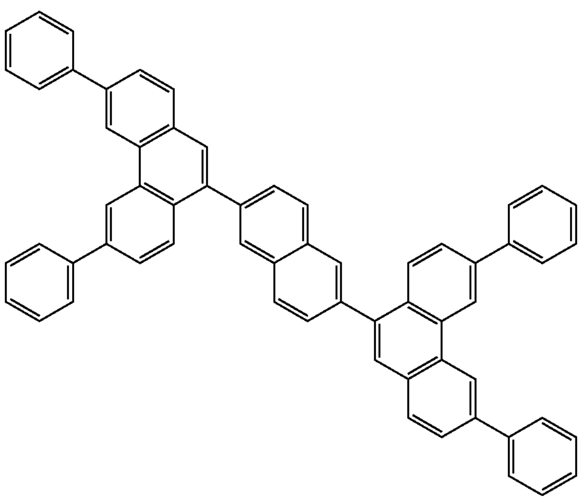
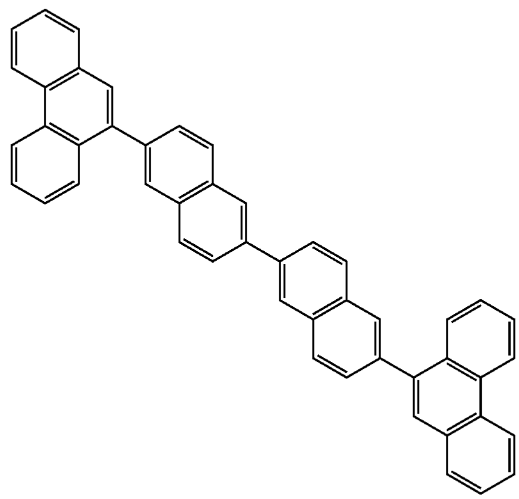
[Chemical Formula 39]
A-1
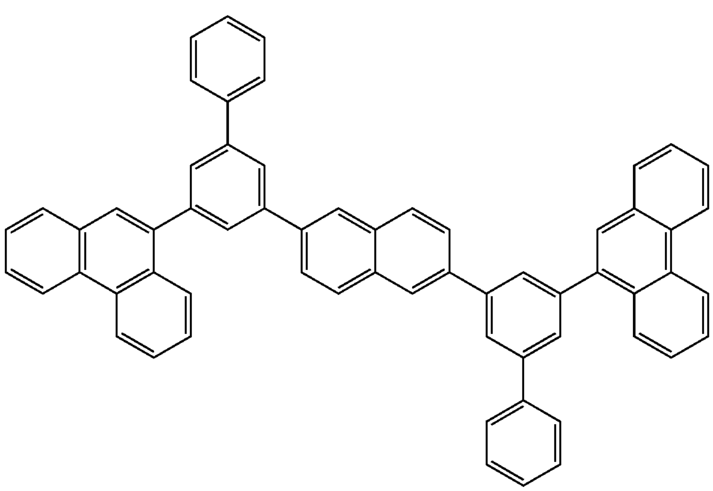

-continued
A-2
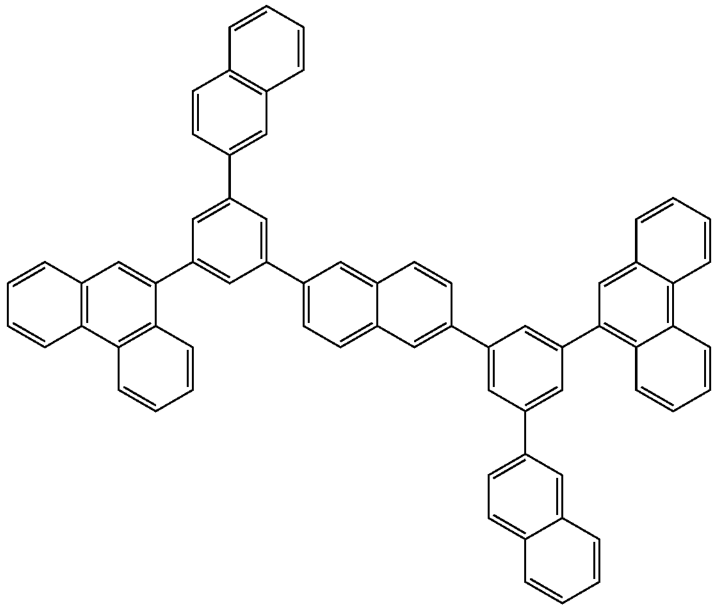
A-4
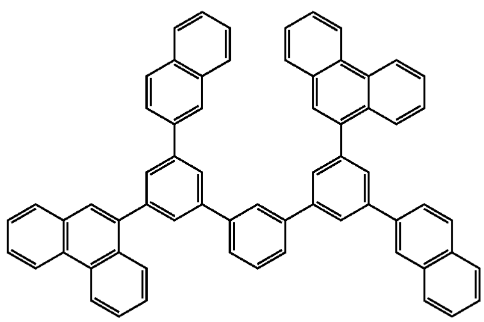
A-15
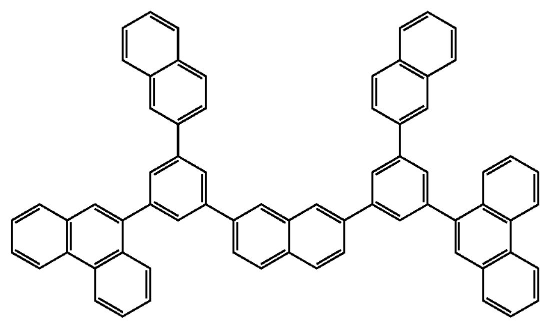
A-17
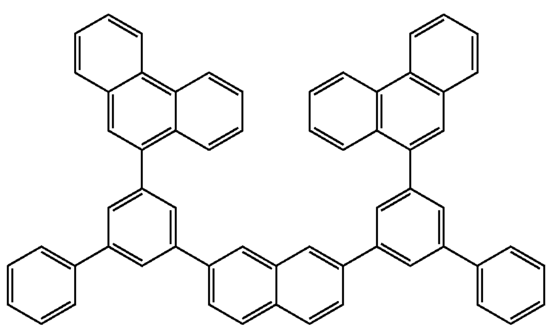
A-24
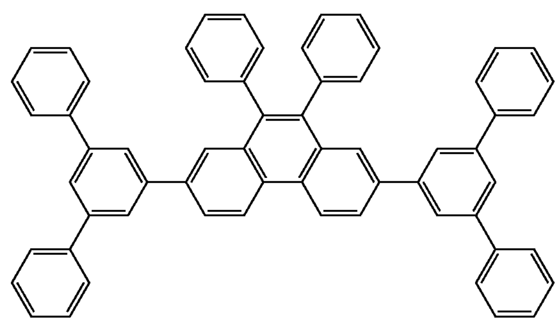
B-25
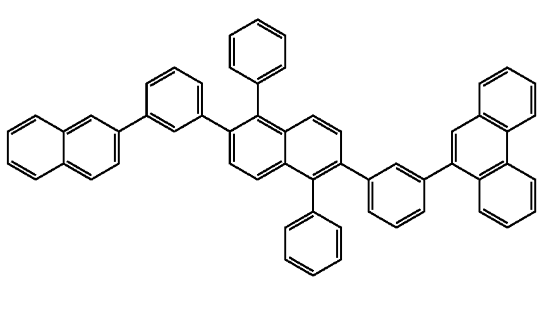
A-26
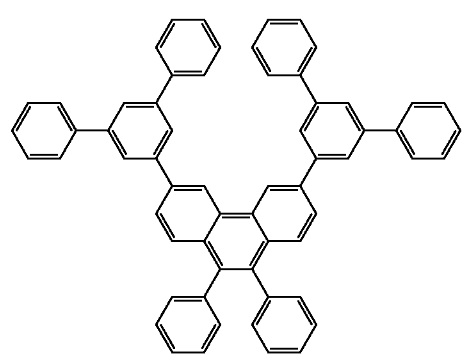

-continued
[Chemical Formula 40]
F-14
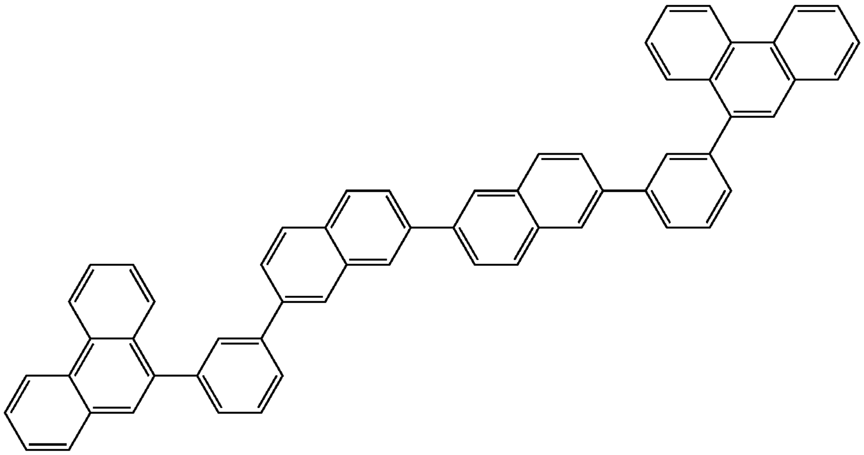
F-25
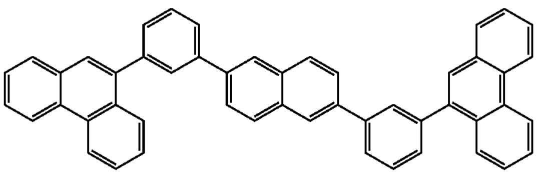
F-26
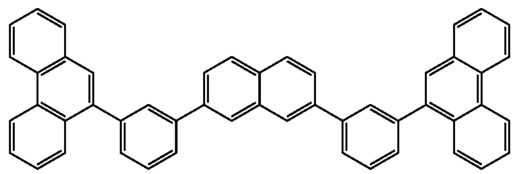
F-27
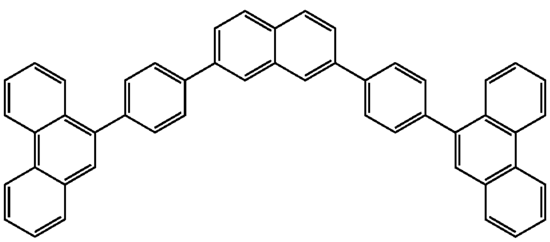
F-28
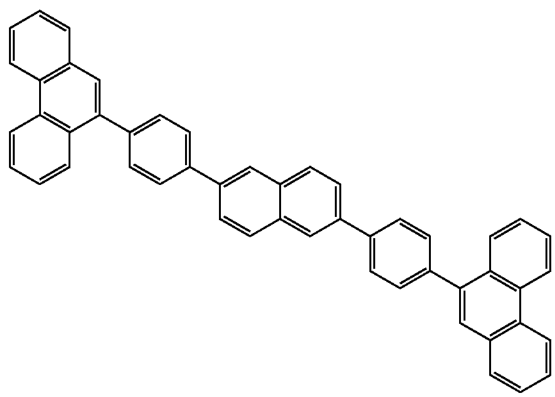
F-29
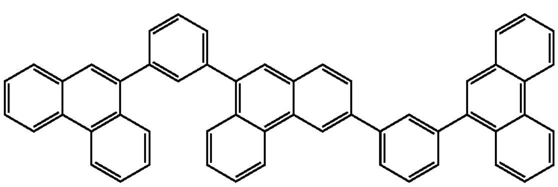
F-30
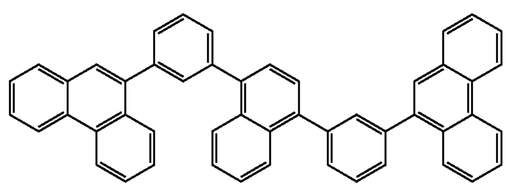
F-31
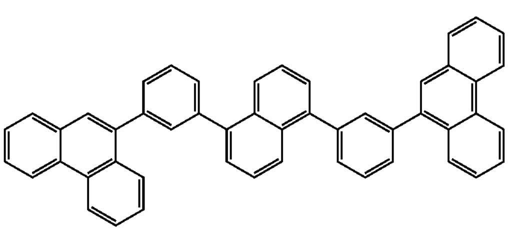
F-32
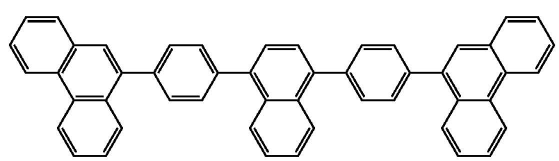

-continued
[Chemical Formula 41]
C-1
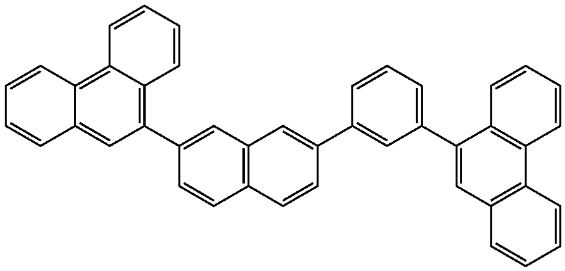
C-2
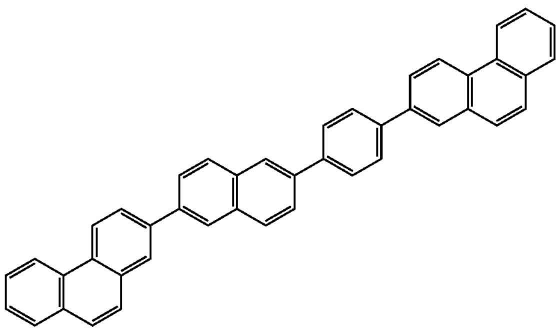
C-3
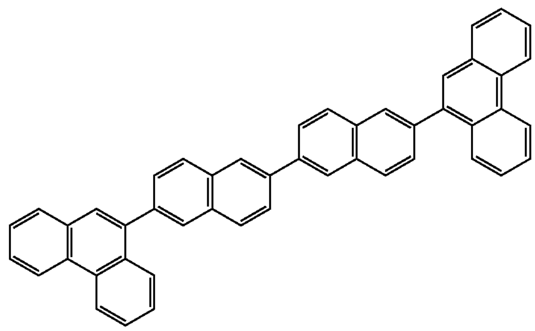
C-4
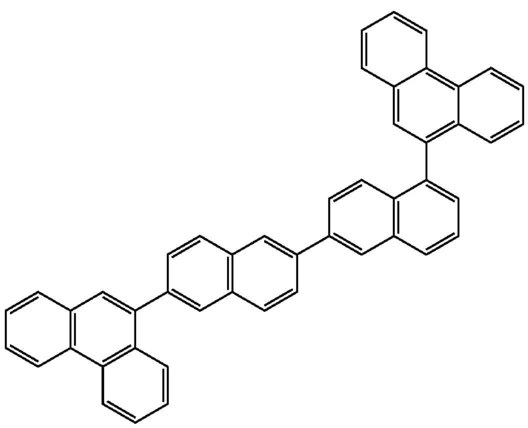
C-5
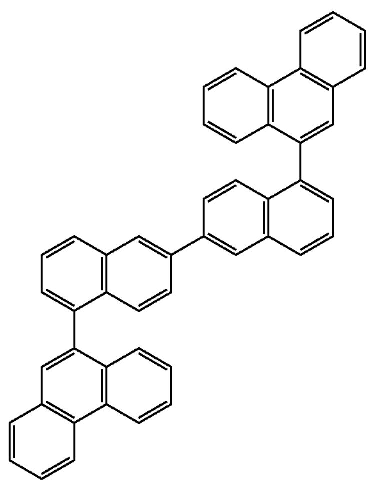
C-6
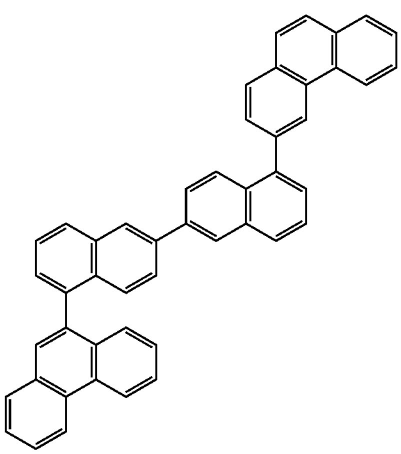
C-7
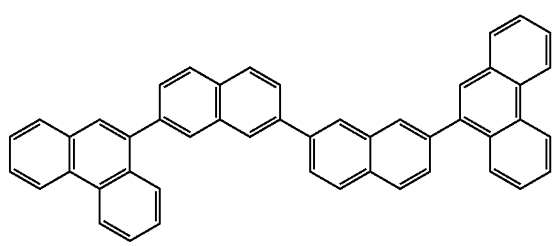

-continued
C-8
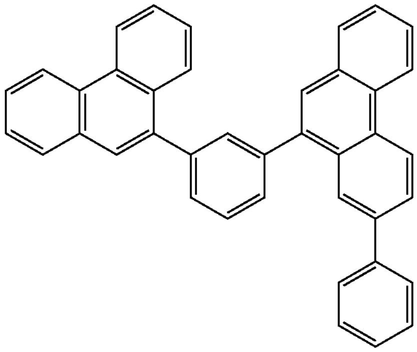
[Chemical Formula 42]
D-1
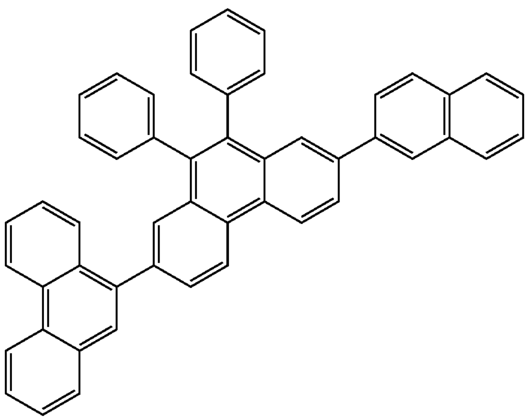
D-2
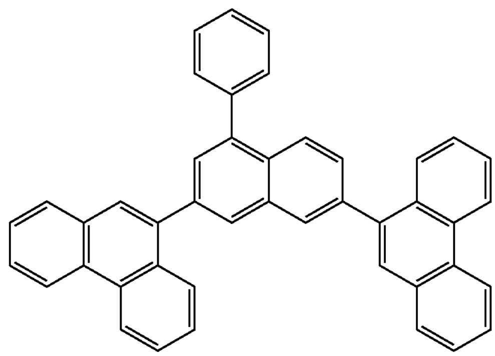
D-3
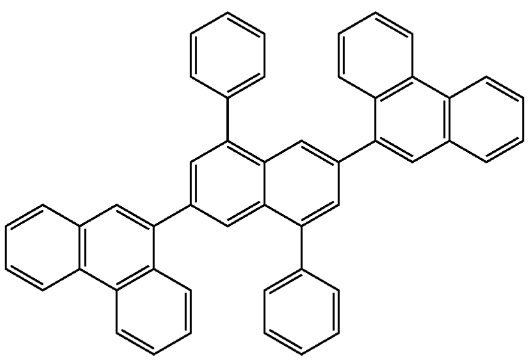
D-4
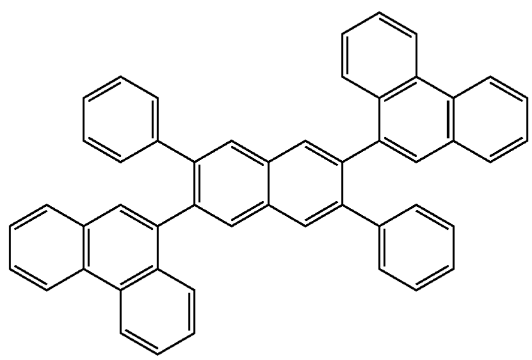
D-5
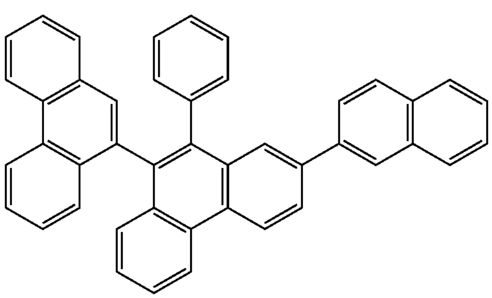
D-6
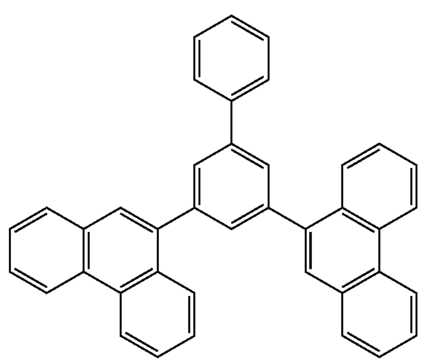

-continued
D-7
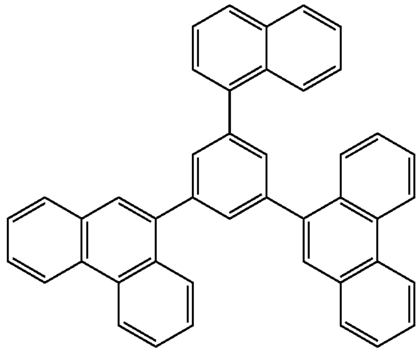
D-8
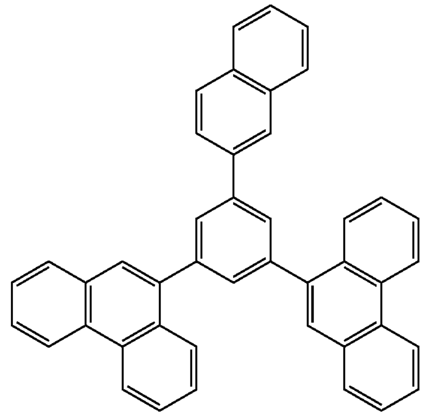
D-9
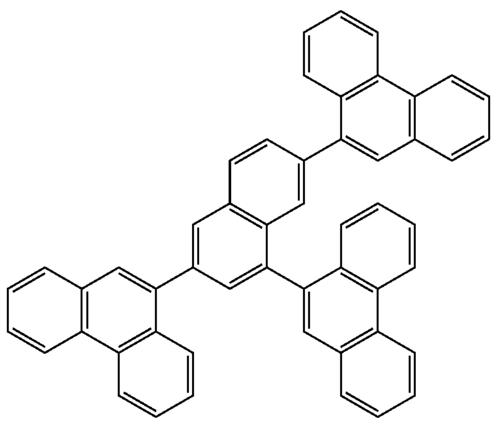
[Chemical Formula 43]
E-1
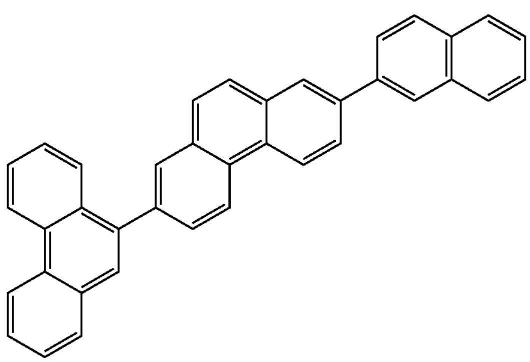
E-2
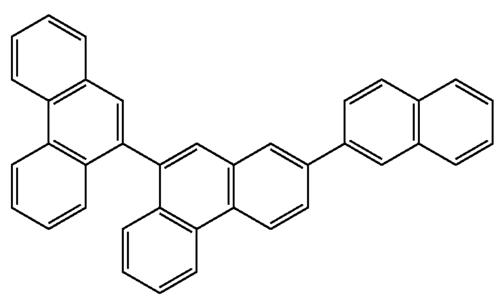
E-3
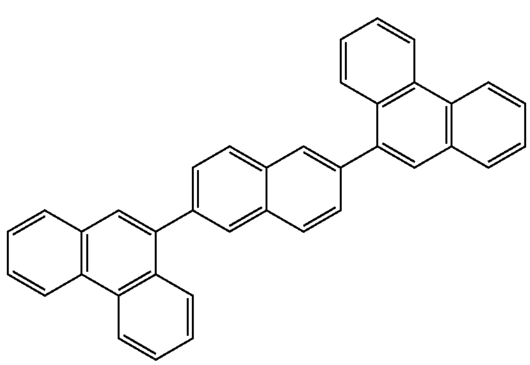
E-4
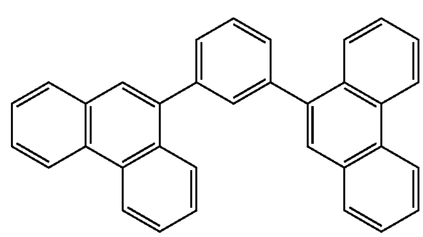

-continued
E-5
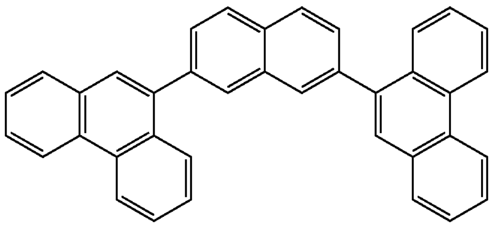
[Chemical Formula 44]
G-1
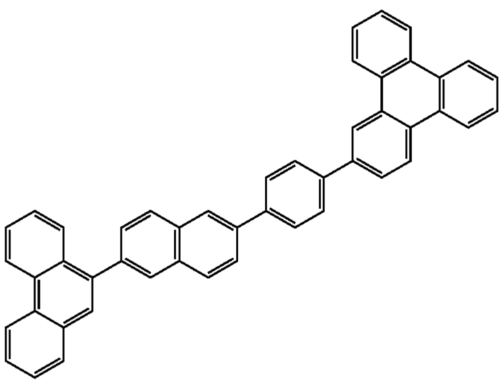
G-2
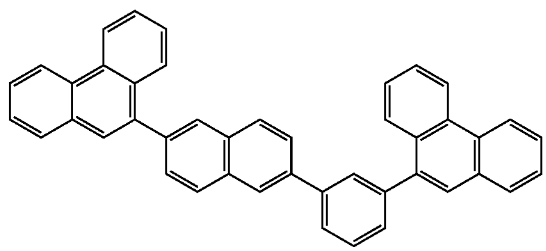
G-3
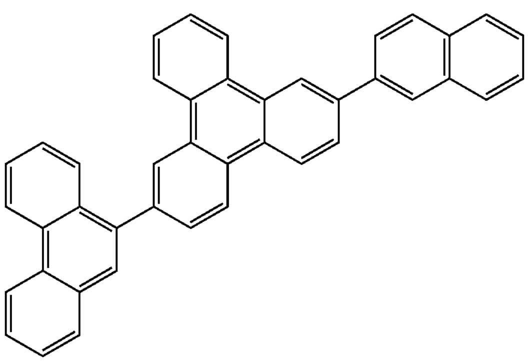
G-4
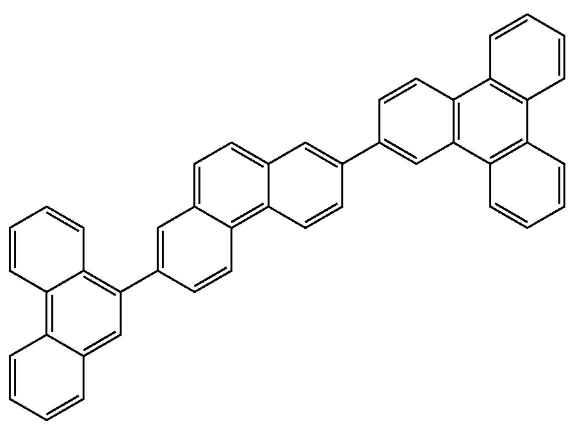
G-5
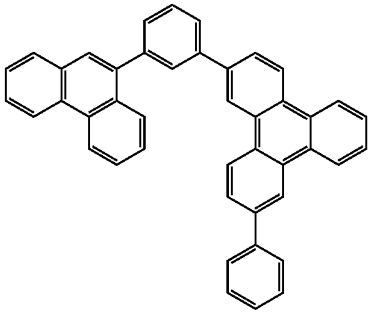
G-6
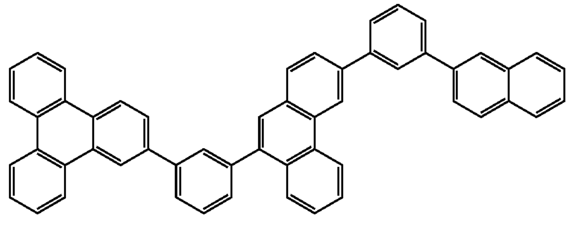

-continued
G-7
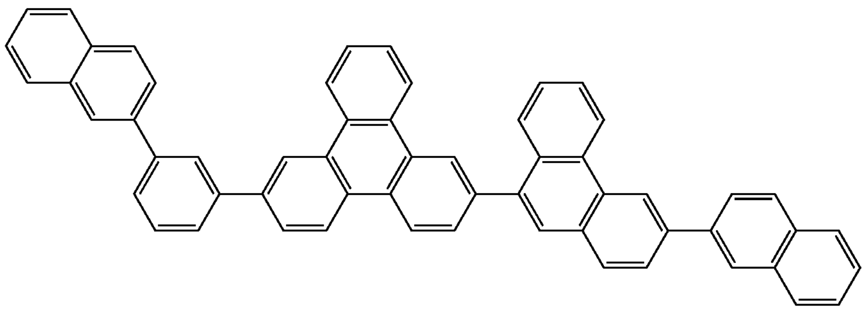
Preferably in the aspect of the invention, the polycyclic fused aromatic skeleton is the elementary substance of chrysene represented by the following formula (11) or its derivative.
[Chemical Formula 45]
(11)
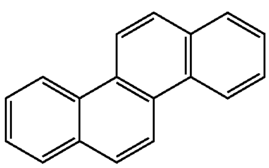
Examples of the chrysene derivative are those represented by the following formulae.
[Chemical Formula 46]
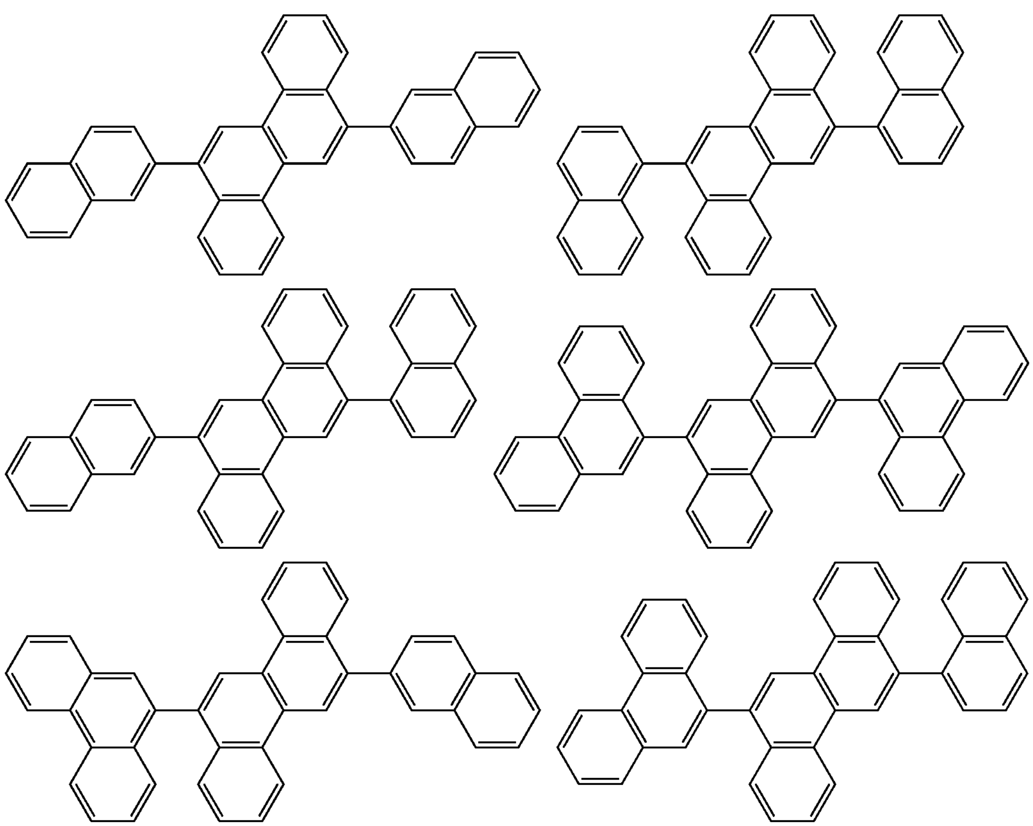

-continued
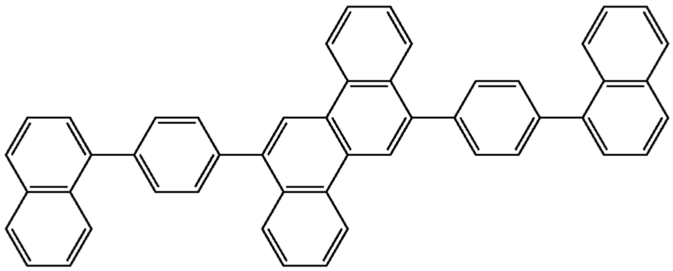
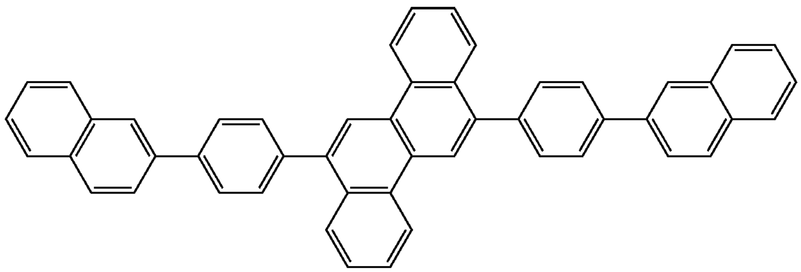
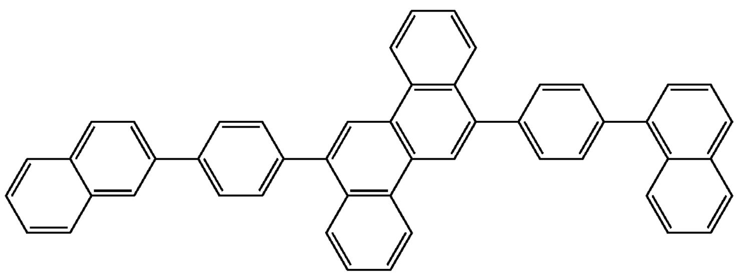
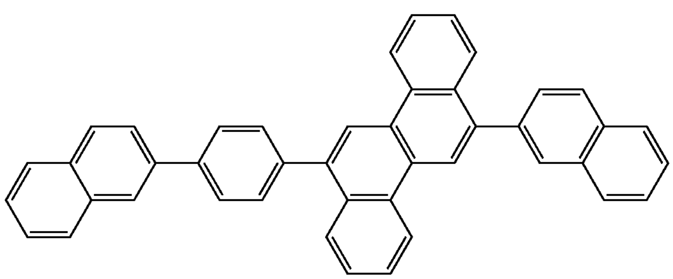
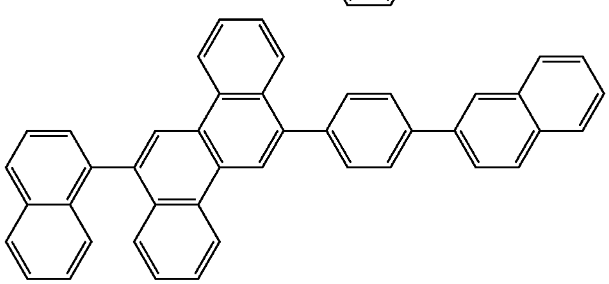
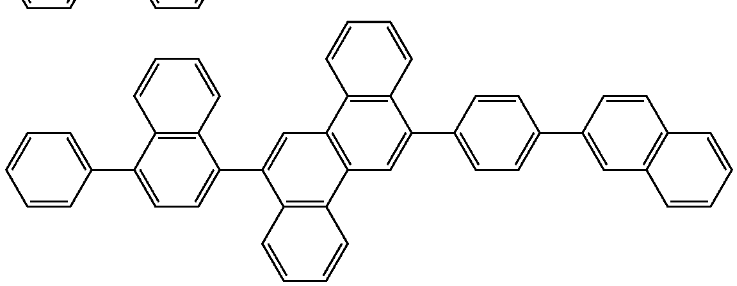

-continued
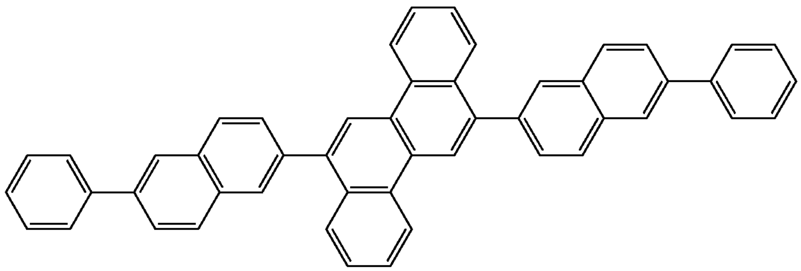
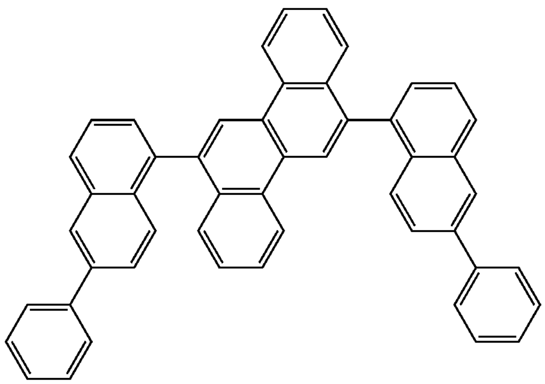
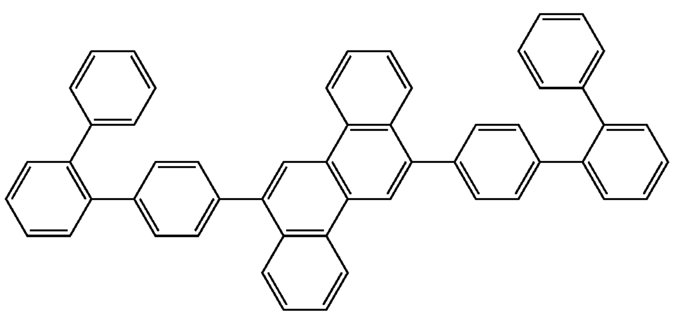
[Chemical Formula 47]
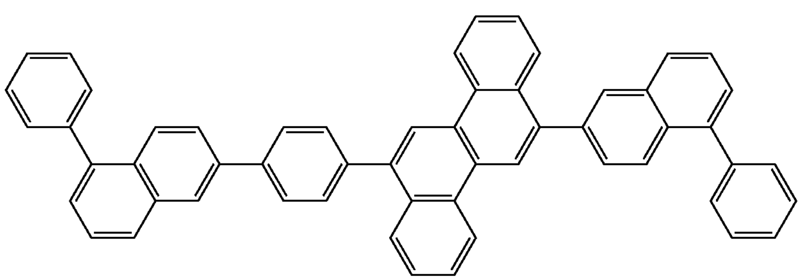
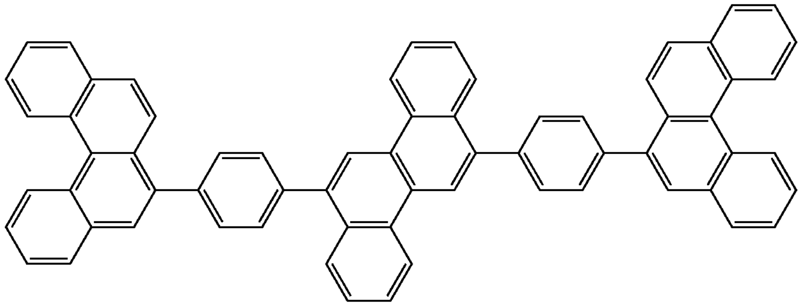

-continued
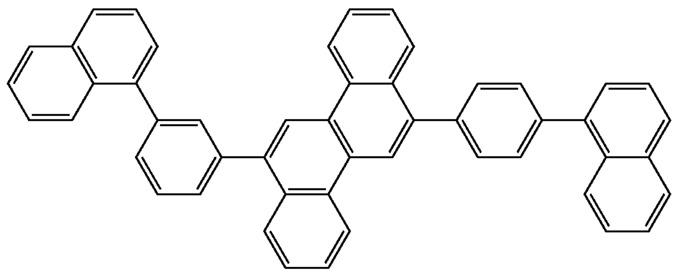
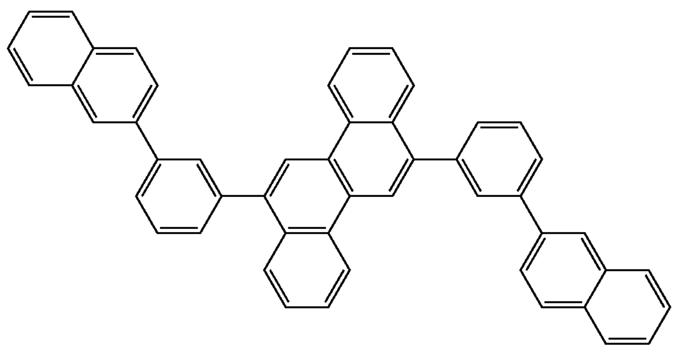
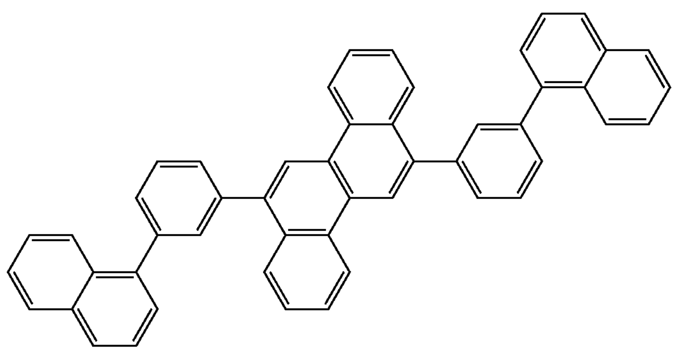
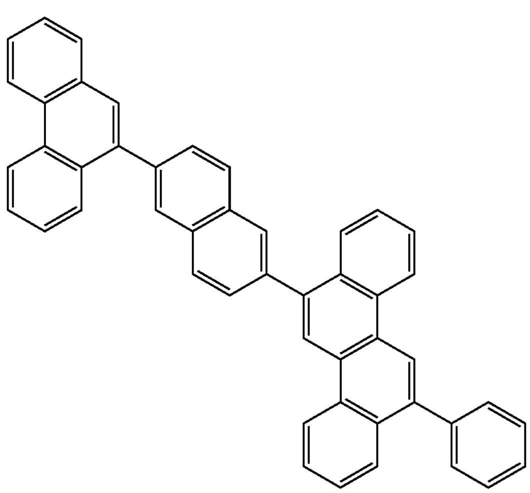

-continued
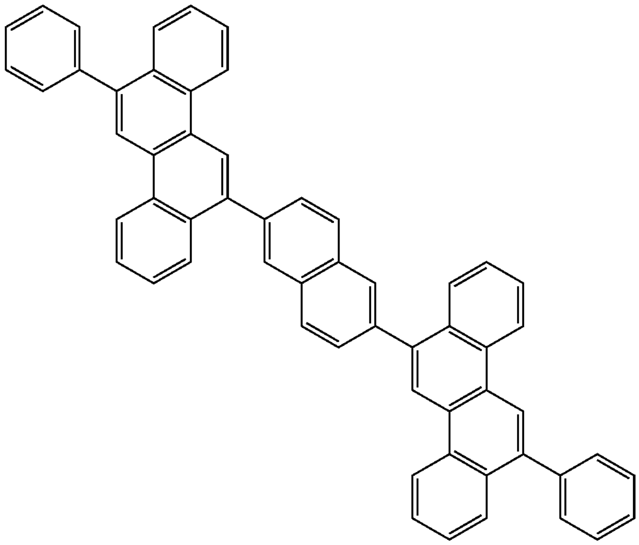
[Chemical Formula 48]
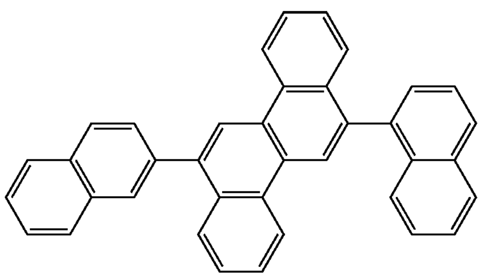
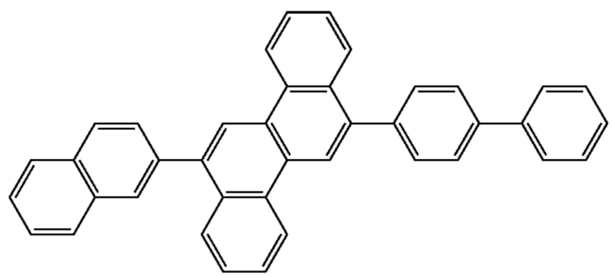
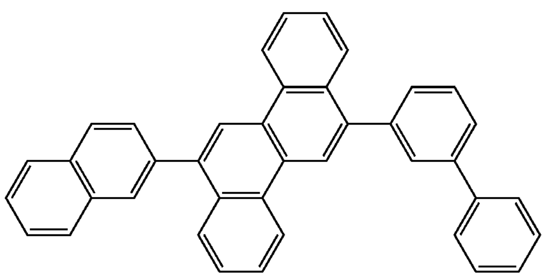
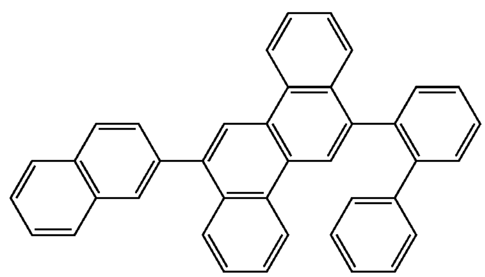
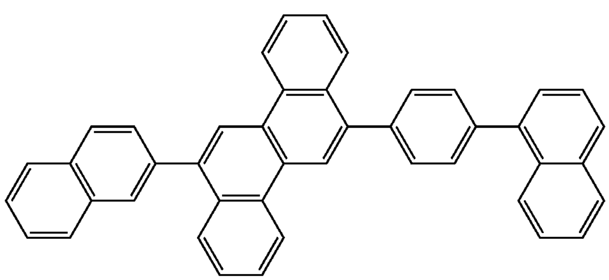
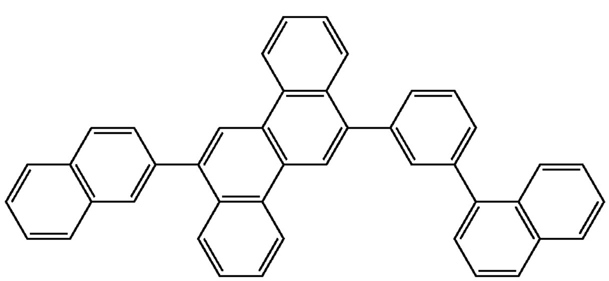

-continued
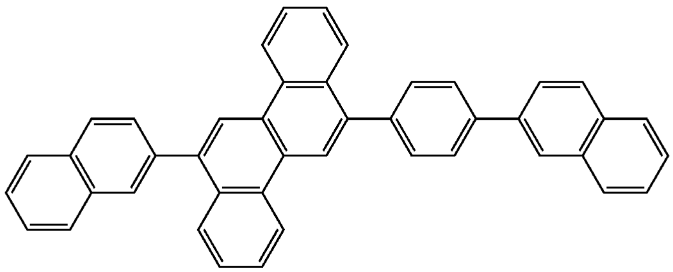
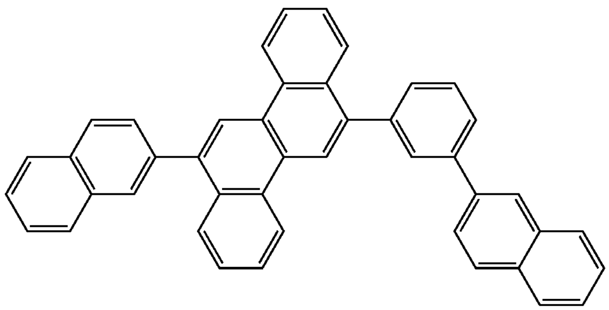
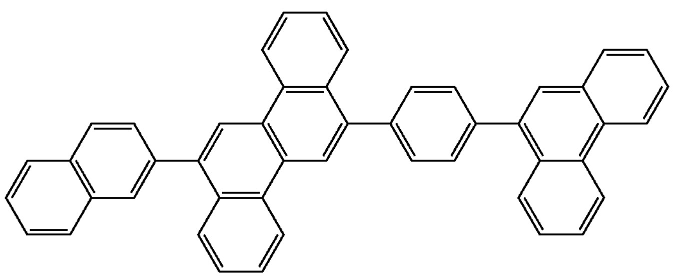
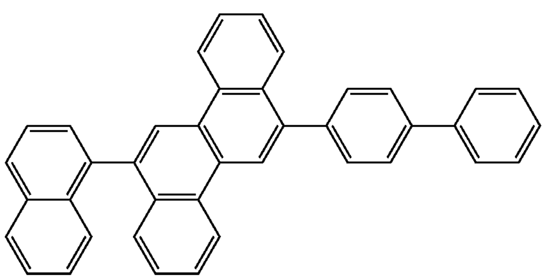
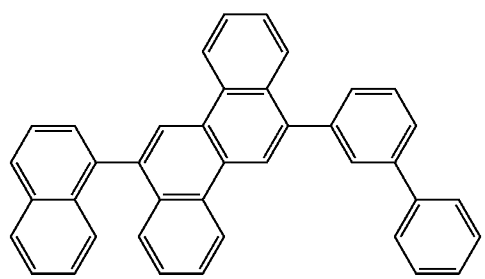
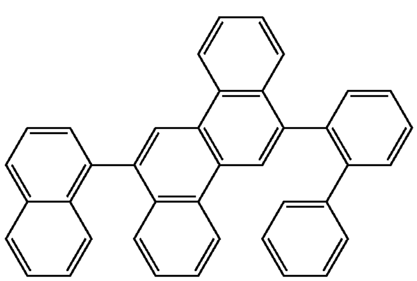
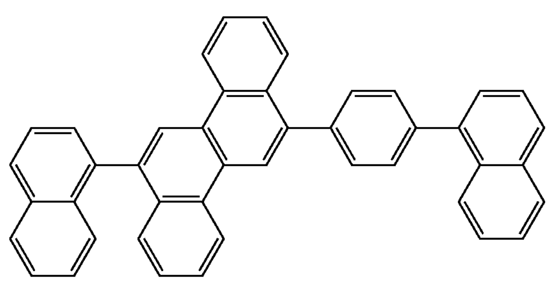
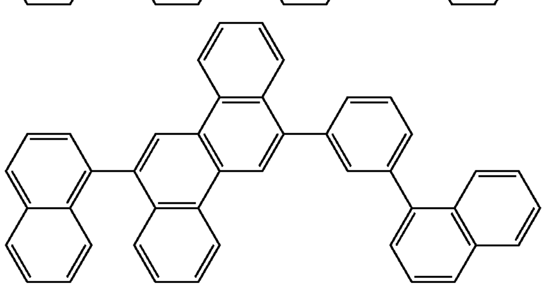

-continued
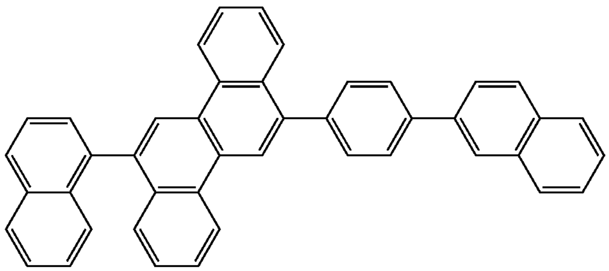
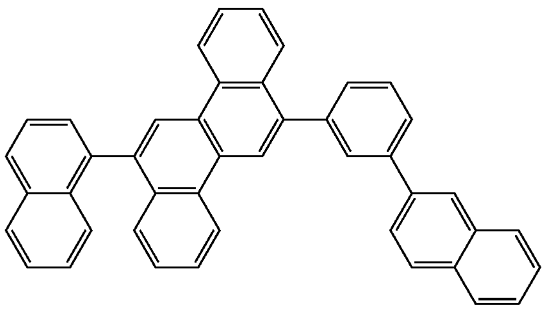
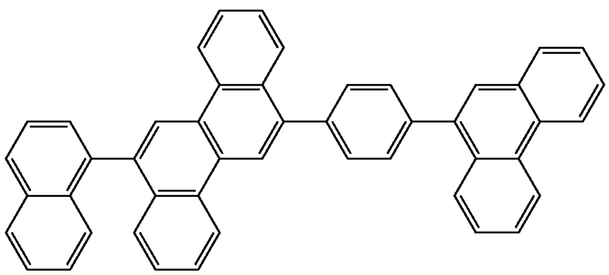
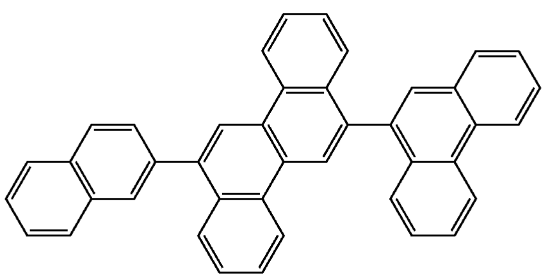
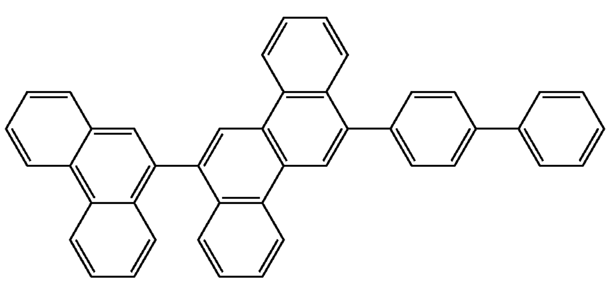
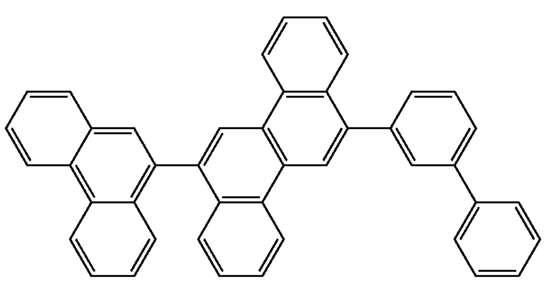
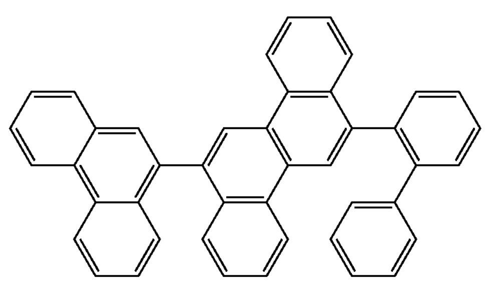

-continued
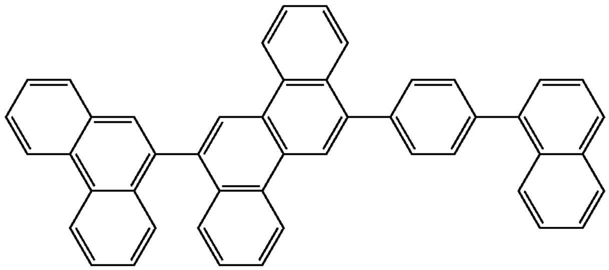
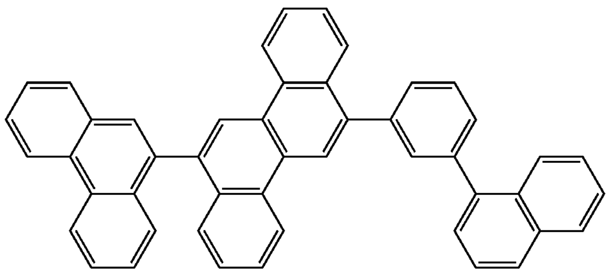
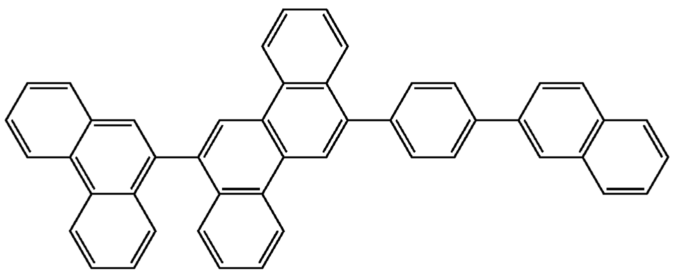
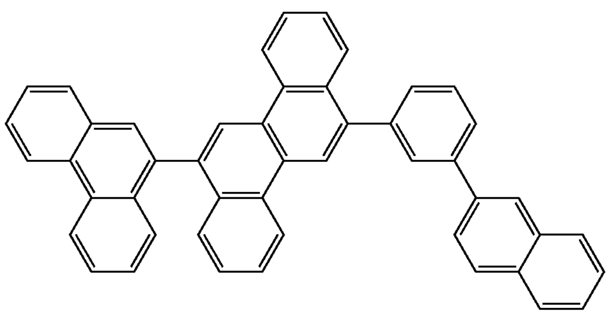
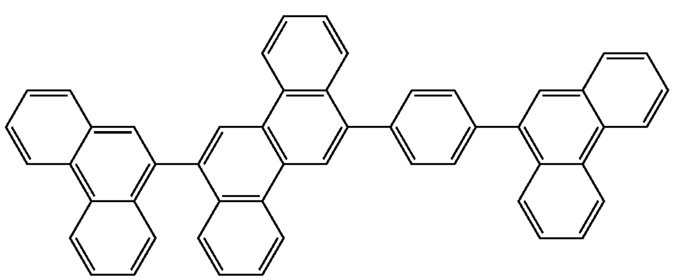
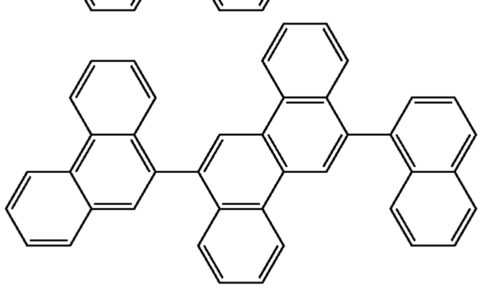

-continued
[Chemical Formula 49]
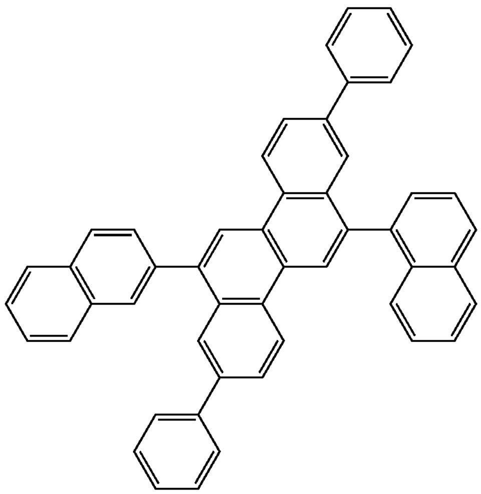
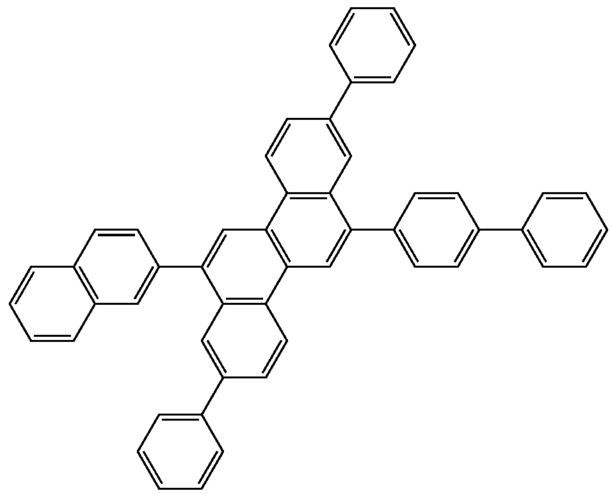
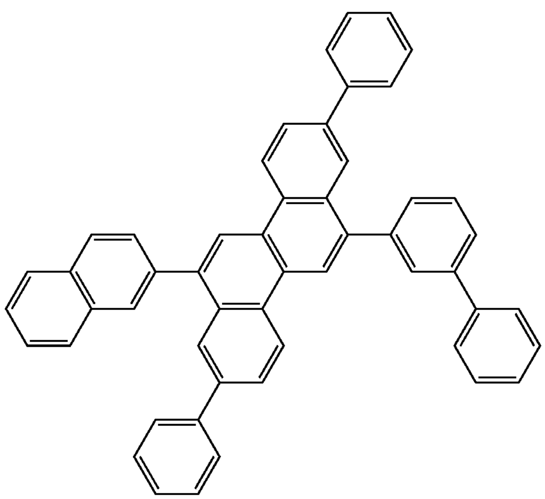
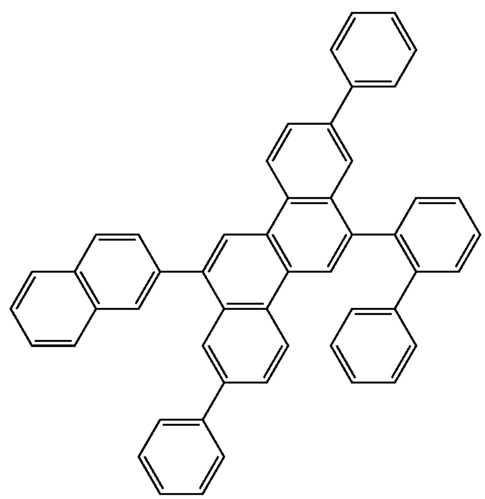
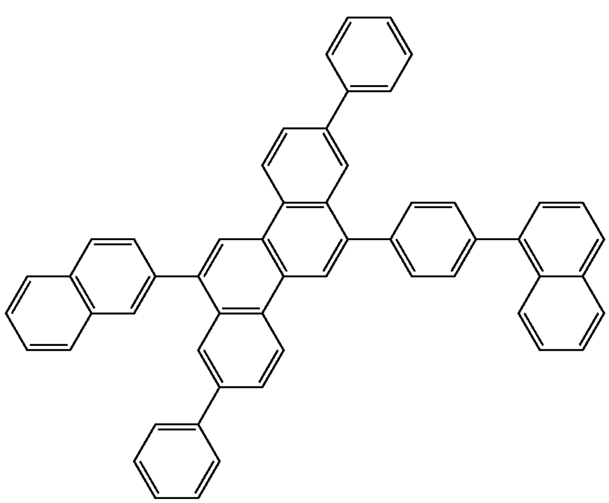

-continued
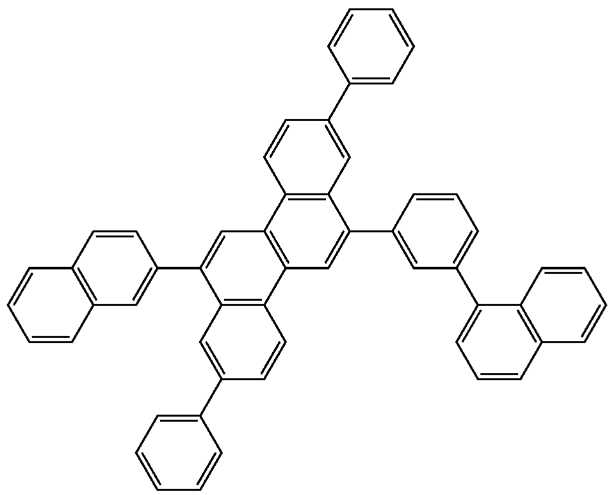
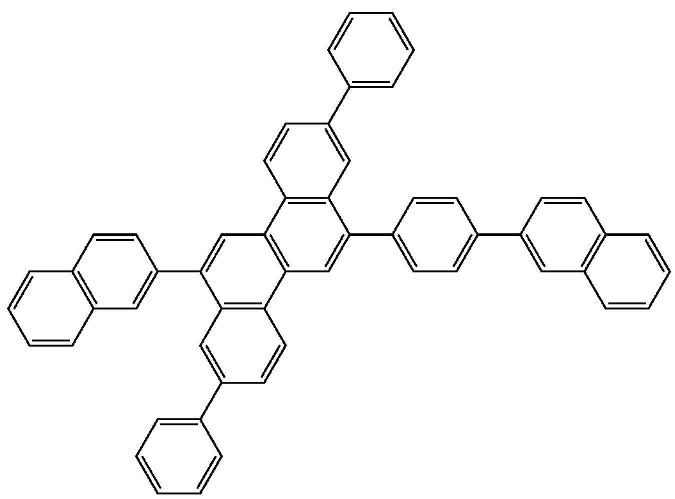
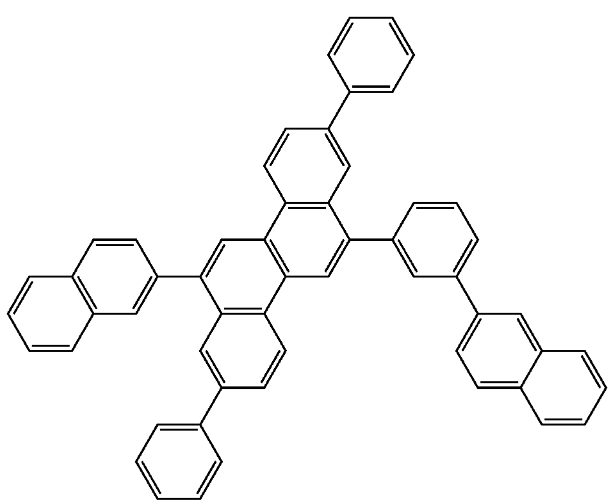

-continued
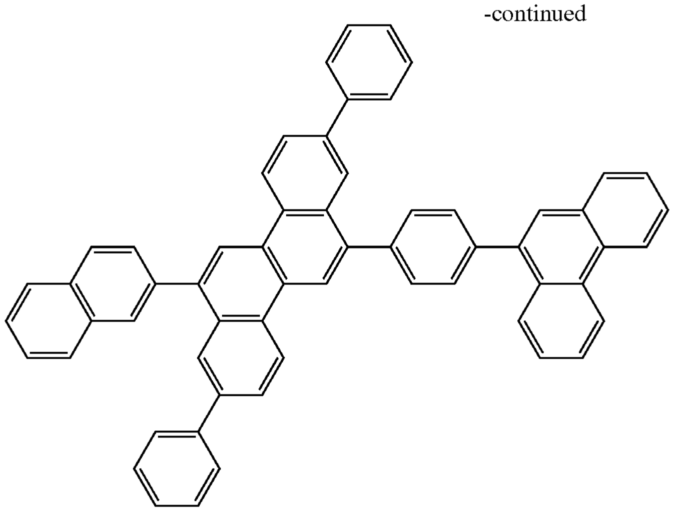
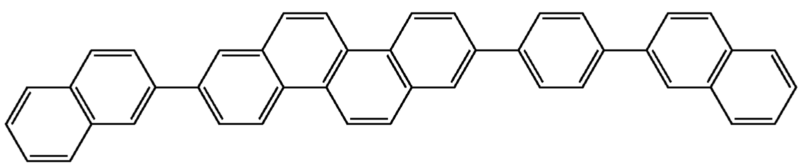
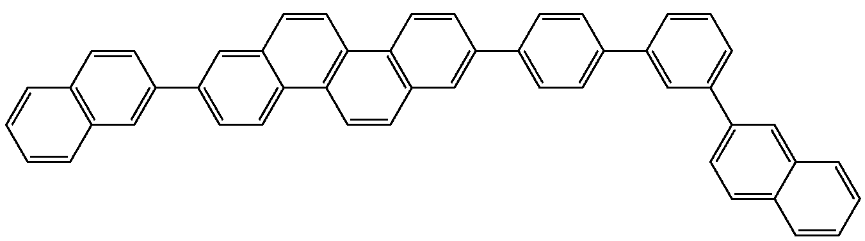
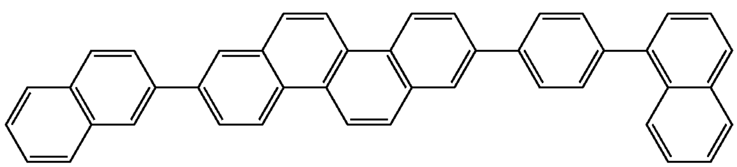
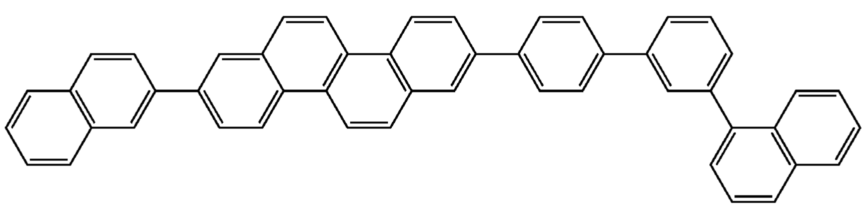
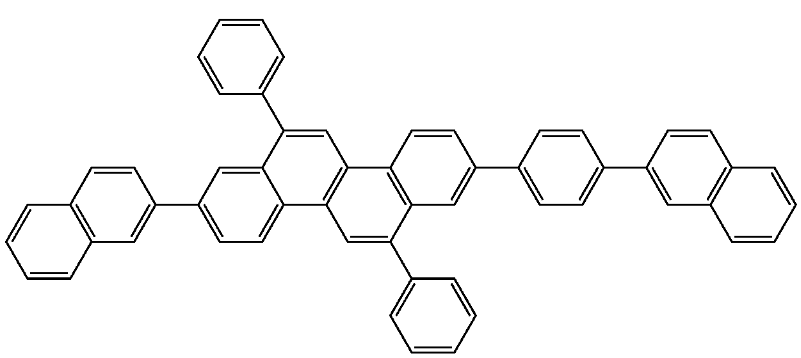

-continued
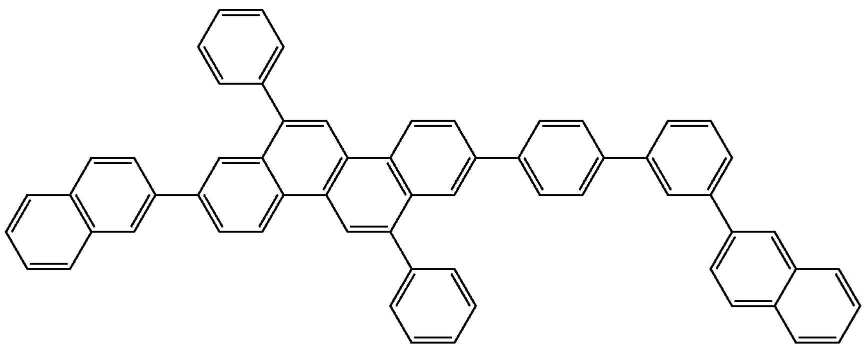
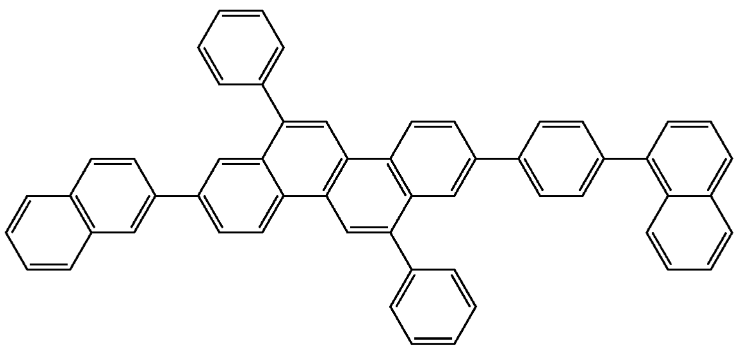
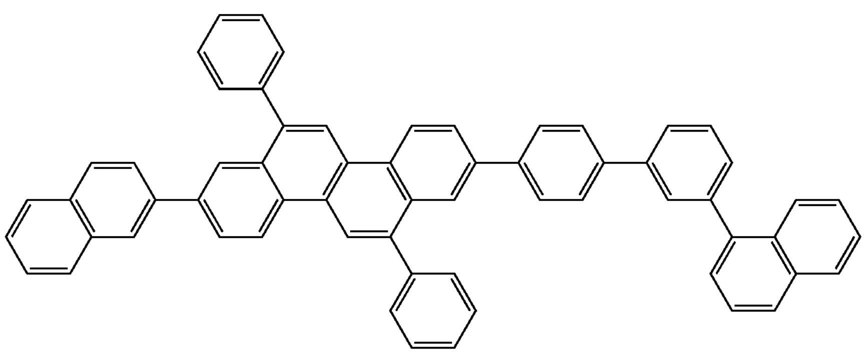
Preferably in the aspect of the invention, the polycyclic fused aromatic skeleton is the elementary substance of a compound represented by the following formula (12) (benzo[c]phenanthrene) or its derivative.
[Chemical Formula 50]
(12)
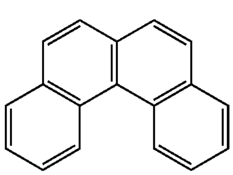
Examples of the derivative of such a compound are as follows.
[Chemical Formula 51]
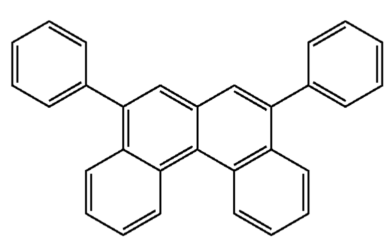

-continued
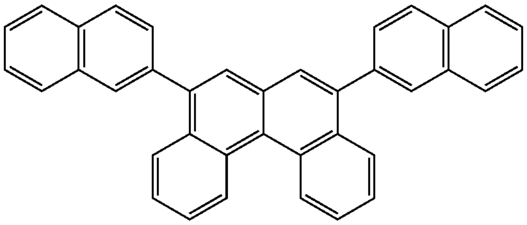
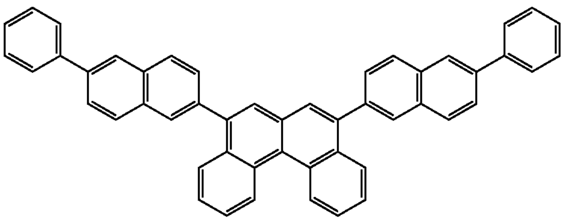
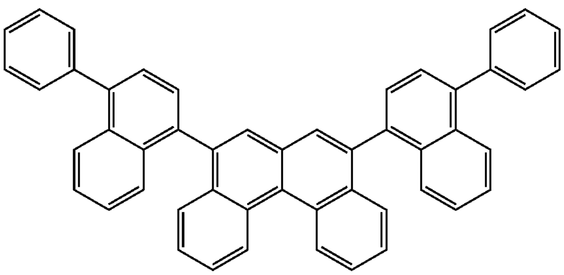
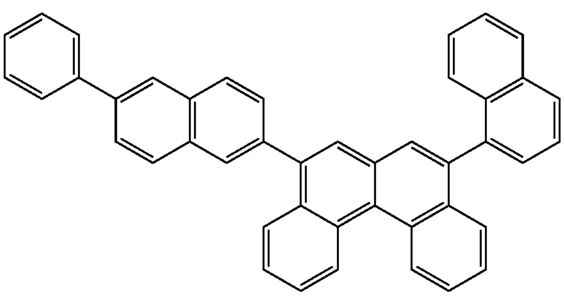
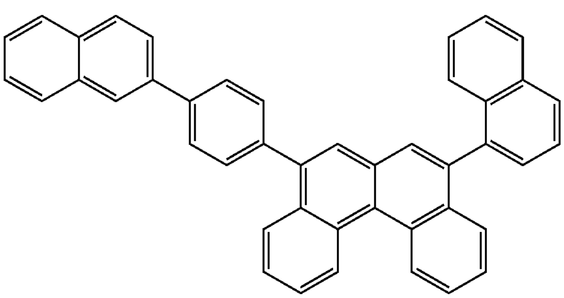
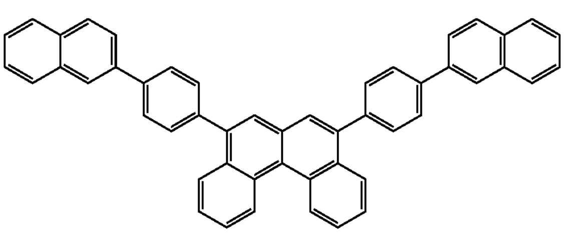
-continued
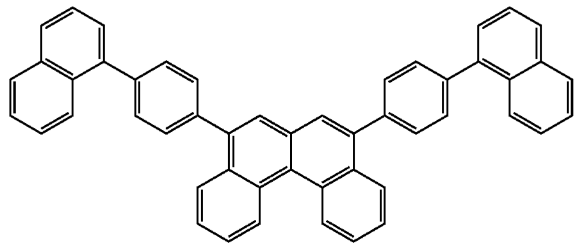
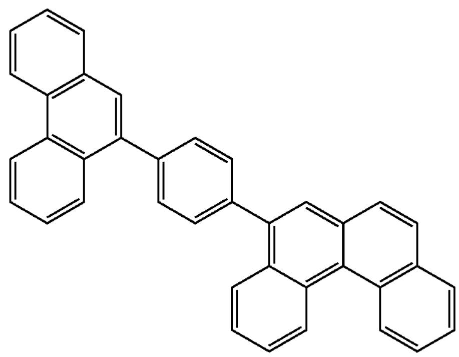
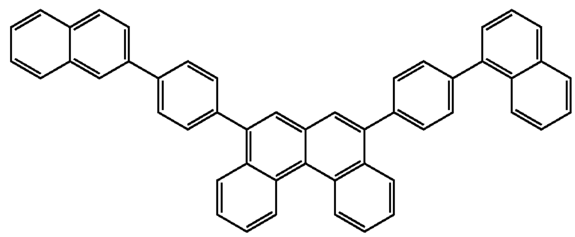
Preferably in the aspect of the invention, the polycyclic fused aromatic skeleton is the elementary substance of a compound represented by the following formula (13) (benzo[c]chrysene) or its derivative.
[Chemical Formula 52]
(13)
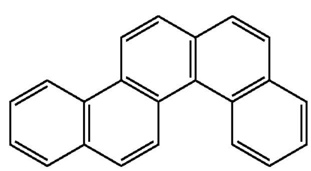
Examples of the derivative of such a compound are as follows.
[Chemical Formula 53]
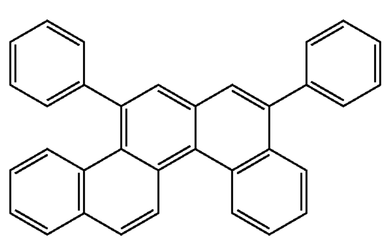

-continued

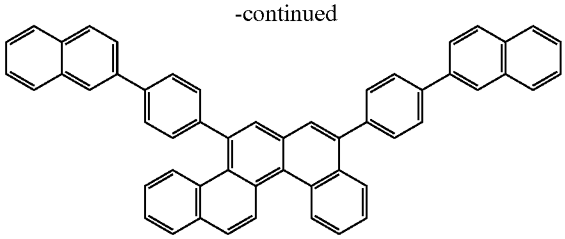

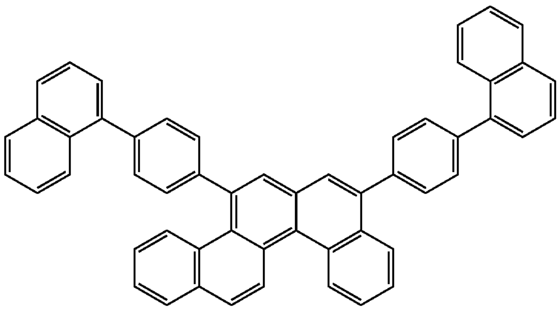

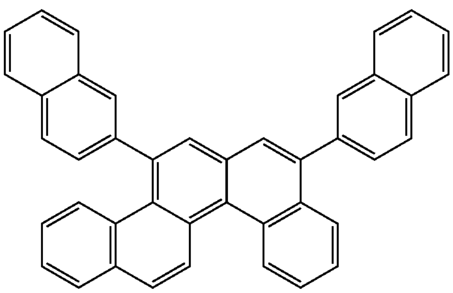

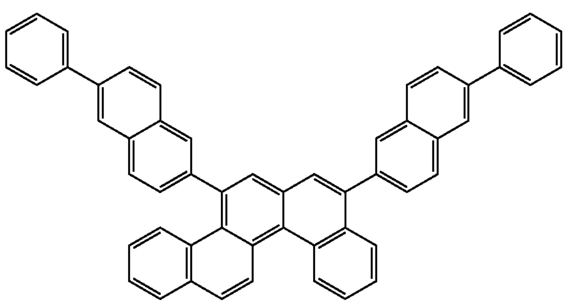

Preferably in the aspect of the invention, the polycyclic fused aromatic skeleton is the elementary substance of a compound represented by the following formula (14) (benzo [c, g]phenanthrene) or its derivative.

[Chemical Formula 54]

(14)

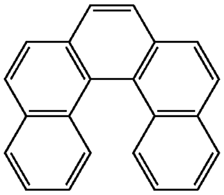

Examples of the derivative of such a compound are as follows.

[Chemical Formula 55]

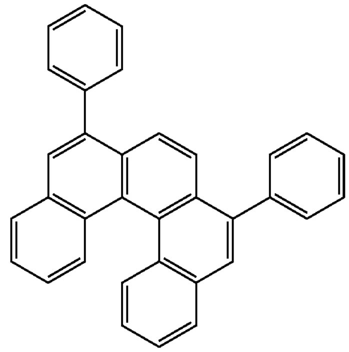

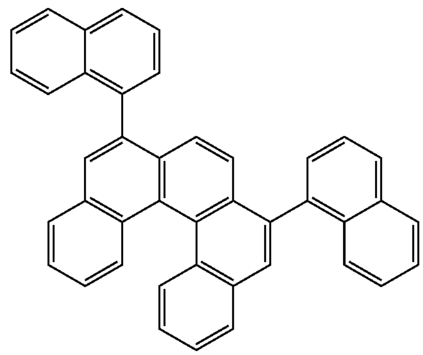

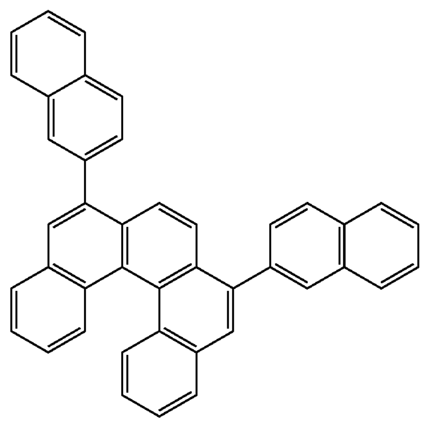

Preferably in the aspect of the invention, the polycyclic fused aromatic skeleton is the elementary substance of fluoranthene represented by the following formula (15) or its derivative.

[Chemical Formula 56]

(15)

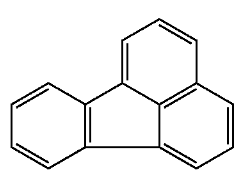

Examples of the fluoranthene derivative are those represented by the following formulae.

[Chemical Formula 57]
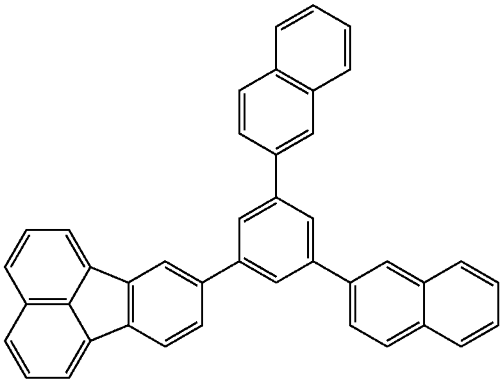
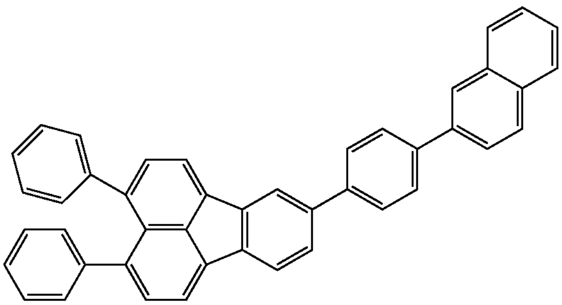
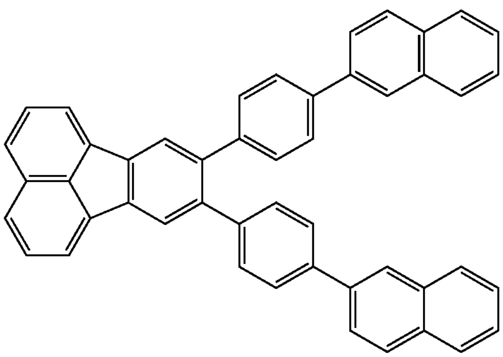
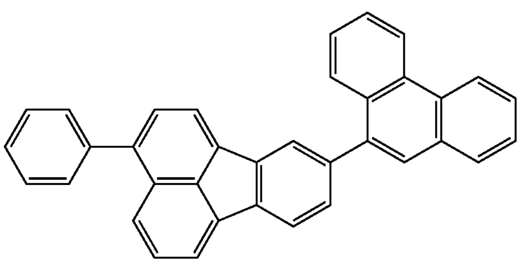
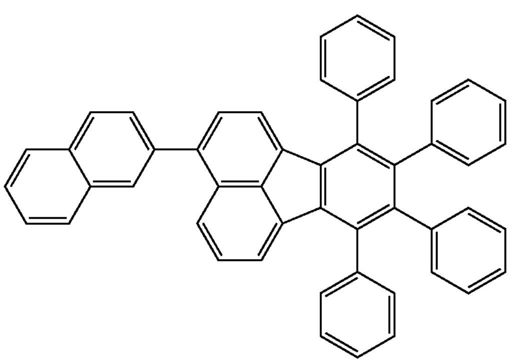
-continued
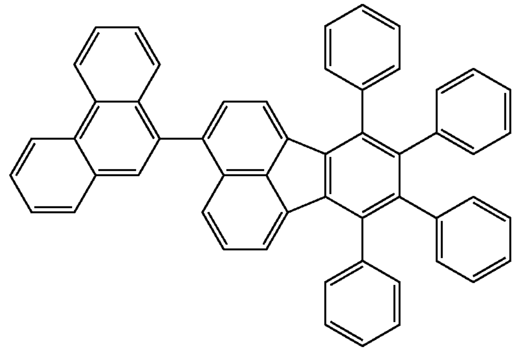
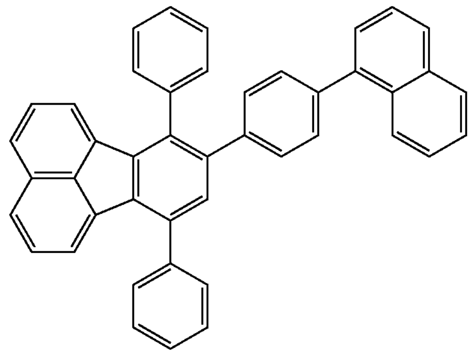
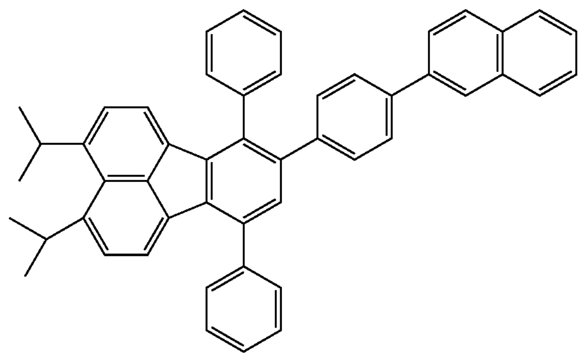
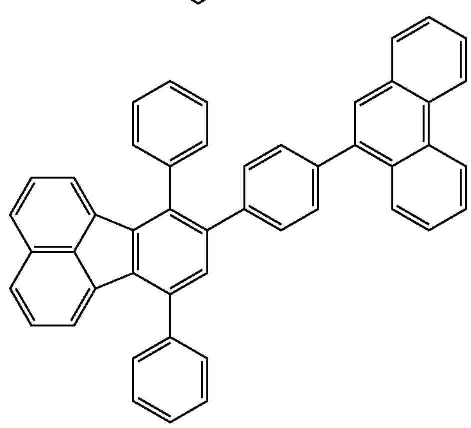
[Chemical Formula 58]
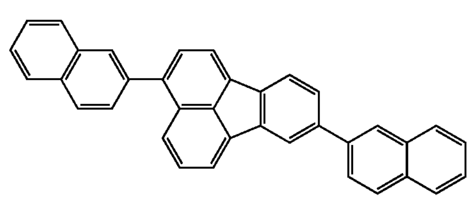

-continued
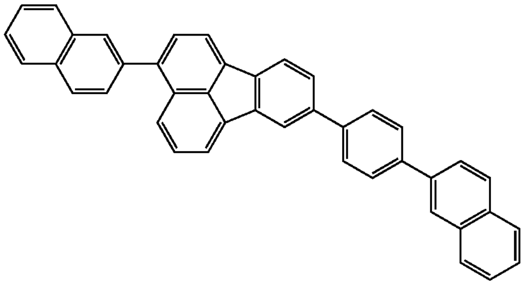
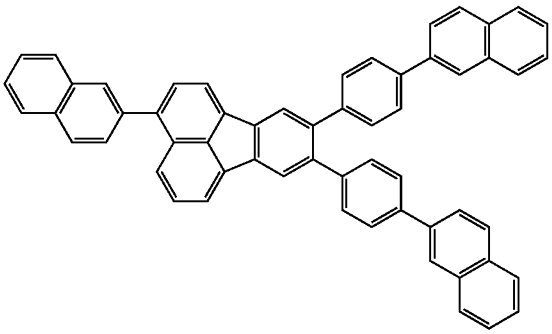
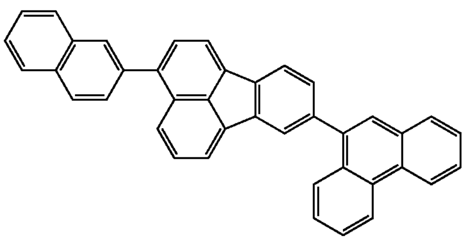
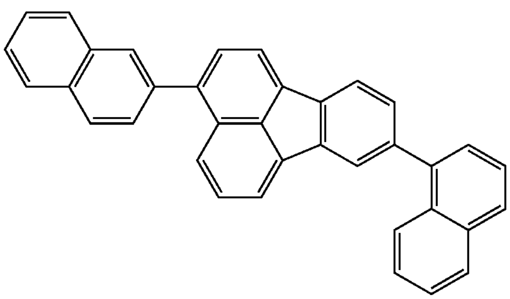
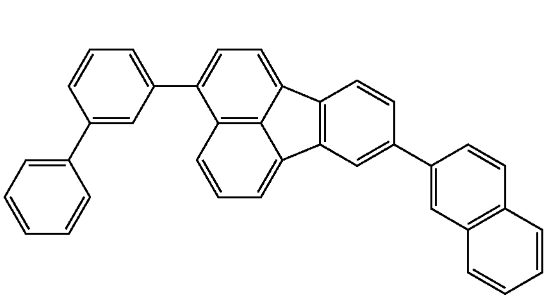
-continued
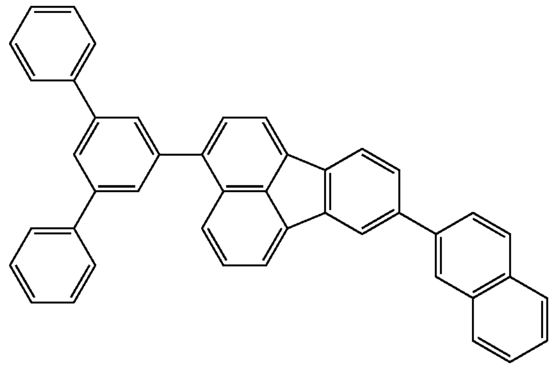
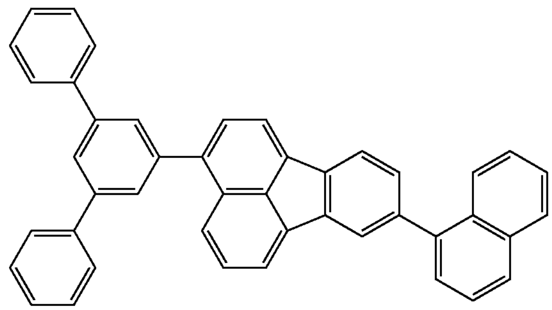
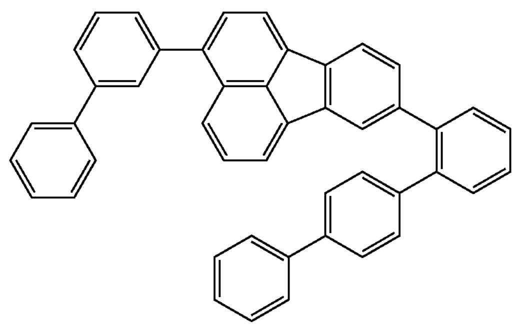
Examples of the substituted or unsubstituted benzofluoranthene are a benzo[b]fluoranthene derivative represented by the following formula (151) and a benzo[k]fluoranthene derivative represented by a formula (152).
[Chemical Formula 59]
(151)
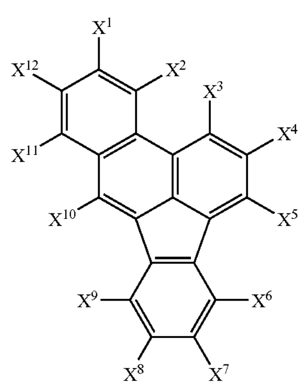

-continued (152)

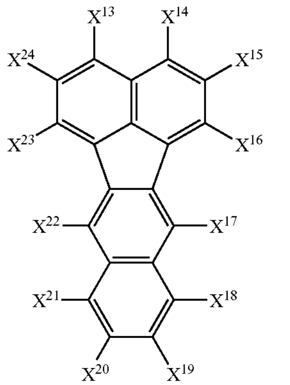

In the formulae (151) and (152), $X^1$ to $X^{24}$ each represent a hydrogen atom, a halogen atom, a linear, branched or cyclic alkyl group, a linear, branched or cyclic alkoxy group, or a substituted or unsubstituted aryl group.

The aryl group represents a carbocyclic aromatic group such as a phenyl group and naphthyl group, or a heterocyclic aromatic group such as a furyl group, thienyl group and pyridyl group.

$X^1$ to $X^{24}$ each preferably represent hydrogen atom, halogen atom (such as fluorine atom, chlorine atom, or bromine atom), linear, branched or cyclic alkyl group having 1 to 16 carbon atoms (such as methyl group, ethyl group, n-propyl group, isopropyl group, n-butyl group, isobutyl group, sec-butyl group, tert-butyl group, n-pentyl group, isopentyl group, neopentyl group, tert-pentyl group, cyclopentyl group, n-hexyl group, 3,3-dimethylbutyl group, cyclohexyl group, n-heptyl group, cyclohexylmethyl group, n-octyl group, tert-octyl group, 2-ethylhexyl group, n-nonyl group, n-decyl group, n-dodecyl group, n-tetradecyl group, or n-hexadecyl group), linear, branched or cyclic alkoxy group having 1 to 16 carbon atoms (such as methoxy group, ethoxy group, n-propoxy group, isopropoxy group, n-butoxy group, isobutoxy group, sec-butoxy group, n-pentyloxy group, neopentyloxy group, cyclopentyloxy group, n-hexyloxy group, 3,3-dimethylbutyloxy group, cyclohexyloxy group, n-heptyloxy group, n-octyloxy group, 2-ethylhexyloxy group, n-nonyloxy group, n-decyloxy group, n-dodecyloxy group, n-tetradecyloxy group, or n-hexadecyloxy group), or substituted or unsubstituted aryl group having 4 to 16 carbon atoms (such as phenyl group, 2-methylphenyl group, 3-methylphenyl group, 4-methylphenyl group, 4-ethylphenyl group, 4-n-propylphenyl group, 4-isopropylphenyl group, 4-n-butylphenyl group, 4-tert-butylphenyl group, 4-isopentylphenyl group, 4-tert-pentylphenyl group, 4-n-hexylphenyl group, 4-cyclohexylphenyl group, 4-n-octylphenyl group, 4-n-decylphenyl group, 2,3-dimethylphenyl group, 2,4-dimethylphenyl group, 2,5-dimethylphenyl group, 3,4-dimethylphenyl group, 5-indanyl group, 1,2,3,4-tetrahydro-5-naphthyl group, 1,2,3,4-tetrahydro-6-naphthyl group, 2-methoxyphenyl group, 3-methoxyphenyl group, 4-methoxyphenyl group, 3-ethoxyphenyl group, 4-ethoxyphenyl group, 4-n-propoxyphenyl group, 4-isopropoxyphenyl group, 4-n-butoxyphenyl group, 4-n-pentyloxyphenyl group, 4-n-hexyloxyphenyl group, 4-cyclohexyloxyphenyl group, 4-n-heptyloxyphenyl group, 4-n-octyloxyphenyl group, 4-n-decyloxyphenyl group, 2,3-dimethoxyphenyl group, 2,5-dimethoxyphenyl group, 3,4-dimethoxyphenyl group, 2-methoxy-5-methylphenyl group, 3-methyl-4-methoxyphenyl group, 2-fluorophenyl group, 3-fluorophenyl group, 4-fluorophenyl group, 2-chlorophenyl group, 3-chlorophenyl group, 4-chlorophenyl group, 4-bromophenyl group, 4-trifluoromethylphenyl group, 3,4-dichlorophenyl group, 2-methyl-4-chlorophenyl group, 2-chloro-4-methylphenyl group, 3-chloro-4-methylphenyl group, 2-chloro-4-methoxyphenyl group, 4-phenylphenyl group, 3-phenylphenyl group, 4-(4'-methylphenyl)phenyl group, 4-(4'-methoxyphenyl)phenyl group, 1-naphthyl group, 2-naphthyl group, 4-ethoxy-1-naphthyl group, 6-methoxy-2-naphthyl group, 7-ethoxy-2-naphthyl group, 2-furyl group, 2-thienyl group, 3-thienyl group, 2-pyridyl group, 3-pyridyl group, or 4-pyridyl group), more preferably hydrogen atom, fluorine atom, chlorine atom, alkyl group having 1 to 10 carbon atoms, alkoxy group having 1 to 10 carbon atoms or aryl group having 6 to 12 carbon atoms, further more preferably hydrogen atom, fluorine atom, chlorine atom, alkyl group having 1 to 6 carbon atoms, alkoxy group having 1 to 6 carbon atoms or carbocyclic aromatic group having 6 to 10 carbon atoms.

Examples of the benzo[b]fluoranthene derivative represented by the formula (151) are as follows.

[Chemical Formula 60]

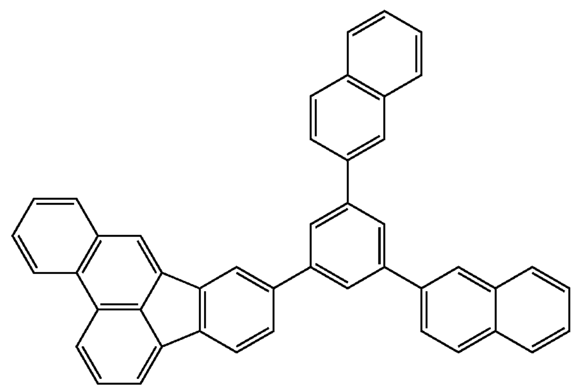

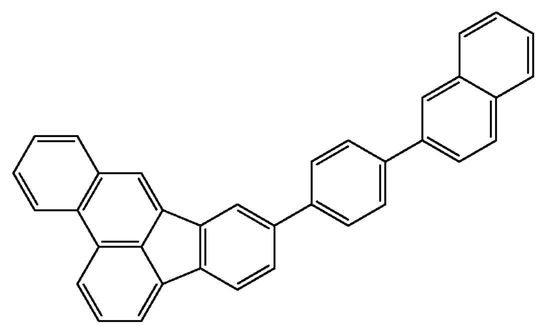

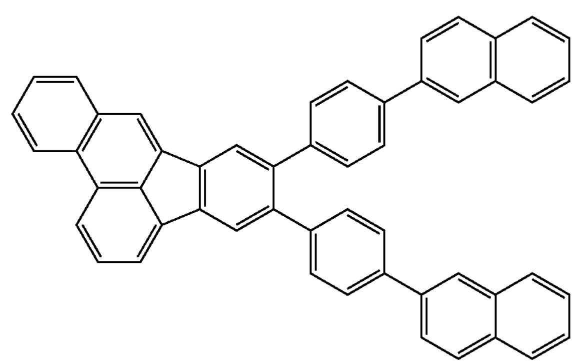

-continued
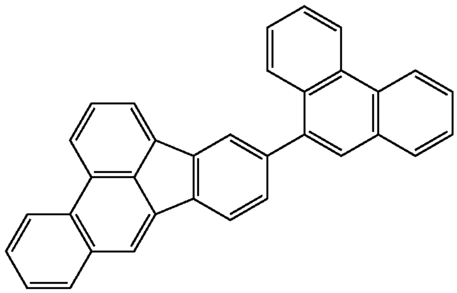
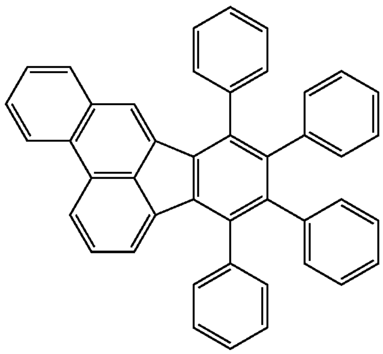
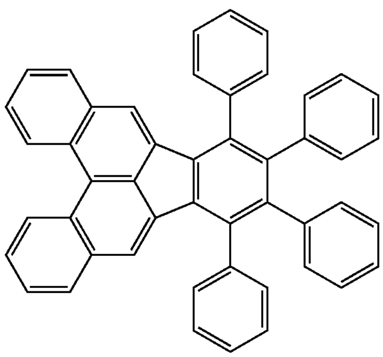
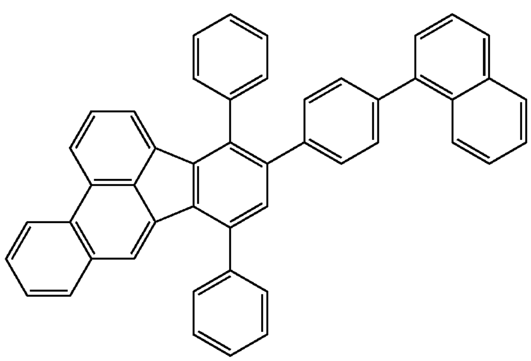
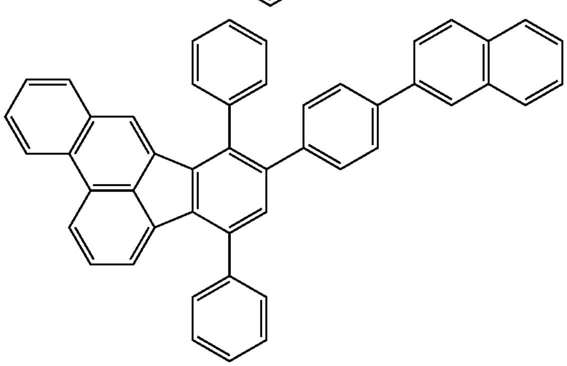
-continued
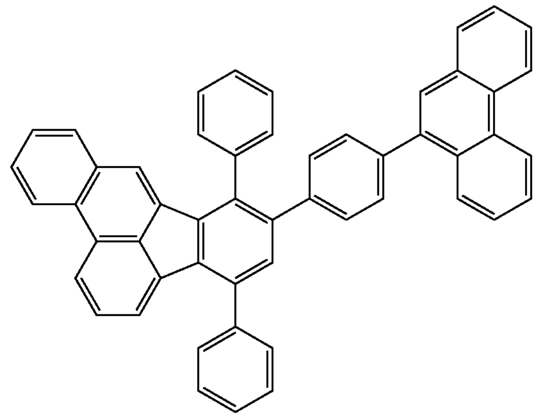
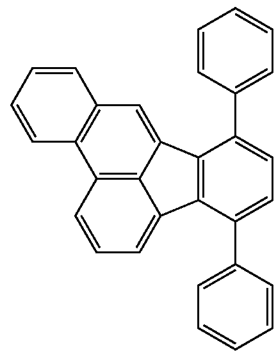
Examples of the benzo[k]fluoranthene derivative represented by the formula (152) are as follows.
[Chemical Formula 61]
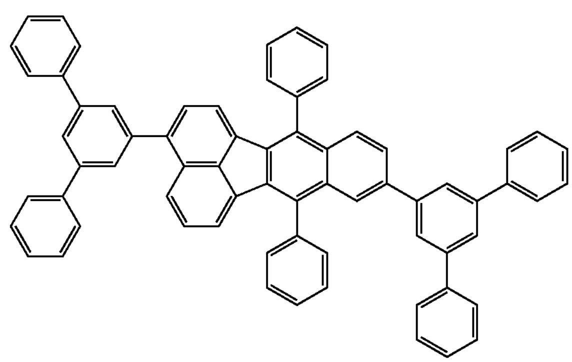
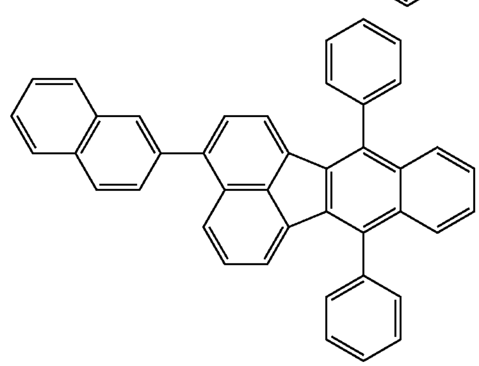

-continued

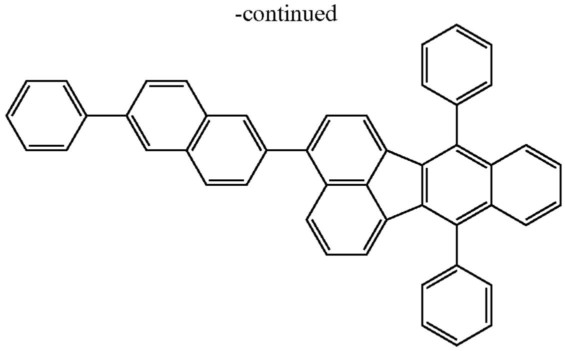

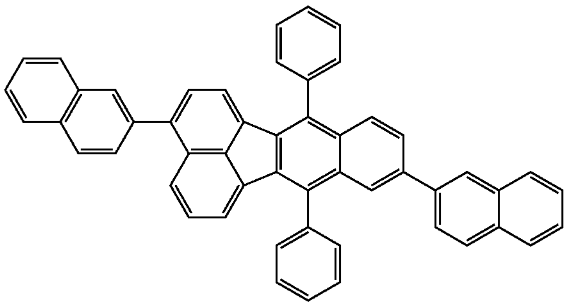

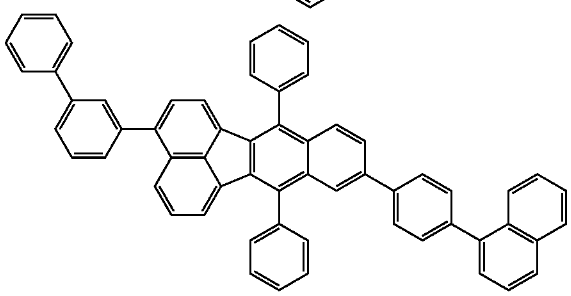

-continued

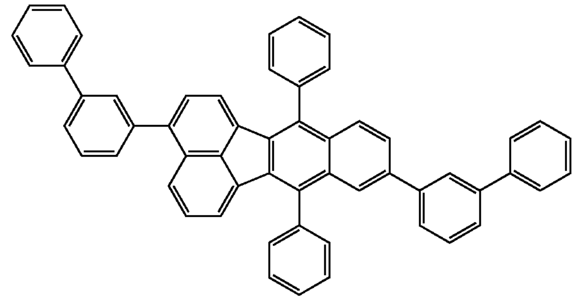 [SMILES: c1ccc(-c2cccc(-c3ccc4c(-c5ccccc5)c5c(c(-c6ccccc6)c4c3)-c3cccc4c(-c6cccc(-c7ccccc7)c6)ccc-5c34)c2)cc1]

Preferably in the aspect of the invention, the polycyclic fused aromatic skeleton is the elementary substance of triphenylene represented by the following formula (16) or its derivative. A part of the carbon atoms in the skeleton may be nitrogen atoms.

[Chemical Formula 62]

(16)

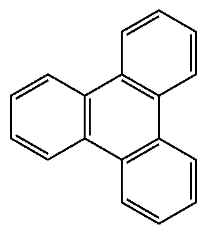

Examples of the triphenylene derivative are those represented by the following formulae.

[Chemical Formula 63]

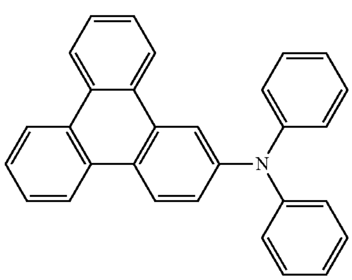

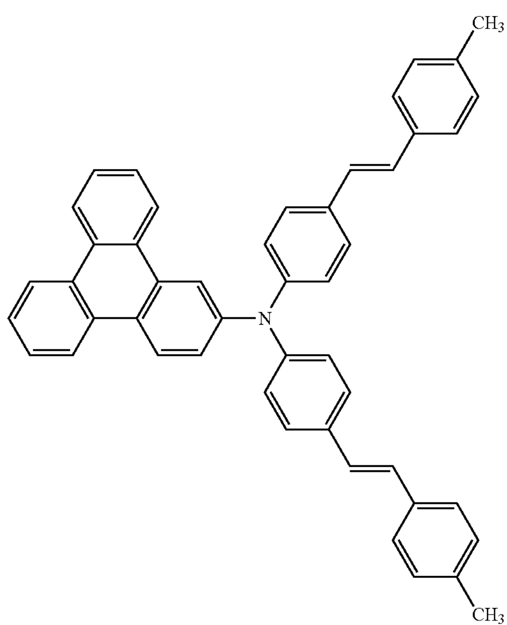

-continued
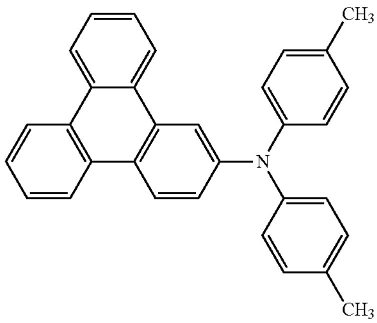
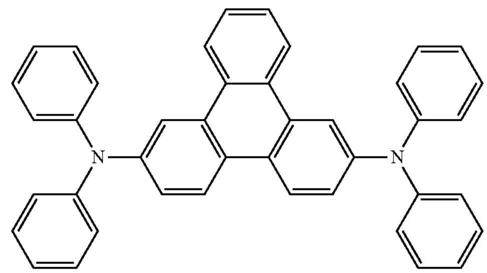
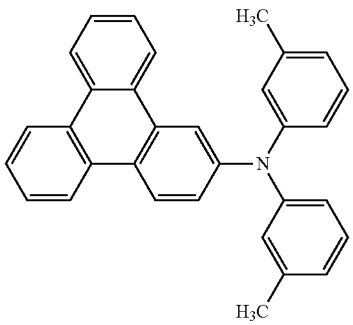
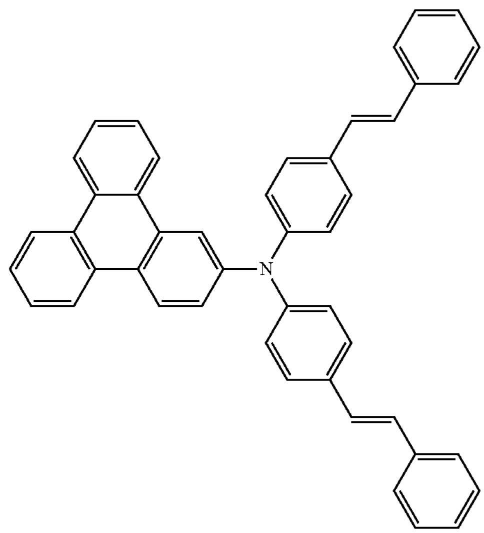
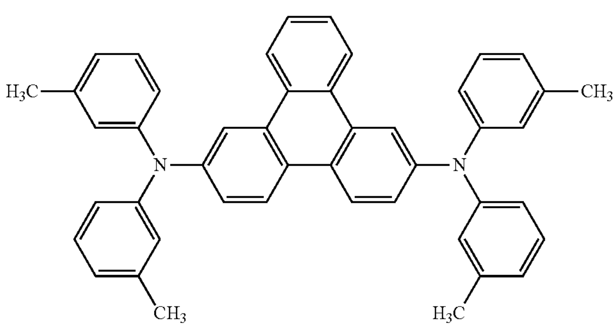
[Chemical Formula 64]
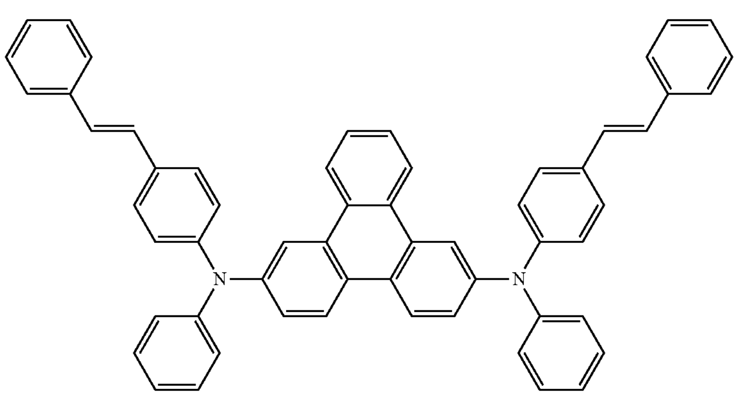

-continued
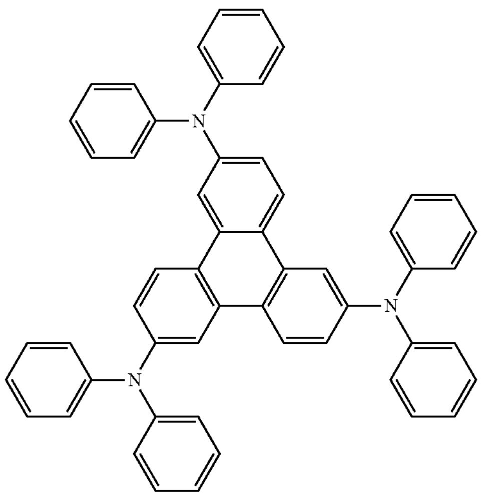
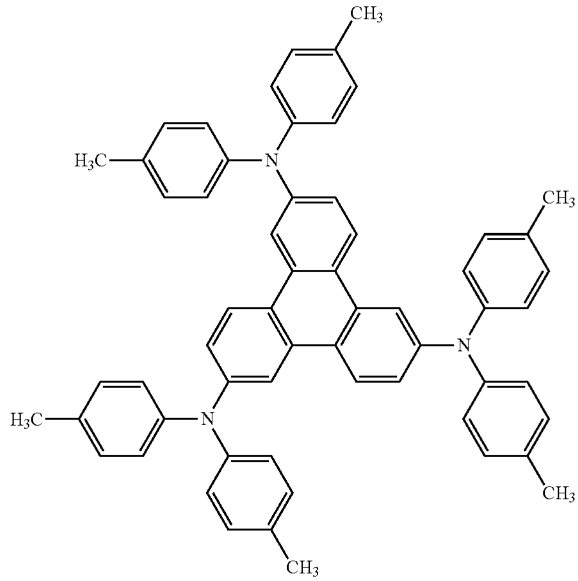
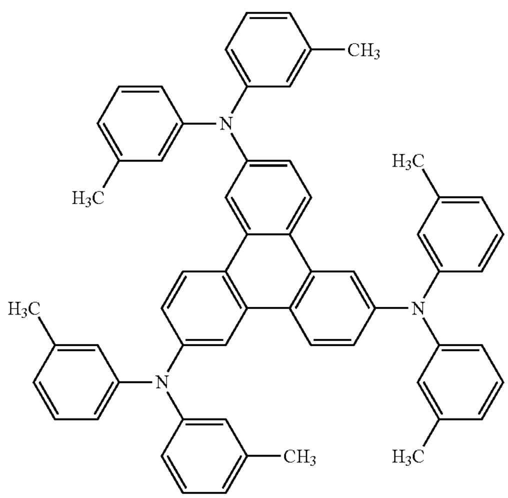
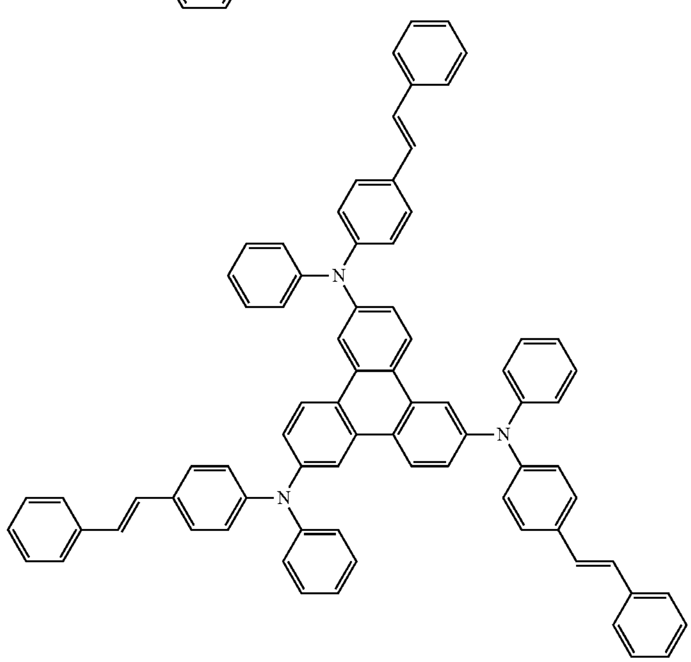

-continued
[Chemical Formula 65]
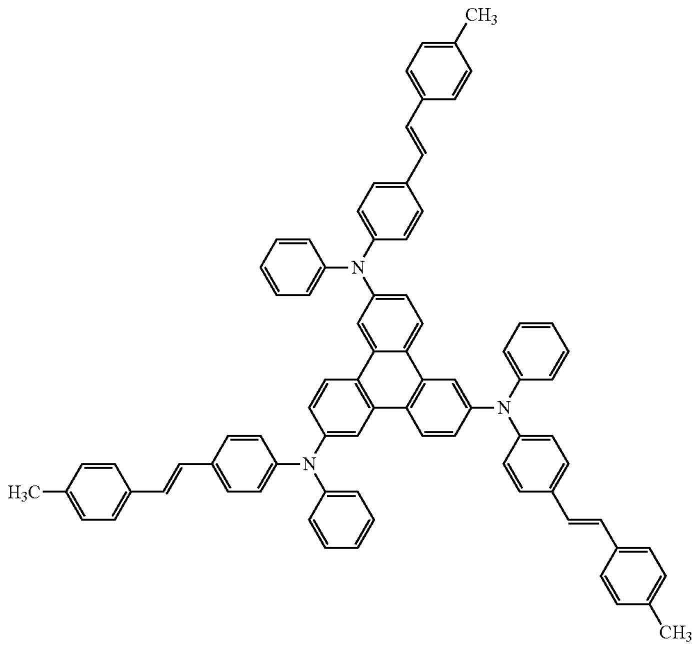
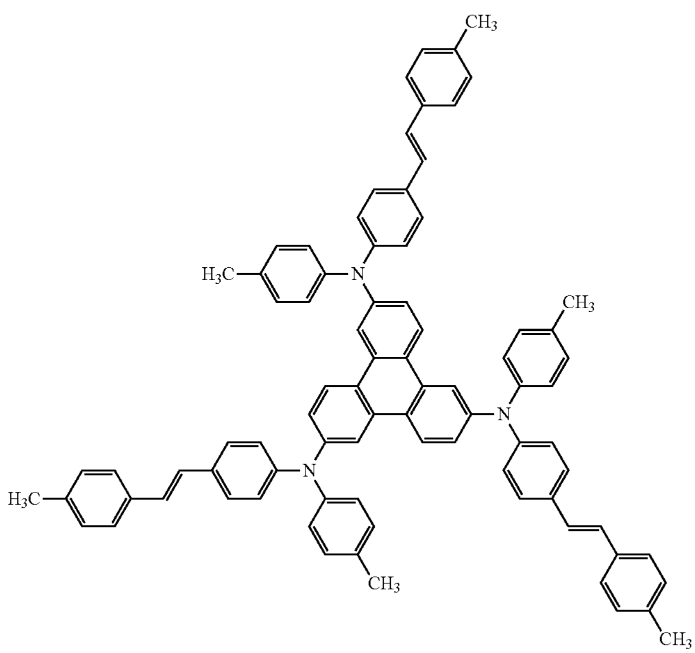
[Chemical Formula 66]
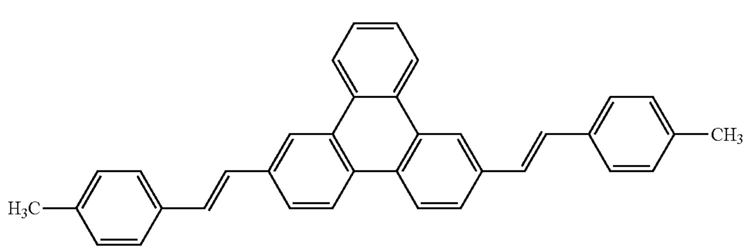

-continued
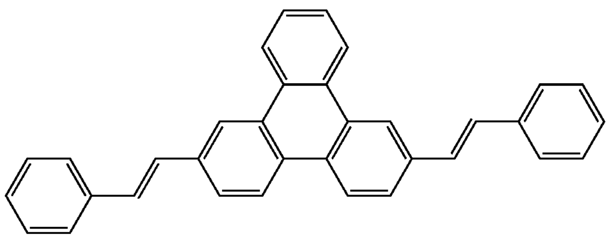
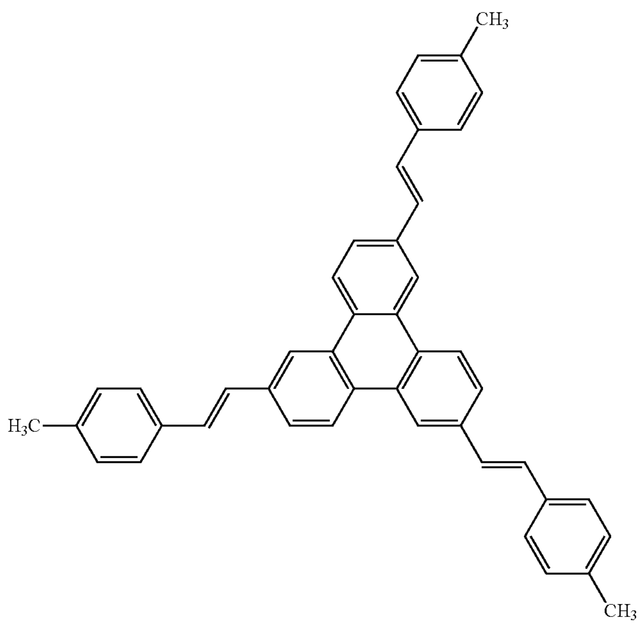
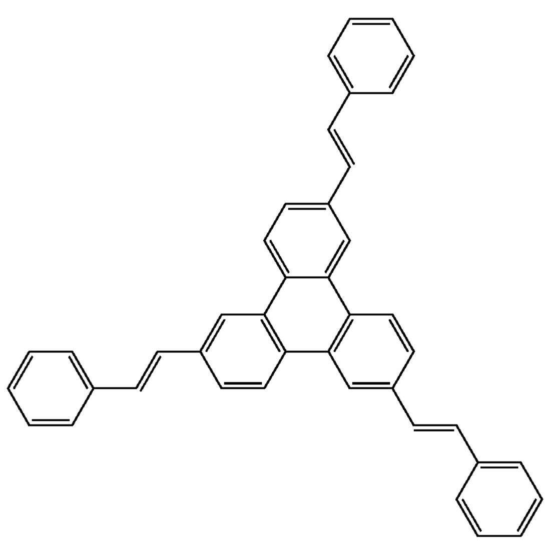

-continued
[Chemical Formula 67]
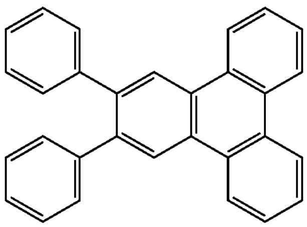
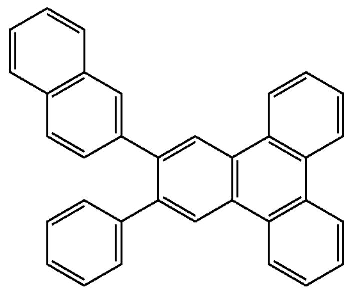
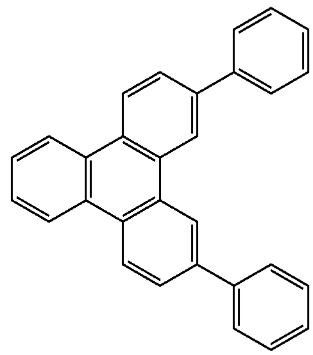
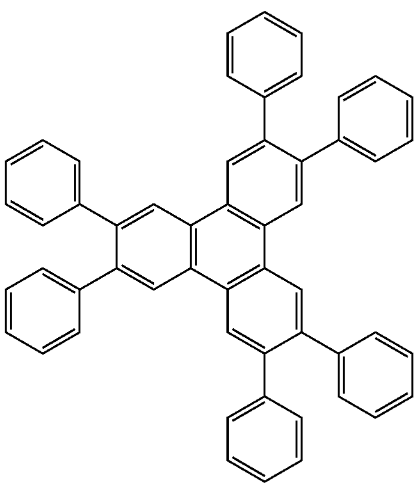
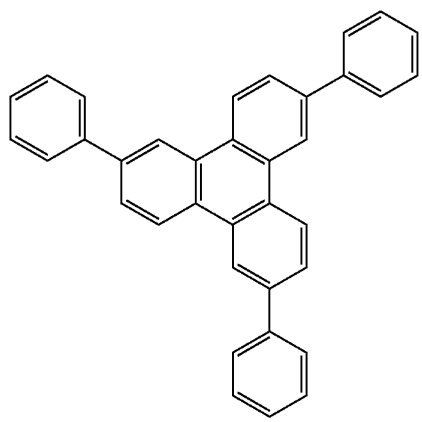
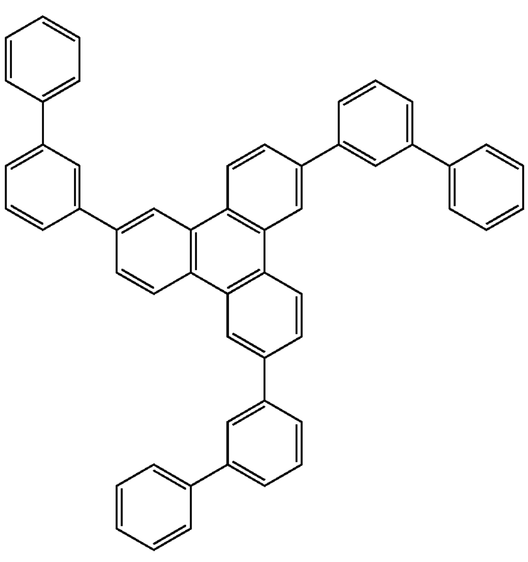
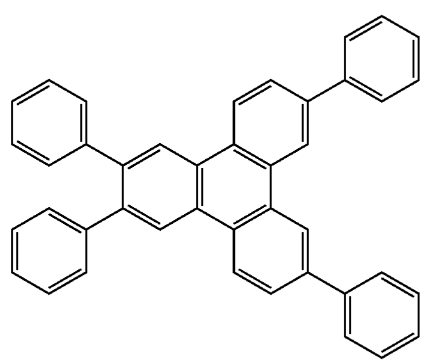

-continued
[Chemical Formula 68]
H-1
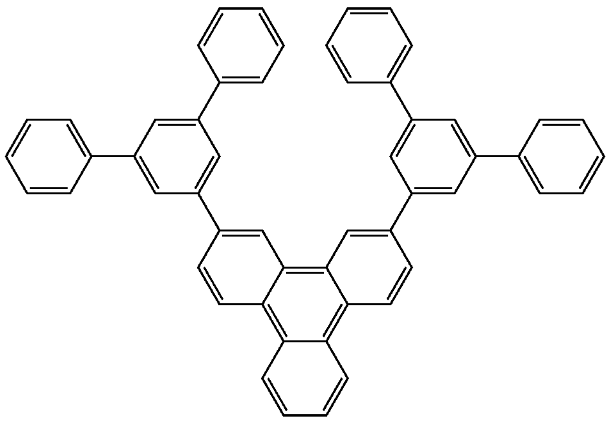
H-2
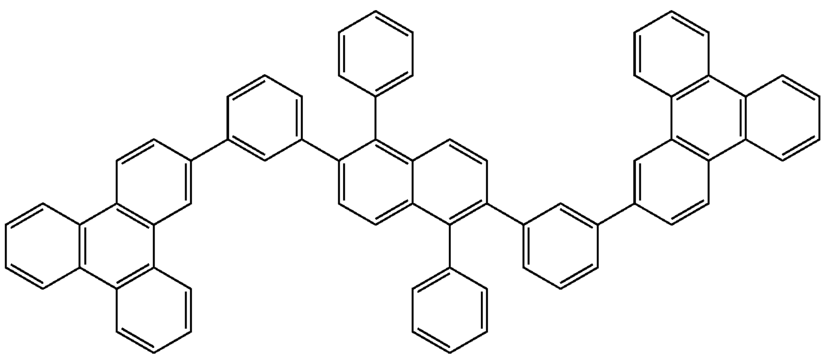
H-3
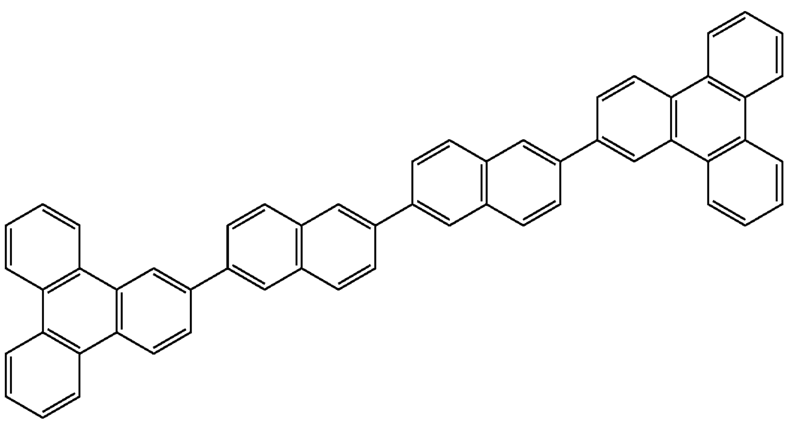
The polycyclic fused aromatic skeleton may contain nitrogen atom, examples of which are shown below.
[Chemical Formula 69]
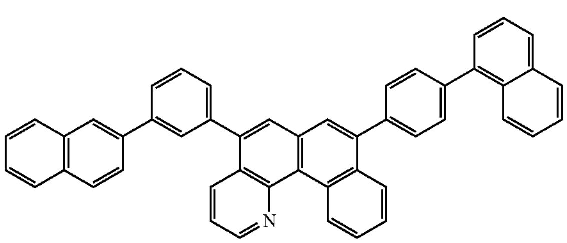
-continued
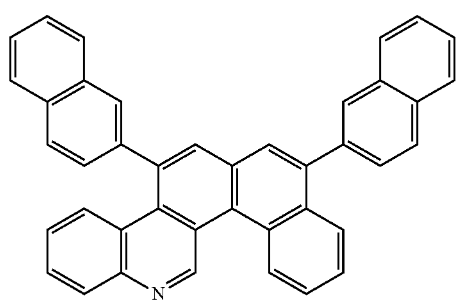

-continued

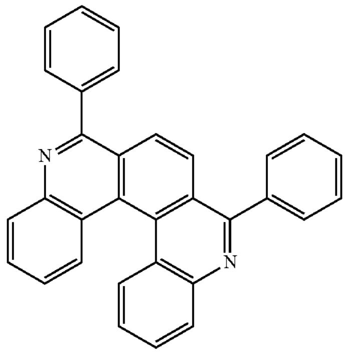

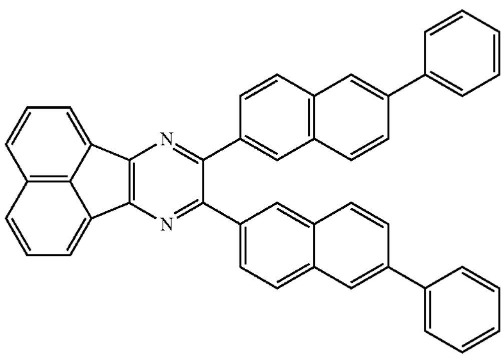

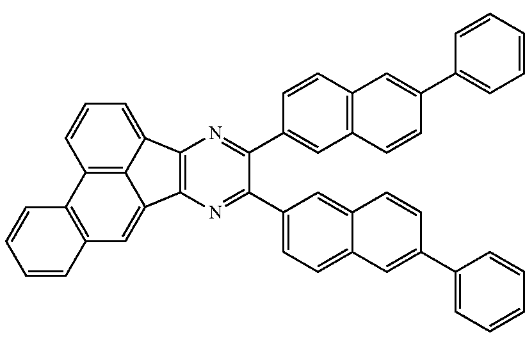

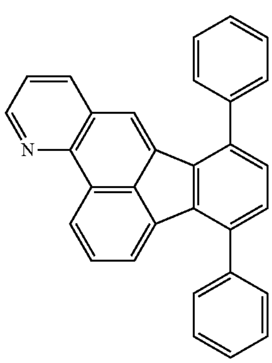

Examples of the compound represented by the formula (4) are compounds represented by the following formulae (41) to (48).

[Chemical Formula 70]

$$Np—(Np)_n—Np \qquad (41)$$

In the formula (41), Np represents substituted or unsubstituted naphthalene, and n represents an integer of 0 to 3.

[Chemical Formula 71]

(42)

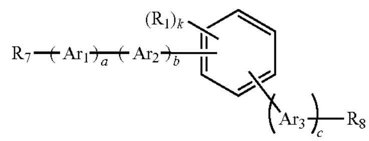

In the formula (42), $Ar_1$ and $Ar_2$ each independently represent substituted or unsubstituted naphthalene or substituted or unsubstituted phenanthrene. $Ar_3$ represents a substituted or unsubstituted aryl group having 6 to 30 ring carbon atoms.

However, at least one of $Ar_1$, $Ar_2$ and $Ar_3$ is naphthalene. $R_1$, $R_7$ and $R_8$ each represent a hydrogen atom or a substituent. a, b and c each represent an integer of 1 to 3.

k represents an integer of 1 to 4. When k is 2 or more, $R_1$ may be mutually the same or different.

[Chemical Formula 72]

(43)

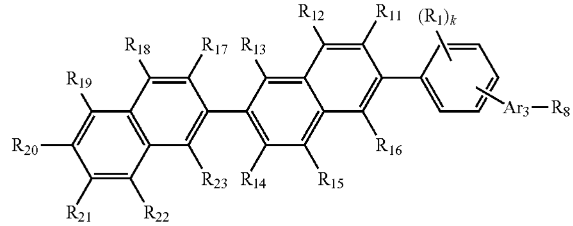

In the formula (43), $Ar_3$ represents an aryl group having 6 to 30 ring carbon atoms, and $R_1$, $R_8$, $R_{11}$ to $R_{23}$ each represent a hydrogen atom or a substituent.

k represents an integer of 1 to 4. When k is 2 or more, $R_1$ may be mutually the same or different.

[Chemical Formula 73]

(44)

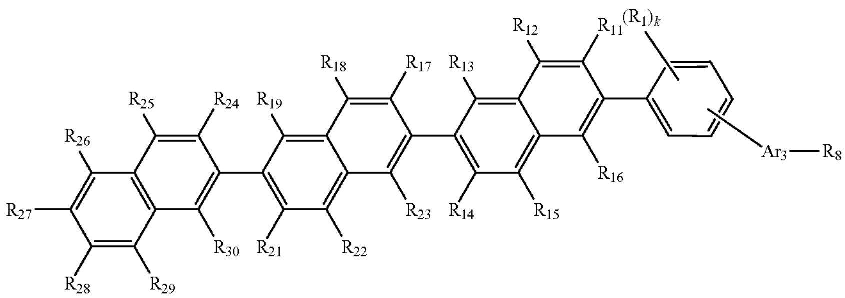

In the formula (44), $Ar_3$ represents an aryl group having 6 to 30 ring carbon atoms, and $R_1$, $R_8$, $R_{11}$ to $R_{19}$ and $R_{21}$ to $R_{30}$ each represent a hydrogen atom or a substituent.

k represents an integer of 1 to 4. When k is 2 or more, $R_1$ may be mutually the same or different.

In the formula (46), $Ar_3$ represents an aryl group having 6 to 30 ring carbon atoms, and $R_1$, $R_8$, $R_{31}$ to $R_{43}$ each represent a hydrogen atom or a substituent.

k represents an integer of 1 to 4. When k is 2 or more, $R_1$ may be mutually the same or different.

[Chemical Formula 74]

(45)

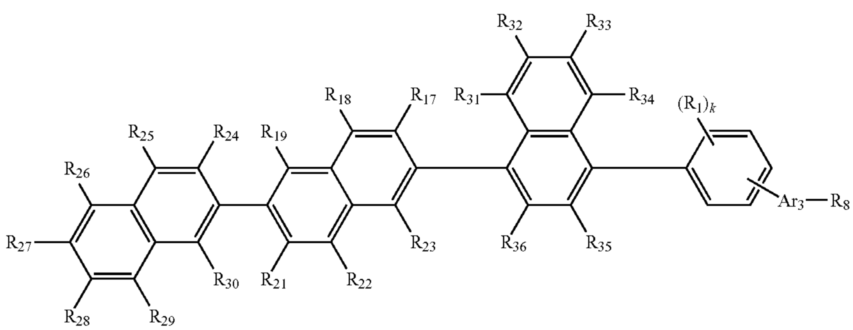

In the formula (45), $Ar_3$ represents an aryl group having 6 to 30 ring carbon atoms, and $R_1$, $R_8$, $R_{17}$ to $R_{19}$ and $R_{21}$ to $R_{36}$ each represent a hydrogen atom or a substituent.

k represents an integer of 1 to 4. When k is 2 or more, $R_1$ may be mutually the same or different.

[Chemical Formula 75]

(46)

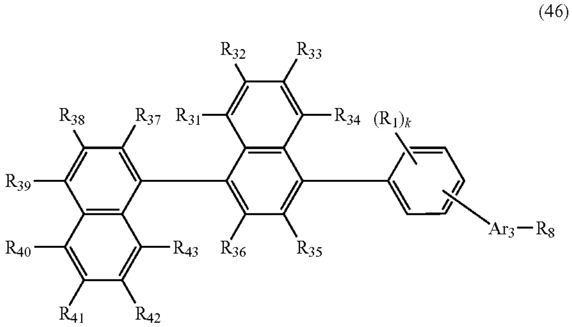

[Chemical Formula 76]

(47)

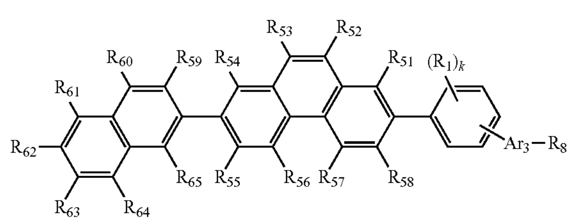

In the formula (47), $Ar_3$ represents an aryl group having 6 to 30 ring carbon atoms, and $R_1$, $R_8$, $R_{51}$ to $R_{65}$ each represent a hydrogen atom or a substituent.

k represents an integer of 1 to 4. When k is 2 or more, $R_1$ may be mutually the same or different.

[Chemical Formula 77]
(48)
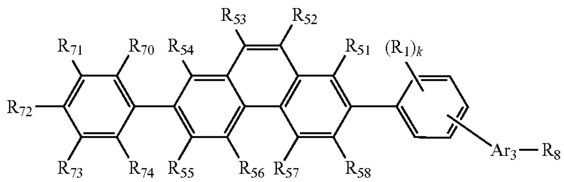
In the formula (48), $Ar_a$ represents an aryl group having 6 to 30 ring carbon atoms, and $R_1$, $R_8$, $R_{51}$ to $R_{58}$ and $R_{70}$ to $R_{74}$ each represent a hydrogen atom or a substituent.
k represents an integer of 1 to 4. When k is 2 or more, $R_1$ may be mutually the same or different.
Examples of the compounds are as follows.
[Chemical Formula 78]
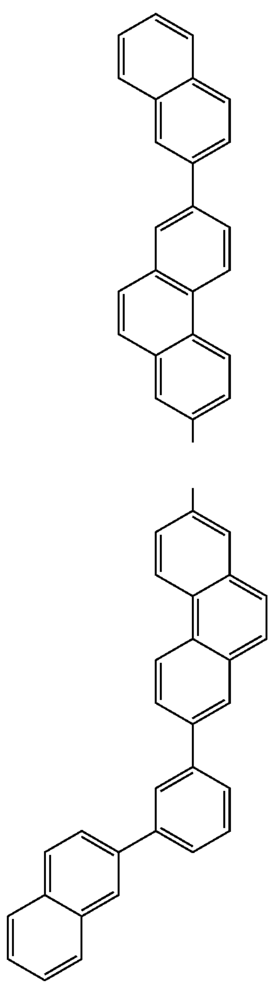
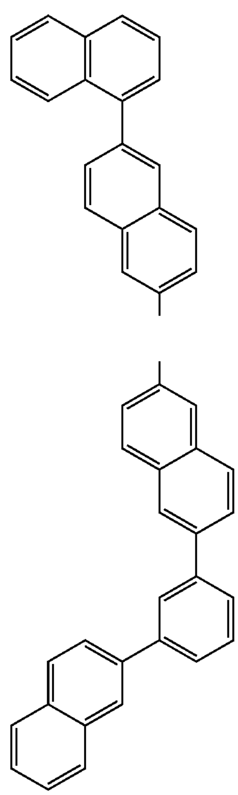
-continued
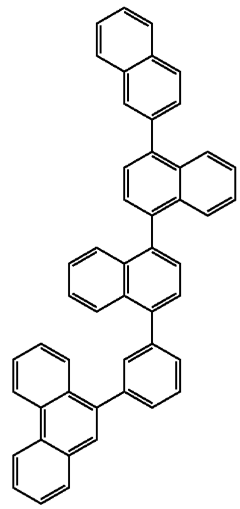
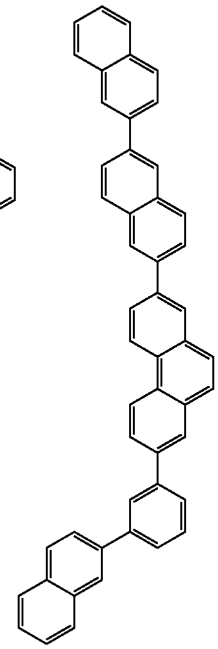
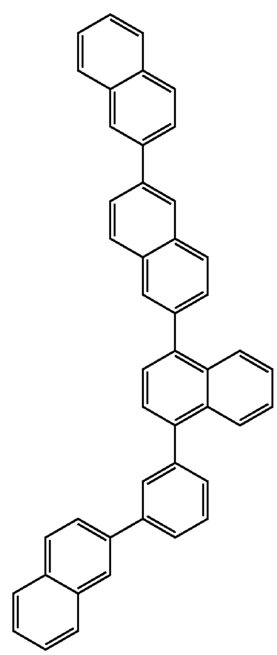

-continued
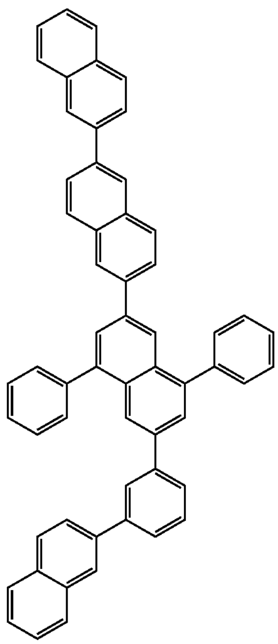
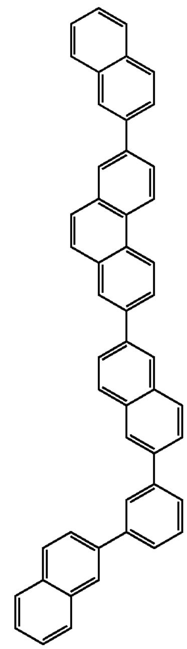
-continued
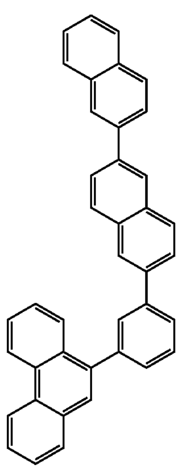
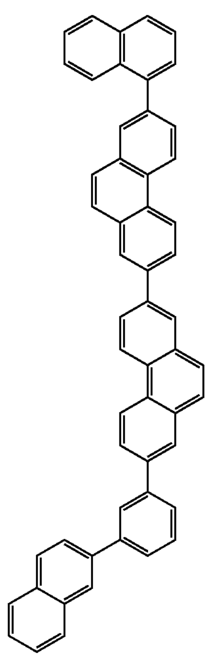
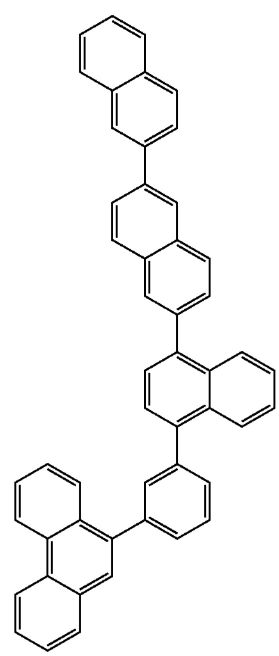

-continued
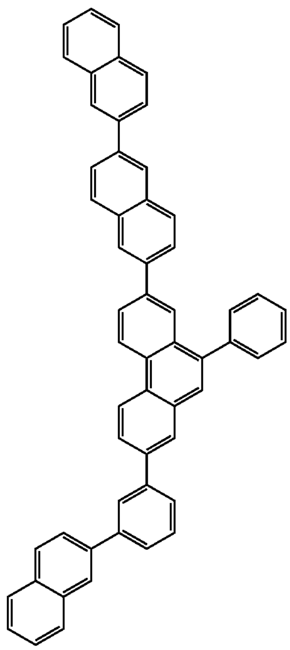
-continued
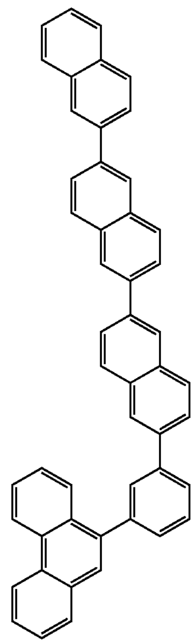
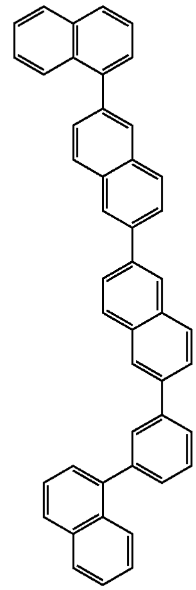
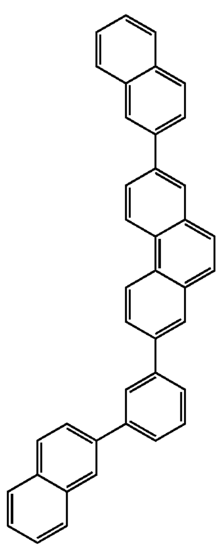
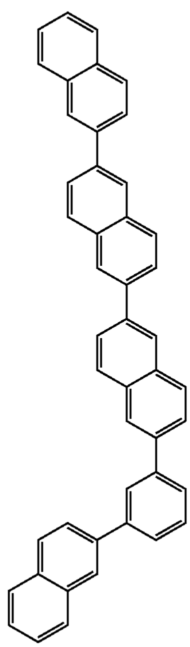
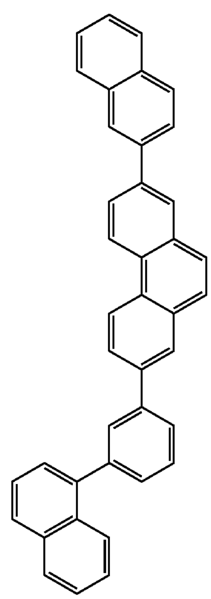
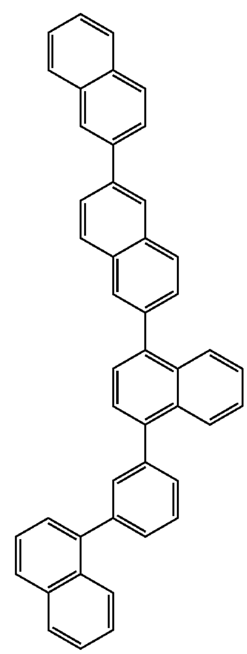

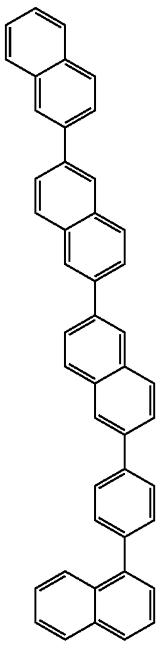
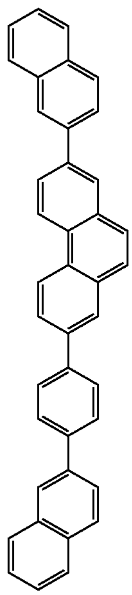
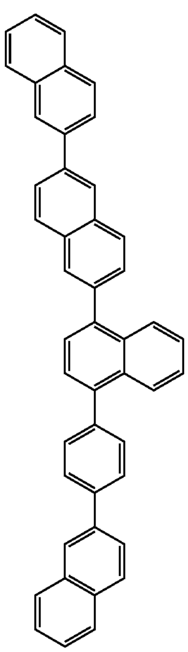
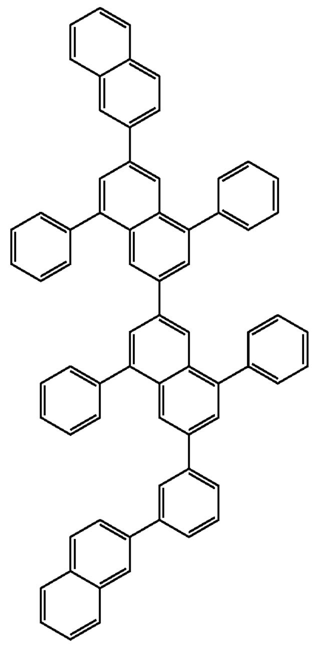
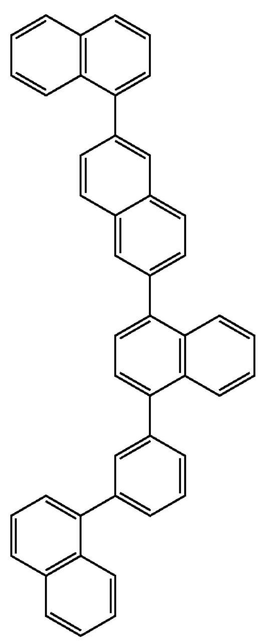
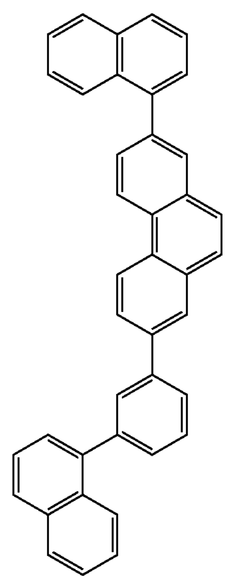

-continued
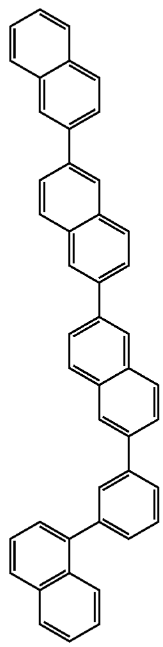
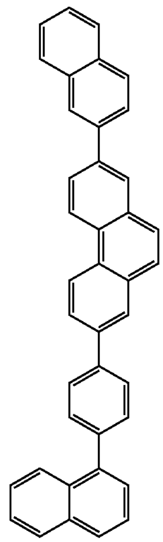
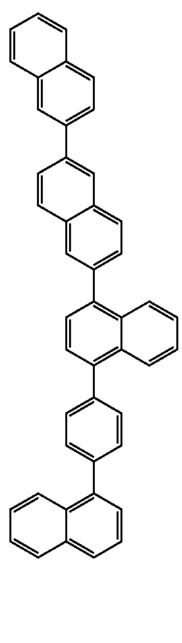
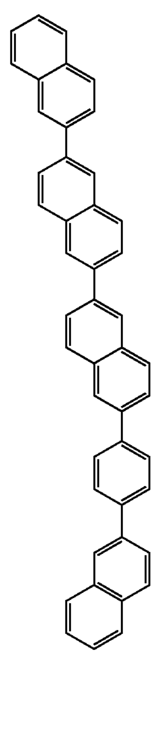
-continued
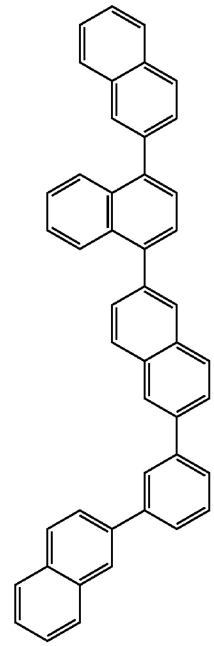
An example of the host material is an oligonaphthalene derivative represented by the following formula (49).
[Chemical Formula 79]
$$Ar^1 \leftarrow Ar^2 \rightarrow_n Ar^3 \quad (49)$$
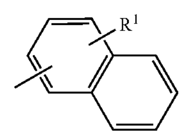
(50)
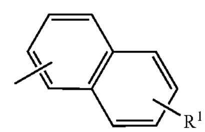
(51)
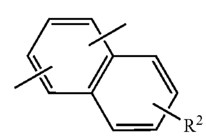
(52)
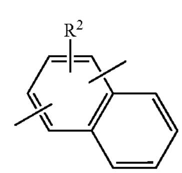
(53)
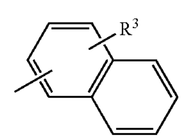
(54)

-continued (55)

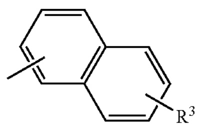

In the formula: n is 1 or 2; $Ar^1$ is a substituent represented by the general formula (50) or (51); $Ar^2$ is a substituent represented by the general formula (52) or (53); $Ar^3$ is a substituent represented by the general formula (54) or (55); $R^1$ to $R^3$ each independently represent a hydrogen atom, linear or branched alkyl group having 6 or less carbon atoms, alicyclic alkyl group, substituted or unsubstituted aromatic ring, substituted or unsubstituted heteroaromatic ring, alkoxy group, amino group, cyano group, silyl group, ester group, carbonyl group or halogen.

The oligonaphthalene derivative may have the structure represented by the general formula (56).

[Chemical Formula 80]

$$Ar^1 - (Ar^2)_n - Ar^3 \quad (56)$$

(57)

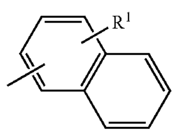

(58)

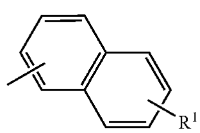

(59)

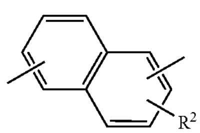

(60)

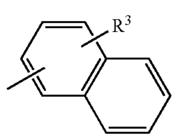

(61)

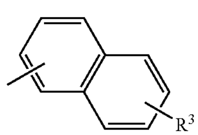

In the formula: n is 1 or 2; $Ar^1$ is a substituent represented by the general formula (57) or (58); $Ar^2$ is a substituent represented by the general formula (59); $Ar^3$ is a substituent represented by the general formula (60) or (61); and $R^1$ to $R^3$ each independently represent a hydrogen atom, linear or branched alkyl group having 6 or less carbon atoms, alicyclic alkyl group, substituted or unsubstituted aromatic ring, substituted or unsubstituted heteroaromatic ring, alkoxy group, amino group, cyano group, silyl group, ester group, carbonyl group or halogen.

More specifically, the oligonaphthalene derivative exemplarily have the structure represented by the general formula (62).

[Chemical Formula 81]

(62)

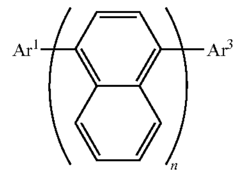

(63)

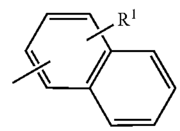

(64)

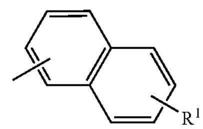

(65)

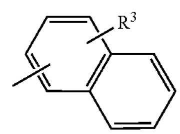

(66)

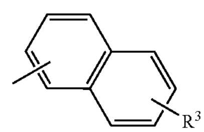

In the formula: n is 1 or 2; $Ar^1$ is a substituent represented by the general formula (63) or (64); $Ar^3$ is a substituent represented by the general formula (65) or (66); and $R^1$ and $R^3$ each independently represent a hydrogen atom, linear or branched alkyl group having 6 or less carbon atoms, alicyclic alkyl group, substituted or unsubstituted aromatic ring, substituted or unsubstituted heteroaromatic ring, alkoxy group, amino group, cyano group, silyl group, ester group, carbonyl group or halogen.

The oligonaphthalene derivative may have the structure represented by the general formula (67).

[Chemical Formula 82]

(67)

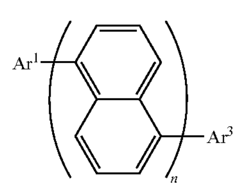

(68)

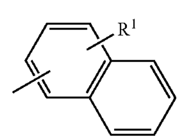

(69)

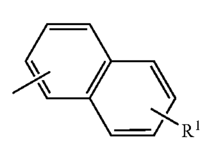

-continued (70)

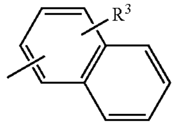

(71)

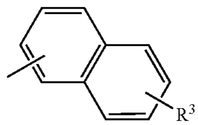

In the formula: n is 1 or 2; $Ar^1$ is a substituent represented by the general formula (68) or (69); $Ar^3$ is a substituent represented by the general formula (70) or (71); and $R^1$ and $R^3$ each independently represent a hydrogen atom, linear or branched alkyl group having 6 or less carbon atoms, alicyclic alkyl group, substituted or unsubstituted aromatic ring, substituted or unsubstituted heteroaromatic ring, alkoxy group, amino group, cyano group, silyl group, ester group, carbonyl group or halogen.

Particularly, the structure represented by the general formula (72) is preferable.

[Chemical Formula 83]

(72)

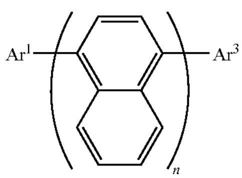

(73)

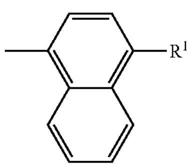

(74)

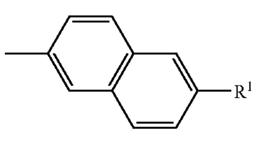

(75)

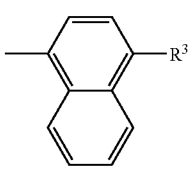

(76)

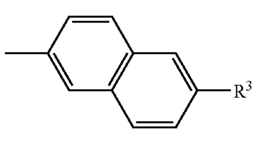

In the formula: n is 1 or 2; $Ar^1$ is a substituent represented by the general formula (73) or (74); $Ar^3$ is a substituent represented by the general formula (75) or (76); and $R^1$ and $R^3$ each independently represent a hydrogen atom, linear or branched alkyl group having 6 or less carbon atoms, alicyclic alkyl group, substituted or unsubstituted aromatic ring, substituted or unsubstituted heteroaromatic ring, alkoxy group, amino group, cyano group, silyl group, ester group, carbonyl group or halogen.

Further, the structure represented by the general formula (77) is preferable.

[Chemical Formula 84]

(77)

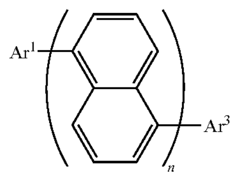

(78)

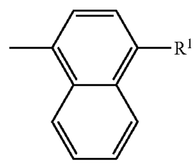

(79)

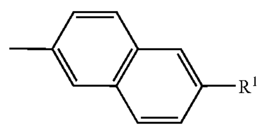

(80)

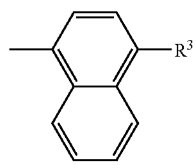

(81)

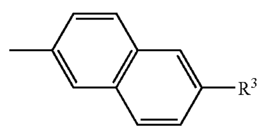

In the formula: n is 1 or 2; $Ar^1$ is a substituent represented by the general formula (78) or (79); $Ar^3$ is a substituent represented by the general formula (80) or (81); and $R^1$ and $R^3$ each independently represent a hydrogen atom, linear or branched alkyl group having 6 or less carbon atoms, alicyclic alkyl group, substituted or unsubstituted aromatic ring, substituted or unsubstituted heteroaromatic ring, alkoxy group, amino group, cyano group, silyl group, ester group, carbonyl group or halogen.

Examples of the alkyl group having 6 or less carbon atoms are a methyl group, ethyl group, n-propyl group, i-propyl group, n-butyl group, i-butyl group, sec-butyl group, t-butyl group, n-pentyl group, i-pentyl group and n-hexyl group.

Examples of the alicyclic alkyl group are a cyclopropyl group, cyclobutyl group, cyclopentyl group and cyclohexyl group.

Examples of the substituted or unsubstituted aromatic ring are a phenyl group, naphthyl group, anthranyl group, pyrenyl group and spirofluorenyl group.

Examples of the substituted or unsubstituted heteroaromatic ring are a pyridyl group, indolyl group, carbazolyl group, thienyl group and furyl group.

Examples of the oligonaphthalene derivative represented by the general formula (49) are oligonaphthalene derivatives represented by the following structural formulae. However, the invention is not limited to these compounds.

-continued
[Chemical Formula 85]
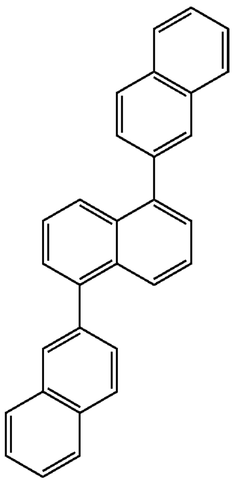
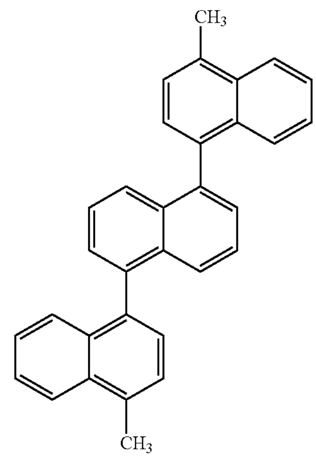
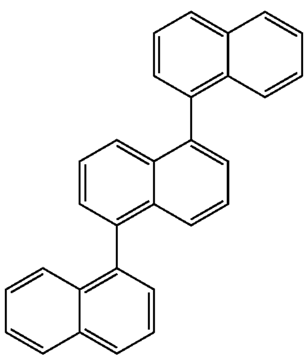
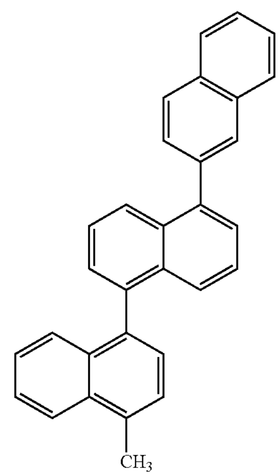
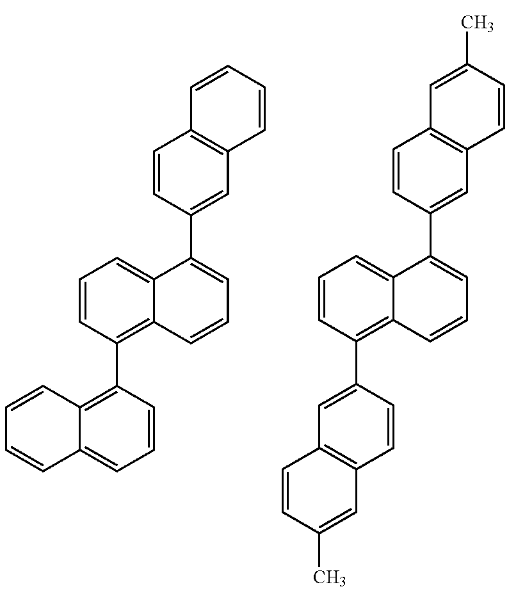
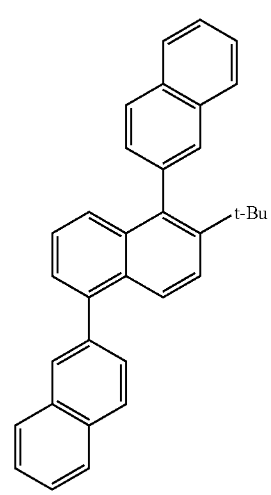

-continued
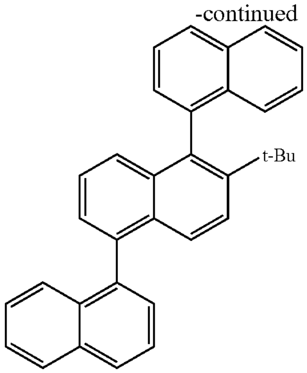
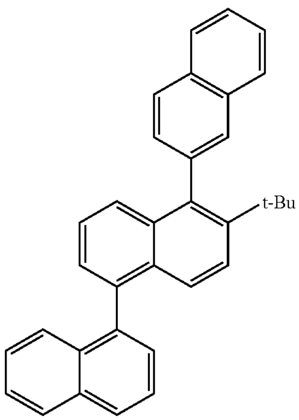
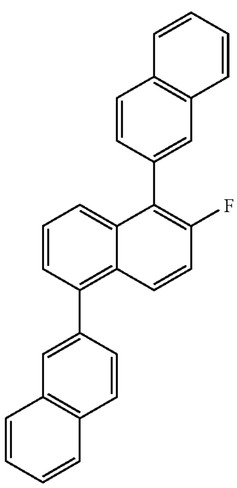
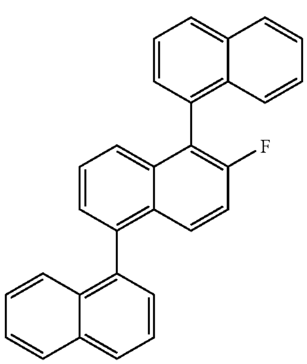
-continued
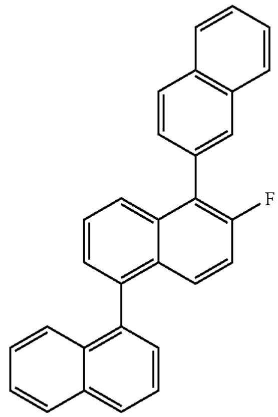
[Chemical Formula 86]
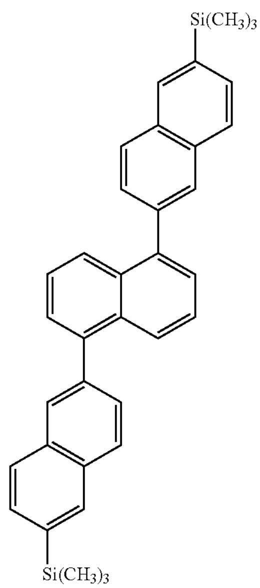
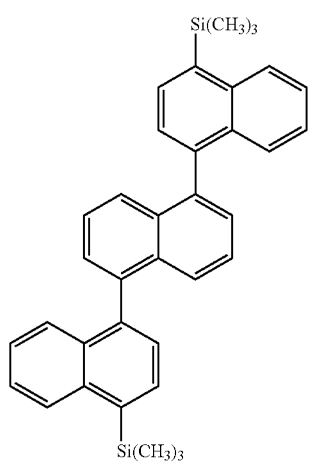

-continued
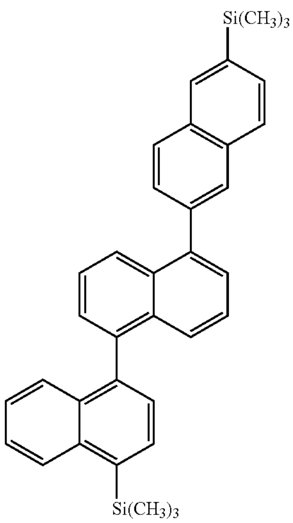
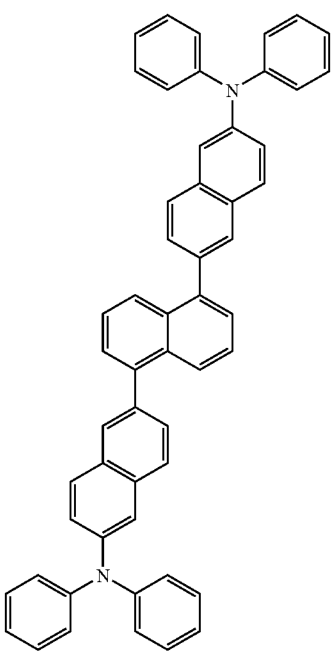
-continued
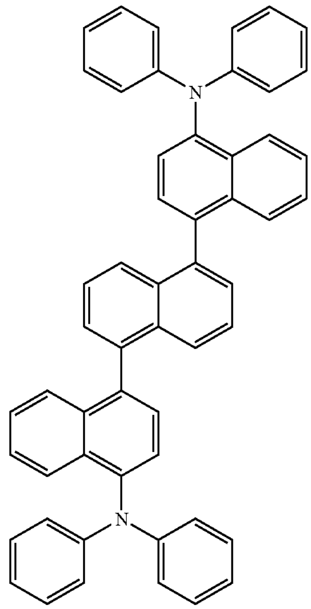
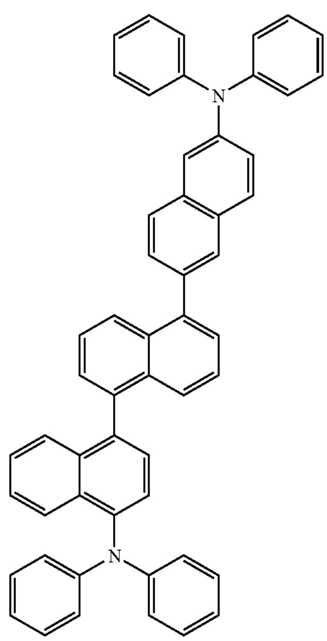

-continued
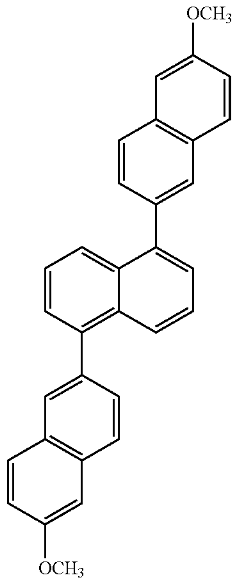
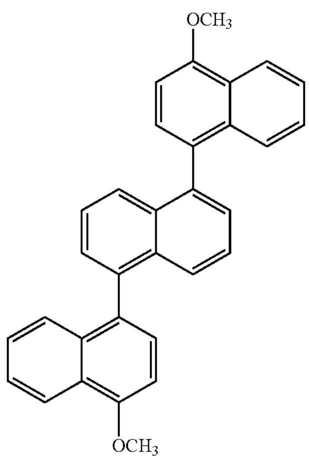
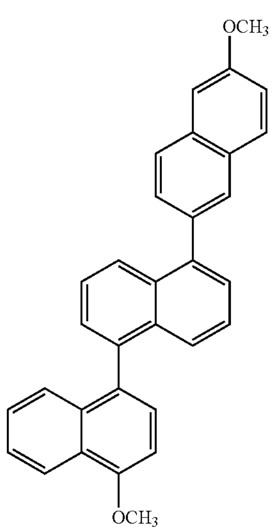
-continued
[Chemical Formula 87]
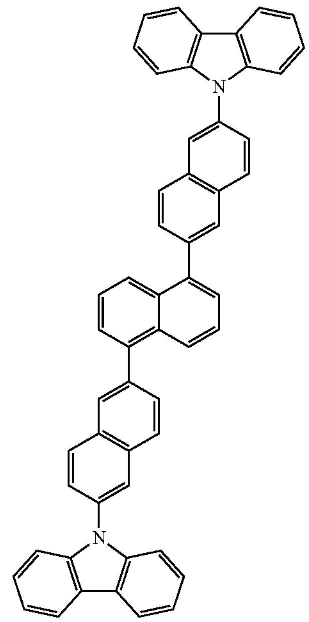
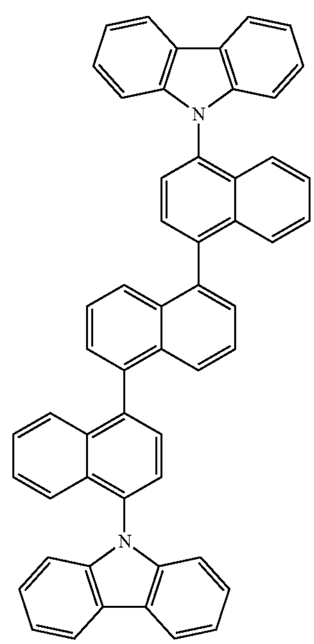

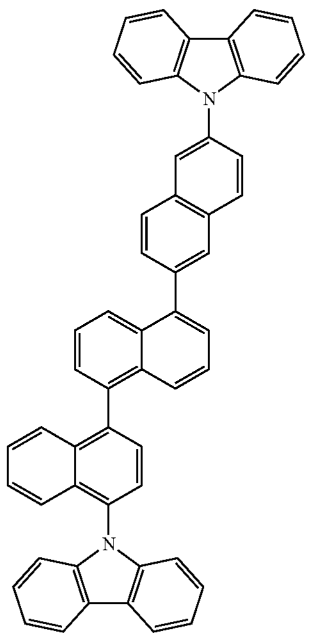
N
N
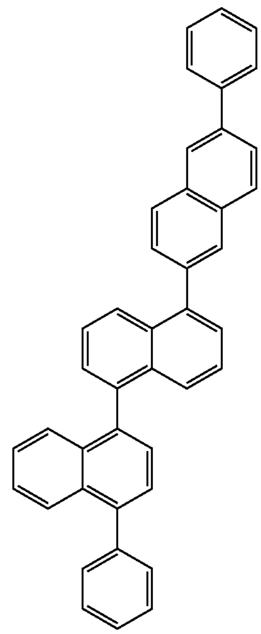
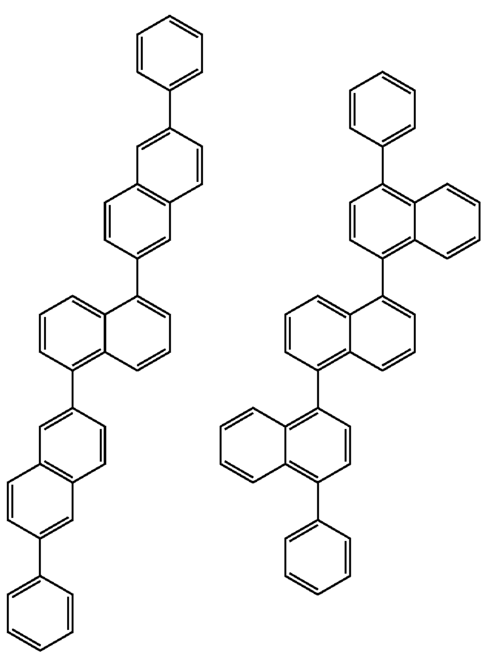
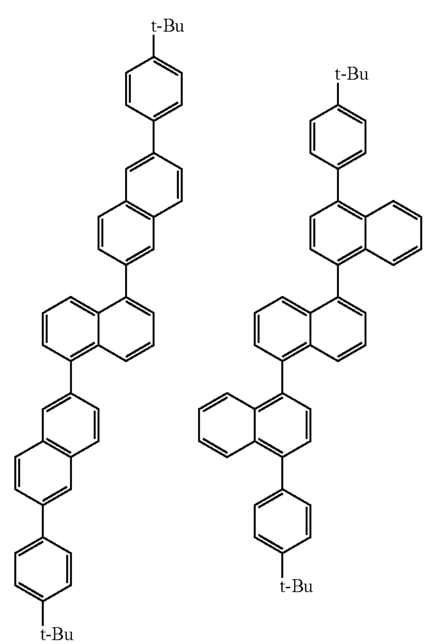
t-Bu
t-Bu
t-Bu
t-Bu

-continued
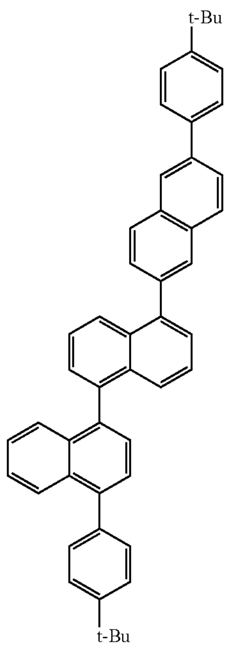
[Chemical Formula 88]
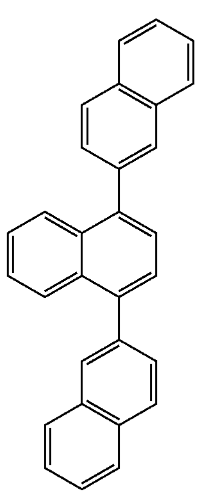
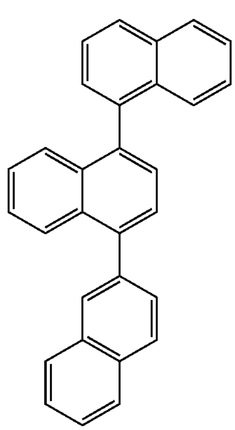
-continued
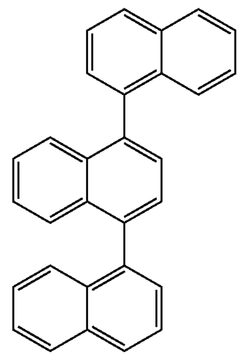
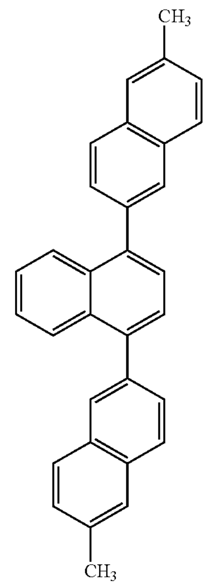
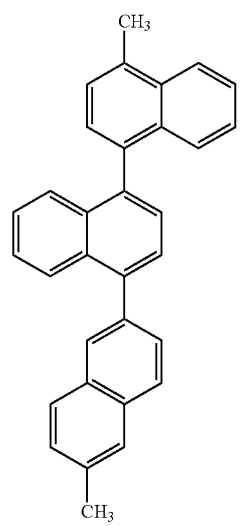
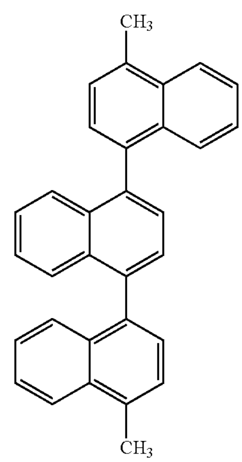
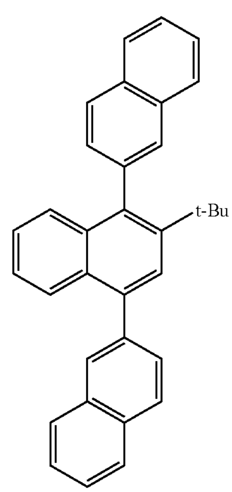
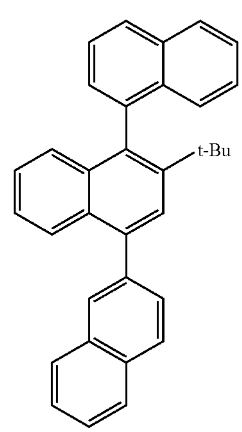

-continued
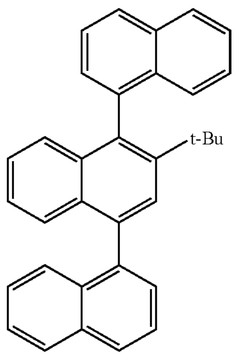
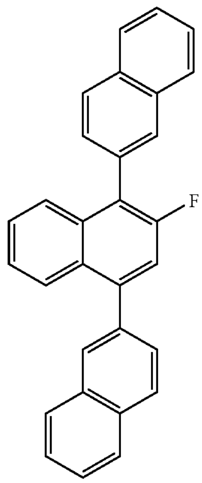
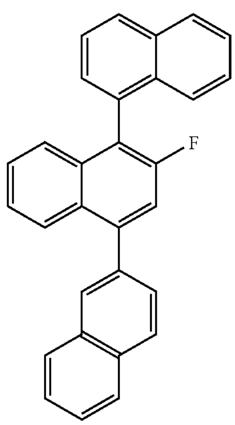
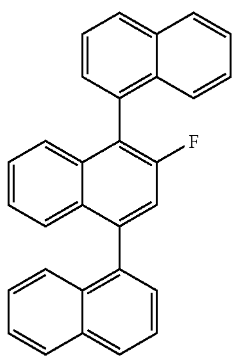
[Chemical Formula 89]
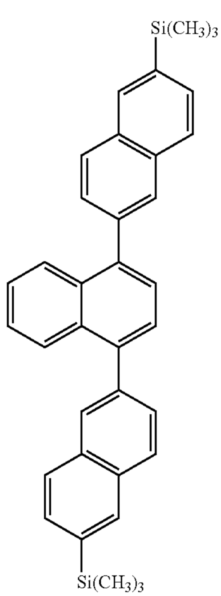
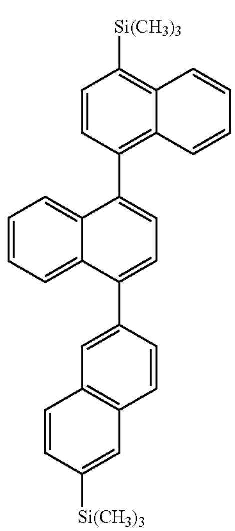
-continued
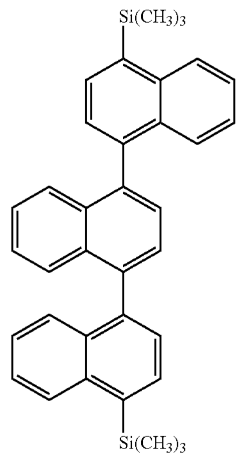
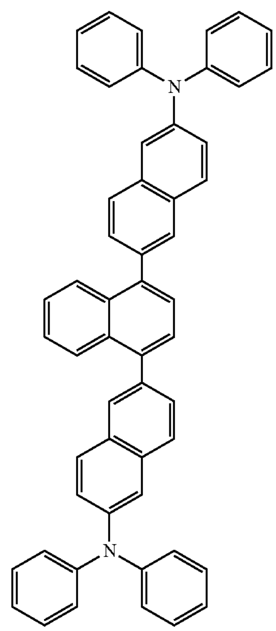
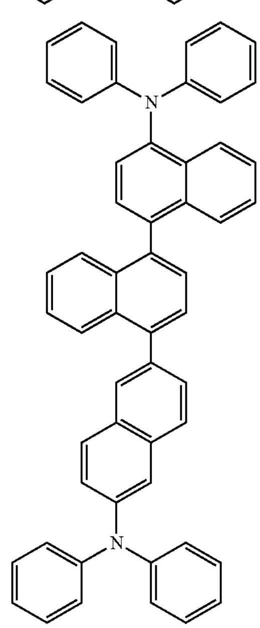

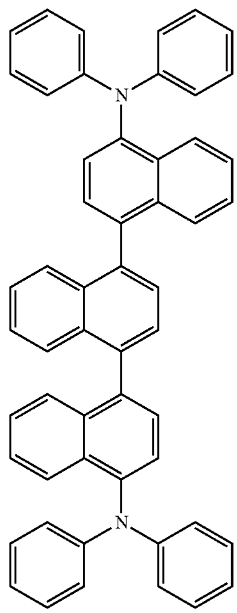
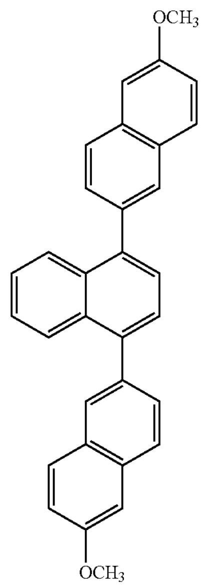
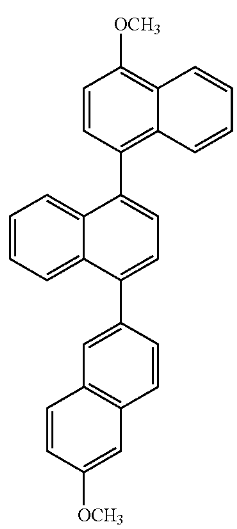
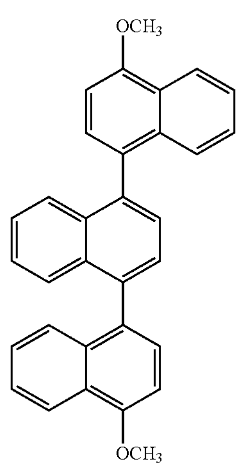
[Chemical Formula 90]
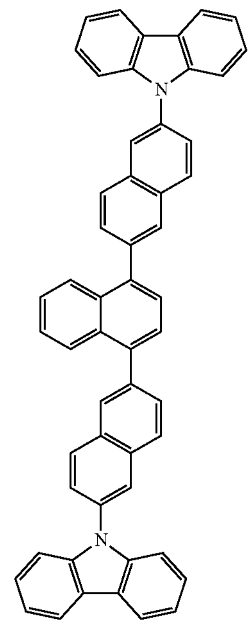
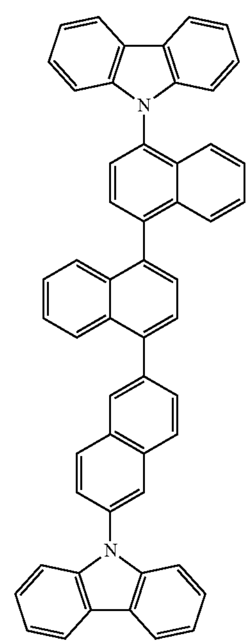

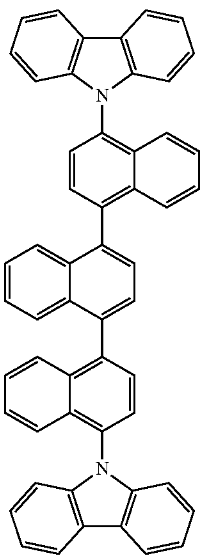
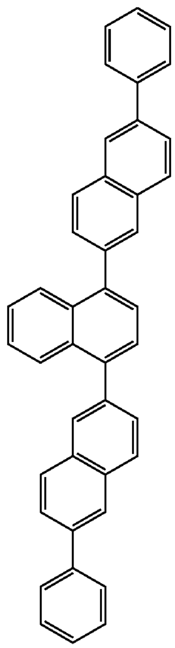
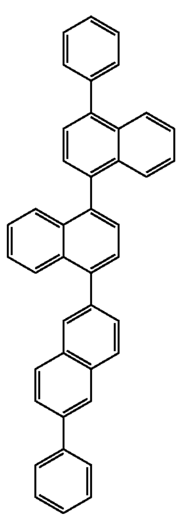
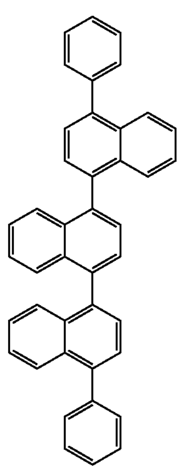
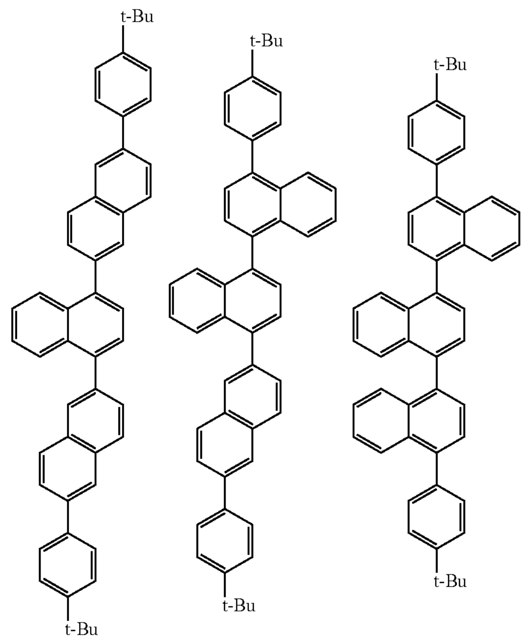
[Chemical Formula 91]
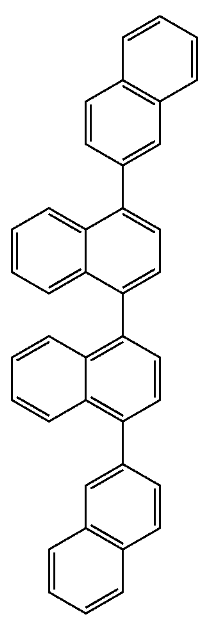
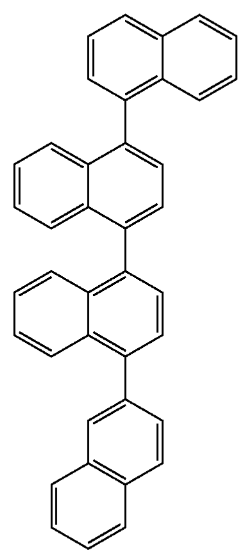

-continued
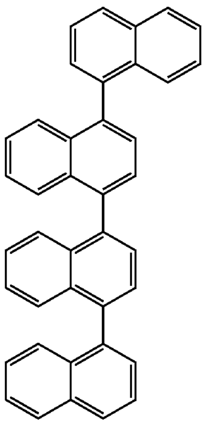
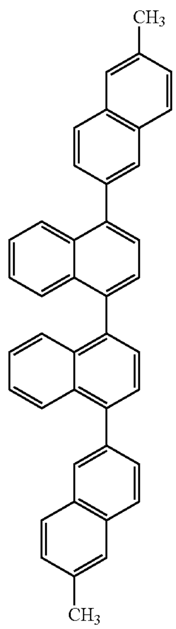
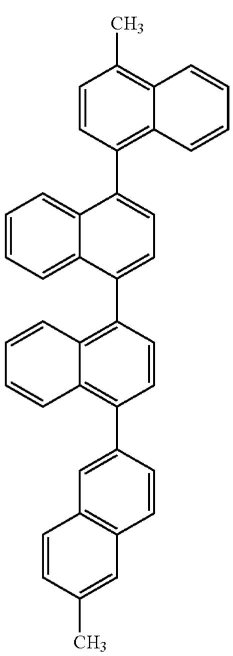
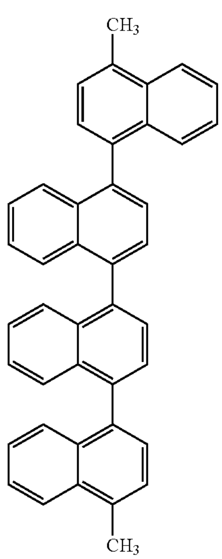
-continued
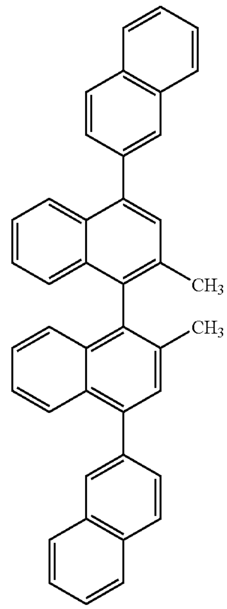
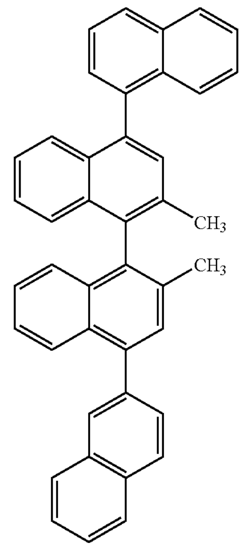
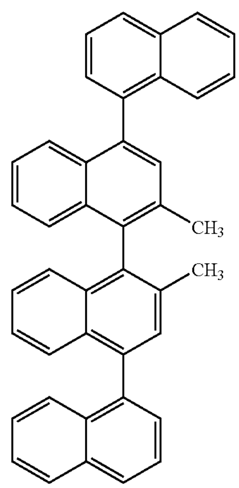
[Chemical Formula 92]
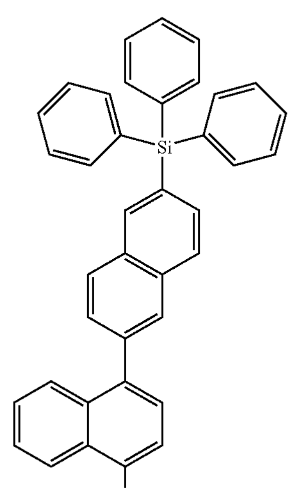

-continued
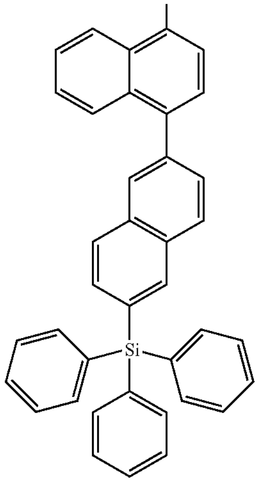
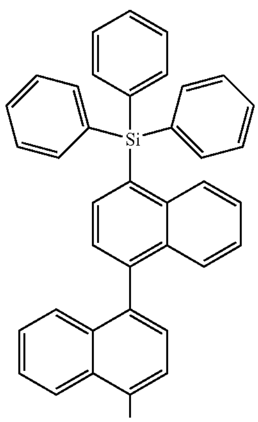
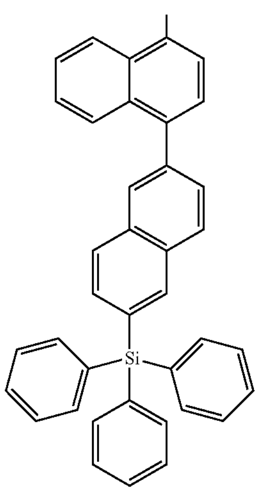
-continued
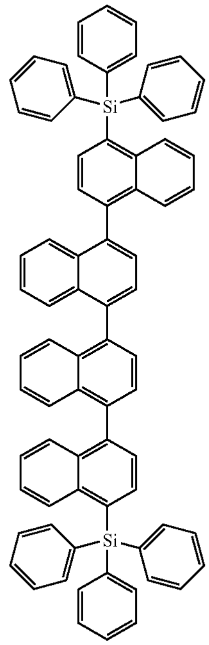
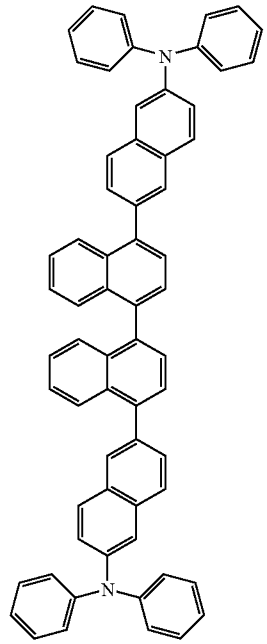
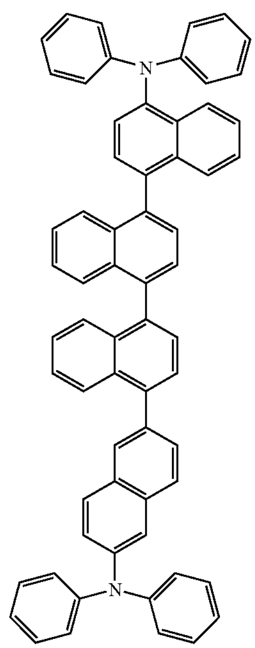
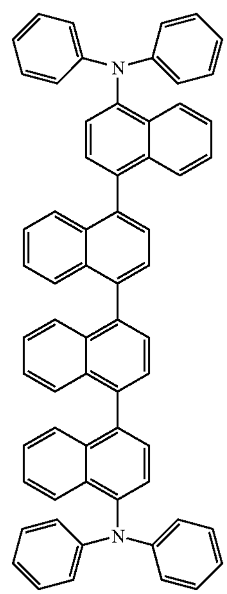

-continued
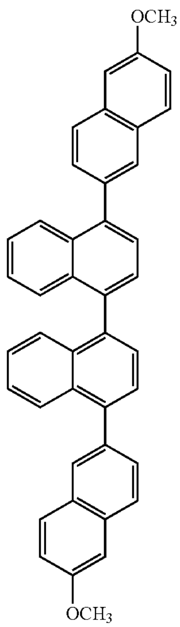
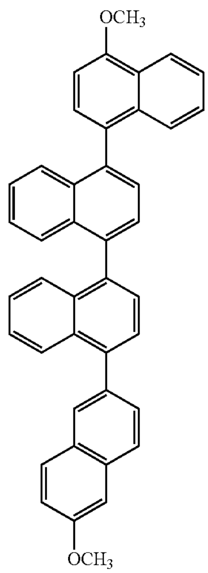
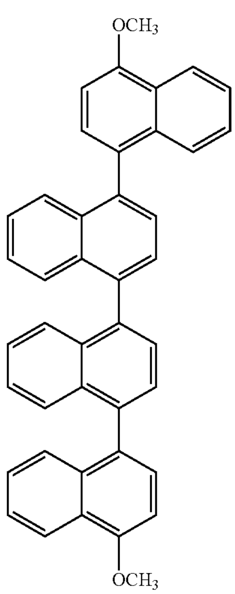
-continued
[Chemical Formula 93]
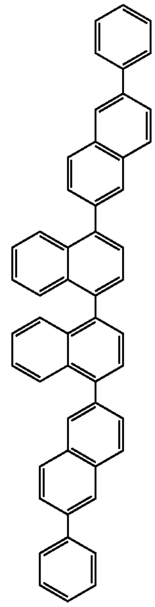
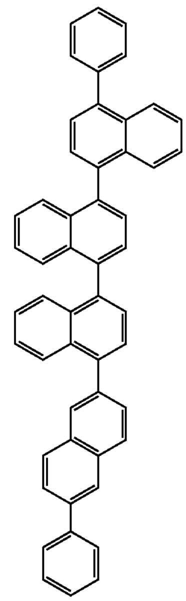
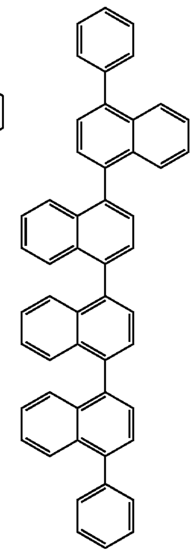
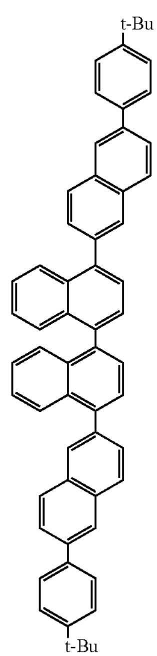
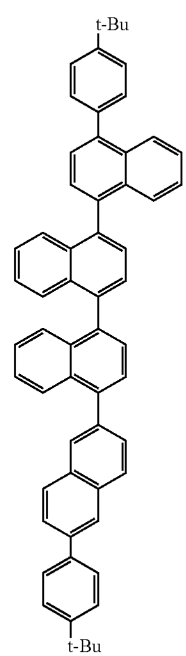
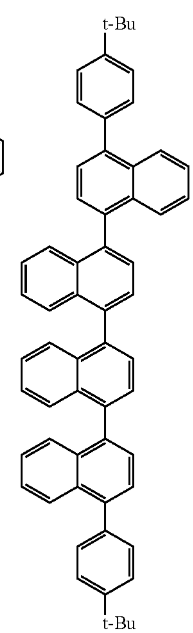

-continued
[Chemical Formula 94]
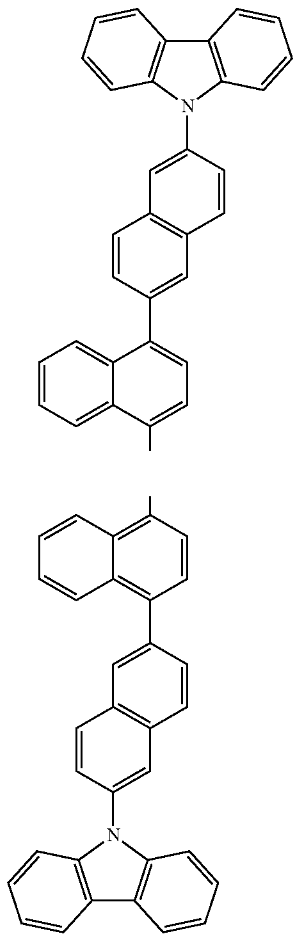
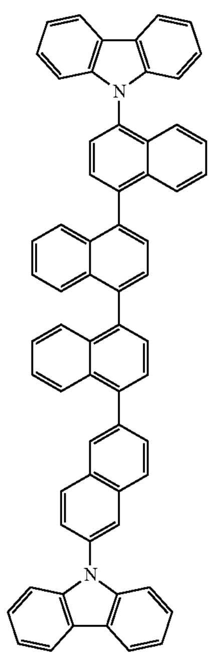
-continued
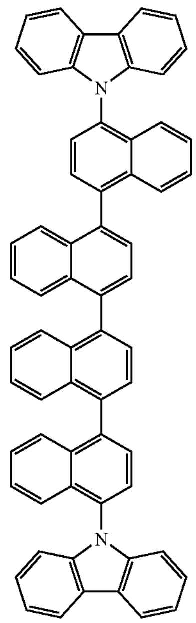
[Chemical Formula 95]
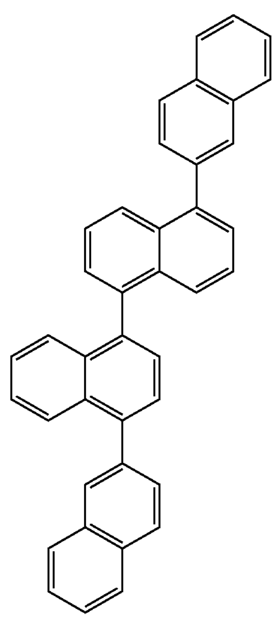

-continued
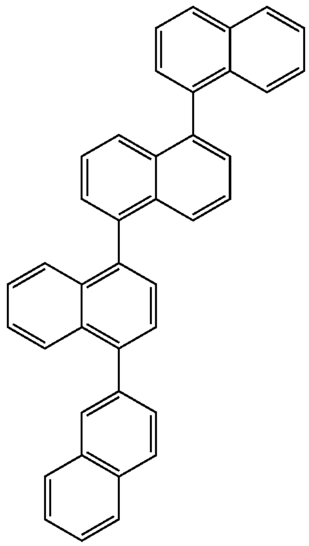
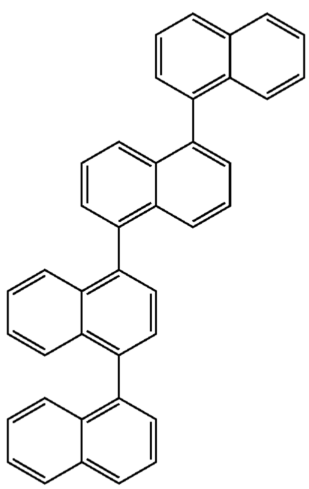
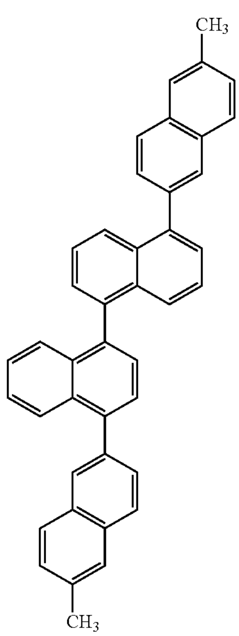
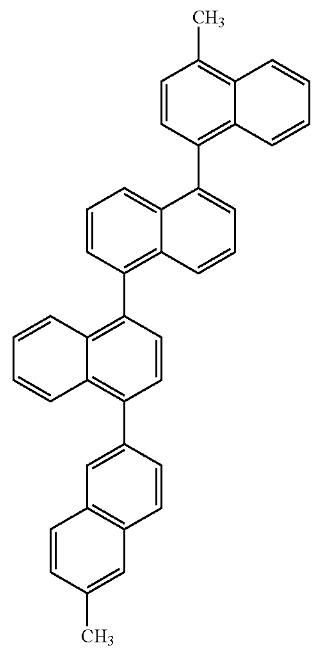
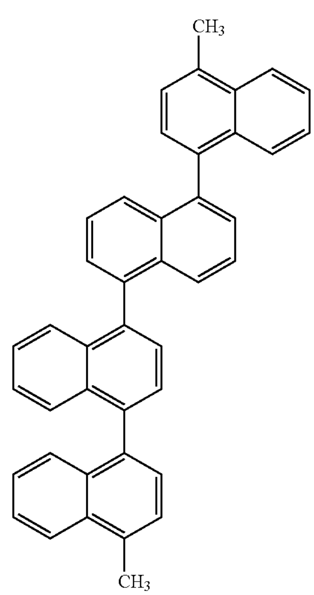

-continued
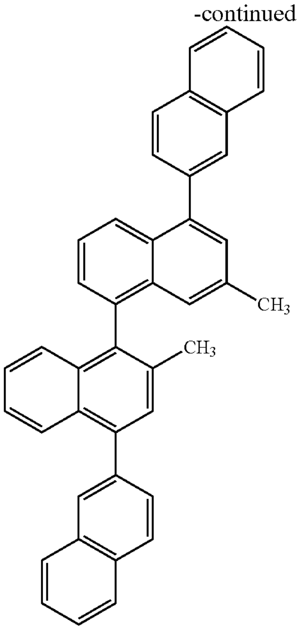
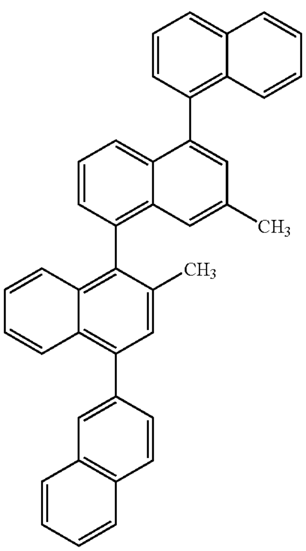
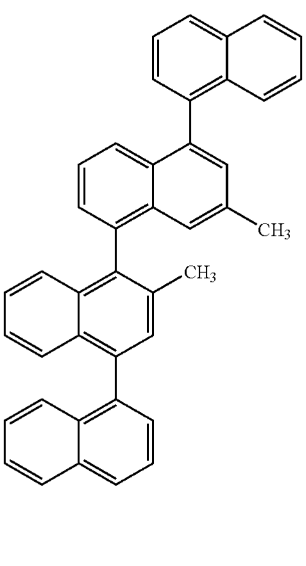
-continued
[Chemical Formula 96]
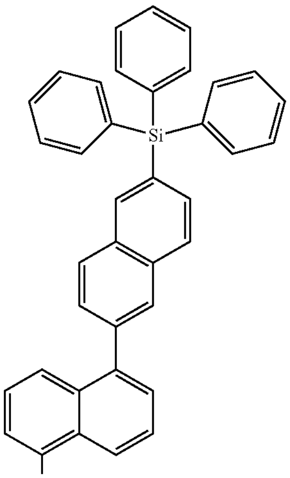
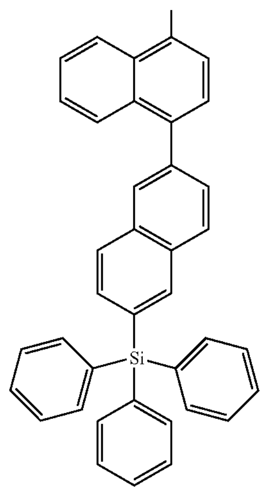
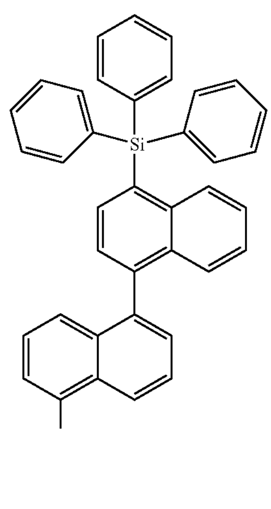

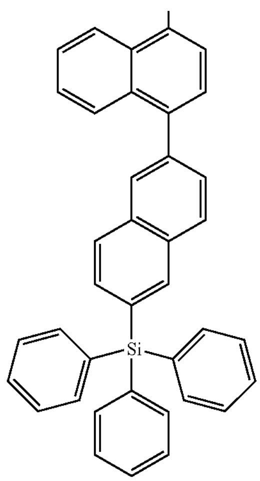
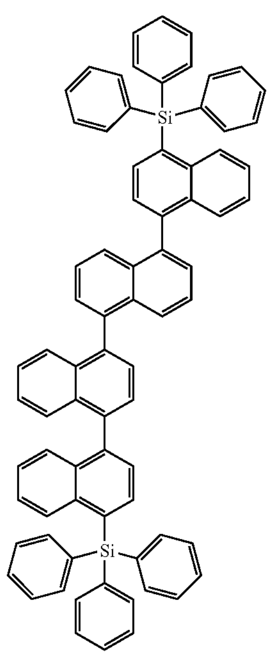
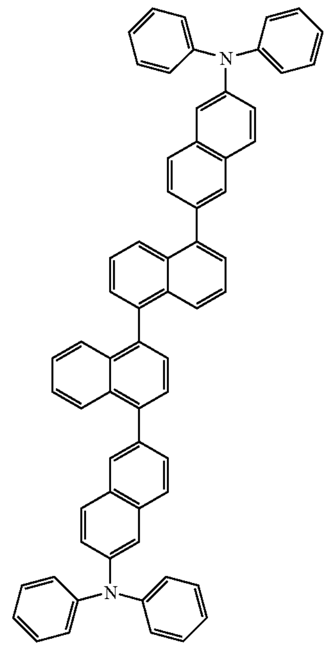
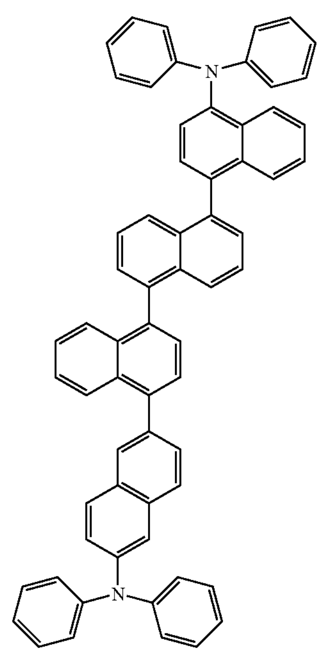

-continued
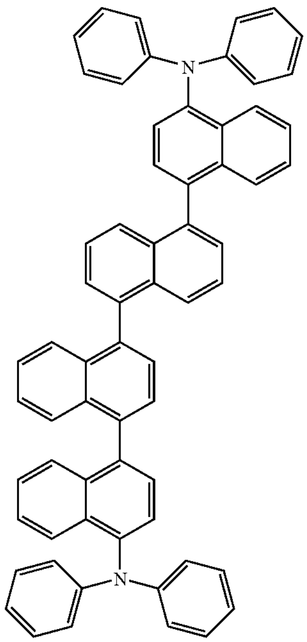
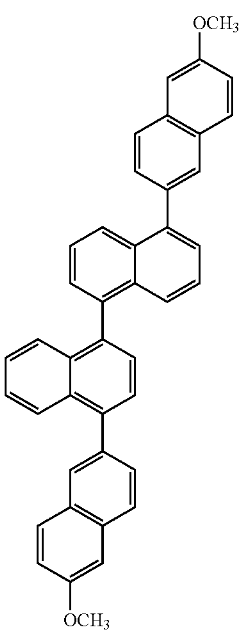
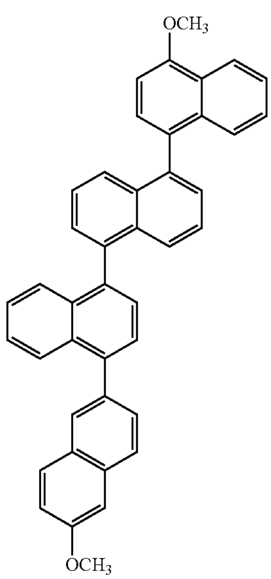
-continued
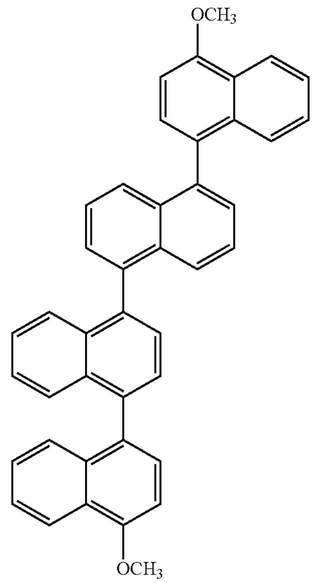
[Chemical Formula 97]
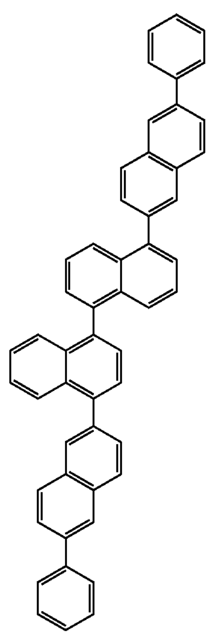
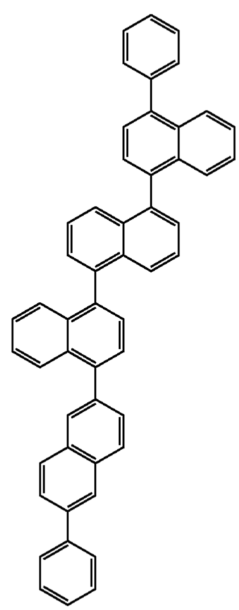

-continued
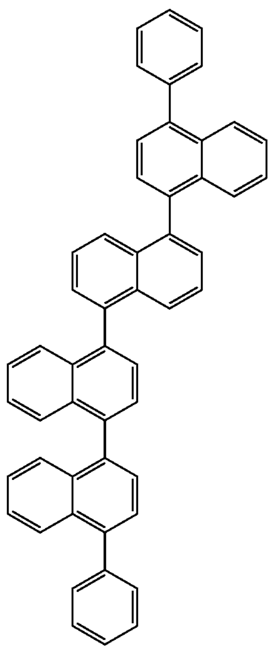
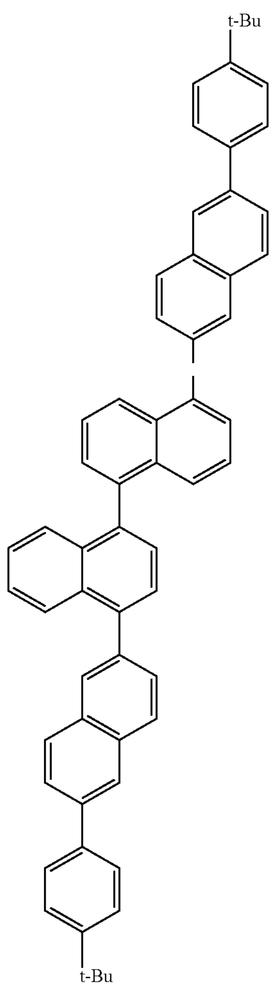
-continued
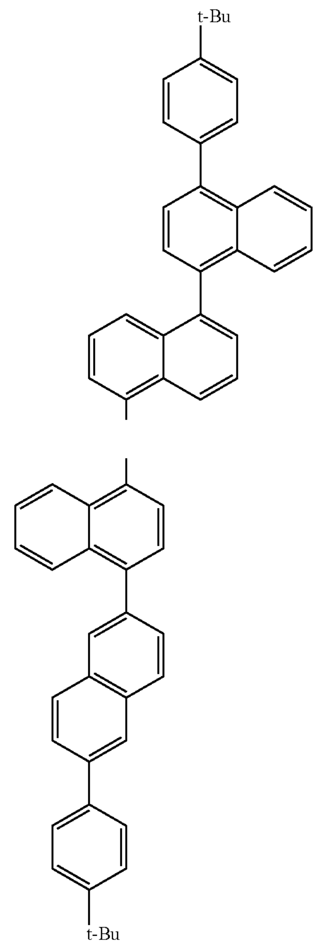
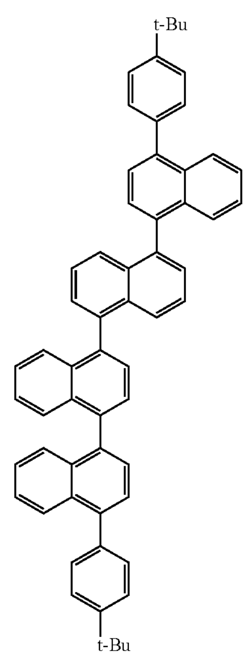 [SMILES: CC(C)(C)c1ccc(-c2ccc(-c3cccc4c(-c5ccc(-c6ccc(-c7ccc(C(C)(C)C)cc7)c7ccccc67)c6ccccc56)cccc34)c3ccccc23)cc1]
The oligonaphthalene derivative may be represented by the following formula (82).

[Chemical Formula 98]

(82)

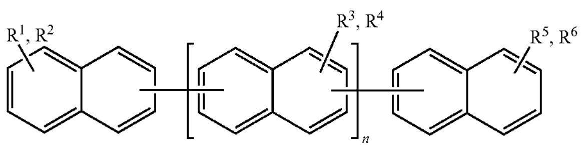

In the formula, $R^1$ to $R^6$ each are an independent group suitably selected from the group consisting of hydrogen, alkoxy group having 1 to 4 carbon atoms, alkyl group having 1 to 4 carbon atoms and substituted or unsubstituted amino group. n is an integer of 2 to 4.

Examples of such an oligonaphthalene compound are those represented by the following formulae.

[Chemical Formula 99]

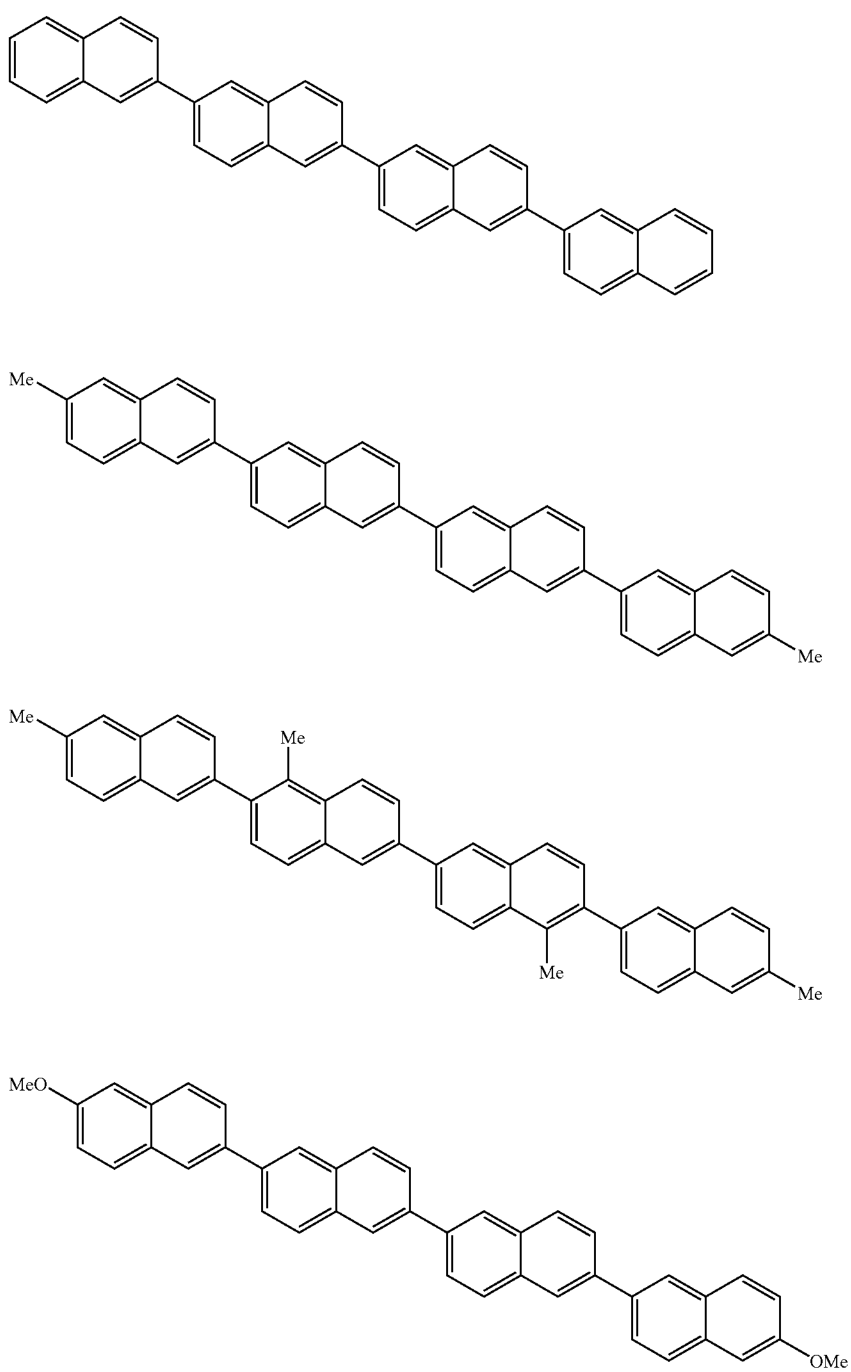

-continued

[Chemical Formula 100]

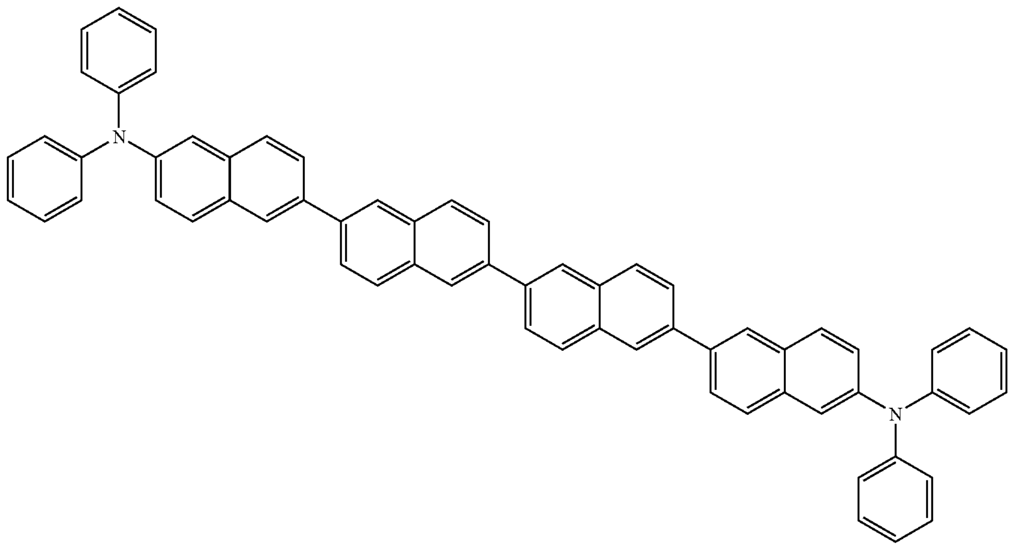

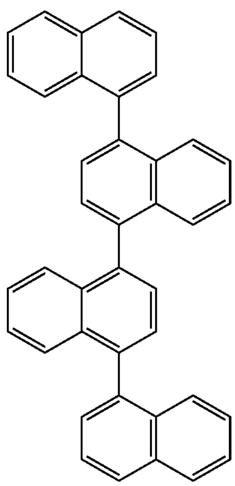

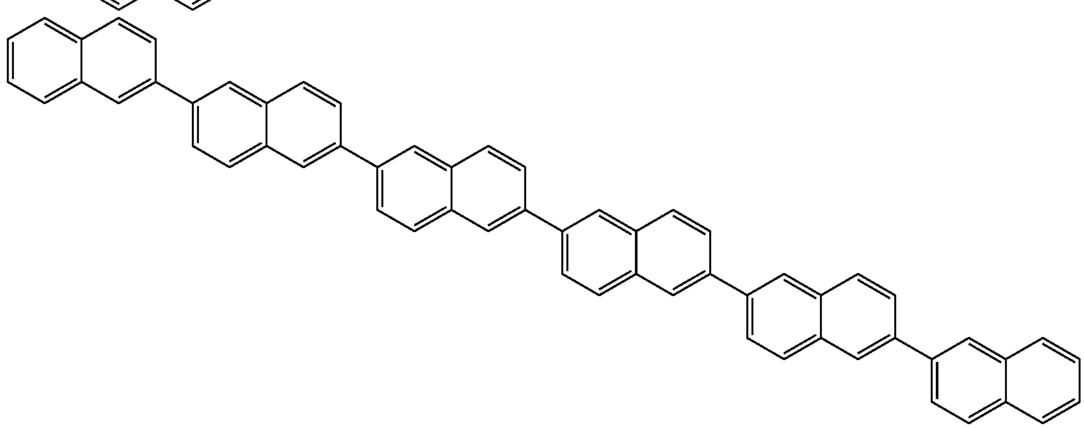

The material used for the host may contain a host material represented by the following formula (141).

$$Ra—Ar^{1}—Rb \qquad (141)$$

In the formula (141), when Ra, Rb and $Ar^1$ have a single or plural substituent(s), the substituent(s) is preferably an alkyl group having 1 to 20 carbon atoms, a haloalkyl group having 1 to 20 carbon atoms, a cycloalkyl group having 5 to 18 carbon atoms, a silyl group having 3 to 20 carbon atoms, a cyano group or a halogen atom. A substituent for $Ar^1$ may also be an aryl group having 6 to 22 carbon atoms.

Since the substituent(s) contains no nitrogen atom, the stability of the host material can be further enhanced, and the lifetime of the device can be prolonged.

The number of plural aryl substituents for $Ar^1$ is preferably 2 or less, more preferably 1 or less.

Examples of the alkyl group having 1 to 20 carbon atoms are a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neo-pentyl group, a 1-methylpentyl group, 2-methylpentyl group, a 1-pentylhexyl group, a 1-butylpentyl group, a 1-heptyloctyl group and 3-methylpentyl group.

Examples of the haloalkyl group having 1 to 20 carbon atoms are chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group and 1,2,3-triiodopropyl group.

Examples of the cycloalkyl group having 5 to 18 carbon atoms are cyclopentyl group, cyclohexyl group, cyclooctyl group, and 3,5-tetramethylcyclohexyl group, among which cyclohexyl group, cyclooctyl group and 3,5-tetramethylcyclohexyl group are preferable.

The silyl group having 3 to 20 carbon atoms is preferably an alkylsilyl group, an arylsilyl group or an aralkylsilyl group, examples of which are trimethylsilyl group, triethylsilyl group, tributylsilyl group, trioctylsilyl group, triisobutylsilyl group, dimethylethylsilyl group, dimethylisopropylsilyl group, dimethylpropylsilyl group, dimethylbutylsilyl group, dimethyltertiarybutylsilyl group, diethylisopropylsilyl group, phenyldimethylsilyl group, diphenylmethylsilyl group, diphenyltertiarybutylsilyl group and triphenylsilyl group.

Examples of the halogen atom are a fluorine atom, a chlorine atom, a bromine atom and an iodine atom.

The aryl substituent having 6 to 22 carbon atoms is preferably phenyl group, biphenyl group, terphenyl group, naphthyl group, chrysenyl group, fluoranthenyl group, 9,10-dialkylfluorenyl group, 9,10-diarylfluorenyl group, triphenylenyl group, phenanthrenyl group, benzophenanthrenyl group, dibenzophenanthrenyl group, benzotriphenylenyl group, benzochrysenyl group or dibenzofuranyl group, more preferably phenyl group having 6 to 18 carbon atoms, biphenyl group, terphenyl group, naphthyl group, chrysenyl group, fluoranthenyl group, 9,10-dimethylfluorenyl group, triphenylenyl group, phenanthrenyl group, benzophenanthrenyl group or dibenzofuranyl group, much more preferably a phenyl group having 6 to 14 carbon atoms, biphenyl group, naphthyl group, phenanthrenyl group or dibenzofuranyl group.

The fluorescent host may contain a host material represented by the following formula (142).

$$Ra—Ar^1—Ar^2—Rb \quad (142)$$

In the formula (142) above, Ra and $Ar^1$ each represent a substituted or unsubstituted naphthalene ring.

Rb represents a substituted or unsubstituted fused aromatic hydrocarbon group selected from a group consisting of a phenanthrene ring, a triphenylene ring, a benzophenanthrene ring, a dibenzophenanthrene ring, a benzotriphenylene ring, a fluoranthene ring, a benzochrysene ring and a picene ring.

$Ar^2$ represents a substituted or unsubstituted fused aromatic hydrocarbon group selected from a group consisting of a benzene ring, a naphthalene ring, a chrysene ring, a fluoranthene ring, a triphenylene ring, a benzophenanthrene ring, a dibenzophenanthrene ring, a benzotriphenylene ring, a benzochrysene ring, a benzo[b]fluoranthene ring and a picene ring.

Substituents for Ra and Rb are not aryl groups. Substituents for $Ar^1$ and $Ar^2$ are not aryl groups when $Ar^1$ or $Ar^2$ represents a naphthalene ring.

The fluorescent host may contain a host material represented by the following formula (143).

$$Ra—Ar^1—Ar^2—Ar^3—Rb \quad (143)$$

In the formula (143), Ra, Rb, $Ar^1$, $Ar^2$ and $Ar^3$ each represent a substituted or unsubstituted benzene ring or a substituted or unsubstituted fused aromatic hydrocarbon ring selected from the group consisting of naphthalene ring, chrysene ring, fluoranthene ring, triphenylene ring, phenanthrene ring, benzophenanthrene ring, dibenzophenanthrene ring, benzotriphenylene ring, benzochrysene ring, benzo[b]fluoranthene ring and picene ring.

When $Ar^2$ is a substituted or unsubstituted benzene ring or a substituted or unsubstituted 2,7-phenanthrene-diyl group or triphenylene ring, [Ra—$Ar^1$—] and [Rb—$Ar^3$—] are differently structured groups.

The fluorescent host may contain a host material represented by the following formula (144).

[Chemical Formula 101]

(144)

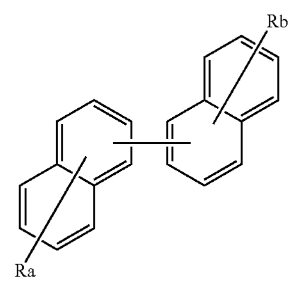

In the formula (144), Ra and Rb each represent a substituted or unsubstituted fused aromatic hydrocarbon group selected from a group consisting of a phenanthrene ring, a triphenylene ring, a benzophenanthrene ring, a dibenzophenanthrene ring, a benzotriphenylene ring, a benzo[b]fluoranthene ring, a fluoranthene ring, a benzochrysene ring and a picene ring.

Substituents for Ra, Rb, $Ar^1$ and $Ar^2$ are not aryl groups.

The fluorescent host may contain a host material represented by the following formula (145).

[Chemical Formula 102]

(145)

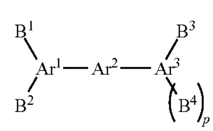

In the formula (145), when $Ar^1$, $Ar^2$, $Ar^3$, $B^1$, $B^2$, $B^3$ and $B^4$ have a single or plural substituent(s), the substituent(s) is preferably an alkyl group having 1 to 20 carbon atoms, a haloalkyl group having 1 to 20 carbon atoms, a cycloalkyl group having 5 to 18 carbon atoms, a silyl group having 3 to 20 carbon atoms, a cyano group or a halogen atom. A substituent for $Ar^2$ may also be an aryl group having 6 to 22 carbon atoms.

Since the substituent(s) contains no nitrogen atom, the stability of the host material can be further enhanced, and the lifetime of the device can be prolonged.

The number of plural aryl substituents for $Ar^2$ is preferably 2 or less, more preferably 1 or less.

Examples of the alkyl group having 1 to 20 carbon atoms are a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neo-pentyl group, a 1-methylpentyl group, 2-methylpentyl group, a 1-pentylhexyl group, a 1-butylpentyl group, a 1-heptyloctyl group and 3-methylpentyl group.

Examples of the haloalkyl group having 1 to 20 carbon atoms are chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group and 1,2,3-triiodopropyl group.

Examples of the cycloalkyl group having 5 to 18 carbon atoms are cyclopentyl group, cyclohexyl group, cyclooctyl group, and 3,5-tetramethylcyclohexyl group, among which cyclohexyl group, cyclooctyl group and 3,5-tetramethylcyclohexyl group are preferable.

The silyl group having 3 to 20 carbon atoms is preferably an alkylsilyl group, an arylsilyl group or an aralkylsilyl group, examples of which are trimethylsilyl group, triethylsilyl group, tributylsilyl group, trioctylsilyl group, triisobutylsilyl group, dimethylethylsilyl group, dimethylisopropylsilyl group, dimethylpropylsilyl group, dimethylbutylsilyl group, dimethyltertiarybutylsilyl group, diethylisopropylsilyl group, phenyldimethylsilyl group, diphenylmethylsilyl group, diphenyltertiarybutylsilyl group and triphenylsilyl group.

Examples of the halogen atom are a fluorine atom, a chlorine atom, a bromine atom and an iodine atom.

The aryl substituent having 6 to 22 carbon atoms is preferably phenyl group, biphenyl group, terphenyl group, naphthyl group, chrysenyl group, fluoranthenyl group, 9,10-dialkylfluorenyl group, 9,10-diarylfluorenyl group, triphenylenyl group, phenanthrenyl group, benzophenanthrenyl group, dibenzophenanthrenyl group, benzotriphenylenyl group, benzochrysenyl group or dibenzofuranyl group, more preferably phenyl group having 6 to 18 carbon atoms, biphenyl group, terphenyl group, naphthyl group, chrysenyl group, fluoranthenyl group, 9,10-dimethylfluorenyl group, triphenylenyl group, phenanthrenyl group, benzophenanthrenyl group or dibenzofuranyl group, much more preferably a phenyl group having 6 to 14 carbon atoms, biphenyl group, naphthyl group, phenanthrenyl group or dibenzofuranyl group.

In the aspect of the invention, the host preferably has the minimum triplet energy gap of 2.1 eV to 3.5 eV.

When green and red emission is to be obtained by transfer of triplet energy, the host is required to have a relatively wide triplet energy gap.

A material having a large conjugation at π bonding exhibits a narrow triplet energy gap, so that the transfer of the energy to the phosphorescent dopant is difficult.

Accordingly, conventional structures have employed a phosphorescent host material having a fewer number of common π bonding and having a wider triplet energy gap.

In contrast, according to the aspect of the invention, the minimum triplet energy gap is 2.1 eV to 3.5 eV.

When the host material has the minimum triplet energy gap of approximately 2.1 eV to 3.5 eV, the transfer of the energy to the red phosphorescent dopant and green phosphorescent dopant can be secured.

Further, since the host material has the suitable minimum triplet energy gap of approximately 2.1 eV to 3.5 eV, preferably approximately 2.1 eV to 2.7 eV, the singlet energy gap can also become of a suitable size. Accordingly, it is possible to prevent the reduction in luminous efficiency caused by an excessively large singlet energy gap and inefficiency in the transfer of the energy to the fluorescent dopant. Thus, the lifetime of the organic EL device can be increased while the driving voltage is reduced.

In other words, the host material according to the aspect of the invention can exhibit a suitable energy gap as the host material for the fluorescent emission in the device including the mixed-color emitting layer. Hence, the host material can provide an organic EL device having practical lifetime.

According to the aspect of the invention, since the above-described host material is used for the mixed-color emitting layer, an organic EL device requiring a lower driving voltage and having both of practical luminous efficiency and emission lifetime is obtainable.

While the above-described host material is usable in the mixed-color emitting layer according to the aspect of the invention, the host material may be suitably used for the second emitting layer. The host material for the second emitting layer may be a suitable known material, as long as such as material is compatible with the invention.

When the mixed-color emitting layer is formed of the above-described host material and the host material used therein has a wider gap than a conventional host of a fluorescent emitting layer, a difference in ionization potential (Ip) between the host material and the hole injecting/transporting layer etc. may become so large that the injection of holes into the mixed-color emitting layer may be difficult and that a driving voltage required for providing sufficient luminance may be raised.

In the above instance, introducing a hole-injectable/transportable assistance material for assisting injection of charges in the mixed-color emitting layer can contribute to facilitation of the injection of the holes into the mixed-color emitting layer and to reduction of the driving voltage.

As the assistance material for assisting the injection of charges, for instance, a typical hole injecting/transporting material or the like can be used.

Examples of the assistance material are a triazole derivative (see, for instance, the specification of U.S. Pat. No. 3,112,197), an oxadiazole derivative (see, for instance, the specification of U.S. Pat. No. 3,189,447), an imidazole derivative (see, for instance, JP-B-37-16096), a polyarylalkane derivative (see, for instance, the specifications of U.S. Pat. No. 3,615,402, U.S. Pat. No. 3,820,989 and U.S. Pat. No. 3,542,544, JP-B-45-555, JP-B-51-10983, JP-A-51-93224, JP-A-55-17105, JP-A-56-4148, JP-A-55-108667, JP-A-55-156953, and JP-A-56-36656), a pyrazoline derivative and a pyrazolone derivative (see, for instance, the specifications of U.S. Pat. No. 3,180,729 and U.S. Pat. No. 4,278,746, JP-A-55-88064, JP-A-55-88065, JP-49-105537, JP-A-55-51086, JP-A-56-80051, JP-A-56-88141, JP-A-57-45545, JP-A-54-112637 and JP-A-55-74546), a phenylenediamine derivative (see, for instance, the specification of U.S. Pat. No. 3,615,404, JP-B-51-10105, JP-B-46-3712, JP-B-47-25336, JP-A-54-53435, JP-A-54-110536 and JP-A-54-119925), an arylamine derivative (see, for instance, the specifications of U.S. Pat. No. 3,567,450, U.S. Pat. No. 3,180,703, U.S. Pat. No. 3,240,597, U.S. Pat. No. 3,658,520, U.S. Pat. No. 4,232,103, U.S. Pat. No. 4,175,961 and U.S. Pat. No. 4,012,376, JP-B-49-35702, JP-B-39-27577, JP-A-55-144250, JP-A-56-119132 and JP-A-56-22437 and the specification of West Germany Patent No. 1,110,518), an amino-substituted chalcone derivative (see, for instance, the specification of U.S. Pat. No. 3,526,501), an oxazole derivative (disclosed in, for instance, the specification of U.S. Pat. No. 3,257,203), a styrylanthracene derivative (see, for instance, JP-A-56-46234), a fluorenone derivative (see, for instance, JP-A-54-110837), a hydrazone derivative (see, for instance, the specification of U.S. Pat. No. 3,717,462 and JP-A-54-59143, JP-A-55-52063, JP-A-55-52064, JP-A-55-46760, JP-A-55-85495, JP-A-57-11350, JP-A-57-148749 and JP-A-02-311591), a stilbene derivative (see, for instance, JP-A-61-210363, JP-A-61-228451, JP-A-61-14642, JP-A-61-72255, JP-A-62-47646, JP-A-62-36674, JP-A-62-10652, JP-A-62-30255, JP-A-60-93455, JP-A-60-94462, JP-A-60-174749 and JP-A-60-175052), a silazane derivative (see the specification of U.S. Pat. No. 4,950,950), a polysilane type (see JP-A-02-204996), an aniline-based copolymer (see JP-A-02-282263), and a conductive polymer oligomer (particularly, thiophene oligomer) disclosed in JP-A-01-211399.

The hole-injectable material, examples of which are as listed above, is preferably a porphyrin compound (disclosed in JP-A-63-295695 etc.), an aromatic tertiary amine compound or a styrylamine compound (see, for instance, the specification of U.S. Pat. No. 4,127,412, JP-A-53-27033, JP-A-54-58445, JP-A-54-149634, JP-A-54-64299, JP-A-55-79450, JP-A-55-144250, JP-A-56-119132, JP-A-61-295558, JP-A-61-98353 or JP-A-63-295695), particularly preferably an aromatic tertiary amine compound.

In addition, 4,4'-bis(N-(1-naphthyl)-N-phenylamino)biphenyl (hereinafter, abbreviated as NPD) having in the molecule two fused aromatic rings disclosed in U.S. Pat. Nos. 5,061,569, 4,4',4"-tris(N-(3-methylphenyl)-N-phenylamino) triphenylamine (hereinafter, abbreviated as MTDATA) in which three triphenylamine units disclosed in JP-A-04-308688 are bonded in a starburst form and the like may also be used.

Further, a hexaazatriphenylene derivative disclosed in Japanese Patent No. 3614405 and No. 3571977 and U.S. Pat. No. 4,780,536 may also preferably be used as the hole-injecting material.

Alternatively, inorganic compounds such as p-type Si and p-type SiC can also be used as the hole-injecting material.

Preferably in the aspect of the invention, the phosphorescent dopant contains a metal complex having: a metal selected from the group consisting of Ir, Pt, Os, Au, Cu, Re and Ru; and a ligand.

According to such a structure, by using the above metal complex as the phosphorescent dopant, red to green phosphorescent emission is obtainable.

Preferably in the aspect of the invention, the mixed-color emitting layer contains a red phosphorescent dopant for red phosphorescent emission and a green phosphorescent dopant for green phosphorescent emission.

According to the above structure, the single-layered mixed-color emitting layer can sufficiently provide each of blue fluorescent emission and red and green phosphorescent emission. Hence, favorable white emission is obtainable.

A conventional organic EL device has required three-layered emitting layer for providing white emission. However, the organic EL device according to the aspect of the invention can provide further favorable white emission by the single-layered mixed-color emitting layer. Thus, the manufacturing process can be simplified while the cost is suppressed.

Both of the green phosphorescent dopant and the red phosphorescent dopant may be doped in the mixed-color emitting layer. Alternatively, either one of them may be doped in the mixed-color emitting layer.

Preferably in the aspect of the invention, the red phosphorescent dopant provides the maximum emission luminance at a wavelength of 580 nm to 700 nm, and the green phosphorescent dopant provides the maximum emission luminance at a wavelength of 490 nm to 580 nm.

Examples of the red and green phosphorescent dopant are PQIr(iridium(III) bis(2-phenyl quinolyl-N,$C^{2'}$)acetylacetonate) and $Ir(ppy)_3$(fac-tris(2-phenylpyridine)iridium). Further examples are compounds shown below.

[Chemical Formula 103]

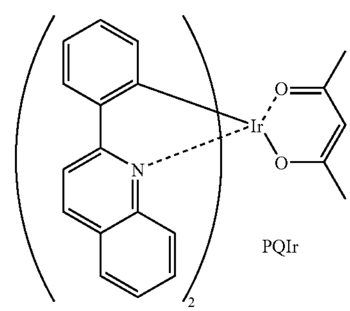

PQIr

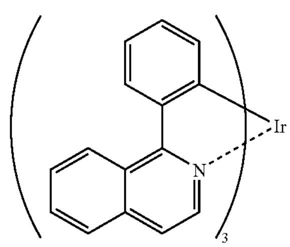

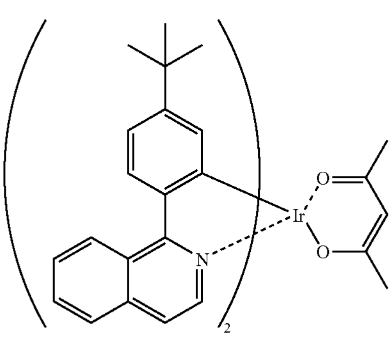

-continued
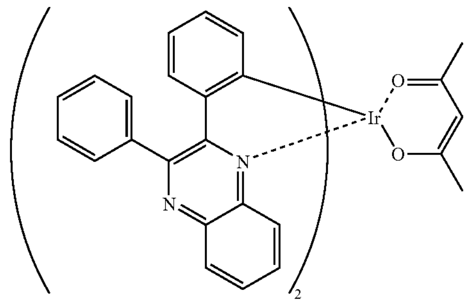
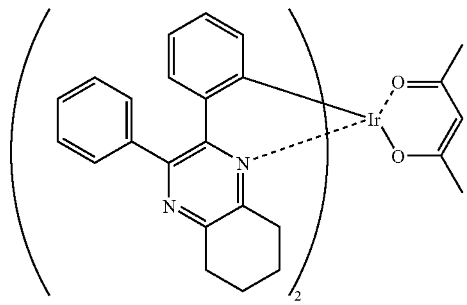
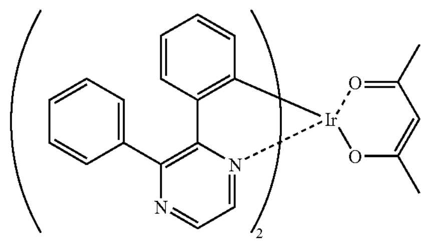
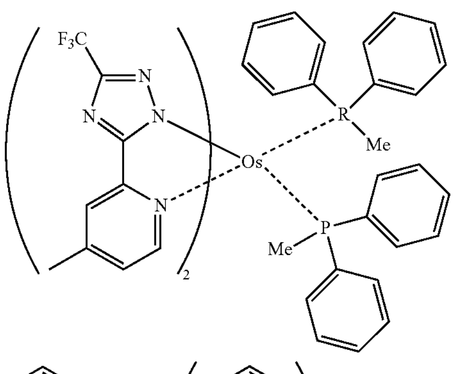
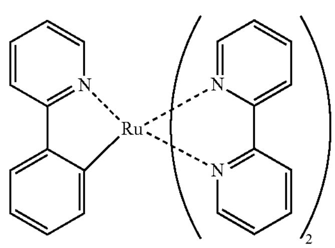
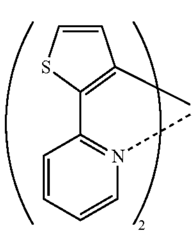
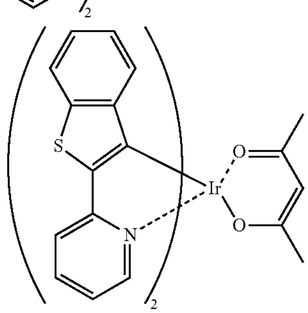
-continued
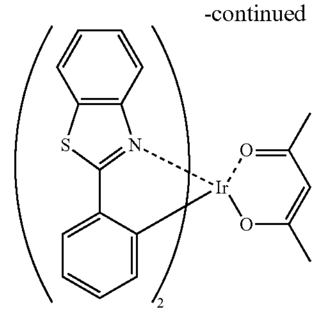
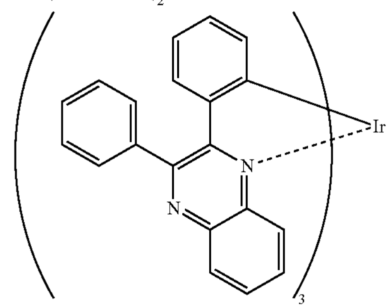
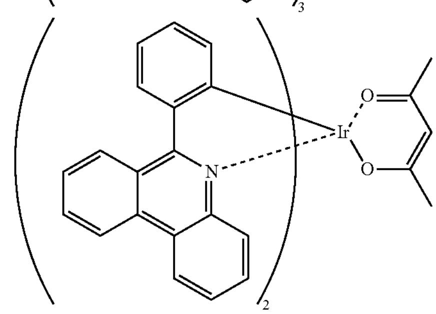
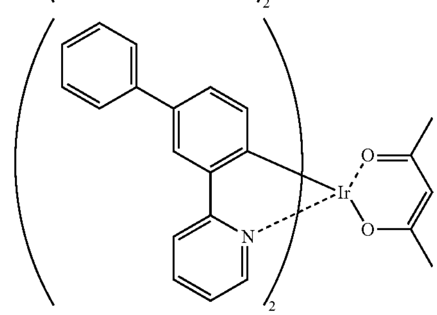
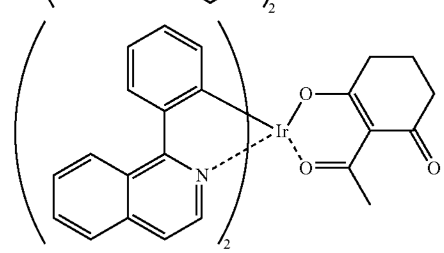
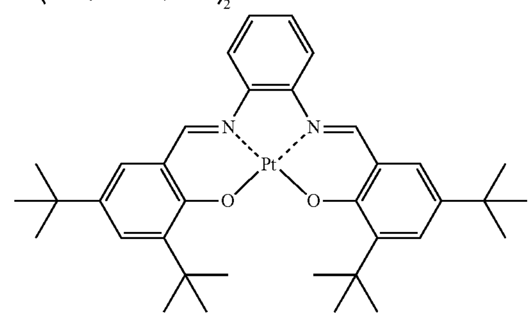

-continued
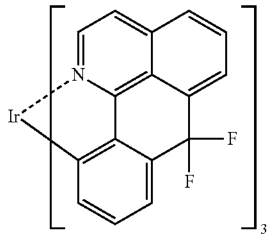
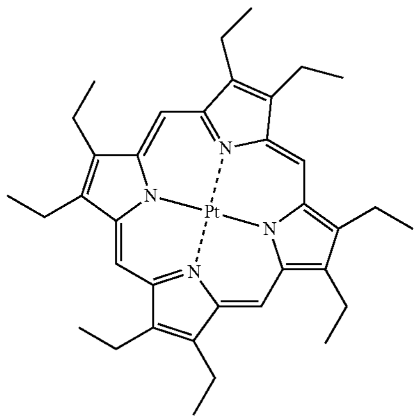
[Chemical Formula 104]
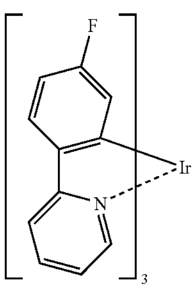
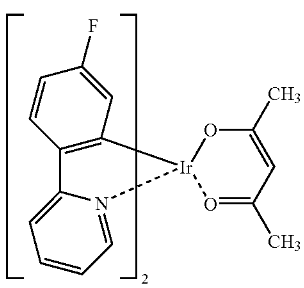
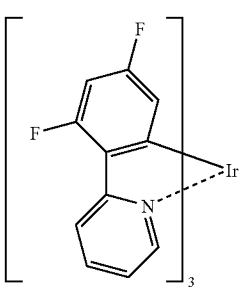
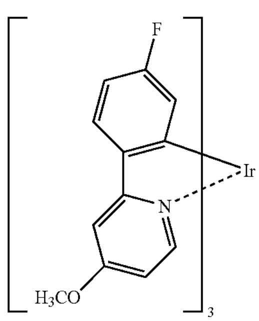
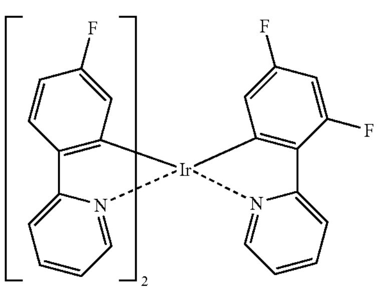
-continued
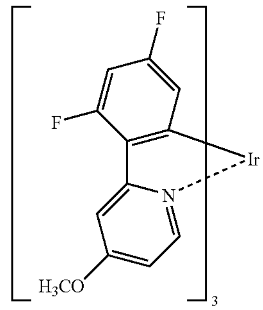
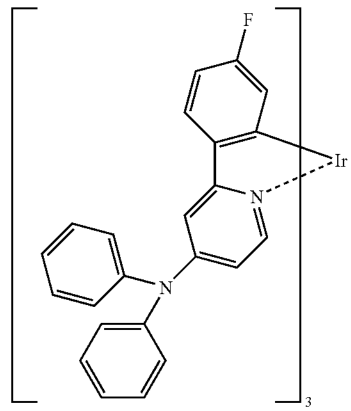
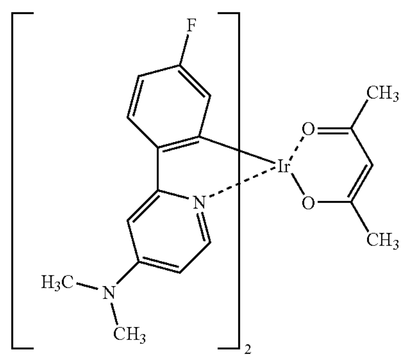
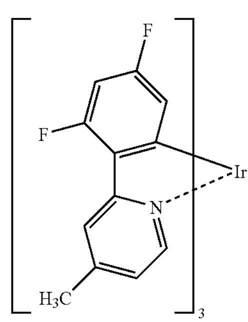
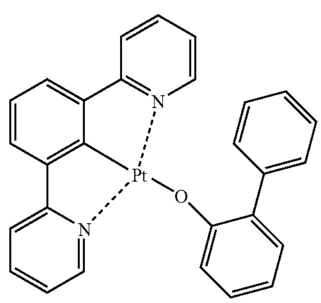

-continued
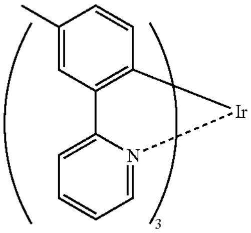
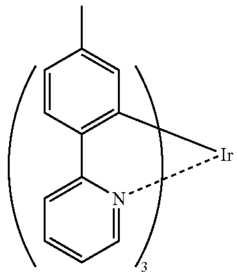
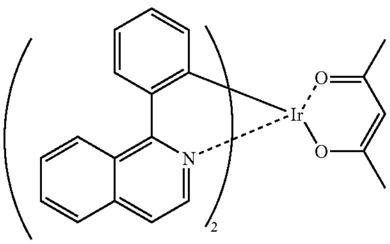
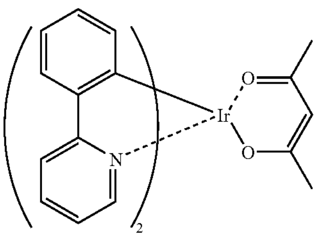
[Chemical Formula 105]
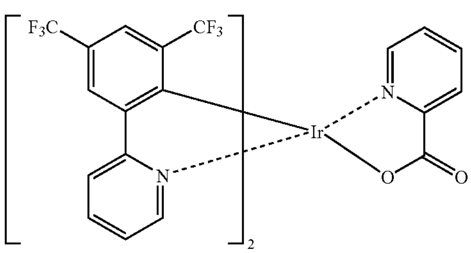
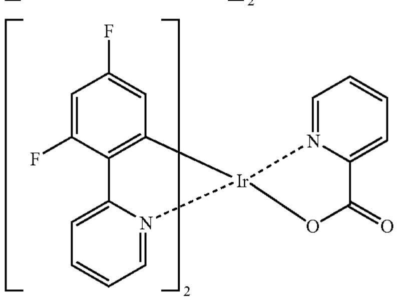
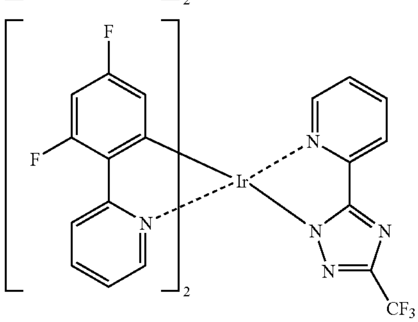
-continued
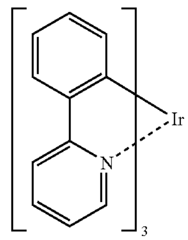
Ir(ppy)3
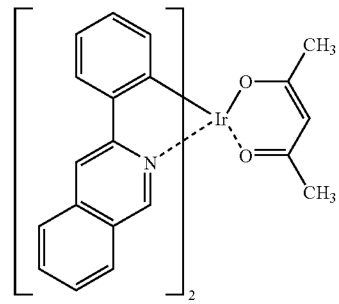
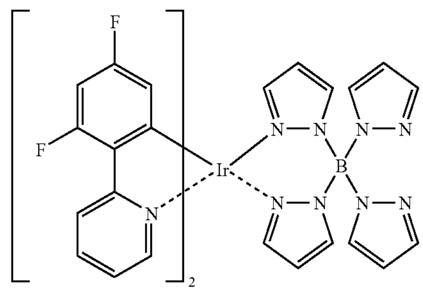
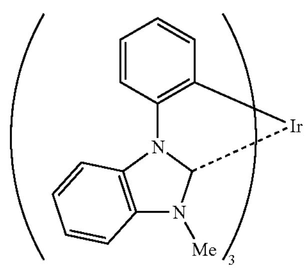
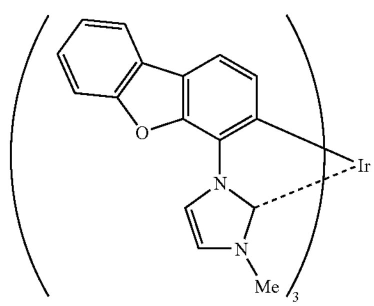
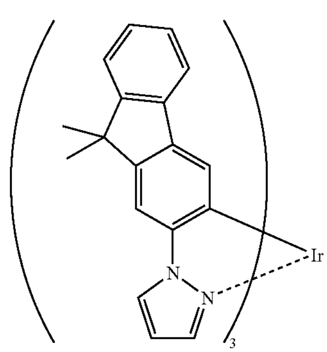

-continued
[Chemical Formula 106]
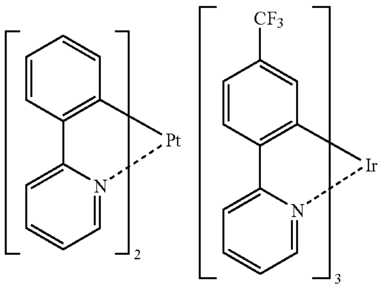
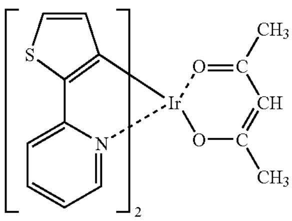
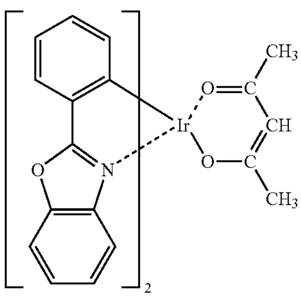
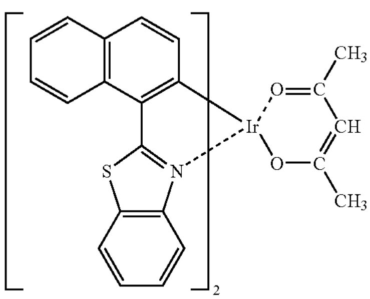
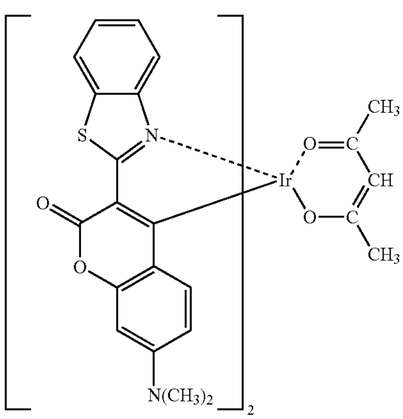
-continued
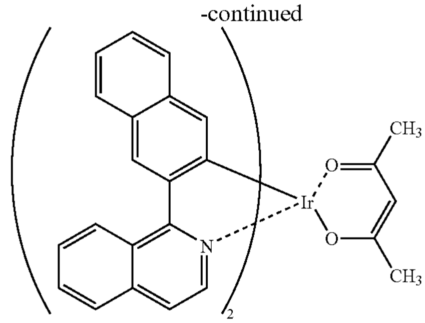
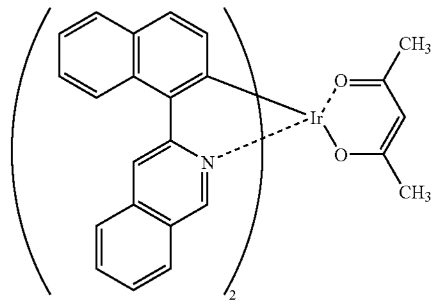
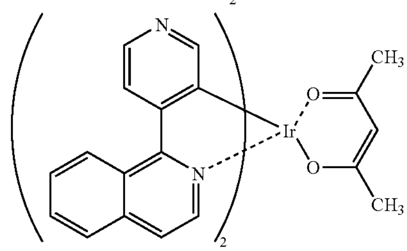
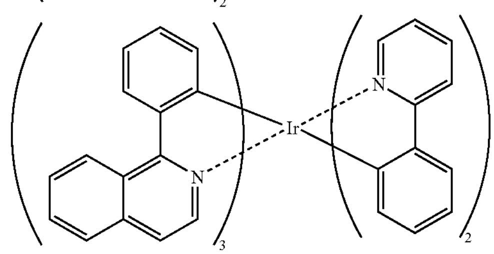
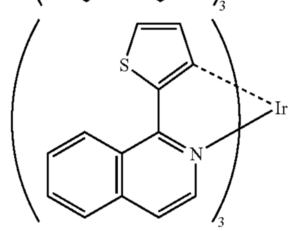
Preferably in the aspect of the invention, the fluorescent dopant is preferably an amine compound represented by the following formula (20).
[Chemical Formula 107]
(20)
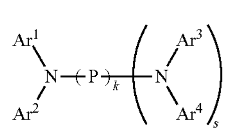
In the formula (20): P represents a substituted or unsubstituted aromatic hydrocarbon group having 6 to 40 ring carbon atoms, a substituted or unsubstituted heterocyclic group having 3 to 40 ring atoms, or a substituted or unsubstituted styryl group; k is an integer of 1 to 3;

$Ar^1$ to $Ar^4$ each independently represent a substituted or unsubstituted aromatic hydrocarbon group having 6 to 40 ring carbon atoms or a substituted or unsubstituted heterocyclic group having 3 to 40 ring atoms; s is an integer of 0 to 4;

An adjacent set of substituents for suitably-selected two of $Ar^1$, $Ar^2$ and P may be bonded together to form a ring. When k is 2 or more, P may be mutually the same or different.

Examples of the aromatic hydrocarbon group and the heterocyclic group represented by P are respectively a substituted or unsubstituted aromatic hydrocarbon group having 6 to 40 ring carbon atoms and a substituted or unsubstituted heterocyclic group having 3 to 40 carbon atoms, such as residues of benzene, biphenyl, terphenyl, naphthalene, phenanthrene, fluoranthene, anthracene, pyrene, perylene, coronene, chrysene, picene, dinaphthyl, trinaphthyl, phenylanthracene, diphenylanthracene, florene, triphenylene, rubicene, benzanthracene, dibenzanthracene, acenaphthofluoranthene, tribenzopentaphene, fluoranthenofluoranthene, benzodifluoranthene, benzofluoranthene and diindenoperylene. In particular, residues of naphthalene, phenanthrene, fluoranthene, anthracene, pyrene, perylene, chrysene, phenylanthracene and diphenylanthracene, and residues of combination of two or more thereof are preferable.

In the formula (20), $Ar^1$ to $Ar^4$ each independently represent a substituted or unsubstituted aromatic hydrocarbon group having 6 to 40 ring carbon atoms or a substituted or unsubstituted heterocyclic group having 3 to 40 ring atoms. s is an integer of 0 to 4.

Examples of the aromatic hydrocarbon group represented by $Ar^1$ to $Ar^4$ are a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, and 4"-t-butyl-p-terphenyl-4-yl group.

Examples of the heterocyclic group represented by $Ar^1$ to $Ar^4$ are a 1-pyroryl group, 2-pyroryl group, 3-pyroryl group, pyrazinyl group, 2-pyridiny group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-3-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, 4-t-butyl-3-indolyl group and the like.

As examples of the amine compound represented by the formula (20), fused aromatic amine, styryl amine, benzidine and the like are shown below, but the invention is not limited thereto. Me represents a methyl group.

[Chemical Formula 108]
(A)-1
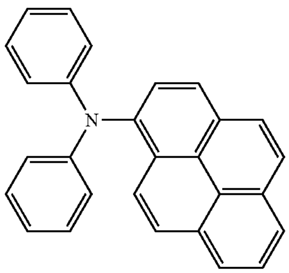
(A)-2
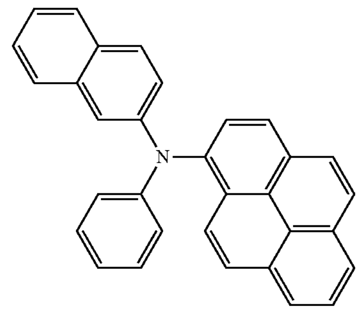
(A)-3
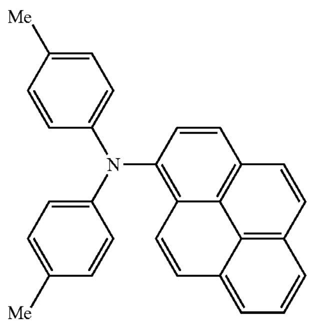
(A)-4
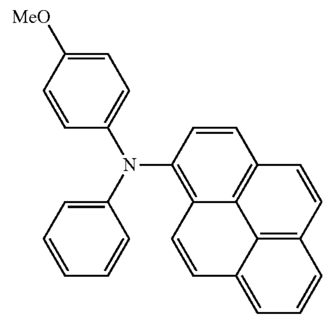
(A)-5
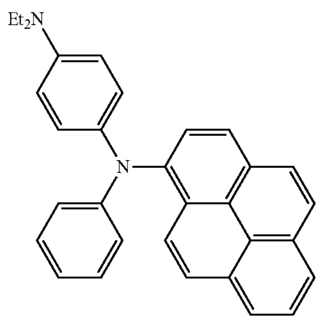
(A)-6
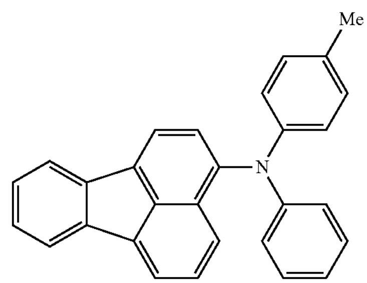
(A)-7
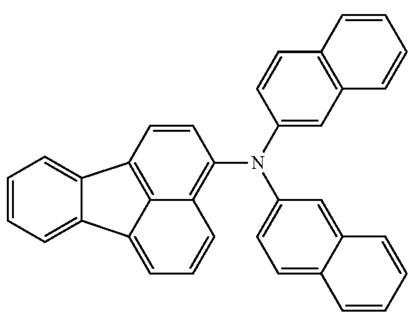
(A)-8
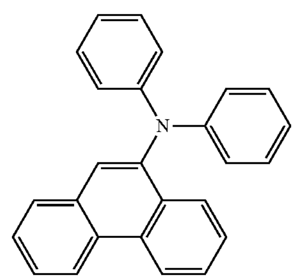
(A)-9
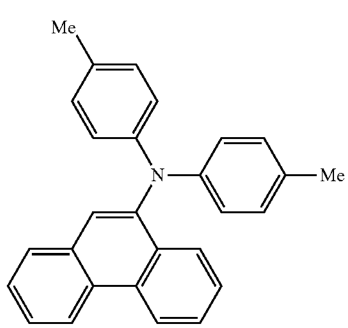
(A)-10
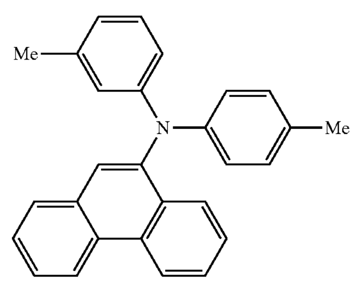

-continued
(A)-11
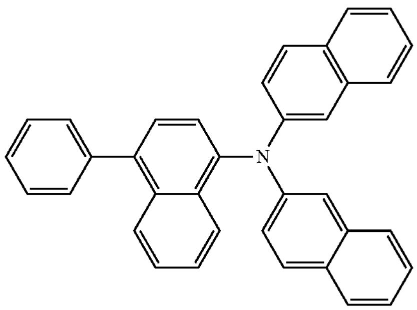
(A)-12
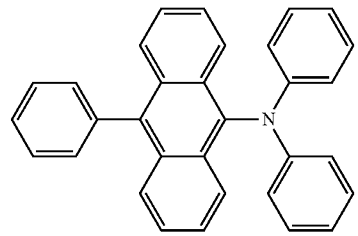
(A)-13
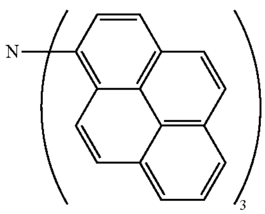
(A)-14
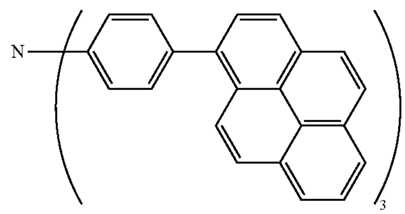
(A)-15
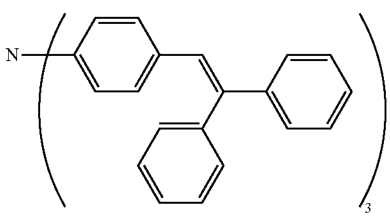
[Chemical Formula 109]
(A)-16
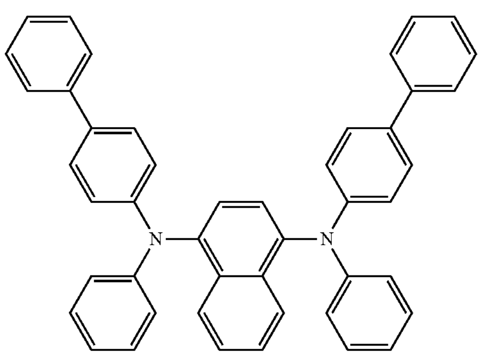
(A)-17
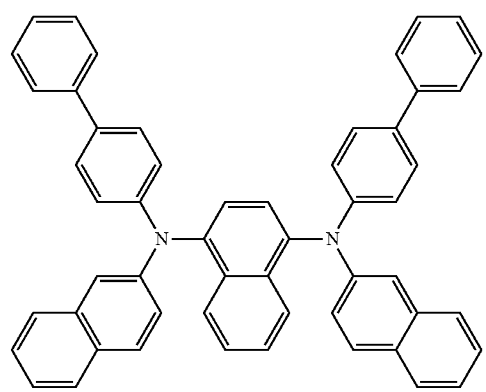
(A)-18
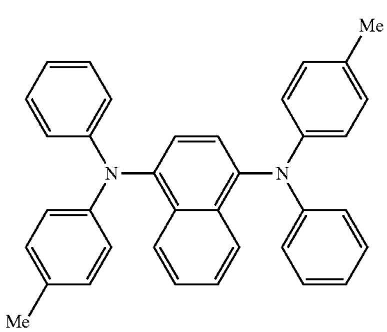
(A)-19
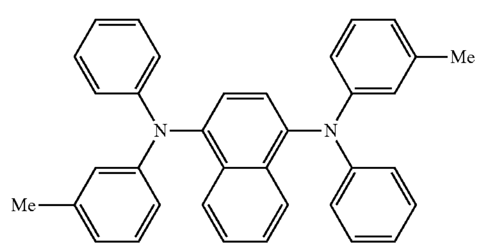

-continued
(A)-20
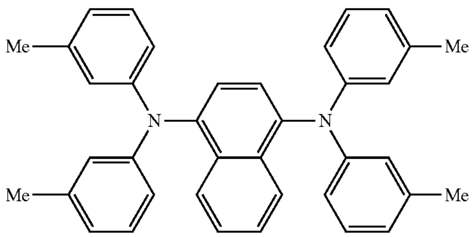
(A)-21
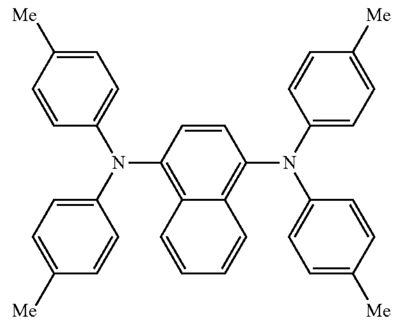
(A)-22
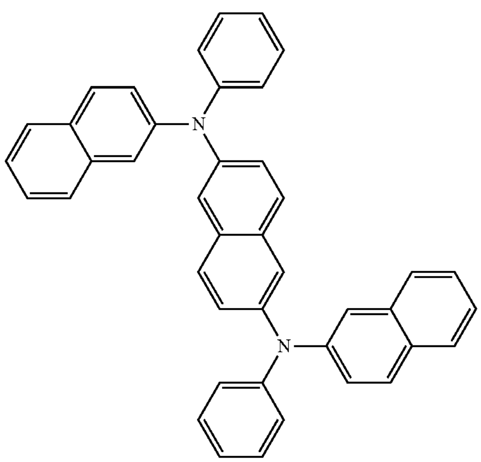
(A)-23
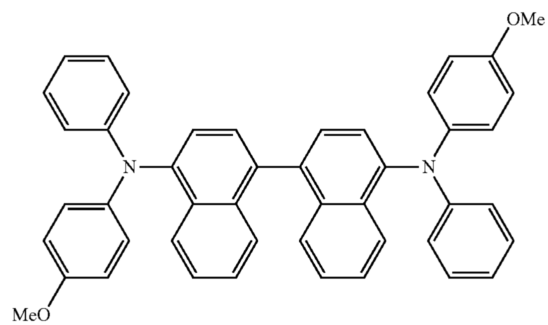
(A)-24
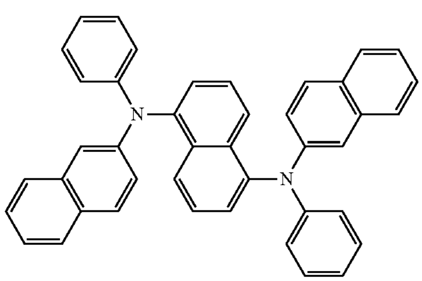
(A)-25
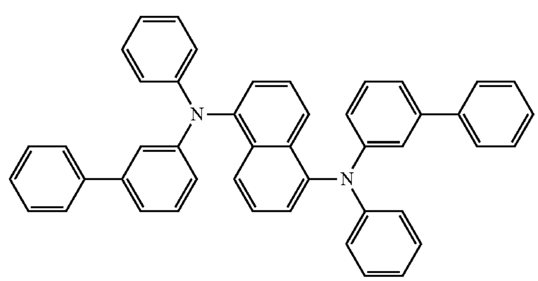
(A)-23
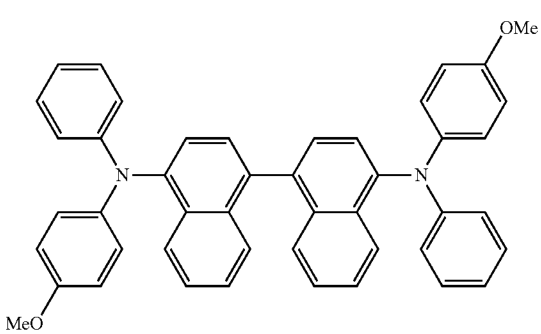
(A)-24
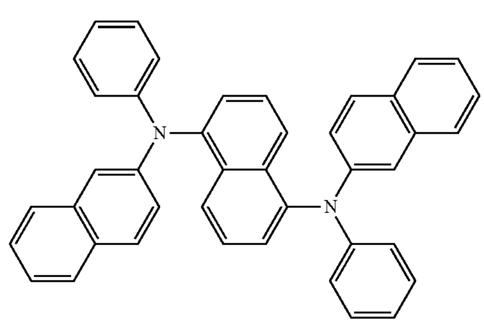

-continued
(A)-26
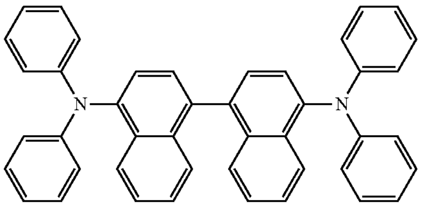
(A)-27
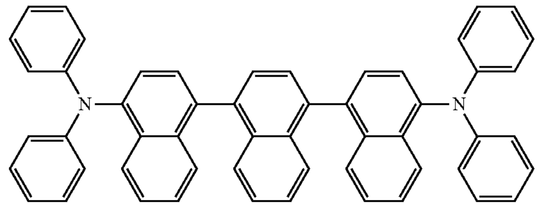
[Chemical Formula 110]
(A)-28
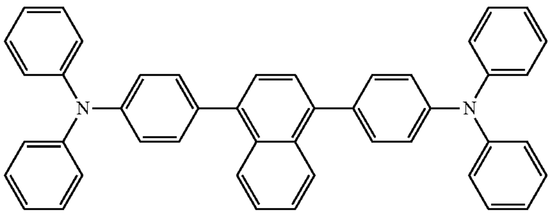
(A)-29
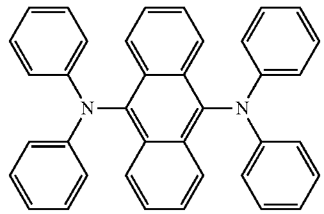
(A)-30
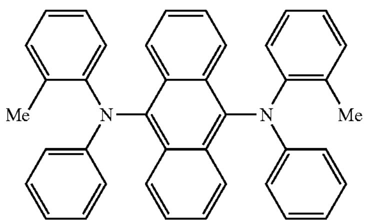
(A)-31
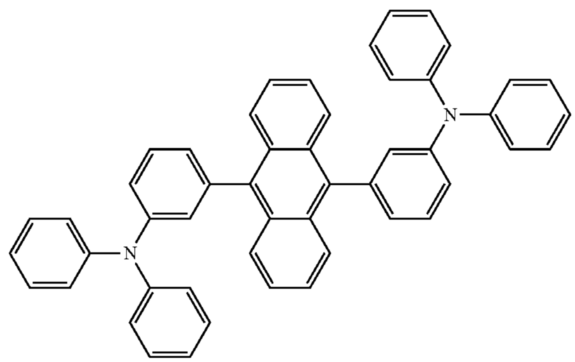
(A)-32
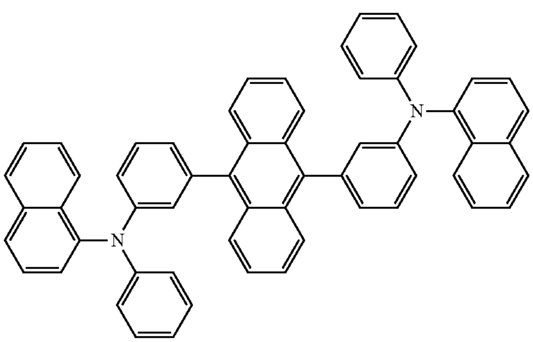
(A)-33
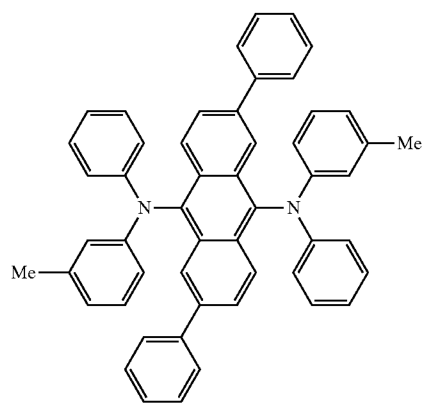
(A)-34
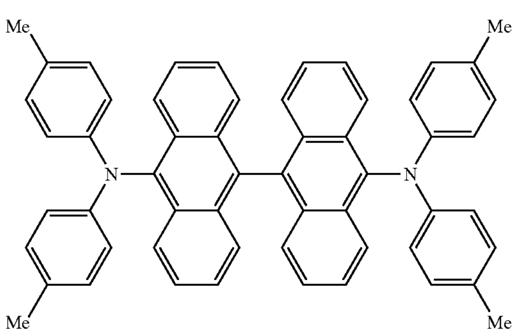
(A)-35
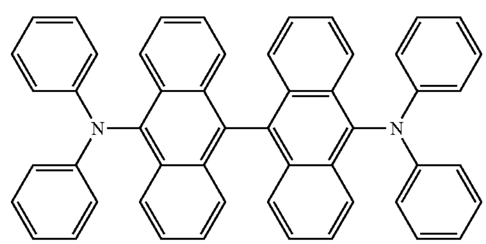

-continued
(A)-36
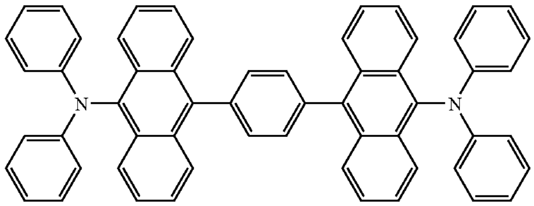
(A)-37
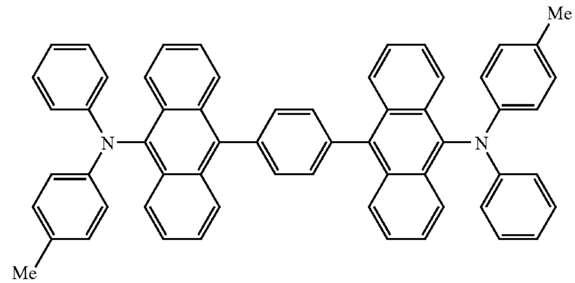
(A)-38
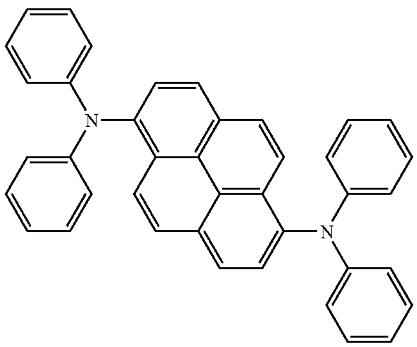
(A)-39
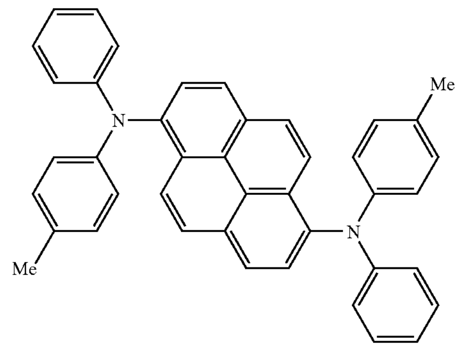
[Chemical Formula 111]
(A)-40
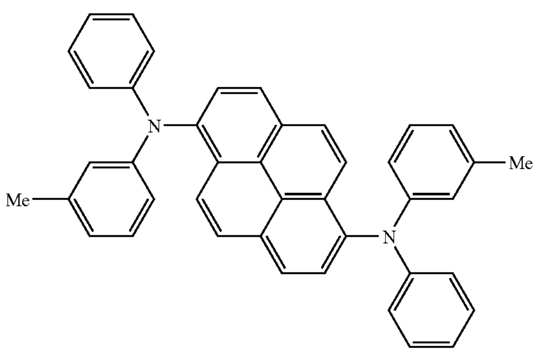
(A)-41
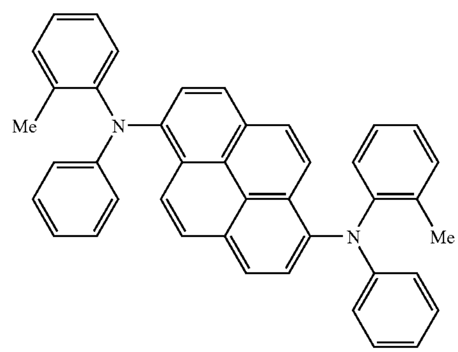
(A)-42
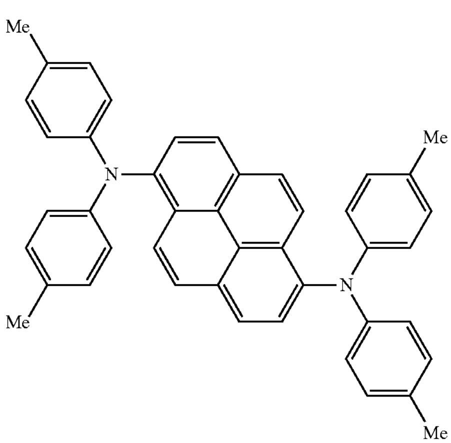
(A)-43
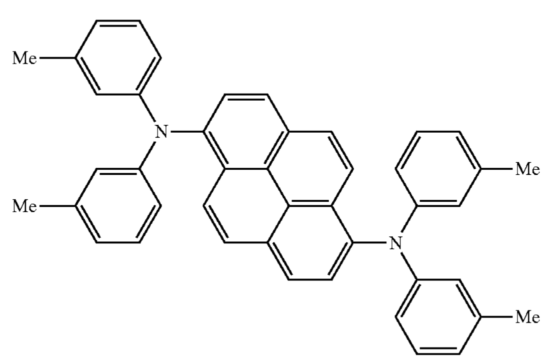

-continued
(A)-44
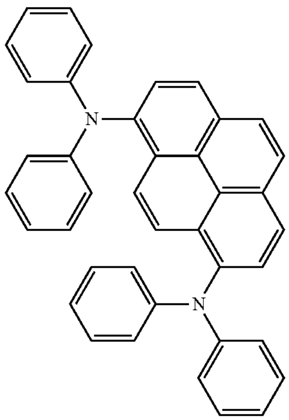
(A)-45
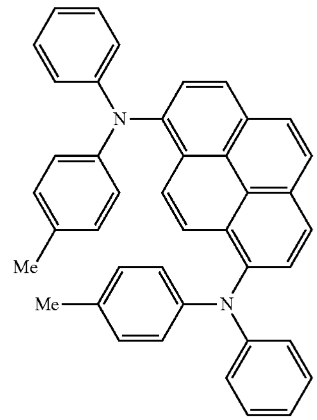
(A)-46
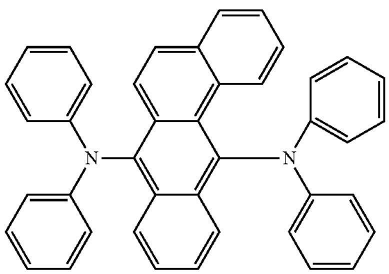
(A)-47
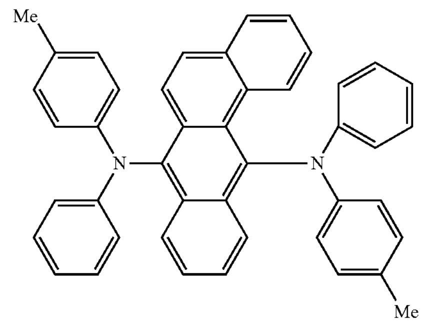
(A)-48
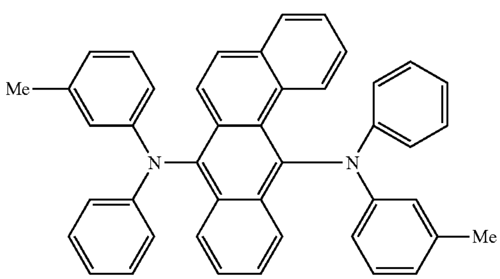
(A)-49
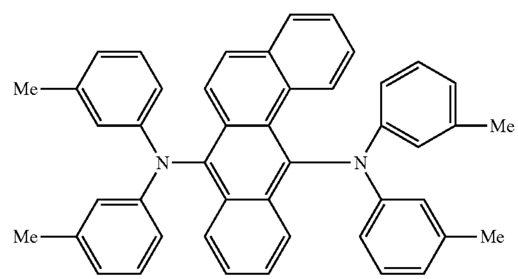
(A)-50
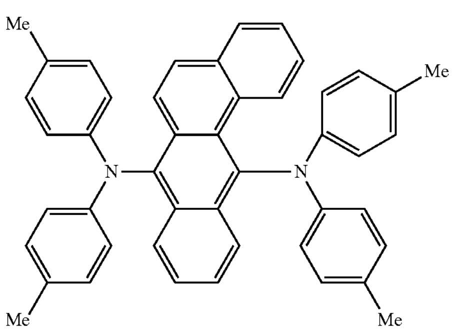
(A)-51
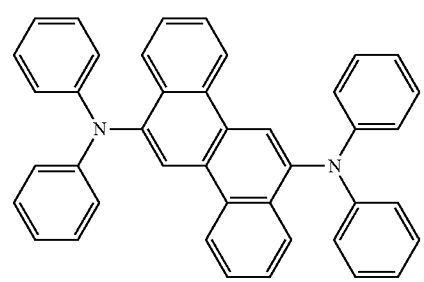
(A)-52
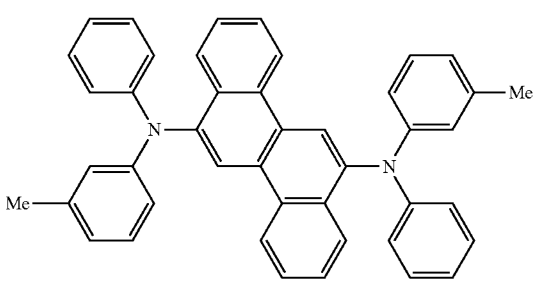

-continued
[Chemical Formula 112]
(A)-53
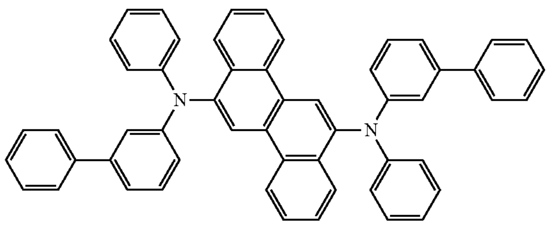
(A)-54
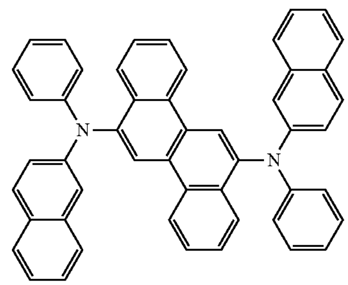
(A)-55
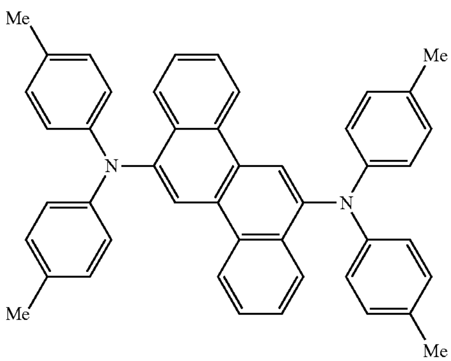
(A)-56
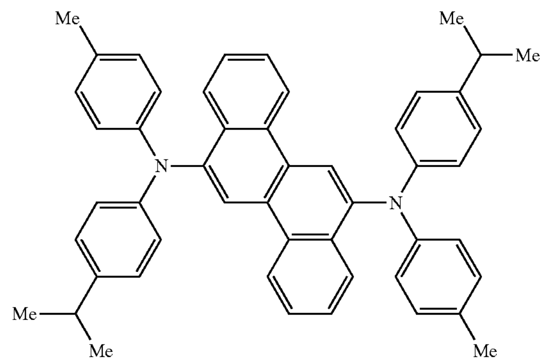
(A)-57
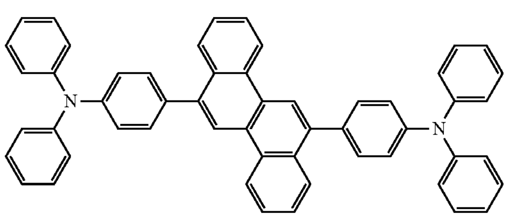
(A)-58
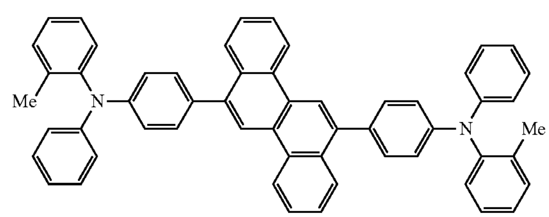
(A)-59
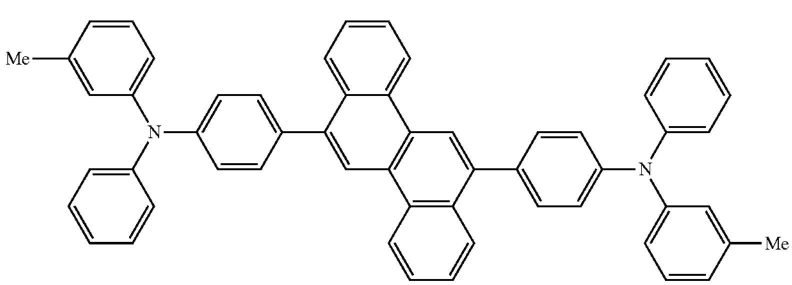
(A)-60
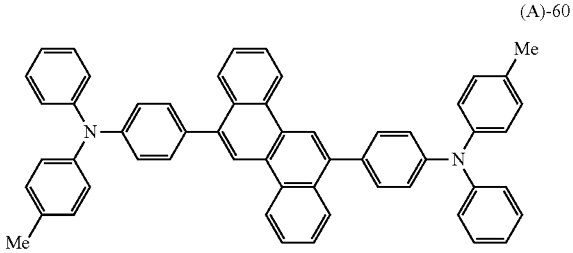
(A)-61
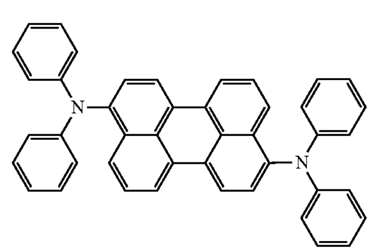

-continued
(A)-62
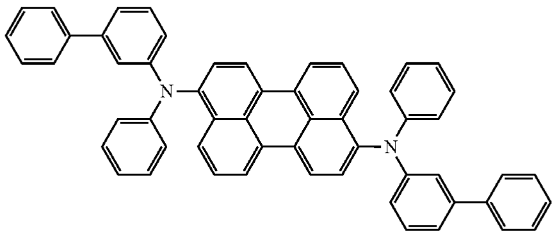
(A)-63
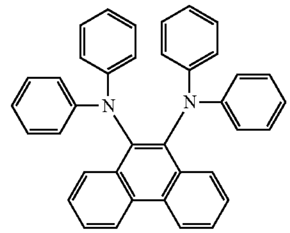
(A)-64
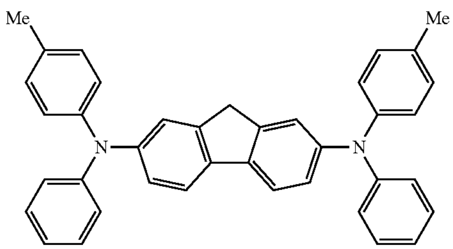
(A)-65
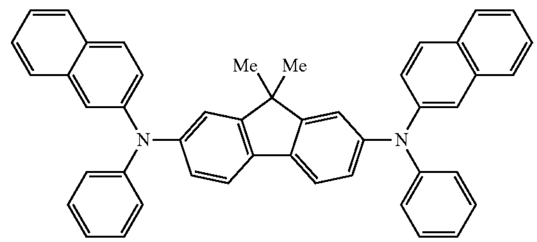
[Chemical Formula 113]
(A)-66
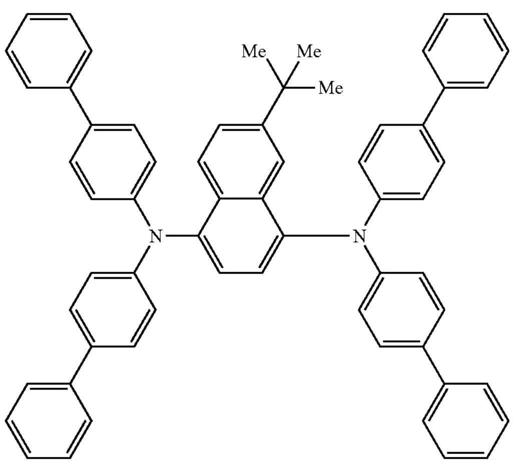
(A)-67
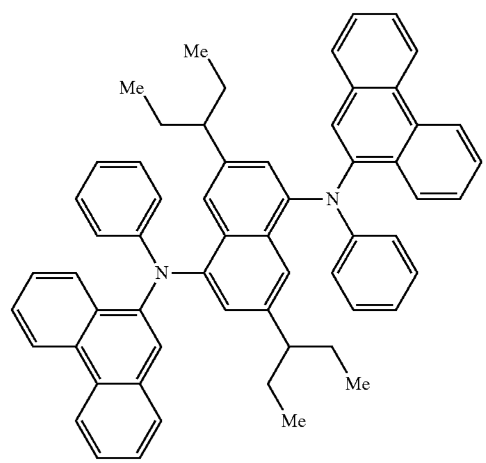
(A)-68
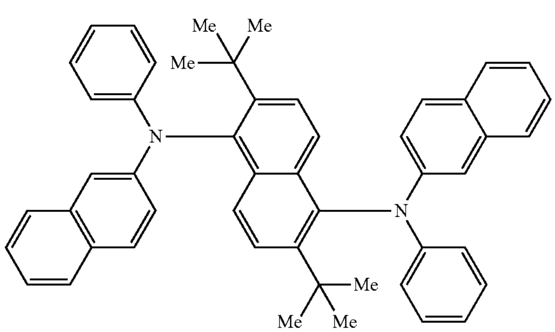
(A)-69
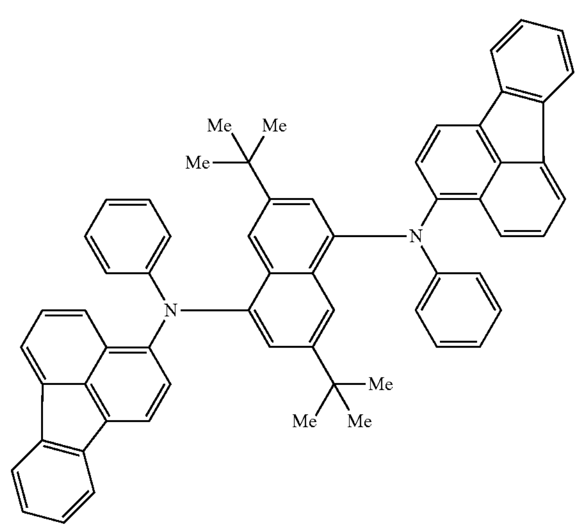

-continued
(A)-70
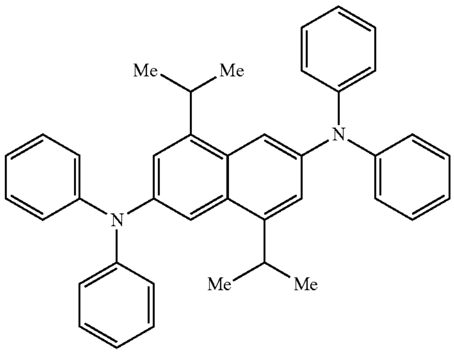
(A)-71
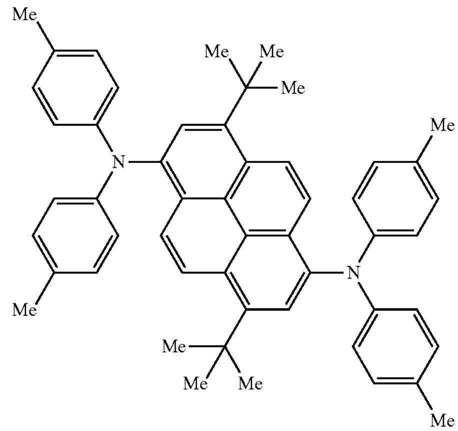
(A)-72
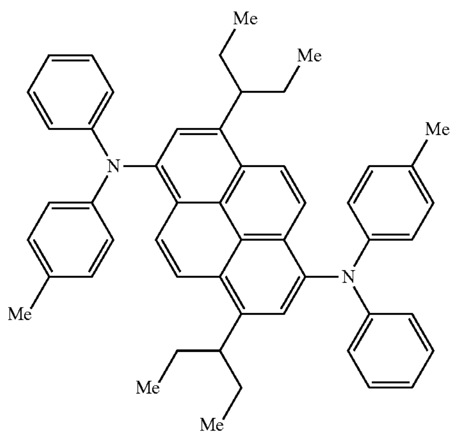
(A)-73
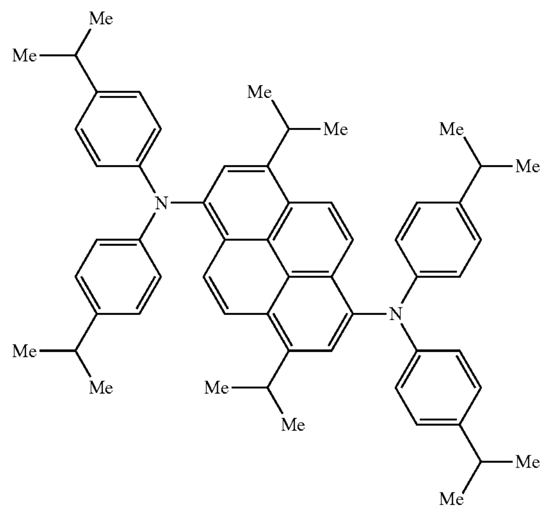
(A)-74
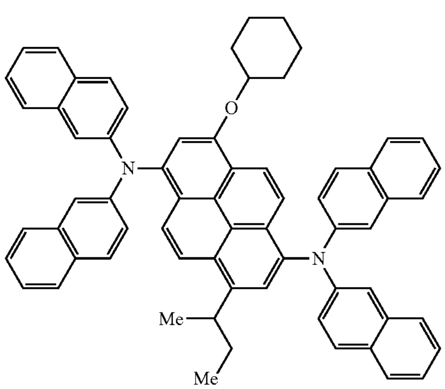
(A)-75
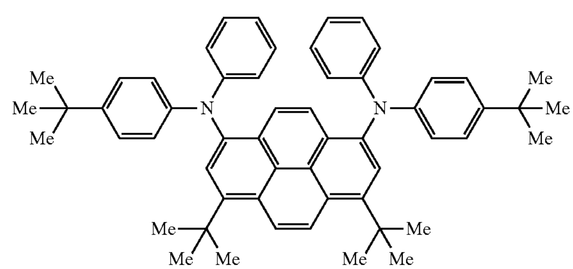

-continued
(A)-76
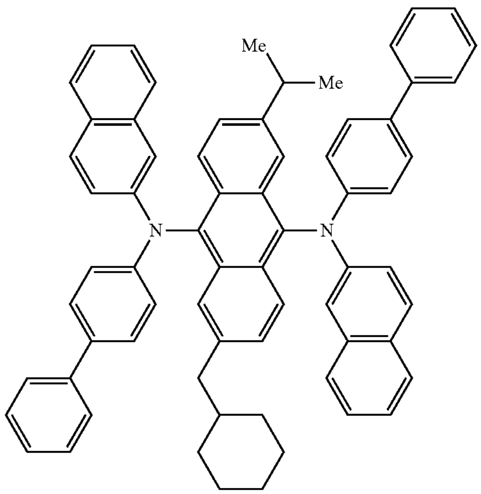
(A)-77
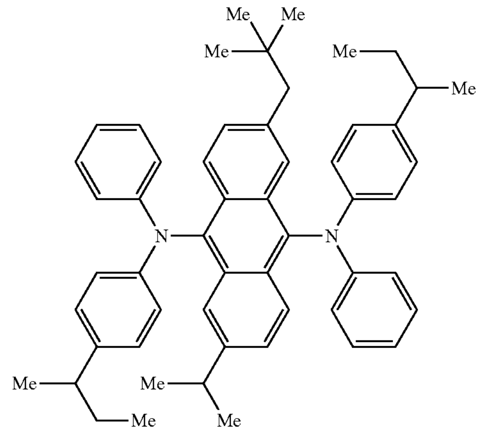
[Chemical Formula 114]
(A)-78
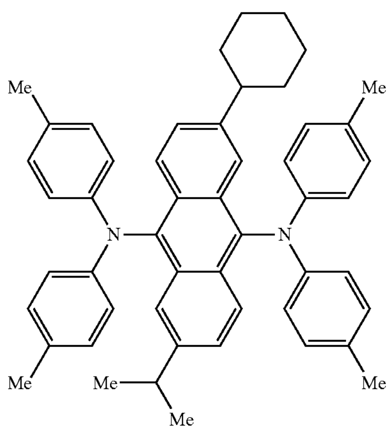
(A)-79
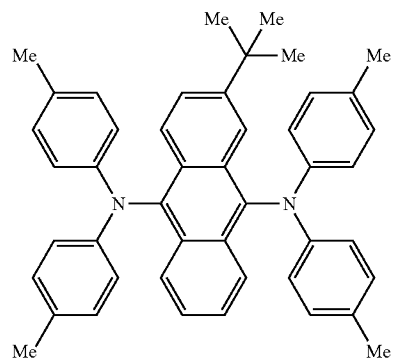
(A)-80
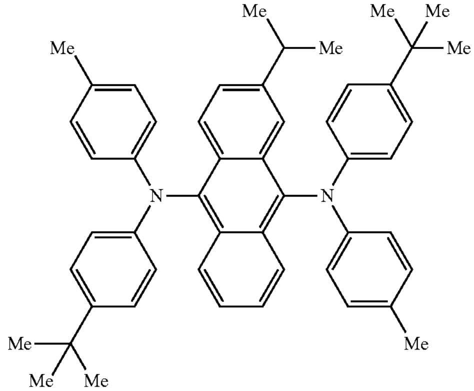
(A)-81
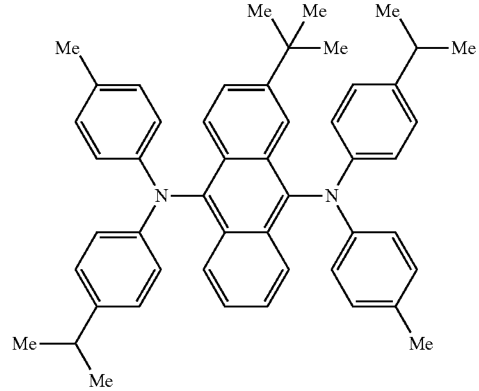

-continued
(A)-82
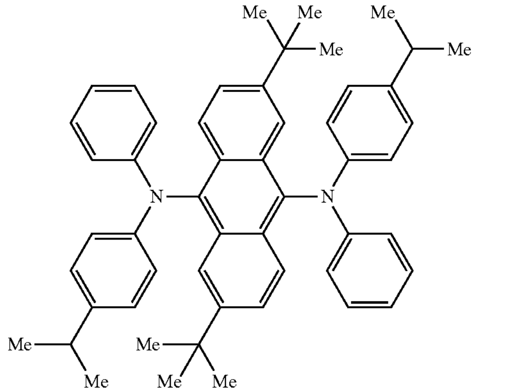
(A)-83
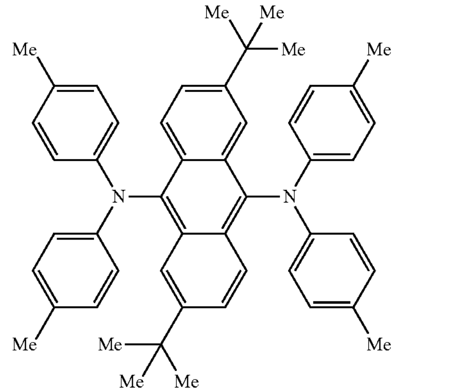
(A)-84
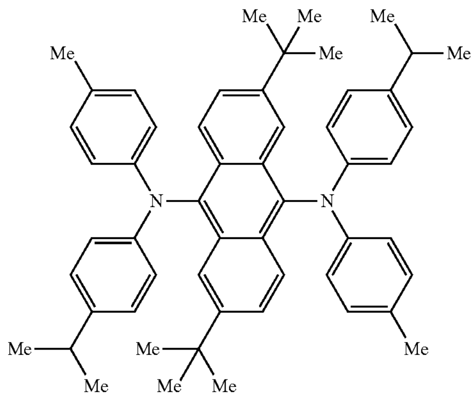
(A)-85
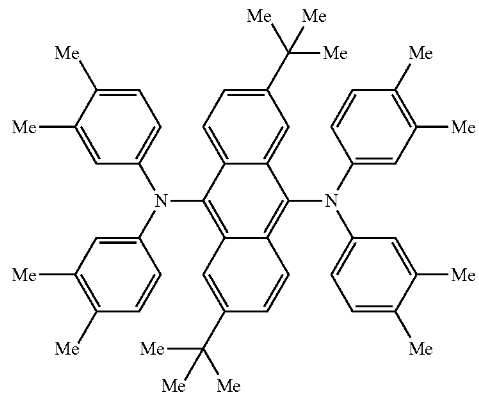
(A)-86
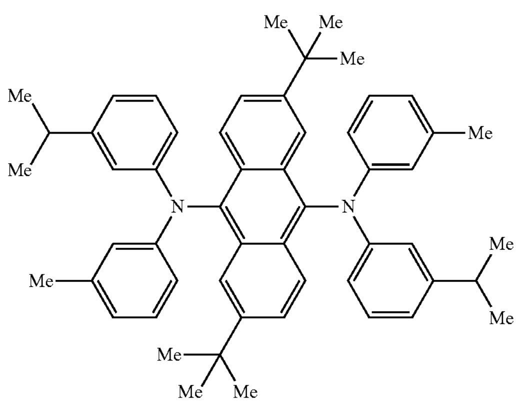
(A)-87
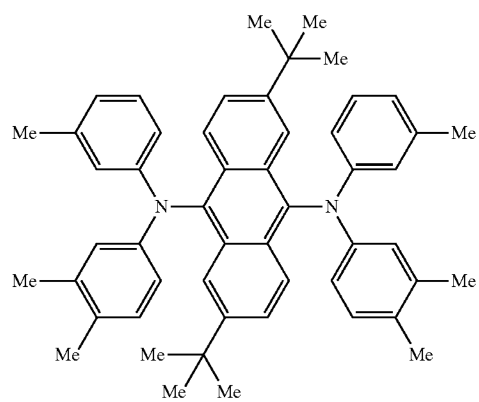
(A)-88
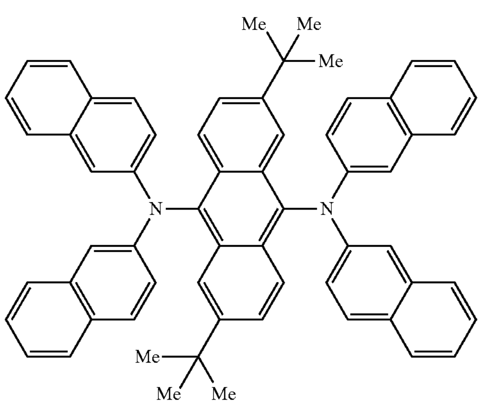
(A)-89
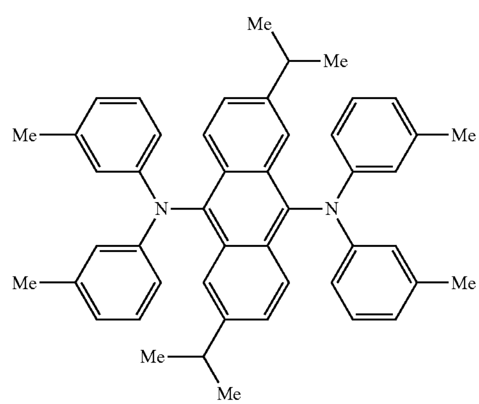

-continued
[Chemical Formula 115]
(A)-90
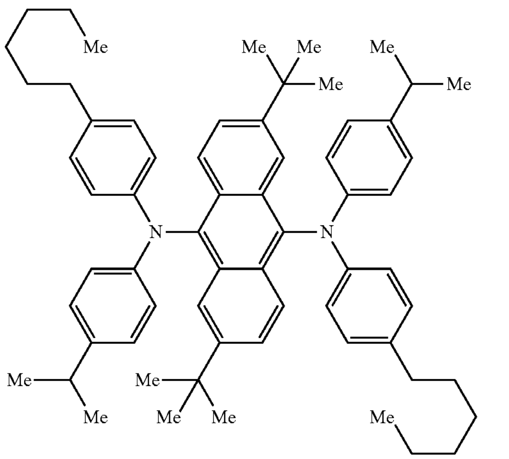
(A)-91
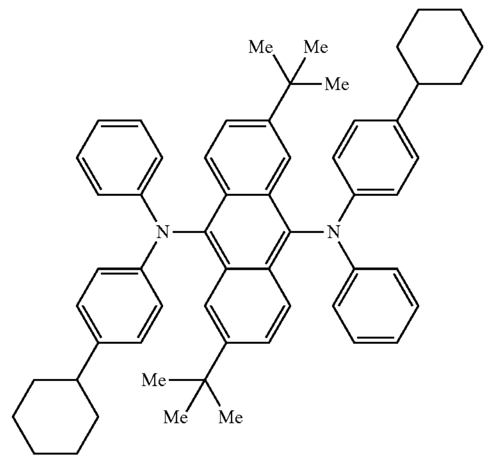
(A)-92
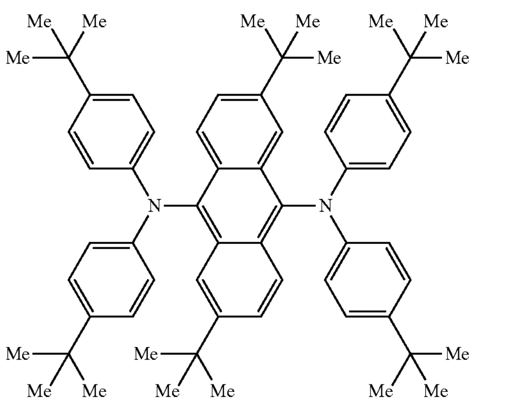
(A)-93
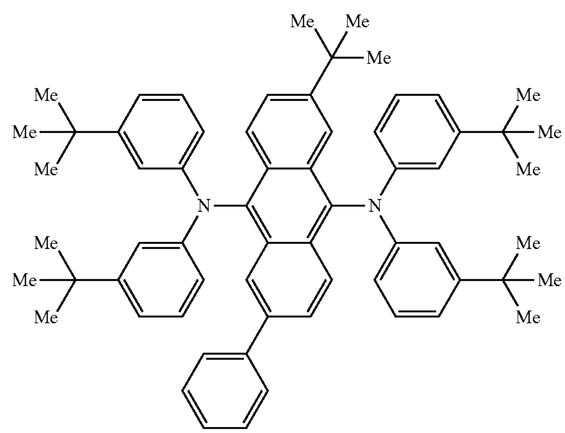
(A)-94
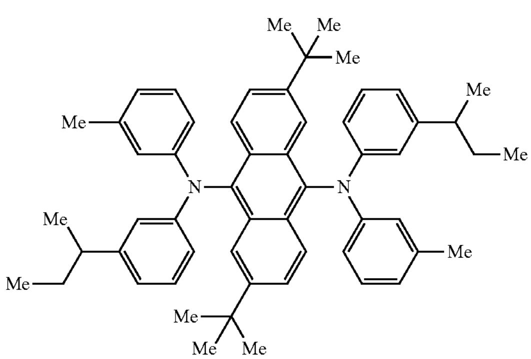
(A)-95
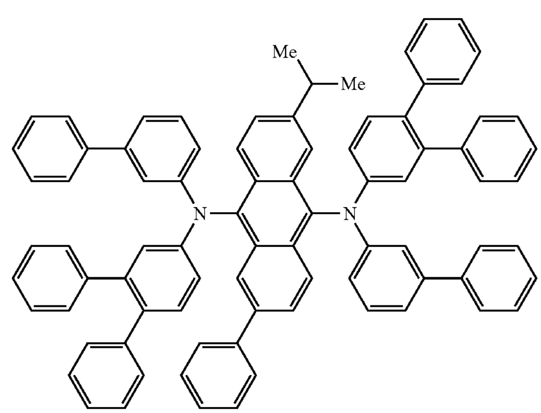

-continued
(A)-96
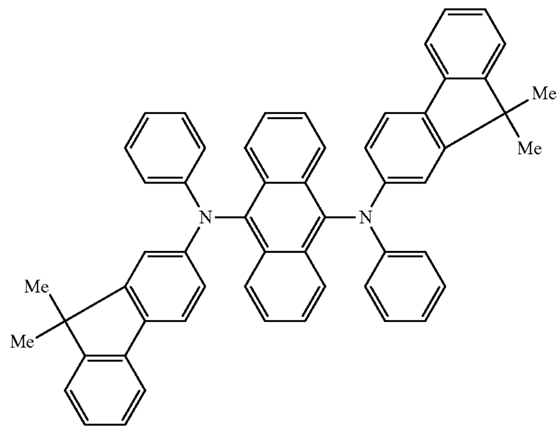
(A)-97
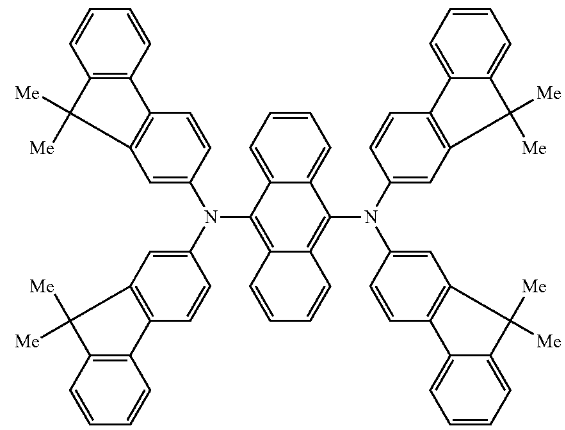
(A)-98
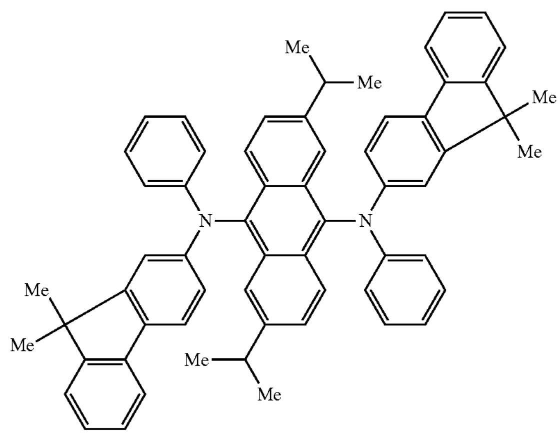
(A)-99
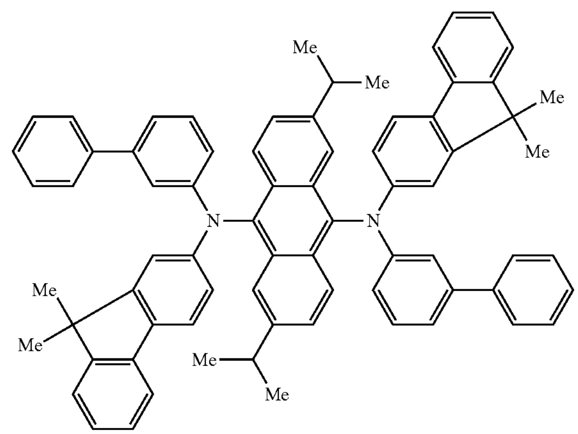
(A)-100
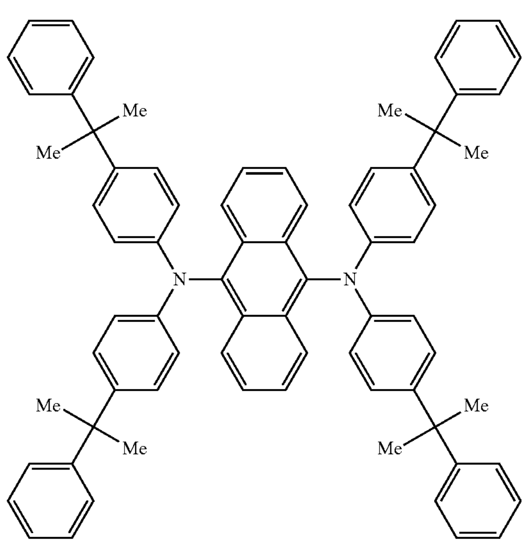

-continued
[Chemical Formula 116]
(A)-101
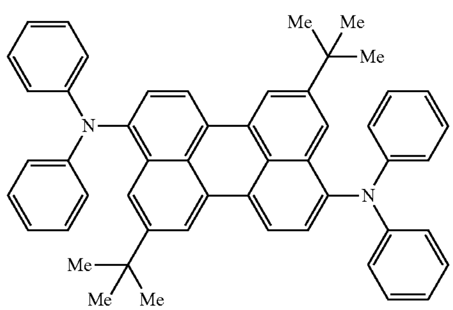
(A)-102
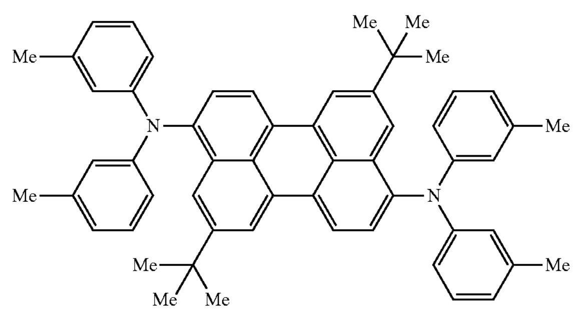
(A)-103
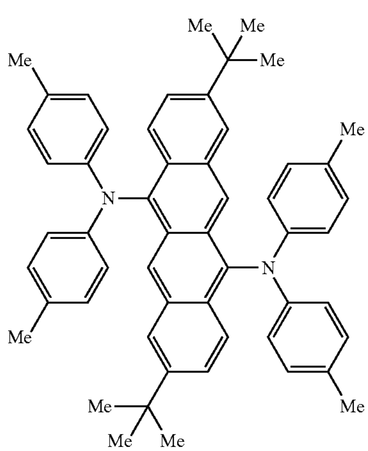
(A)-104
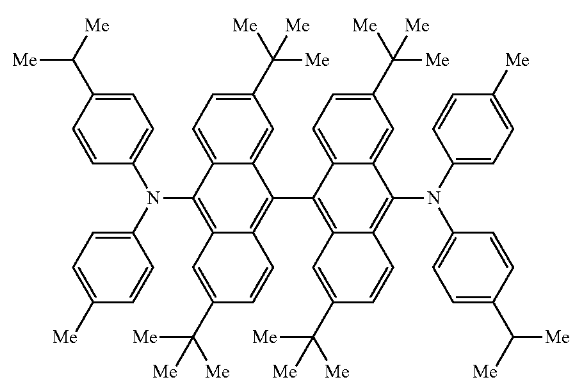
(A)-105
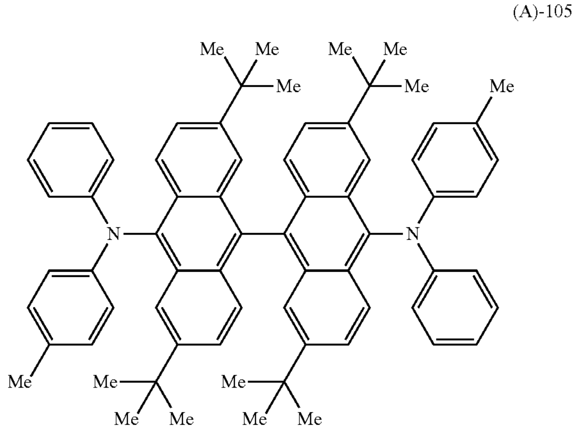
(A)-106
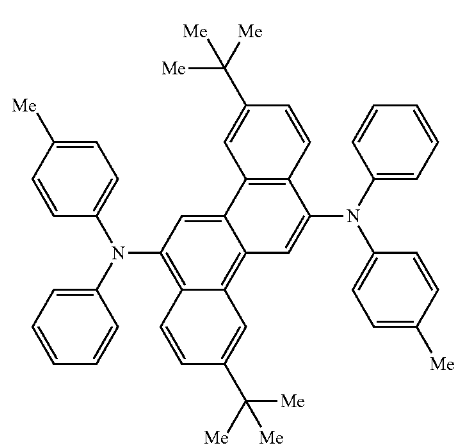

-continued
(A)-107
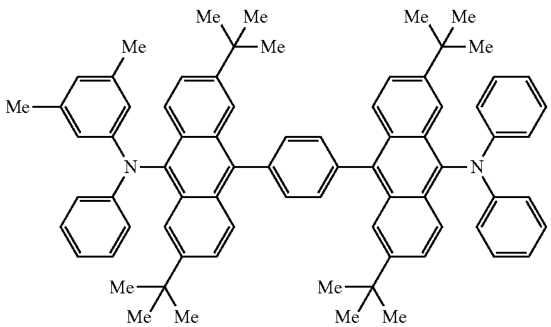
(A)-108
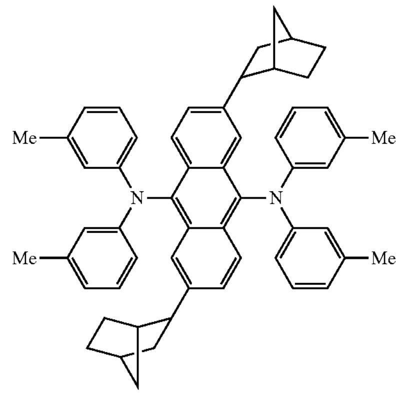
[Chemical Formula 117]
(A)-109
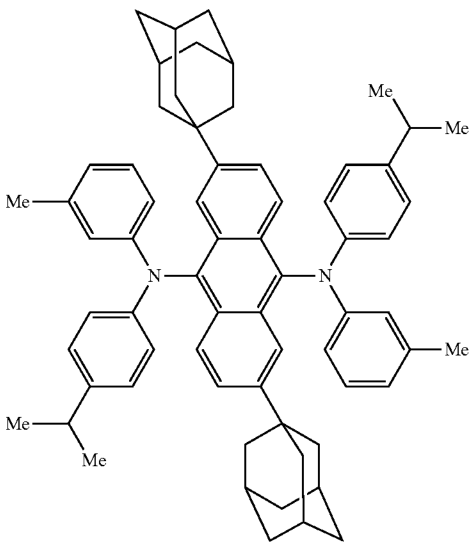
(A)-110
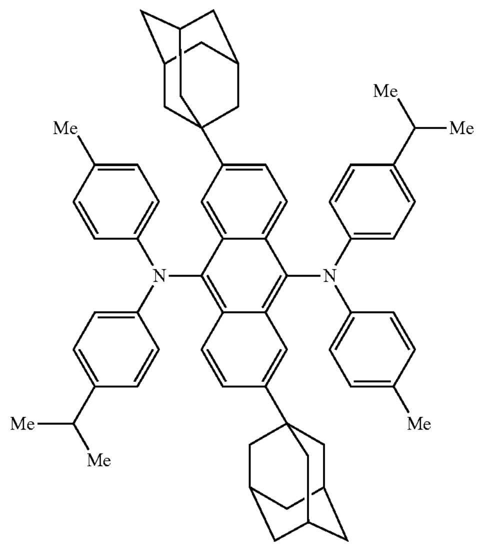
(A)-111
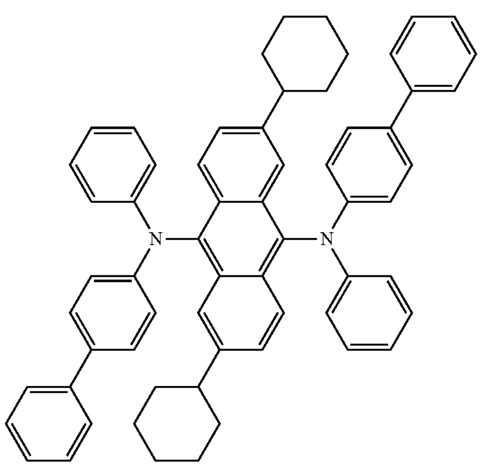
(A)-112
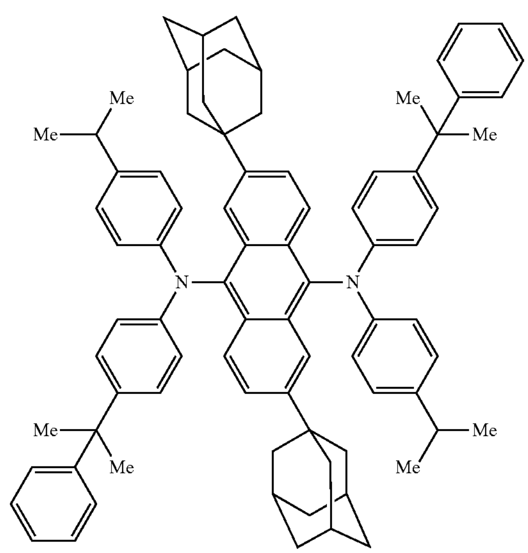

-continued
(A)-113
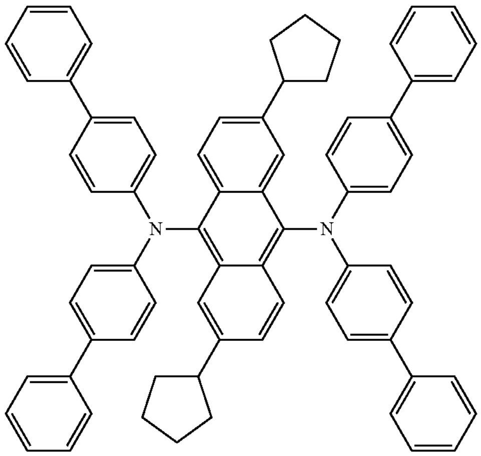
(A)-114
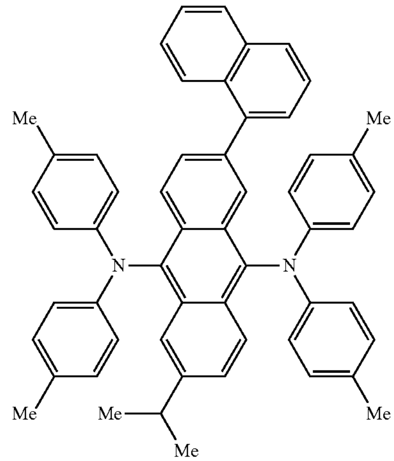
(A)-115
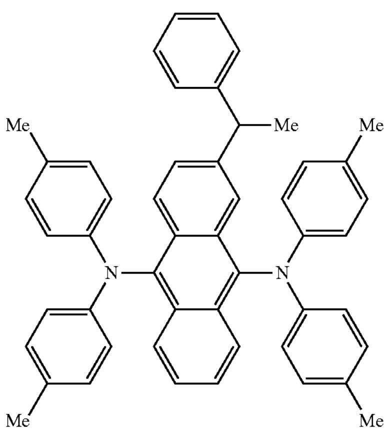
(A)-116
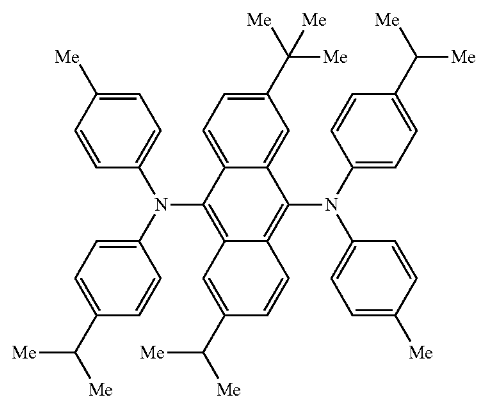
(A)-117
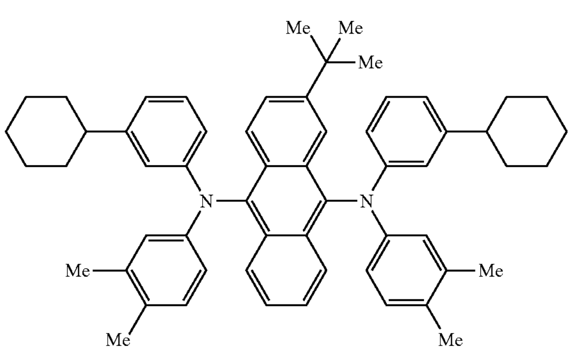

-continued
[Chemical Formula 118]
(A)-118
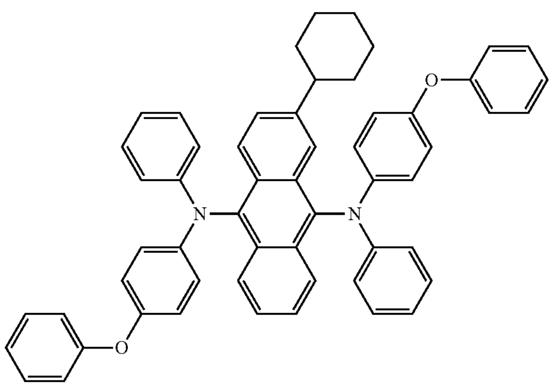
(A)-119
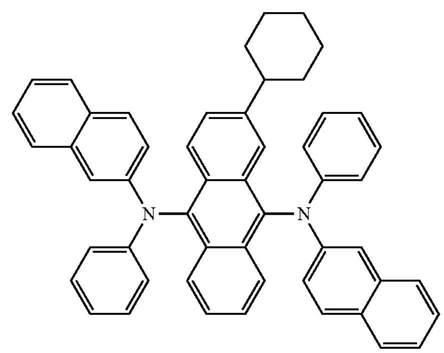
(A)-120
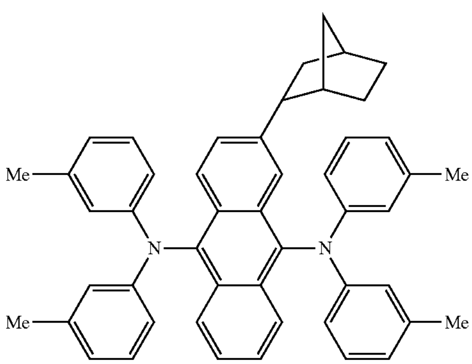
(A)-121
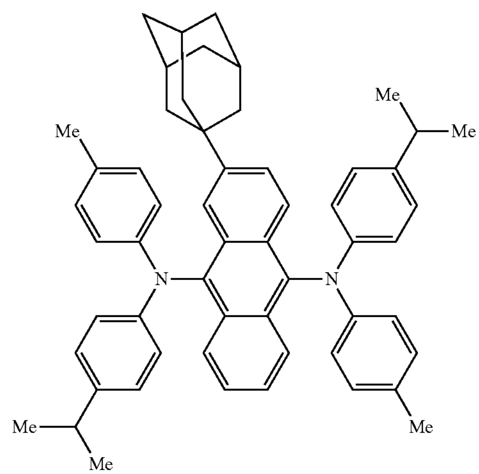
(A)-122
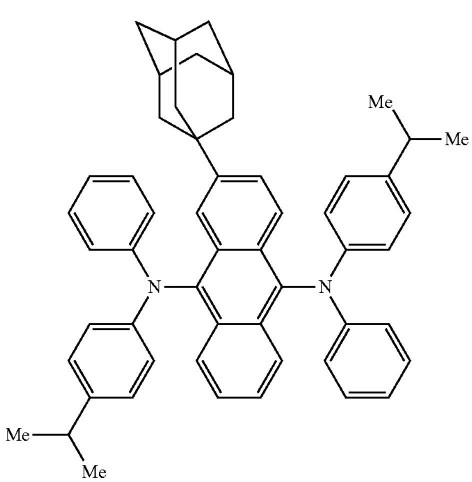
(A)-123
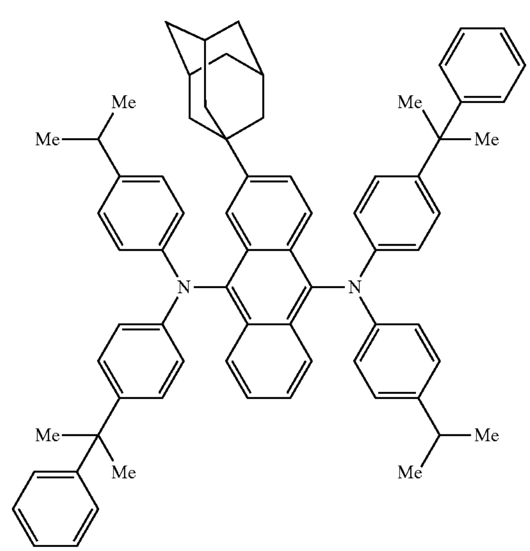

-continued
(A)-124
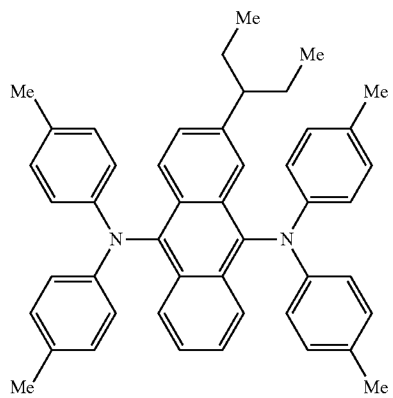
(A)-125
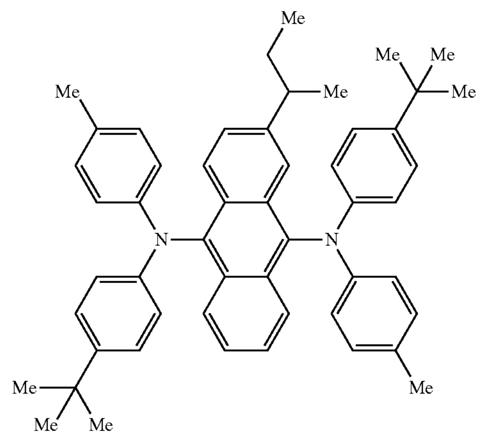
(A)-126
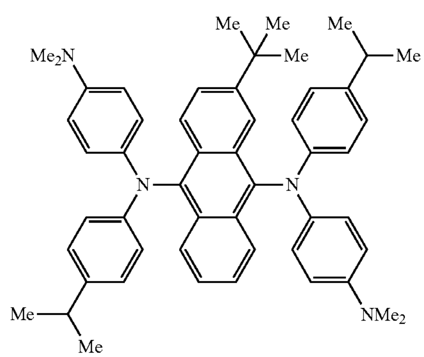
(A)-127
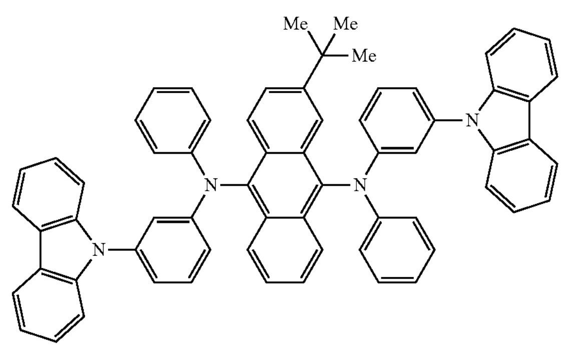
(A)-128
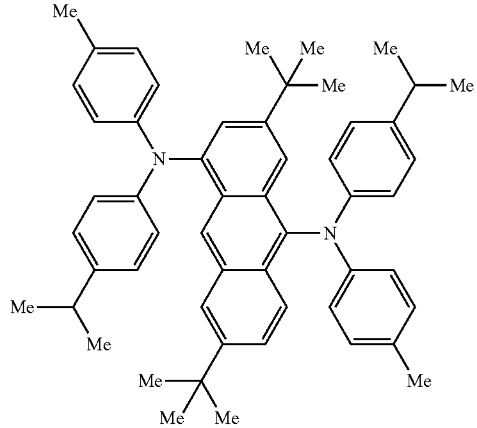
(A)-129
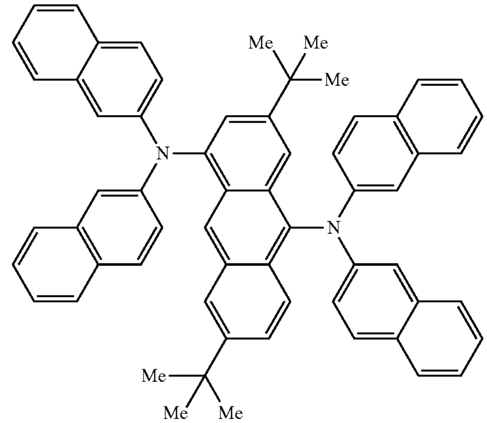

-continued
[Chemical Formula 119]
(A)-130
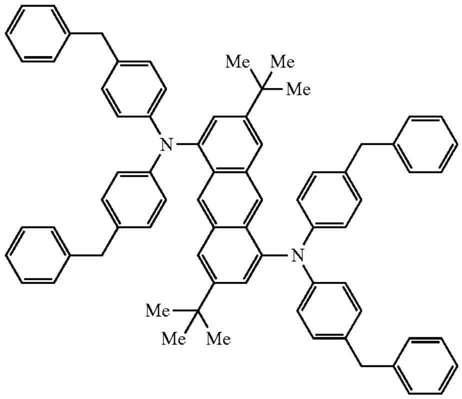
(A)-131
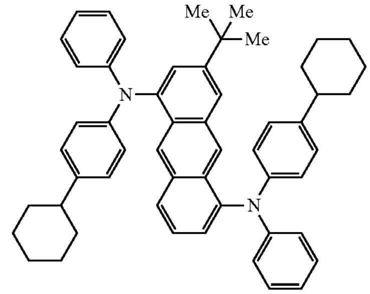
(A)-132
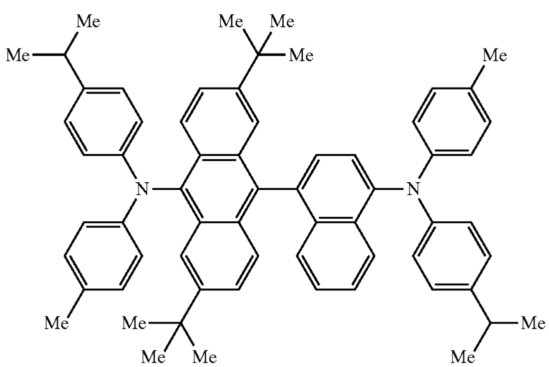
(A)-133
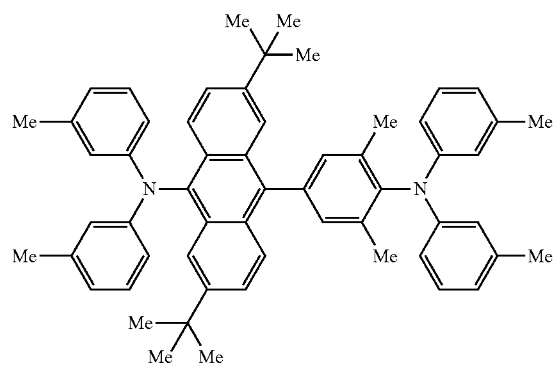
(A)-134
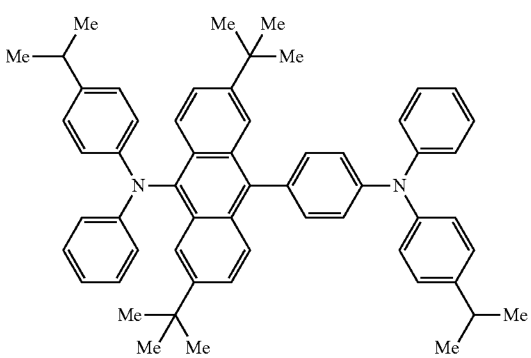
(A)-135
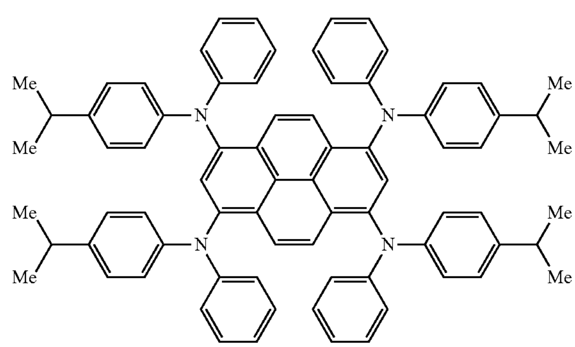
(A)-136
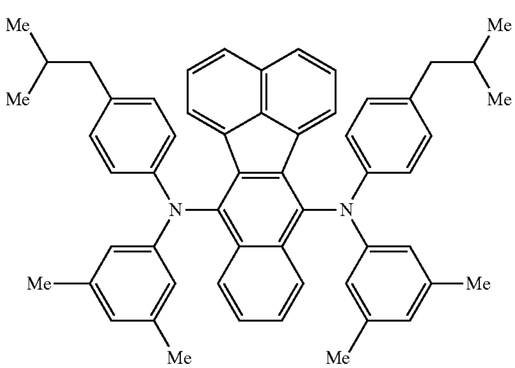
(A)-137
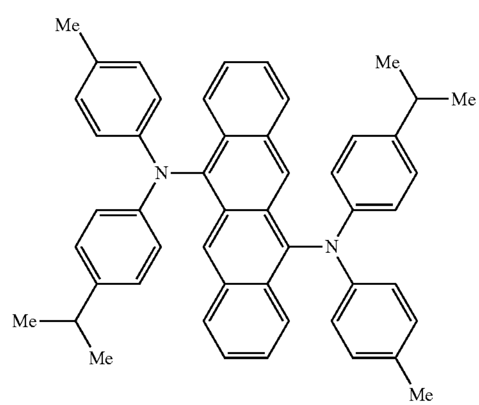

-continued
(A)-138
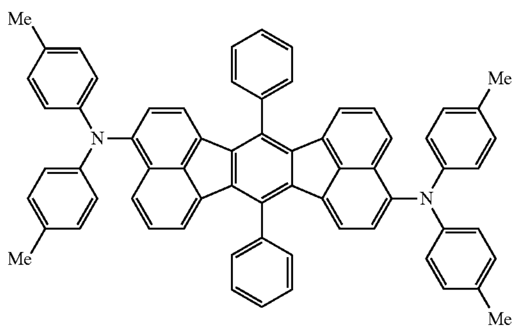
(A)-139
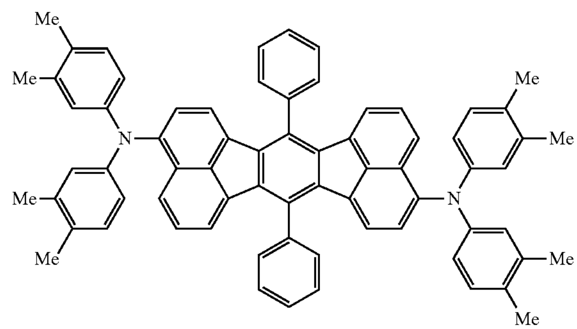
[Chemical Formula 120]
(A)-140
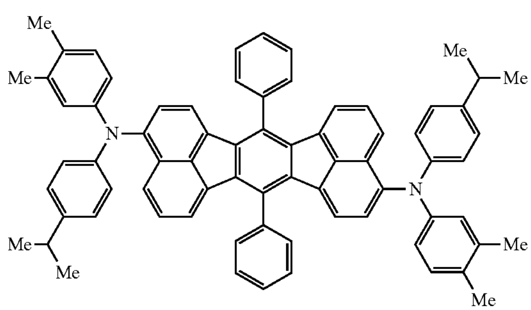
(A)-141
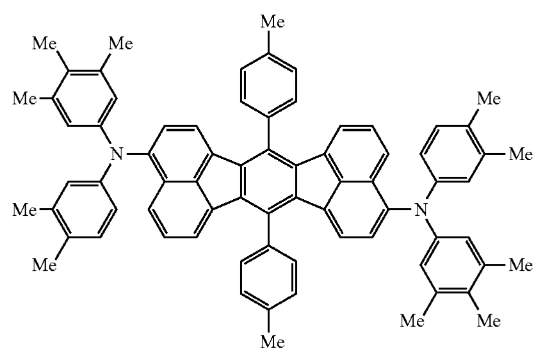
(A)-142
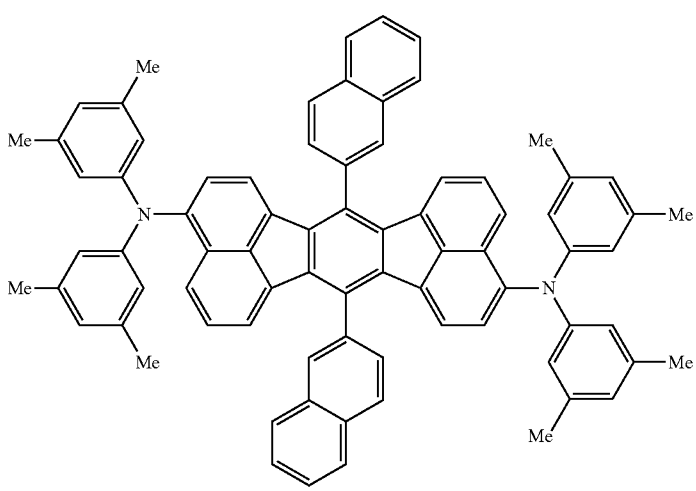

-continued
(A)-143
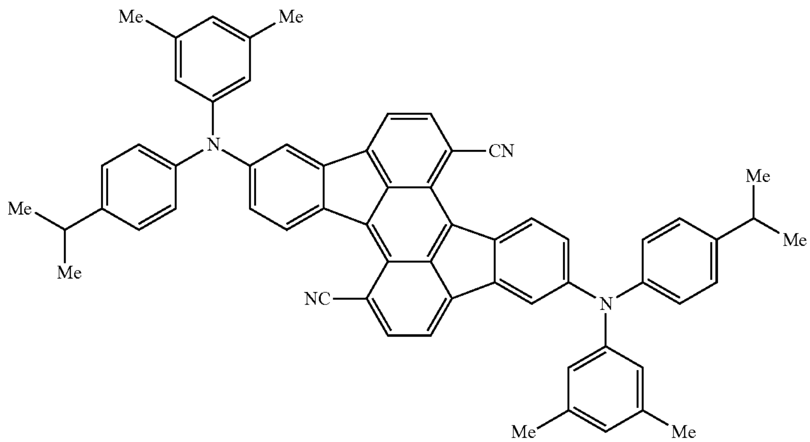
(A)-144
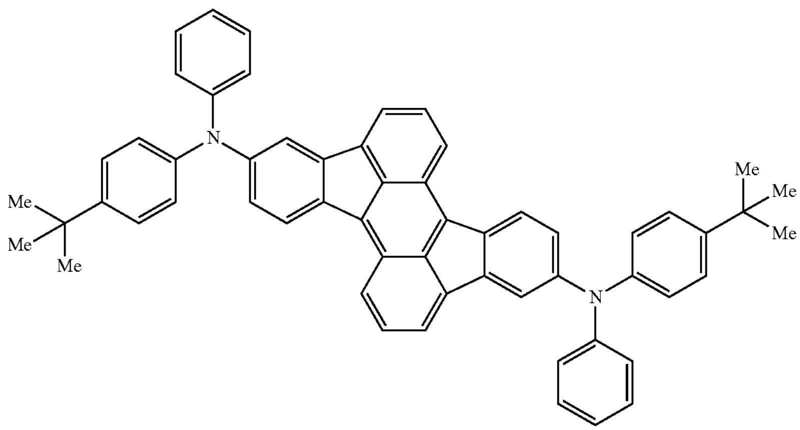
(A)-145
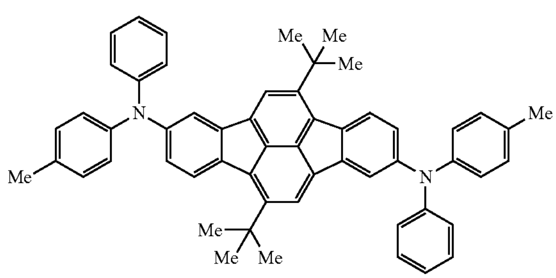
(A)-146
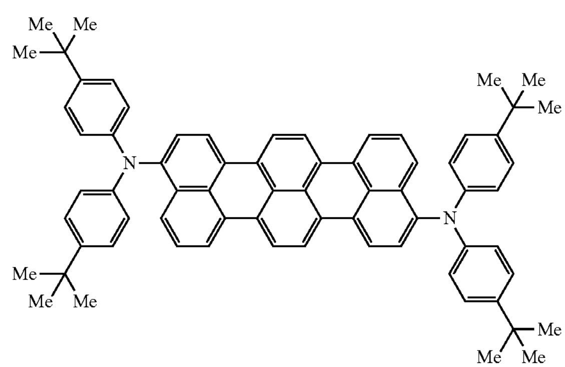
(A)-147
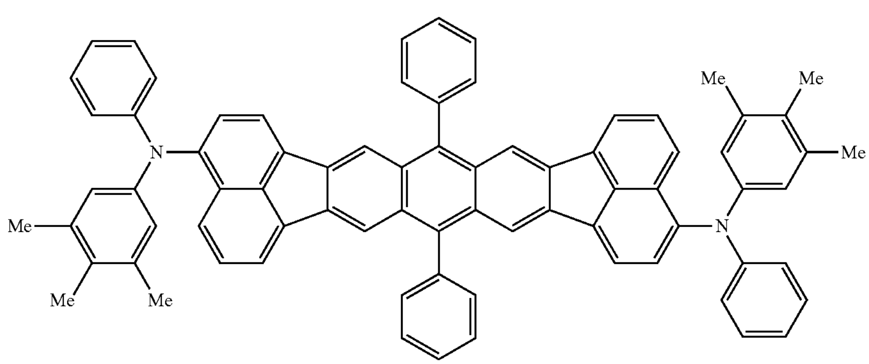

-continued
[Chemical Formula 121]
(A)-148
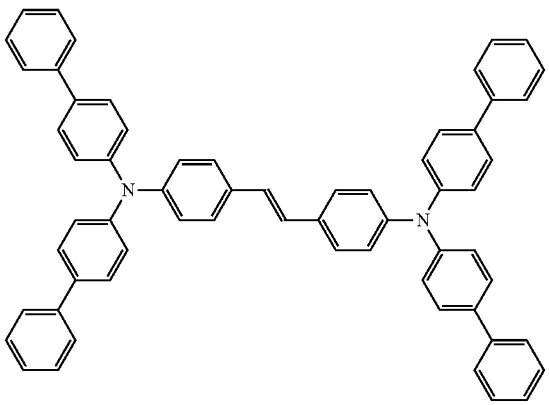
(A)-149
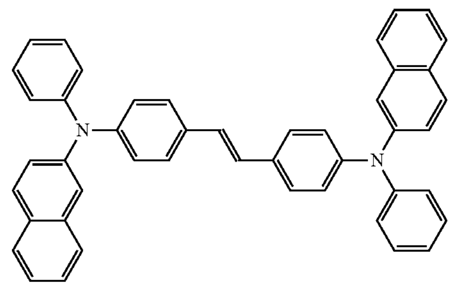
(A)-150
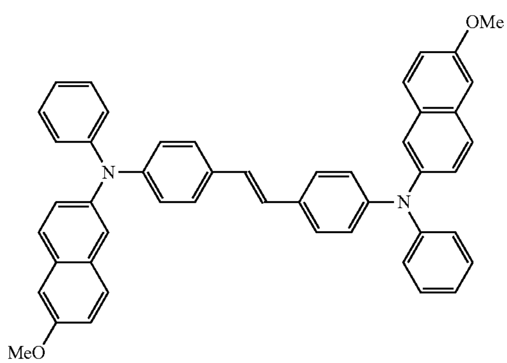
(A)-151
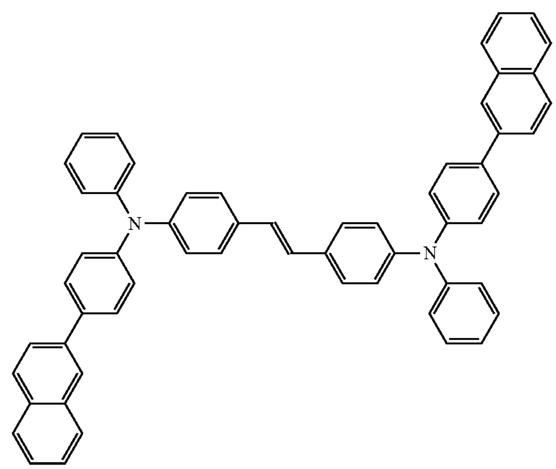
(A)-152
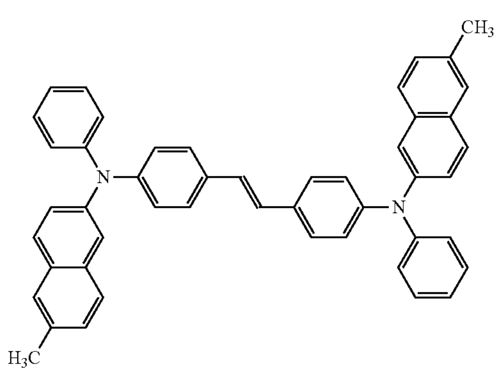
(A)-153
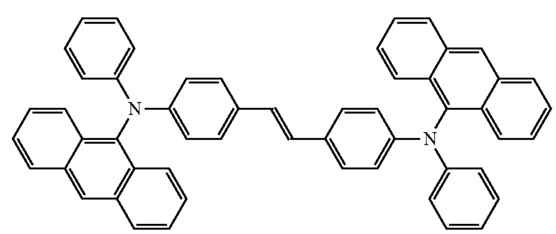

-continued
(A)-154
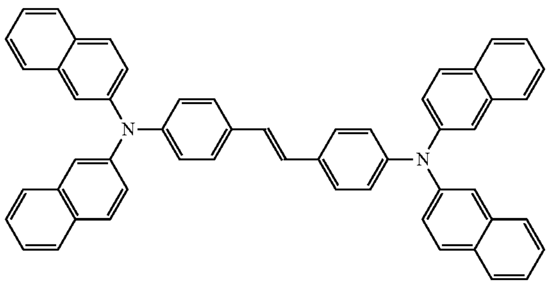
(A)-155
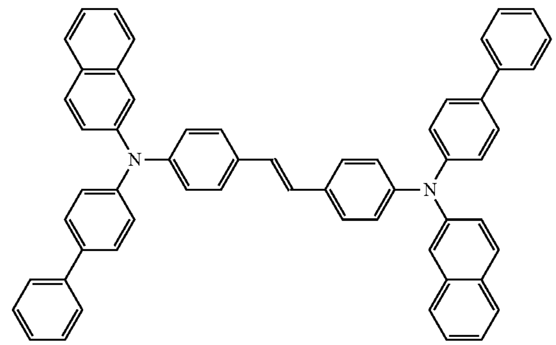
(A)-156
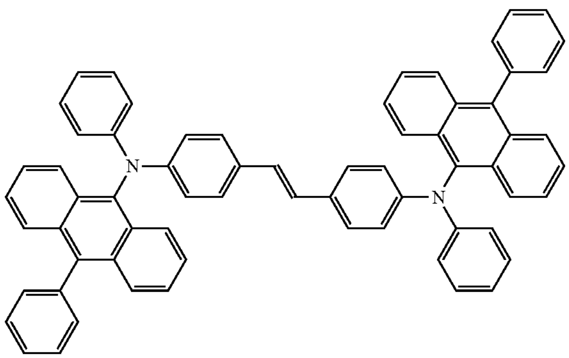
[Chemical Formula 122]
(A)-157
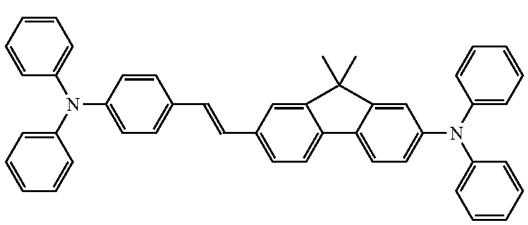
(A)-158
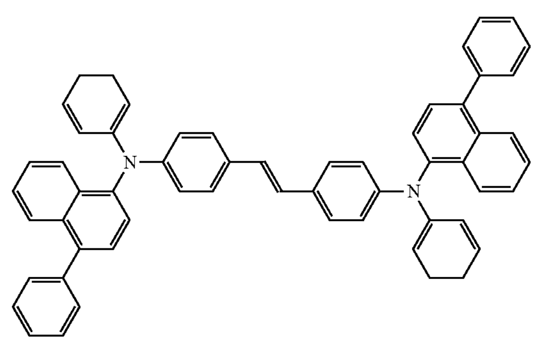
(A)-159
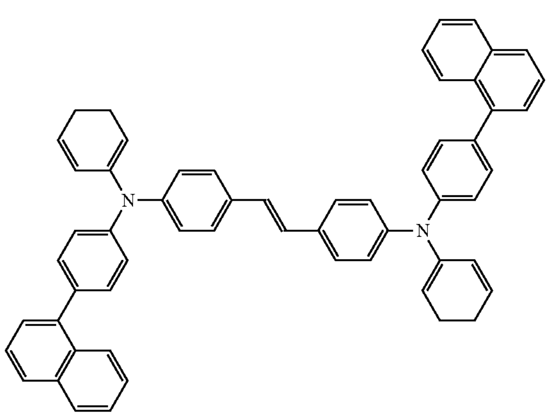
(A)-160
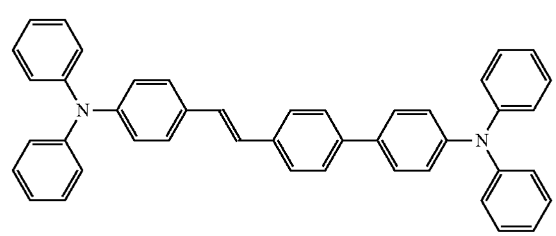

-continued
(A)-161
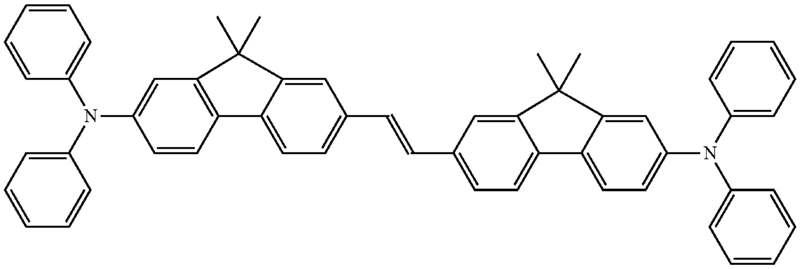
(A)-162
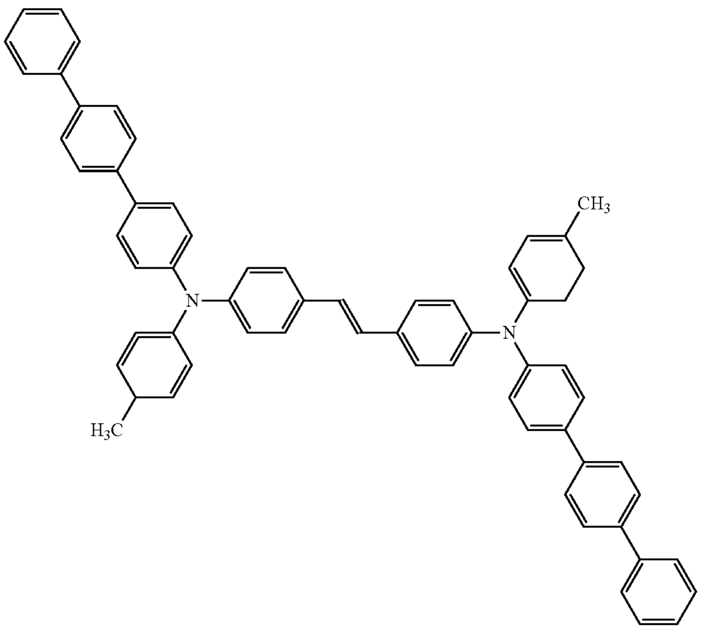
(A)-165
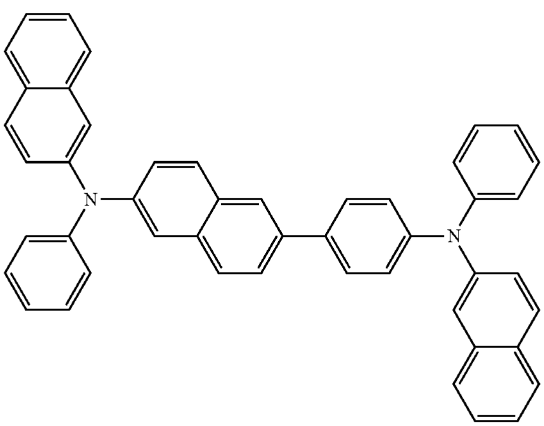
[Chemical Formula 123]
EM32
(A)-166
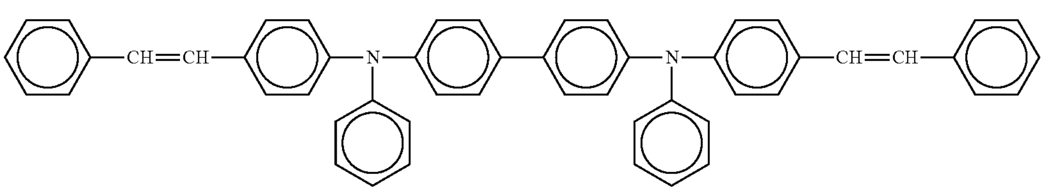

-continued
EM33
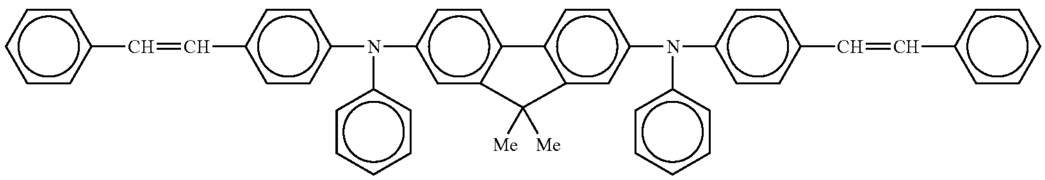
(A)-167
EM34
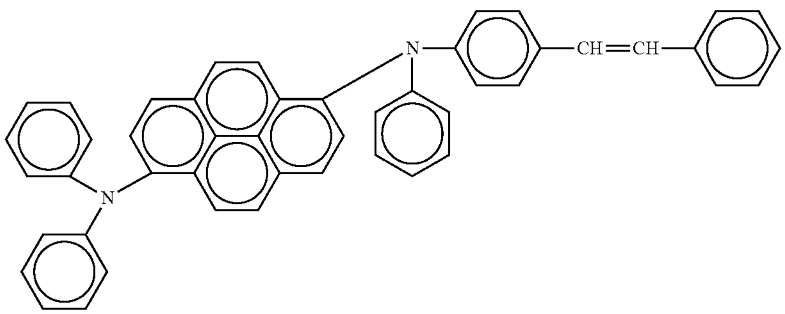
(A)-168
EM35
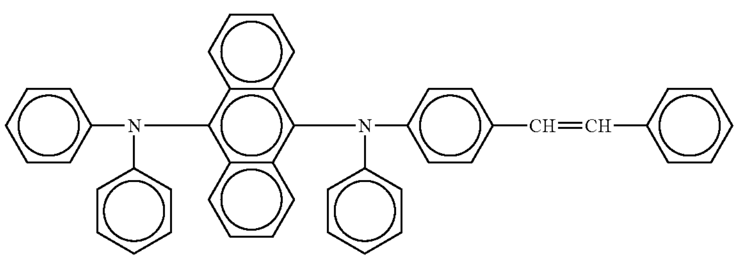
(A)-169
EM36
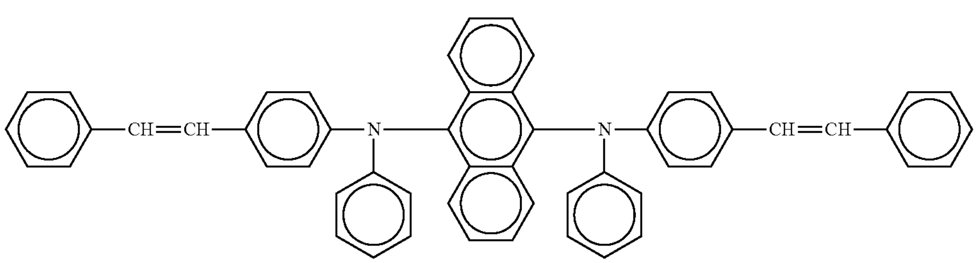
(A)-170
[Chemical Formula 124]
EM41
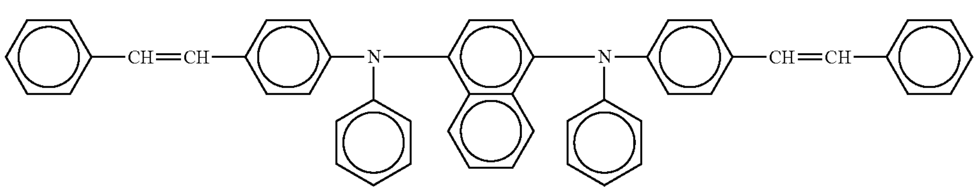
(A)-171

-continued
EM42
(A)-172
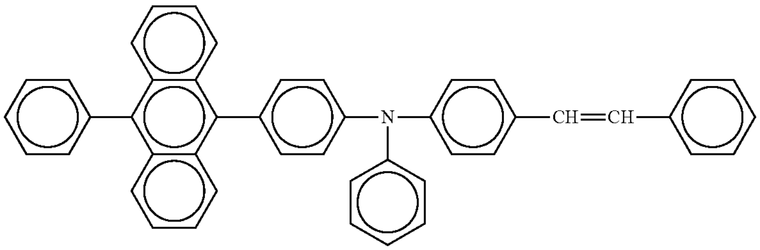
EM43
(A)-173
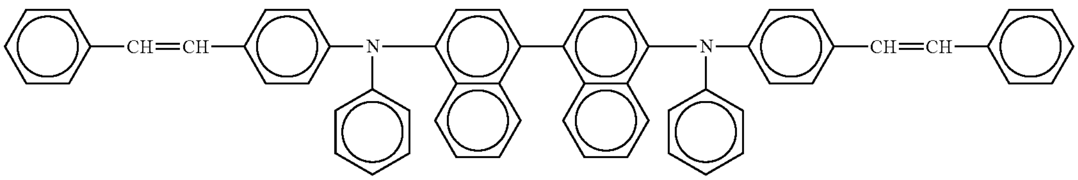
EM44
(A)-174
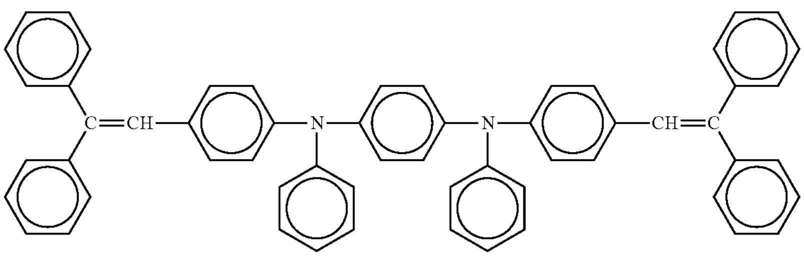
EM45
(A)-175
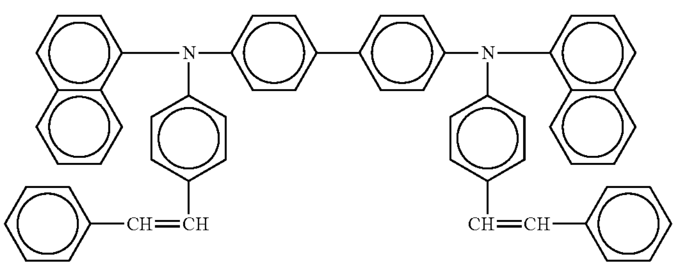
[Chemical Formula 125]
EM46
(A)-176
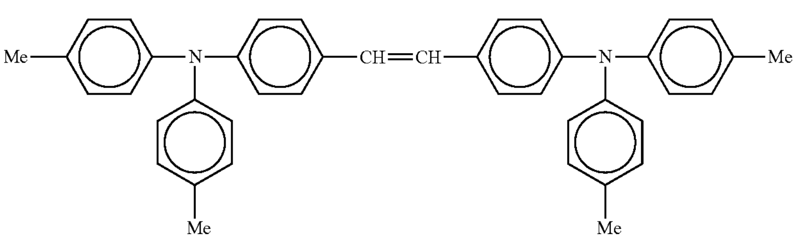

-continued
EM47
(A)-177
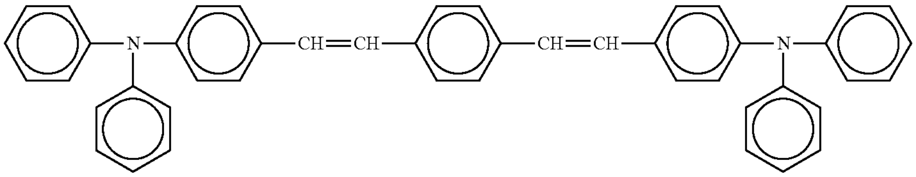
EM48
(A)-178
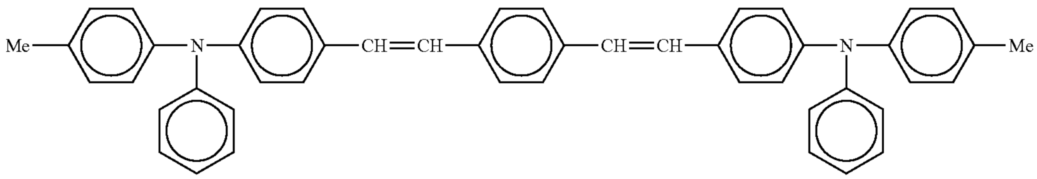
EM49
(A)-179
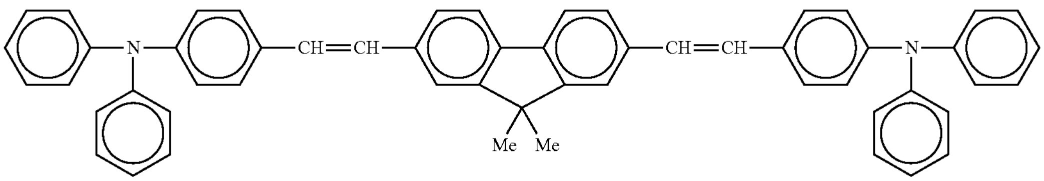
EM50
(A)-180
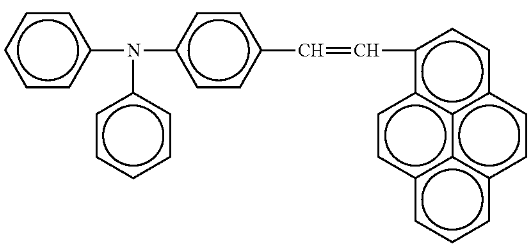
[Chemical Formula 126]
EM51
(A)-181
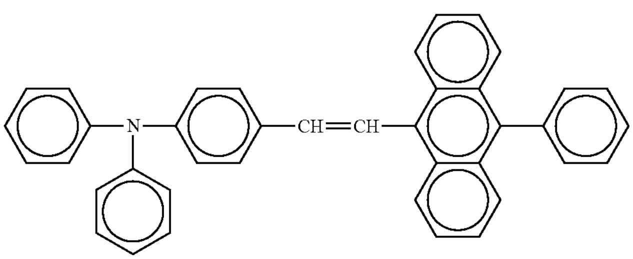
EM52
(A)-182
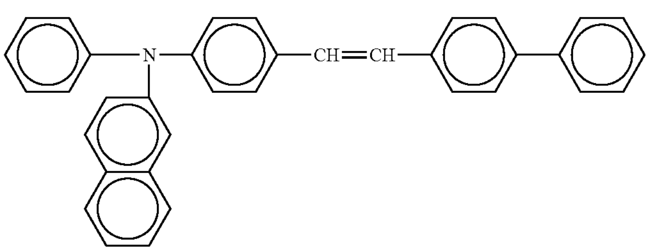

-continued
EM53
(A)-183
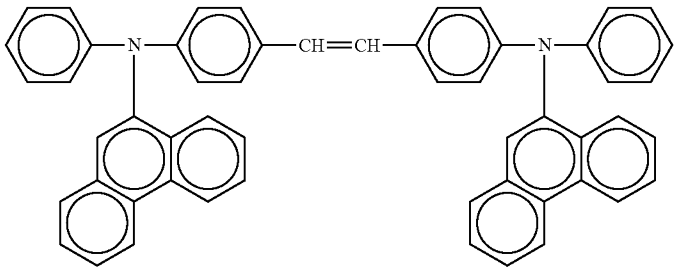
EM54
(A)-184
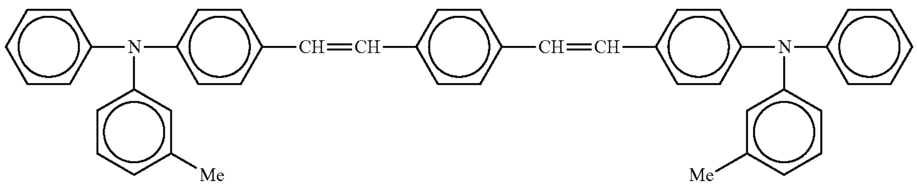
EM55
(A)-185
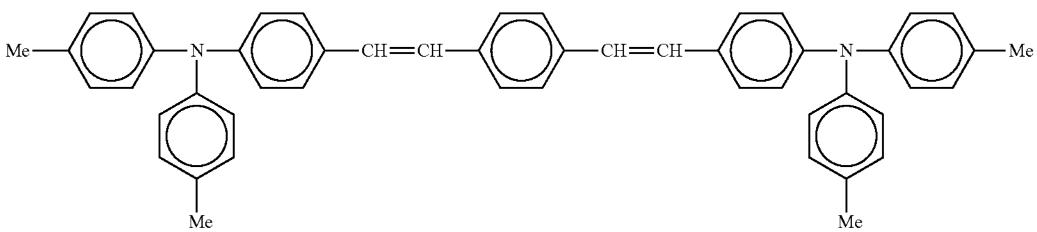
[Chemical Formula 127]
EM56
(A)-186
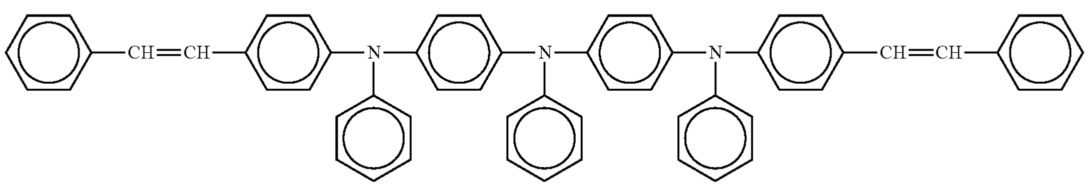
EM57
(A)-187
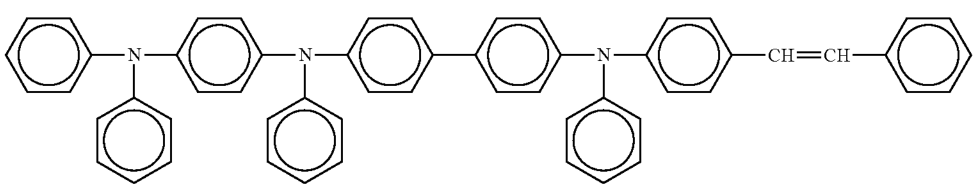
EM58
(A)-188
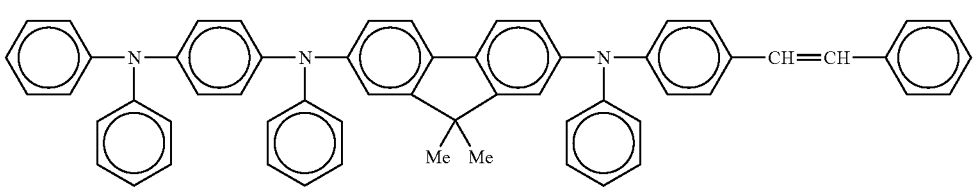

-continued
EM59
(A)-189
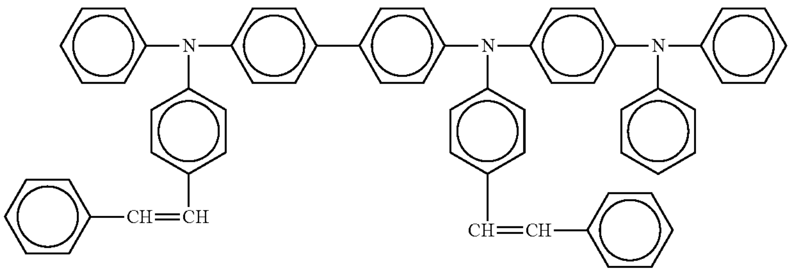
EM60
(A)-190
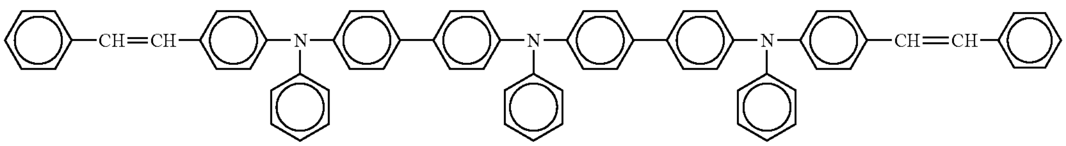
EM61
(A)-191
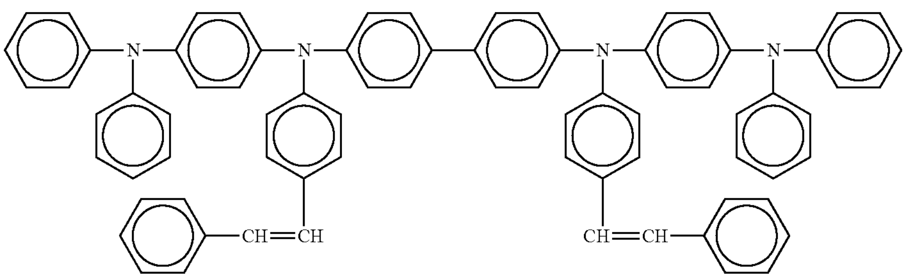
EM62
(A)-192
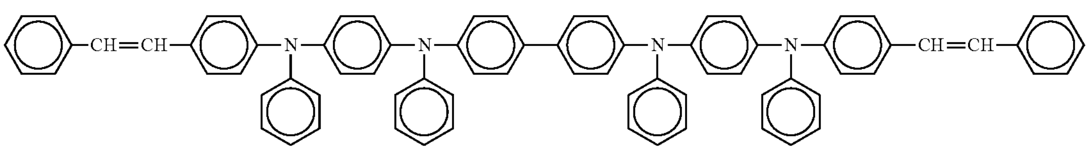
[Chemical Formula 128]
EM63
(A)-193
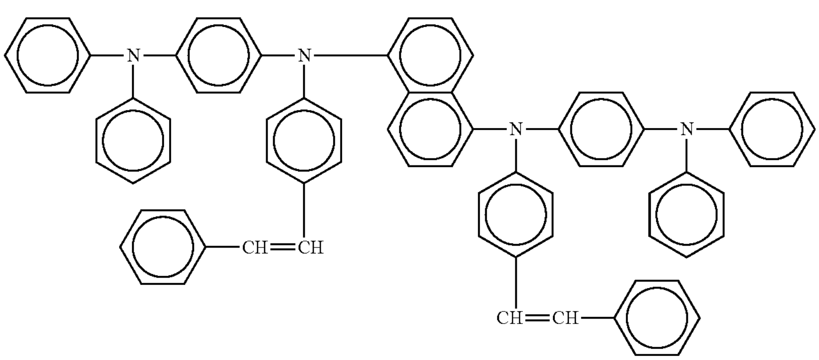

-continued
EM64
(A)-194
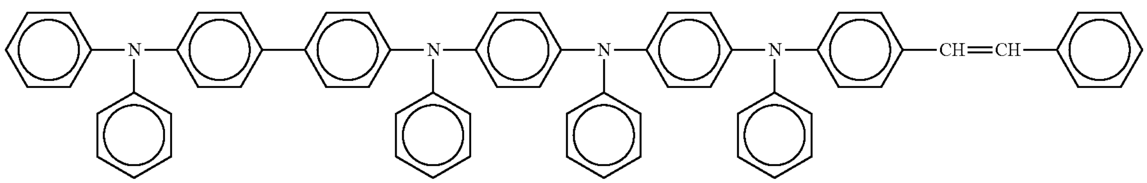
EM65
(A)-195
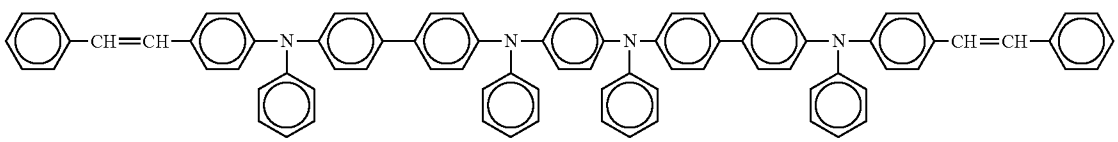
[Chemical Formula 129]
(A)-196
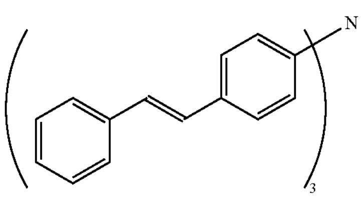
(A)-197
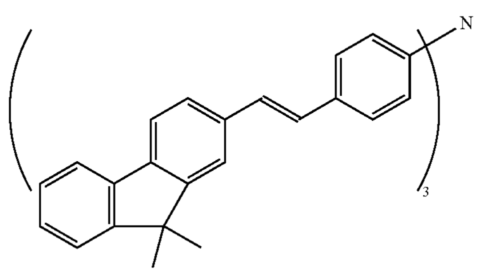
(A)-198
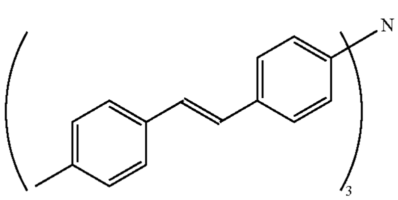
(A)-199
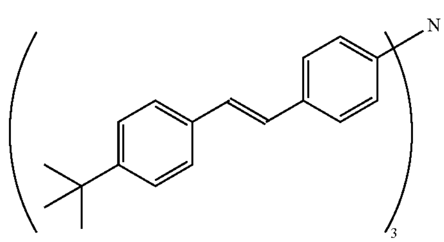
(A)-201
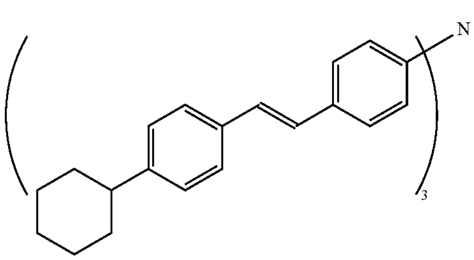
(A)-202
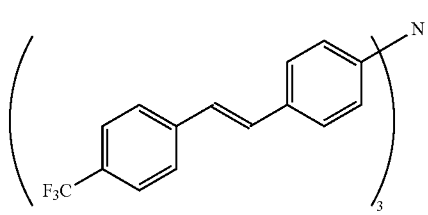

-continued (A)-203

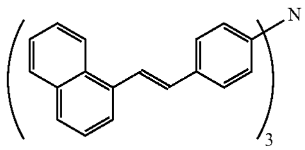

(A)-204

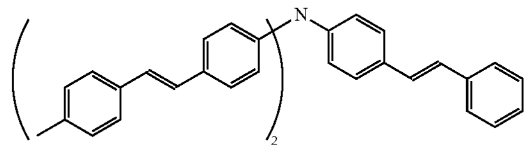

Compounds containing a carbazole group such as those shown below may be used.

[Chemical Formula 130]

(A)-163

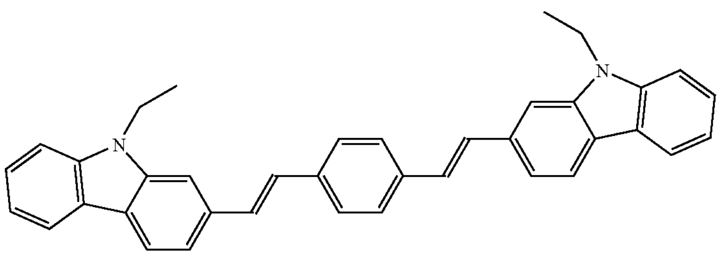

(A)-164

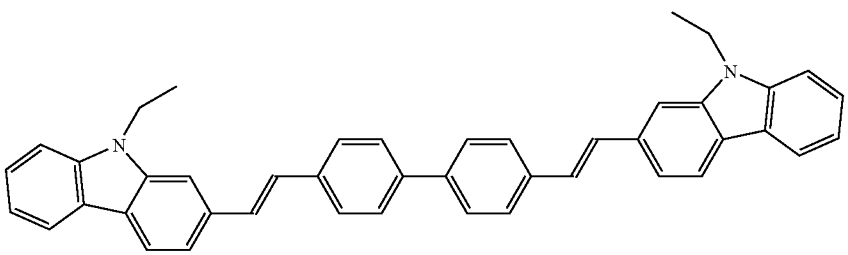

Preferably in the aspect of the invention, the fluorescent dopant is a fluoranthene derivative represented by any one of the following formulae (21) to (24).

[Chemical Formula 131]

(21)

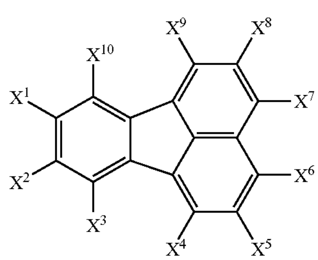

(22)

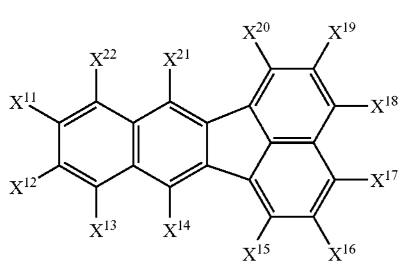

-continued (23)

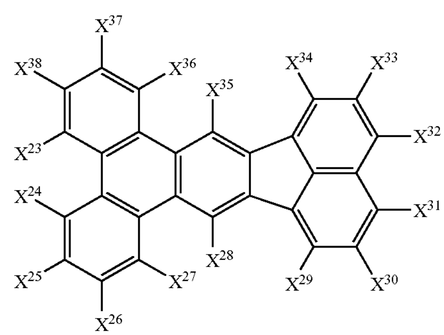

(24)

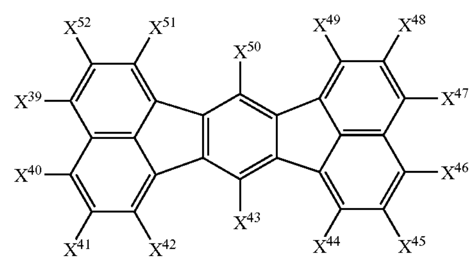

In the formulae (21) to (24), $X^1$ to $X^{52}$ each independently represent a hydrogen atom, halogen atom, substituted or unsubstituted linear, branched or cyclic alkyl group having 1 to 30 carbon atoms, substituted or unsubstituted linear, branched or cyclic alkoxy group having 1 to 30 carbon atoms, substituted or unsubstituted linear, branched or cyclic alkylthio group having 1 to 30 carbon atoms, substituted or unsubstituted linear, branched or cyclic alkenyl group having 2 to 30 carbon atoms, substituted or unsubstituted linear, branched or cyclic alkenyloxy group having 2 to 30 carbon atoms, substituted or unsubstituted linear, branched or cyclic alkenylthio group having 2 to 30 carbon atoms, substituted or unsubstituted aralkyl group having 7 to 30 carbon atoms, substituted or unsubstituted aralkyloxy group having 7 to 30 carbon atoms, substituted or unsubstituted aralkylthio group having 7 to 30 carbon atoms, substituted or unsubstituted aryl group having 6 to 20 carbon atoms, substituted or unsubstituted aryloxy group having 6 to 20 carbon atoms, substituted or unsubstituted arylthio having 6 to 20 carbon atoms, substituted or unsubstituted amino group having 2 to 30 carbon atoms, cyano group, silyl group, hydroxyl group, —$COOR^{1e}$ group wherein $R^{1e}$ represents a hydrogen atom, substituted or unsubstituted linear, branched or cyclic alkyl group having 1 to 30 carbon atoms, substituted or unsubstituted linear, branched or cyclic alkenyl group having 2 to 30 carbon atoms, substituted or unsubstituted aralkyl group having 7 to 30 carbon atoms or substituted or unsubstituted aryl group having 6 to 30 carbon atoms, —$COR^{2e}$ group wherein $R^{2e}$ represents a hydrogen atom, substituted or unsubstituted linear, branched or cyclic alkyl group having 1 to 30 carbon atoms, substituted or unsubstituted linear, branched or cyclic alkenyl group having 2 to 30 carbon atoms, substituted or unsubstituted aralkyl group having 7 to 30 carbon atoms, substituted or unsubstituted aryl group having 6 to 30 carbon atoms or amino group, or —$OCOR^{3e}$ group wherein $R^{3e}$ represents a substituted or unsubstituted linear, branched or cyclic alkyl group having 1 to 30 carbon atoms, substituted or unsubstituted linear, branched or cyclic alkenyl group having 2 to 30 carbon atoms, substituted or unsubstituted aralkyl group having 7 to 30 carbon atoms, or substituted or unsubstituted aryl group having 6 to 30 carbon atoms; an adjacent set of groups of $X^1$ to $X^{52}$ and an adjacent set of substituents of $X^1$ to $X^{52}$ may be bonded together to form a substituted or unsubstituted carbocycle.

Examples of the fluoranthene derivative are those represented by the following formulae.

[Chemical Formula 132]

1-1

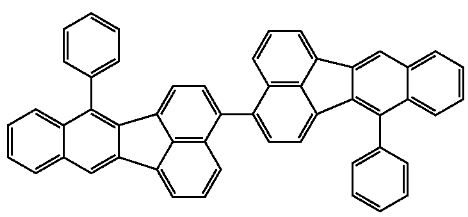

1-2

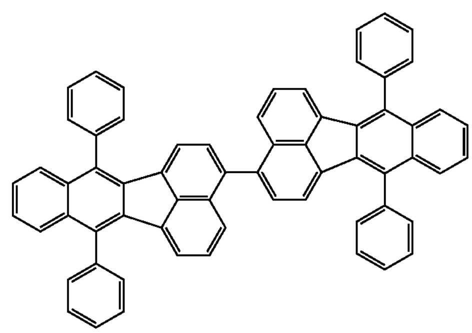

1-3

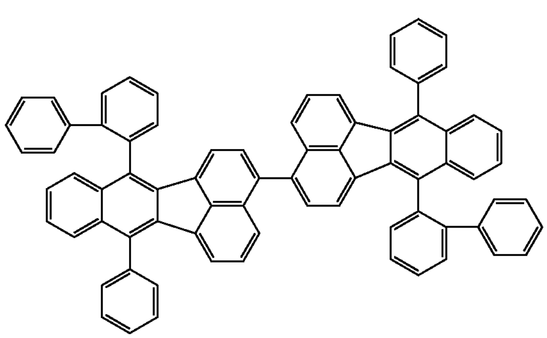

1-4

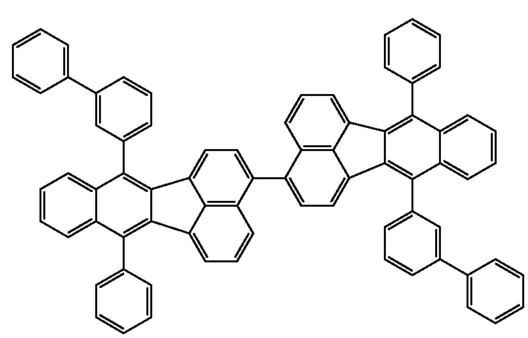

-continued
1-5
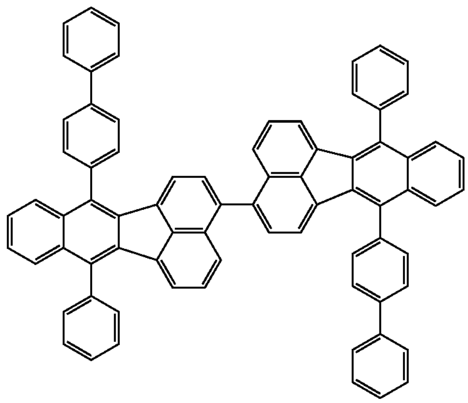
1-6
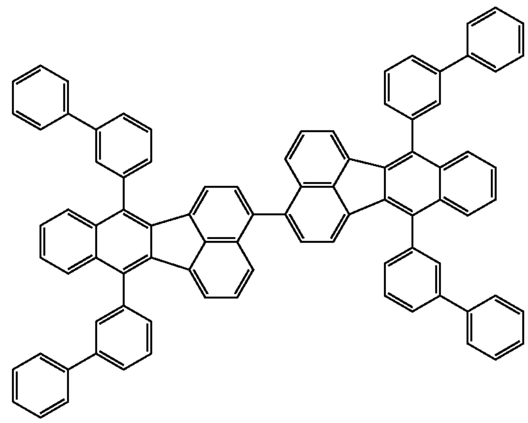
1-7
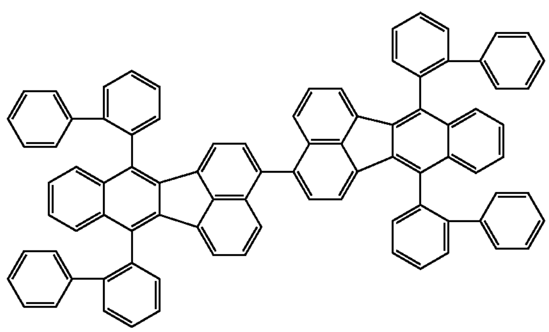
1-8
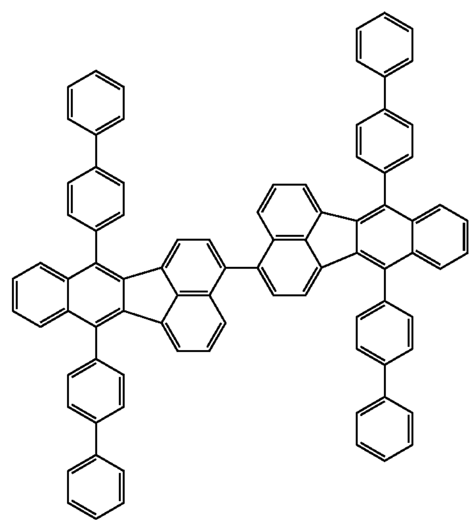
1-9
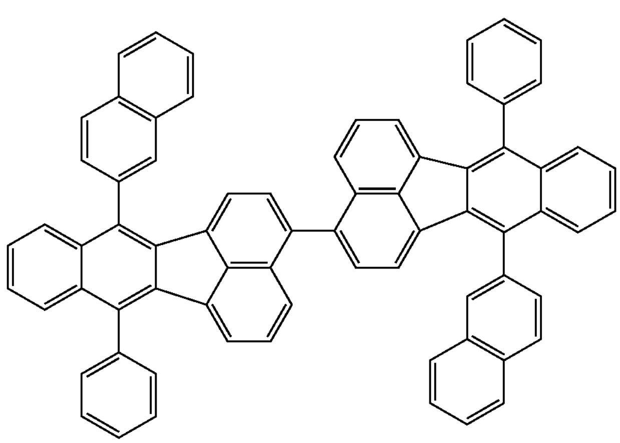

-continued
[Chemical Formula 133]
1-10
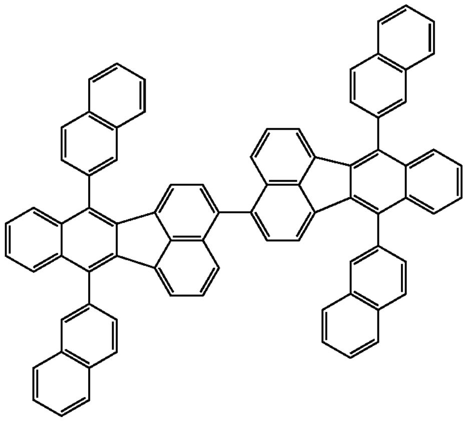
1-11
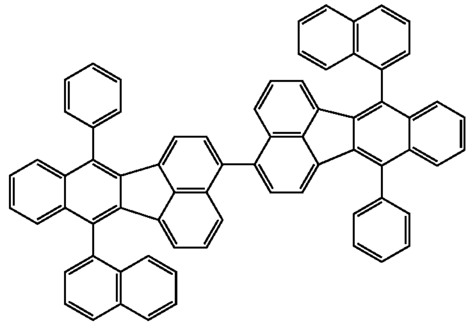
1-12
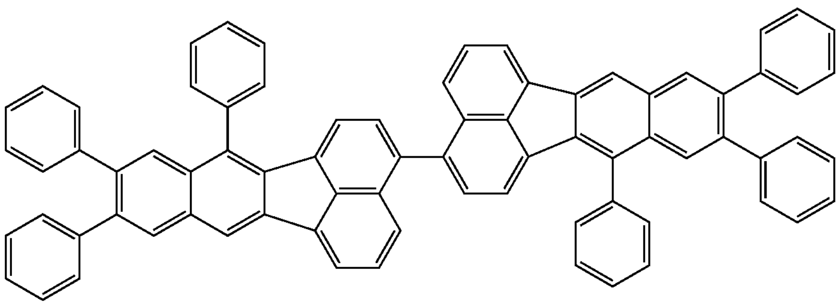
1-13
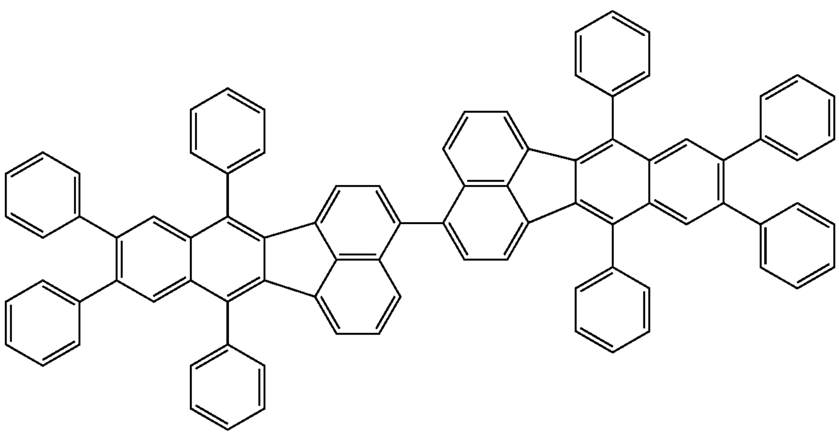
1-14
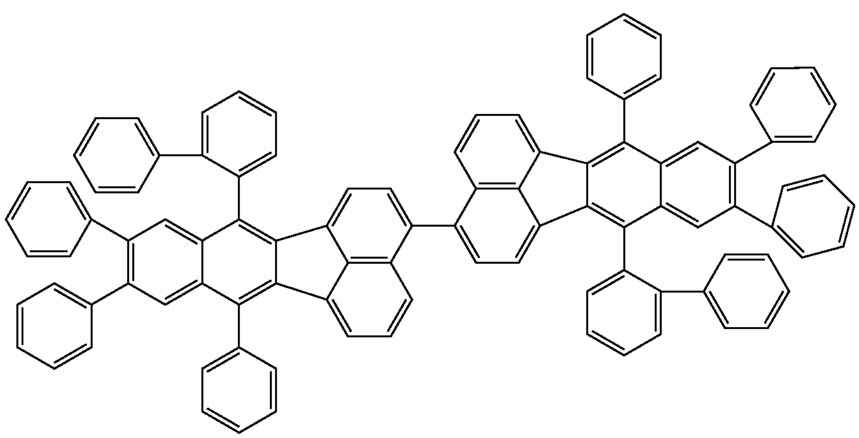

-continued
1-15
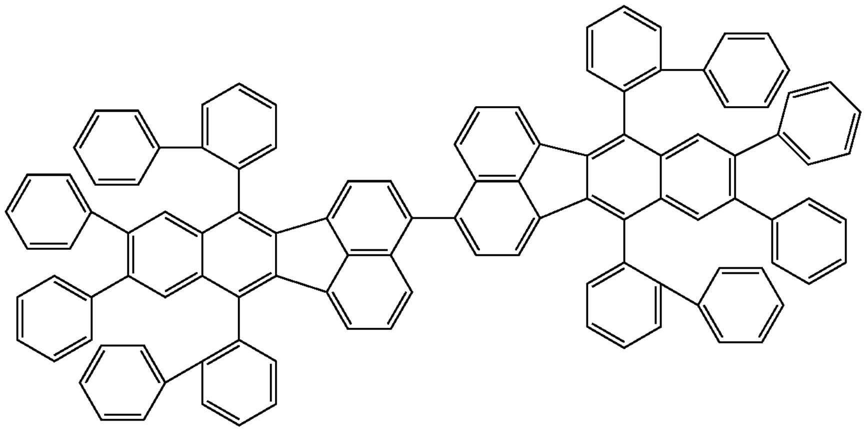
1-16
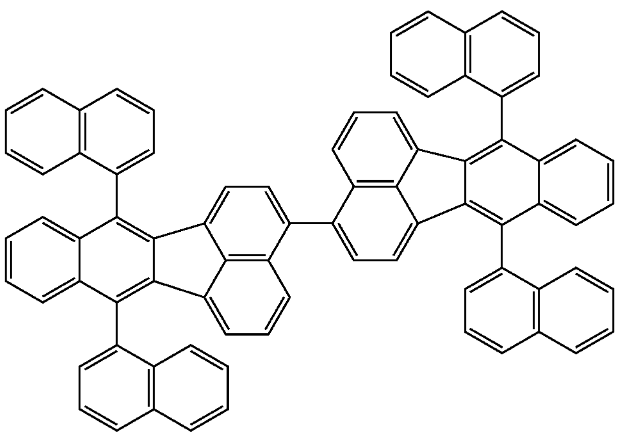
1-17
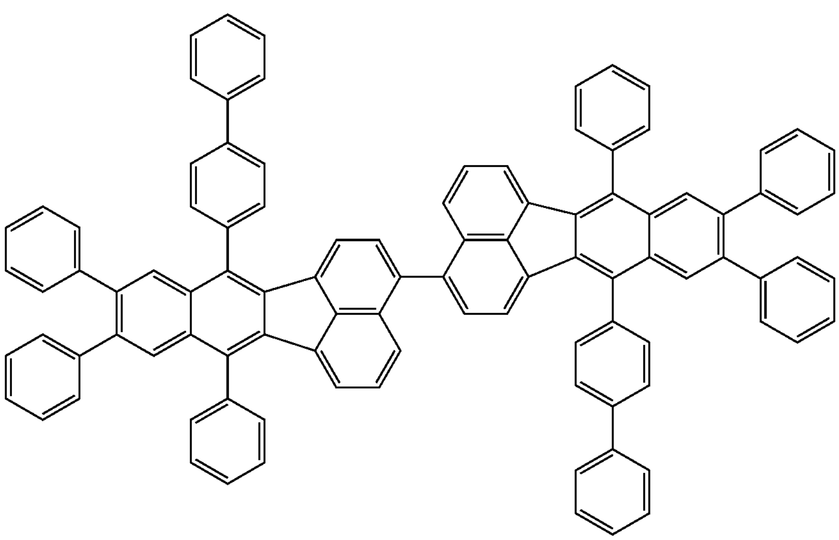

-continued
1-18
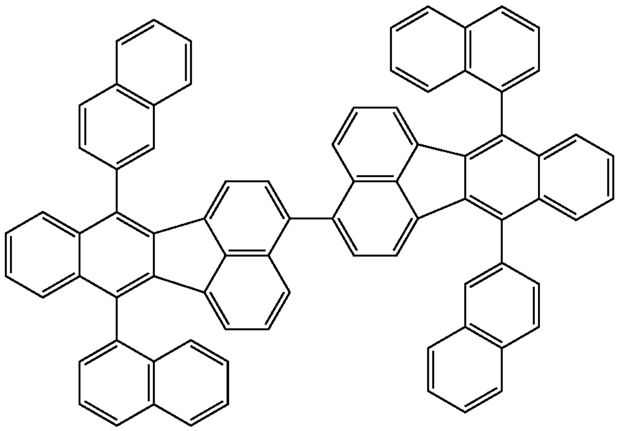
[Chemical Formula 134]
1-19
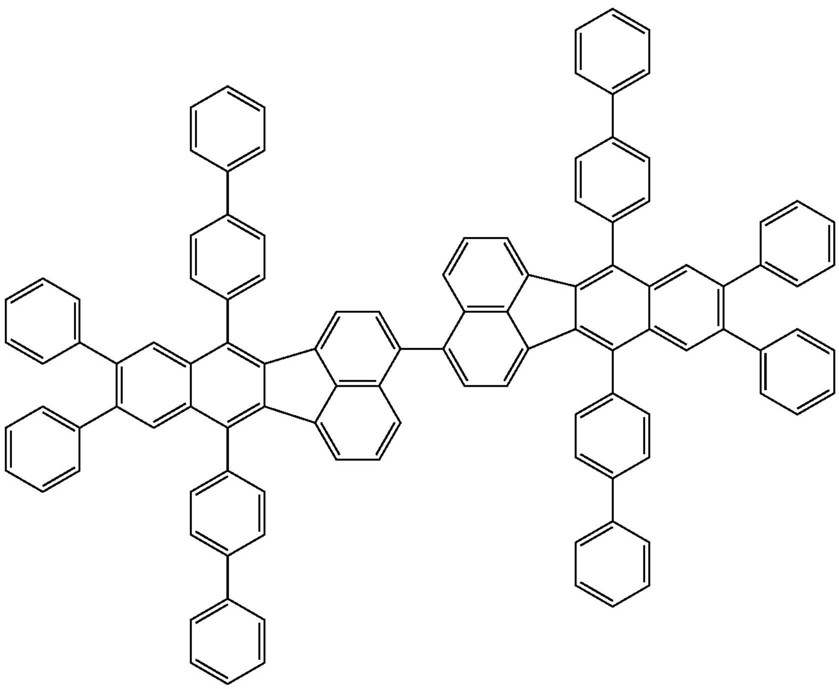
1-20
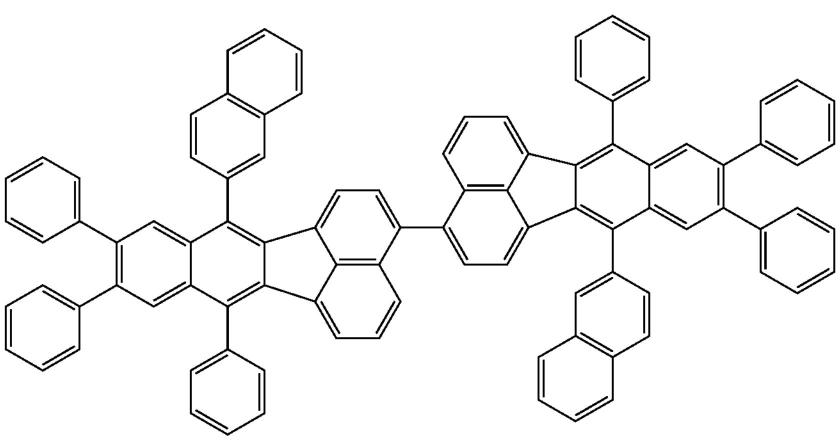

-continued
1-21
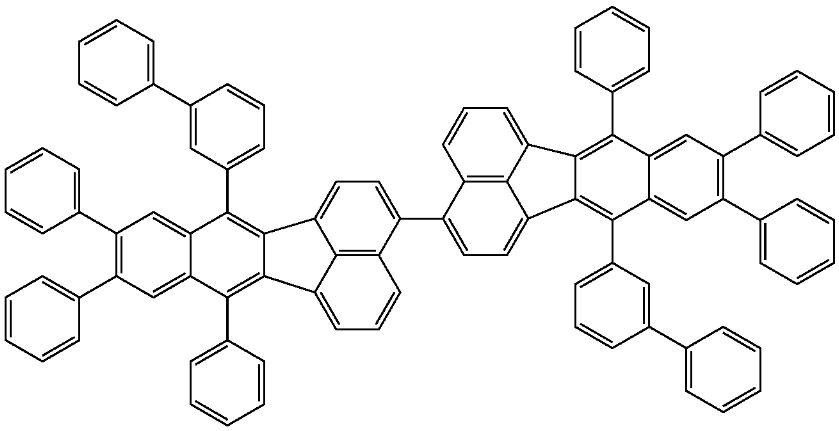
1-22
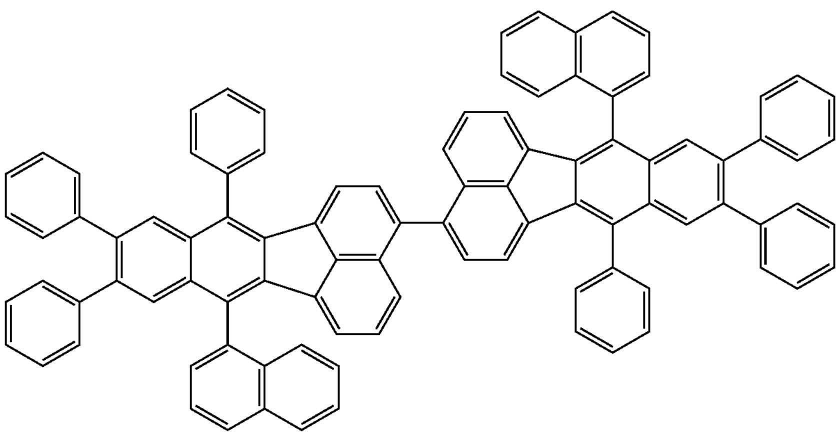
1-23
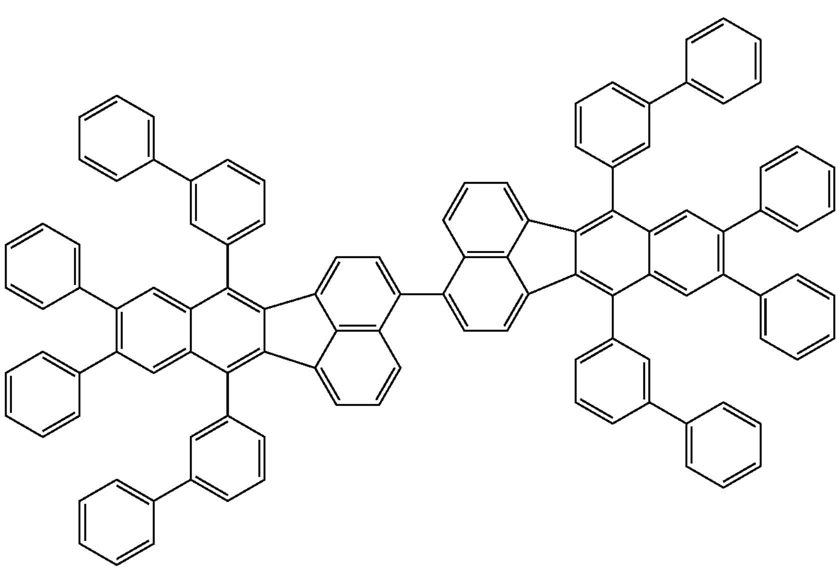

-continued
1-24
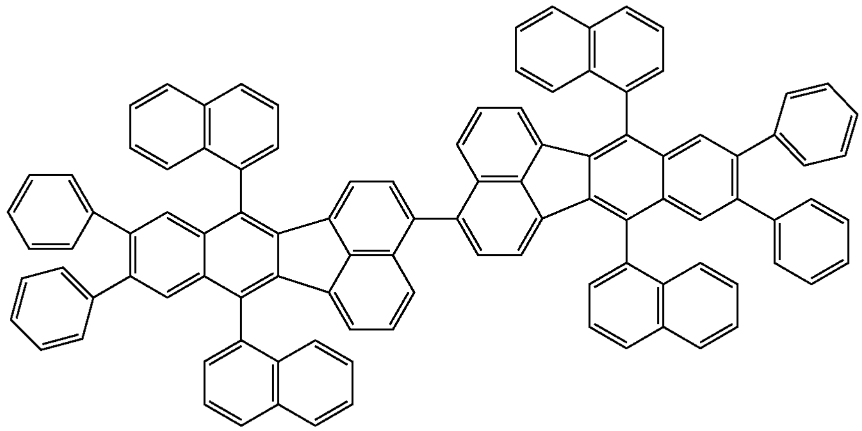
1-25
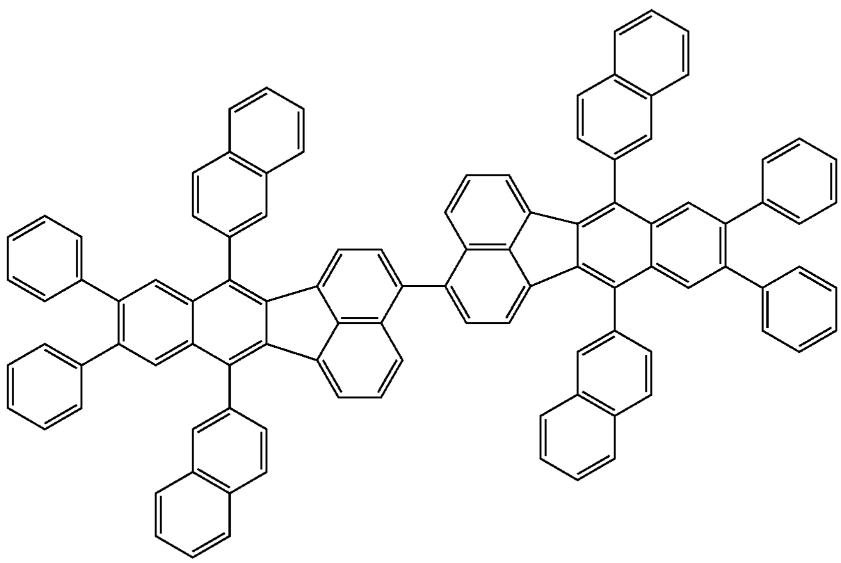
1-26
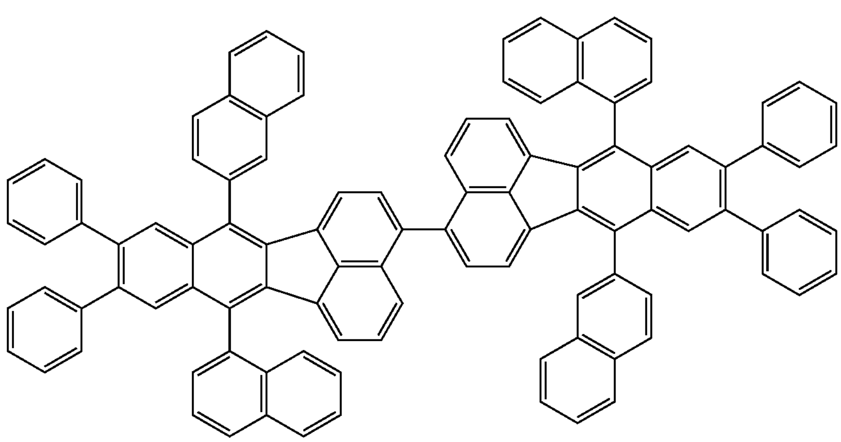

-continued
[Chemical Formula 135]
1-27
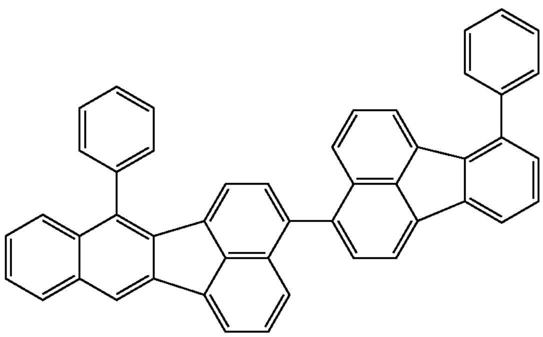
1-28
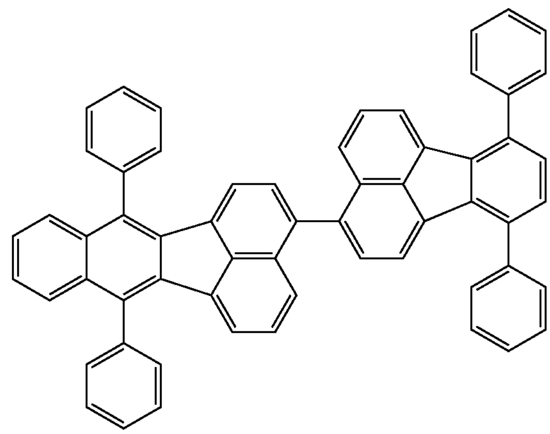
1-29
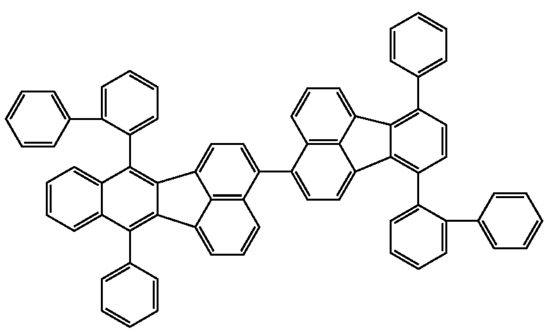
1-30
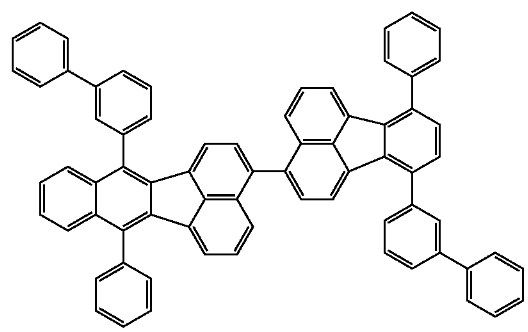
1-31
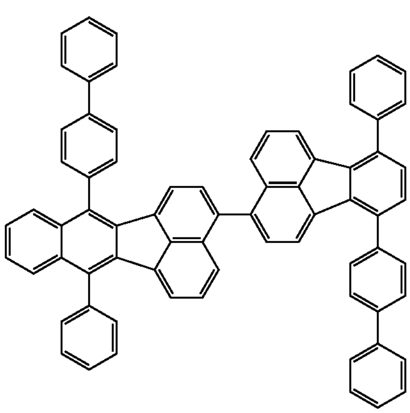
1-32
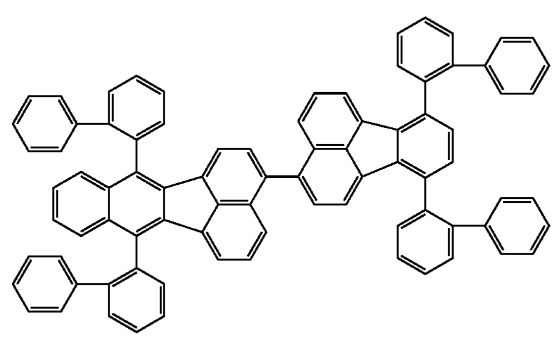

-continued
1-33
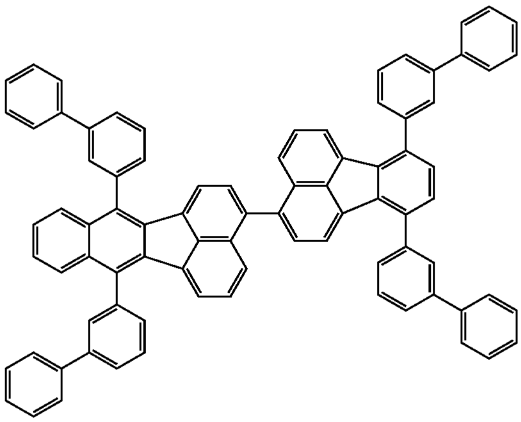
1-34
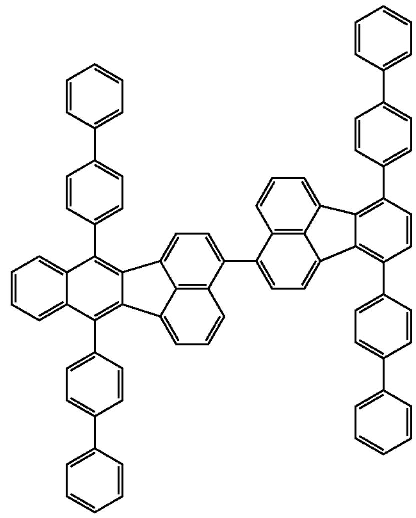
1-35
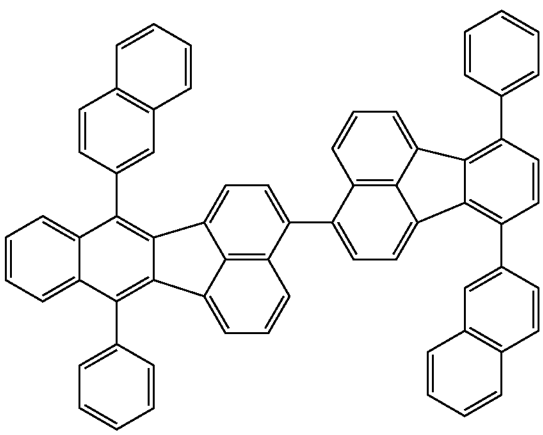
[Chemical Formula 136]
1-36
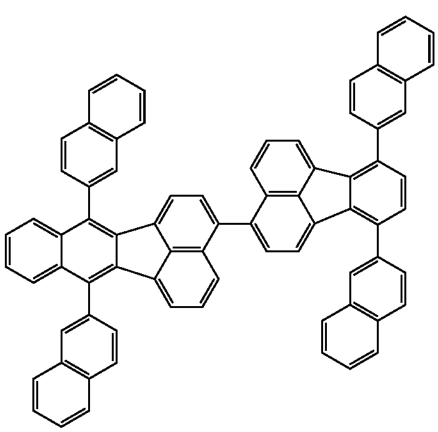
1-37
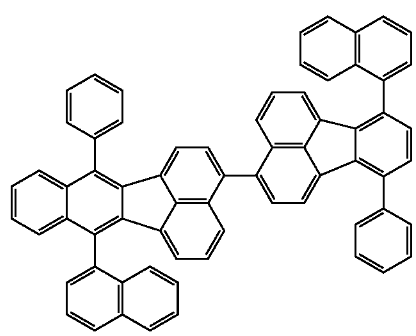

-continued
1-38
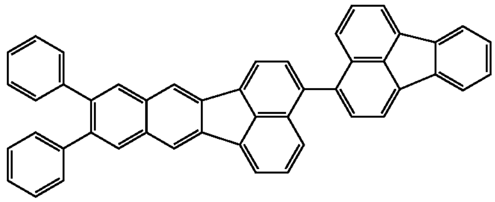
1-39
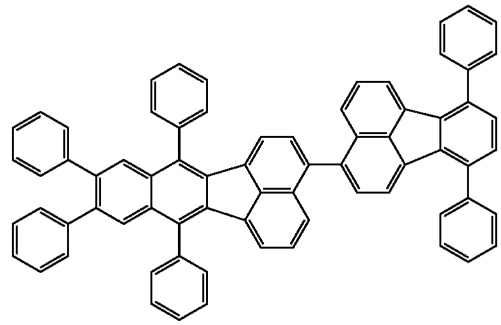
1-40
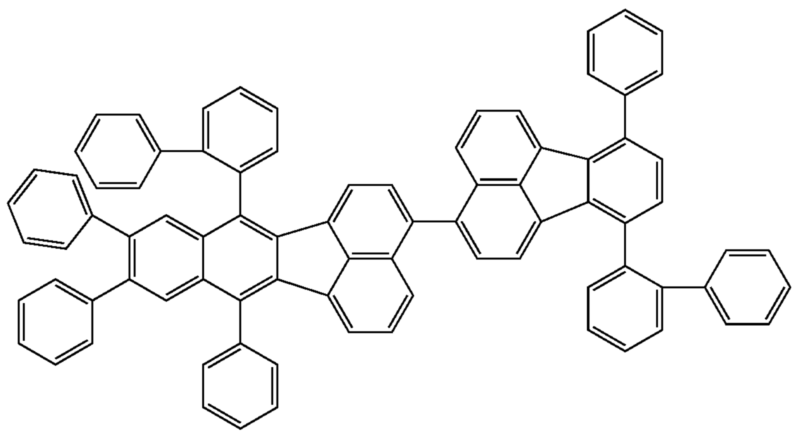
1-41
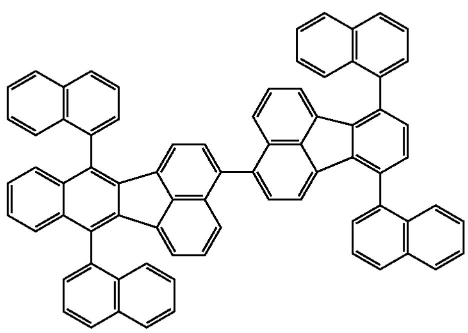
1-42
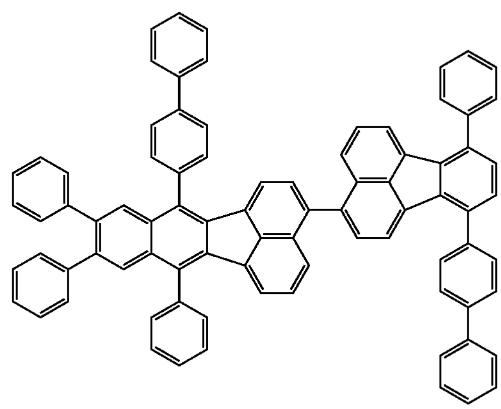
1-43
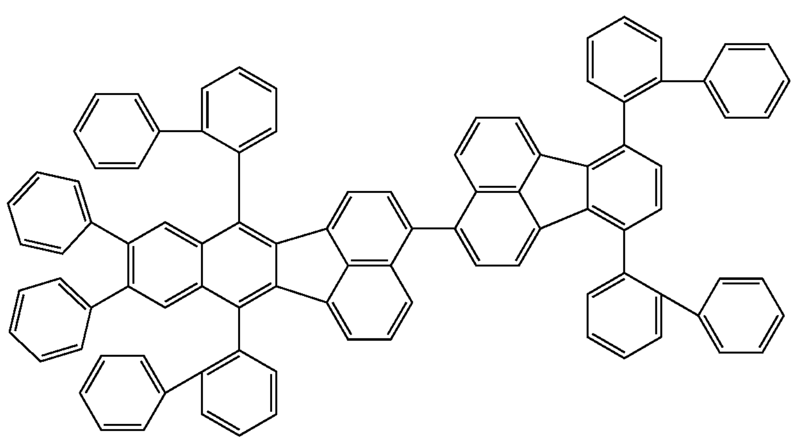

-continued
1-44
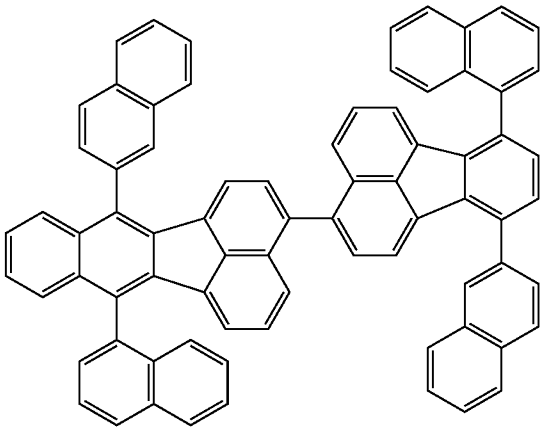
[Chemical Formula 137]
1-45
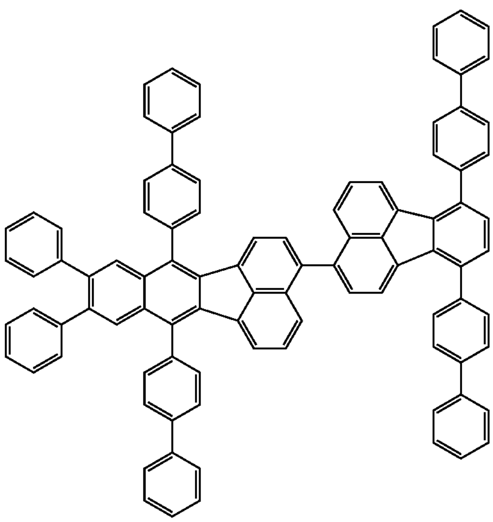
1-46
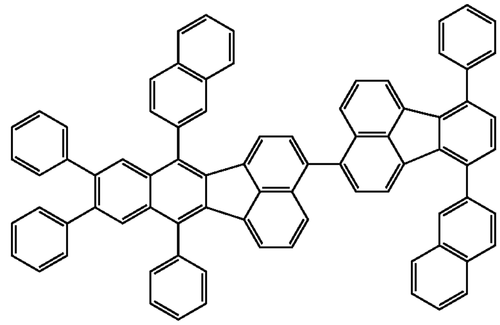
1-47
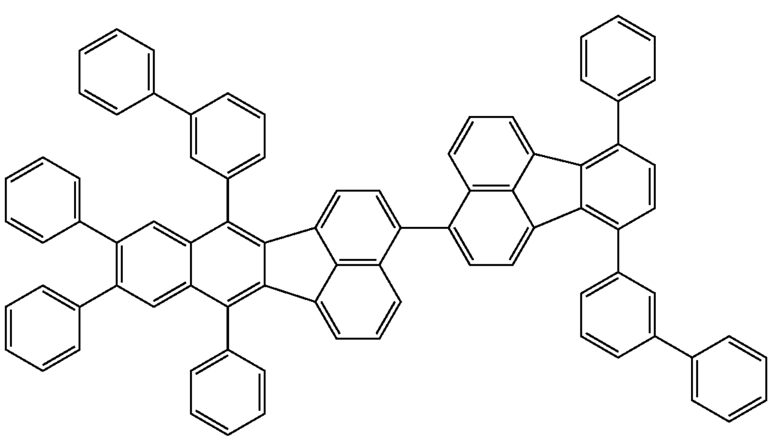

-continued
1-48
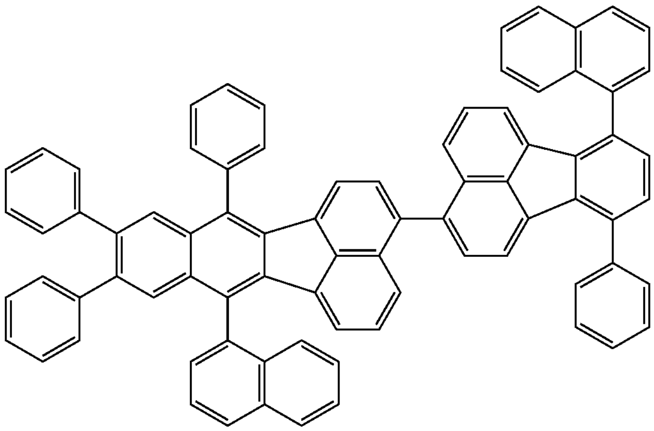
1-49
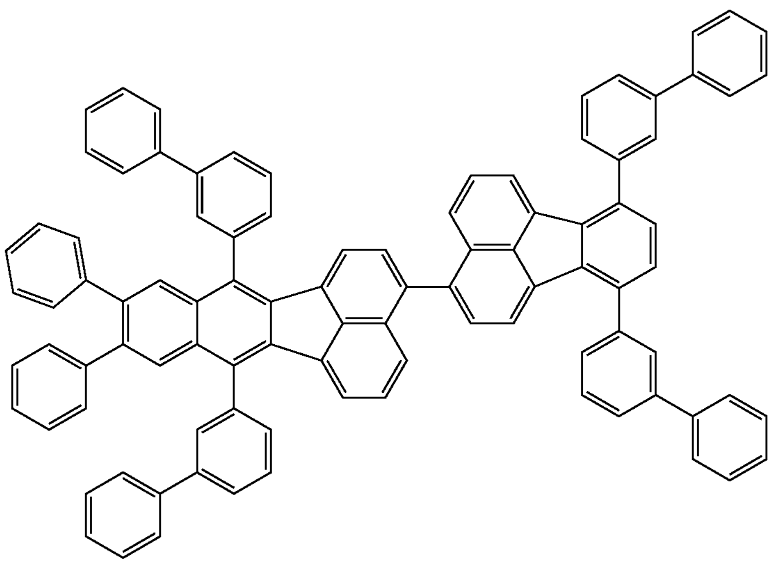
1-50
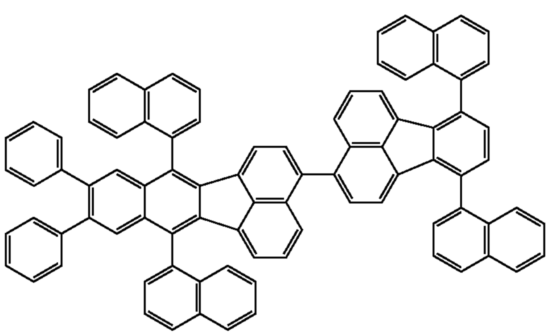
1-51
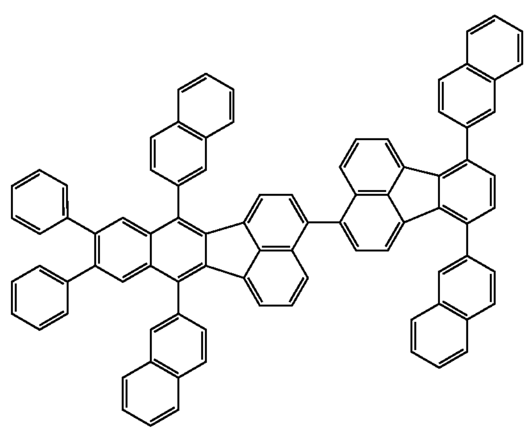

-continued
1-52
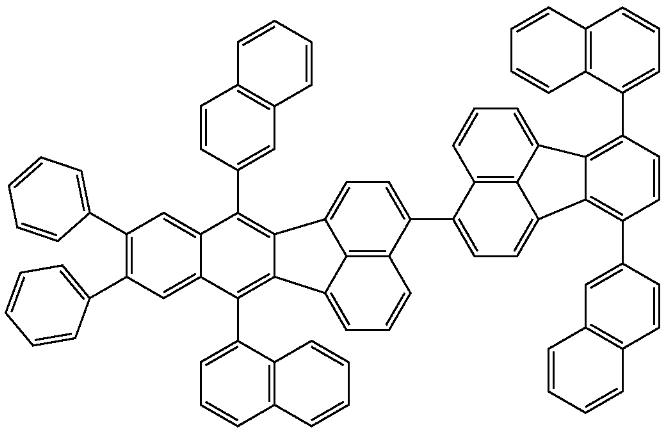
[Chemical Formula 138]
1-53
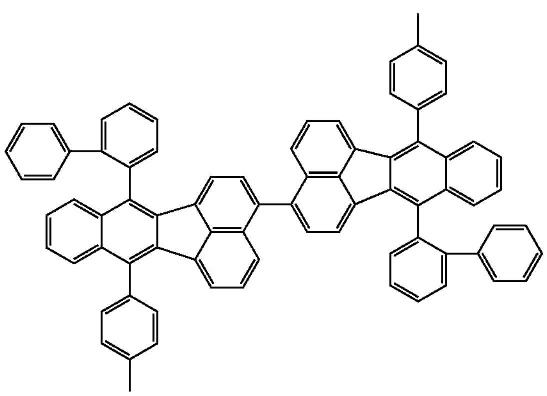
1-54
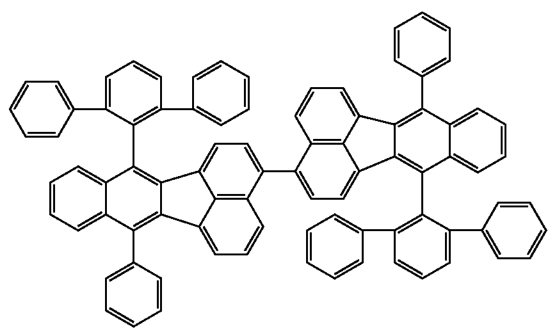
1-55
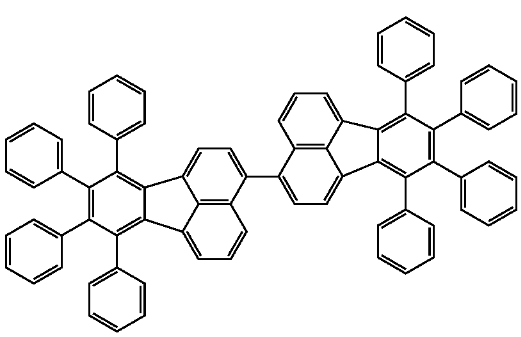
1-56
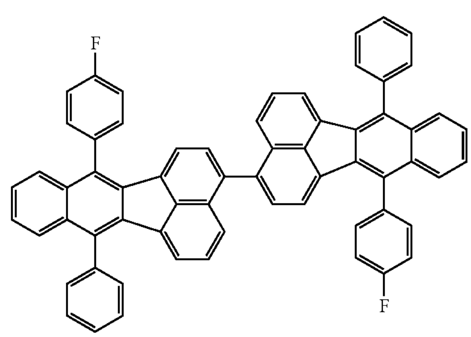

-continued
1-57
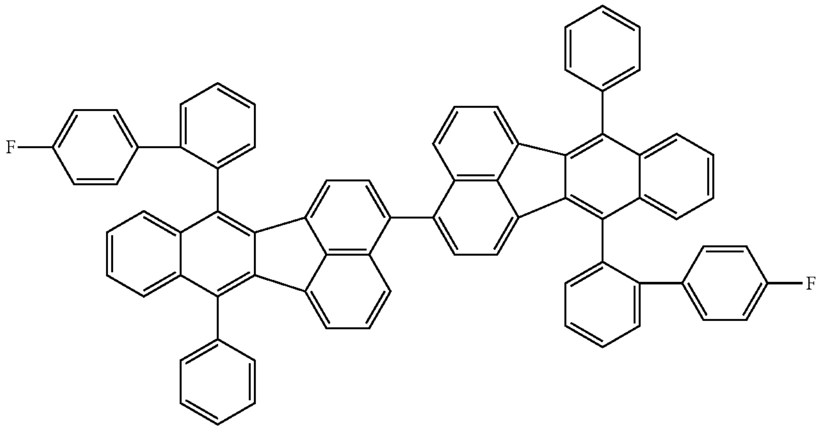
1-58
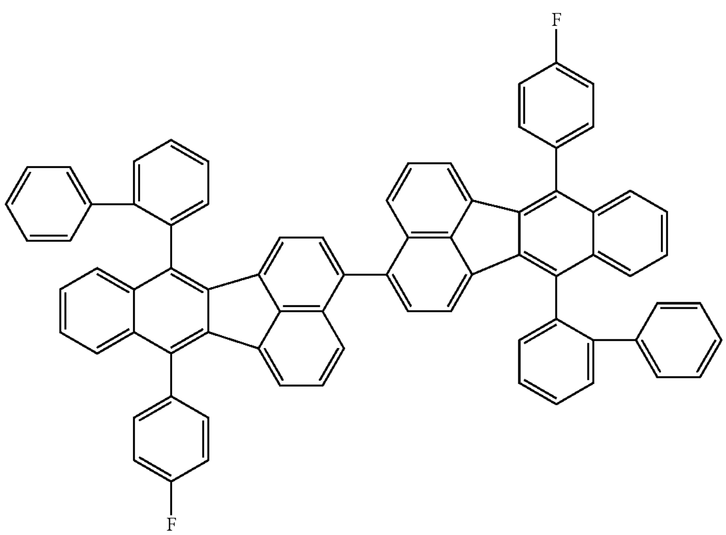
1-59
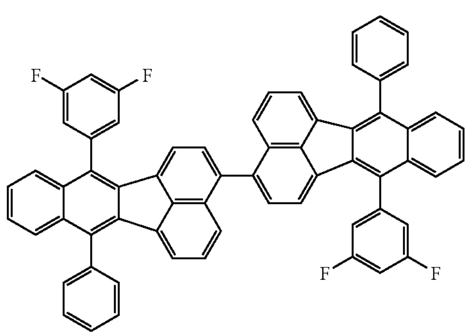
1-60
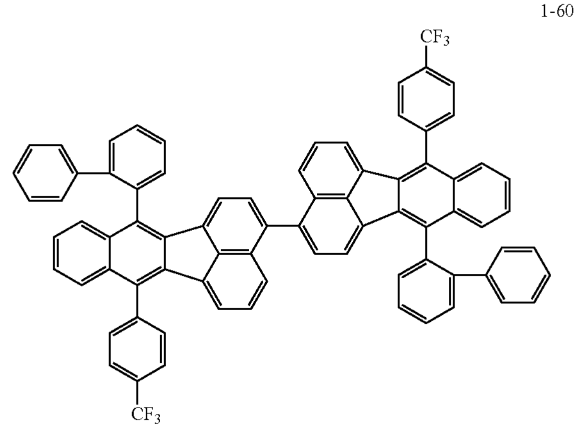

-continued
[Chemical Formula 139]
1-61
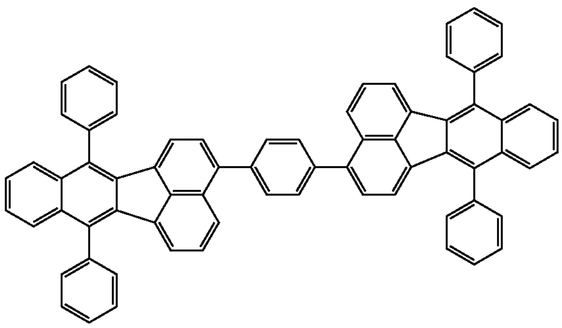
1-62
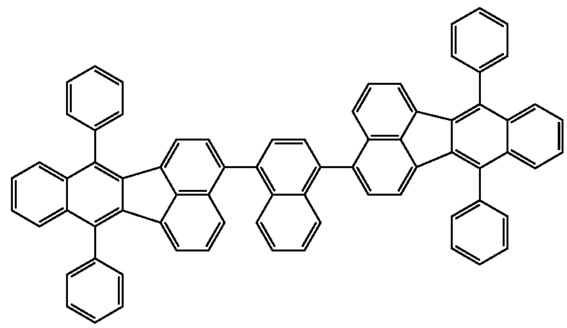
1-63
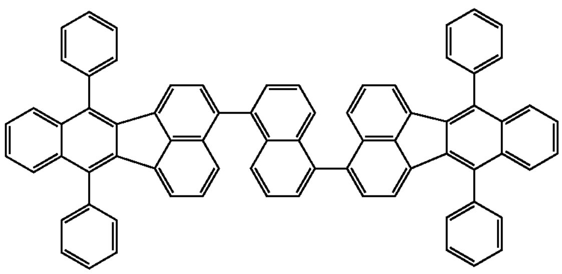
1-64
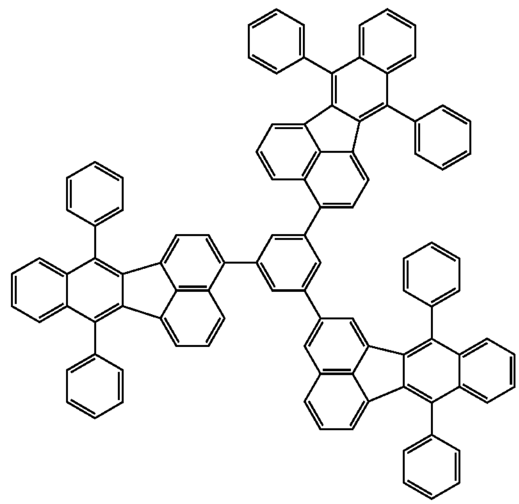
1-65
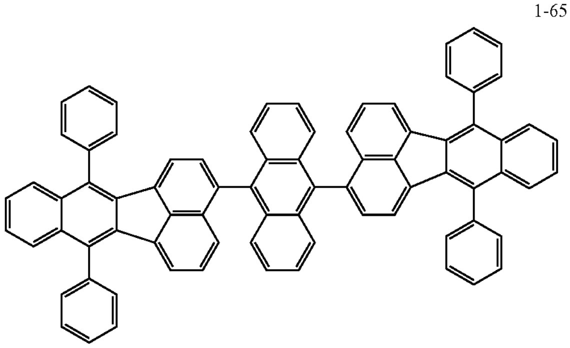
1-66
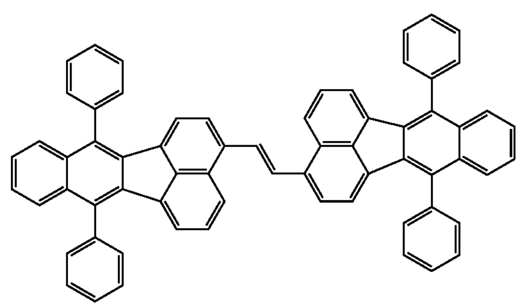
1-67
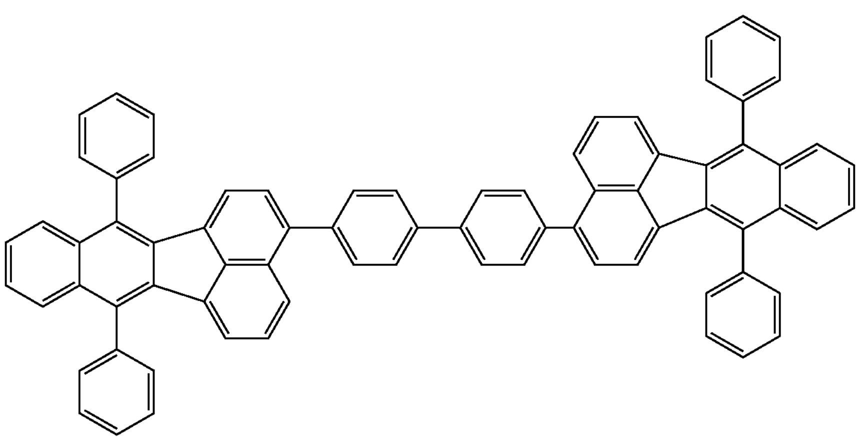

-continued
1-68
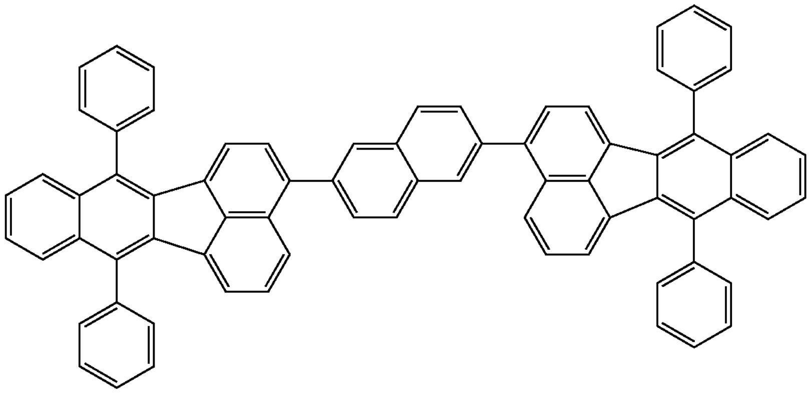
1-69
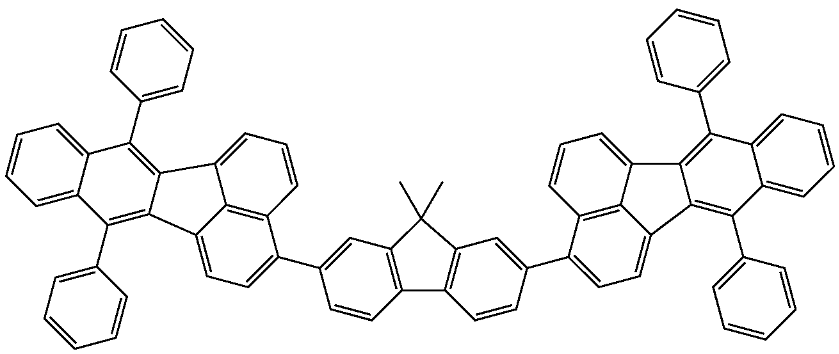
[Chemical Formula 140]
1-70
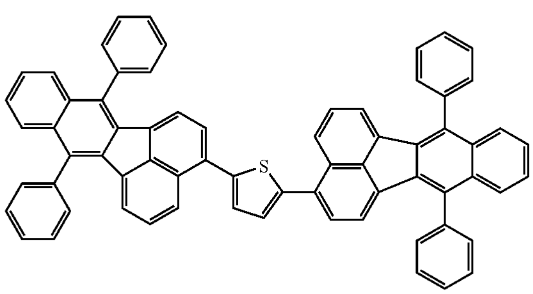
1-71
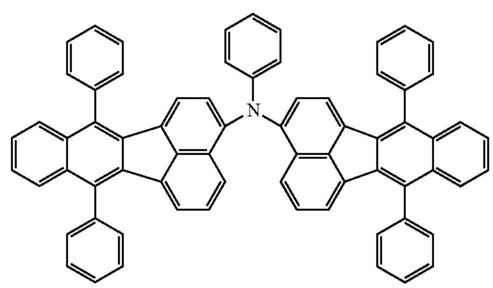
1-72
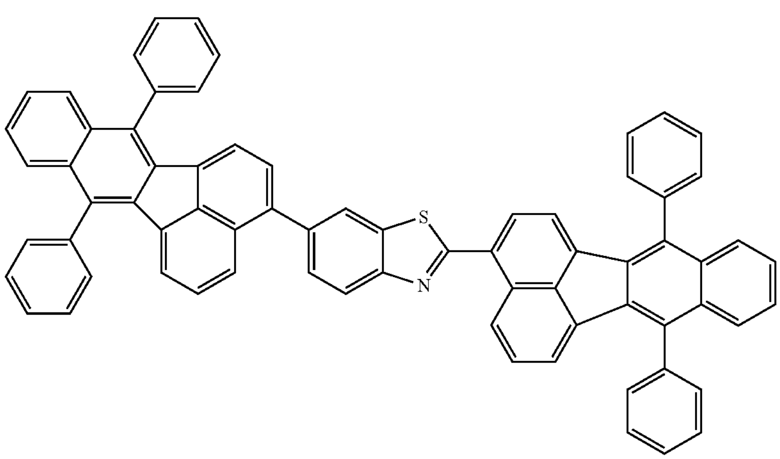

-continued
1-73
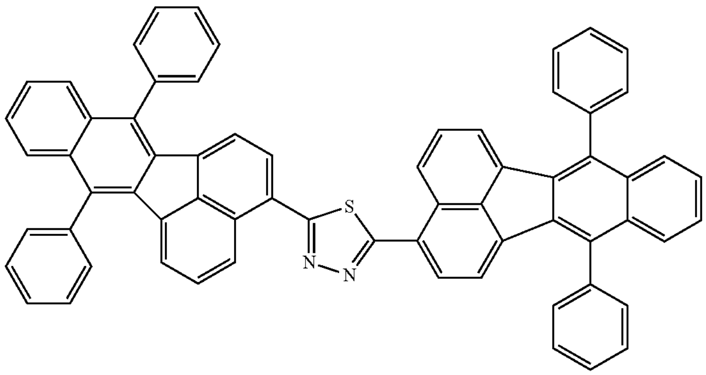
1-74
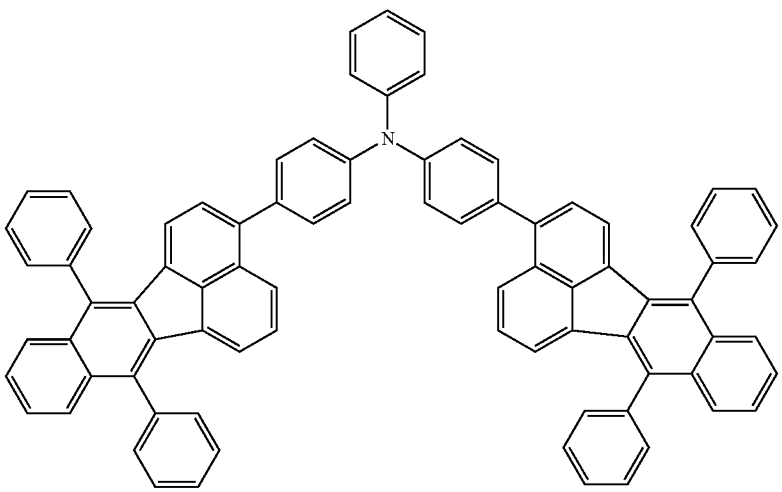
1-75
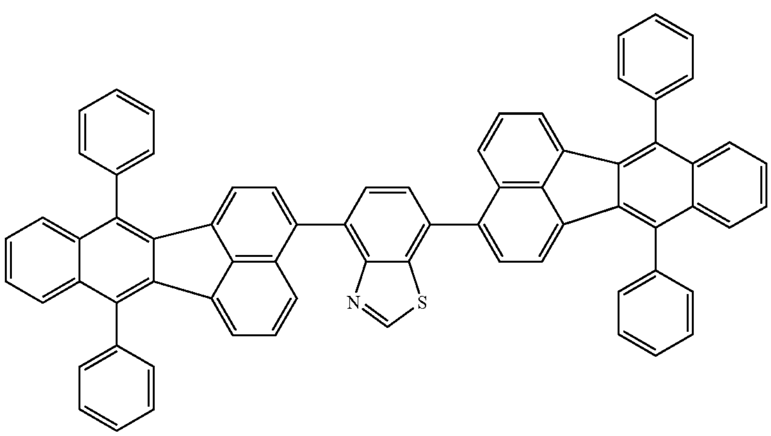

-continued
1-76
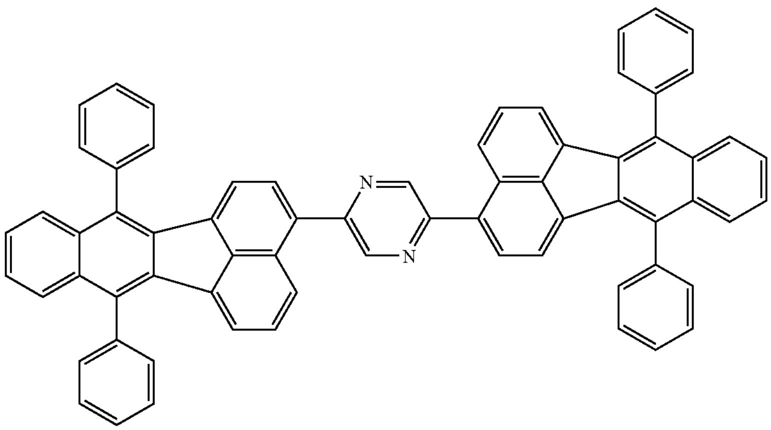
1-77
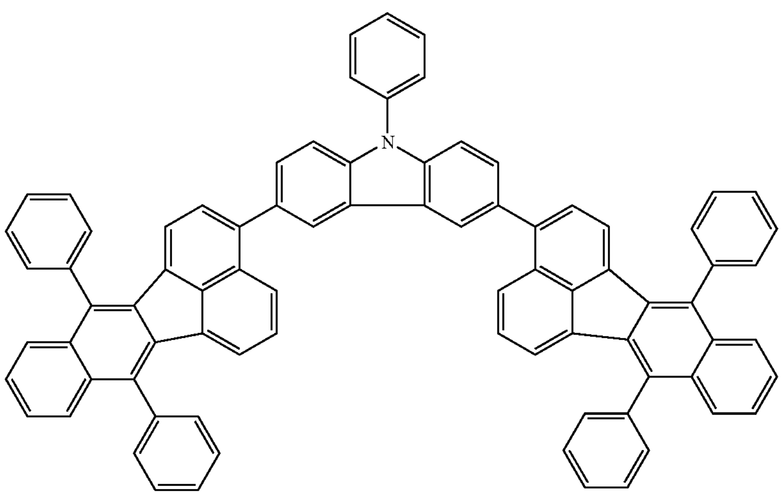
1-78
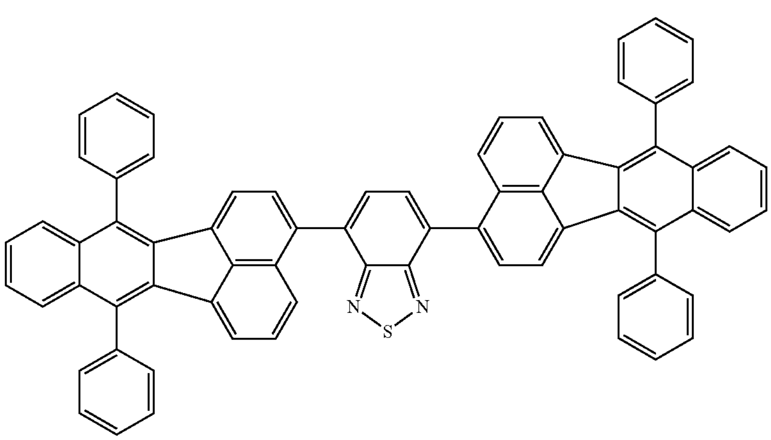

-continued
[Chemical Formula 141]
1-79
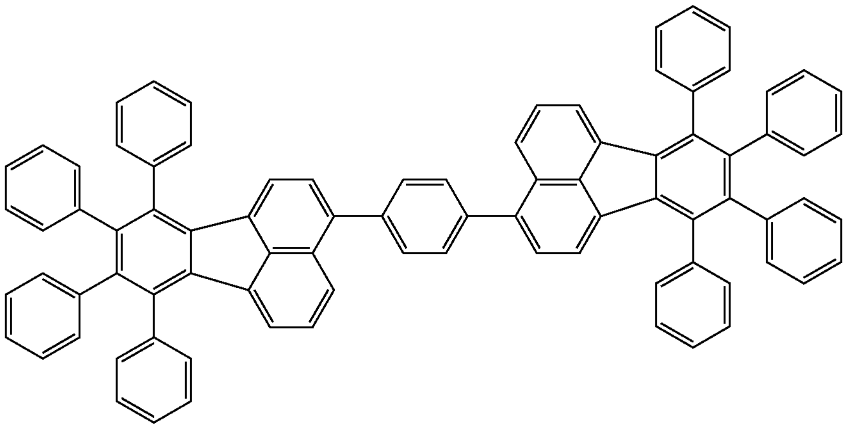
1-80
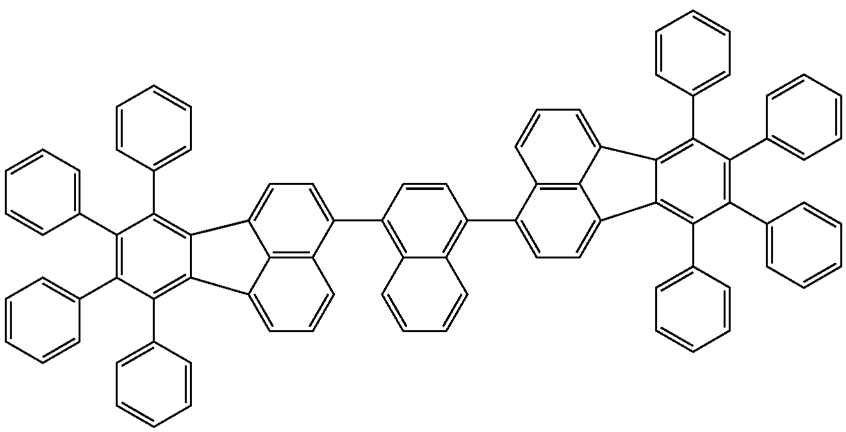
1-81
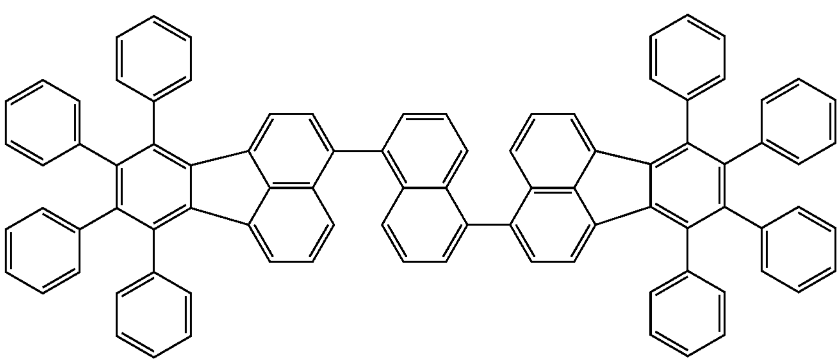

-continued
1-82
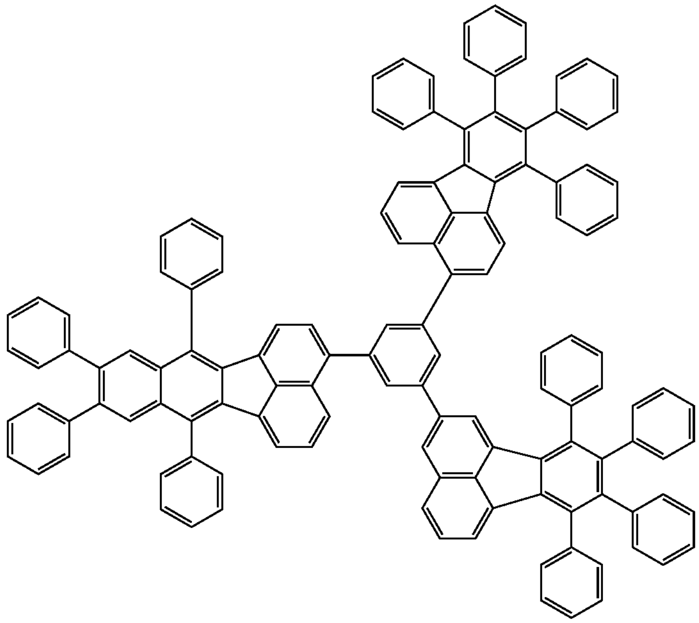
1-83
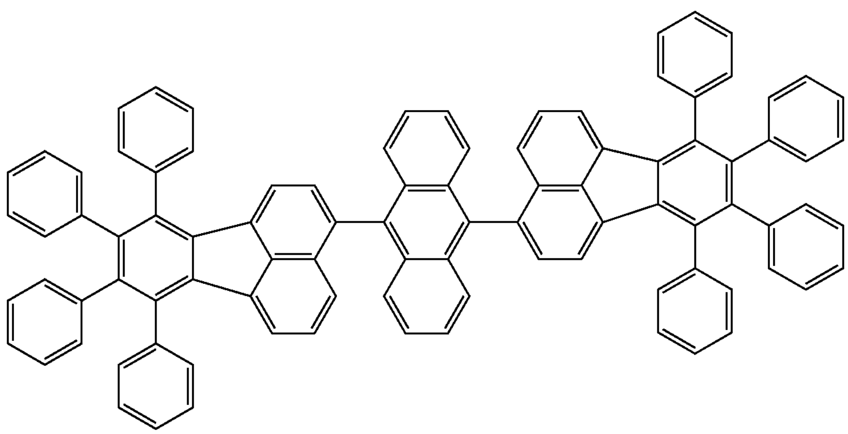
1-84
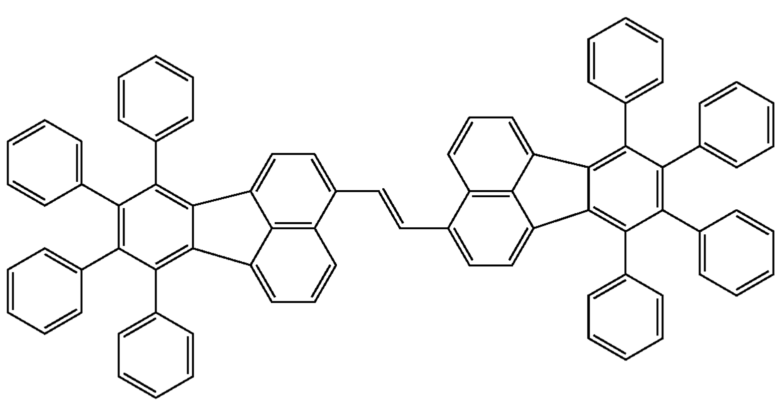

-continued
1-84
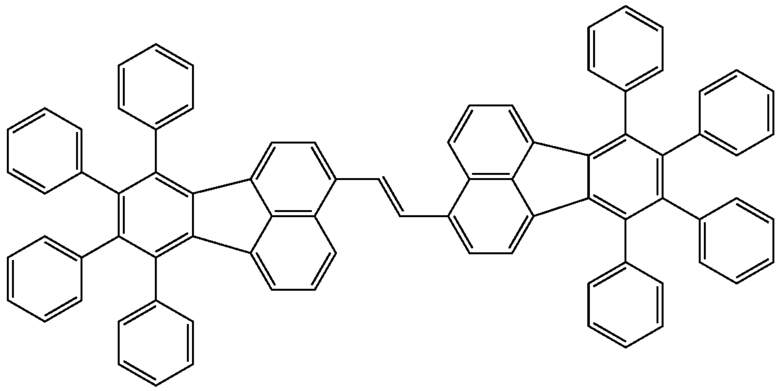
1-85
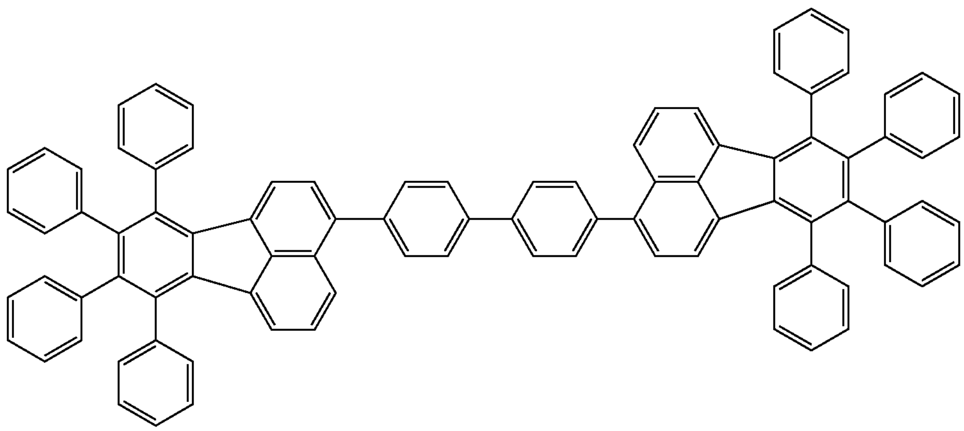
1-86
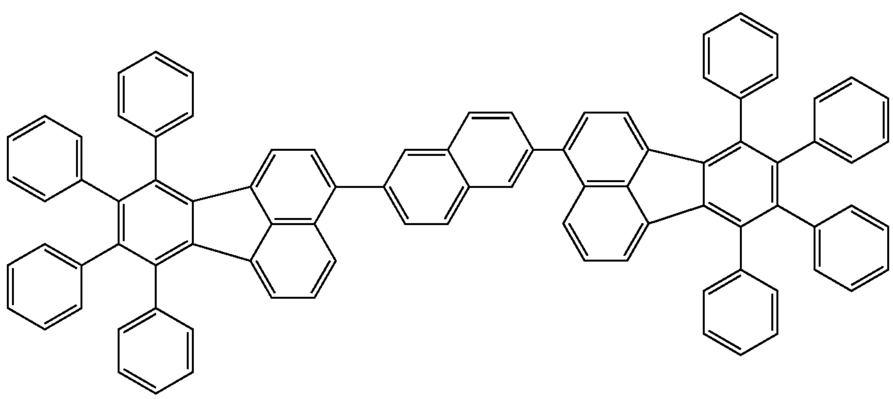
1-87
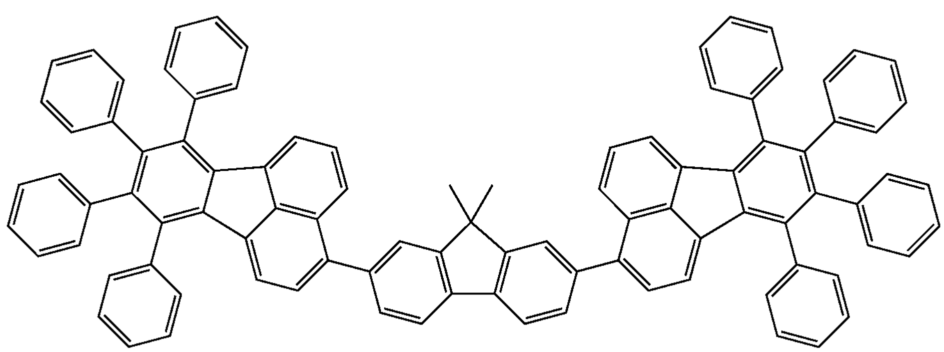

-continued
[Chemical Formula 142]
1-88
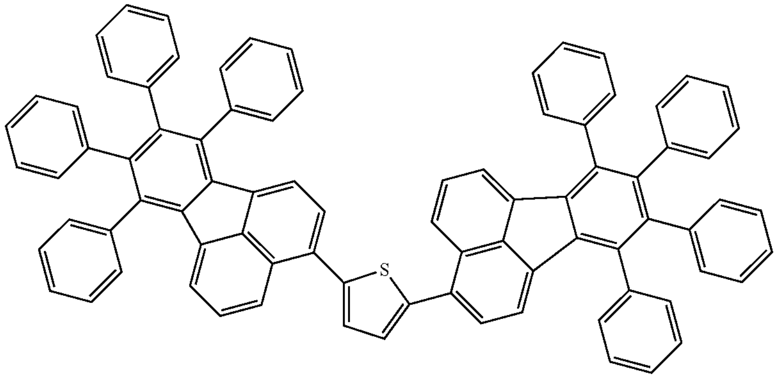
1-89
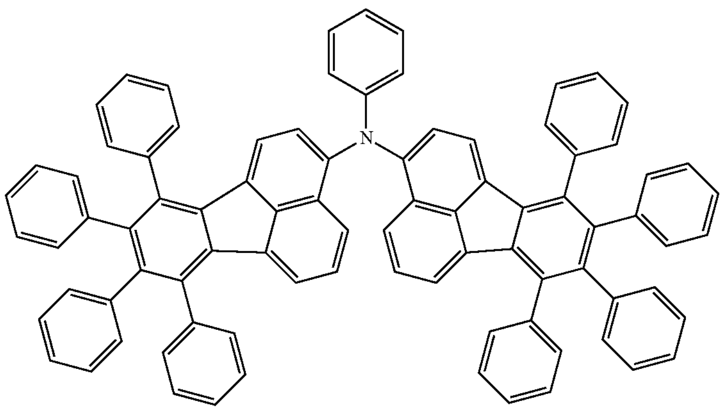
1-90
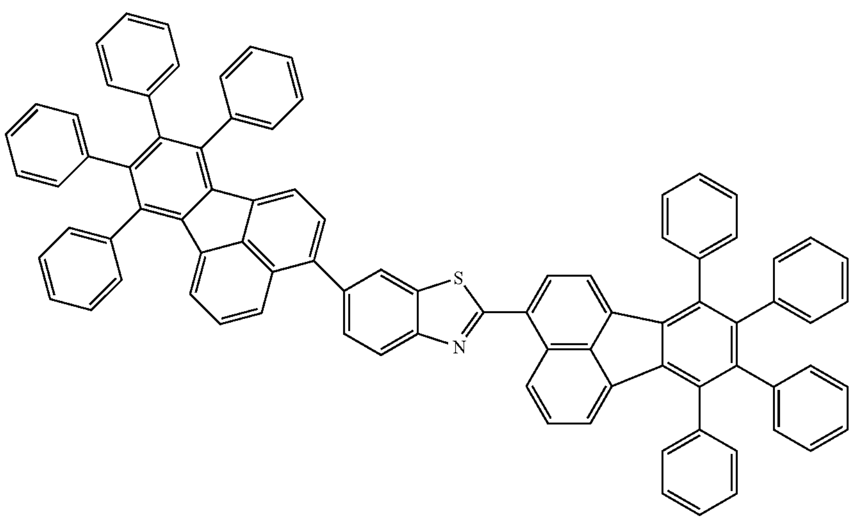

-continued
1-91
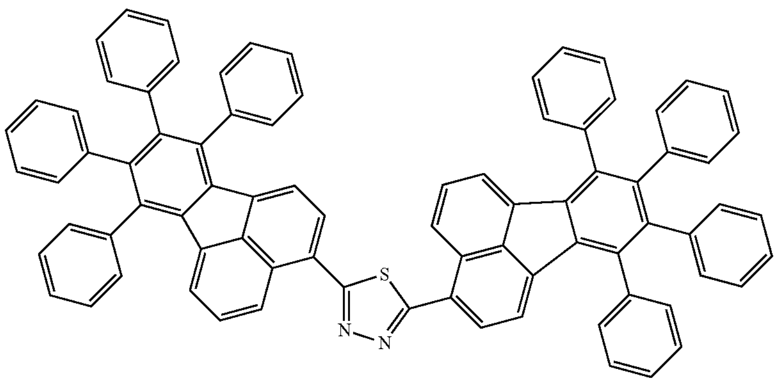
1-92
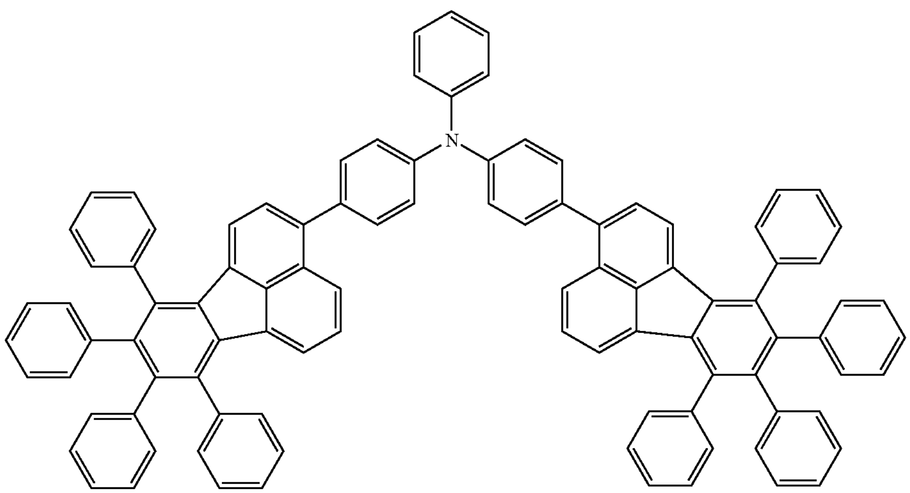
1-93
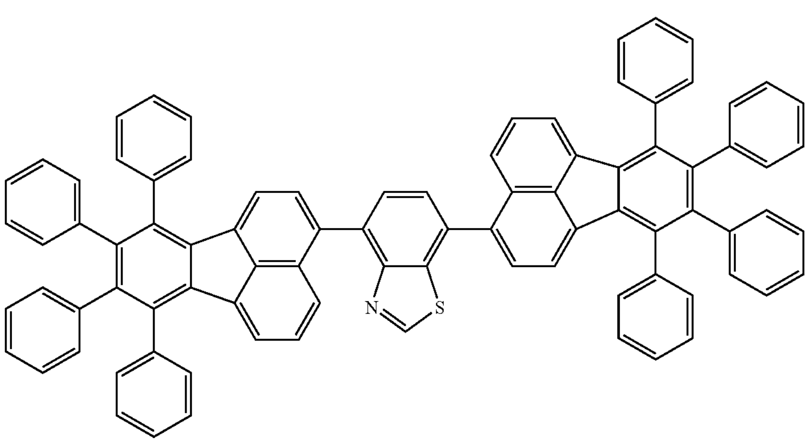

-continued
1-94
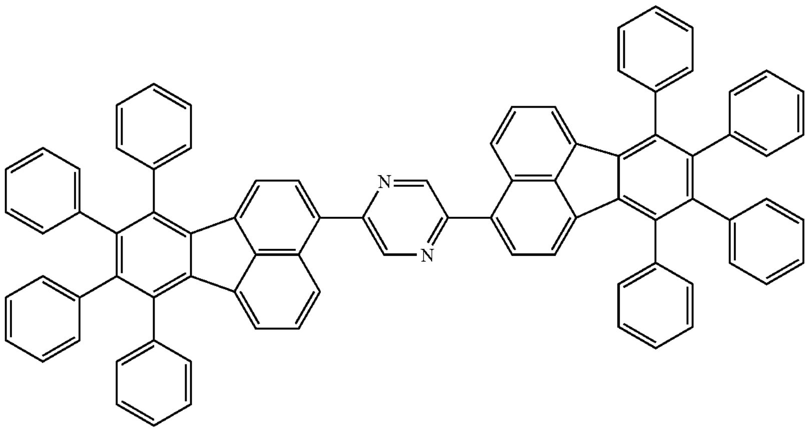
1-95
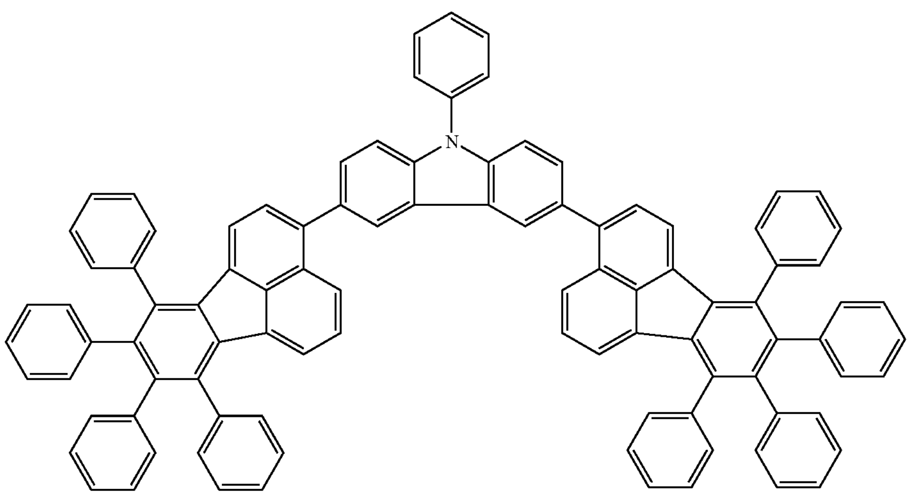
1-96
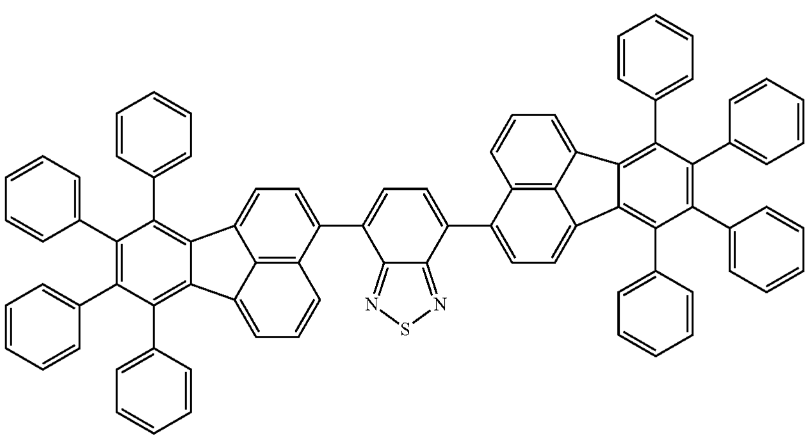

-continued
[Chemical Formula 143]
1-97
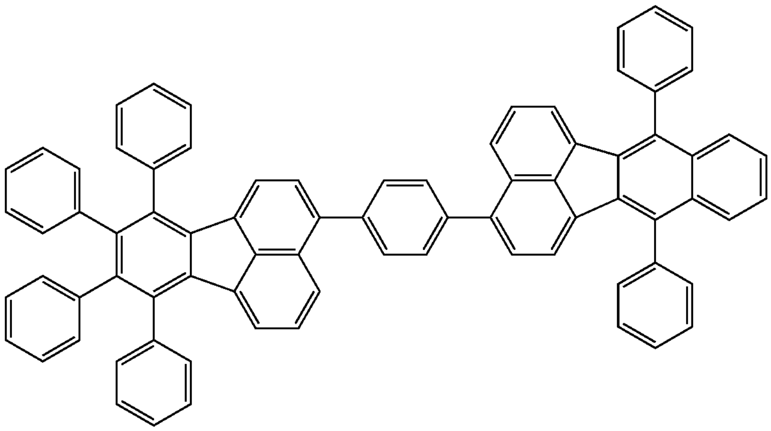
1-98
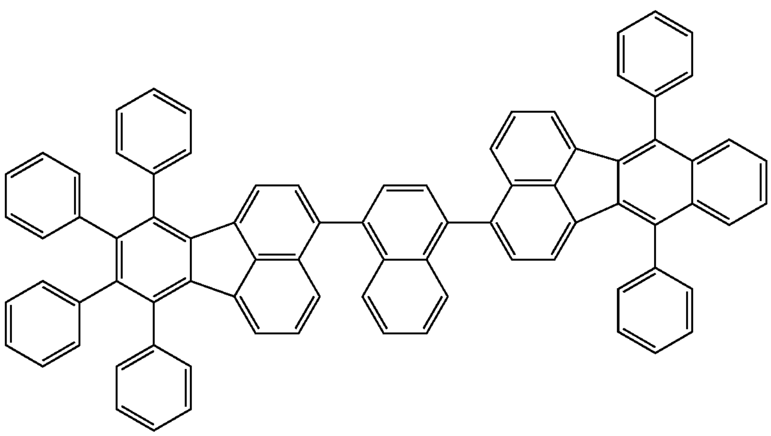
1-99
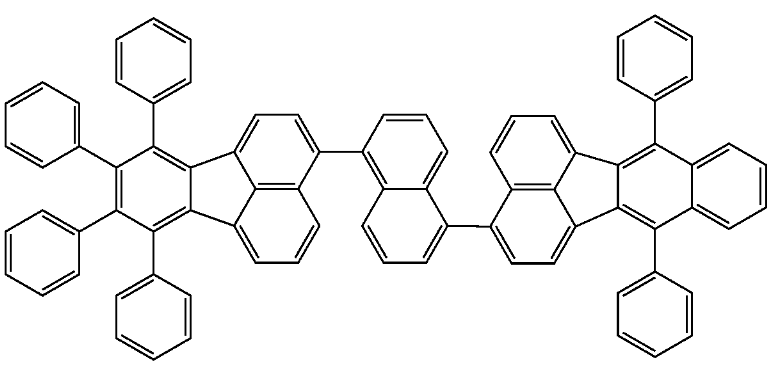

-continued
1-100
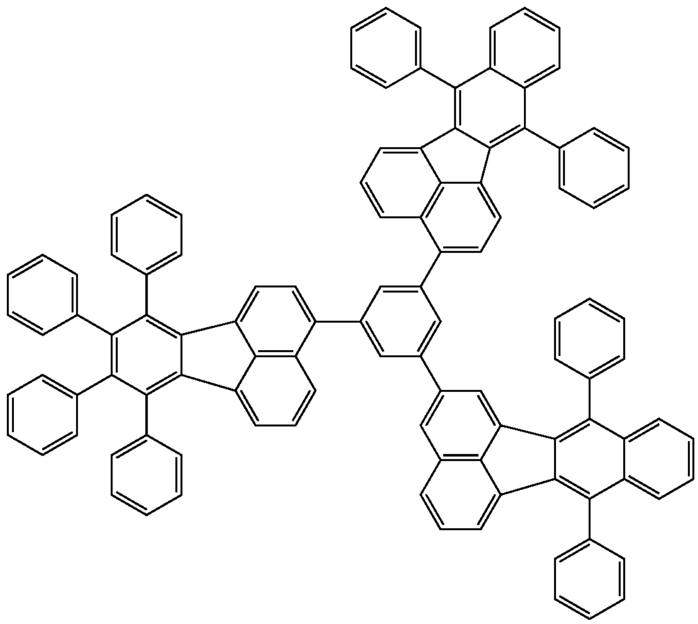
1-101
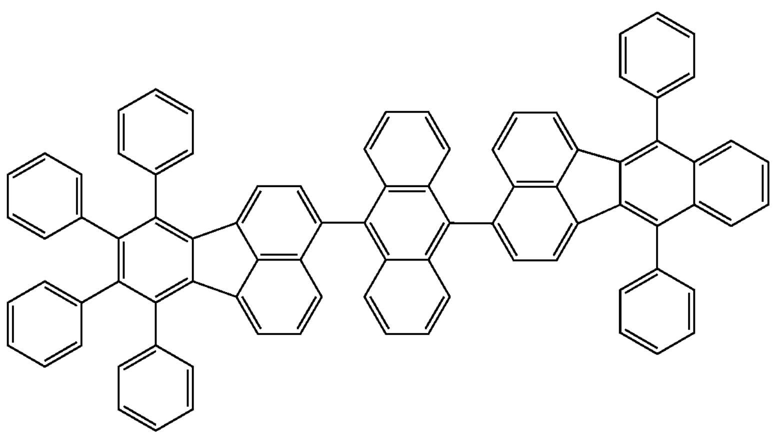
1-102
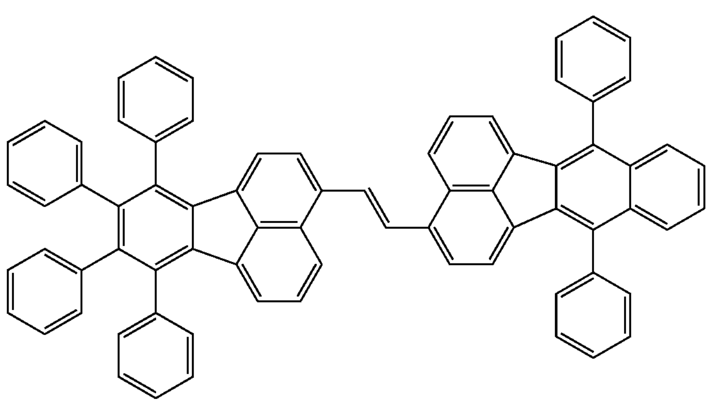

-continued
1-103
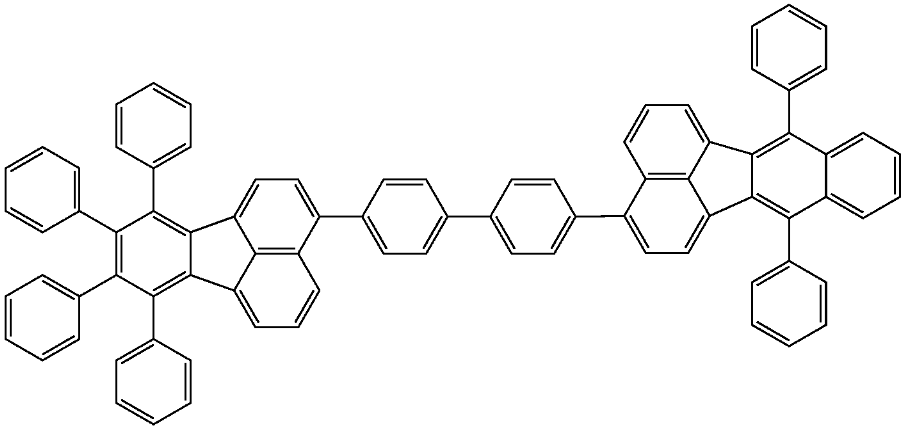
1-104
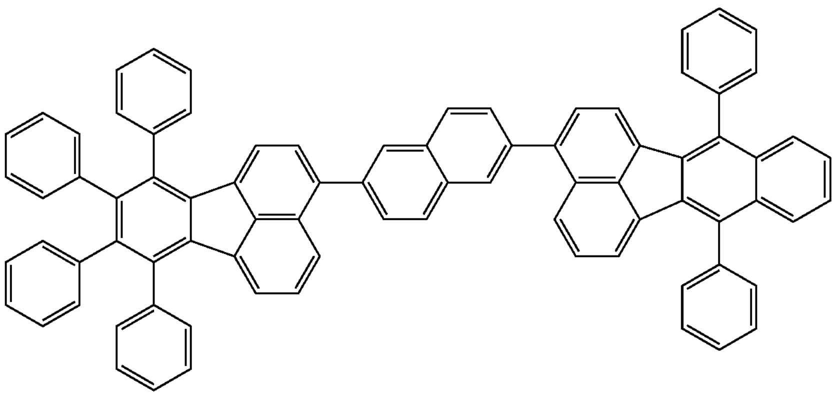
1-105
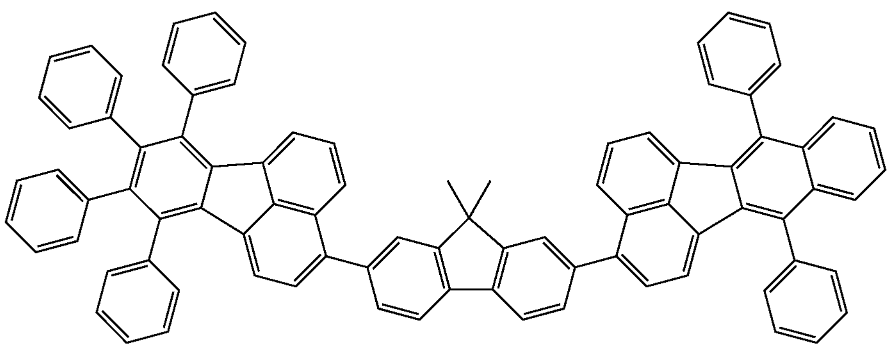
[Chemical Formula 144]
1-106
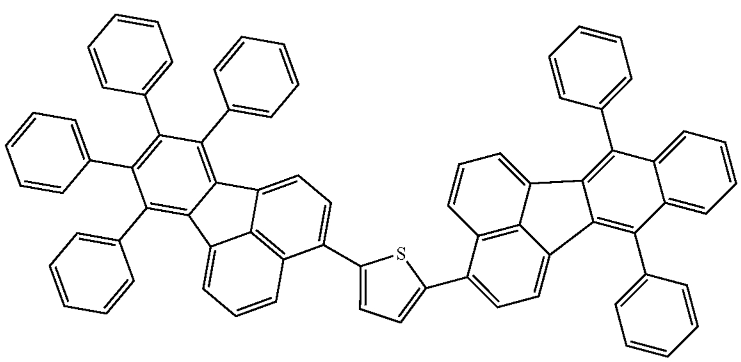

-continued
1-107
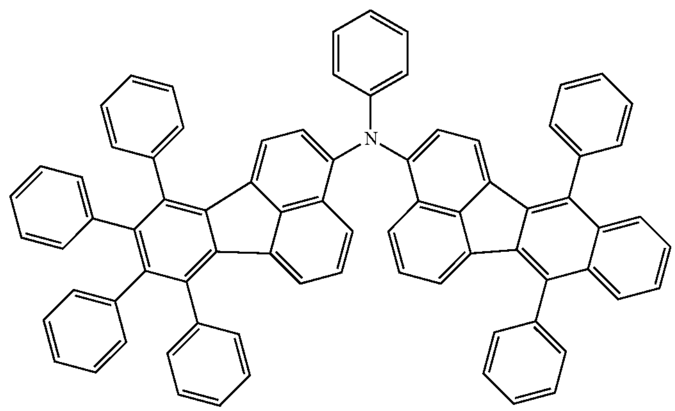
1-108
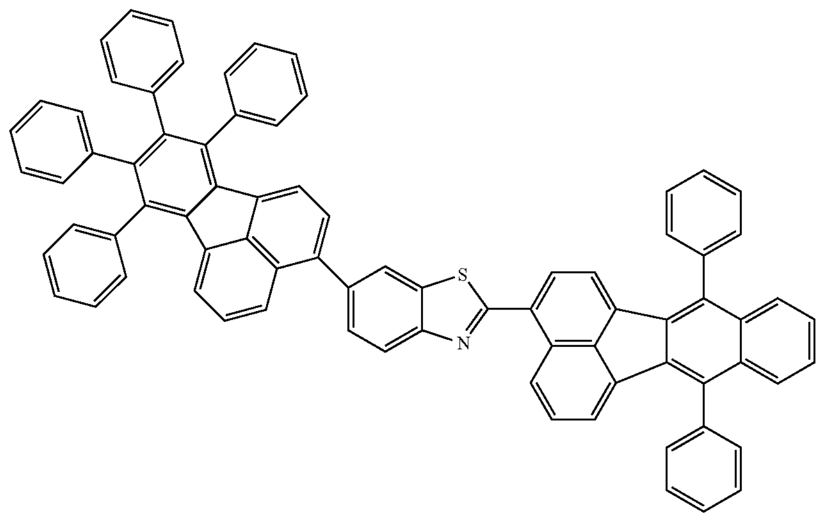
1-109
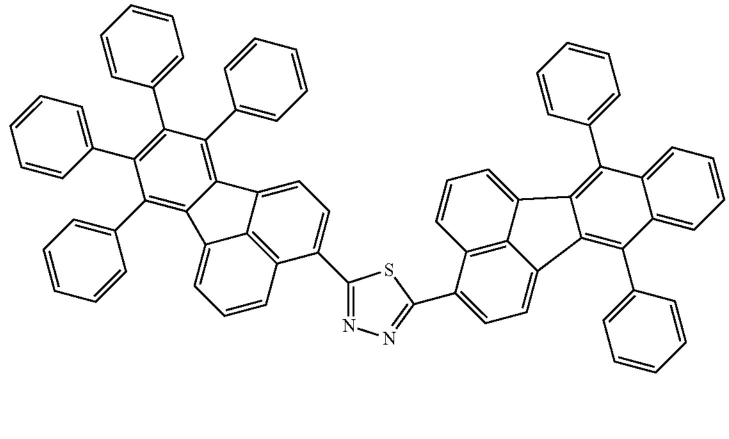

-continued
1-110
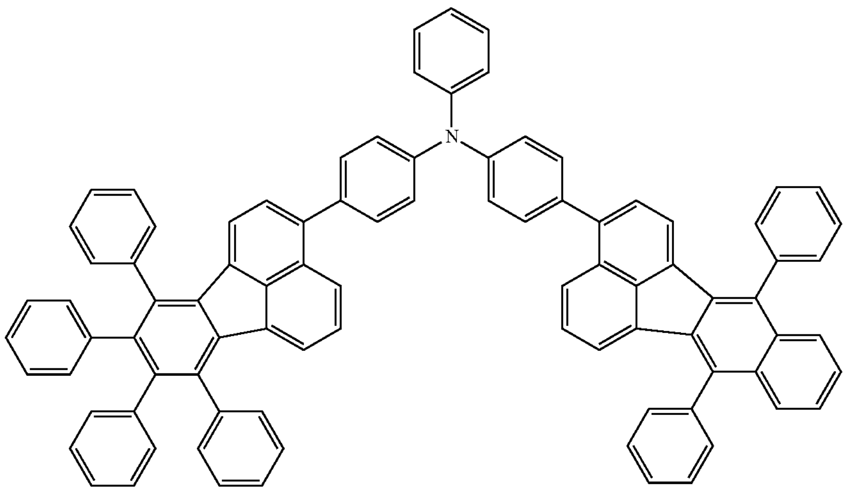
1-111
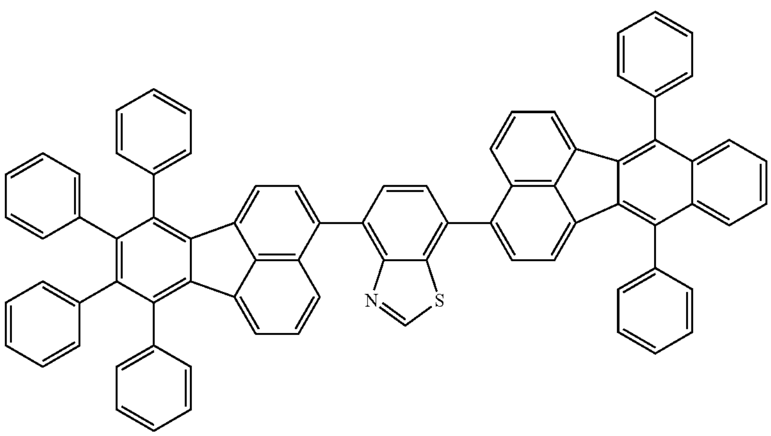
1-112
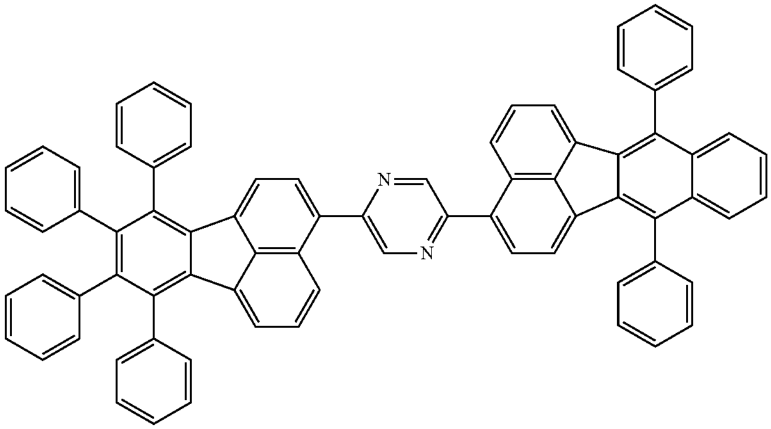

-continued
1-113
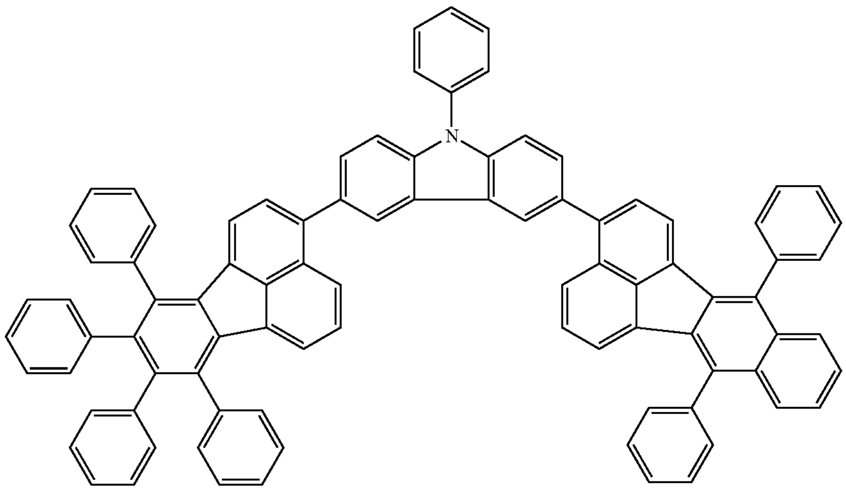
1-114
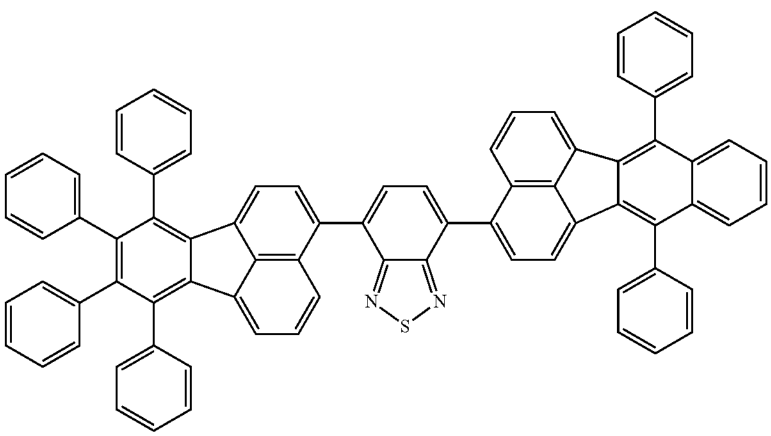
[Chemical Formula 145]
2-1
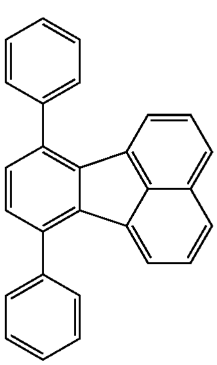
2-2
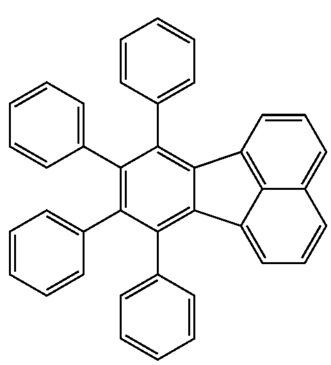

-continued
2-3
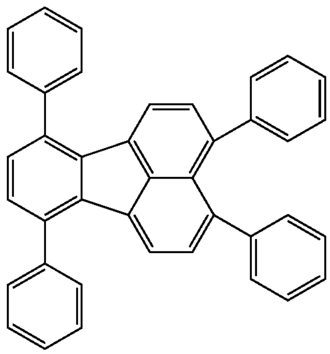
2-4
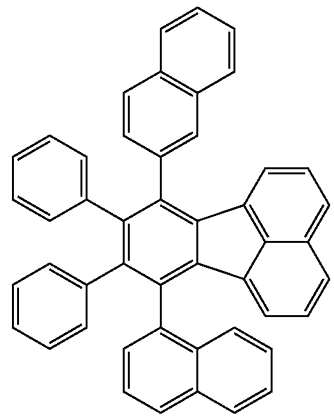
2-5
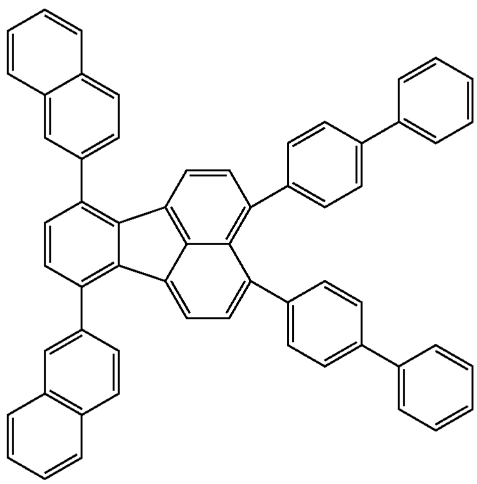
2-6
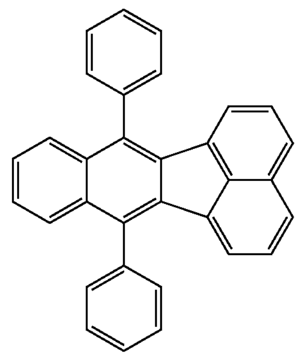
2-7
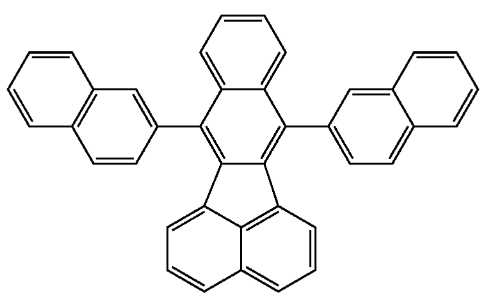
2-8
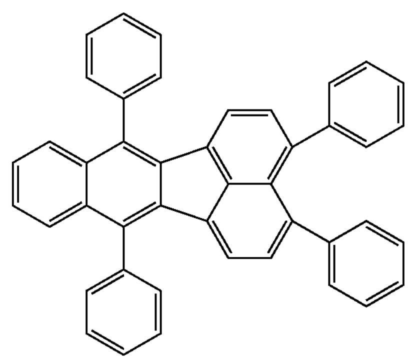
2-9
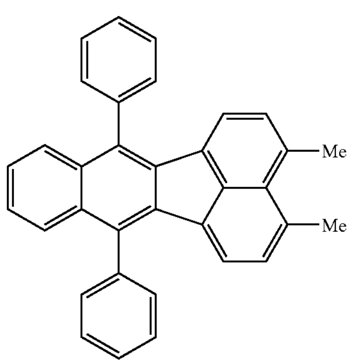
2-10
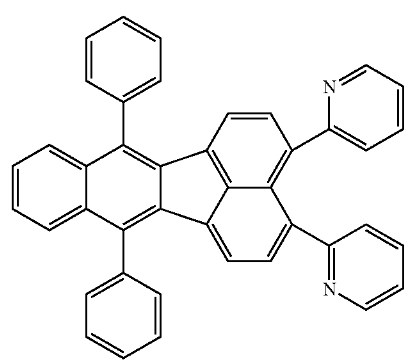

-continued
2-11
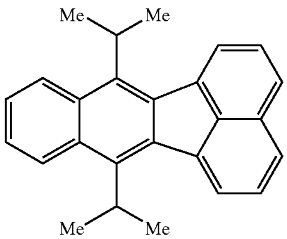
2-12
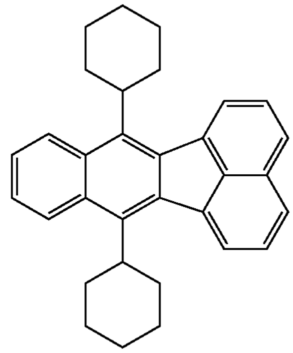
2-13
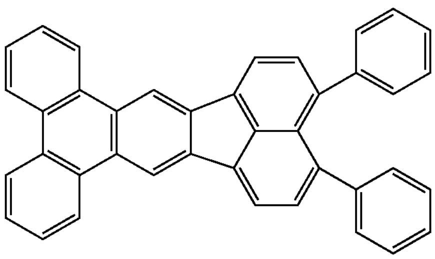
2-14
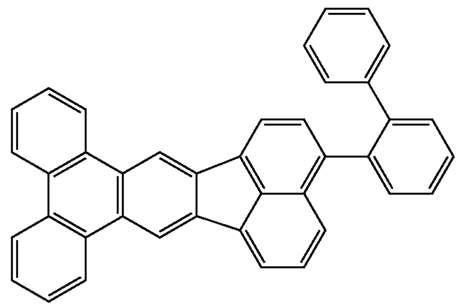
2-15
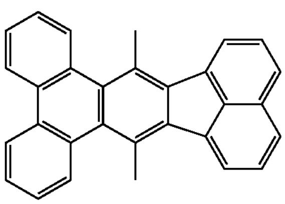
2-16
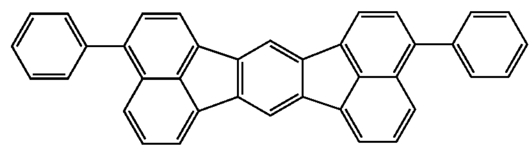
2-17
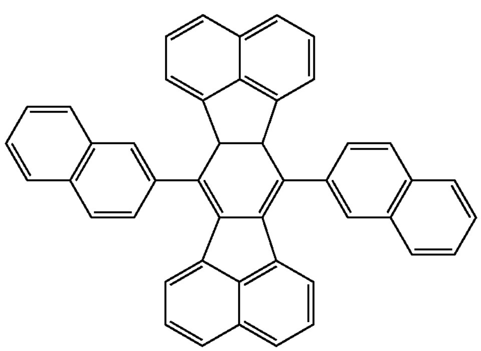
2-18
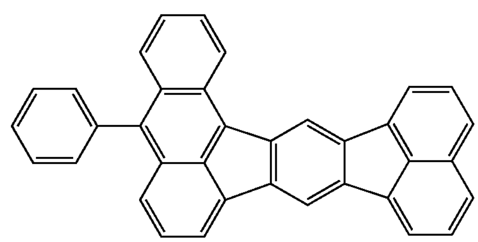
2-19
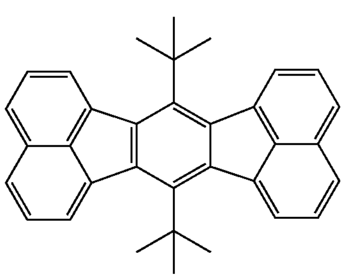

-continued
[Chemical Formula 146]
2-20
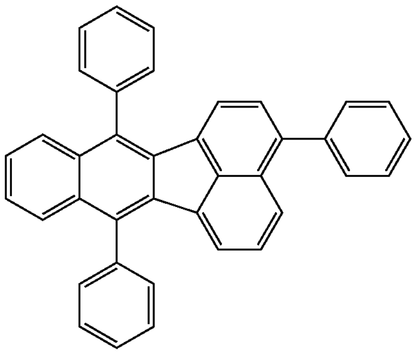
2-21
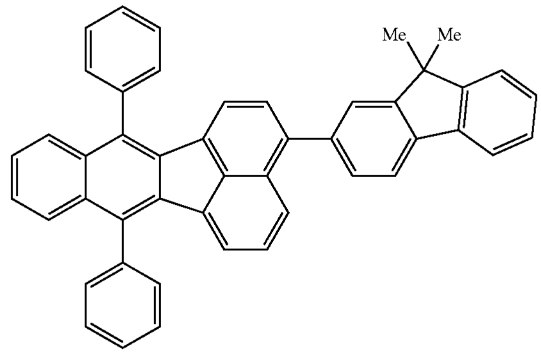
2-22
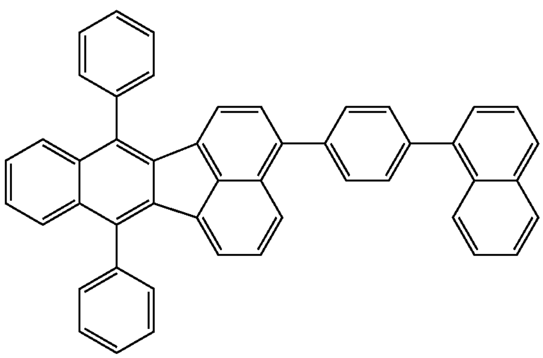
2-23
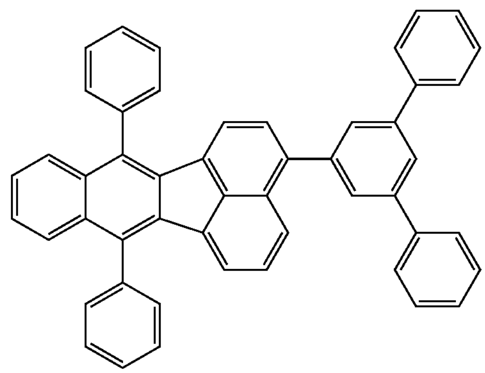
2-24
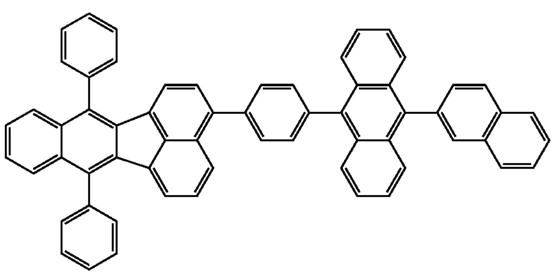
2-25
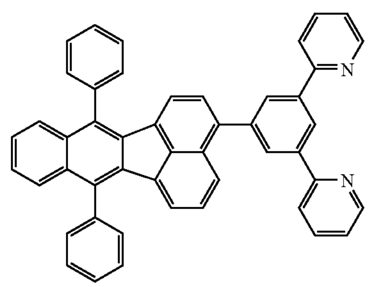
2-26
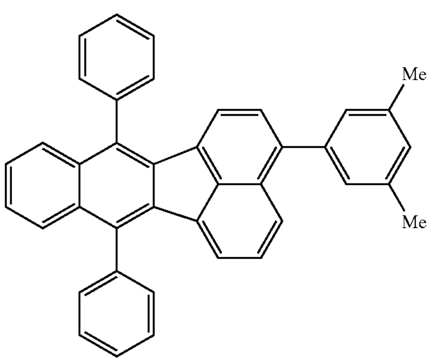
2-27
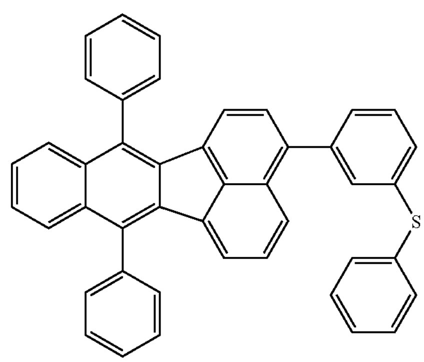

-continued
2-28
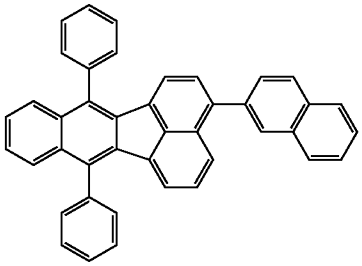
2-29
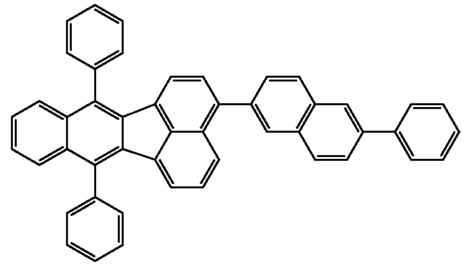
2-30
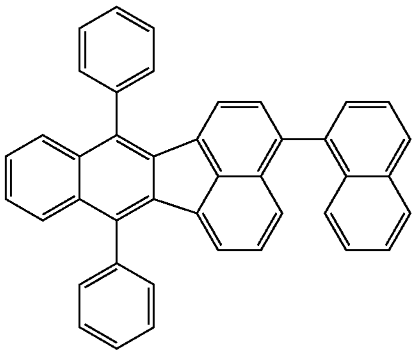
2-31
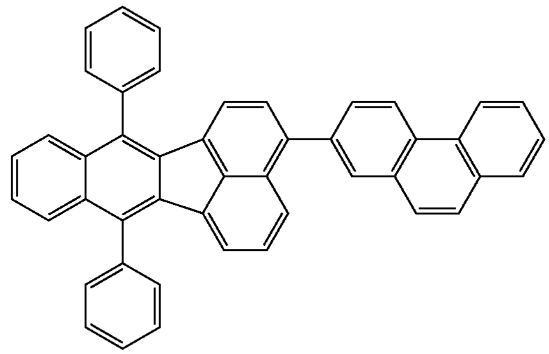
2-32
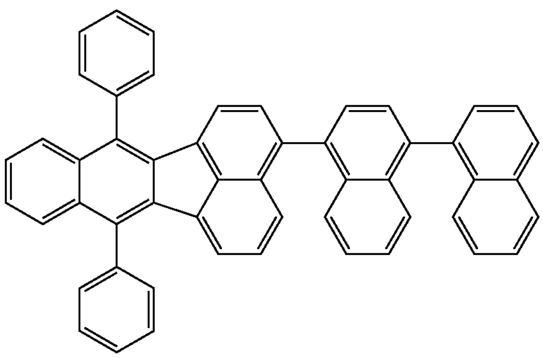
2-33
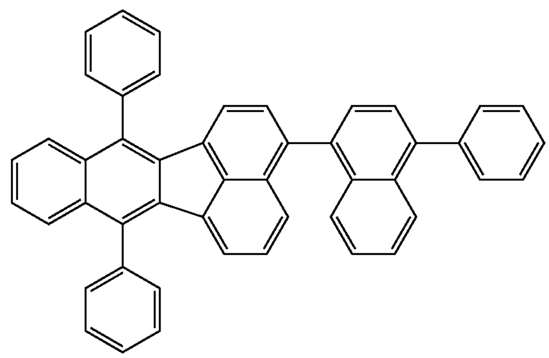
2-34
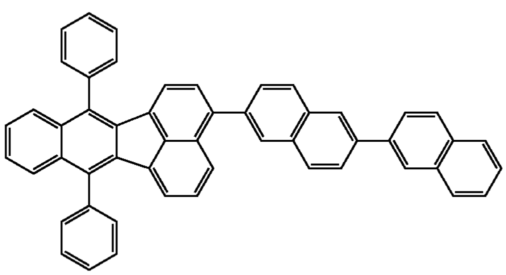
2-35
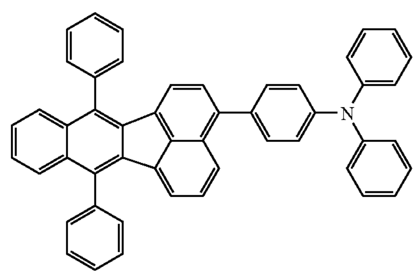
[Chemical Formula 147]
2-36
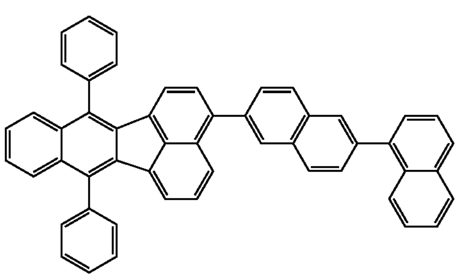
2-37
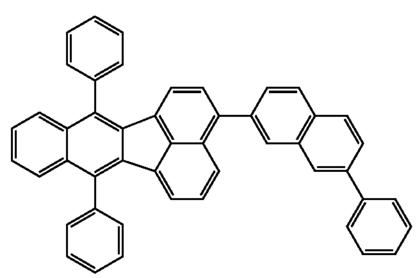

-continued
2-38
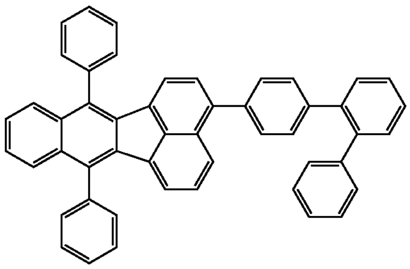
2-39
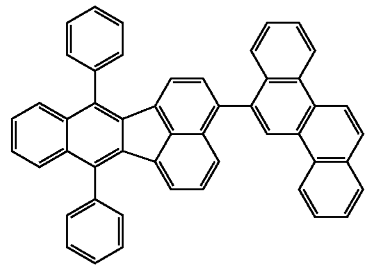
2-40
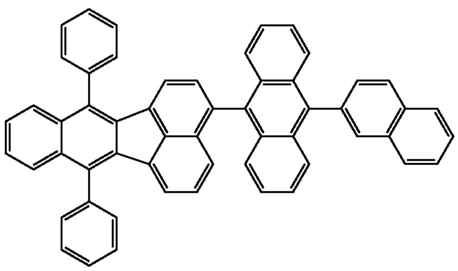
2-41
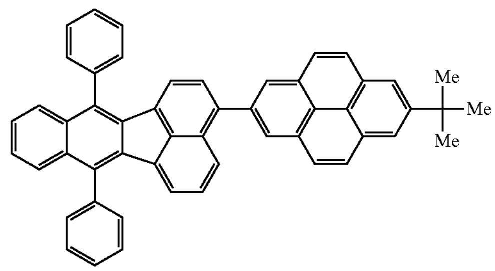
2-42
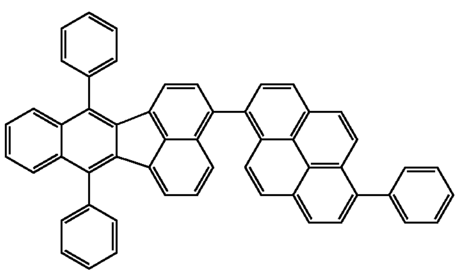
2-43
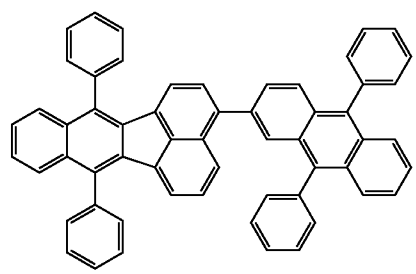
2-44
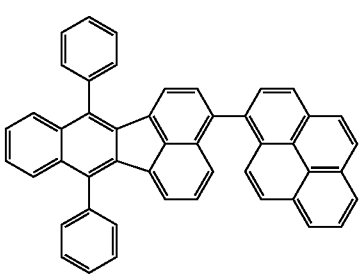
2-45
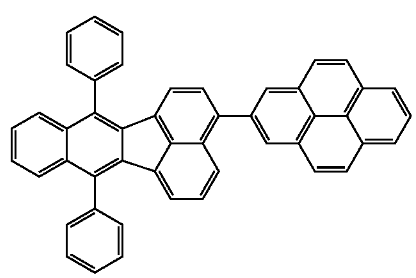
2-46
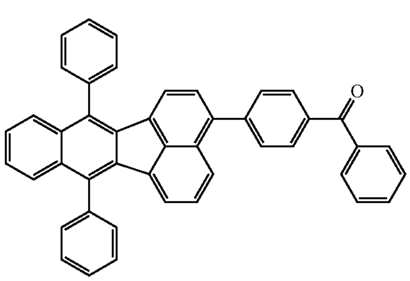
2-47
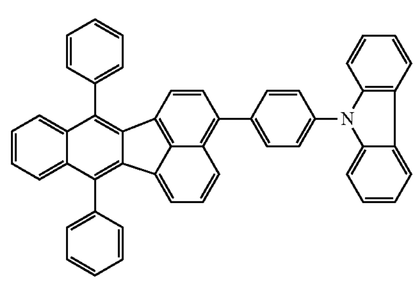

-continued
2-48
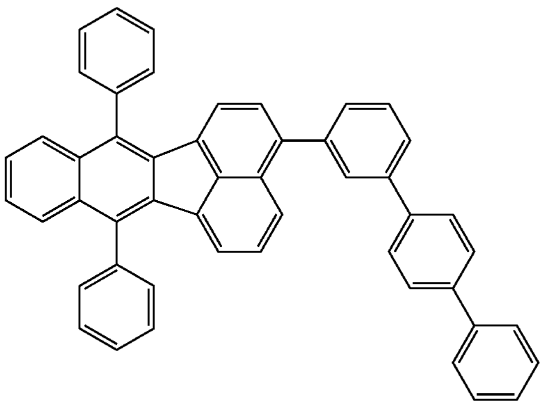
2-49
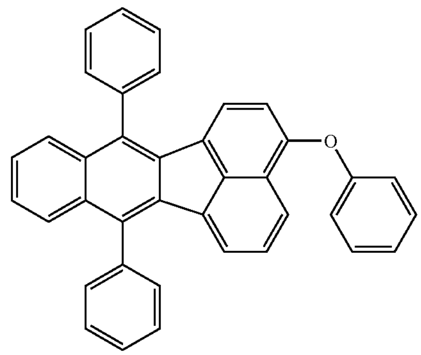
2-50
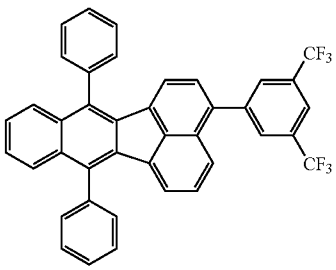
2-51
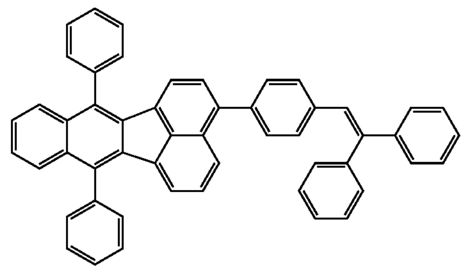
[Chemical Formula 148]
2-52
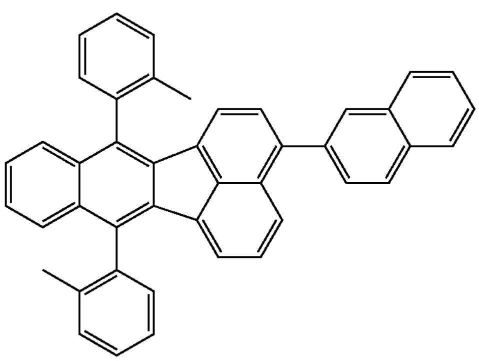
2-53
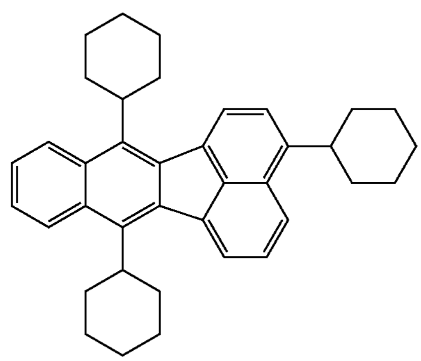
2-54
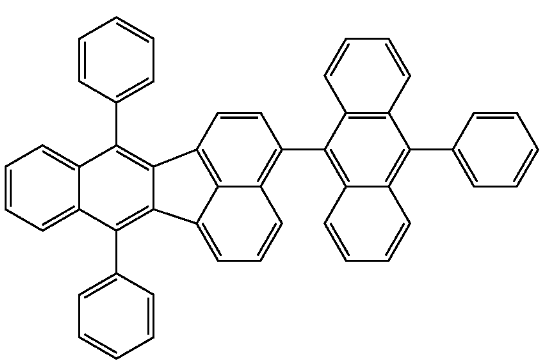
2-55
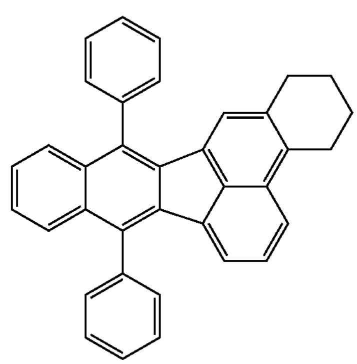

-continued
2-56
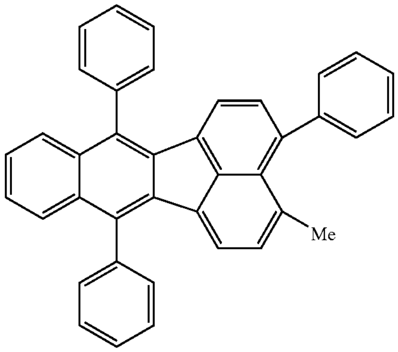
2-57
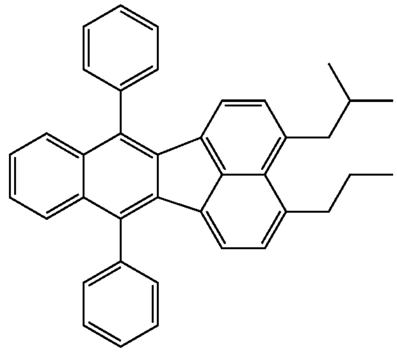
2-58
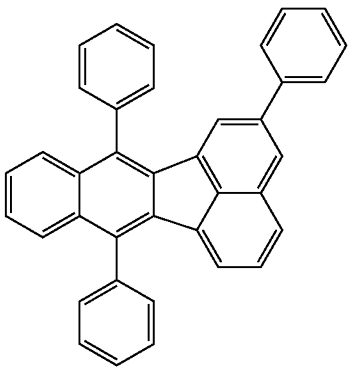
2-59
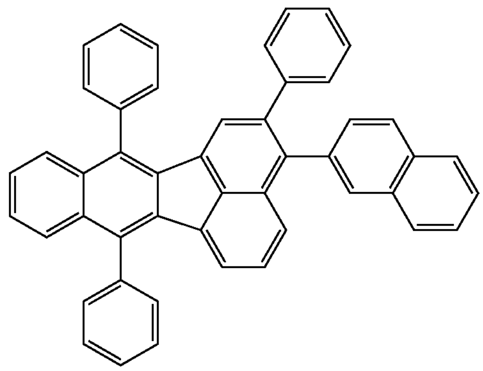
2-60
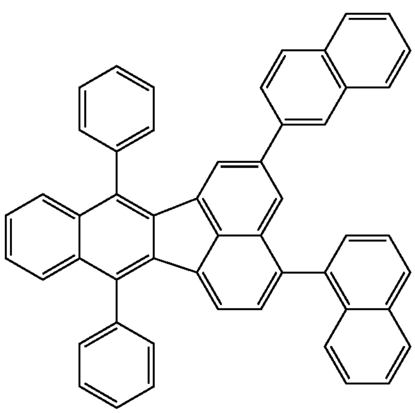
2-61
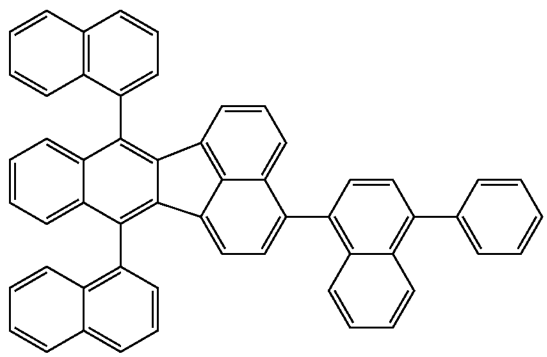
2-62
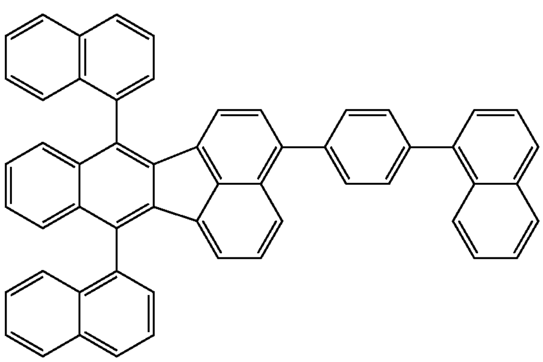
2-63
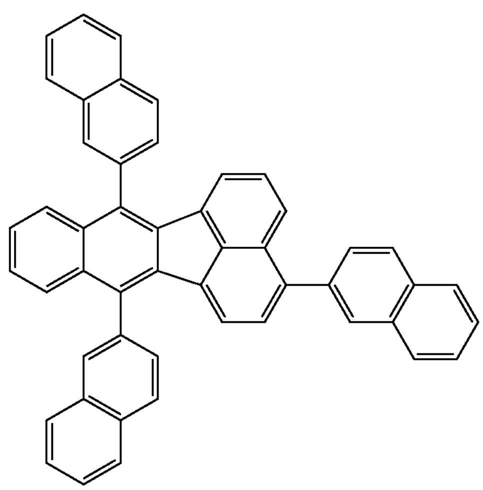

-continued
2-64
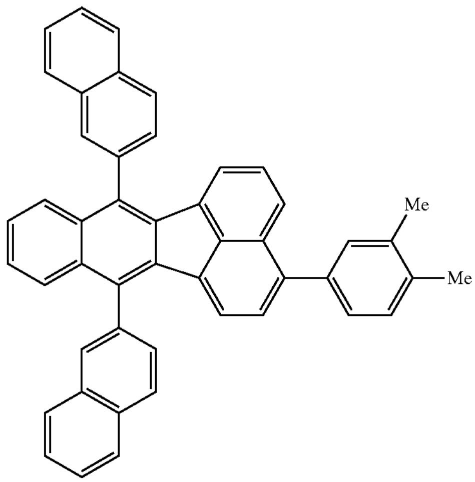
2-65
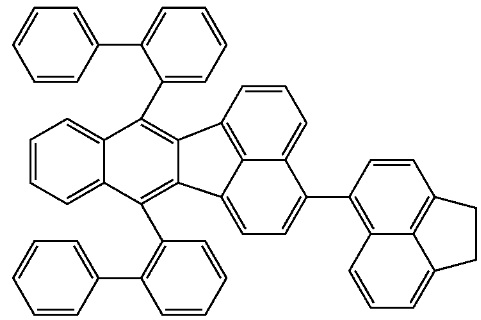
2-66
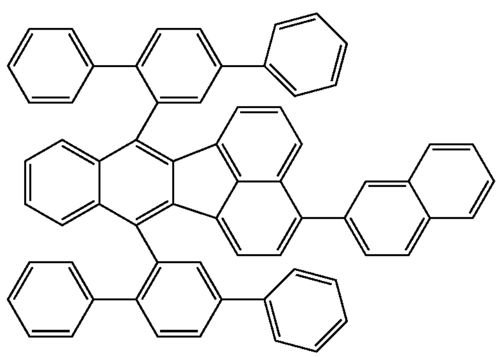
2-67
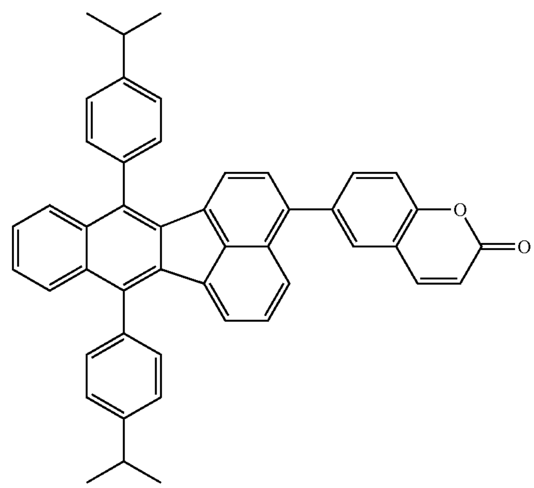
2-68
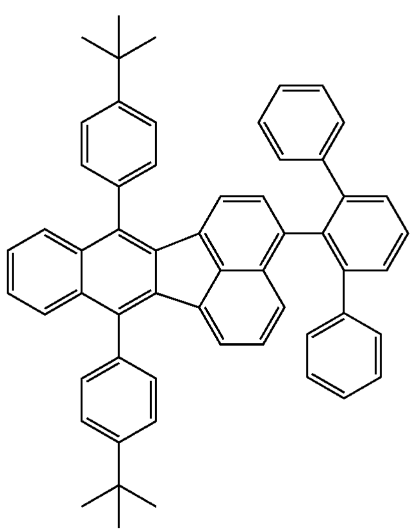

-continued
[Chemical Formula 149]
2-69
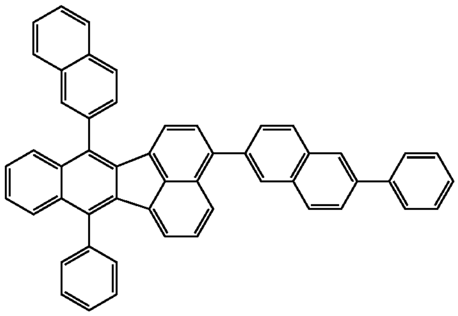
2-70
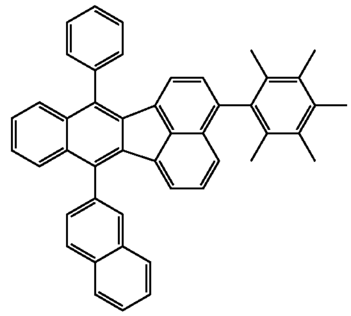
2-71
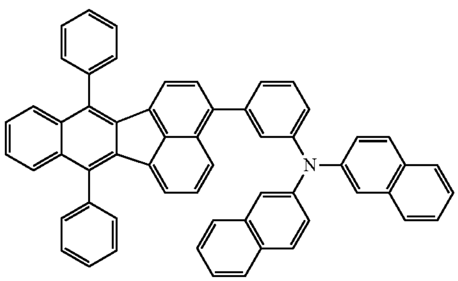
2-72
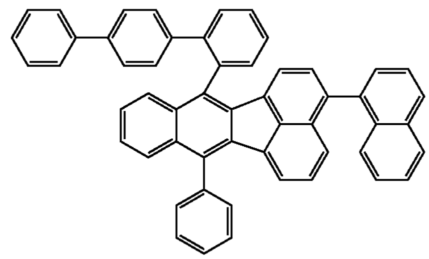
2-73
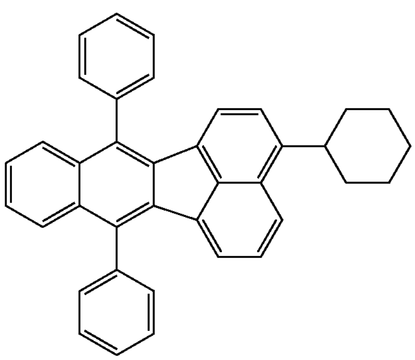
2-74
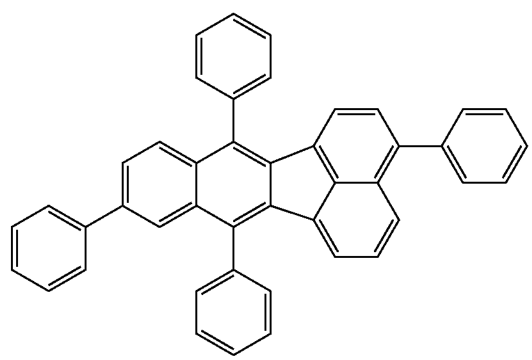
2-75
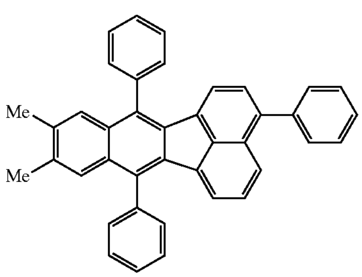
2-76
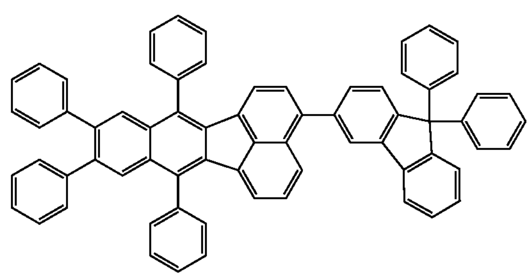

-continued
2-77
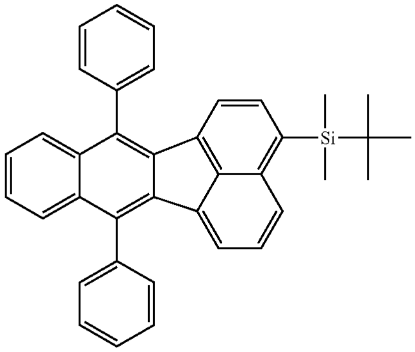
2-78
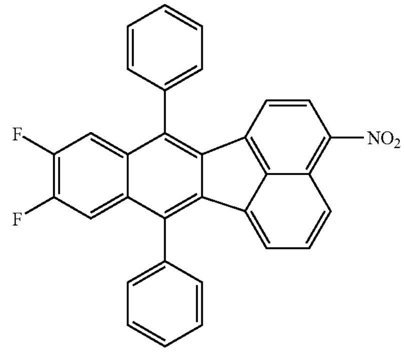
2-79
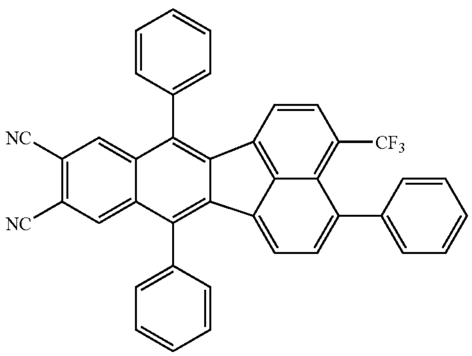
2-80
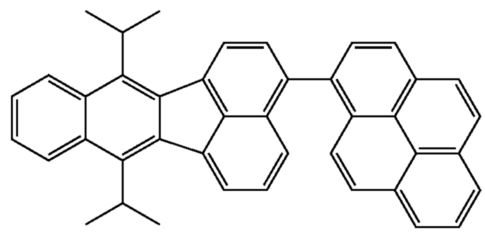
2-81
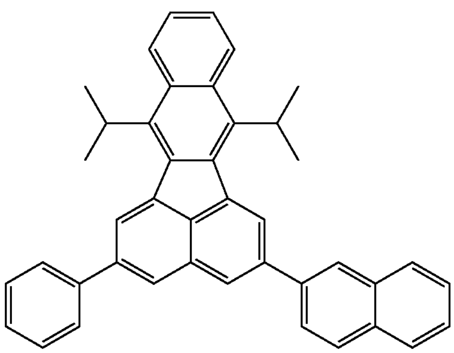
2-82
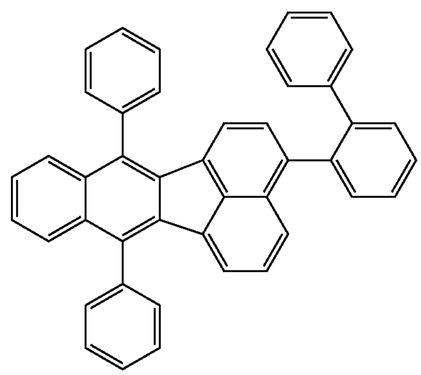
2-83
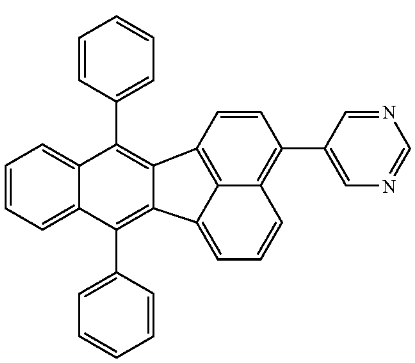
2-84
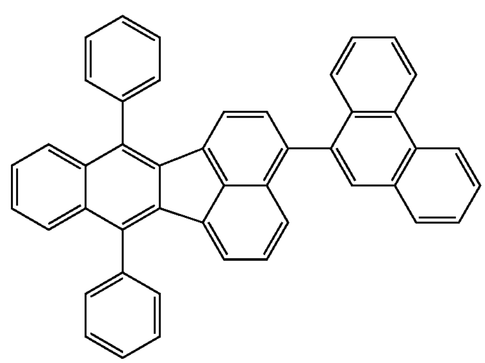

-continued 2-85

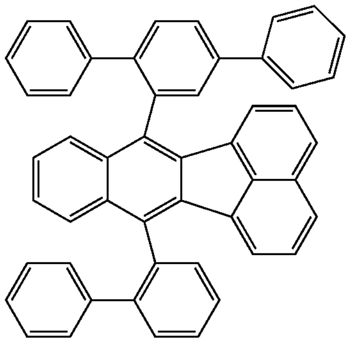

2-86

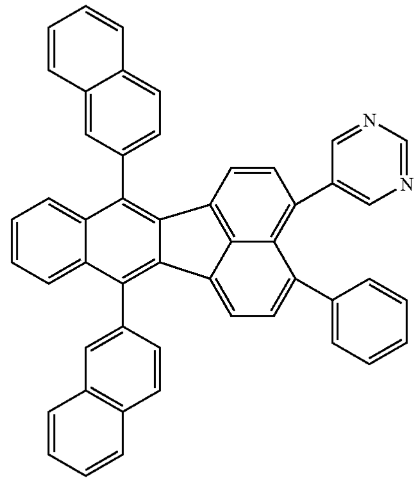

The fluorescent dopant according to the aspect of the invention may be represented by a formula (25) below.

[Chemical Formula 150]

(25)

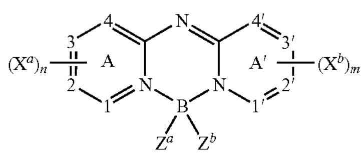

In the formula (25), A and A' each represent an independent azine ring system corresponding to a six-membered aromatic ring containing one or more nitrogen. $X^a$ and $X^b$ represent independently-selected substituents capable of being bonded together to form a fused ring with respect to A or A'. m and n each independently represent 0 to 4. $Z^a$ and $Z^b$ represent independently-selected substituents. 1, 2, 3, 4, 1', 2', 3' and 4' are each independently selected from a carbon atom and nitrogen atom.

The azine ring is preferably a quinolinyl ring or isoquinolinyl ring in which: all of 1, 2, 3, 4, 1', 2', 3' and 4' are carbon atoms; m and n each are 2 or more; and $X^a$ and $X^b$ represent 2 or more carbon-substituted groups bonded to form an aromatic ring. $Z^a$ and $Z^b$ are preferably fluorine atoms.

A fluorescent dopant of one preferable embodiment is structured such that: the two fused ring systems are quinoline or isoquinoline systems; aryl or heteroaryl substituents are phenyl groups; at least two $X^a$ groups and two $X^b$ groups are present to form 6-6 fused rings by bonding together; the fused ring systems each are fused in 1-2 position, 3-4 position, 1'-2' position or 3'-4' position; and at least either one of the fused rings is substituted by a phenyl group. The fluorescent dopant is represented by the following formula (91), (92) or (93).

[Chemical Formula 151]

(91)

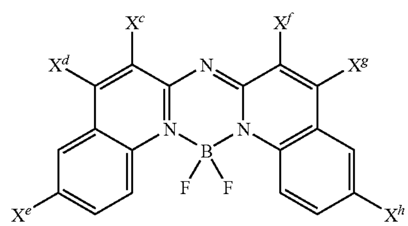

(92)

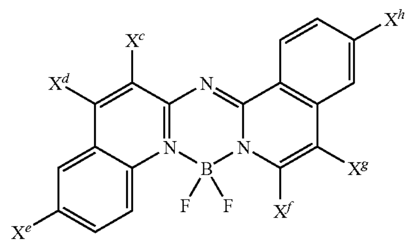

(93)

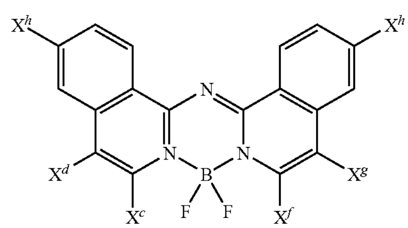

In the formulae (91) to (93), each of $X^c$, $X^d$, $X^e$, $X^f$, $X^g$ and $X^h$ represents a hydrogen atom or an independently-selected substituent. One of them must represent an aryl group or heteroaryl group.

The azine ring is preferably a quinolinyl ring or isoquinolinyl ring in which: all of 1, 2, 3, 4, 1', 2', 3' and 4' are carbon atoms; m and n each are 2 or more; $X^a$ and $X^b$ represent 2 or more carbon-substituted groups bonded to form an aromatic ring; and one of $X^a$ and $X^b$ represents an aryl group or substituted aryl group. $Z^a$ and $Z^b$ are preferably fluorine atoms.

A boron compound usable in the aspect of the invention will be exemplified below. The boron compound is complexated by two ring nitrogen atoms of deprotonated bis(azinyl) amine ligand, and the two ring nitrogen atoms are parts of different 6,6 fused ring systems. At least either one of the 6,6 fused ring systems contains an aryl or heteroaryl substituent.

[Chemical Formula 152]

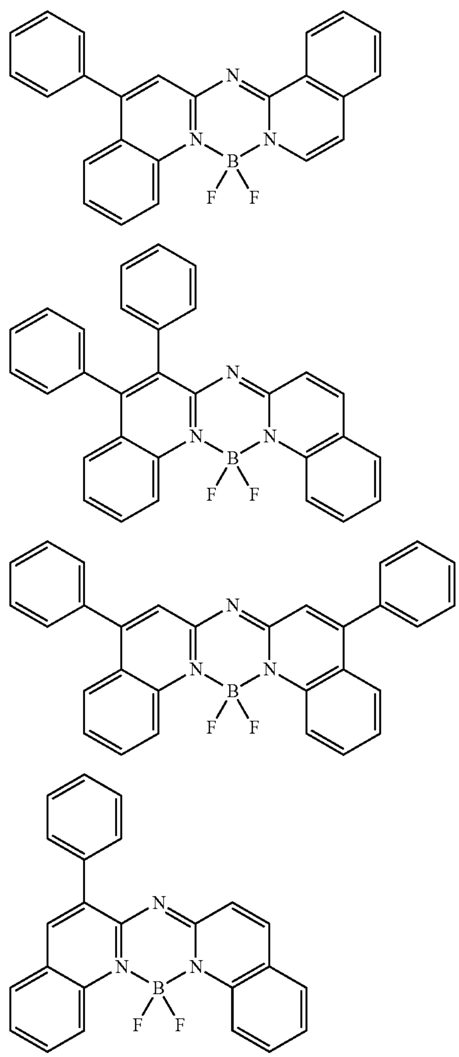

[Chemical Formula 153]

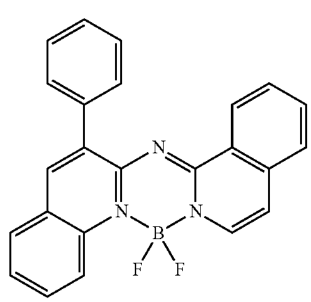

-continued

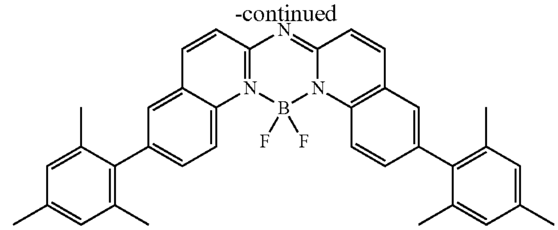

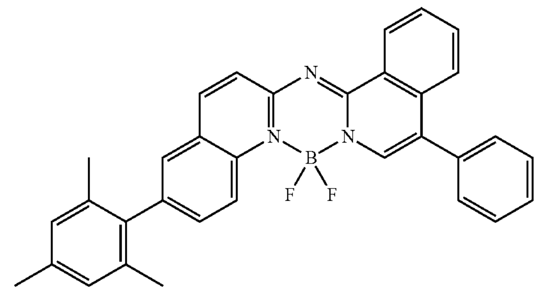

Preferably in the aspect of the invention, the organic thin-film layer includes an electron injecting layer between the cathode and the mixed-color emitting layer, and the electron injecting layer contains a nitrogen-containing heterocyclic derivative.

With use of the nitrogen-containing cyclic derivative having high electron performance in the electron injecting/transporting layer, the driving voltage can be lowered.

Particularly in the aspect of the invention, the emitting layer (fluorescent emitting layer and phosphorescent emitting layer) is formed of a host having a wider gap than a conventional host for a fluorescent emitting layer such as an anthracene derivative. Thus, the charge injection barrier may be easily increased, so that the driving voltage may be easily raised.

In this respect, since the electron transporting layer having high electron transporting performance is included, increase in the driving voltage can be prevented.

The electron injecting layer or the electron transporting layer, which aids injection of the electrons into the emitting layer, has a high electron mobility. The electron injecting layer is provided for adjusting energy level, by which, for instance, sudden changes of the energy level can be reduced. As a material for the electron injecting layer or the electron transporting layer, 8-hydroxyquinoline or a metal complex of its derivative, an oxadiazole derivative and a nitrogen-containing heterocyclic derivative are preferable. An example of the 8-hydroxyquinoline or the metal complex of its derivative is a metal chelate oxinoid compound containing a chelate of oxine (typically 8-quinolinol or 8-hydroxyquinoline). For instance, tris(8-quinolinol)aluminum can be used. Examples of the oxadiazole derivative are as follows.

[Chemical Formula 154]

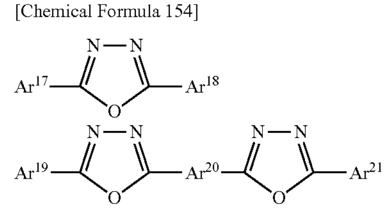

-continued

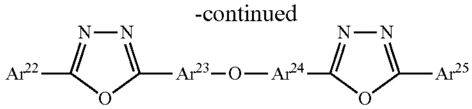

In the formula, $Ar^{17}$, $Ar^{18}$, $Ar^{19}$, $Ar^{21}$, $Ar^{22}$ and $Ar^{25}$ each represent a substituted or unsubstituted arylene group. $Ar^{17}$, $Ar^{19}$ and $Ar^{22}$ may be the same as or different from $Ar^{18}$, $Ar^{21}$ and $Ar^{25}$ respectively. $Ar^{20}$, $Ar^{23}$ and $Ar^{24}$ each represent a substituted or unsubstituted arylene group. $Ar^{23}$ and $Ar^{24}$ may be mutually the same or different.

Examples of the aryl group in the general formulae (13) to (15) are a phenyl group, biphenyl group, anthranil group, perylenyl group and pyrenyl group. Examples of the arylene group are a phenylene group, naphthylene group, biphenylene group, anthranylene group, perylenylene group and pyrenylene group. Examples of the substituent therefor are an alkyl group having 1 to 10 carbon atoms, alkoxy group having 1 to 10 carbon atoms and cyano group. Such an electron transport compound is preferably an electron transport compound that can be favorably formed into a thin film(s). Examples of the electron transport compounds are as follows.

-continued (B)

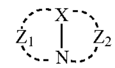

In the formula, X represents a carbon atom or a nitrogen atom. $Z_1$ and $Z_2$ each independently represent an atom group capable of forming a nitrogen-containing heterocycle.

In the formula (B), X represents a carbon atom or nitrogen atom. $Z_1$ and $Z_2$ each independently represent an atom group capable of forming a nitrogen-containing heterocycle.

[Chemical Formula 157]

(C)

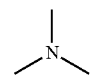

The nitrogen-containing heterocyclic derivative is preferably an organic compound having a nitrogen-containing five-membered or six-membered aromatic polycyclic group.

[Chemical Formula 155]

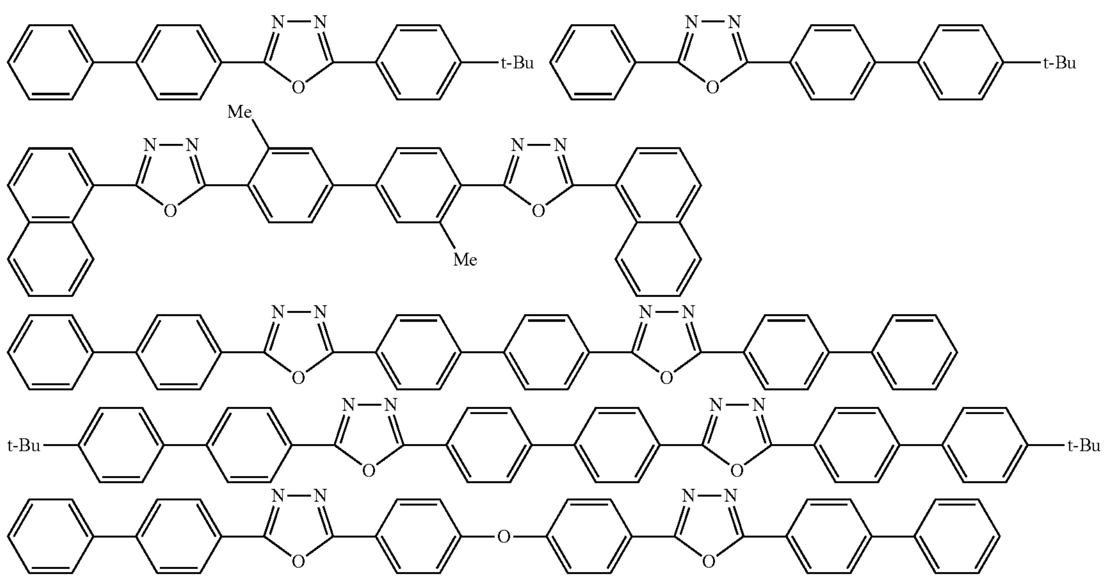

An example of the nitrogen-containing heterocyclic derivative is a nitrogen-containing compound that is not a metal complex, the derivative being formed of an organic compound represented by one of the following general formulae. Examples of the nitrogen-containing heterocyclic derivative are five-membered ring or six-membered ring derivative having a skeleton represented by the formula (A) and a derivative having a structure represented by the formula (B).

[Chemical Formula 156]

(A)

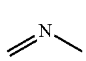

When the number of the nitrogen atoms is plural, the nitrogen atoms bonded to the skeleton thereof in non-adjacent positions. When the nitrogen-containing heterocyclic derivative includes such nitrogen-containing aromatic polycyclic series having plural nitrogen atoms, the nitrogen-containing heterocyclic derivative may be a nitrogen-containing aromatic polycyclic organic compound having a skeleton formed by a combination of the skeletons respectively represented by the formulae (A) and (B), or by a combination of the skeletons respectively represented by the formulae (A) and (C).

A nitrogen-containing group of the nitrogen-containing organic compound is selected from nitrogen-containing heterocyclic groups respectively represented by the following general formulae.

[Chemical Formula 158]

(2)

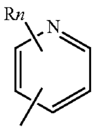

(3)

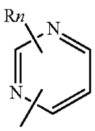

(4)

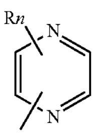

(5)

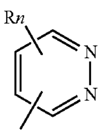

(6)

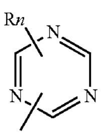

(7)

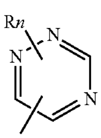

(8)

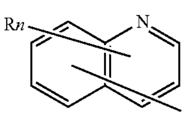

(9)

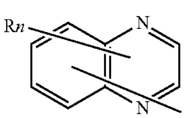

(10)

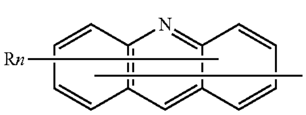

(11)

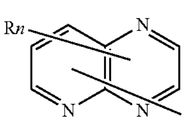

(12)

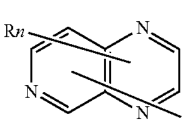

(13)

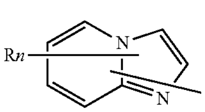

-continued (14)

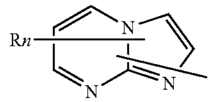

(15)

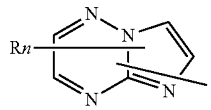

(16)

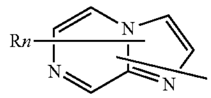

(17)

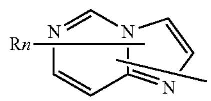

(18)

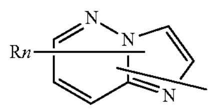

(19)

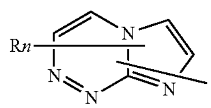

(20)

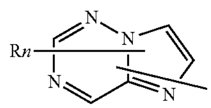

(21)

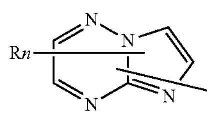

(22)

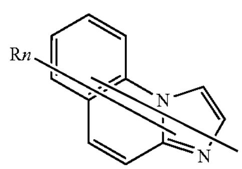

(23)

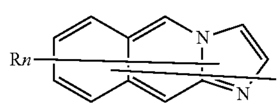

(24)

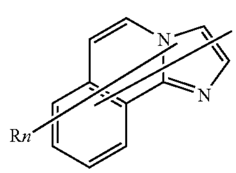

In the formulae (2) to (24): R represents an aryl group having 6 to 40 carbon atoms, a heteroaryl group having 3 to 40 carbon atoms, an alkyl group having 1 to 20 carbon atoms or an alkoxy group having 1 to 20 carbon atoms; and n represents an integer in a range of 0 to 5. When n is an integer of 2 or more, the plurality of R may be mutually the same or different.

A preferable specific compound is a nitrogen-containing heterocyclic derivative represented by the following formula.

[Chemical Formula 159]

$$HAr\text{-}L^1\text{-}Ar^1\text{—}Ar^2$$

In the formula, HAr represents a substituted or unsubstituted nitrogen-containing heterocycle having 3 to 40 carbon atoms; $L^1$ represents a single bond, a substituted or unsubstituted arylene group having 6 to 40 carbon atoms, or a substituted or unsubstituted heteroarylene group having 3 to 40 carbon atoms; $Ar^1$ represents a substituted or unsubstituted divalent aromatic hydrocarbon group having 6 to 40 carbon atoms; and $Ar^2$ represents a substituted or unsubstituted aryl group having 6 to 40 carbon atoms, or a substituted or unsubstituted heteroaryl group having 3 to 40 carbon atoms.

HAr is exemplarily selected from the following group.

[Chemical Formula 160]

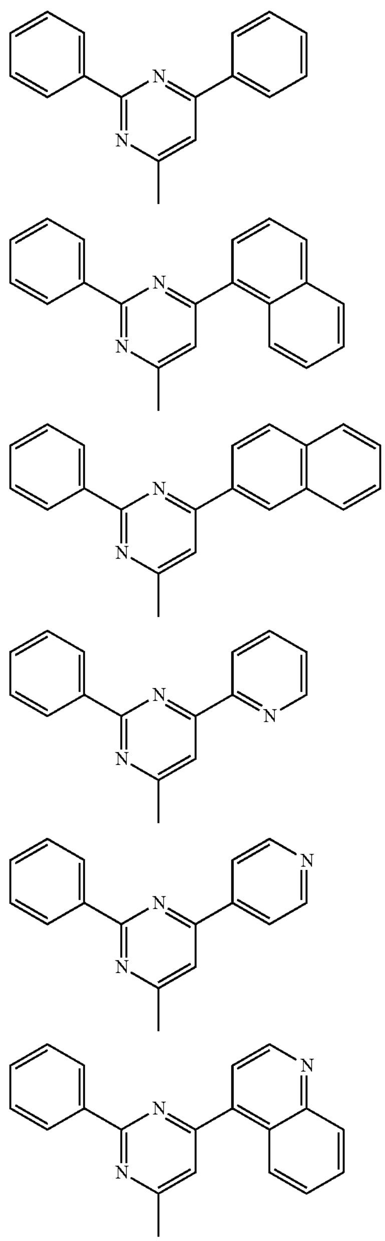

-continued

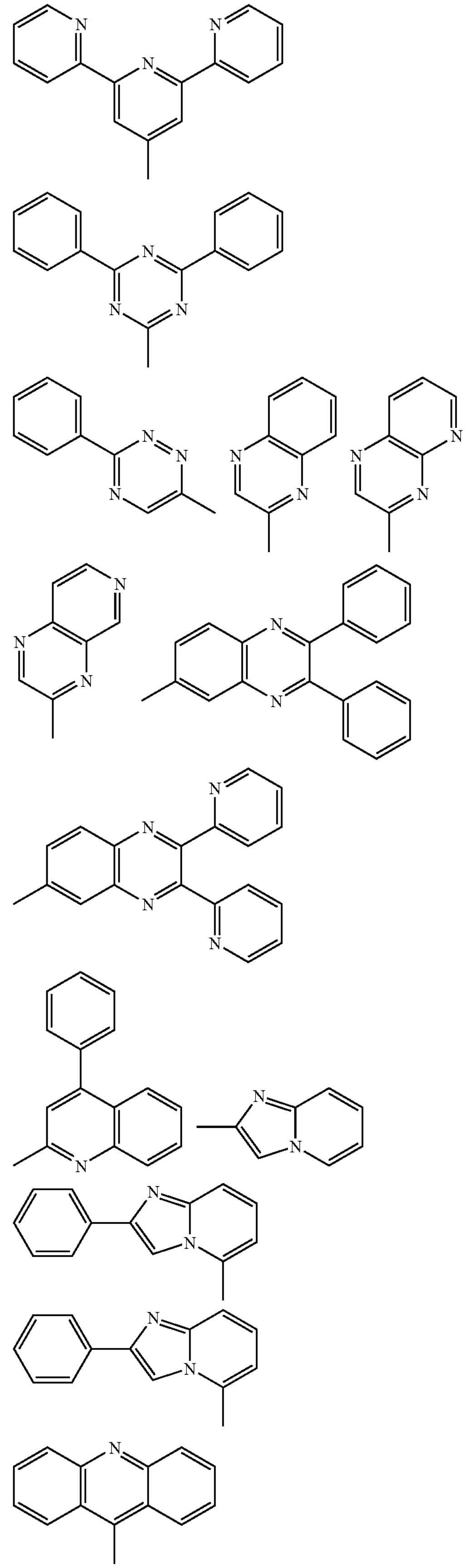

-continued

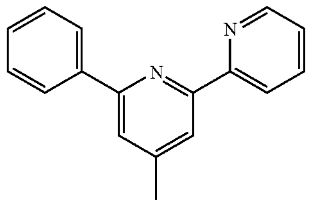

$L^1$ is exemplarily selected from the following group.

[Chemical Formula 161]

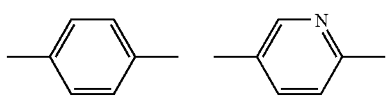

$Ar^2$ is exemplarily selected from the following group.

[Chemical Formula 162]

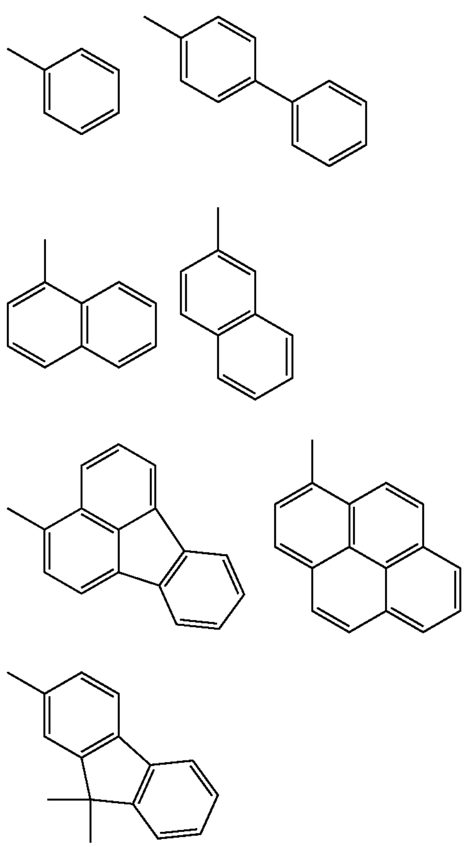

$Ar^1$ is exemplarily selected from the following arylanthranil groups.

[Chemical Formula 163]

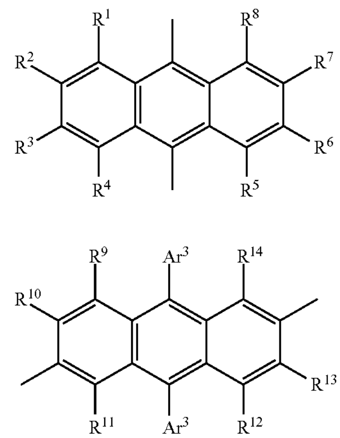

In the formula, $R^1$ to $R^{14}$ each independently represent a hydrogen atom, halogen atom, alkyl group having 1 to 20 carbon atoms, alkoxy group having 1 to 20 carbon atoms, aryloxy group having 6 to 40 carbon atoms, substituted or unsubstituted aryl group having 6 to 40 carbon atoms or heteroaryl group having 3 to 40 carbon atoms. $Ar^3$ represents a substituted or unsubstituted aryl group having 6 to 40 carbon atoms or heteroaryl group having 3 to 40 carbon atoms.

The nitrogen-containing heterocyclic derivative may be a nitrogen-containing heterocyclic derivative in which $R^1$ to $R^8$ in the structure of $Ar^1$ represented by the above formula each represent a hydrogen atom.

Other than the above, the following compound (see JP-A-9-3448) can be favorably used.

[Chemical Formula 164]

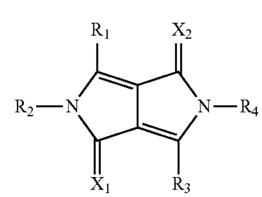

In the formula, $R_1$ to $R_4$ each independently represent a hydrogen atom, a substituted or unsubstituted aliphatic group, a substituted or unsubstituted alicyclic group, a substituted or unsubstituted carbocyclic aromatic ring group, or substituted or unsubstituted heterocyclic group. $X_1$ and $X_2$ each independently represent an oxygen atom, a sulfur atom or a dicyanomethylene group.

Alternatively, the following compound (see JP-A-2000-173774) can also be favorably used.

[Chemical Formula 165]

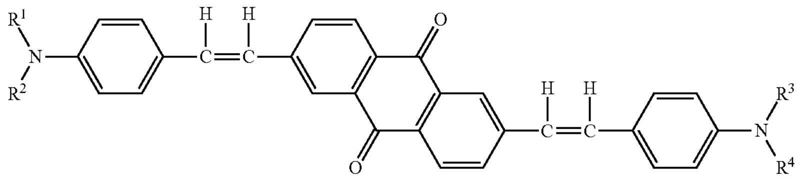

In the formula, $R^1$, $R^2$, $R^3$ and $R^4$, which may be mutually the same or different, each represent an aryl group represented by the following formula.

[Chemical Formula 166]

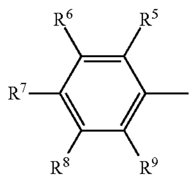

In the formula, $R^5$, $R^6$, $R^7$, $R^8$ and $R^9$, which may be mutually the same or different, each represent a hydrogen atom, a saturated or unsaturated alkoxyl group, an alkyl group, an amino group or an alkylamino group. At least one of $R^5$, $R^6$, $R^7$, $R^8$ and $R^9$ represents a saturated or unsaturated alkoxyl group, an alkyl group, an amino group or an alkylamino group.

A polymer compound containing the nitrogen-containing heterocyclic group or a nitrogen-containing heterocyclic derivative may be used.

Although thickness of the electron injecting layer or the electron transporting layer is not specifically limited, the thickness is preferably 1 to 100 nm.

In the organic EL device according to the aspect of the invention, a reduction-causing dopant may be preferably contained in an interfacial region between the cathode and the organic thin-film layer.

With this arrangement, the organic EL device can emit light with enhanced luminance intensity and have a longer lifetime.

The reduction-causing dopant is defined as a substance capable of reducing an electron-transporting compound. Accordingly, as long as the substance has reducibility of a predetermined level, various substances may be usable. For instance, at least one substance selected from a group consisting of alkali metal, alkali earth metal, rare-earth metal, oxide of alkali metal, halide of alkali metal, oxide of alkali earth metal, halide of alkali earth metal, oxide of rare-earth metal, halide of rare-earth metal, organic complex of alkali metal, organic complex of alkali earth metal and organic complex of rare-earth metal can be favorably used.

Specifically, a preferable reduction-causing dopant is at least one alkali metal selected from a group consisting of Li (work function: 2.9 eV), Na (work function: 2.36 eV), K (work function: 2.28 eV), Rb (work function: 2.16 eV) and Cs (work function: 1.95 eV), or at least one alkali earth metal selected from a group consisting of Ca (work function: 2.9 eV), Sr (work function: 2.0 to 2.5 eV) and Ba (work function: 2.52 eV). A substance having work function of 2.9 eV or less is particularly preferable. Among the above, a more preferable reduction-causing dopant is at least one alkali metal selected from a group consisting of K, Rb and Cs. A further more preferable reduction-causing dopant is Rb or Cs. The most preferable reduction-causing dopant is Cs. Since the above alkali metals have particularly high reducibility, addition of a relatively small amount of these alkali metals to an electron injecting zone can enhance luminance intensity and lifetime of the organic EL device. As a reduction-causing dopant having work function of 2.9 eV or less, a combination of two or more of the alkali metals is also preferable. Particularly, a combination including Cs (e.g., Cs and Na, Cs and K, Cs and Rb, or Cs, Na and K) is preferable. A reduction-causing dopant containing Cs in a combining manner can efficiently exhibit reducibility. Addition of the reduction-causing dopant to the electron injecting zone can enhance luminance intensity and lifetime of the organic EL device.

An organic-EL-material-containing solution according to another aspect of the invention contains the host, the fluorescent dopant and the phosphorescent dopant and a solvent, the host, the fluorescent dopant and the phosphorescent dopant being dissolved in the solvent.

According to the organic-EL-material-containing solution, the above-described mixed-color emitting layer can be easily formed into film(s) with low cost by a coating method such as ink printing and nozzle jetting.

Example of the solvent for the organic-EL-material-containing solution are a biphenyl derivative and cyclic ketone.

The biphenyl derivative is exemplarily alkyl-substituted biphenyl, examples of which are methylbiphenyl, ethylbiphenyl, diethylbiphenyl, isopropylbiphenyl, diisopropylbiphenyl, n-propylbiphenyl, n-pentylbiphenyl and methoxybiphenyl.

The alkyl group of the alkyl-substituted biphenyl more preferably has 1 to 5 carbon atoms. When the alkyl group has 1 to 5 carbon atoms, viscosity and solubility can be suitably balanced.

For instance, materials such as ethylbiphenyl and isopropylbiphenyl are favorably usable as the solvent for the organic-EL-material-containing solution according to the aspect of the invention.

With respect to the composition of the solvent, 100% of the solvent may be formed of a biphenyl derivative, or the solvent may be a mixture solution in which a viscosity control reagent and the like are mixed.

When such a mixture solution is used, 20% or more of the solvent may be formed of a biphenyl derivative, 50% or more of the solvent may be formed of a biphenyl derivative, or 75% or more of the solvent may be formed of a biphenyl derivative. In order to take advantage of the viscosity and the solubility of a biphenyl derivative, a biphenyl derivative is preferably contained at a higher proportion.

Examples of the cyclic ketone are cyclic alkyl ketones such as a cyclopentanone derivative, a cyclohexanone derivative, a cycloheptanone derivative and a cyclooctanone derivative. The above cyclic ketone may be singularly used or a plurality thereof may be mixed together in use.

Particularly, the solvent preferably contains a cyclohexanone derivative as the cyclic ketone.

Preferable examples of the cyclohexanone derivative are 2-acetylcyclohexanone, 2-methylcyclohexanone, 3-methylcyclohexanone, 4-methylcyclohexanone, 2-cyclohexylcyclohexanone, 2-(1-cyclohexenyl)cyclohexanone, 2,5-dimethylcyclohexanone, 3,4-dimethylcyclohexanone, 3,5-dimethylcyclohexanone, 4-ethylcyclohexanone, pulegone, menthone, 4-pentylcyclohexanone, 2-propylcyclohexanone, 3,3,5-trimethylcyclohexanone and thujone.

Among the above, cyclohexanone is preferable.

As the cyclic ketone, cyclic ketone containing a nitrogen ring is also preferable, examples of which are caprolactam, N-methylcaprolactam, 1,3-dimethyl-2-imidazolidine, 2-pyrolidone, 1-acetyl-2-pyrolidone, 1-butyl-2-pyrolidone, 2-piperidone and 1,5-dimethyl-2-piperidone.

A cyclic ketone compound is preferably selected from a group consisting of cyclohexanone, cyclopentanone and cycloheptanone (including derivatives thereof).

As a result of various deliberation, the inventors have found that a low-molecular organic EL material is soluble in a cyclohexanone derivative at a higher concentration than in other solvents. In addition, the inventors have also found that, since compounds soluble in cyclohexanone derivative are not narrowly limited, an organic-EL-material-containing solution in which various low-molecular organic EL materials are used can be prepared.

It has been found that, by using a cyclohexanone derivative as the solvent, an organic-EL-material-containing solution containing a sufficient amount of a low-molecular organic EL material having high performance, which has not been able to be put in use because of its low solubility in a conventional solvent, can be prepared.

Further, since a cyclohexanone derivative boils at a high boiling temperature (156 degrees C.: cyclohexanone) and has high viscosity (2cP: cyclohexanone), a cyclohexanone is suitable for coating processing such as ink jetting. A cyclohexanone derivative is also favorably mixed with an alcohol-base solvent (viscosity control reagent), particularly with a diol-base solvent, so that a high viscosity solution can be prepared by controlling the viscosity. Thus, a cyclohexanone derivative is an excellent solvent for a low-molecular organic EL material, viscosity of which hardly changes merely by dissolving the material in the solvent.

BEST MODE FOR CARRYING OUT THE INVENTION

Exemplary preferable embodiment(s) of the invention will be described below.

Organic EL Device

Figure 1:
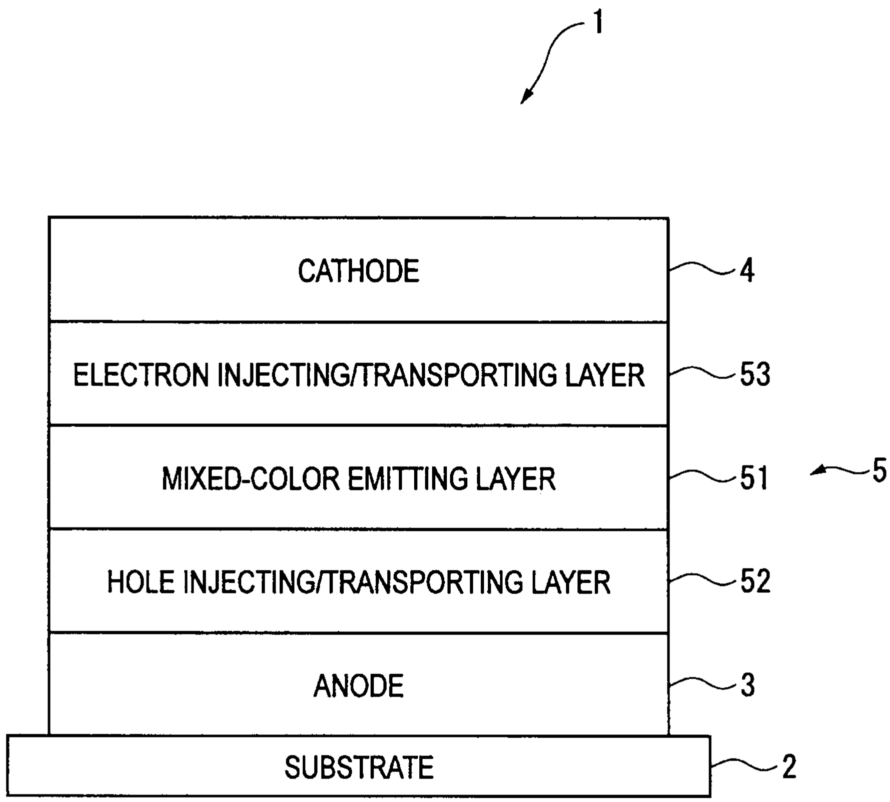
FIG. 1 schematically shows an arrangement of an organic EL device according to an exemplary embodiment of the invention.
Figure 2:
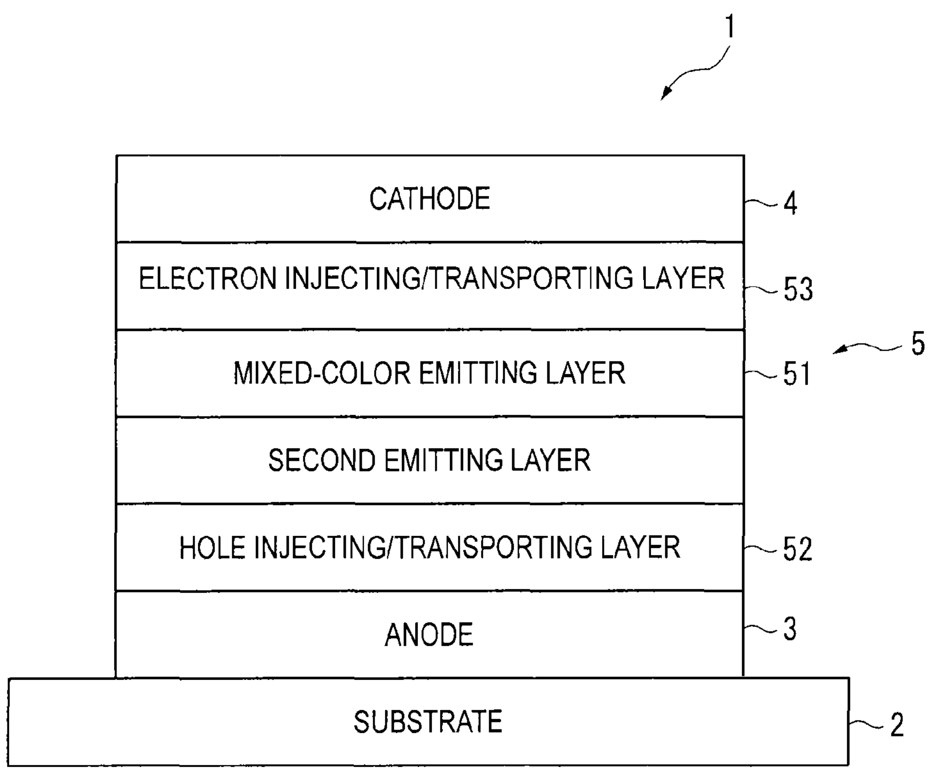
FIG. 2 schematically shows an arrangement of an organic EL device according to an exemplary embodiment of the invention that includes a second emitting layer disposed between a mixed-color emitting layer and a hole injecting/transporting layer.
Figure 3:
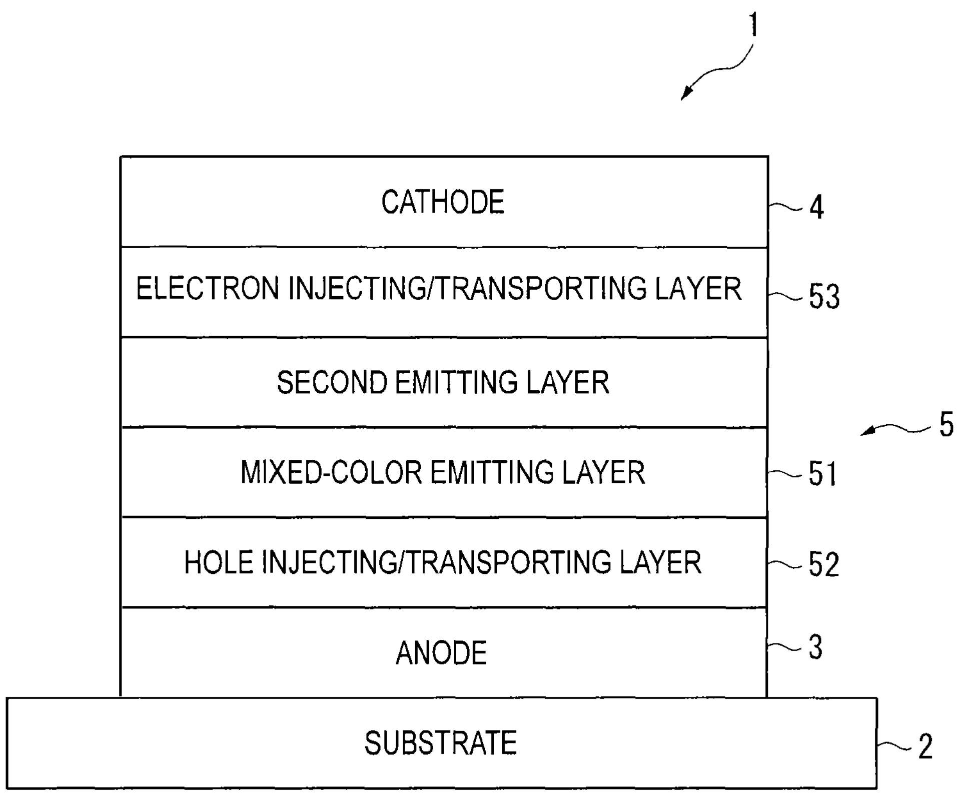
FIG. 3 schematically shows an arrangement of an organic EL device according to an exemplary embodiment of the invention that includes a second emitting layer disposed between a mixed-color emitting layer and an electron injecting/transporting layer.

FIG. 1 schematically shows an arrangement of an organic EL device according to this exemplary embodiment.

The organic EL device 1 includes a transparent substrate 2, an anode 3, a cathode 4 and an organic thin-film layer 5 positioned between the anode 3 and the cathode 4.

The organic thin-film layer 5 includes a single-layered mixed-color emitting layer 51 for providing white emission, and the mixed-color emitting layer 51 contains a host, a fluorescent dopant for blue fluorescent emission, a red phosphorescent dopant for red phosphorescent emission and a green phosphorescent dopant for green phosphorescent emission.

The organic thin-film layer 5 may include a hole injecting/transporting layer 52 between the mixed-color emitting layer 51 and the anode 3, and may also include an electron injecting/transporting layer 53 between the mixed-color emitting layer 51 and the cathode 4.

The hole injecting/transporting layer 52 may be a separately-prepared hole injecting layer and hole transporting layer.

Examples of materials to be used for at least either one of the hole injecting layer and the hole transporting layer are as follows.

Examples of the materials are a triazole derivative (see, for instance, the specification of U.S. Pat. No. 3,112,197), an oxadiazole derivative (see, for instance, the specification of U.S. Pat. No. 3,189,447), an imidazole derivative (see, for instance, JP-B-37-16096), a polyarylalkane derivative (see, for instance, the specifications of U.S. Pat. No. 3,615,402, U.S. Pat. No. 3,820,989 and U.S. Pat. No. 3,542,544, JP-B-45-555, JP-B-51-10983, JP-A-51-93224, JP-A-55-17105, JP-A-56-4148, JP-A-55-108667, JP-A-55-156953, and JP-A-56-36656), a pyrazoline derivative and a pyrazolone derivative (see, for instance, the specifications of U.S. Pat. No. 3,180,729 and U.S. Pat. No. 4,278,746, JP-A-55-88064, JP-A-55-88065, JP-49-105537, JP-A-55-51086, JP-A-56-80051, JP-A-56-88141, JP-A-57-45545, JP-A-54-112637 and JP-A-55-74546), a phenylenediamine derivative (see, for instance, the specification of U.S. Pat. No. 3,615,404, JP-B-51-10105, JP-B-46-3712, JP-B-47-25336, JP-A-54-53435, JP-A-54-110536 and JP-A-54-119925), an arylamine derivative (see, for instance, the specifications of U.S. Pat. No. 3,567,450, U.S. Pat. No. 3,180,703, U.S. Pat. No. 3,240,597, U.S. Pat. No. 3,658,520, U.S. Pat. No. 4,232,103, U.S. Pat. No. 4,175,961 and U.S. Pat. No. 4,012,376, JP-B-49-35702, JP-B-39-27577, JP-A-55-144250, JP-A-56-119132 and JP-A-56-22437 and the specification of West Germany Patent No. 1,110,518), an amino-substituted chalcone derivative (see, for instance, the specification of U.S. Pat. No. 3,526,501), an oxazole derivative (disclosed in, for instance, the specification of U.S. Pat. No. 3,257,203), a styrylanthracene derivative (see, for instance, JP-A-56-46234), a fluorenone derivative (see, for instance, JP-A-54-110837), a hydrazone derivative (see, for instance, the specification of U.S. Pat. No. 3,717,462 and JP-A-54-59143, JP-A-55-52063, JP-A-55-52064, JP-A-55-46760, JP-A-55-85495, JP-A-57-11350, JP-A-57-148749 and JP-A-02-311591), a stilbene derivative (see, for instance, JP-A-61-210363, JP-A-61-228451, JP-A-61-14642, JP-A-61-72255, JP-A-62-47646, JP-A-62-36674, JP-A-62-10652, JP-A-62-30255, JP-A-60-93455, JP-A-60-94462, JP-A-60-174749 and JP-A-60-175052), a silazane derivative (see the specification of U.S. Pat. No. 4,950,950), a polysilane type (see JP-A-02-204996), an aniline-based copolymer (see JP-A-02-282263), and a conductive polymer oligomer (particularly, thiophene oligomer) disclosed in JP-A-01-211399.

The material for the hole injecting layer, examples of which are as listed above, is preferably a porphyrin compound (disclosed in JP-A-63-295695 etc.), an aromatic tertiary amine compound or a styrylamine compound (see, for instance, the specification of U.S. Pat. No. 4,127,412, JP-A-53-27033, JP-A-54-58445, JP-A-54-149634, JP-A-54-64299, JP-A-55-79450, JP-A-55-144250, JP-A-56-119132, JP-A-61-295558, JP-A-61-98353 or JP-A-63-295695), particularly preferably an aromatic tertiary amine compound.

In addition, NPD having in the molecule two fused aromatic rings disclosed in U.S. Pat. Nos. 5,061,569, 4,4',4"-tris (N-(3-methylphenyl)-N-phenylamino)triphenylamine (hereinafter, abbreviated as MTDATA) in which three triphenylamine units disclosed in JP-A-04-308688 are bonded in a starburst form and the like may also be used.

The hole injecting layer and the hole transporting layer, which aids the injection of the holes into the emitting layer and transports the holes to the emitting region, exhibits large hole mobility while typically exhibiting as small ionization energy as 5.5 eV or less. Materials for the hole injecting layer and the hole transporting layer are preferably capable of transporting the holes to the emitting layer at lower electric strength. In addition, the hole mobility thereof is preferably $10^{-4}$ $cm^2/V \cdot sec$ when applied with an electric field of, for instance, $10^4$ to $10^6$ V/cm.

The materials for the hole injecting layer and the hole transporting layer are not specifically limited, and may be suitably selected among those typically and widely used as hole charge transporting materials in photoconductive materials and those typically used in hole injecting layers and hole transporting layers of organic EL devices.

For the hole injecting layer and the hole transporting layer, for instance, an aromatic amine derivative represented by the following formula is usable.

[Chemical Formula 167]

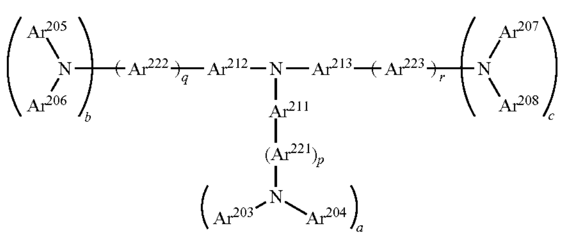

In the formula, $Ar^{211}$ to $Ar^{213}$ and $Ar^{221}$ to $Ar^{223}$ each represent a substituted or unsubstituted arylene group having 6 to 50 ring carbon atoms or a substituted or unsubstituted heteroarylene group having 5 to 50 ring atoms. $Ar^{203}$ to $Ar^{208}$ each represent a substituted or unsubstituted aryl group having 6 to 50 ring carbon atoms or a substituted or unsubstituted heteroaryl group having 5 to 50 ring atoms. a to c and p to r each represent an integer of 0 to 3. $Ar^{203}$ and $Ar^{204}$, $Ar^{205}$ and $Ar^{206}$, and $Ar^{207}$ and $Ar^{208}$ may be respectively linked together to form saturated or unsaturated rings.

Examples of the substituted or unsubstituted aryl group having 6 to 50 ring carbon atoms are a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group and 4"-t-butyl-p-terphenyl-4-yl group.

Examples of the substituted or unsubstituted arylene group having 6 to 50 ring carbon atoms are groups obtained by eliminating one hydrogen atom from the above aryl groups.

Examples of the substituted or unsubstituted heteroaryl group having 5 to 50 ring atoms are a 1-pyroryl group, 2-pyroryl group, 3-pyroryl group, pyrazinyl group, 2-pyridiny group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-3-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 24-butyl-1-indolyl group, 4-t-butyl-1-indolyl group, 2-t-butyl-3-indolyl group, 4-t-butyl-3-indolyl group and the like.

Examples of the substituted or unsubstituted heteroarylene group having 6 to 50 ring carbon atoms are groups obtained by eliminating one hydrogen atom from the above heteroaryl groups.

Further, the hole injecting layer and the hole transporting layer may contain a compound represented by the following formula.

[Chemical Formula 168]

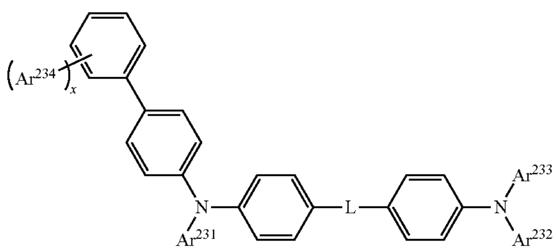

In the formula, $Ar^{231}$ to $Ar^{234}$ each represent a substituted or unsubstituted aryl group having 6 to 50 ring carbon atoms or a substituted or unsubstituted heteroaryl group having 5 to 50 ring atoms. L represents a single bond, a substituted or unsubstituted arylene group having 6 to 50 ring carbon atoms or a substituted or unsubstituted heteroarylene group having 5 to 50 ring atoms. x is an integer of 0 to 5.

$Ar^{232}$ and $Ar^{233}$ may be linked together to form saturated or unsaturated ring. Examples of the substituted or unsubstituted aryl group and arylene group having 6 to 50 ring carbon atoms, and of the substituted or unsubstituted heteroaryl group and heteroarylene group having 5 to 50 ring atoms are the same as enumerated above.

Examples of the materials for the hole injecting layer and the hole transporting layer are triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, aniline copolymers and conductive polymer oligomers (particularly thiophene oligomer).

While the above materials are usable for the hole injecting layer and the hole transporting layer, porphyrin compounds, aromatic tertiary amine compounds and styrylamine compounds are preferable, among which aromatic tertiary amine compounds are particularly preferable.

Further usable examples are compounds having two fused aromatic rings in their molecules such as NPD and 4,4',4"-tris(N-(3-methylphenyl)-N-phenylamino)triphenylamine in which three units of triphenylamine are linked together in a starburst form (hereinafter abbreviated as MTDATA).

In addition, a nitrogen-containing heterocyclic derivative represented by the following formula is also usable.

[Chemical Formula 169]

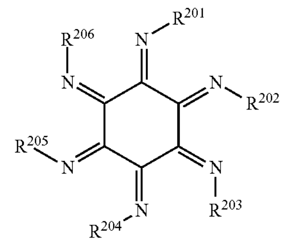

In the formula, $R^{201}$ to $R^{206}$ each represent any one of a substituted or unsubstituted alkyl group having 1 to 50 carbon atoms, substituted or unsubstituted aryl group having 6 to 50 ring carbon atoms, substituted or unsubstituted aralkyl group having 7 to 50 carbon atoms and substituted or unsubstituted heterocyclic group having 5 to 50 ring atoms. $R^{201}$ and $R^{202}$, $R^{203}$ and $R^{204}$, $R^{205}$ and $R^{206}$, $R^{201}$ and $R^{206}$, $R^{202}$ and $R^{203}$ or $R^{204}$ and $R^{205}$ may form a fused ring.

Further, the compound represented by the following formula is also usable.

[Chemical Formula 170]

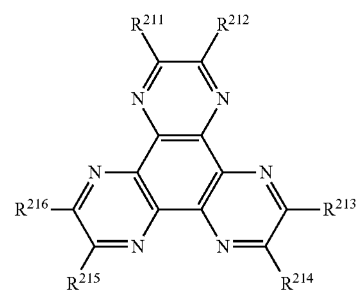

$R^{211}$ to $R^{216}$ each represent a substituent, preferably an electron absorbing group such as cyano group, nitro group, sulfonyl group, carbonyl group, trifluoromethyl group and halogen.

Alternatively, inorganic compounds such as p-type Si and p-type SiC can also be used as the material for the hole injecting layer.

The compound represented by the following formula is also preferable for the hole injecting layer.

[Chemical Formula 171]

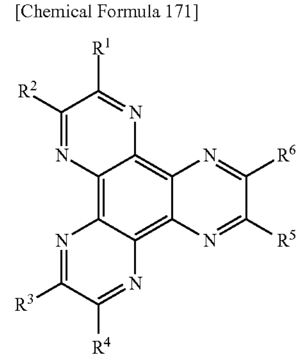

In the formula, $R_1$ to $R_6$ each represent halogen, a cyano group, nitro group, alkyl group or trifluoromethyl group. $R_1$ to $R_6$ may be mutually the same or different. Preferably, $R^1$ to $R^6$ represent a cyano group.

The hole injecting layer can be formed by thinly layering the above-described compound by a known method such as vacuum deposition, spin coating, casting and LB method.

The thickness of the hole injecting layer is not particularly limited. Typically, the thickness is 5 nm to 5 μm.

The hole injecting layer and the hole transporting layer may be a single-layered layer made of the single one of the above materials or a combinations of two or more of the above materials. Alternatively, the hole injecting layer and the hole transporting layer may be a multilayer layer in which a plurality of hole injecting layers and hole transporting layers made of different materials are layered.

The above-described material may be used as the material for the electron injecting layer 53.

In addition, an electron blocking layer may be provided to the mixed-color emitting layer 51 adjacently to the anode 3 while a hole blocking layer may be provided to the mixed-color emitting layer 51 adjacently to the cathode 4. With this arrangement, electrons and holes can be trapped in the mixed-color emitting layer 51, thereby enhancing probability of exciton generation in the mixed-color emitting layer 51.

The organic thin-film layer 5 may include a second emitting layer separately from the mixed-color emitting layer.

The second emitting layer may contain a phosphorescent dopant or a fluorescent dopant.

At this time, either one of the emission wavelength of the fluorescent dopant contained in the mixed-color emitting layer 51 and the emission wavelength of the second emitting layer may be longer than the other.

For instance, the fluorescent dopant contained in the mixed-color emitting layer 51 may provide green emission while the second emitting layer may provide blue emission. Alternatively, the fluorescent dopant contained in the mixed-color emitting layer 51 may provide blue emission while the second emitting layer may provide green emission.

When the single-layered mixed-color emitting layer 51 provides emission of three wavelengths, the mixed-color emitting layer 51 may contain the fluorescent dopant for blue fluorescent emission, the red phosphorescent dopant for red phosphorescent emission and the green fluorescent dopant for green fluorescent emission.

The anode of the organic EL device is used for injecting holes into the hole transporting layer or the emitting layer. It is effective that the anode has a work function of 4.5 eV or more. Exemplary materials for the anode for use in the aspect of the invention are indium-tin oxide (ITO), tin oxide (NESA), gold, silver, platinum and copper. The cathode is preferably formed of a material with smaller work function in order to inject electrons into the electron injecting layer or the emitting layer. Although a material for the cathode is subject to no specific limitation, examples of the material are indium, aluminum, magnesium, alloy of magnesium and indium, alloy of magnesium and aluminum, alloy of aluminum and lithium, alloy of aluminum, scandium and lithium, alloy of magnesium and silver and the like.

A method of forming each of the layers in the organic EL device according to the aspect of the invention is not particularly limited. A conventionally-known methods such as vacuum deposition or spin coating may be employed for forming the layers. The organic thin-film layer containing the above-described compound, which is used in the organic EL device according to the aspect of the invention, may be formed by a conventional coating method such as vacuum deposition, molecular beam epitaxy (MBE method) and coating methods using a solution such as a dipping, spin coating, casting, bar coating, and roll coating.

Although the thickness of each organic layer of the organic EL device is not particularly limited, the thickness is generally preferably in a range of several nanometers to 1 μm because an excessively-thinned film likely entails defects such as a pin hole while an excessively-thickened film requires high voltage to be applied and deteriorates efficiency.

The organic EL device is formed on a light-transmissive substrate. The light-transmissive substrate, which supports the organic EL device, is preferably a smoothly-shaped substrate that transmits 50% or more of light in a visible region of 400 nm to 700 nm.

The light-transmissive substrate is exemplarily a glass plate, a polymer plate or the like.

For the glass plate, materials such as soda-lime glass, barium/strontium-containing glass, lead glass, aluminosilicate glass, borosilicate glass, barium borosilicate glass and quartz can be used.

For the polymer plate, materials such as polycarbonate, acryl, polyethylene terephthalate, polyether sulfide and polysulfone can be used.

EXAMPLES

Next, the invention will be described in further detail by exemplifying Example(s) and Comparative(s). However, the invention is not limited by the description of Example(s).

Note that solid-property values of each material, which are shown in the Table below, were measured in the following manner.

Triplet energy gap Eg was defined based on phosphorescence spectrum.

Specifically, each material was dissolved in an EPA solvent (diethylether:isopentane:ethanol=5:5:2 in volume ratio) at a concentration of 10 μmol/L, thereby forming a sample for phosphorescence measurement.

Then, the sample for phosphorescence measurement was put into a quartz cell, cooled to 77K and irradiated with exciting light, so that a wavelength of phosphorescence radiated therefrom was measured.

A tangent line was drawn to be tangent to a rising section adjacent to short-wavelength of the obtained phosphorescence spectrum, a wavelength value at an intersection of the tangent line and a base line (absorption zero) was converted into energy value, and the converted energy value was defined as the triplet energy gap Eg(T).

For the measurement, a commercially-available measuring equipment F-4500 (manufactured by Hitachi, Ltd.) was used.

Herein this description, the affinity level Ea (electron affinity) means energy discharged or absorbed when one electron is given to a molecule of the material. Also herein this description, "positive" means that energy is discharged while "negative" means that energy is absorbed.

The affinity level Ea is defined by the following equation based on the ionization potential Ip and the optical energy gap Eg(S).

$$Af=Ip-Eg(S)$$

The ionization potential Ip means energy required for removing electron(s) from a compound of each material (i.e., energy required for ionization). The ionization potential is, for instance, a value measured by an ultraviolet-ray photoelectron spectrometer (AC-3, manufactured by Riken Keiki Co., Ltd.).

The optical energy gap Eg(S) means a difference between a conduction level and a valence electron level. For instance, the optical energy gap is obtained by converting into energy a wavelength value at an intersection of a long-wavelength side tangent line of absorption spectrum of toluene dilute solution of each material and a base line.

Eg(S) of NPD used in Examples was 3.0 eV, and Eg(s) of BCzVBi used in Examples was 2.8 eV.

Example 1

A glass substrate (size: 25 mm×75 mm×1.1 mm thick) having an ITO transparent electrode (manufactured by Geomatec Co., Ltd.) was ultrasonic-cleaned in isopropyl alcohol for five minutes, and then UV/ozone-cleaned for 30 minutes.

After the glass substrate having the transparent electrode line was cleaned, the glass substrate was mounted on a substrate holder of a vacuum deposition apparatus. Then, 55-nm thick film of 4,4'-bis[N-(1-naphthyl)-N-phenylamino]biphenyl (hereinafter abbreviated as "NPD film") was initially formed by resistance heating deposition onto a surface of the glass substrate where the transparent electrode line was provided so that the NPD film covered the transparent electrode. The NPD film served as the hole injecting/transporting layer.

A 40-nm thick film of a compound represented by the following formula (H1) was formed on the NPD film by resistance heating deposition. At the same time, NPD and a compound represented by the following formula (RD) were deposited respectively as a fluorescent dopant and a red phosphorescent dopant, so that the NPD and the compound (RD) were contained respectively at contents of 2% and 0.1% (mass ratio) of the compound (H1). This film served as the mixed-color emitting layer.

Subsequently, a 10-nm thick film of a compound represented by the following formula (HB) was formed on the mixed-color emitting layer by resistance heating deposition. The film of the compound (HB) served as a hole blocking layer.

Further, 30-nm thick film of tris(8-quinolynol)aluminum (Alq) complex was formed on this film. This film served as an electron injecting/transporting layer.

After that, LiF was formed into 0.5-nm thick film. Metal (Al) was deposited on the LiF film to form a 150-nm thick metal cathode, thereby providing the organic EL device.

[Chemical Formula 172]

(H1)

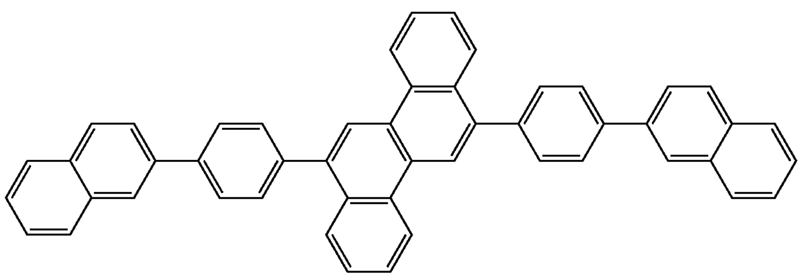

(HB)

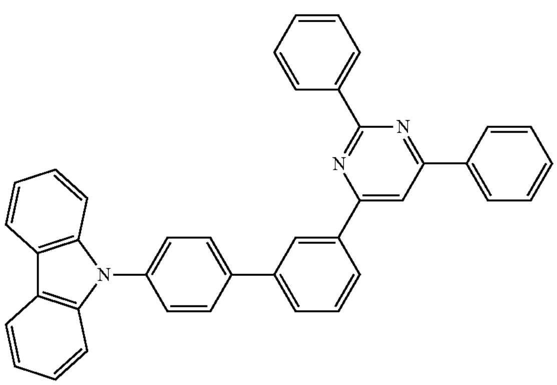

(RD)

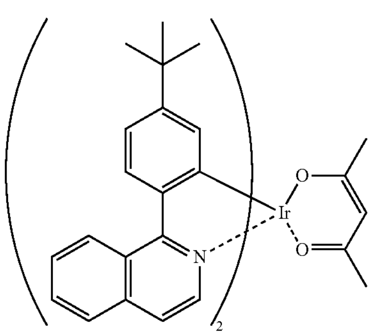

Alq

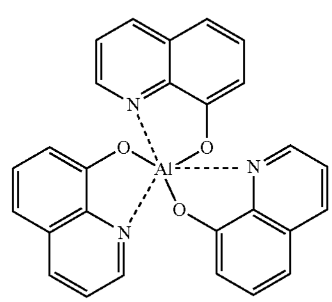

Example 2

An organic EL device was manufactured in the same manner as Example 1, except that the following compound (GD) was deposited as a green fluorescent dopant in addition to the fluorescent dopant and the red phosphorescent dopant so that the compound (GD) was contained at a content of 0.5% (mass ratio) of the compound (H1).

[Chemical Formula 173]

(GD)

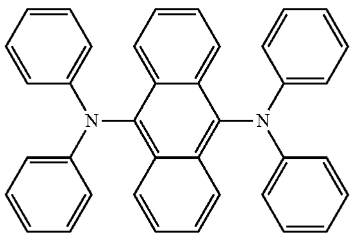

Example 3

An organic EL device was manufactured in the same manner as Example 1, except that a 10-nm-thick green phosphorescent-emitting layer was provided between the mixed-color emitting layer and the hole blocking layer. The green phosphorescent-emitting layer was deposited so that $Ir(ppy)_3$ for green phosphorescent emission was contained at a content of 5% of the CBP (i.e., host).

Example 4

An organic EL device was manufactured in the same manner as Example 3, except that a 5-nm-thick intermediate layer made of BAlq was provided between the mixed-color emitting layer and the green phosphorescent-emitting layer.

Example 5

An organic EL device manufactured in the same manner as Example 3, except that the layering order of the mixed-color emitting layer and the green phosphorescent-emitting layer was reversed so that the anode, the hole injecting/transporting layer, the green phosphorescent-emitting layer, the mixed-color emitting layer, the hole blocking layer, the electron injecting layer and the cathode were layered in this order.

Example 6

An organic EL device was manufactured in the same manner as Example 5, except that an intermediate layer made of CBP was provided between the green phosphorescent-emitting layer and the mixed-color emitting layer.

Example 7

An organic EL device was manufactured in the same manner as Example 2, except that: CBP was used as the host in place of the compound (H1); and $Ir(ppy)_3$ was used as the green phosphorescent dopant in place of the compound (GD).

Example 8

An organic EL device was manufactured in the same manner as Example 7, except that the following compound (H2) was used as the host in place of the CBP.

[Chemical Formula 174]

(H2)

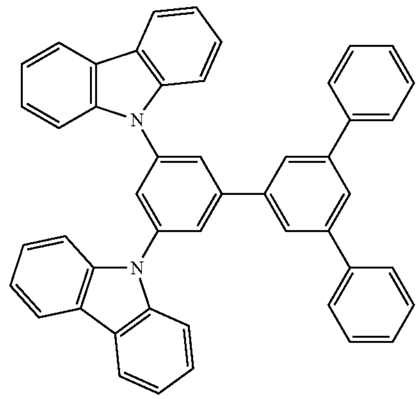

Example 9

An organic EL device was manufactured in the same manner as Example 2, except that CBP was used as the host in place of the compound (H1).

Example 10

An organic EL device was manufactured in the same manner as Example 1, except that the following compound (H3) was used as the host in place of the compound (H1).

[Chemical Formula 175]

(H3)

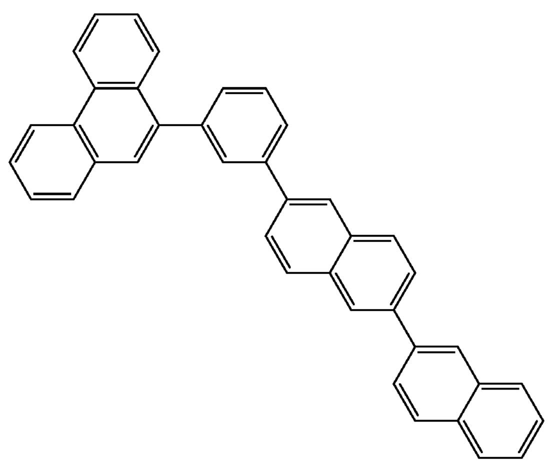

Example 11

An organic EL device was manufactured in the same manner as Example 1, except that the compound (H2) was used as the host in place of the compound (H1).

Example 12

An organic EL device was manufactured in the same manner as Example 1, except that the following compound (BD) was used as the fluorescent dopant in place of the NPD.

[Chemical Formula 176]

(BD)

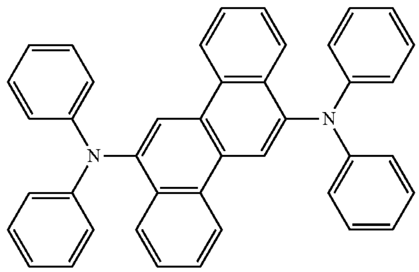

Example 13

An organic EL device was manufactured in the same manner as Example 1, except that BCzVBi was used as the fluorescent dopant in place of the NPD.

Example 14

An organic EL device manufactured in the same manner as Example 7, except that the following compound (E) was used as the electron injecting/transporting material in place of Alq.

[Chemical Formula 177]

(E)

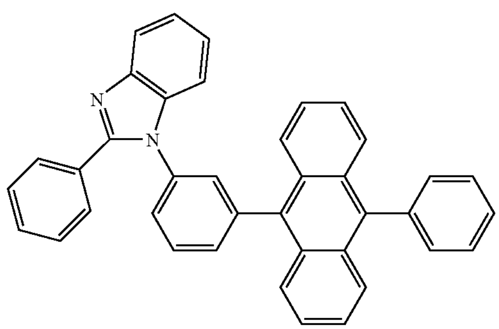

Example 15

An organic EL device was manufactured in the same manner as Example 2, except that: CBP was used as the host in place of the compound (H1); and the compound (GD) was used as the green fluorescent dopant in place of $Ir(ppy)_3$.

Example 16

An organic EL device was manufactured in the same manner as Example 7, except that the compound (BD) was used as the fluorescent dopant in place of the NPD.

Example 17

An organic EL device was manufactured in the same manner as Example 7, except that the following compound (BD2) was used as the fluorescent dopant in place of the NPD.

[Chemical Formula 178]

(BD2)

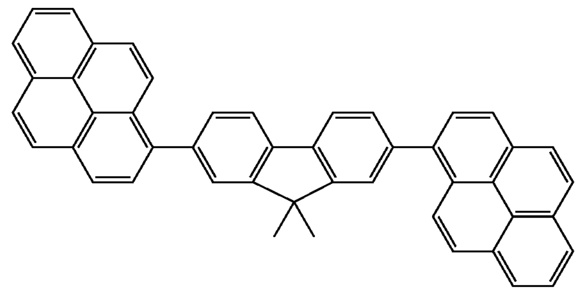

Example 18

An organic EL device was manufactured in the same manner as Example 7, except that the following compound (BD3) was used as the fluorescent dopant in place of the NPD.

[Chemical Formula 179]

(BD3)

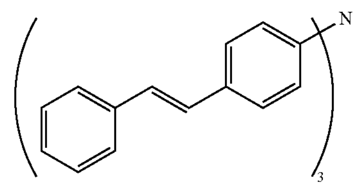

Example 19

An organic EL device was manufactured in the same manner as Example 2, except that the following compound (BD4) was used as the fluorescent dopant in place of the NPD.

[Chemical Formula 180]

(BD4)

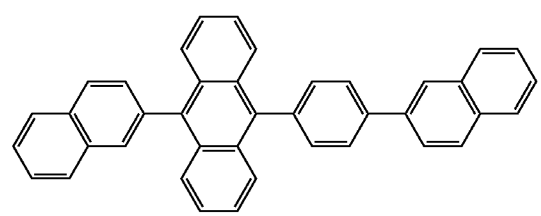

Example 20

An organic EL device was manufactured in the same manner as Example 2, except that the compound (BD3) was used as the fluorescent dopant in place of the NPD.

Example 21

An organic EL device was manufactured in the same manner as Example 7, except that the compound (H1) was used as the fluorescent dopant in place of the NPD.

Example 22

As in Example 1, a NPD film was formed on a transparent electrode so as to form a hole injecting/transporting layer.

Subsequently, a 40-nm thick film of a compound represented by the following formula (A1) was formed on the NPD film by resistance heating deposition to serve as the mixed-color emitting layer. At the same time, the above compound (BD4), Ir(Ph-ppy)$_3$ represented by the following formula and the above compound (RD) were deposited respectively as a fluorescent dopant, a green phosphorescent dopant and a red phosphorescent dopant. The compound (BD4), the Ir(Ph-ppy)$_3$ and the compound (RD) were contained respectively at contents of 7.5%, 1% and 0.1% (mass ratio) of the compound (A1).

A film of the above compound (E) was formed as the electron injecting layer on the mixed-color emitting layer, and then a 0.5-nm-thick film of LiF was formed. Metal (Al) was deposited on the LiF film to form a 150-nm thick metal cathode, thereby providing the organic EL device.

[Chemical Formula 181]

A1

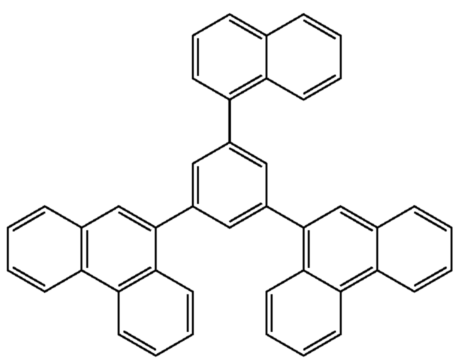

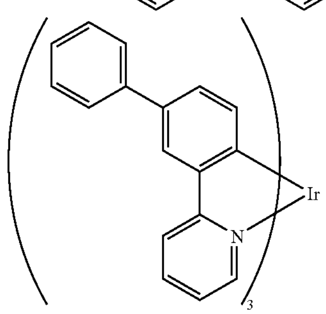

Ir(Ph-ppy)$_3$

Example 23

In Example 25, a 40-nm-thick film of a compound represented by the following formula (A2) was formed by resistance heating deposition to serve as the mixed-color emitting layer. At the same time, the above compound (BD), Ir(ppy)$_3$ represented by the following formula and the above compound (RD) were deposited respectively as a fluorescent dopant, a green phosphorescent dopant and a red phosphorescent dopant. The compound (BD), the Ir(ppy)$_3$ and the compound (RD) were contained respectively at contents of 2%, 1% and 0.1% (mass ratio) of the compound (A2).

Except for the above, the organic EL device was manufactured in the same manner as Example 22.

[Chemical Formula 182]

A2

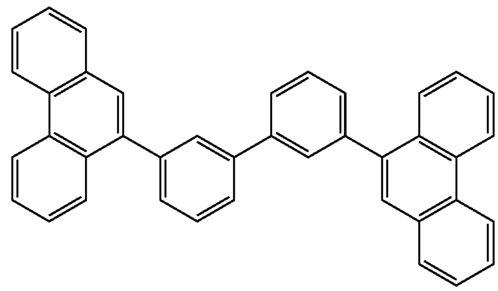

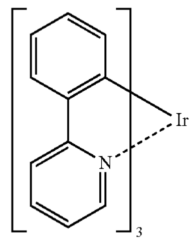

Ir(ppy)$_3$

Example 24

In Example 25, a 40-nm-thick film of a compound represented by the following formula (A3) was formed by resistance heating deposition to serve as the mixed-color emitting layer. At the same time, the above compound (H1), Ir(Ph-ppy)$_3$ represented by the following formula and the above compound (RD) were deposited respectively as a fluorescent dopant, a green phosphorescent dopant and a red phosphorescent dopant. The compound (H1), the Ir(Ph-ppy)$_3$ and the compound (RD) were contained respectively at contents of 2%, 2% and 1% (mass ratio) of the compound (A2).

Except for the above, the organic EL device was manufactured in the same manner as Example 22.

[Chemical Formula 183]

A3

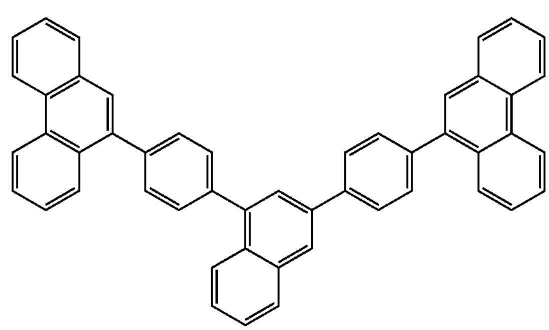

Comparative 1

An organic EL device was manufactured in the same manner as Example 1, except that the mixed-color emitting layer was provided by: using CBDP as the host; and depositing the compound (RD) and Firpic respectively as the red phosphorescent dopant and the blue phosphorescent dopant so that the compound (RD) and Firpic were contained respectively at contents of 5% and 0.1% of the CBDP.

Comparative 2

An organic EL device was manufactured in the same manner as Example 1, except that the mixed-color emitting layer was provided by: using the compound (BD4) as the host; and depositing TBP(2,5,8,11-tetrakis(1,1-dimethylethyl) perylene) and rubrene respectively as the blue fluorescent dopant and the red fluorescent dopant so that the TBP(2,5,8,11-tetrakis(1,1-dimethylethyl)perylene) and rubrene were contained respectively at contents of 5% and 0.1% of the compound (H4).

[Evaluation of Organic EL Device]

The organic EL devices each manufactured as described above were driven by direct-current electricity of 1 mA/cm$^2$ to emit light, and then emission chromaticity, the luminance (L) and voltage were measured. Based on the measurement, the external quantum efficiency (EQE, %) was obtained. In addition, by conducting a direct-current continuous current test with the initial luminance intensity being set at 1000 cd/m$^2$ for each organic EL device, time elapsed until the initial luminance intensity was reduced to the half (i.e., time until half-life) was measured for each organic EL device.

Table 1 below shows the evaluation results, and Table 2 below shows the ionization potential (Ip), affinity level (Ea), singlet energy gap (Eg(S)) and triplet energy gap (Eg(T)) of each material.

TABLE 1

| | EQE | Time until Half-Life | Chromaticity (CIE color system) | |
|---|---|---|---|---|
| | (%) | T50@1000 cd/m$^2$ (h) | x | y |
| Example 1 | 12.6 | 1000 | 0.459 | 0.220 |
| Example 2 | 12.8 | 1250 | 0.298 | 0.361 |
| Example 3 | 12.2 | 1300 | 0.311 | 0.488 |
| Example 4 | 12.1 | 1000 | 0.441 | 0.394 |
| Example 5 | 14.5 | 1300 | 0.344 | 0.492 |
| Example 6 | 15.5 | 1400 | 0.329 | 0.567 |
| Example 7 | 16.6 | 500 | 0.355 | 0.439 |
| Example 8 | 17.0 | 650 | 0.341 | 0.479 |
| Example 9 | 12.4 | 500 | 0.335 | 0.370 |
| Example 10 | 13.3 | 800 | 0.454 | 0.226 |
| Example 11 | 12.1 | 600 | 0.427 | 0.219 |
| Example 12 | 12.3 | 950 | 0.462 | 0.243 |
| Example 13 | 11.8 | 900 | 0.479 | 0.255 |
| Example 14 | 16.8 | 550 | 0.356 | 0.428 |
| Example 15 | 13.4 | 1300 | 0.296 | 0.366 |
| Example 16 | 17.1 | 350 | 0.368 | 0.445 |
| Example 17 | 16.6 | 500 | 0.352 | 0.402 |
| Example 18 | 16.3 | 400 | 0.377 | 0.398 |
| Example 19 | 12.5 | 1500 | 0.291 | 0.324 |
| Example 20 | 13.9 | 2000 | 0.298 | 0.331 |
| Example 21 | 16.5 | 350 | 0.275 | 0.352 |
| Example 22 | 14.7 | 3000 | 0.342 | 0.398 |
| Example 23 | 13.9 | 2200 | 0.329 | 0.354 |
| Example 24 | 15.1 | 2500 | 0.361 | 0.375 |
| Comparative 1 | 16.7 | 150 | 0.300 | 0.426 |
| Comparative 2 | 5.1 | 300 | 0.311 | 0.341 |

TABLE 2

| Material | Ip (eV) | Ea (eV) | Eg(S) (eV) | Eg(T) (eV) |
|---|---|---|---|---|
| H1 | 5.88 | 2.64 | 3.24 | 2.38 |
| H2 | 5.98 | 2.41 | 3.57 | 2.89 |
| H3 | 6.04 | 2.55 | 3.49 | 2.44 |
| A1 | 6.00 | 2.70 | 3.30 | 2.60 |
| A2 | 6.10 | 2.80 | 3.30 | 2.60 |
| A3 | 6.00 | 2.70 | 3.30 | 2.60 |
| RD | — | — | — | 2.03 |
| BD | 5.47 | 2.67 | 2.80 | — |
| BD2 | 5.85 | 2.73 | 3.12 | — |
| BD3 | 5.38 | 2.59 | 2.79 | — |
| BD4 | 5.92 | 3.00 | 2.92 | — |
| GD | 5.50 | 3.00 | 2.50 | — |
| $Ir(ppy)_3$ | — | — | — | 2.56 |
| $Ir(Ph\text{-}ppy)_3$ | — | — | — | 2.52 |
| CBP | 6.06 | 2.50 | 3.56 | 2.81 |

As clearly appreciated from Table 1, the organic EL device according to each of Examples 1 to 24, in which the host material according to the aspect of the invention was used, provided favorable mixed-color emission, and had long lifetime and high efficiency.

In contrast, the organic EL device according to each of Comparatives 1 and 2, which adopted a conventional mixed-color layer containing the plurality of fluorescent dopants or the plurality of phosphorescent dopants, provided unfavorable mixed-color emission of reddish color, and had short lifetime.

The use of CBP, of which triplet energy gap Eg(T) is large, as the host would be preferable for securing the transfer of the triplet energy to the phosphorescent dopant and for obtaining phosphorescent emission.

However, CBP has a large singlet energy gap Eg(S), and increase of the difference in the singlet energy gap Eg(S) between the CBP and the fluorescent dopant reduces the lifetime of organic EL devices.

In contrast, the compound (BD2), which is not applicable as the host for phosphorescent emission due to its narrow triplet energy gap Eg(T), has a suitable singlet energy gap Eg(S) for fluorescent emission.

Therefore, in Examples 22 to 24, the compound (BD2) was added to the CBP (i.e., host) at a content of 2%. With this arrangement, it is found possible to secure both of the transfer of the triplet energy to the phosphorescent dopant and the transfer of the singlet energy to the fluorescent dopant, and to prolong the lifetime of organic EL devices.

INDUSTRIAL APPLICABILITY

The invention is applicable to an organic EL device. The invention is also applicable to an organic-EL-material-containing solution for forming the emitting layer(s) of the organic EL device.

The invention claimed is:

1. An organic EL device, comprising:
an anode;
a cathode; and
an organic thin-film layer provided between the anode and the cathode,
the organic thin-film layer comprising a single-layered mixed-color emitting layer for providing mixed-color emission,
the mixed-color emitting layer containing a host, a fluorescent dopant for fluorescent emission and a phosphorescent dopant for phosphorescent emission,
wherein the wavelength of emission of the fluorescent dopant is shorter than the wavelength of emission of the phosphorescent dopant, wherein the singlet energy gap $Eg_H$ of the host and the singlet energy gap $Eg_{PD}$ of the phosphorescent dopant satisfy a relationship of $Eg_H<Eg_{PD}$.

2. The organic EL device according to claim 1, wherein the mixed-color emitting layer contains a red phosphorescent dopant for red phosphorescent emission and a green phosphorescent dopant for green phosphorescent emission.

3. The organic EL device according to claim 2, wherein
the wavelength of a maximum emission luminance of the red phosphorescent dopant is 580 nm to 700 nm, and
the wavelength of a maximum emission luminance of the green phosphorescent dopant is 490 nm to 580 nm.

4. The organic EL device according to claim 1, wherein
the organic thin-film layer comprises an electron injecting/transporting layer between the cathode and the mixed-color emitting layer, and
the electron injecting/transporting layer contains a nitrogen-containing heterocyclic derivative.

5. An organic-EL-material-containing solution comprising:
a host;
a fluorescent dopant for fluorescent emission;
a phosphorescent dopant for phosphorescent emission; and
a solvent,
wherein the host, the fluorescent dopant and the phosphorescent dopant are dissolved in the solvent,
wherein the wavelength of emission of the fluorescent dopant is shorter than the wavelength of emission of the phosphorescent dopant, and
wherein a single energy gap $Eg_H$ of the host and a singlet energy gap $Eg_{PD}$ of the phosphorescent dopant satisfy a relationship of $Eg_H<Eg_{PD}$.

6. An organic EL device, comprising:
an anode;
a cathode; and
an organic thin-film layer provided between the anode and the cathode,
the organic thin-film layer comprising a single-layered mixed-color emitting layer for providing mixed-color emission,
the mixed-color emitting layer containing a first host, a fluorescent dopant for fluorescent emission and a first phosphorescent dopant for phosphorescent emission,
wherein the wavelength of emission of the fluorescent dopant is shorter than the wavelength of emission of the first phosphorescent dopant,
said organic thin-film layer comprises a second emitting layer layered on a side of said mixed-color emitting layer near said anode,
said second emitting layer comprising a second host and a second phosphorescent dopant, and
a triplet energy gap $EgT(H_1)$ of said first host and a triplet energy gap $EgT(PD_2)$ of said second phosphorescent dopant satisfy a relationship of $EgT(H_1)<EgT(PD_2)$.

7. An organic EL device, comprising:
an anode;
a cathode; and
an organic thin-film layer provided between the anode and the cathode,
the organic thin-film layer comprising a single-layered mixed-color emitting layer for providing mixed-color emission,
the mixed-color emitting layer comprising a first host, a fluorescent dopant for fluorescent emission and a first phosphorescent dopant for phosphorescent emission,
wherein the wavelength of emission of the fluorescent dopant is shorter than the wavelength of emission of the first phosphorescent dopant,
said organic thin-film layer comprises a second emitting layer layered on a side of said mixed-color emitting layer near said cathode,
said second emitting layer comprising a second host and a second phosphorescent dopant, and
a triplet energy gap $EgT(H_1)$ of said first host and a triplet energy gap $EgT(PD_2)$ of said second phosphorescent dopant satisfy a relationship of $EgT(H_1)<EgT(PD_2)$.

8. An organic EL device, comprising:
an anode;
a cathode; and
an organic thin-film layer provided between the anode and the cathode,
the organic thin-film layer comprising a single-layered mixed-color emitting layer for providing mixed-color emission,
the mixed-color emitting layer comprising a first host, a fluorescent dopant for fluorescent emission and a first phosphorescent dopant for phosphorescent emission,
wherein the wavelength of emission of the fluorescent dopant is shorter than the wavelength of emission of the first phosphorescent dopant,
said organic thin-film layer comprises a second emitting layer layered on a side of said mixed-color emitting layer near said anode,
said second emitting layer comprising a second host and a second phosphorescent dopant, and
a singlet energy gap $Eg(H_1)$ of said first host and a singlet energy gap $Eg(PD_2)$ of said second phosphorescent dopant satisfy a relationship of $Eg(H_1)<Eg(PD_2)$.

9. An organic EL device, comprising:
an anode;
a cathode; and
an organic thin-film layer provided between the anode and the cathode,
the organic thin-film layer comprising a single-layered mixed-color emitting layer for providing mixed-color emission,
the mixed-color emitting layer comprising a first host, a fluorescent dopant for fluorescent emission and a first phosphorescent dopant for phosphorescent emission,
wherein the wavelength of emission of the fluorescent dopant is shorter than the wavelength of emission of the first phosphorescent dopant,
said organic thin-film layer comprises a second emitting layer layered on a side of said mixed-color emitting layer near said cathode,
said second emitting layer comprising a second host and a second phosphorescent dopant, and
a singlet energy gap $Eg(H_1)$ of said first host and a singlet energy gap $Eg(PD_2)$ of said second phosphorescent dopant satisfy a relationship of $Eg(H_1)<Eg(PD_2)$.

10. An organic EL device, comprising:
an anode;
a cathode; and
an organic thin-film layer provided between the anode and the cathode,
the organic thin-film layer comprising a single-layered mixed-color emitting layer for providing mixed-color emission,
the mixed-color emitting layer comprising a first host, a fluorescent dopant for fluorescent emission and a first phosphorescent dopant for phosphorescent emission,
wherein the wavelength of emission of the fluorescent dopant is shorter than the wavelength of emission of the first phosphorescent dopant,
said organic thin-film layer comprises a second emitting layer layered on a side of said mixed-color emitting layer near said anode,
said second emitting layer comprising a second host and a second phosphorescent dopant, and
a triplet energy gap $EgT(PD_1)$ of said first phosphorescent dopant and a triplet energy gap $EgT(PD_2)$ of said second phosphorescent dopant satisfy a relationship of $EgT(PD_1)<EgT(PD_2)$.

11. An organic EL device, comprising:

an anode;

a cathode; and an organic thin-film layer provided between the anode and the cathode, the organic thin-film layer comprising a single-layered mixed-color emitting layer for providing mixed-color emission, the mixed-color emitting layer comprising a first host, a fluorescent dopant for fluorescent emission and a first phosphorescent dopant for phosphorescent emission, wherein the wavelength of emission of the fluorescent dopant is shorter than the wavelength of emission of the first phosphorescent dopant, said organic thin-film layer comprises a second emitting layer layered on a side of said mixed-color emitting layer near said cathode, said second emitting layer comprising a second host and a second phosphorescent dopant, and a triplet energy gap $EgT(PD_1)$ of said first phosphorescent dopant and a triplet energy gap $EgT(PD_2)$ of said second phosphorescent dopant satisfy a relationship of $EgT(PD_1)<EgT(PD_2)$.

* * * * *